US012799141B2

(12) United States Patent
Schaefer et al.

(10) Patent No.: US 12,799,141 B2
(45) Date of Patent: Nov. 17, 2026

(54) HETEROCYCLIC COMPOUND AND AN ORGANIC ELECTROLUMINESCENCE DEVICE COMPRISING THE HETEROCYCLIC COMPOUND

(71) Applicant: IDEMITSU KOSAN CO., LTD., Chiyoda-ku (JP)

(72) Inventors: Thomas Schaefer, Liestal (CH); Pierre Boufflet, Basel (CH); Sigma Hashimoto, Sodegaura (JP); Chao-Chen Lin, Basel (CH)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 986 days.

(21) Appl. No.: 18/001,661

(22) PCT Filed: Jun. 18, 2021

(86) PCT No.: PCT/IB2021/055387

§ 371 (c)(1),
(2) Date: Dec. 13, 2022

(87) PCT Pub. No.: WO2021/255698

PCT Pub. Date: Dec. 23, 2021

(65) Prior Publication Data

US 2023/0137925 A1 May 4, 2023

(30) Foreign Application Priority Data

Jun. 19, 2020 (EP) .................................... 20181225

(51) Int. Cl.

| | |
|---|---|
| ***H01L 51/54*** | (2006.01) |
| ***C07F 5/02*** | (2006.01) |
| ***C09K 11/06*** | (2006.01) |
| ***H10K 85/60*** | (2023.01) |
| *H10K 50/11* | (2023.01) |

(52) U.S. Cl.

CPC ................ *C07F 5/02* (2013.01); *C07F 5/027* (2013.01); *C09K 11/06* (2013.01); *H10K 85/658* (2023.02); *C09K 2211/1018* (2013.01); *H10K 50/11* (2023.02)

(58) Field of Classification Search
None
See application file for complete search history.

(56) References Cited

U.S. PATENT DOCUMENTS

| | | | |
|---|---|---|---|
| 10,249,832 | B1 | 4/2019 | Takahashi et al. |
| 2019/0067577 | A1 | 2/2019 | Xia |
| 2020/0203651 | A1 | 6/2020 | Duan et al. |
| 2020/0203652 | A1 | 6/2020 | Duan et al. |

FOREIGN PATENT DOCUMENTS

| | | | |
|---|---|---|---|
| CN | 108690060 | A | 10/2018 |
| CN | 109422770 | A | 3/2019 |
| EP | 3 569 605 | A1 | 11/2019 |
| JP | 2021-95342 | A | 6/2021 |
| JP | 2023-526761 | A | 6/2023 |
| WO | WO 2020/042606 | A1 | 3/2020 |
| WO | WO 2020/042626 | A1 | 3/2020 |
| WO | WO 2020/135953 | A1 | 7/2020 |
| WO | WO 2021/214309 | A1 | 10/2021 |

OTHER PUBLICATIONS

International Search Report issued Jul. 12, 2021, in PCT/IB2021/055387, filed on Jun. 18, 2021, 3 pages.

*Primary Examiner* — Andrew K Bohaty
(74) *Attorney, Agent, or Firm* — Oblon, McClelland, Maier & Neustadt, L.L.P.

(57) ABSTRACT

Heterocyclic compounds of the general structure (I) below (I)

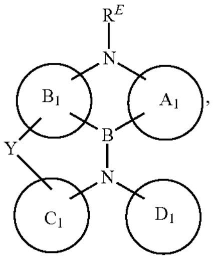

, with substituents as defined herein, and materials including one or more such compounds, preferably emitter materials, may be used for an organic electroluminescence device. An organic electroluminescence device may include one or more such specific heterocyclic compounds, as may electronic equipment and a light emitting layer further having at least one host and at least one dopant, wherein the dopant may have at least one of the specific heterocyclic compounds.

21 Claims, 1 Drawing Sheet

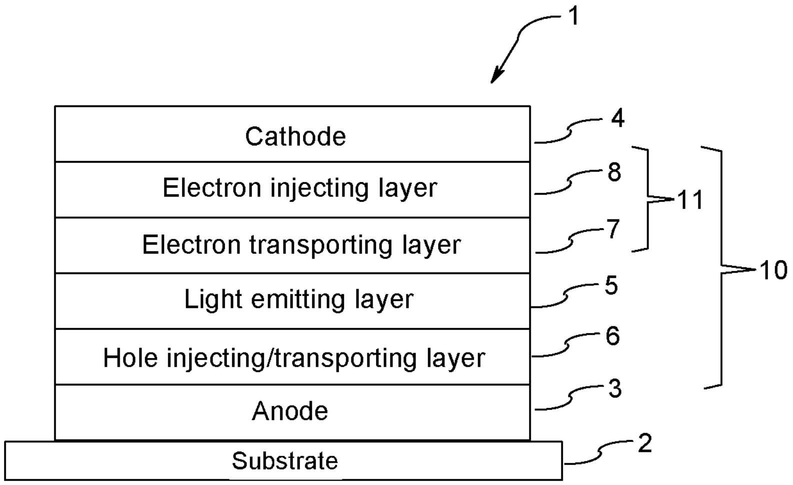
1
Cathode
4
Electron injecting layer
8
11
Electron transporting layer
7
10
Light emitting layer
5
Hole injecting/transporting layer
6
Anode
3
Substrate
2

HETEROCYCLIC COMPOUND AND AN ORGANIC ELECTROLUMINESCENCE DEVICE COMPRISING THE HETEROCYCLIC COMPOUND

CROSS-REFERENCE TO RELATED APPLICATIONS

The present application is the national stage of international application PCT/IB2021/055387, filed on Jun. 18, 2021, and claims the benefit of the filing date of European Appl. No. 20181225.2, filed on Jun. 19, 2020.

The present invention relates to specific heterocyclic compounds, a material, preferably an emitter material, for an organic electroluminescence device comprising said specific heterocyclic compounds, an organic electroluminescence device comprising said specific heterocyclic compounds, an electronic equipment comprising said organic electroluminescence device, a light emitting layer comprising at least one host and at least one dopant, wherein the dopant comprises at least one of said specific heterocyclic compounds, and the use of said heterocyclic compounds in an organic electroluminescence device.

When a voltage is applied to an organic electroluminescence device (hereinafter may be referred to as an organic EL device), holes are injected to an emitting layer from an anode and electrons are injected to an emitting layer from a cathode. In the emitting layer, injected holes and electrons are re-combined and excitons are formed.

An organic EL device comprises an emitting layer between the anode and the cathode. Further, there may be a case where it has a stacked layer structure comprising an organic layer such as a hole-injecting layer, a hole-transporting layer, an electron-injecting layer, an electron-transporting layer, etc.

US 2019/0067577 A1 relates to boron containing heterocyclic compounds for organic electronic devices, such as organic light emitting devices having a structure according to the following Formula I Formula I

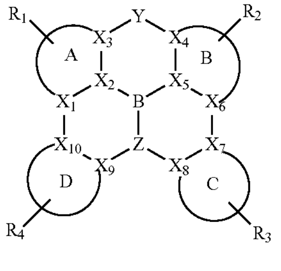

wherein rings A, B, C, and D are each independently 5- or 6-membered aryl or heteroaryl rings;

$R_1$, $R_2$, $R_3$ and $R_4$ each independently represent no substitution or up to the maximum available substitutions;

Y is NR, O, PR, S or Se; and

Z is N or P.

An example for a compound of formula I is the following compound

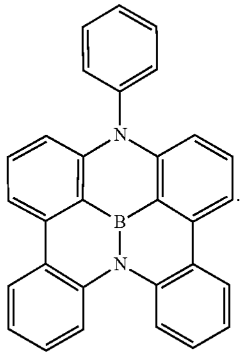 [SMILES: c1ccc(N2c3cccc4c3B3c5c(cccc52)-c2ccccc2N3c2ccccc2-4)cc1]

However, the specific structure and substitution pattern of polycyclic compounds has a significant impact on the performance of the polycyclic compounds in organic electronic devices.

Notwithstanding the developments described above, there remains a need for organic electroluminescence devices comprising new materials, especially dopant (=emitter) materials, to provide improved performance of electroluminescence devices.

Accordingly, it is an object of the present invention, with respect to the aforementioned related art, to provide materials suitable for providing organic electroluminescence devices which ensure good performance of the organic electroluminescence devices, especially good EQEs and/or a long lifetime. More particularly, it should be possible to provide dopant (=emitter) materials, especially blue light emitting dopant materials having a narrow spectrum (smaller FWHM), i.e. good color purity when used as dopant in organic electroluminescence devices.

Said object is according to one aspect of the present invention solved by a heterocyclic compound represented by formula (I):

(I)

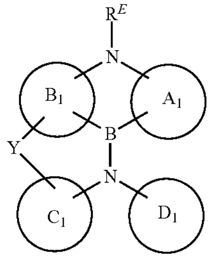

wherein ring $A_1$, ring $B_1$, ring $C_1$ and ring $D_1$ each independently represents a substituted or unsubstituted aromatic group having 6 to 60, preferably from 6 to 30, more preferably from 6 to 18 ring carbon atoms, or a substituted or unsubstituted heteroaromatic group having 5 to 60, preferably to 30, more preferably 5 to 18 ring atoms;

or ring $C_1$ and ring $D_1$ may be connected via a direct bond, O, S, $NR^{23}$, $SIR^{24}R^{25}$ or $CR^{27}R^{28}$, preferably via a direct bond;

$R^E$ represents hydrogen; an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted; an alkenyl group having from 2 to 20 carbon atoms which is unsubstituted or substituted; an iminyl group $R^{23}$—C═N; an alkynyl group having from 2 to 20 carbon atoms which is unsubstituted or substituted;

or $R^E$ or a substituent on $R^E$ may be bonded to the ring $A_1$ and/or to the ring $B_1$ or to a substituent on the ring $A_1$ and or the ring $B_1$ to form a ring structure which is unsubstituted or substituted, Y represents a direct bond, O, S, $NR^{23}$, $SIR^{24}R^{25}$ or $CR^{27}R^{28}$, preferably a direct bond; in the case that Y is a direct bond, ring $B_1$ and $C_1$ may additionally be connected via O, S, $NR^{23}$, $SIR^{24}R^{25}$ or $CR^{27}R^{28}$;

$R^{23}$, $R^{24}$, $R^{25}$, $R^{27}$ and $R^{28}$ each independently represents an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted; an alkyl group having from 1 to 20 carbon atoms which is unsubstituted or substituted; or a cycloalkyl group having from 3 to 20 ring carbon atoms which is unsubstituted or substituted;

and/or two residues $R^{24}$ and $R^{25}$ and/or two residues $R^{27}$ and $R^{28}$ together form a ring structure which is unsubstituted or substituted.

The compounds of formula (I) can be in principal used in any layer of an EL device. Preferably, the compound of formula (I) is a dopant (=emitter) in organic EL elements, especially in the light-emitting layer, more preferably a fluorescent dopant. Particularly, the compounds of formula (I) are used as fluorescent dopants in organic EL devices, especially in the light-emitting layer.

The term organic EL device (organic electroluminescence device) is used interchangeably with the term organic light-emitting diode (OLED) in the present application.

It has been found that the specific compounds of formula (I) show a narrow emission characteristic, preferably a narrow fluorescence, more preferably a narrow blue fluorescence. Such a narrow emission characteristic is suitable to prevent energy losses by outcoupling. The compounds of formula (I) according to the present invention preferably have a Full width at half maximum (FWHM) of lower than 30 nm, more preferably lower than 25 nm.

It has further been found that organic EL devices comprising the compounds of the present invention are generally characterized by high external quantum efficiencies (EQE) and long lifetimes, especially when the specific compounds of formula (I) are used as dopants (light emitting material), especially fluorescent dopants in organic electroluminescence devices.

Examples of the optional substituent(s) indicated by "substituted or unsubstituted" and "may be substituted" referred to above or hereinafter include an aryl group having from 6 to 60, preferably from 6 to 30, more preferably from 6 to 18 ring carbon atoms which is in turn unsubstituted or substituted, a heteroaryl group having from 5 to 60, preferably 5 to 30, more preferably 5 to 18 ring atoms which is in turn unsubstituted or substituted, an alkyl group having 1 to 20, preferably 1 to 8 carbon atoms, a cycloalkyl group having 3 to 20, preferably 3 to 6 carbon atoms, a group $OR^{20}$, an alkylhalide group having 1 to 20, preferably 1 to 8 carbon atoms, a group $N(R^{22})_2$, a halogen atom (fluorine, chlorine, bromine, iodine), a cyano group, a carboxyalkyl group having 1 to 20 carbon atoms, preferably 1 to 8 carbon atoms, a carboxamidalkyl group having 1 to 20 carbon atoms, preferably 1 to 8 carbon atoms, a silyl group $SiR^{24}R^{25}R^{26}$, $B(R^{21})_2$, a group $SR^{20}$, a carboxyaryl group having 6 to 18 ring carbon atoms in the aryl residue and a carboxamidaryl group having 6 to 18 ring carbon atoms in the aryl residue;

or two adjacent substituents together form a ring structure which is in turn unsubstituted or substituted;

$R^{20}$, $R^{21}$, and $R^{22}$ each independently represents an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted and which is linked via a carbon atom to N, O, S or B; an alkyl group having from 1 to 20 carbon atoms which is unsubstituted or substituted; or a cycloalkyl group having from 3 to 20 ring carbon atoms which is unsubstituted or substituted;

and/or two residues $R^2$ and/or two residues $R^{21}$ together form a ring structure which is unsubstituted or substituted;

or $R^{20}$, $R^{21}$, and/or $R^{22}$ together with an adjacent substituent form a ring structure which is unsubstituted or substituted;

$R^{26}$ represents an aryl group having from 6 to 60, preferably from 6 to 30, more preferably from 6 to 18 ring carbon atoms which is unsubstituted or substituted; a heteroaryl group having from to 60, preferably 5 to 30, more preferably 5 to 18 ring atoms which is unsubstituted or substituted and which is linked via a carbon atom to N or Si; an alkyl group having from 1 to 20 carbon atoms which is unsubstituted or substituted; or a cycloalkyl group having from 3 to 20 ring carbon atoms which is unsubstituted or substituted; and $R^{24}$, $R^{25}$ are defined above.

The terms hydrogen, halogen, an alkyl group having from 1 to 20 carbon atoms which is unsubstituted or substituted, an alkylhalide group having from 1 to 20 carbon atoms which is unsubstituted or substituted, a cycloalkyl group having from 3 to 20 ring carbon atoms which is unsubstituted or substituted, a substituted or unsubstituted aromatic group having 6 to 60, preferably from 6 to 30, more preferably from 6 to 18 ring carbon atoms; a substituted or unsubstituted heteroaromatic group having 5 to 60, preferably 5 to 30, more preferably 5 to 18 ring atoms, a carboxyalkyl group having 1 to 20 carbon atoms, preferably 1 to 8 carbon atoms, a carboxamidalkyl group having 1 to 20 carbon atoms, preferably 1 to 8 carbon atoms, a carboxyaryl group having 6 to 18 ring carbon atoms in the aryl residue, a carboxamidaryl group having 6 to 18 ring carbon atoms in the aryl residue, $N(R^{22})_2$, $OR^{20}$, $SR^{20}$, $SR^{20}$, $SiR^{24}R^{25}R^{26}$ and $B(R^{21})_2$, are known in the art and generally have the following meaning, if said groups are not further specified in specific embodiments mentioned below:

In the invention, hydrogen includes isomers differing in the number of neutrons, i.e. protium, deuterium and tritium.

The substituted or unsubstituted aromatic group (also called aryl group) having 6 to 60, preferably from 6 to 30, more preferably from 6 to 18 ring carbon atoms most preferably having from 6 to 13 ring carbon atoms, may be a non-condensed aromatic group or a condensed aromatic group. Specific examples thereof include phenyl group, naphthyl group, phenanthryl group, biphenyl group, terphenyl group, fluoranthenyl group, triphenylenyl group, phenanthrenyl group, fluorenyl group, indenyl group, anthracenyl, chrysenyl, spirofluorenyl group, benzo[c]phenanthrenyl group, with phenyl group, naphthyl group, biphenyl group, terphenyl group, phenanthryl group, triphenylenyl group, fluorenyl group, indenyl group and fluoranthenyl group being preferred, phenyl group, 1-naphthyl group, 2-naphthyl group, biphenyl-2-yl group, biphenyl-3-yl group, biphenyl-4-yl group, phenanthrene-9-yl group, phenanthrene-3-yl group, phenanthrene-2-yl group, triphenylene-2-yl group, fluorene-2-yl group, especially a 9,9-di-$C_{1-20}$alkylfluorene-2-yl group, like a 9,9-dimethylfluorene-2-yl group, a 9,9-di-$C_{6-18}$arylfluorene-2-yl group, like a 9,9-diphenylfluorene-2-yl group, or a 9,9-di-$C_{5-18}$heteroarylfluorene-2-yl group, 1,1-dimethylindenyl group, fluoranthene-3-yl group, fluoranthene-2-yl group and fluoranthene-8-yl group being more preferred, and phenyl group being most preferred.

In the case of the rings $A_1$, $B_1$, $C_1$ and $D_1$, preferred substituted or unsubstituted aromatic group having 6 to 60, preferably from 6 to 30, more preferably from 6 to 18 ring carbon atoms are mentioned below.

The substituted or unsubstituted heteroaromatic group (also called heteroaryl group) having 5 to 60, preferably 5 to 30, more preferably 5 to 18 ring atoms, most preferably having from 5 to 13 ring atoms, may be a non-condensed heteroaromatic group or a condensed heteroaromatic group. Specific examples thereof include the residues of pyrrole ring, isoindole ring, benzofuran ring, isobenzofuran ring, benzothiophene, dibenzothiophene ring, isoquinoline ring, quinoxaline ring, quinazoline, phenanthridine ring, phenanthroline ring, pyridine ring, pyrazine ring, pyrimidine ring, pyridazine ring, indole ring, quinoline ring, acridine ring, carbazole ring, furan ring, thiophene ring, benzoxazole ring, benzothiazole ring, benzimidazole ring, dibenzofuran ring, triazine ring, oxazole ring, oxadiazole ring, thiazole ring, thiadiazole ring, triazole ring, imidazole ring, indolidine ring, imidazopyridine ring, 4-imidazo[1,2-a]benzimidazoyl, 5-benzimidazo[1,2-a]benzimidazoyl, and benzimidazolo[2,1-b][1,3]benzothiazolyl, with the residues of benzofuran ring, indole ring, benzothiophene ring, dibenzofuran ring, carbazole ring, and dibenzothiophene ring being preferred, and the residues of benzofuran ring, 1-phenylindol ring, benzothiophene ring, dibenzofuran-1-yl group, dibenzofuran-3-yl group, dibenzofuran-2-yl group, dibenzofuran-4-yl group, 9-phenylcarbazole-3-yl group, 9-phenylcarbazole-2-yl group, 9-phenylcarbazole-4-yl group, dibenzothiophene-2-yl group, and dibenzothiophene-4-yl, dibenzothiophene-1-yl group, and dibenzothiophene-3-yl group being more preferred.

In the case of the rings $A_1$, $B_1$, $C_1$ and $D_1$, preferred substituted or unsubstituted heteroaromatic group having 5 to 60, preferably 5 to 30, more preferably 5 to 18 ring atoms are mentioned below.

Examples of the alkyl group having from 1 to 20 carbon atoms which is unsubstituted or substituted include methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, with methyl group, ethyl group, n-propyl group, isopropyl group, n-butyl group, s-butyl group, isobutyl group, t-butyl group being preferred. Preferred are alkyl groups having 1 to 8 carbon atoms, more preferably 1 to 4 carbon atoms. Suitable examples for alkyl groups having 1 to 8 carbon atoms respectively 1 to 4 carbon atoms are mentioned before.

Examples of the alkylhalide group having from 1 to 20 carbon atoms which is unsubstituted or substituted include those disclosed as alkyl groups wherein the hydrogen atoms thereof are partly or entirely substituted by halogen atoms. Preferred alkylhalide groups are fluoroalkyl groups having 1 to 20 carbon atoms including the alkyl groups mentioned above wherein the hydrogen atoms thereof are partly or entirely substituted by fluorine atoms, for example $CF_3$.

Examples of the cycloalkyl group having from 3 to 20 ring carbon atoms which is unsubstituted or substituted include cyclopropyl group, cyclobutyl group, cyclopentyl group, cyclohexyl group, cyclooctyl group, and adamantyl group, with cyclopentyl group, and cyclohexyl group being preferred. Preferred are cycloalkyl groups having 3 to 6 carbon atoms. Suitable examples for cycloalkyl groups having 3 to 6 carbon atoms are mentioned before.

Examples of halogen atoms include fluorine, chlorine, bromine, and iodine, with fluorine being preferred.

The group $OR^2$ is preferably a $C_{1-20}$alkoxy group or a $C_{6-18}$aryloxy group. Examples of an alkoxy group having 1 to 20 carbon atoms, preferably 1 to 8 carbon atoms, include those having an alkyl portion selected from the alkyl groups mentioned above. Examples of an aryloxy group having 6 to 18 ring carbon atoms include those having an aryl portion selected from the aryl groups mentioned above, for example —OPh.

The group $SR^{20}$ is preferably a $C_{1-20}$alkylthio group or a $C_{6-18}$arylthio group. Examples of an alkylthio group having 1 to 20 carbon atoms, preferably 1 to 8 carbon atoms, include those having an alkyl portion selected from the alkyl groups mentioned above. Examples of an arylthio group having 6 to 18 ring carbon atoms include those having an aryl portion selected from the aryl groups mentioned above, for example —SPh.

The group $N(R^{22})_2$ is preferably an $C_{1-20}$alkyl and/or $C_{6-18}$aryl and/or heteroaryl (having 5 to 18 ring atoms) substituted amino group. Examples of an alkylamino group (alkyl substituted amino group) having 1 to 20 ring carbon atoms include those having an alkyl portion selected from the alkyl groups mentioned above. Examples of an arylamino group (aryl substituted amino group) having 6 to 18 ring carbon atoms include those having an aryl portion selected from the aryl groups mentioned above, for example $—NPh_2$. Examples of a heteroarylamino group (heteroaryl substituted amino group), preferably a heteroarylamino group having 5 to 18 ring atoms include those having an aryl portion selected from the heteroaryl groups mentioned above.

The group $B(R^{21})_2$ is preferably an $C_{1-20}$alkyl and/or $C_{6-18}$aryl and/or heteroaryl (having 5 to 18 ring atoms) substituted boron group. Examples of an alkylboron group (alkyl substituted boron group) having 1 to 20 ring carbon atoms include those having an alkyl portion selected from the alkyl groups mentioned above. Examples of an arylboron group (aryl substituted boron group) having 6 to 18 ring carbon atoms include those having an aryl portion selected from the aryl groups mentioned above. Examples of a heteroarylboron group (heteroaryl substituted boron group), preferably a heteroarylboron group having 5 to 18 ring atoms include those having an aryl portion selected from the heteroaryl groups mentioned above.

The group $SiR^{24}R^{25}R^{26}$ is preferably a $C_{1-20}$alkyl and/or $C_{6-18}$aryl substituted silyl group. Preferred examples of $C_{1-20}$alkyl and/or $C_{6-18}$aryl substituted silyl groups include alkylsilyl groups having 1 to 8 carbon atoms in each alkyl residue, preferably 1 to 4 carbon atoms, including trimethylsilyl group, triethylsilyl group, tributylsilyl group, dimethylethylsilyl group, t-butyldimethylsilyl group, propyldimethylsilyl group, dimethylisopropylsilyl group, dimethylpropylsilyl group, dimethylbutylsilyl group, dimethyltertiarybutylsilyl group, diethylisopropylsilyl group, and arylsilyl groups having 6 to 18 ring carbon atoms in each aryl residue, preferably triphenylsilyl group, and alky/arylsilyl groups, preferably phenyldimethylsilyl group, diphenylmethylsilyl group, and diphenyltertiarybutylsilyl group, with diphenyltertiarybutylsilyl group and t-butyldimethylsilyl group being preferred.

Examples of a carboxyalkyl group having 1 to 20 carbon atoms, preferably 1 to 8 carbon atoms, those having an alkyl portion selected from the alkyl groups mentioned above.

Examples of a fluoroalkyl group having 1 to 20 carbon atoms include the alkyl groups mentioned above wherein the hydrogen atoms thereof are partly or entirely substituted by fluorine atoms.

Examples of a carboxamidalkyl group (alkyl substituted amide group) having 1 to 20 carbon atoms, preferably 1 to 8 carbon atoms include those having an alkyl portion selected from the alkyl groups mentioned above.

Examples of a carboxamidaryl group (aryl substituted amide group) having 6 to 18 carbon atoms, preferably 6 to 13 carbon atoms, include those having an aryl portion selected from the aryl groups mentioned above.

The optional substituents preferably each independently represents an aryl group having from 6 to 18 ring carbon atoms which is unsubstituted or substituted; a heteroaryl group having from 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted; CN; $N(R^{22})_2$; $SiR^{24}R^{25}R^{26}$, $SR^{20}$ or $OR^{20}$;

or two adjacent substituents together form a ring structure which is in turn unsubstituted or substituted;

$R^{20}$ and $R^{22}$ each independently represents an aryl group having from 6 to 18 ring carbon atoms which is unsubstituted or substituted; a heteroaryl group having from 5 to 18 ring atoms which is unsubstituted or substituted and which is linked via a carbon atom to N or O or S; an alkyl group having from 1 to 20 carbon atoms which is unsubstituted or substituted; or a cycloalkyl group having from 3 to 20 ring carbon atoms which is unsubstituted or substituted;

or $R^{20}$ and/or $R^{22}$ together with an adjacent substituent form a ring structure which is in turn unsubstituted or substituted;

$R^{24}$, $R^{25}$ and $R^{26}$ represents an aryl group having from 6 to 18 ring carbon atoms which is unsubstituted or substituted; a heteroaryl group having from 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted.

More preferably, the optional substituents each independently represents an aryl group having from 6 to 18 ring carbon atoms which is unsubstituted or substituted; a heteroaryl group having from 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted; CN; or $N(R^{22})_2$;

or two adjacent substituents together form a ring structure which is in turn unsubstituted or substituted;

$R^{22}$ represents an aryl group having from 6 to 18 ring carbon atoms which is unsubstituted or substituted; or an alkyl group having from 1 to 20 carbon atoms which is unsubstituted or substituted;

or $R^{22}$ together with an adjacent substituent forms a ring structure which is in turn unsubstituted or substituted.

Most preferably, the optional substituents each independently represents an alkyl group having 1 to 4 carbon atoms which is unsubstituted or substituted; a cycloalkyl group having from 3 to 6 ring carbon atoms which is unsubstituted or substituted; an aryl group having 6 to 13 ring carbon atoms which is unsubstituted or substituted; a heteroaryl group having from 5 to 13 ring atoms which is unsubstituted or substituted; CN; or $N(R^{22})_2$;

or two adjacent substituents together form a ring structure which is in turn unsubstituted or substituted;

$R^{22}$ represents an aryl group having from 6 to 18 ring carbon atoms which is unsubstituted or substituted; or an alkyl group having from 1 to 20 carbon atoms which is unsubstituted or substituted.

The optional substituents mentioned above may be further substituted by one or more of the optional substituents mentioned above.

The number of the optional substituents depends on the group which is substituted by said substituent(s). The maximum number of possible substituents is defined by the number of hydrogen atoms present. Preferred are 1, 2, 3, 5, 6, 7, 8 or 9 optional substituents per group which is substituted, more preferred are 1, 2, 3, 5, 5, 6 or 7 optional substituents, most preferred are 1, 2, 3, 4 or 5 optional substituents, further most preferred are 1, 2, 3, 4 or 5 optional substituents, even further most preferred are 1, 2, 3 or 4 optional substituents and even more further most preferred are 1 or 2 optional substituents per group which is substituted. In a further preferred embodiment, some or all of the groups mentioned above are unsubstituted.

In a further preferred embodiment, the total number of substituents in the compound of formula (I) is 0, 1, 2, 3, 4, 5, 6, 7 or 8, preferably 0, 1, 2, 3, 4, 5, or 6, i.e. the remaining residues are hydrogen.

The "carbon number of a to b" in the expression of "substituted or unsubstituted X group having a to b carbon atoms" is the carbon number of the unsubstituted X group and does not include the carbon atom(s) of an optional substituent.

The term "unsubstituted" referred to by "unsubstituted or substituted" means that a hydrogen atom is not substituted by one the groups mentioned above.

An index of 0 in the definition in any formula mentioned above and below means that a hydrogen atom is present at the position defined by said index.

The compounds of formula (I)

In the heterocyclic compounds represented by formula (I)

(I)

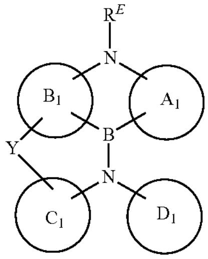

the residues have the following meanings:

ring $A_1$, ring $B_1$, ring $C_1$ and ring $D_1$ each independently represents a substituted or unsubstituted aromatic group having 6 to 60, preferably from 6 to 30, more preferably from 6 to 18 ring carbon atoms, or a substituted or unsubstituted heteroaromatic group having 5 to 60, preferably to 30, more preferably 5 to 18 ring atoms;

or ring $C_1$ and ring $D_1$ may be connected via a direct bond, O, S, $NR^{23}$, $SIR^{24}R^{25}$ or $CR^{27}R^{28}$, preferably via a direct bond;

$R^E$ represents hydrogen; an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted; an alkenyl group having from 2 to 20 carbon atoms which is unsubstituted or substituted; an iminyl group $R^{23}$—C═N; an alkynyl group having from 2 to 20 carbon atoms which is unsubstituted or substituted;

or $R^E$ or a substituent on $R^E$ may be bonded to the ring $A_1$ and/or to the ring $B_1$ or to a substituent on the ring $A_1$ and or the ring $B_1$ to form a ring structure which is unsubstituted or substituted, Y represents a direct bond, O, S, $NR^{23}$, $SIR^{24}R^{25}$ or $CR^{27}R^{28}$, preferably a direct bond; in the case that Y is a direct bond, ring $B_1$ and $C_1$ may additionally be connected via O, S, $NR^{23}$, $SIR^{24}R^{25}$ or $CR^{27}R^{28}$;

$R^{23}$, $R^{24}$, $R^{25}$, $R^{27}$ and $R^{28}$ each independently represents an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted and which is linked via a carbon atom to N or Si; an alkyl group having from 1 to 20 carbon atoms which is unsubstituted or substituted; or a cycloalkyl group having from 3 to 20 ring carbon atoms which is unsubstituted or substituted;

and/or two residues $R^{24}$ and $R^{25}$ and/or two residues $R^{27}$ and $R^{28}$ together form a ring structure which is unsubstituted or substituted.

Preferably, rings $A_1$, $B_1$, $C_1$ and $D_1$ each independently represents a substituted or unsubstituted aromatic group having 6 to 60, preferably from 6 to 30, more preferably from 6 to 18 ring carbon atoms, or a substituted or unsubstituted heteroaromatic group having 5 to 60, preferably 5 to 30, more preferably 5 to 18 ring atoms of the following formulae:

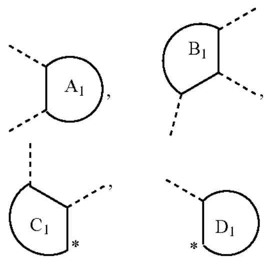

wherein ring $C_1$ and ring $D_1$ may be connected via a direct bond, O, S, $NR^{23}$, $SIR^{24}R^{25}$ or $CR^{27}R^{28}$, preferably via a direct bond;

the star is the position of the preferred bonding optional sites between ring $C_1$ and ring $D_1$; and the dotted lines are bonding sites.

More preferred rings $A_1$, $B_1$, $C_1$ and $D_1$ are:

Non-condensed aromatic groups or condensed aromatic groups. Specific examples thereof are based on phenyl, naphthyl, phenanthrene, biphenyl, terphenyl, fluoranthene, triphenylene, fluorene, indene, anthracene, chrysene, spirofluorene, benzo[c]phenanthrene, with phenyl, naphthyl, biphenyl, terphenyl, phenanthrene, triphenylene, fluorene, indene and fluoranthene being preferred, and phenyl and naphthyl being most preferred;

or

Non-condensed heteroaromatic groups or condensed heteroaromatic groups. Specific examples thereof are based on pyrrole, isoindole, benzofuran, isobenzofuran, benzothiophene, dibenzothiophene, isoquinoline, quinoxaline, quinazoline, phenanthridine, phenanthroline, pyridine, pyrazine, pyrimidine, pyridazine, indole, quinoline, acridine, carbazole, furan, thiophene, benzoxazole, benzothiazole, benzimidazole, dibenzofuran, triazine, oxazole, oxadiazole, thiazole, thiadiazole, triazole, imidazole, indolidine, imidazopyridine, 4-imidazo[1,2-a]benzimidazol, 5-benzimidazo[1,2-a]benzimidazol, and benzimidazolo[2,1-b][1,3]benzothiazol, with indole, especially 1-phenylindole, benzothiophene, dibenzofuran, carbazole, dibenzothiophene, benzofuran, and benzothiophene being preferred.

More preferably, rings $A_1$, $B_1$, $C_1$ and $D_1$ are represented by the following formulae:

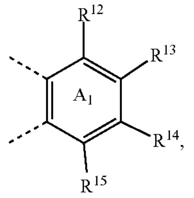

wherein the dotted lines are bonding sites and the residues $R^{12}$, $R^{13}$, $R^{14}$ and $R^{15}$ are defined below;

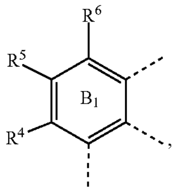

wherein the dotted lines are bonding sites and the residues $R^4$, $R^5$ and $R^6$ are defined below;

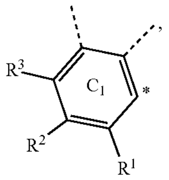

wherein the dotted lines are bonding sites and the residues $R^1$, $R^2$ and $R^3$ are defined below; wherein ring $C_1$ and ring $D_1$ may be connected via a direct bond, O, S, $NR^{23}$, $SIR^{24}R^{25}$ or $CR^{27}R^{28}$, preferably via a direct bond, and the star is the position of the preferred optional bonding site to ring $D_1$;

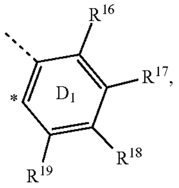

wherein the dotted lines are bonding and the residues $R^{16}$, $R^{17}$, $R^{18}$ and $R^{19}$ are defined below; wherein ring $C_1$ and ring $D_1$ may be connected via a direct bond, O, S, $NR^{23}$, $SIR^{24}R^{25}$ or $CR^{27}R^{28}$, preferably via a direct bond, and the star is the position of the preferred optional bonding site to ring $C_1$.

Examples for ring structures formed by two adjacent substituents are shown below (the ring structures below may be substituted by one or more of the substituents mentioned above):

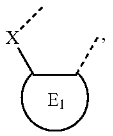

preferably

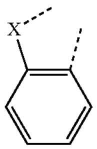

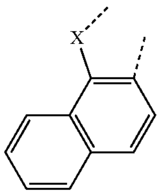

-continued

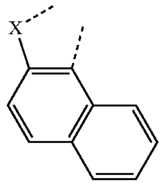

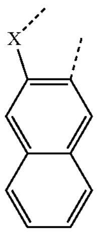

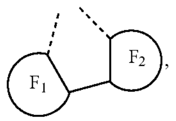

preferably

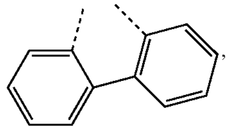

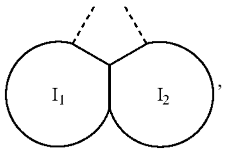

preferably

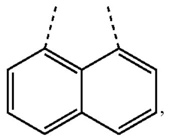

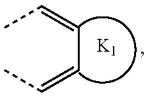

preferably

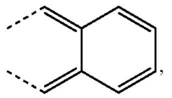

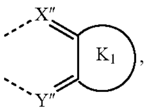

preferably

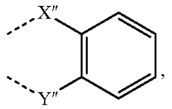

e.g.

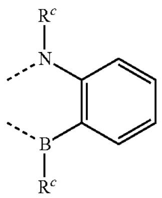

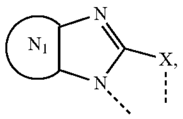

preferably

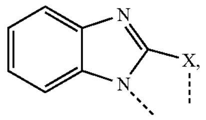

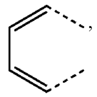

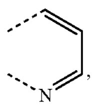

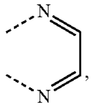

wherein X is O, $CR^aR^b$, S or $NR^c$,

X" and Y" each independently represents O, $CR^aR^b$, S, $BR^c$ or $NR^c$, $R^a$ and $R^b$ each independently represents $C_1$ to $C_8$ alkyl or substituted or unsubstituted $C_6$ to $C_{18}$ aryl, preferably $C_1$ to $C_4$ alkyl or substituted or unsubstituted $C_6$ to $C_{10}$ aryl, more preferably methyl or unsubstituted or substituted phenyl, $R^c$ represents $C_1$ to $C_8$ alkyl, preferably $C_1$ to $C_4$ alkyl, or substituted or unsubstituted $C_6$ to $C_{10}$ aryl, preferably unsubstituted or substituted phenyl, $E_1$, $F_1$, $F_2$, $G_1$, $H_1$, $I_1$, $I_2$, $K_1$, $L_1$, $M_1$ and $N_1$ each independently represents a substituted or unsubstituted aromatic group having 6 to 60, preferably from 6 to 30, more preferably from 6 to 18 ring carbon atoms, or a substituted or unsubstituted heteroaromatic group having 5 to 60, preferably to 30, more preferably 5 to 18 ring atoms, and the dotted lines are bonding sites.

Examples for the case that $R^E$ or a substituent on $R^E$ may be bonded to the ring $A_1$ and/or to the ring $B_1$ or to a substituent on the ring $A_1$ and or the ring $B_1$ to form a ring structure which is unsubstituted or substituted are:

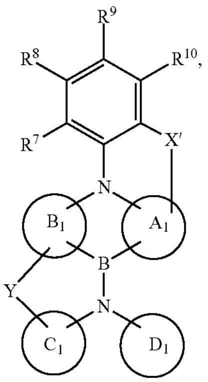

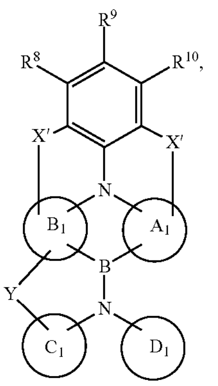

-continued

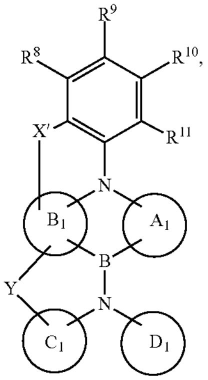

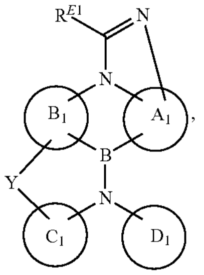

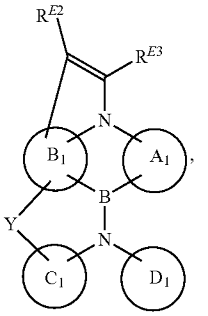

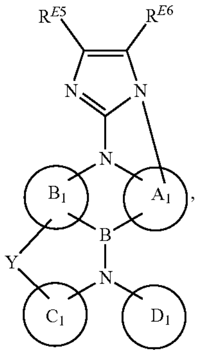

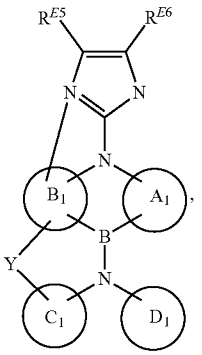

preferably

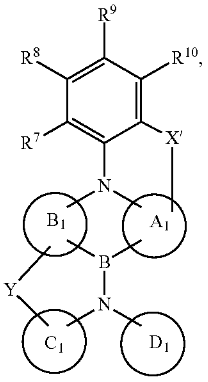

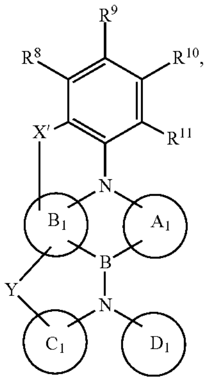

wherein $R^{E1}$, $R^{E2}$, $R^{E3}$, $R^{E5}$ and $R^{E6}$ each independently represents $C_1$ to $C_8$ alkyl or substituted or unsubstituted $C_6$ to $C_{18}$ aryl, preferably $C_1$ to $C_4$ alkyl or substituted or unsubstituted $C_6$ to $C_{10}$ aryl, more preferably methyl or unsubstituted or substituted phenyl, or two adjacent residues $R^{E2}$ and $R^{E3}$ or $R^{E5}$ and $R^{E6}$ together form a substituted or unsubstituted ring structure;

X' represents a direct bond, O, S, $NR^{23}$, $SiR^{24}R^{25}$, $CR^{27}R^{28}$, or $BR^{21}$, the rings $A_1$, $B_1$, $C_1$, $D_1$, $R^{21}$, $R^{23}$, $R^{24}$, $R^{25}$, $R^{27}$, $R^{28}$ and Y are defined above and below, and $R^7$, $R^8$, $R^9$, $R^{10}$ and $R^{11}$ are defined below.

Y represents a direct bond, O, S, $NR^{23}$, $SIR^{24}R^{25}$ or $CR^{27}R^{28}$, preferably a direct bond;

in the case that Y is a direct bond, ring $B_1$ and $C_1$ may additionally be connected via O, S, $NR^{23}$, $SIR^{24}R^{25}$ or $CR^{27}R^{28}$.

The case that Y is a direct bond and ring $B_1$ and $C_1$ additionally are connected via O, S, $NR^{23}$, $SIR^{24}R^{25}$ or $CR^{27}R^2$ is shown below:

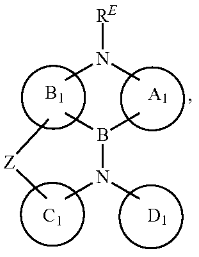

wherein Z is O, S, $NR^{23}$, $SIR^{24}R^{25}$ or $CR^{27}R^{28}$, and the residues and the indices have been mentioned above.

Preferably, Y is a direct bond.

Preferred heterocyclic compounds according to the present invention are represented formula (II)

(II)

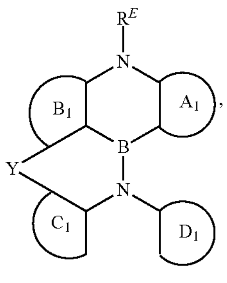

wherein the residues and the indices are mentioned above.

In a more preferred embodiment, the heterocyclic compounds according to the present invention are represented by formula (III)

(III)

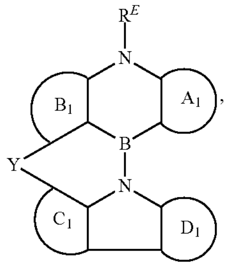

wherein the residues and the indices have been mentioned above.

In one embodiment, ring $A_1$ in the heterocyclic compounds according to the present invention is a substituted or unsubstituted heteroaromatic group having 5 to 60 ring atoms. Suitable heteroaromatic groups are mentioned above.

$R^E$ is preferably a group of the following formula (IV):

(IV)

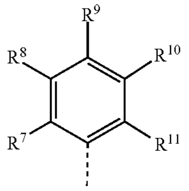

wherein $R^7$, $R^8$, $R^9$, $R^{10}$ and $R^{11}$ each independently represents hydrogen; an aryl group having from 6 to 60, preferably from 6 to 30, more preferably from 6 to 18 ring carbon atoms which is unsubstituted or substituted; a heteroaryl group having from 5 to 60, preferably 5 to 30, more preferably to 18 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SiR^{24}R^{25}R^{26}$ or halogen;

and/or two adjacent residues $R^7$, $R^8$, $R^9$, $R^{10}$ and/or $R^{11}$ together form a ring structure which is unsubstituted or substituted;

and/or $R^7$ and/or $R^{11}$ are connected to the ring $B_1$ and/or to the ring $A_1$ or to a substituent on the ring $A_1$ and or the ring $B_1$ to form a ring structure which is unsubstituted or substituted; and the dotted line is a bonding site.

Most preferably, the heterocyclic compounds according to the present invention are represented by formula (V)

(V)

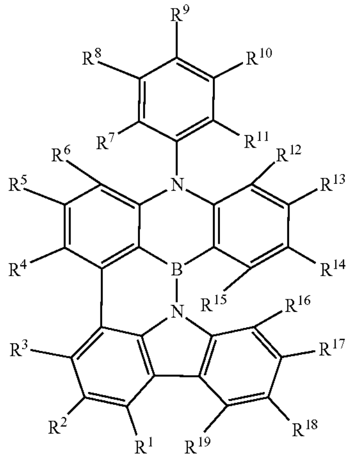

wherein $R^1$, $R^2$, $R^3$, $R^4$, $R^5$, $R^6$, $R^{12}$, $R^{13}$, $R^{14}$, $R^{15}$, $R^{16}$, $R^{17}$, $R^{18}$ and $R^{19}$ each independently represents hydrogen; an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SiR^{24}R^{25}R^{26}$ or halogen;

or two adjacent residues $R^1$, $R^2$ and/or $R^3$ and/or two adjacent residues $R^4$, $R^5$ and/or $R^6$ and/or two adjacent residues $R^{12}$, $R^{13}$, $R^{14}$ and/or $R^{15}$, and/or two adjacent residues $R^{11}$, $R^{17}$, $R^{18}$ and/or $R^{19}$ together form a ring structure which is unsubstituted or substituted, and/or two adjacent residues $R^7$, $R^8$, $R^9$, $R^{10}$ and/or $R^{11}$ together form a ring structure which is unsubstituted or substituted;

and/or $R^7$ and/or $R^{11}$ are connected to $R^6$ and/or $R^{12}$ to form a ring structure which is unsubstituted or substituted;

$R^{20}$, $R^{21}$, and $R^{22}$ each independently represents an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted; an alkyl group having from 1 to 20 carbon atoms which is unsubstituted or substituted; or a cycloalkyl group having from 3 to 20 ring carbon atoms which is unsubstituted or substituted;

and/or two residues $R^{22}$ and/or two residues $R^{21}$ together form a ring structure which is unsubstituted or substituted;

or $R^{20}$, $R^{21}$, and/or $R^{22}$ together with an adjacent residue $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ or $R^{19}$ forms a ring structure which is unsubstituted or substituted; and $R^{24}$, $R^{25}$ and $R^{26}$ each independently represents an aryl group having from 6 to 60, preferably from 6 to 30, more preferably from 6 to 18 ring carbon atoms which is unsubstituted or substituted; a heteroaryl group having from 5 to 60, preferably 5 to 30, more preferably 5 to 18 ring atoms which is unsubstituted or substituted; an alkyl group having from 1 to 20 carbon atoms which is unsubstituted or substituted; or a cycloalkyl group having from 3 to 20 ring carbon atoms which is unsubstituted or substituted.

Examples for ring structures formed by two adjacent residues $R^1$, $R^2$ and/or $R^3$ and/or two adjacent residues $R^4$, $R^5$ and/or $R^6$ and/or two adjacent residues $R^7$, $R^8$, $R^9$, $R^{10}$ and/or $R^{11}$ and/or two adjacent residues $R^{12}$, $R^{13}$, $R^{14}$ and/or $R^{15}$, and/or two adjacent residues $R^{11}$, $R^{17}$, $R^{18}$ and/or $R^{19}$ are shown below (the ring structures below may be substituted by one or more of the substituents mentioned above):

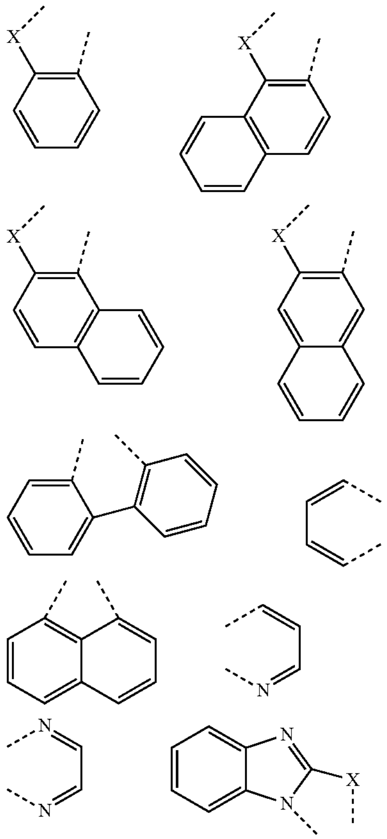

wherein X is O, $CR^aR^b$, S or $NR^c$, $R^a$ and $R^b$ each independently represents $C_1$ to $C_8$ alkyl or substituted or unsubstituted $C_6$ to $C_{18}$ aryl, preferably $C_1$ to $C_4$ alkyl or substituted or unsubstituted $C_6$ to $C_{10}$ aryl, more preferably methyl or unsubstituted or substituted phenyl, $R^c$ represents $C_1$ to $C_8$ alkyl, preferably $C_1$ to $C_4$ alkyl, or substituted or unsubstituted $C_6$ to $C_{10}$ aryl, preferably unsubstituted or substituted phenyl.

Examples for the case that $R^7$ and/or $R^{11}$ are connected to $R^6$ and/or $R^{12}$ to form a ring structure which is unsubstituted or substituted are:

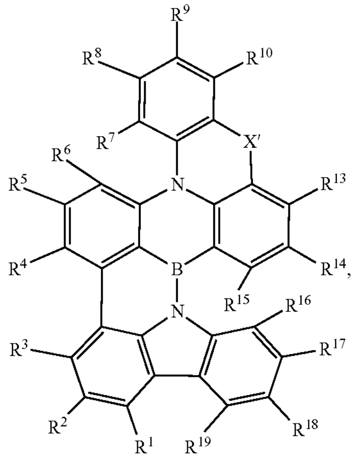

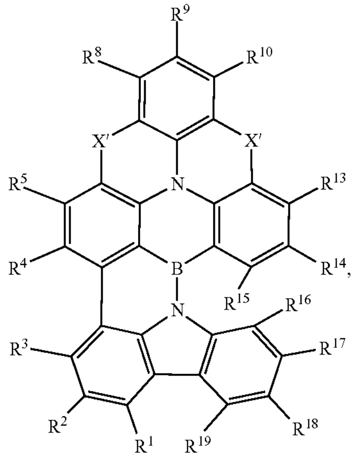

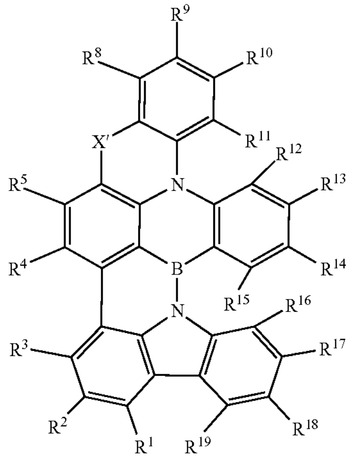

wherein

X' represents a direct bond, O, S, $NR^{23}$, $SIR^{24}R^{25}$, $CR^{27}R^{28}$, or $BR^{21}$, and all other residues are defined above and below.

Preferably, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ and $R^{19}$ each independently represents hydrogen, an aryl group having from 6 to 18 ring carbon atoms which is unsubstituted or substituted; a heteroaryl group having from 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted; CN; $N(R^{22})_2$; $SiR^{24}R^{25}R^{26}$, $SR^{20}$ or $OR^{20}$;

or two adjacent residues $R^1$, $R^2$ and/or $R^3$ and/or two adjacent residues $R^4$, $R^5$ and/or $R^6$ and/or two adjacent residues $R^7$, $R^8$, $R^9$, $R^{10}$ and/or $R^{11}$ and/or two adjacent residues $R^{12}$, $R^{13}$, $R^{14}$ and/or $R^{15}$, and/or two adjacent residues $R^{11}$, $R^{17}$, $R^{18}$ and/or $R^{19}$ together form a ring structure which is unsubstituted or substituted, and/or $R^7$ and/or $R^{11}$ are connected to $R^6$ and/or $R^{12}$ to form a ring structure which is unsubstituted or substituted;

$R^{20}$ and $R^{22}$ each independently represents an aryl group having from 6 to 18 ring carbon atoms which is unsubstituted or substituted; a heteroaryl group having from 5 to 18 ring atoms which is unsubstituted or substituted; an alkyl group having from 1 to 20 carbon atoms which is unsubstituted or substituted; or a cycloalkyl group having from 3 to 20 ring carbon atoms which is unsubstituted or substituted;

or $R^{20}$ and/or $R^{22}$ together with an adjacent residue $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ or $R^{19}$ forms a ring structure which is unsubstituted or substituted; and $R^{24}$, $R^{25}$ and $R^{26}$ represents an aryl group having from 6 to 18 ring carbon atoms which is unsubstituted or substituted; a heteroaryl group having from 5 to 18 ring atoms which is unsubstituted or; an alkyl group having from 1 to 20 carbon atoms which is unsubstituted or substituted; a cycloalkyl group having from 3 to 20 ring carbon atoms which is unsubstituted or substituted.

More preferably, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ and $R^{19}$ each independently represents hydrogen, an aryl group having from 6 to 18 ring carbon atoms which is unsubstituted or substituted; a heteroaryl group having from 5 to 18 ring atoms which is unsubstituted or substituted; an alkyl group having from 1 to 20 carbon atoms which is unsubstituted or substituted; a cycloalkyl group having from 3 to 20 ring carbon atoms which is unsubstituted or substituted; CN; or $N(R^{22})_2$;

or two adjacent residues $R^1$, $R^2$ and/or $R^3$ and/or two adjacent residues $R^4$, $R^5$ and/or $R^6$ and/or two adjacent residues $R^7$, $R^8$, $R^9$, $R^{10}$ and/or $R^{11}$ and/or two adjacent residues $R^{12}$, $R^{13}$, $R^{14}$ and/or $R^{15}$, and/or two adjacent residues $R^{11}$, $R^{17}$, $R^{18}$ and/or $R^{19}$ together form a ring structure which is unsubstituted or substituted, and/or $R^7$ and/or $R^{11}$ are connected to $R^6$ and/or $R^{12}$ to form a ring structure which is unsubstituted or substituted;

$R^{22}$ represents an aryl group having from 6 to 18 ring carbon atoms which is unsubstituted or substituted; or an alkyl group having from 1 to 20 carbon atoms which is unsubstituted or substituted;

or $R^{22}$ together with an adjacent residue $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ or $R^{19}$ forms a ring structure which is unsubstituted or substituted.

Most preferably, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ and $R^{19}$ each independently represents hydrogen, an alkyl group having 1 to 4 carbon atoms which is unsubstituted or substituted; a cycloalkyl group having from 3 to 6 ring carbon atoms which is unsubstituted or substituted; an aryl group having 6 to 13 ring carbon atoms which is unsubstituted or substituted; a heteroaryl group having from 5 to 13 ring atoms which is unsubstituted or substituted; CN; or $N(R^{22})_2$;

or two adjacent residues $R^1$, $R^2$ and/or $R^3$ and/or two adjacent residues $R^4$, $R^5$ and/or $R^6$ and/or two adjacent residues $R^7$, $R^8$, $R^9$, $R^{10}$ and/or $R^{11}$ and/or two adjacent residues $R^{12}$, $R^{13}$, $R^{14}$ and/or $R^{15}$, and/or two adjacent residues $R^{11}$, $R^{17}$, $R^{18}$ and/or $R^{19}$ together form a ring structure which is unsubstituted or substituted, and/or $R^7$ and/or $R^{11}$ are connected to $R^6$ and/or $R^{12}$ to form a ring structure which is unsubstituted or substituted;

$R^{22}$ represents an aryl group having from 6 to 18 ring carbon atoms which is unsubstituted or substituted; or an alkyl group having from 1 to 20 carbon atoms which is unsubstituted or substituted.

In a further preferred embodiment 0, 1, 2, 3, 4, 5, 6, 7 or 8, preferably 0, 1, 2, 3, 4, 5, or 6 of the residues $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$ and $R^{19}$ are not hydrogen; i.e. the remaining residues are hydrogen. Further preferably, 0, 1, 2, 3, 4, 5, 6, 7 or 8, preferably 0, 1, 2, 3, 4, 5, or 6, more preferably 0, 1, 2, 3 or 4 of the residues $R^2$, $R^5$, $R^9$, $R^{12}$, $R^{13}$, $R^{14}$, $R^{15}$, and $R^{18}$ are not hydrogen; i.e. the remaining residues are hydrogen.

In a preferred embodiment the heterocyclic compound according to the present invention is represented by one of the following formulae (VA)

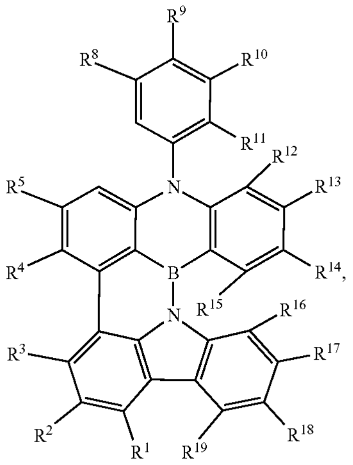

(VB)

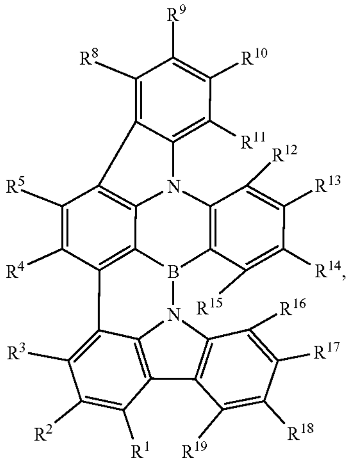

-continued (VC)

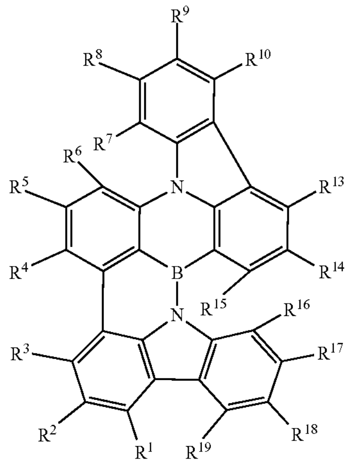

wherein the residues are defined as mentioned above, wherein in formula (VA) and formula (VB)— two adjacent residues $R^1$, $R^2$ and/or $R^3$ and/or two adjacent residues $R^4$ and $R^5$ and/or two adjacent residues $R^8$, $R^9$, $R^{10}$ and/or $R^{11}$ and/or two adjacent residues $R^{12}$, $R^{13}$, $R^{14}$ and/or $R^{15}$, and/or two adjacent residues $R^{11}$, $R^{17}$, $R^{18}$ and/or $R^{19}$ may form together a ring structure which is unsubstituted or substituted;

in formula (VC)— two adjacent residues $R^1$, $R^2$ and/or $R^3$ and/or two adjacent residues $R^4$, $R^5$ and/or $R^6$ and/or two adjacent residues $R^7$, $R^8$, $R^9$ and/or $R^{10}$ and/or two adjacent residues $R^{13}$, $R^{14}$ and/or $R^{15}$, and/or two adjacent residues $R^{11}$, $R^{17}$, $R^{18}$ and/or $R^{19}$ may form together a ring structure which is unsubstituted or substituted.

More preferably, the heterocyclic compound according to the present invention is represented by one of the following formulae (VCa)

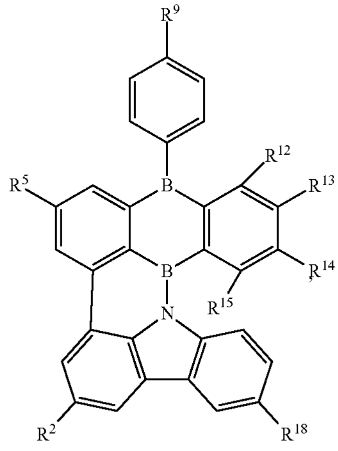

-continued (VBa)

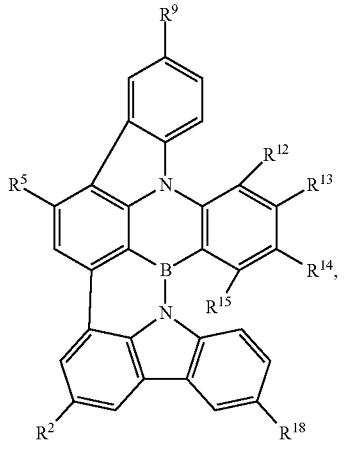

(VCa)

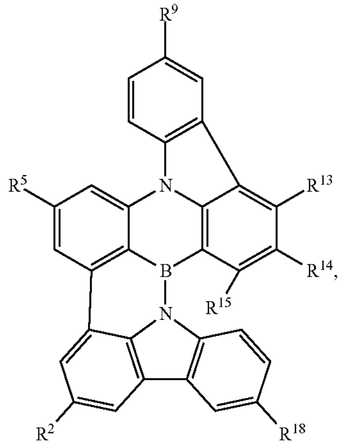

wherein the residues are defined as mentioned above, wherein in formula (VAa) and formula (VBa)— two adjacent residues $R^{12}$, $R^{13}$, $R^{14}$ and/or $R^{15}$ may form together a ring structure which is unsubstituted or substituted;

in formula (VCa)— two adjacent residues $R^{13}$, $R^{14}$ and/or $R^{15}$ may form together a ring structure which is unsubstituted or substituted.

In one preferred embodiment, the heterocyclic compound according to the present invention is represented by formula (VA), wherein two adjacent residues $R^1$, $R^2$ and/or $R^3$ and/or two adjacent residues $R^{11}$, $R^{17}$, $R^{18}$ and/or $R^{19}$ form together a ring structure which is unsubstituted or substituted.

In one preferred embodiment, the heterocyclic compound according to the present invention is represented by formula (VA), wherein at least one of $R^1$ to $R^3$ and/or $R^{16}$ to $R^{19}$ represents an aryl group having from 6 to 60 ring carbon atoms which is unsubstituted or substituted; a heteroaryl group having from 5 to 60 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SiR^{24}R^{25}R^2$ or halogen;

and at least one of $R^4$ to $R^5$ and/or $R^{12}$ to $R^{15}$ represents an aryl group having from 6 to 60 ring carbon atoms which is unsubstituted or substituted; a heteroaryl group having from 5 to 60 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SIR^{24}R^{25}R^{26}$ or halogen.

In a further preferred embodiment, the heterocyclic compound according to the present invention is represented by formula (VA), wherein at least one of $R^1$ to $R^3$ and at least one of $R^{16}$ to $R^{19}$ and at least one of $R^4$ to $R^5$ and at least one of $R^{12}$ to $R^{15}$ represents an aryl group having from 6 to 60 ring carbon atoms which is unsubstituted or substituted; a heteroaryl group having from 5 to 60 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SiR^{24}R^{25}R^{26}$ or halogen.

In one preferred embodiment, the heterocyclic compound according to the present invention is represented by formula (VA), wherein $R^9$ is a heteroaryl group having from 5 to 60 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SiR^{24}R^{25}R^{26}$ or halogen; and at least one of $R^{12}$ to $R^{15}$ represents an aryl group having from 6 to 60 ring carbon atoms which is unsubstituted or substituted; a heteroaryl group having from 5 to 60 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SIR^{24}R^{25}R^{26}$ or halogen.

In one preferred embodiment, the heterocyclic compound according to the present invention is represented by formula (VC), wherein at least one of $R^4$ to $R^6$, $R^{13}$ to $R^{15}$ represents an aryl group having from 6 to 60 ring carbon atoms which is unsubstituted or substituted; a heteroaryl group having from 5 to 60 ring atoms which is unsubstituted or substituted; an alkyl group having from 1 to 20 carbon atoms which is unsubstituted or substituted; an alkylhalide group having from 1 to 20 carbon atoms which is unsubstituted or substituted; a cycloalkyl group having from 3 to 20 ring carbon atoms which is unsubstituted or substituted; CN; $N(R^{22})_2$; $OR^{20}$; $SR^{20}$; $B(R^{21})_2$; $SIR^{24}R^{25}R^{26}$ or halogen.

In one preferred embodiment, the heterocyclic compound according to the present invention is represented by formula (VC) or (VB), wherein at least one of the residues $R^4$, $R^5$, $R^6$, $R^{12}$, $R^{13}$, $R^{14}$ or $R^{15}$ is $C_1$-$C_{10}$ alkyl, $C_3$-$C_{12}$ cycloalkyl, or $C_6$-$C_{10}$ aryl, preferably $C_1$-$C_4$ alkyl, $C_5$-$C_{10}$ cycloalkyl, or phenyl, more preferably tert-butyl.

Below, examples for compounds of formula (I) are given:
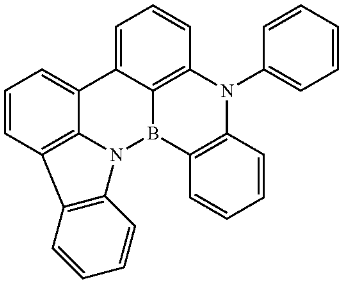
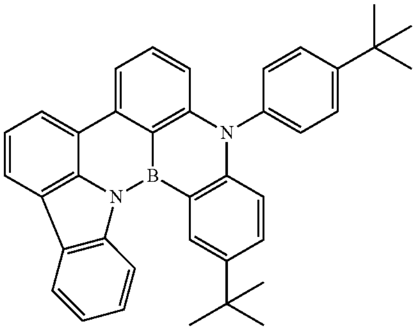
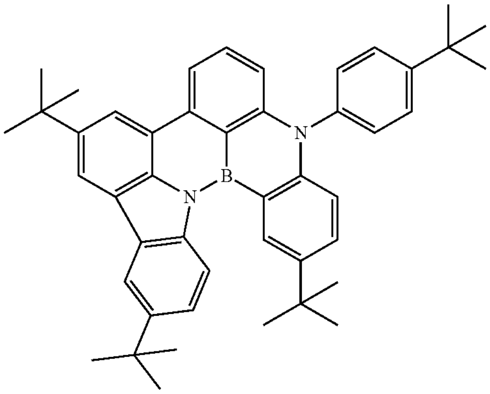
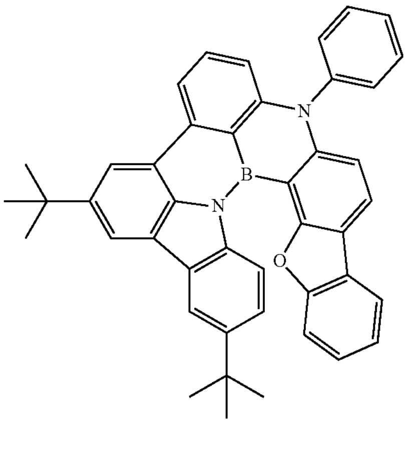
-continued
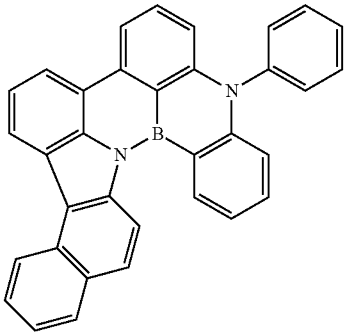
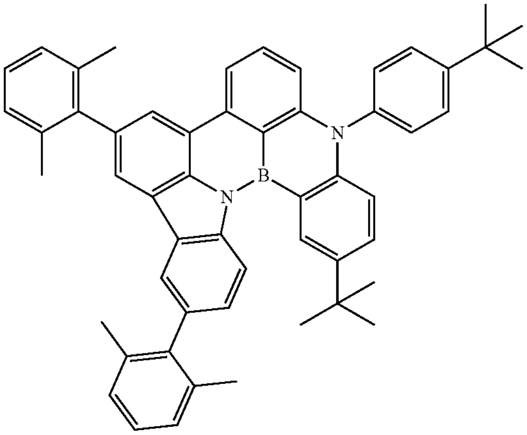
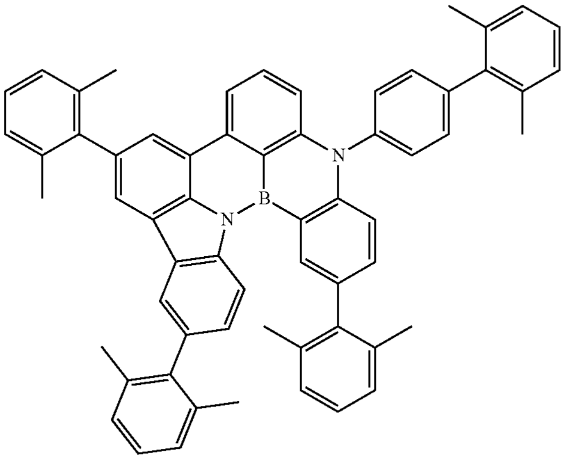
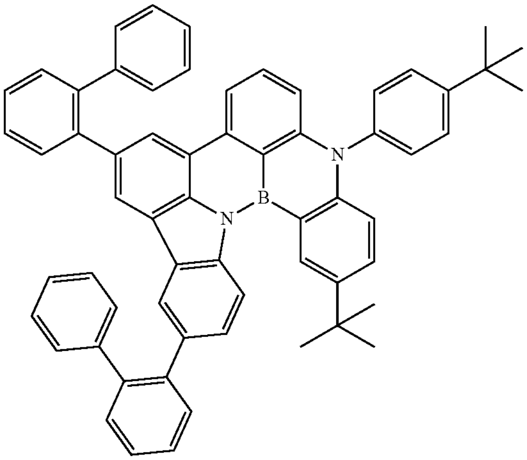

-continued
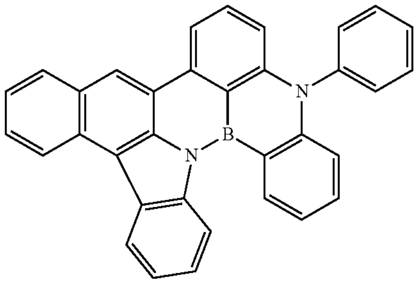
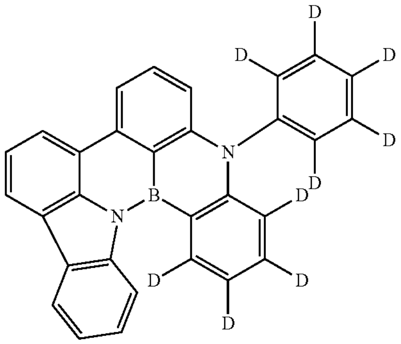
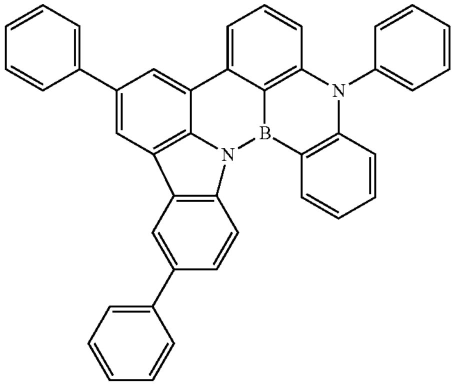
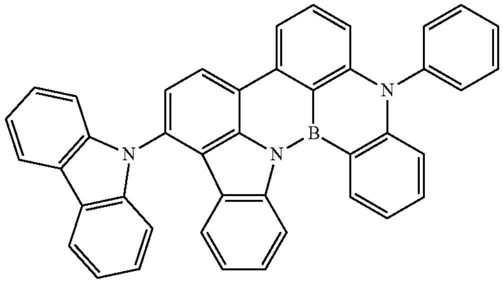
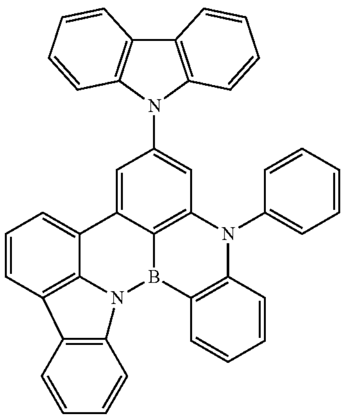
-continued
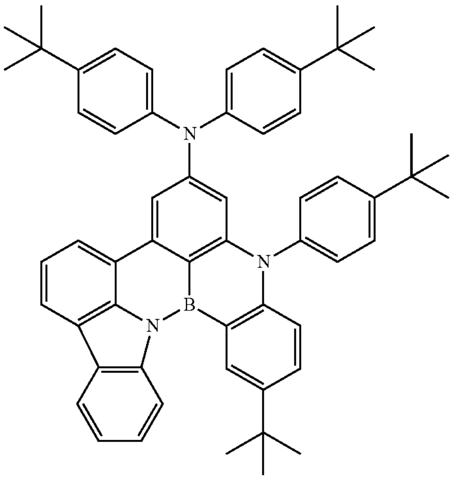
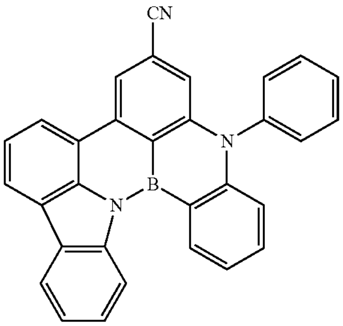
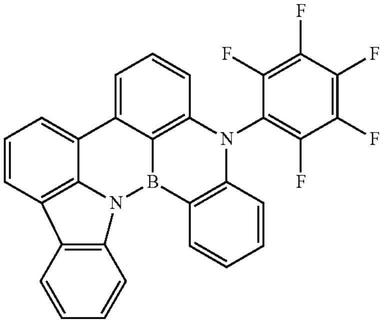
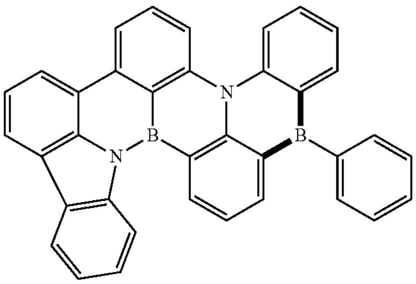
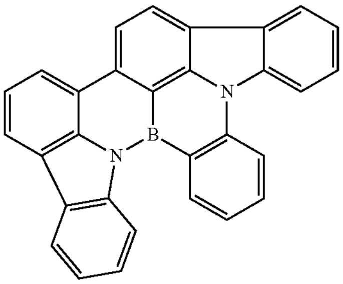

-continued
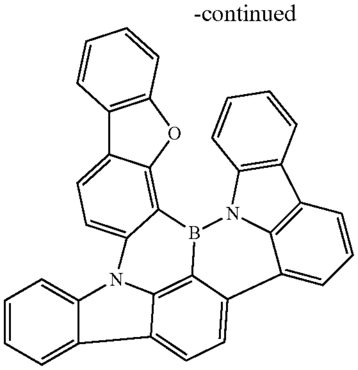
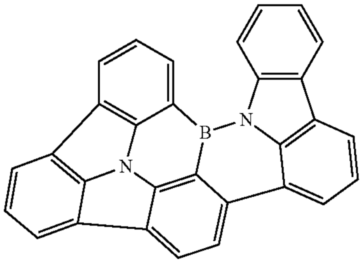
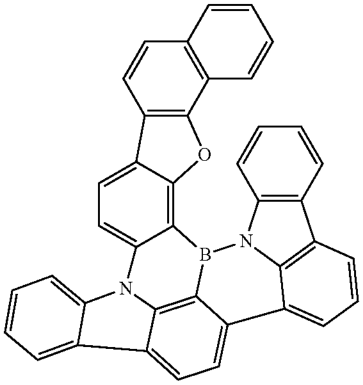
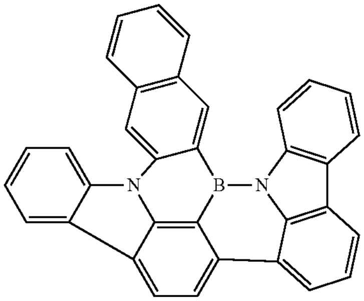
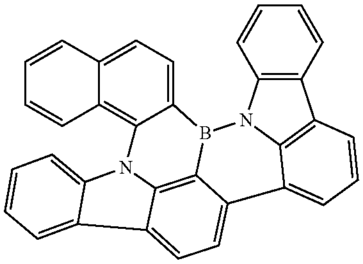
-continued
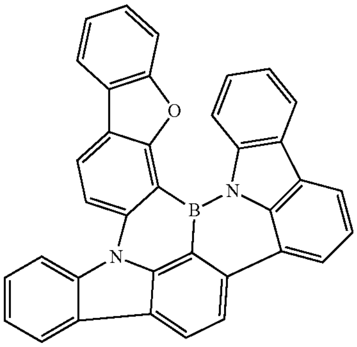
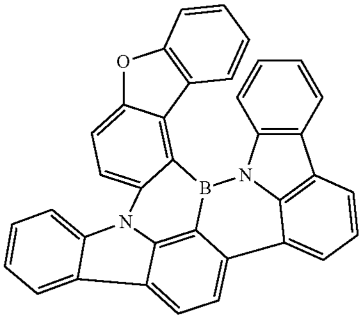
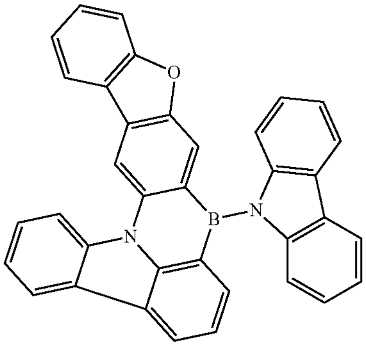
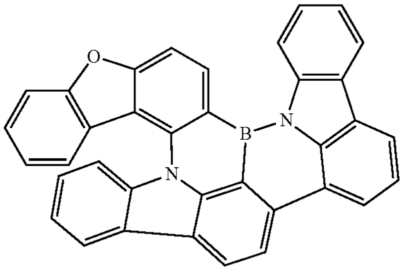
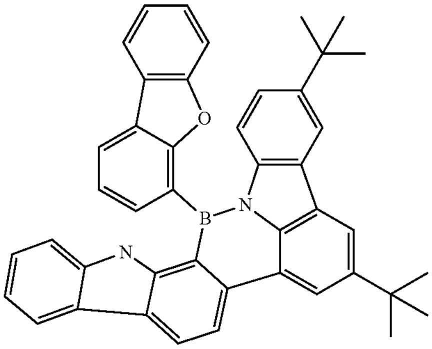

-continued
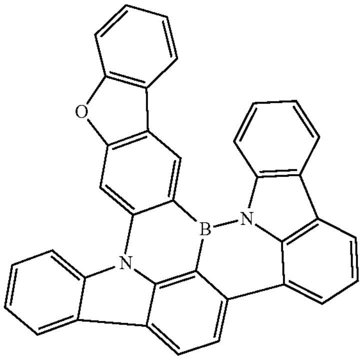
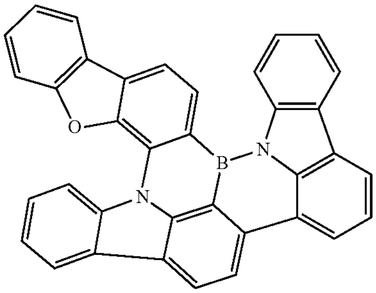
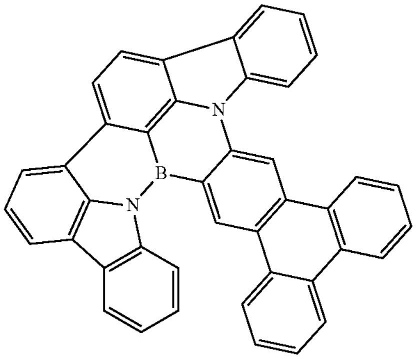
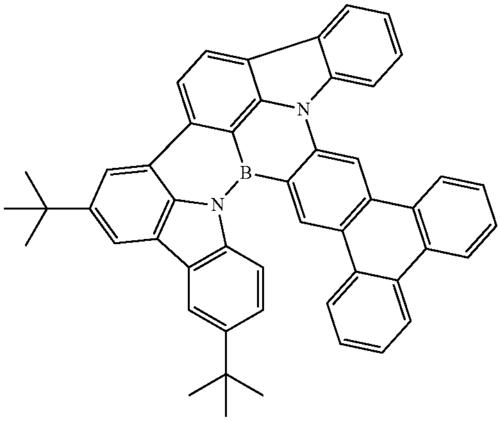
-continued
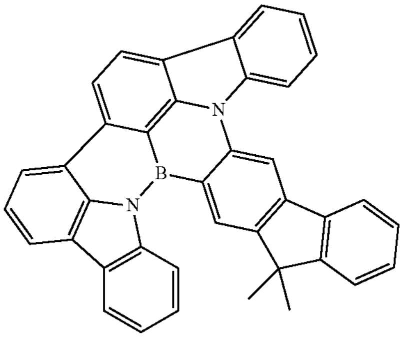
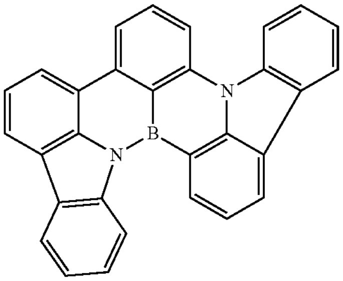
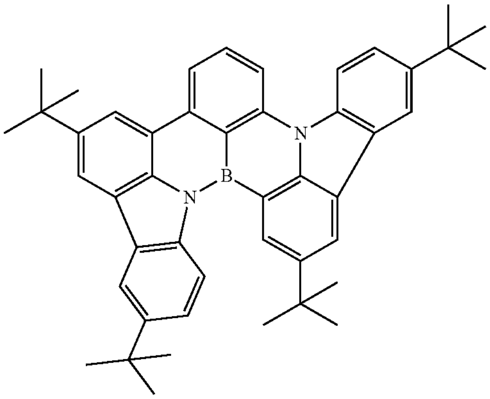
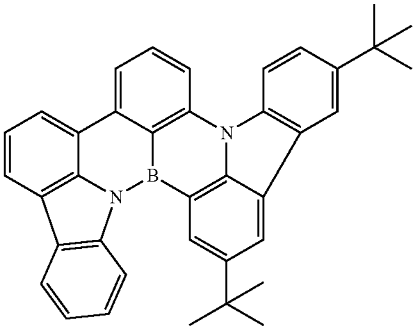
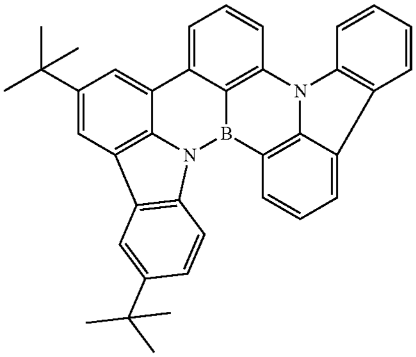

-continued
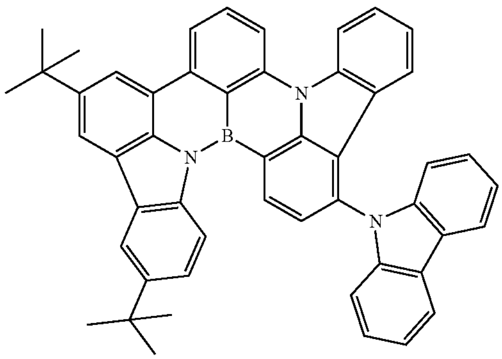
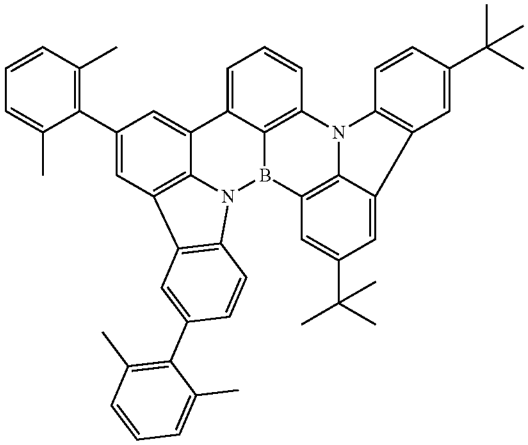
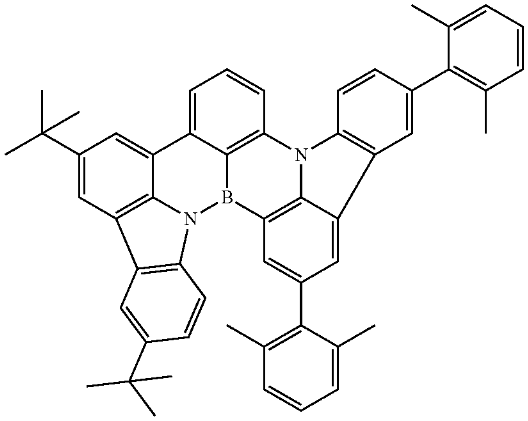
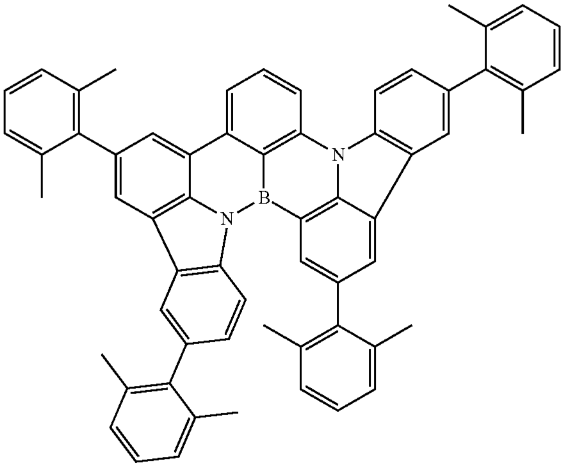
-continued
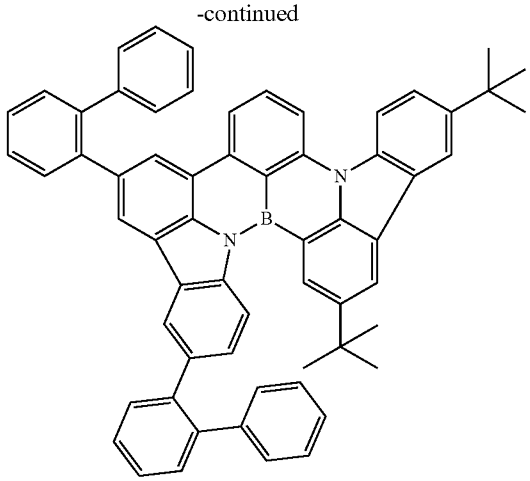
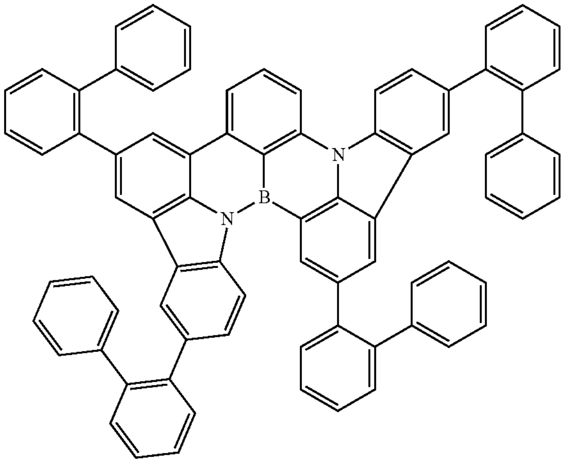
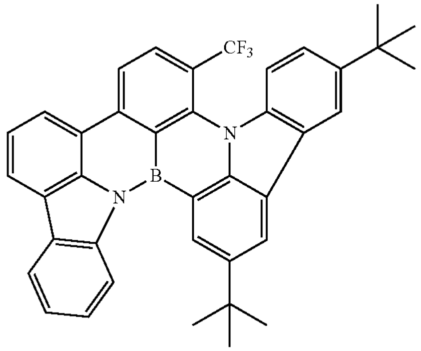
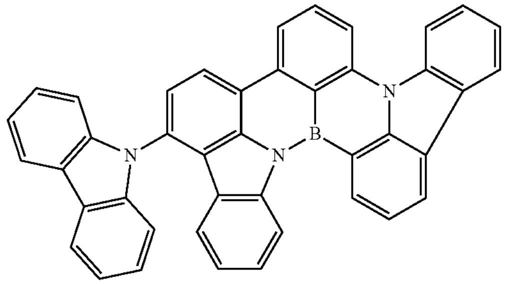

-continued
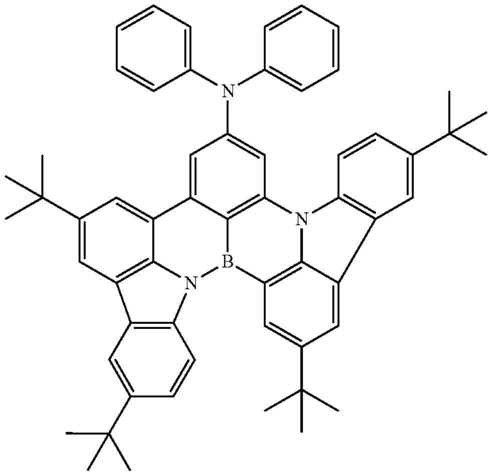
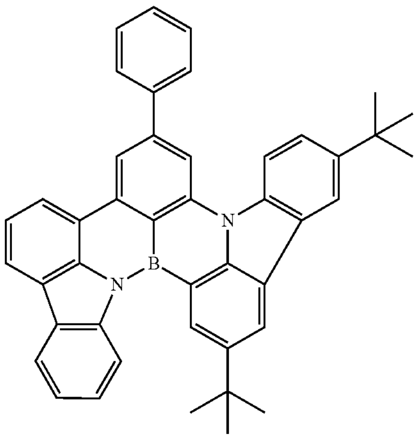
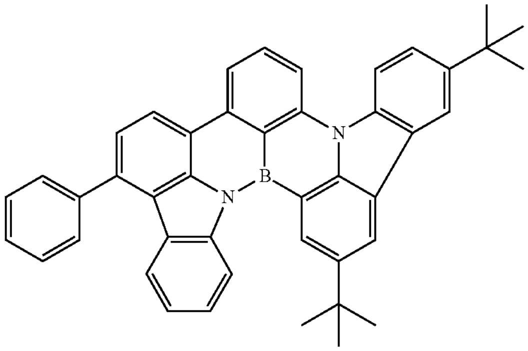
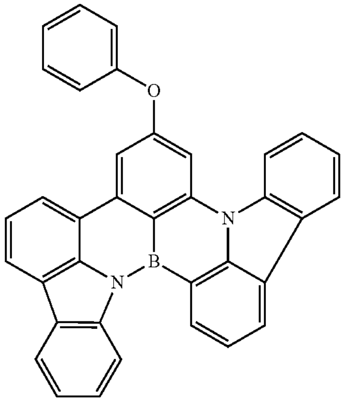
-continued
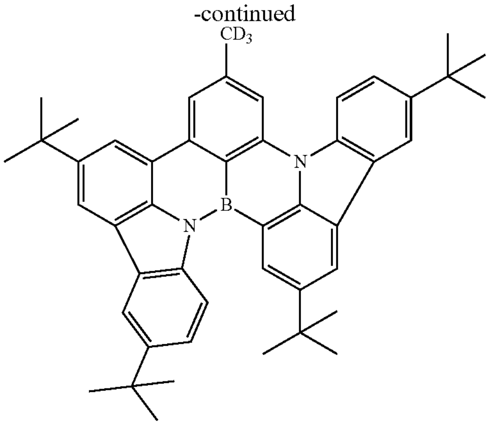
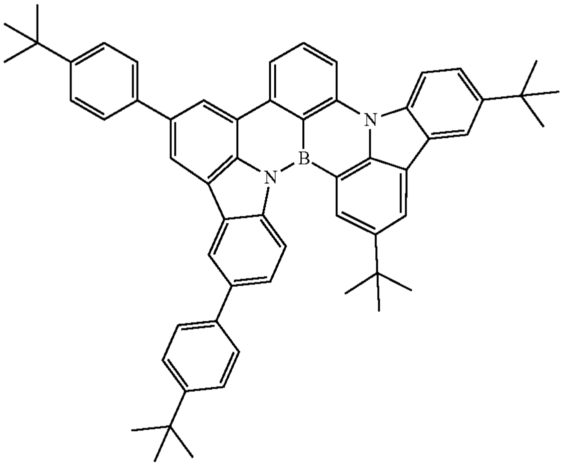
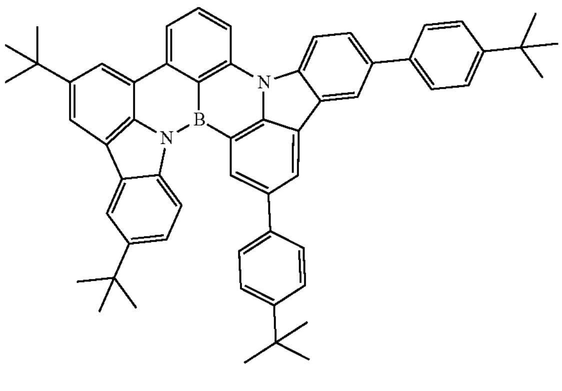

-continued
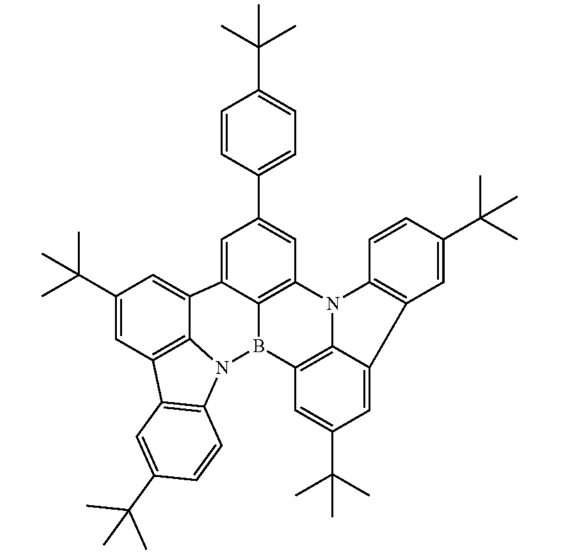
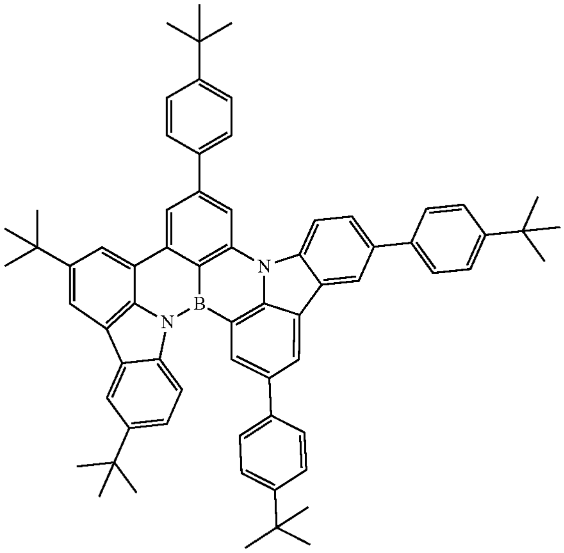
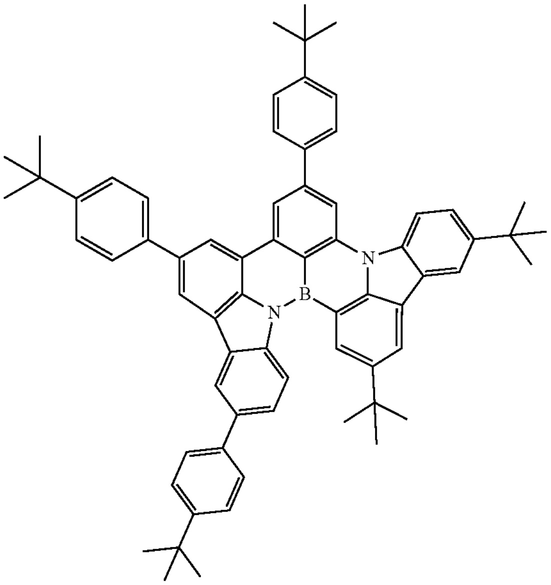
-continued
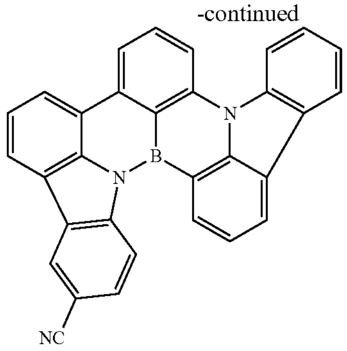
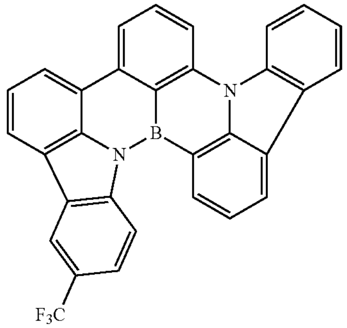
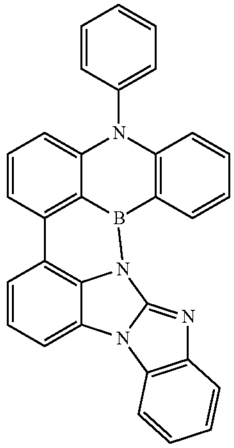
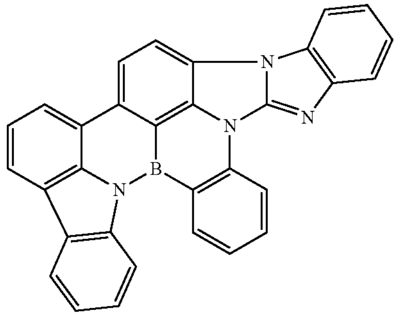
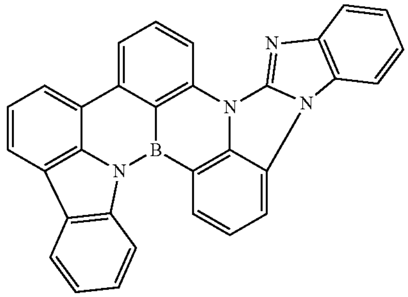

-continued
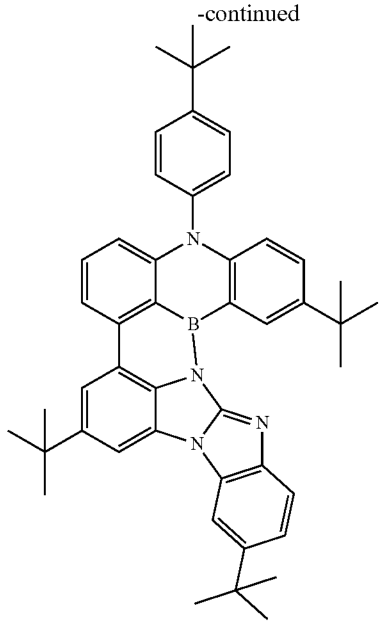
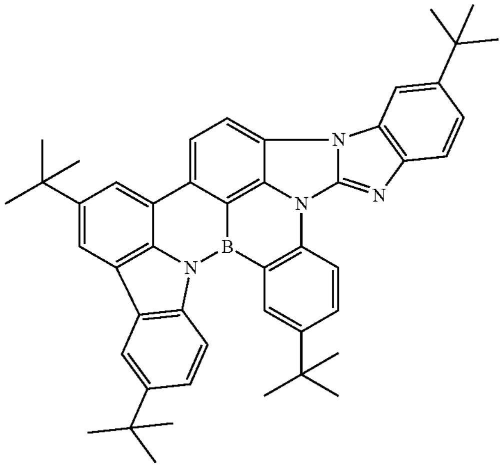
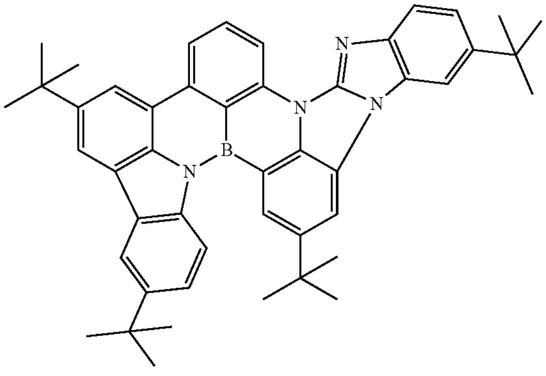
-continued
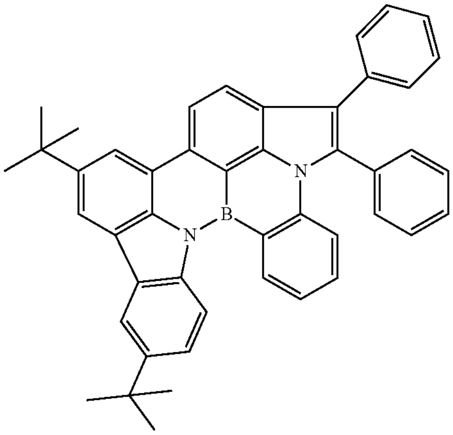
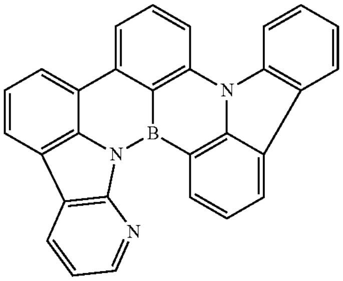
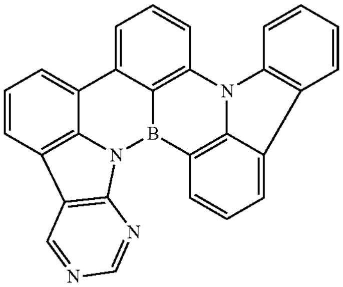
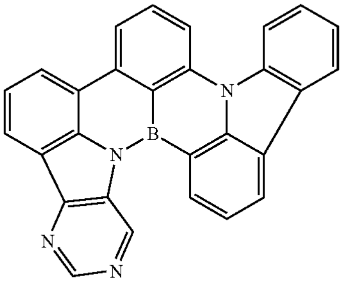
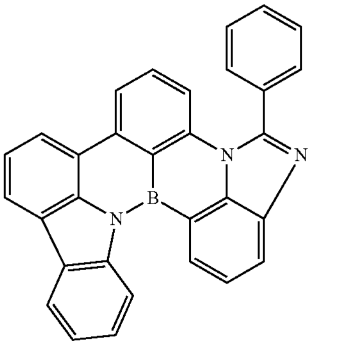

-continued
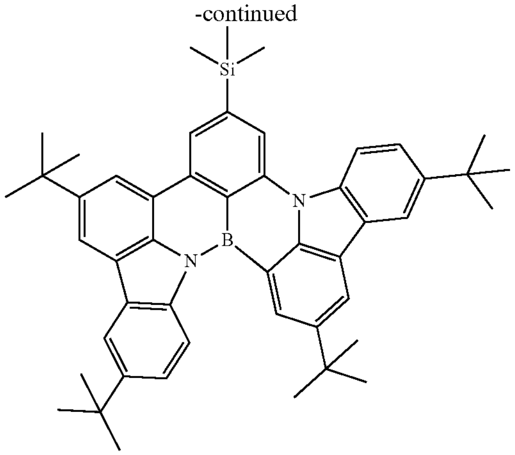
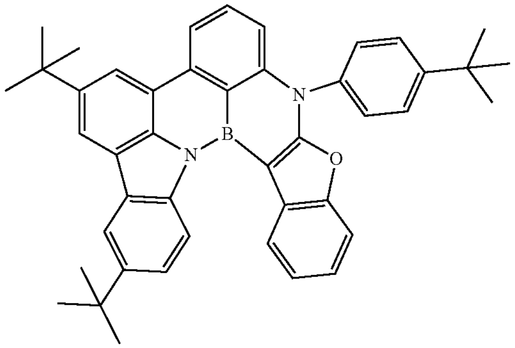
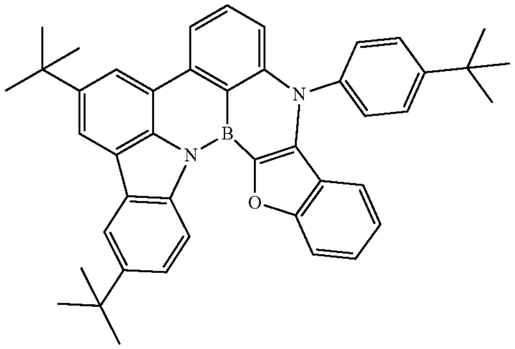
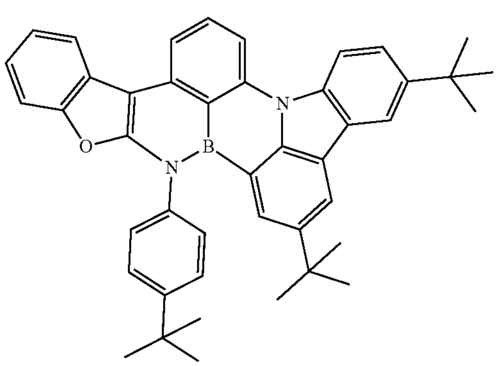
-continued
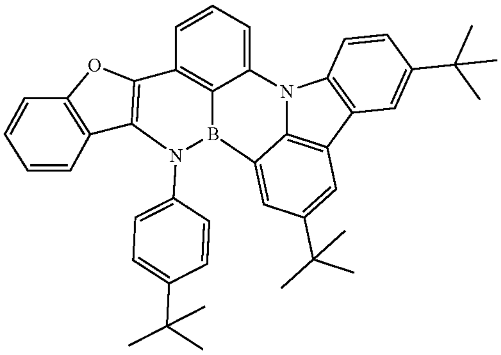
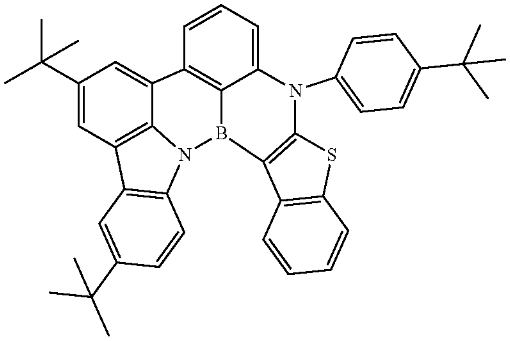
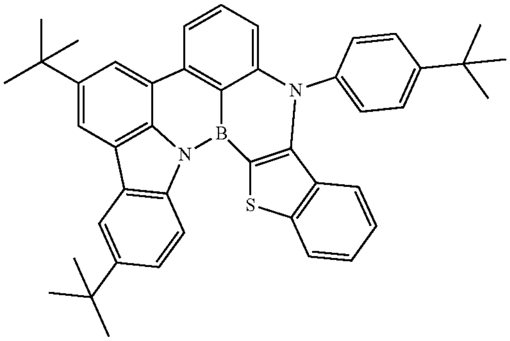
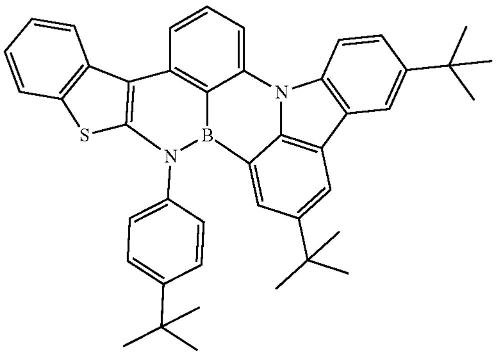

-continued
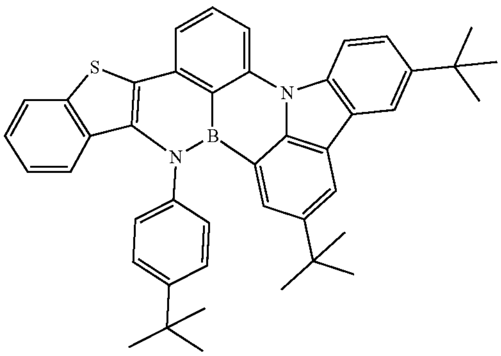
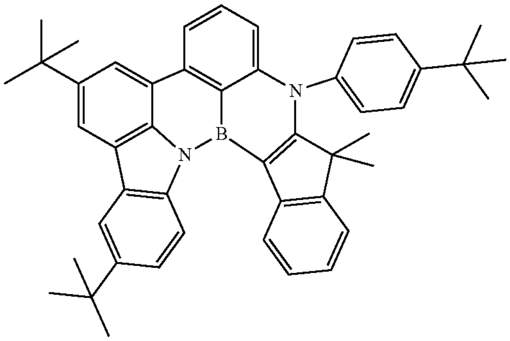
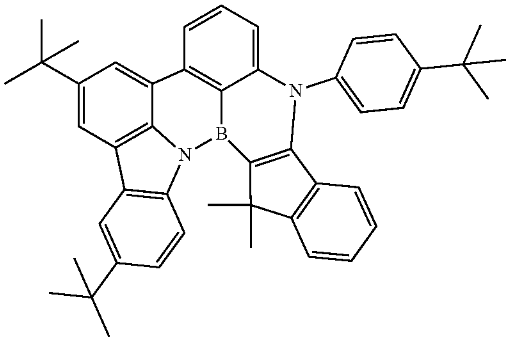
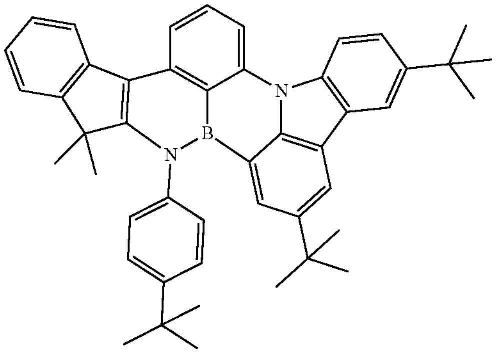
-continued
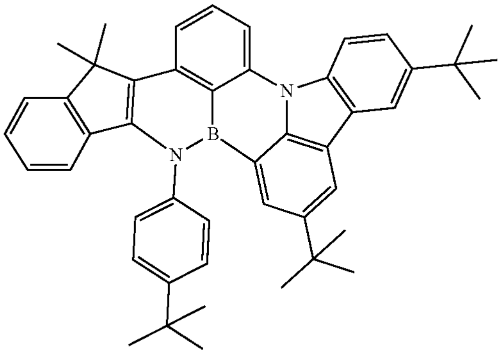
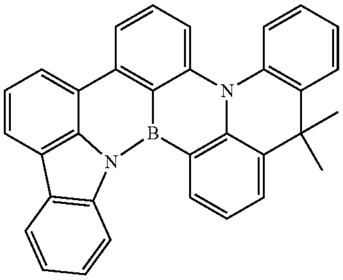
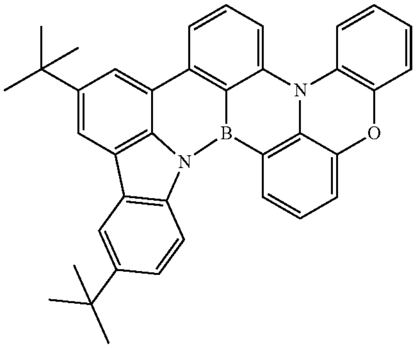
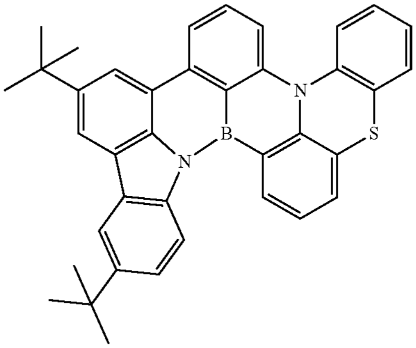
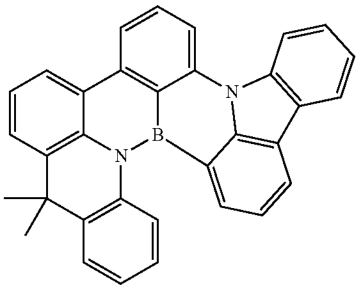

-continued
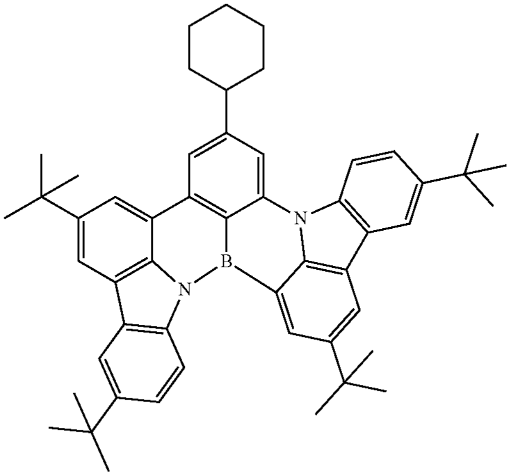
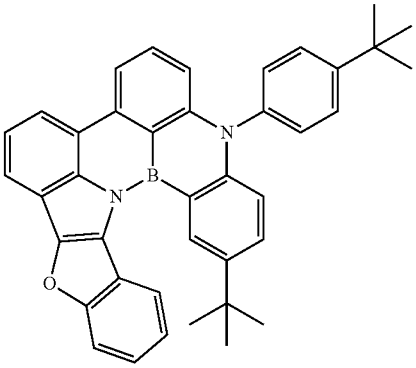
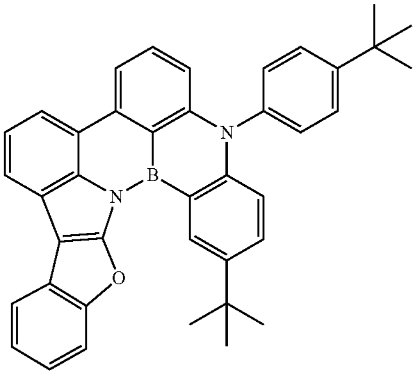
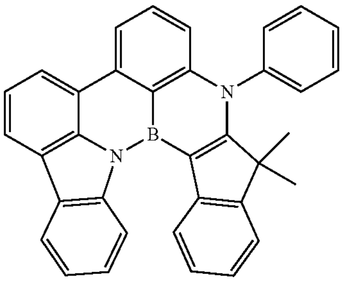
-continued
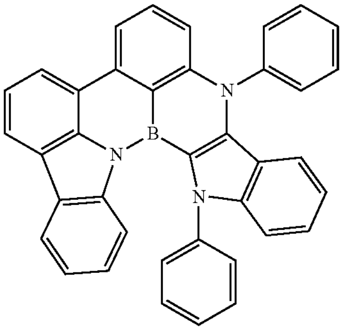
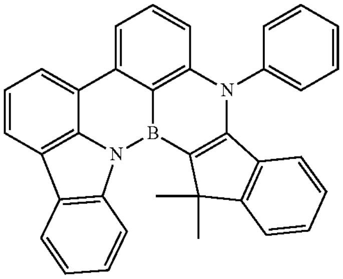
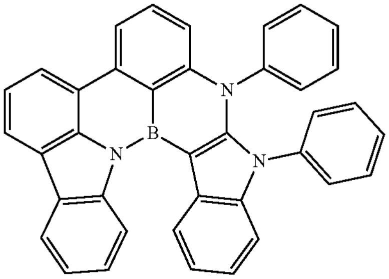
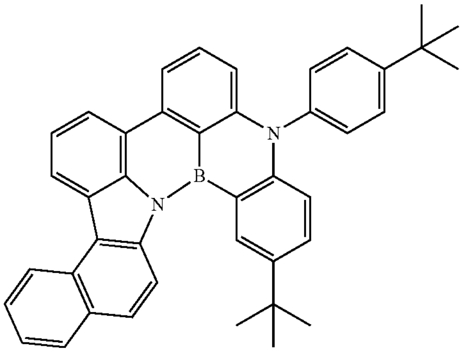
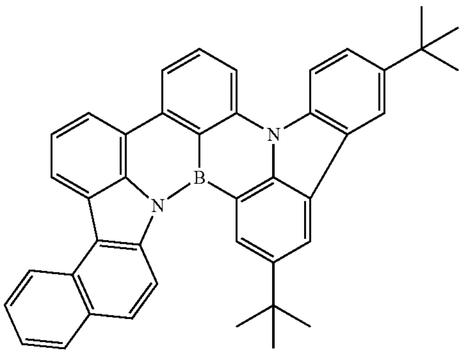

-continued
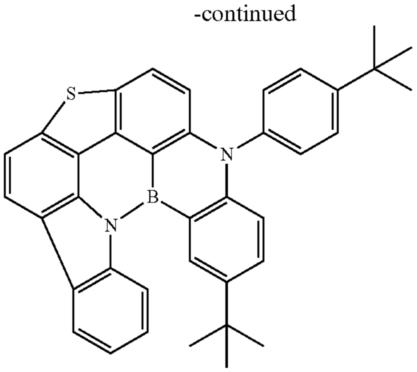
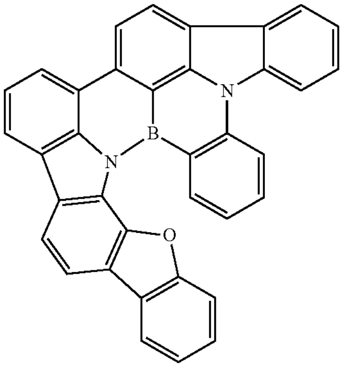
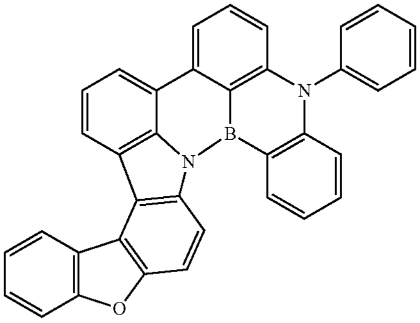
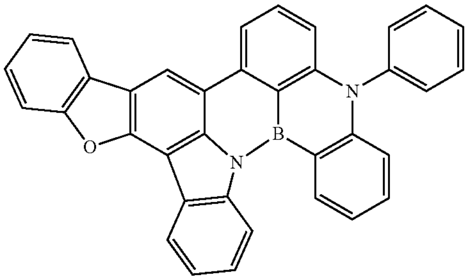
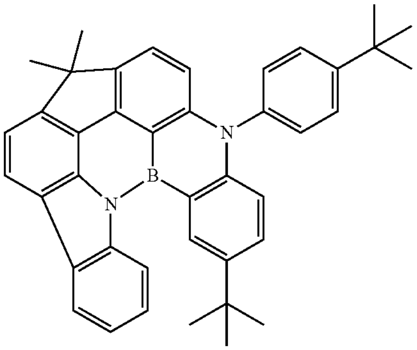
-continued
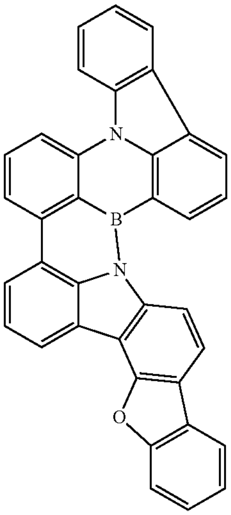
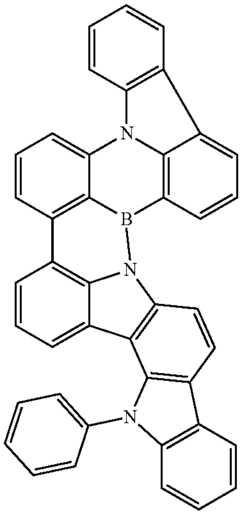
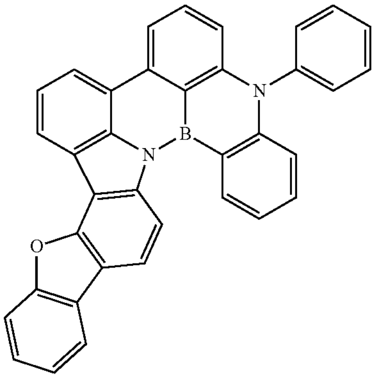

-continued
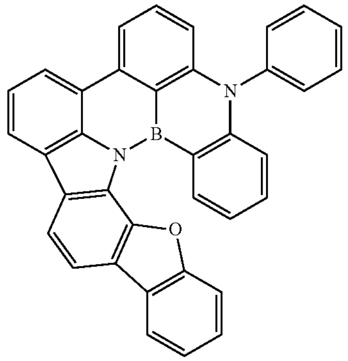
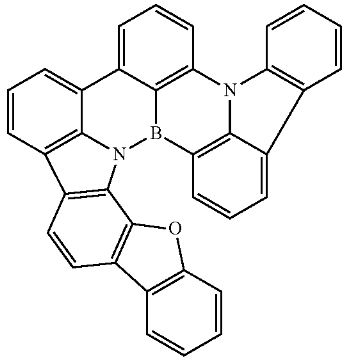
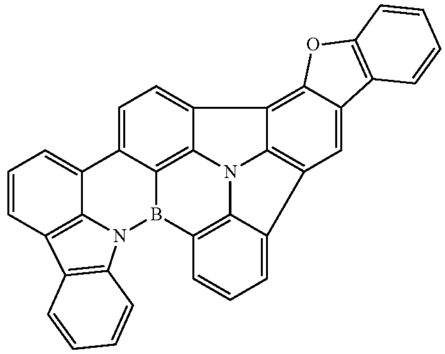
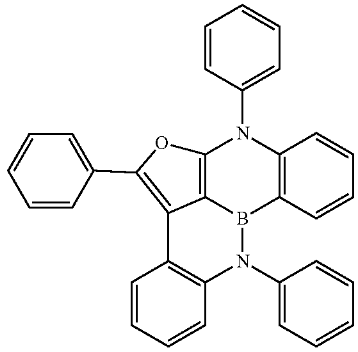
-continued
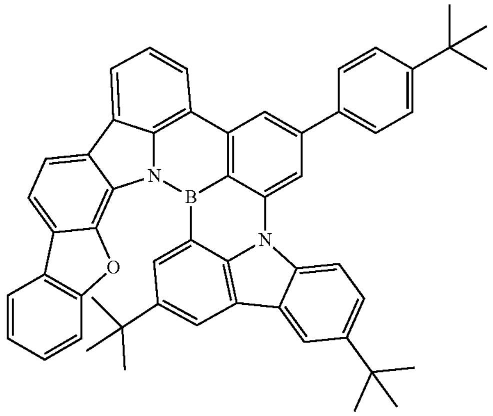
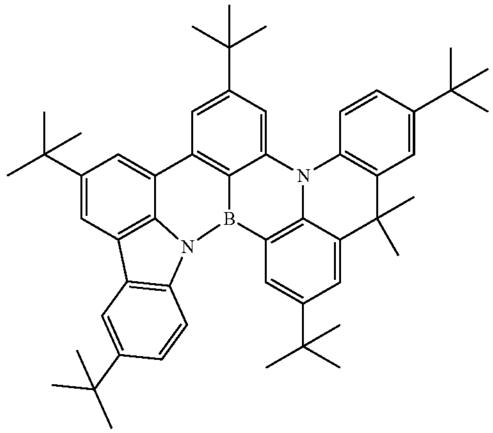
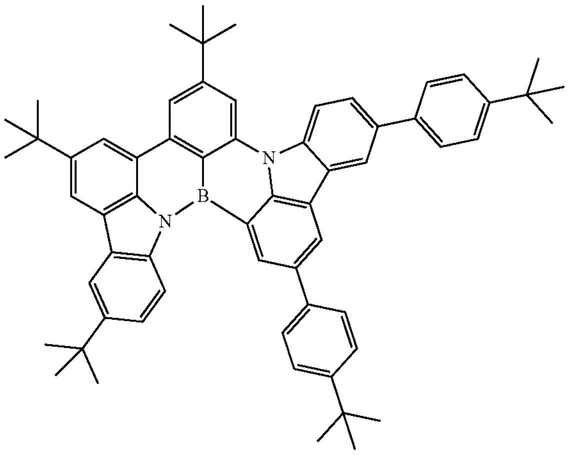

-continued
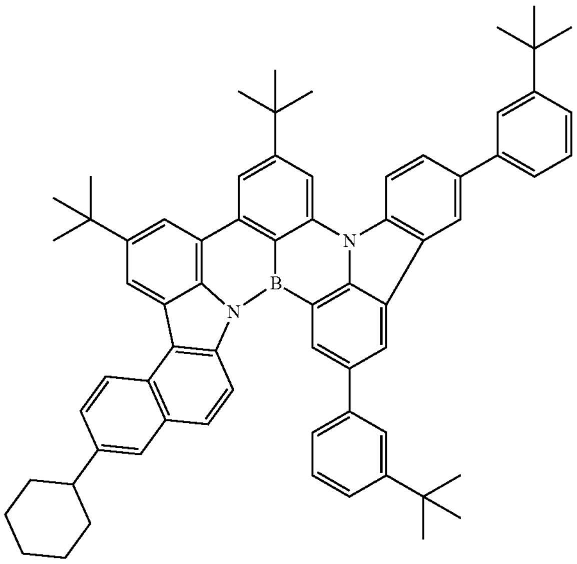
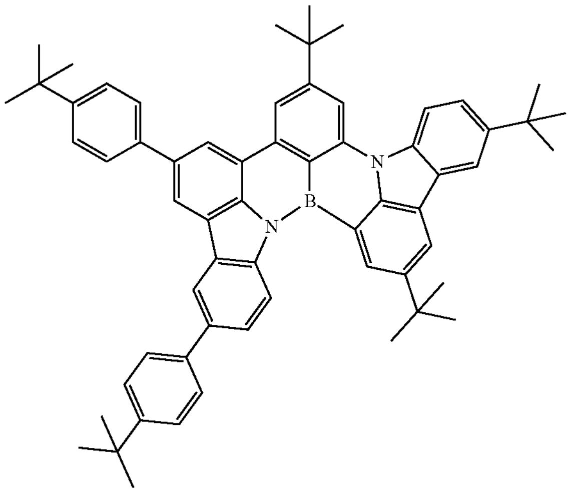
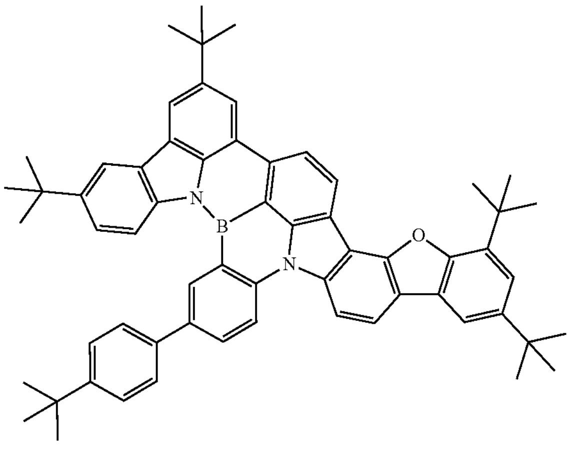
-continued
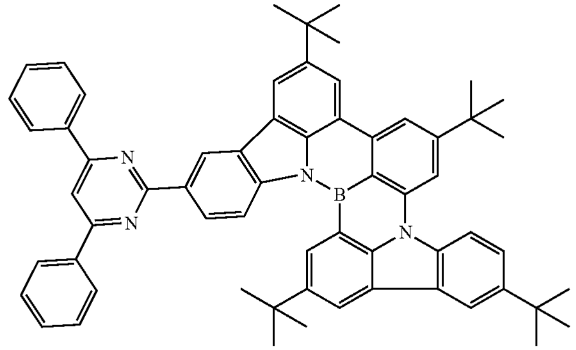
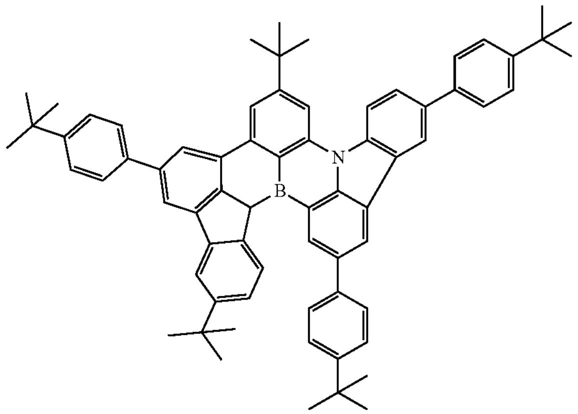
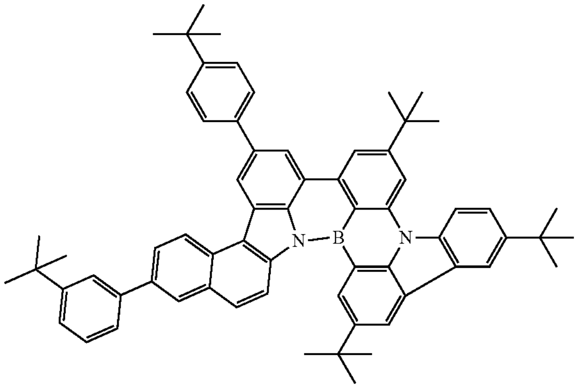
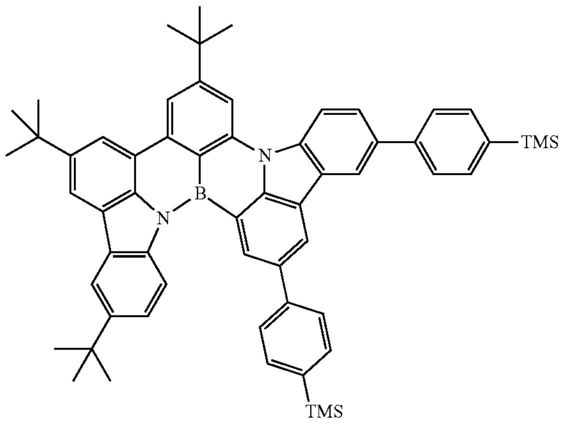

-continued
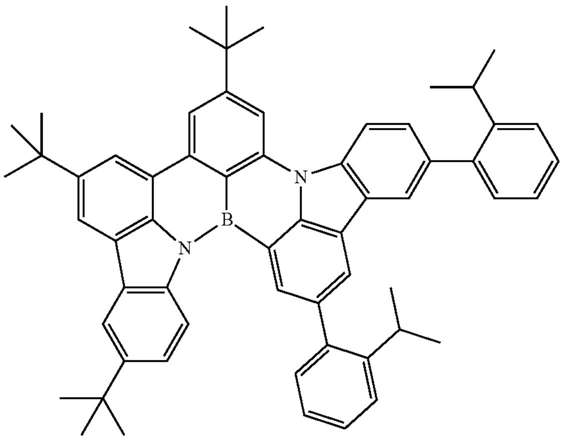
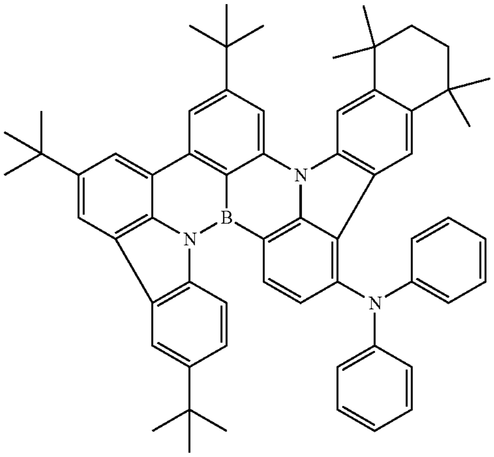
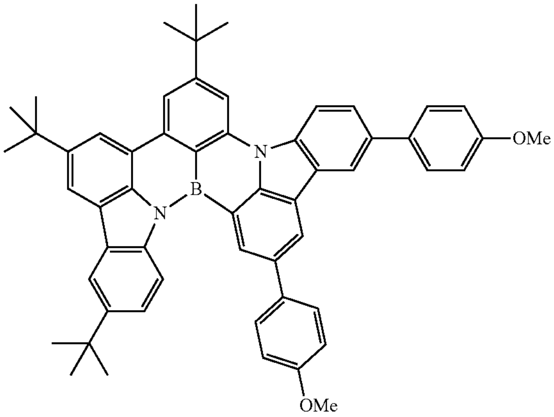
-continued
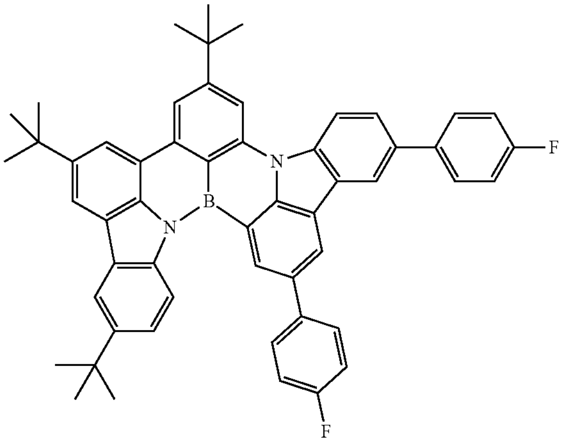
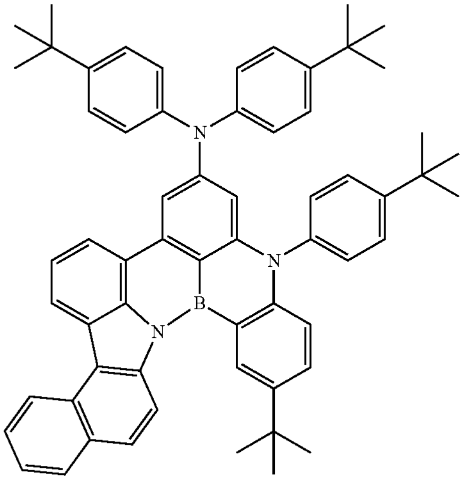
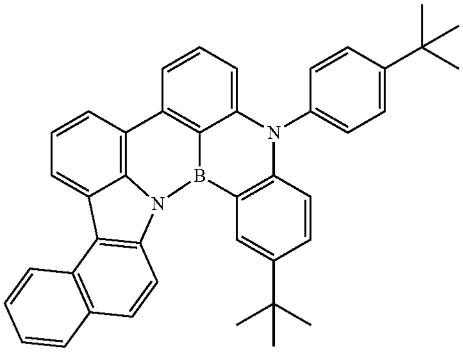
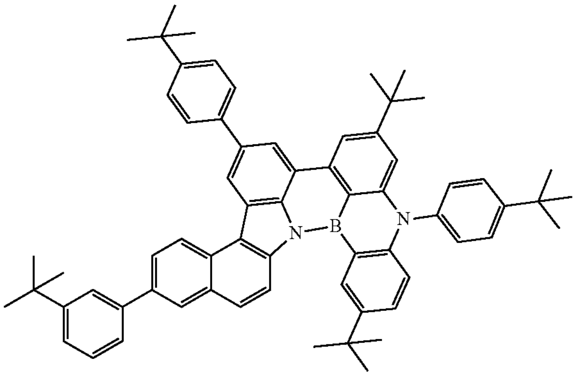

-continued
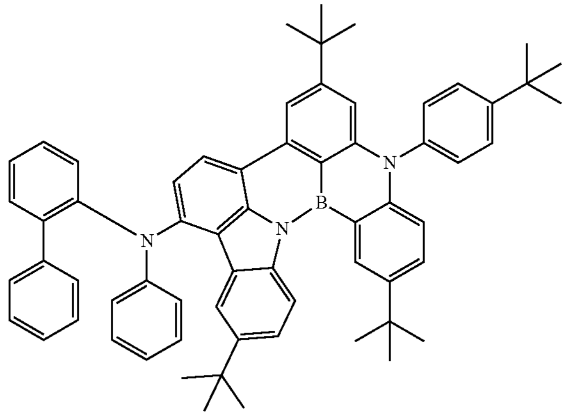
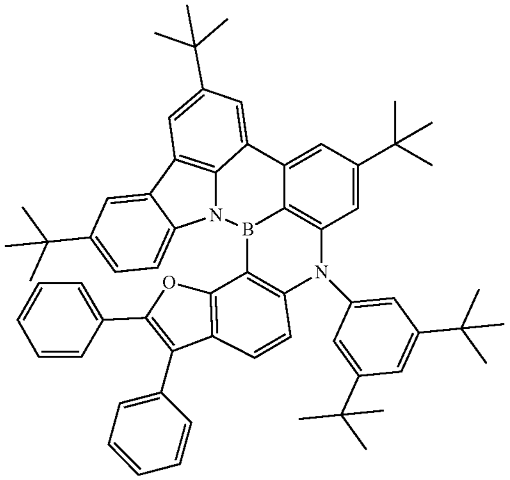
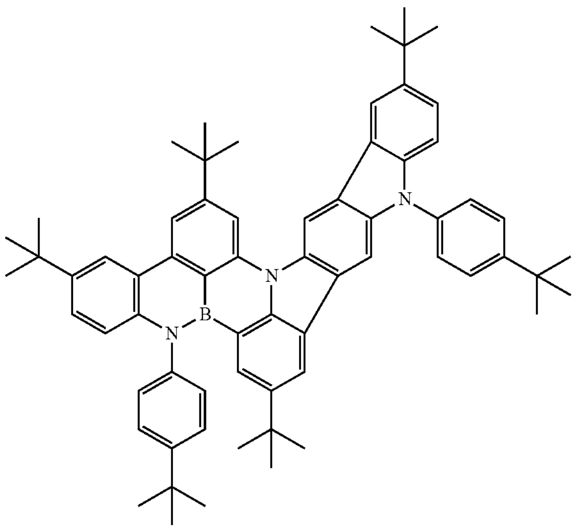
-continued
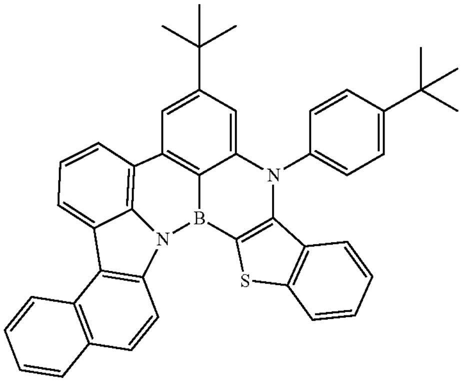
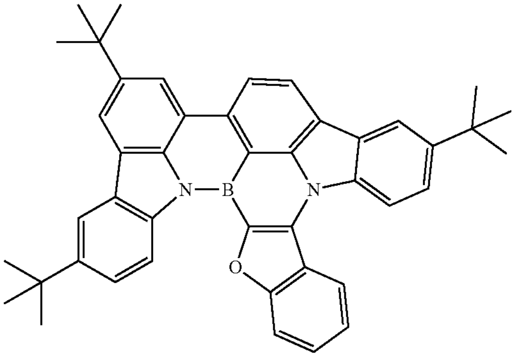
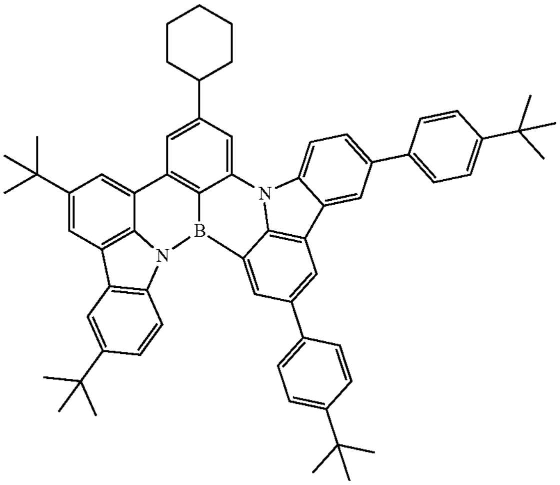
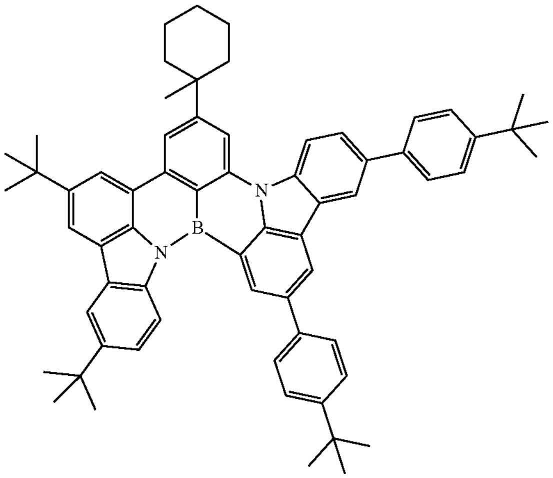

-continued
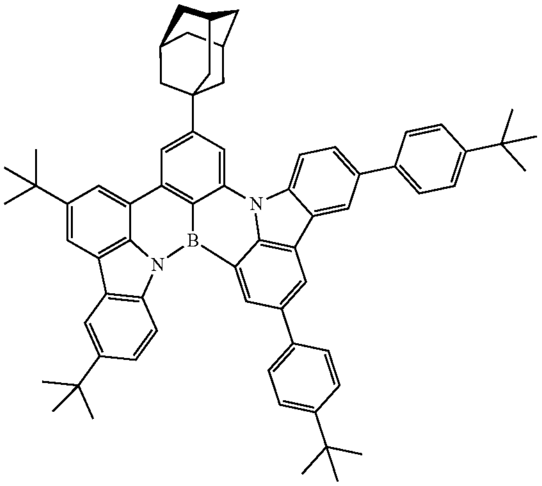
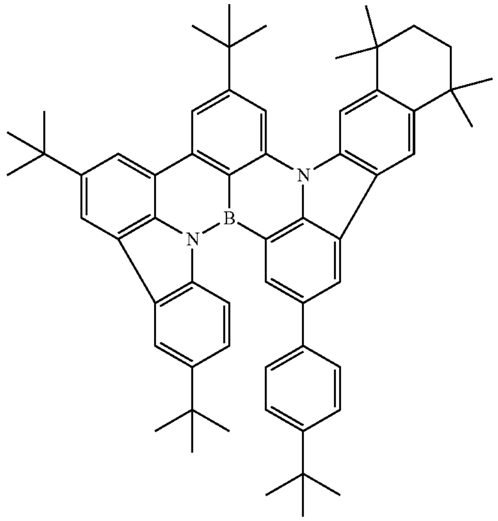
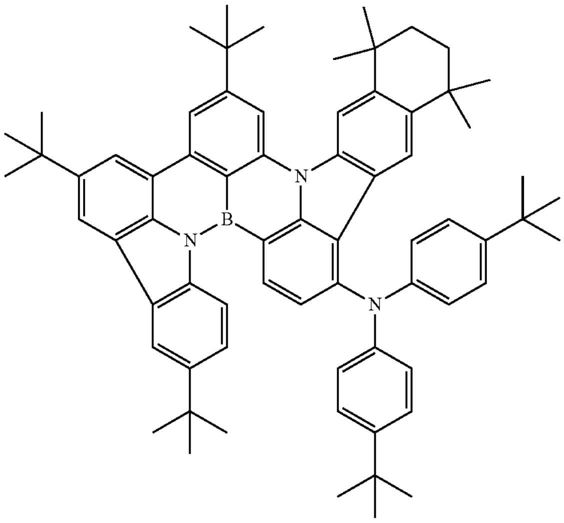
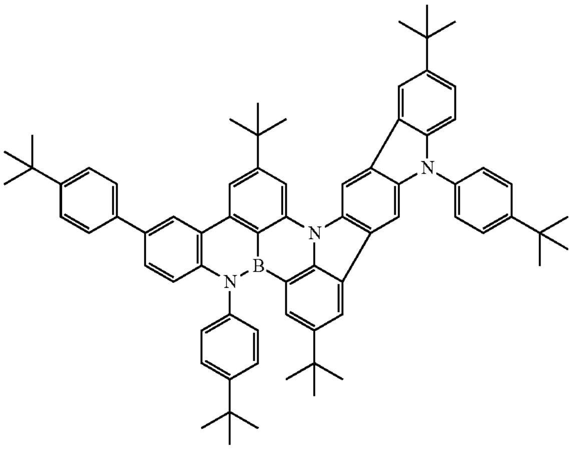
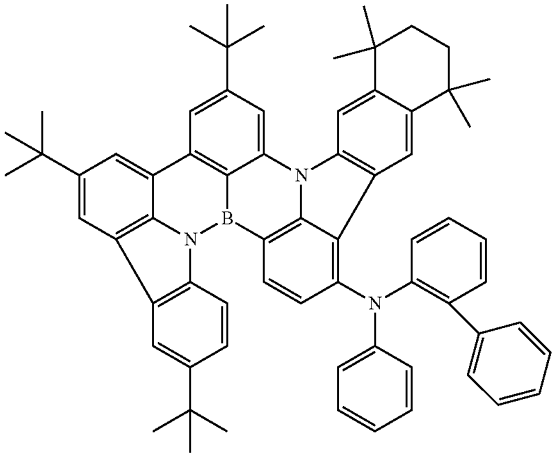
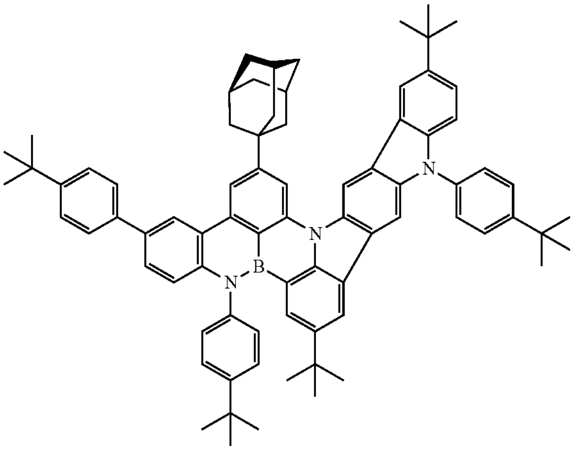

-continued
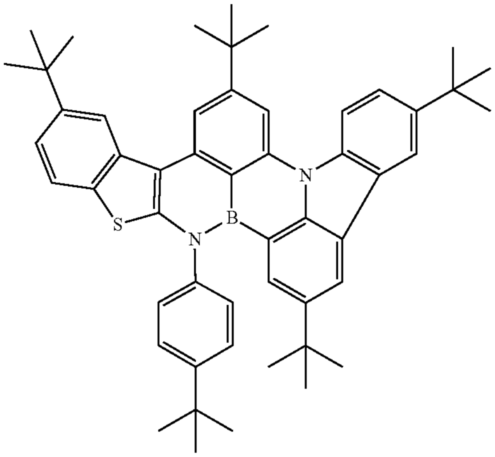
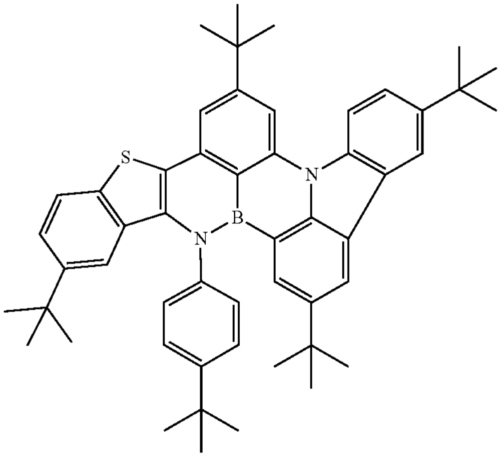
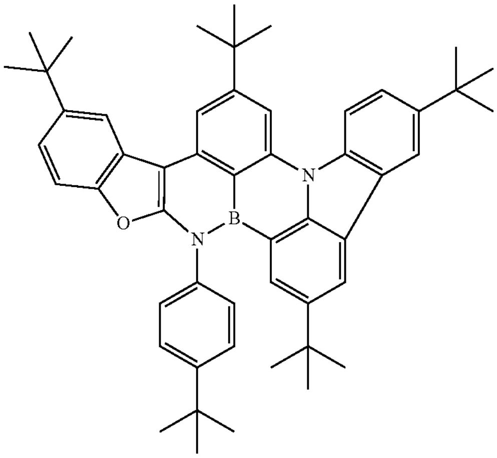
-continued
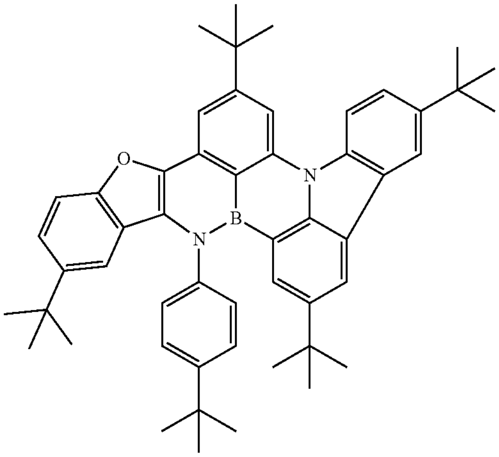
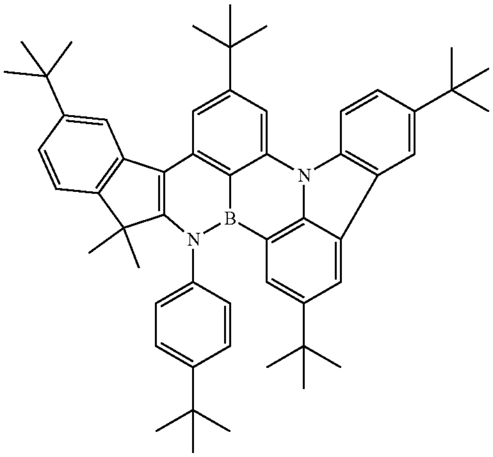
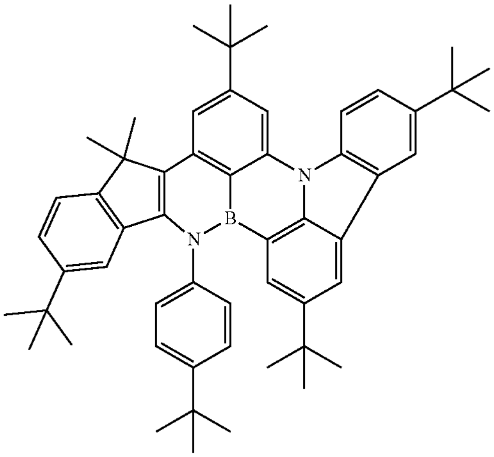

-continued
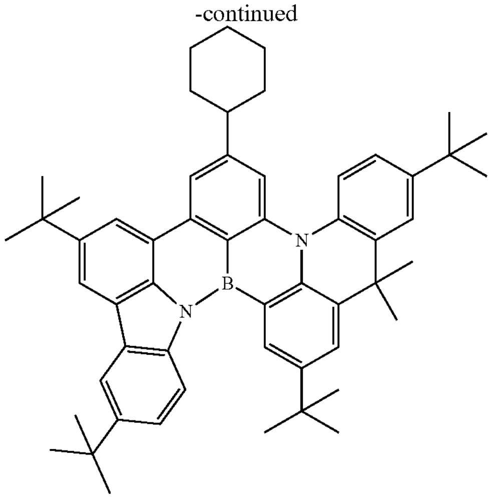
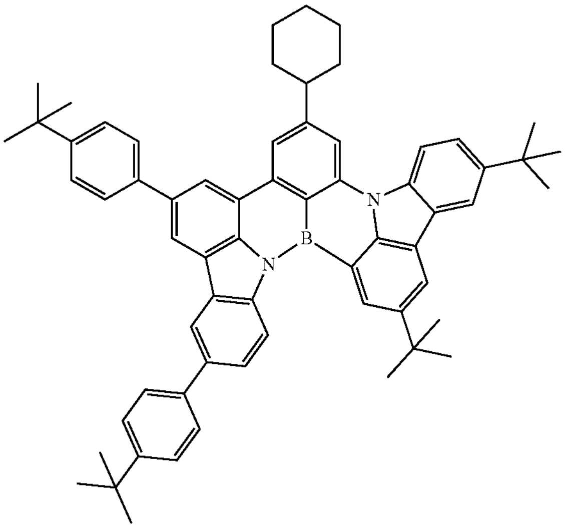
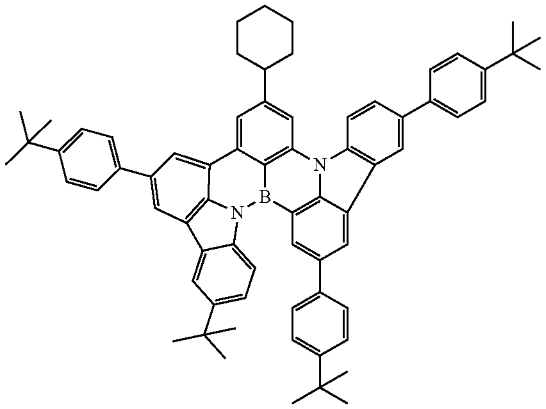
-continued
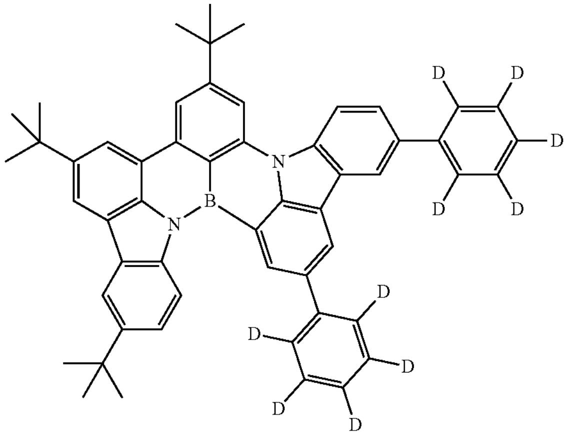
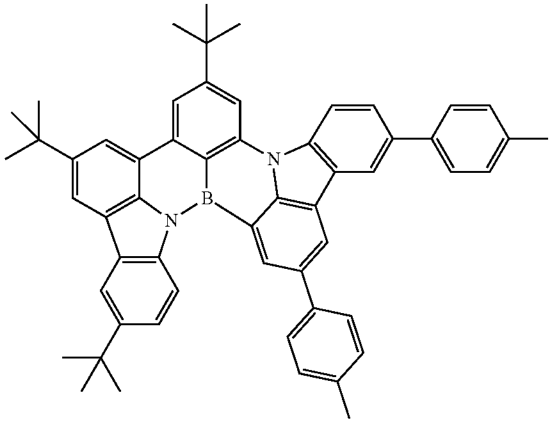
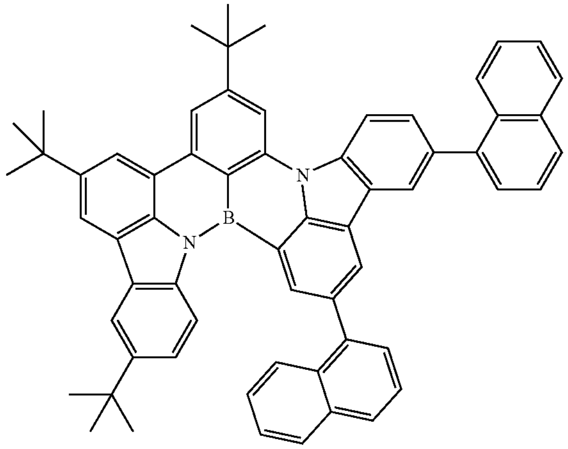
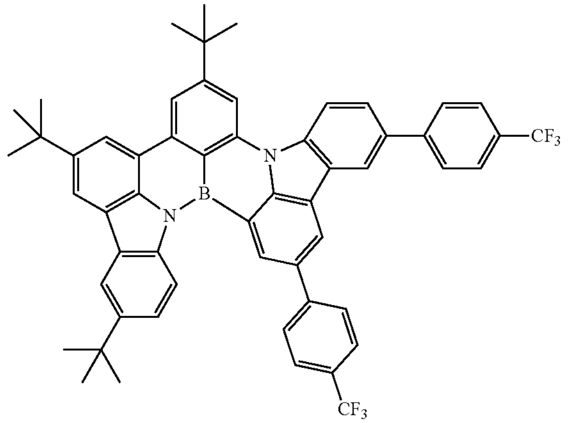

-continued
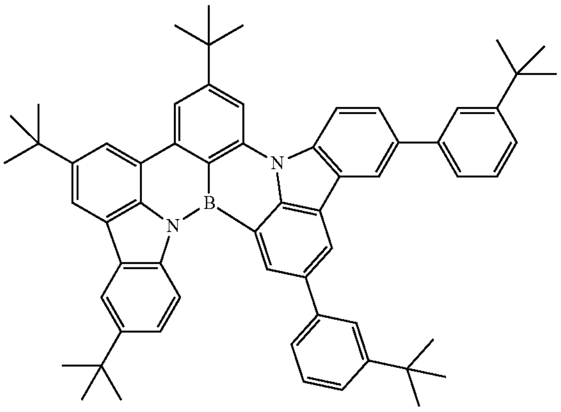
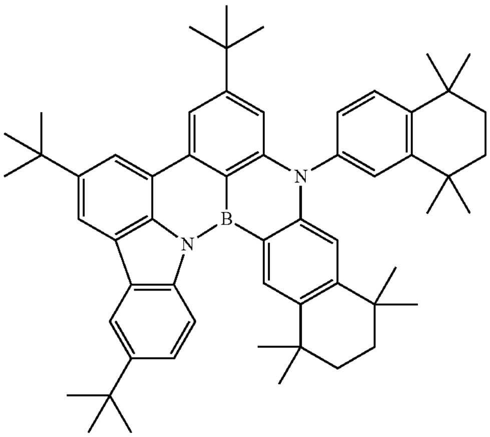
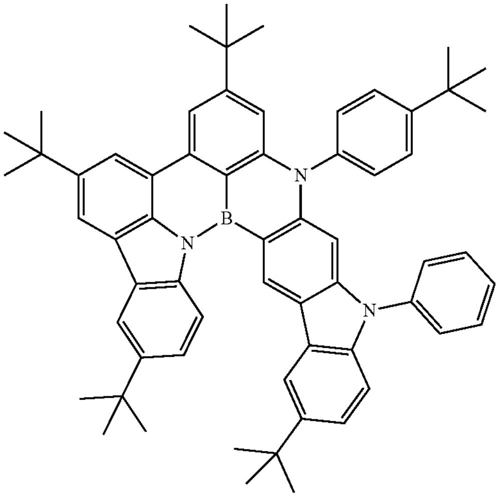
-continued
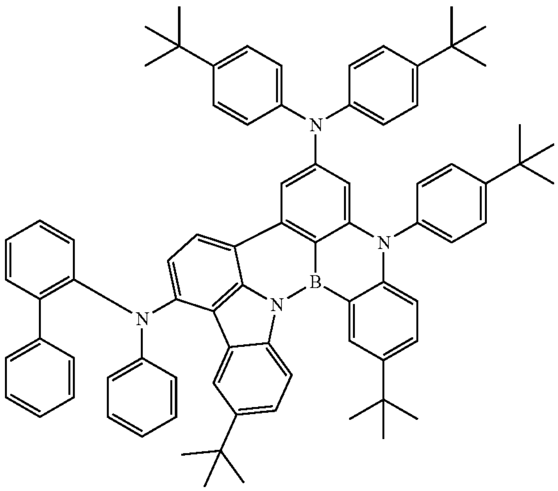
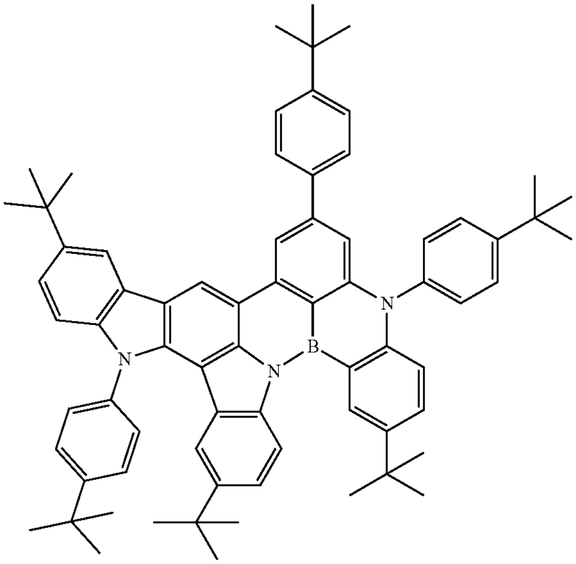
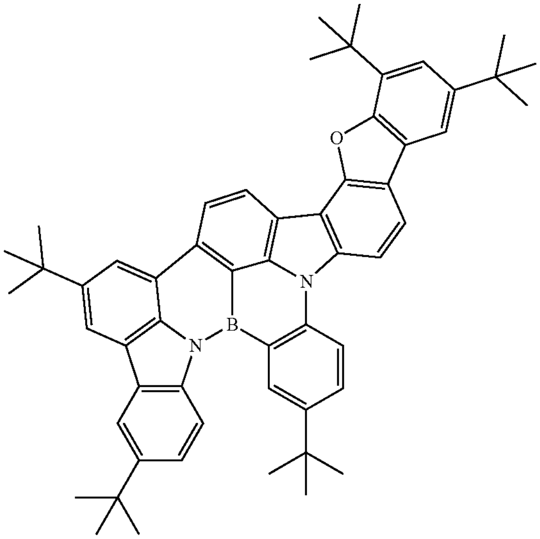

-continued
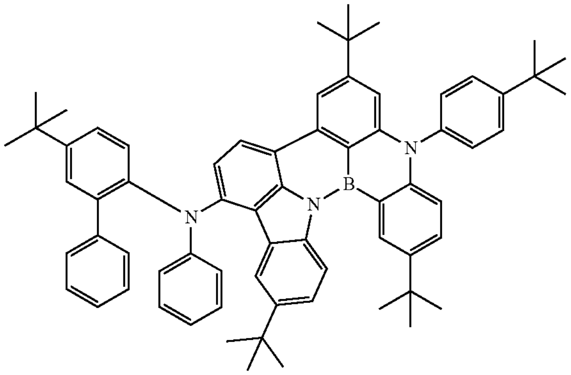
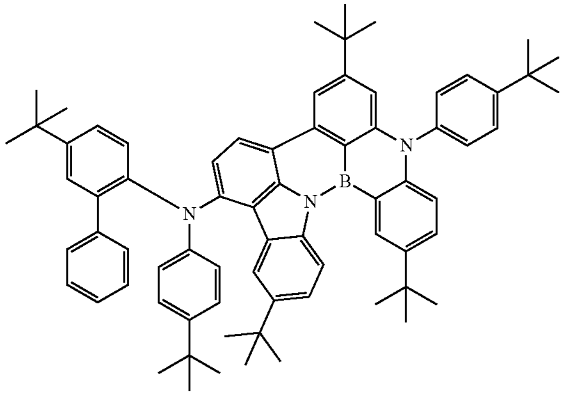
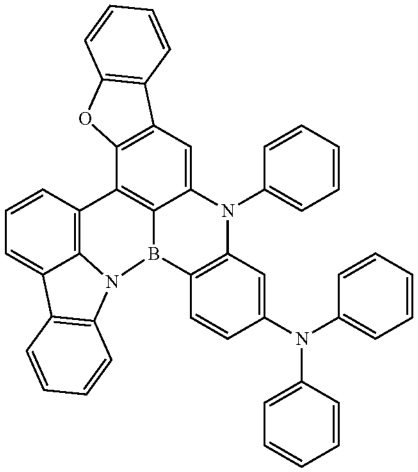
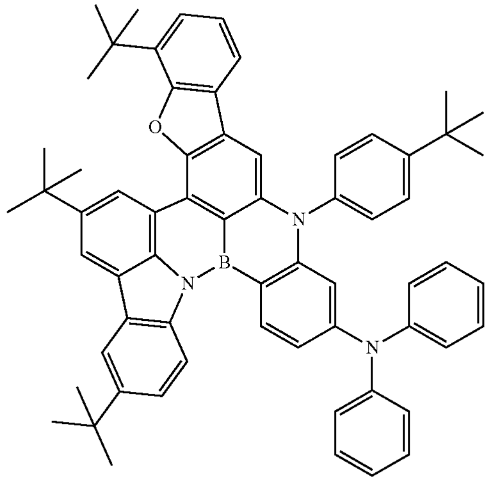
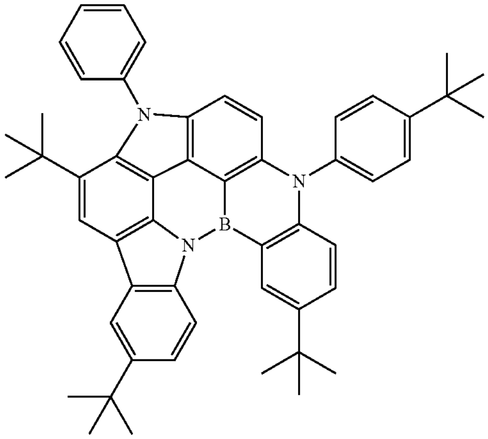
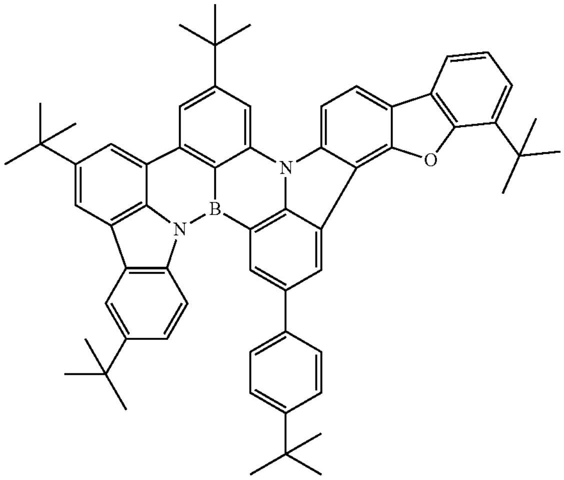
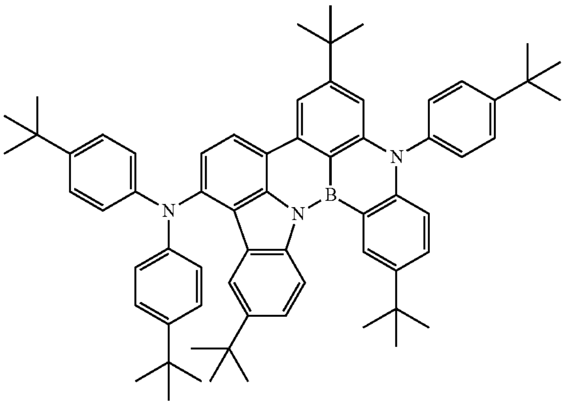
Preparation of the Compounds of Formula (I)
The compounds represented by formula (I) can be synthesized in accordance with the reactions conducted in the examples of the present application, and by using alternative reactions or raw materials suited to an intended product, in analogy to reactions and raw materials known in the art.

The compounds of formula (I) are for example prepared by the following step:

(i) Addition of $BHal_3$ to the intermediate (II), whereby the compound of formula (I) is obtained:

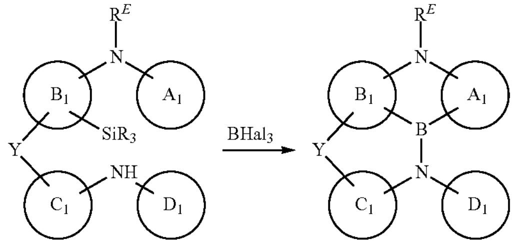

(II) (I) , wherein

Hal represents halogen, preferably F, Cl, Br or I, more preferably Cl or Br and most preferably Br;

R represents $C_1$-$C_8$ alkyl or $C_6$-$C_{10}$ aryl, preferably $C_1$-$C_4$ alkyl or phenyl, more preferably methyl; and all other residues and indices are as defined before.

Suitable reaction conditions are mentioned in the examples of the present application.

The intermediate (II) is for example prepared starting from a compound of formula (III)

(III)

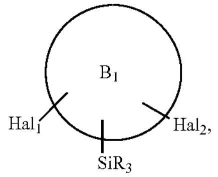

and (i) reaction of $Hal_2$ of compound (III) with an amino compound (IVa) which may be further modified after reaction with compound (III), or with an amino compound (IVb), and (ii) reaction of $Hal_1$ of compound (III) with a carbazole derivative (V), wherein $Hal_1$ represents halogen, preferably Cl, $Hal_2$ represents halogen, preferably Br, R represents $C_1$-$C_8$ alkyl or $C_6$-$C_{10}$ aryl, preferably $C_1$-$C_4$ alkyl or phenyl, more preferably methyl;

and all other residues and indices are as defined before.

Generally, step (i) is carried out first and then step (ii) is carried out.

(IVa)

$R^E—NH_2$, which may be modified as follows:

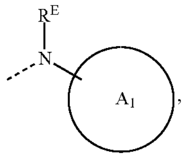

wherein the dotted line is a bonding site to the compound of formula (III) at the position of $Hal_2$.

(IVb)

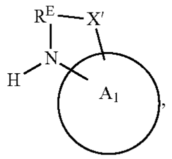

wherein X' is a direct bond (i.e. $R^E$ and the ring $A_1$ are connected via a direct bond), O, S, $NR^{23}$, $SIR^{24}R^{25}$, $CR^{27}R^{28}$ or $BR^{21}$, preferably a direct bond;

(V)

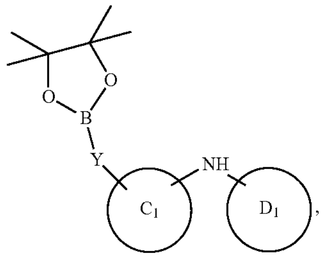

wherein all residues and indices are as defined before.

The preferred compounds of formula (V) are for example prepared by the following step:

(i) Addition of $BHal_3$ to the intermediate (VI), whereby the compound of formula (V) is obtained:

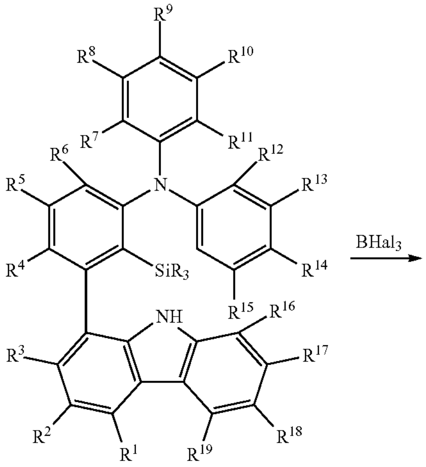

(VI)

-continued

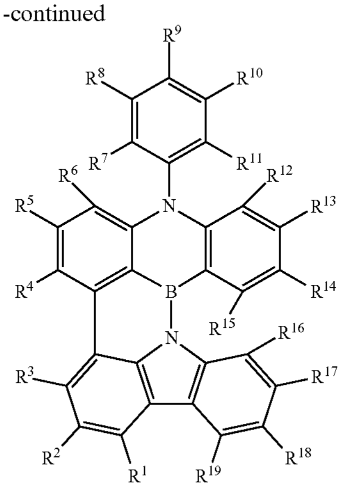

(V)

wherein

Hal represents halogen, preferably F, Cl, Br or I, more preferably Cl or Br and most preferably Br;

R represents $C_1$-$C_8$ alkyl or $C_6$-$C_{10}$ aryl, preferably $C_1$-$C_4$ alkyl or phenyl, more preferably methyl; and all other residues and indices are as defined before.

The intermediate (VI) is for example prepared starting from a compound of formula (VII)

(VII)

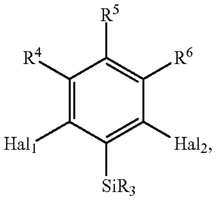

and (i) reaction of $Hal_2$ of compound (VII) with an amino compound (VIIIa) which may be further modified after reaction with compound (VII), or with an amino compound (VIIIb), and (ii) reaction of $Hal_1$ of compound (VII) with a carbazole derivative (IX), wherein $Hal_1$ represents halogen, preferably Cl, $Hal_2$ represents halogen, preferably Br, R represents $C_1$-$C_8$ alkyl or $C_6$-$C_{10}$ aryl, preferably $C_1$-$C_4$ alkyl or phenyl, more preferably methyl; and all other residues and indices are as defined before.

Generally, step (i) is carried out first and then step (ii) is carried out.

(VIIIa)

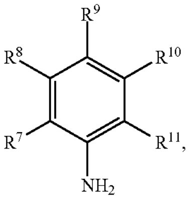

which may be modified as follows:

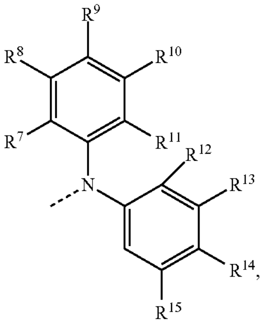

wherein the dotted line is a bonding site to the compound of formula (VII) at the position of $Hal_2$.

(VIIIb)

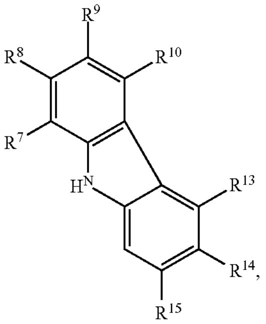

(IX)

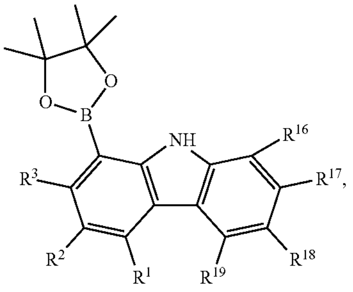

wherein all residues and indices are as defined before.

In a further embodiment, the compounds of formula (I) are for example prepared as follows:

ia) Addition of $BHal_3$ to the intermediate (IIa), whereby the compound of formula (I) is obtained:

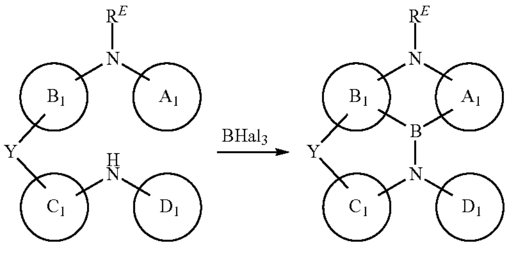

(IIa) (I) , wherein

Hal represents halogen, preferably F, Cl, Br or I, more preferably Cl or Br and most preferably Br;

and all other residues and indices are as defined before.

Suitable reaction conditions are mentioned in the examples of the present application.

The intermediate (IIa) is for example prepared starting from a compound of formula (IIIa)

(IIIa)

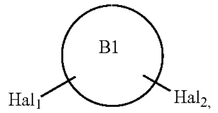

and (i) reaction of $Hal_2$ of compound (IIIa) with an amino compound (IVa) which may be further modified after reaction with compound (IIIa), or with an amino compound (IVb), and (ii) reaction of $Hal_1$ of compound (IIIa) with a carbazole derivative (V), wherein $Hal_1$ represents halogen, preferably Cl, $Hal_2$ represents halogen, preferably Br, all other residues and indices are as defined before.

Generally, step (i) is carried out first and then step (ii) is carried out.

(IVa)

$R^E$—$NH_2$, which may be modified as follows:

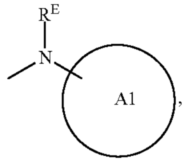

wherein the dotted line is a bonding site to the compound of formula (III) at the position of $Hal_2$.

(IVb)

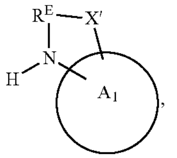

wherein X is a direct bond (i.e. $R^E$ and the ring $A_1$ are connected via a direct bond), O, S, $NR^{23}$, $SiR^{24}R^{25}$, $CR^{27}R^{28}$ or $BR^{21}$, preferably a direct bond;

(V)

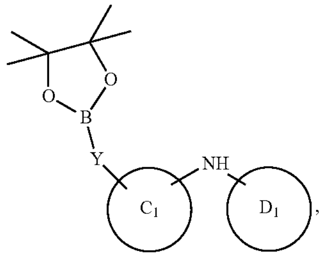

wherein all residues and indices are as defined before.

The preferred compounds of formula (Va) are for example prepared by the following step:

Ia) Addition of $BHal_3$ to the intermediate (Via), whereby the compound of formula (Va) is obtained:

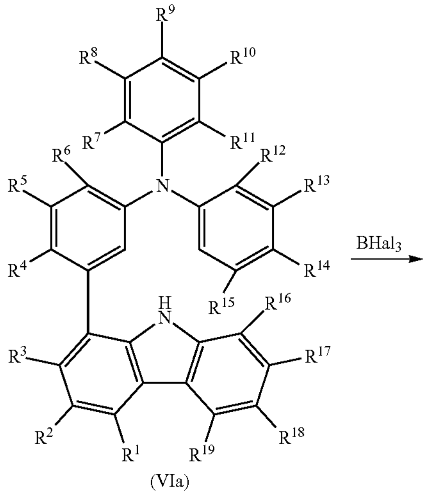

(VIa)

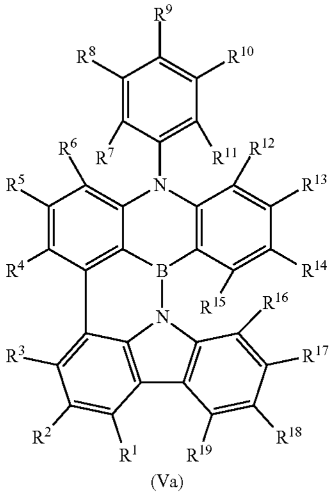

(Va)

wherein

Hal represents halogen, preferably F, Cl, Br or I, more preferably Cl or Br and most preferably Br;

$R^5$ represents $C_1$-$C_{10}$ alkyl, $C_3$-$C_{12}$ cycloalkyl, or $C_6$-$C_{10}$ aryl, preferably $C_1$-$C_4$ alkyl, $C_5$-$C_{10}$ cycloalkyl, or phenyl, more preferably tert-butyl; and all other residues and indices are as defined before.

The intermediate (VIa) is for example prepared starting from a compound of formula (VIIa)

(VIIa)

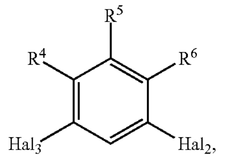

and (i) reaction of $Hal_2$ of compound (VIIa) with an amino compound (VIIIa) which may be further modified after reaction with compound (VIIa), or with an amino compound (VIIIb), and (ii) reaction of $Hal_1$ of compound (VIIa) with a carbazole derivative (IX), wherein $Hal_1$ represents halogen, preferably Cl, $Hal_2$ represents halogen, preferably Br, $R^5$ represents $C_1$-$C_{10}$ alkyl, $C_3$-$C_{12}$ cycloalkyl, or $C_6$-$C_{10}$ aryl, preferably $C_1$-$C_4$ alkyl, $C_5$-$C_{10}$ cycloalkyl, or phenyl, more preferably tert-butyl; and all other residues and indices are as defined before.

Generally, step (i) is carried out first and then step (ii) is carried out.

(VIIIa)

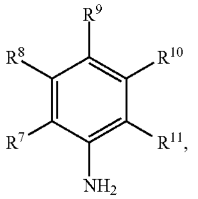

which may be modified as follows:

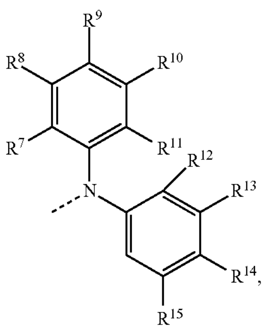

wherein the dotted line is a bonding site to the compound of formula (VIIa) at the position of $Hal_2$.

(VIIIb)

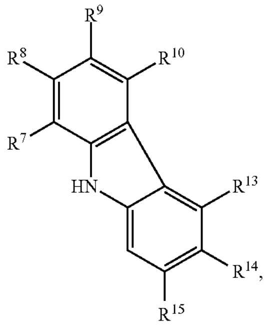

(IX)

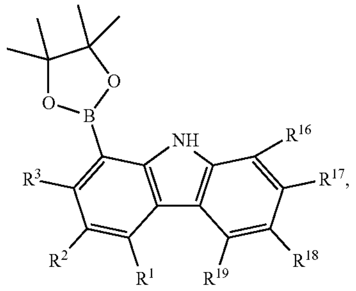

wherein all residues and indices are as defined before.

Examples for suitable preparation processes are mentioned below.

Organic Electroluminescence Device

According to one aspect of the present invention a material for an organic electroluminescence device comprising at least one compound of formula (I) is provided.

According to another aspect of the present invention, an organic electroluminescence device comprising at least one compound of formula (I) is provided.

According to another aspect of the invention, the following organic electroluminescence device is provided: An organic electroluminescence device comprising a cathode, an anode, and one or more organic thin film layers comprising a light emitting layer disposed between the cathode and the anode, wherein at least one layer of the organic thin film layers comprises at least one compound of formula (I).

According to another aspect of the invention an organic electroluminescence device is provided, wherein the light emitting layer comprises at least one compound of formula (I).

According to another aspect of the invention an organic electroluminescence device is provided, wherein the light emitting layer comprises at least one compound of formula (I) as a dopant material and an anthracene compound as a host material.

According to another aspect of the invention an electronic equipment provided with the organic electroluminescence device according to the present invention is provided.

According to another aspect of the invention an emitter material is provided comprising at least one compound of formula (I).

According to another aspect of the invention a light emitting layer is provided comprising at least one host and at least one dopant, wherein the dopant comprises at least one compound of formula (I).

According to another aspect of the invention the use of a compound of formula (I) according to the present invention in an organic electroluminescence device is provided.

In one embodiment, the organic EL device comprises a hole-transporting layer between the anode and the emitting layer.

In one embodiment, the organic EL device comprises an electron-transporting layer between the cathode and the emitting layer.

In the present specification, regarding the "one or more organic thin film layers between the emitting layer and the anode", if only one organic layer is present between the emitting layer and the anode, it means that layer, and if plural organic layers are present, it means at least one layer thereof. For example, if two or more organic layers are present between the emitting layer and the anode, an organic layer nearer to the emitting layer is called the "hole-transporting layer", and an organic layer nearer to the anode is called the "hole-injecting layer". Each of the "hole-transporting layer" and the "hole-injecting layer" may be a single layer or may be formed of two or more layers. One of these layers may be a single layer and the other may be formed of two or more layers.

Similarly, regarding the "one or more organic thin film layers between the emitting layer and the cathode", if only one organic layer is present between the emitting layer and the cathode, it means that layer, and if plural organic layers are present, it means at least one layer thereof. For example, if two or more organic layers are present between the emitting layer and the cathode, an organic layer nearer to the emitting layer is called the "electron-transporting layer", and an organic layer nearer to the cathode is called the "electron-injecting layer". Each of the "electron-transporting layer" and the "electron-injecting layer" may be a single layer or may be formed of two or more layers. One of these layers may be a single layer and the other may be formed of two or more layers.

The "one or more organic thin film layers comprising an emitting layer" mentioned above, preferably the emitting layer, comprises a compound represented by formula (I). The compound represented by formula (I) preferably functions as an emitter material, more preferably as a fluorescent emitter material, most preferably as a blue fluorescent emitter material. By the presence of a compound of formula (I) in the organic EL device, preferably in the emitting layer, organic EL devices characterized by high external quantum efficiencies (EQE) and long lifetimes are provided.

According to another aspect of the invention, an emitting layer of the organic electroluminescence device is provided which comprises at least one compound of formula (I).

Preferably, the emitting layer comprises at least one emitting material (dopant material) and at least one host material, wherein the emitting material is at least one compound of formula (I).

In one embodiment, the host is not selected from CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenylj ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine).

Preferred host materials are substituted or unsubstituted polyaromatic hydrocarbon (PAH) compounds, substituted or unsubstituted polyheteroaromatic compounds, substituted or unsubstituted anthracene compounds, or substituted or unsubstituted pyrene compounds.

More preferably, the organic electroluminescence device according to the present invention comprises in the emitting layer at least one compound of formula (I) as a dopant material and at least one host material selected from the group consisting of substituted or unsubstituted polyaromatic hydrocarbon (PAH) compounds, substituted or unsubstituted polyheteroaromatic compounds, substituted or unsubstituted anthracene compounds, and substituted or unsubstituted pyrene compounds. Preferably, the at least one host is at least one substituted or unsubstituted anthracene compound.

In a further preferred embodiment, the organic electroluminescence device according to the present invention comprises in the emitting layer at least one compound of formula (I) as a dopant material and at least one host material selected from the group consisting of substituted or unsubstituted polyaromatic hydrocarbon (PAH) compounds, substituted or unsubstituted anthracene compounds, and substituted or unsubstituted pyrene compounds. Preferably, the at least one host is at least one substituted or unsubstituted anthracene compound.

According to another aspect of the invention, an emitting layer of the organic electroluminescence device is provided which comprises at least one compound of formula (I) as a dopant material and an anthracene compound as a host material.

Suitable anthracene compounds are represented by the following formula (10):

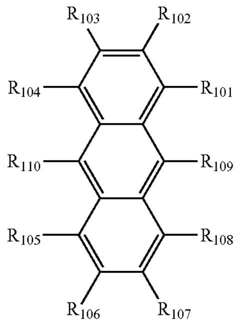

(10)

wherein one or more pairs of two or more adjacent $R_{101}$ to $R_{110}$ may form a substituted or unsubstituted, saturated or unsaturated ring;

$R_{101}$ to $R_{110}$ that do not form the substituted or unsubstituted, saturated or unsaturated ring are independently a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylene group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si($R_{121}$)($R_{122}$)($R_{123}$), —C(=O)$R_{124}$, —COO$R_{125}$, —N($R_{126}$)($R_{127}$), a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (31);

$R_{121}$ to $R_{127}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms or a substituted or unsubstituted monovalent heterocyclic group including 5 to 50 ring atoms; when each of $R_{121}$ to $R_{127}$ is present in plural, each of the plural $R_{121}$ to $R_{127}$ may be the same or different;

provided that at least one of $R_{101}$ to $R_{110}$ that do not form the substituted or unsubstituted, saturated or unsaturated ring is a group represented by the following formula (31). If two or more groups represented by the formula (31) are present, each of these groups may be the same or different;

(31)

$$—L_{101}—Ar_{101}$$

wherein in the formula (31), $L_{101}$ is a single bond, a substituted or unsubstituted arylene group including 6 to 30 ring carbon atoms or a substituted or unsubstituted divalent heterocyclic group including 5 to 30 ring atoms; $Ar_{101}$ is a substituted or unsubstituted aryl group including 6 to 50 ring carbon atoms or a substituted or unsubstituted monovalent heterocyclic group including 5 to 50 ring atoms.

Specific examples of each substituent, substituents for "substituted or unsubstituted" and the halogen atom in the compound (10) are the same as those mentioned above.

An explanation will be given on "one or more pairs of two or more adjacent $R_{101}$ to $R_{110}$ may form a substituted or unsubstituted, saturated or unsaturated ring".

The "one pair of two or more adjacent $R_{101}$ to $R_{110}$" is a combination of $R_{101}$ and $R_{102}$, $R_{102}$ and $R_{103}$, $R_{103}$ and $R_{104}$, $R_{105}$ and $R_{106}$, $R_{106}$ and $R_{107}$, $R_{107}$ and $R_{108}$, $R_{108}$ and $R_{109}$, $R_{101}$ and $R_{102}$ and $R_{103}$ or the like, for example.

The substituent in "substituted" in the "substituted or unsubstituted" for the saturated or unsaturated ring is the same as those for "substituted or unsubstituted" mentioned in the formula (10).

The "saturated or unsaturated ring" means, when $R_{101}$ and $R_{102}$ form a ring, for example, a ring formed by a carbon atom with which $R_{101}$ is bonded, a carbon atom with which $R_{102}$ is bonded and one or more arbitrary elements. Specifically, when a ring is formed by $R_{101}$ and $R_{102}$, when an unsaturated ring is formed by a carbon atom with which $R_{101}$ is bonded, a carbon atom with $R_{102}$ is bonded and four carbon atoms, the ring formed by $R_{101}$ and $R_{102}$ is a benzene ring.

The "arbitrary element" is preferably a C element, a N element, an O element or a S element In the arbitrary element (C element or N element, for example), atomic bondings that do not form a ring may be terminated by a hydrogen atom, or the like.

The "one or more arbitrary element" is preferably 2 or more and 15 or less, more preferably 3 or more and 12 or less, and further preferably 3 or more and 5 or less arbitrary elements.

For example, $R_{101}$ and $R_{102}$ may form a ring, and simultaneously, $R_{105}$ and $R_{106}$ may form a ring. In this case, the compound represented by the formula (10) is a compound represented by the following formula (10A), for example:

(10A)

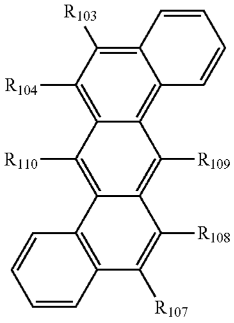

In one embodiment, $R_{101}$ to $R_{110}$ are independently a hydrogen atom, a substituted or unsubstituted alkyl group including 1 to 50 carbon atoms, a substituted or unsubstituted aryl group including 6 to 50 ring carbon atoms, a substituted or unsubstituted heterocyclic group including 5 to 50 ring atoms or a group represented by the formula (31).

Preferably, $R_{101}$ to $R_{110}$ are independently a hydrogen atom, a substituted or unsubstituted aryl group including 6 to 50 ring carbon atoms, a substituted or unsubstituted heterocyclic group including 5 to 50 ring atoms or a group represented by the formula (31).

More preferably, $R_{101}$ to $R_{110}$ are independently a hydrogen atom, a substituted or unsubstituted aryl group including 6 to 18 ring carbon atoms, a substituted or unsubstituted heterocyclic group including 5 to 18 ring atoms or a group represented by the formula (31).

Most preferably, at least one of $R_{109}$ and $R_{110}$ is a group represented by the formula (31).

Further most preferably, $R_{109}$ and $R_{110}$ are independently a group represented by the formula (31).

In one embodiment, the compound (10) is a compound represented by the following formula (10-1):

(10-1)

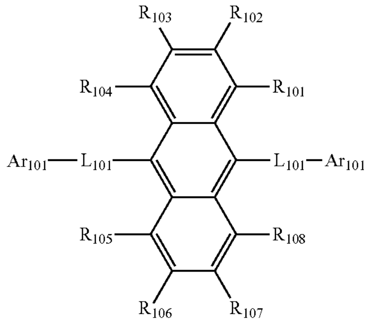

wherein in the formula (10-1), $R_{101}$ to $R_{108}$, $L_{101}$ and $Ar_{101}$ are as defined in the formula (10).

In one embodiment, the compound (10) is a compound represented by the following formula (10-2):

(10-2)

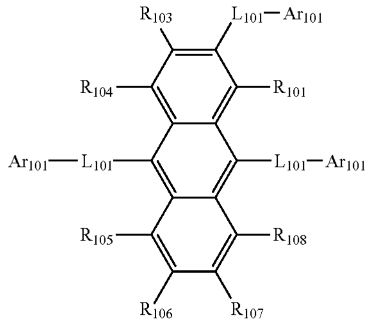

wherein in the formula (10-2), $R_{101}$, $R_{103}$ to $R_{108}$, $L_{101}$ and $Ar_{101}$ are as defined in the formula (10).

In one embodiment, the compound (10) is a compound represented by the following formula (10-3):

(10-3)

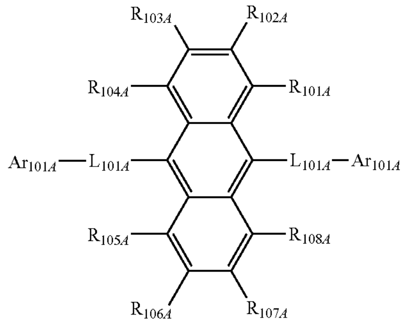

wherein in the formula (10-3), $R_{101A}$ to $R_{108A}$ are independently a hydrogen atom or a substituted or unsubstituted aryl group including 6 to 50 ring carbon atoms;

$L_{101A}$ is a single bond or a substituted or unsubstituted arylene group including 6 to 30 ring carbon atoms, and the two $L_{101A}$s may be the same or different;

$Ar_{101A}$ is a substituted or unsubstituted aryl group including 6 to 50 ring carbon atoms, and the two $Ar_{101A}$s may be the same or different.

In one embodiment, the compound (10) is a compound represented by the following formula (10-4):

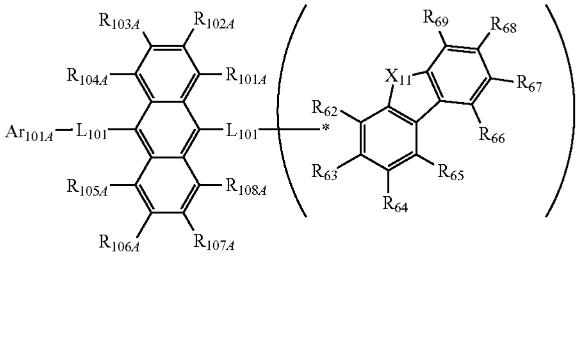

wherein in the formula (10-4), $L_{101}$ and $Ar_{101}$ are as defined in the formula (10);

$R_{101A}$ to $R_{108A}$ are independently a hydrogen atom or a substituted or unsubstituted aryl group including 6 to 50 ring carbon atoms;

$X_{11}$ is O, S, or $N(R_{61})$;

$R_{61}$ is a hydrogen atom, a substituted or unsubstituted alkyl group including 1 to 50 carbon atoms or a substituted or unsubstituted aryl group including 6 to 50 ring carbon atoms;

one of $R_{62}$ to $R_{69}$ is an atomic bonding that is bonded with $L_{101}$;

one or more pairs of adjacent $R_{62}$ to $R_{69}$ that are not bonded with $L_{101}$ may be bonded with each other to form a substituted or unsubstituted, saturated or unsaturated ring; and $R_{62}$ to $R_{69}$ that are not bonded with $L_{101}$ and do not form the substituted or unsubstituted, saturated or unsaturated ring are independently a hydrogen atom, a substituted or unsubstituted alkyl group including 1 to 50 carbon atoms or a substituted or unsubstituted aryl group including 6 to 50 ring carbon atoms.

In one embodiment, the compound (10) is a compound represented by the following formula (10-4A):

(10-4A)

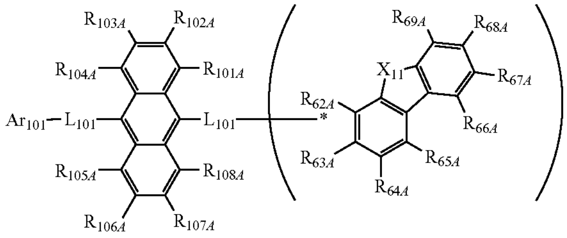

wherein in the formula (10-4A), $L_{101}$ and $Ar_{101}$ are as defined in the formula (10);

$R_{101A}$ to $R_{108A}$ are independently a hydrogen atom or a substituted or unsubstituted aryl group including 6 to 50 ring carbon atoms;

$X_{11}$ is O, S or $N(R_{61})$;

$R_{61}$ is a hydrogen atom, a substituted or unsubstituted alkyl group including 1 to 50 carbon atoms or a substituted or unsubstituted aryl group including 6 to 50 ring carbon atoms; one or more pairs of adjacent two or more of $R_{62A}$ to $R_{69A}$ may form a substituted or unsubstituted, saturated or unsaturated ring, and adjacent two of $R_{62A}$ to $R_{69A}$ form a ring represented by the following formula (10-4A-1); and $R_{62A}$ to $R_{69A}$ that do not form a substituted or unsubstituted, saturated or unsaturated ring are independently a hydrogen atom, a substituted or unsubstituted alkyl group including 1 to 50 carbon atoms or a substituted or unsubstituted aryl group including 6 to 50 ring carbon atoms.

(10-4A-1)

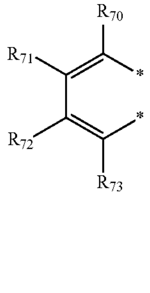

wherein in the formula (10-4A-1), each of the two atomic bondings * is bonded with adjacent two of $R_{62A}$ to $R_{69A}$;

one of $R_{70}$ to $R_{73}$ is an atomic bonding that is bonded with $L_{101}$; and $R_{70}$ to $R_{73}$ that are not bonded with $L_{101}$ are independently a hydrogen atom, a substituted or unsubstituted alkyl group including 1 to 50 carbon atoms or a substituted or unsubstituted aryl group including 6 to 50 ring carbon atoms.

In one embodiment, the compound (10) is a compound represented by the following formula (10-6):

(10-6)

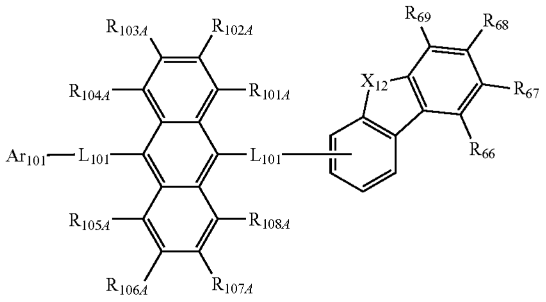

wherein in the formula (10-6), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4); and $X_{12}$ is O or S.

In one embodiment, the compound represented by the formula (10-6) is a compound represented by the following formula (10-6H):

(10-6H)

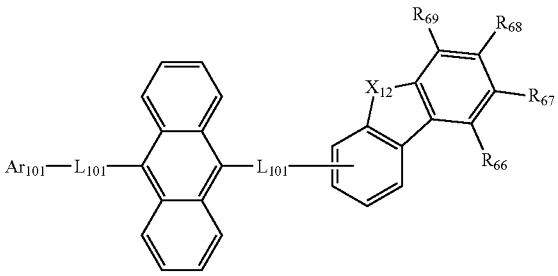

wherein in the formula (10-6H), $L_{101}$ and $Ar_{101}$ are as defined in the formula (10);

$R_{66}$ to $R_{69}$ are as defined in the formula (10-4); and $X_{12}$ is O or S.

In one embodiment, the compound represented by the formulae (10-6) and (10-6H) is a compound represented by the following formula (10-6Ha):

(10-6Ha)

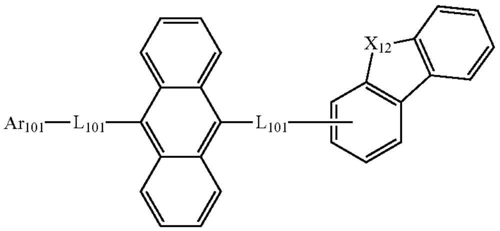

wherein in the formula (10-6Ha), $L_{101}$ and $Ar_{101}$ are as defined in the formula (10); and $X_{12}$ is O or S.

In one embodiment, the compound represented by the formulae (10-6), (10-6H) and (10-6Ha) is a compound represented by the following formula (10-6Ha-1) or (10-6Ha-2):

(10-6Ha-1)

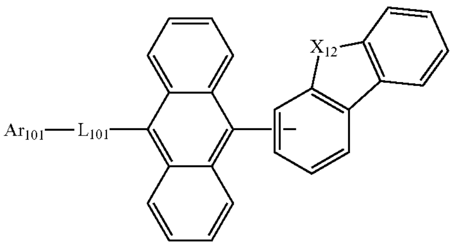

(10-6Ha-2)

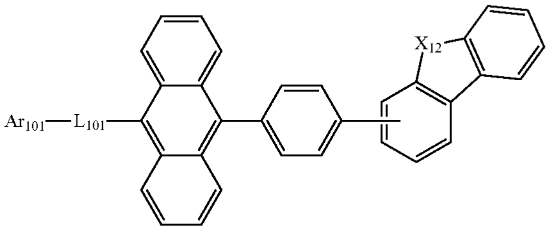

wherein in the formula (10-6Ha-1) and (10-6Ha-2), $L_{101}$ and $Ar_{101}$ are as defined in the formula (10); and $X_{12}$ is O or S.

In one embodiment, the compound (10) is a compound represented by the following formula (10-7):

(10-7)

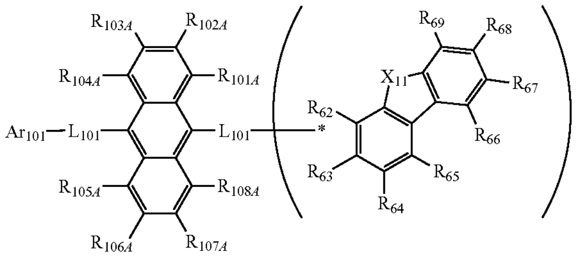

wherein in the formula (10-7), $L_{101}$ and $Ar_{101}$ are as defined in the formula (10);

$R_{101A}$ to $R_{108A}$ are as defined in the formula (10-4);

$X_{11}$ is as defined in the formula (10-4); and $R_{62}$ to $R_{69}$ are as defined in the formula (10-4), provided that any one pair of $R_{66}$ and $R_{67}$, $R_{67}$ and $R_{68}$, and $R_{68}$ and $R_{69}$ are bonded with each other to form a substituted or unsubstituted, saturated or unsaturated ring.

In one embodiment, the compound (10) is a compound represented by the following formula (10-7H):

(10-7H)

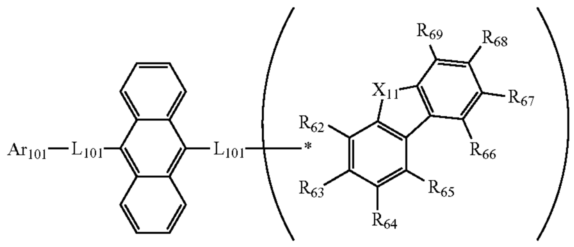

wherein in the formula (10-7H), $L_{101}$ and $Ar_{101}$ are as defined in the formula (10);

$X_{11}$ is as defined in the formula (10-4); and $R_{62}$ to $R_{69}$ are as defined in the formula (10-4), provided that any one pair of $R_{66}$ and $R_{67}$, $R_{67}$ and $R_{68}$, and $R_{68}$ and $R_{69}$ are bonded with each other to form a substituted or unsubstituted, saturated or unsaturated ring.

In one embodiment, the compound (10) is a compound represented by the following formula (10-8):

(10-8)

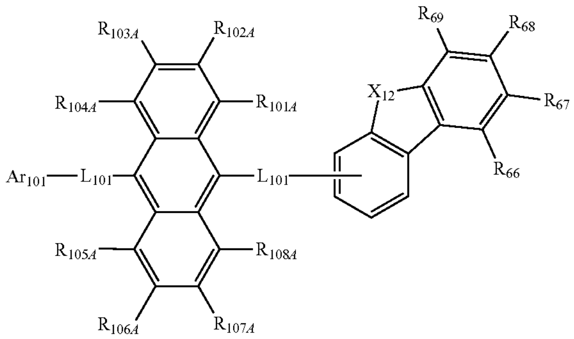

wherein in the formula (10-8), $L_{101}$ and $Ar_{101}$ are as defined in the formula (10);

$R_{101A}$ to $R_{108A}$ are as defined in the formula (10-4);

$X_{12}$ is O or S; and $R_{66}$ to $R_{69}$ are as defined in the formula (10-4), provided that any one pair of $R_{66}$ and $R_{67}$, $R_{67}$ and $R_{68}$, as well as $R_{68}$ and $R_{69}$ are bonded with each other to form a substituted or unsubstituted, saturated or unsaturated ring.

In one embodiment, the compound represented by the formula (10-8) is a compound represented by the following formula (10-8H):

(10-8H)

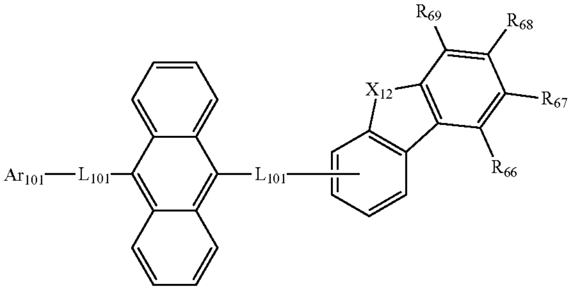

In the formula (10-8H), $L_{101}$ and $Ar_{101}$ are as defined in the formula (10).

$R_{66}$ to $R_{69}$ are as defined in the formula (10-4), provided that any one pair of $R_{66}$ and $R_{67}$, $R_{67}$ and $R_{68}$, as well as $R_{68}$ and $R_{69}$ are bonded with each other to form a substituted or unsubstituted, saturated or unsaturated ring. Any one pair of $R_{66}$ and $R_{67}$, $R_{67}$ and $R_{68}$, as well as $R_{68}$ and $R_{69}$ may preferably be bonded with each other to form an unsubstituted benzene ring; and $X_{12}$ is O or S.

In one embodiment, as for the compound represented by the formula (10-7), (10-8) or (10-8H), any one pair of $R_{66}$ and $R_{67}$, $R_{67}$ and $R_{68}$, as well as $R_{68}$ and $R_{69}$ are bonded with each other to form a ring represented by the following formula (10-8-1) or (10-8-2), and $R_{66}$ to $R_{69}$ that do not form the ring represented by the formula (10-8-1) or (10-8-2) do not form a substituted or unsubstituted, saturated or unsaturated ring.

(10-8-1)

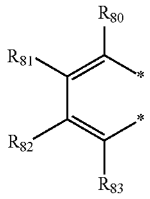

(10-8-2)

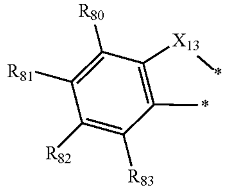

wherein in the formulae (10-8-1) and (10-8-2), the two atomic bondings * are independently bonded with one pair of $R_{66}$ and $R_{67}$, $R_{67}$ and $R_{68}$, or $R_{68}$ and $R_{69}$;

$R_{80}$ to $R_{83}$ are independently a hydrogen atom, a substituted or unsubstituted alkyl group including 1 to 50 carbon atoms or a substituted or unsubstituted aryl group including 6 to 50 ring carbon atoms; and $X_{13}$ is O or S.

In one embodiment, the compound (10) is a compound represented by the following formula (10-9):

(10-9)

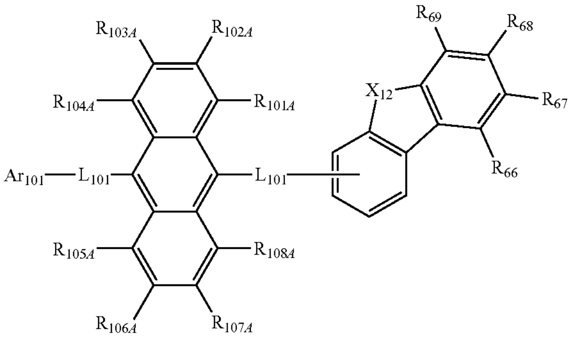

wherein in the formula (10-9), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4), provided that $R_{66}$ and $R_{67}$, $R_{67}$ and $R_{68}$, as well as $R_{68}$ and $R_{69}$ are not bonded with each other and do not form a substituted or unsubstituted, saturated or unsaturated ring; and $X_{12}$ is O or S.

In one embodiment, the compound (10) is selected from the group consisting of compounds represented by the following formulae (10-10-1) to (10-10-4).

(10-10-1)

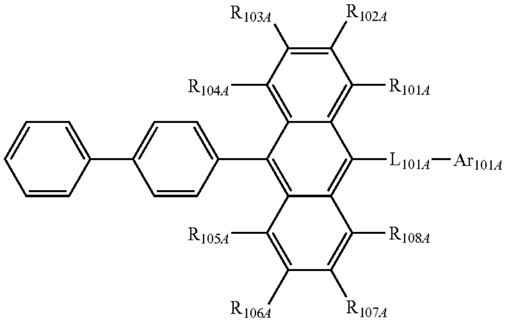

-continued (10-10-2)

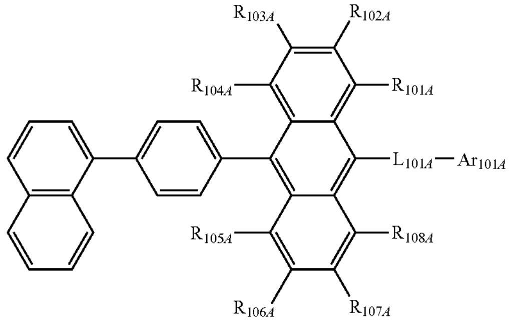

(10-10-3)

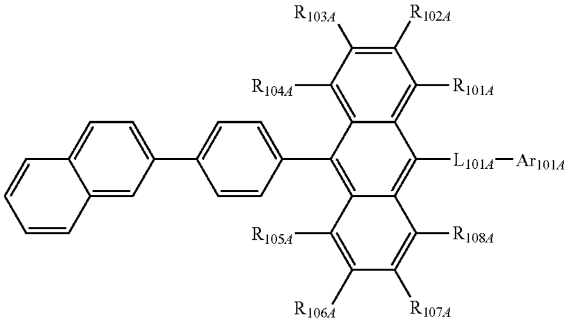

(10-10-4)

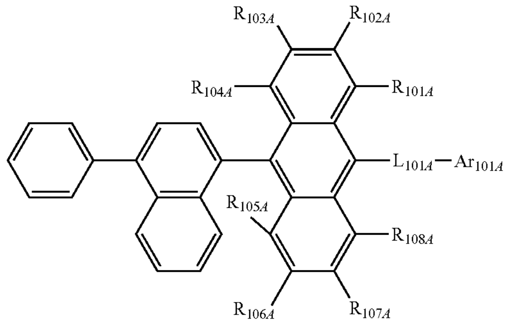

In the formulae (10-10-11H) to (10-10-41H), $L_{101A}$ and $Ar_{101A}$ are as defined in the formula (10-3).

As for the compound represented by the formula (10), the following compounds can be given as specific examples.

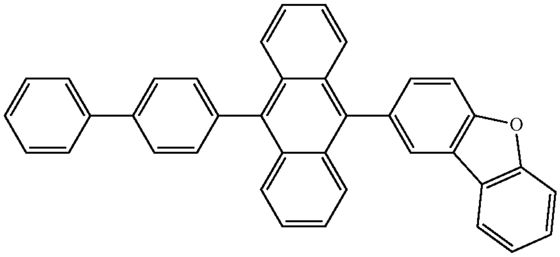

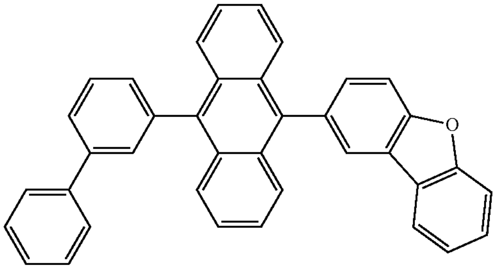

-continued
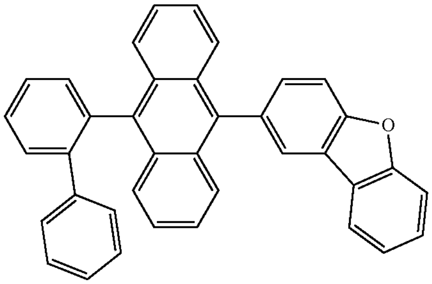
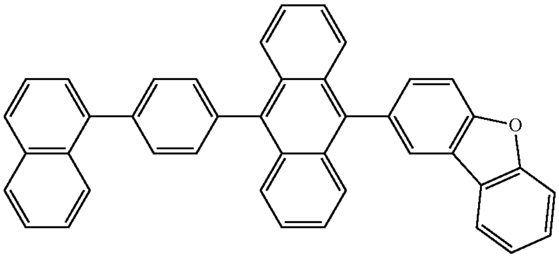
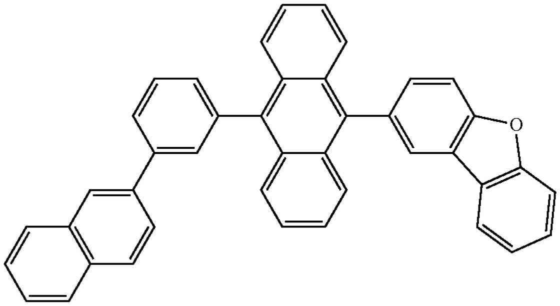
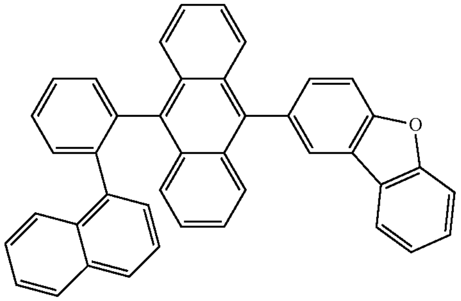
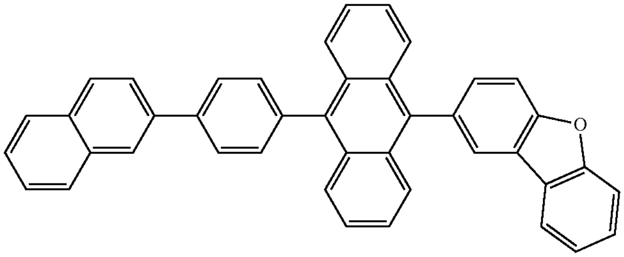
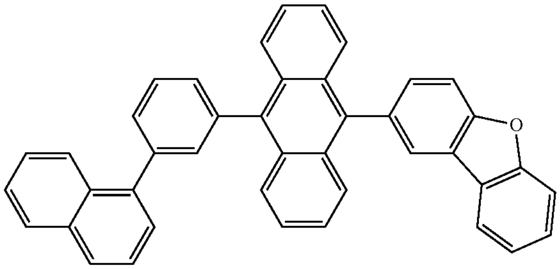
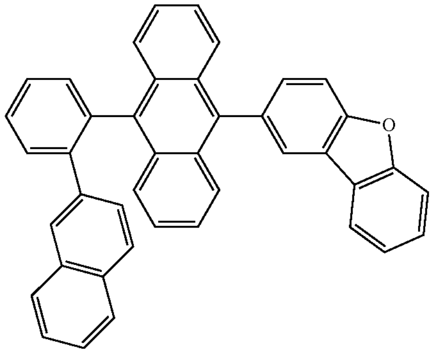
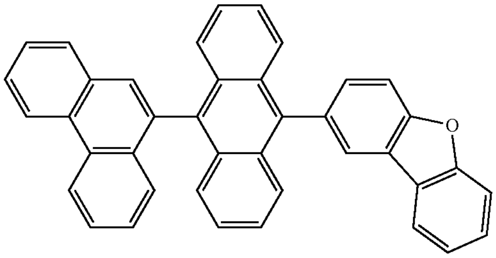
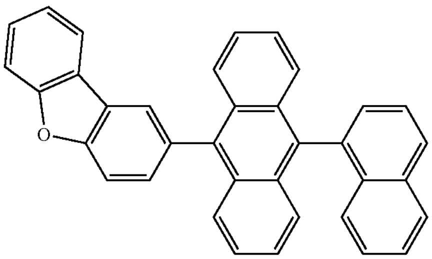
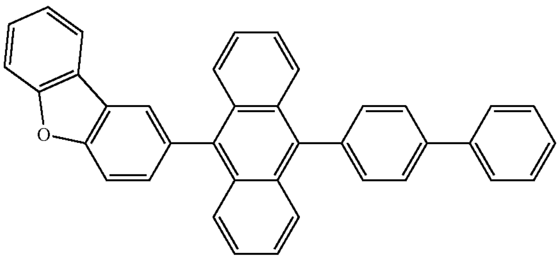

-continued
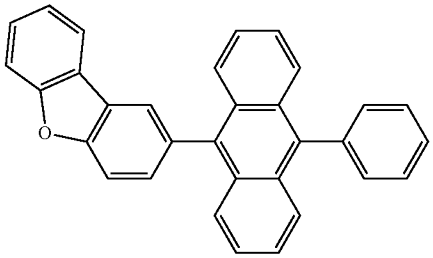
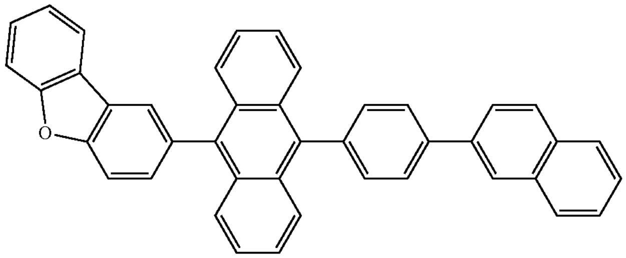
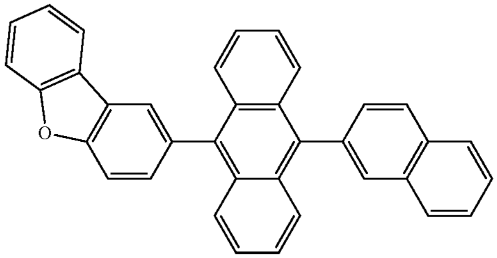
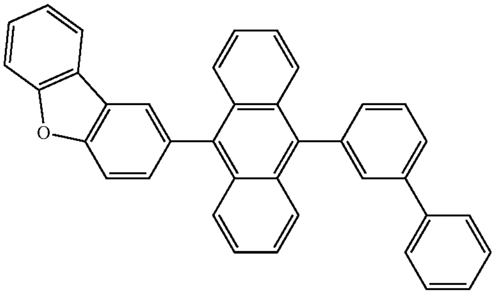
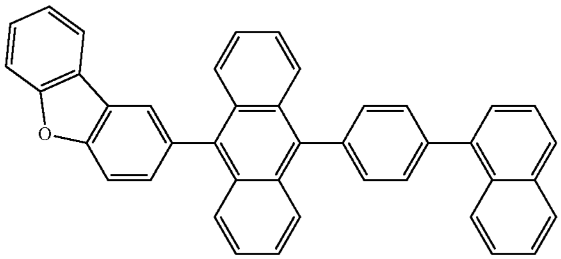
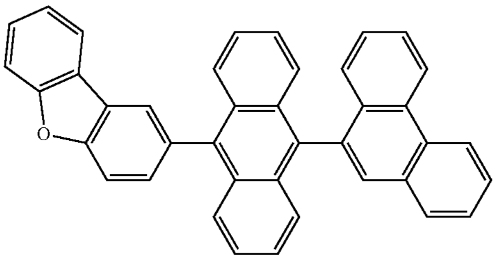
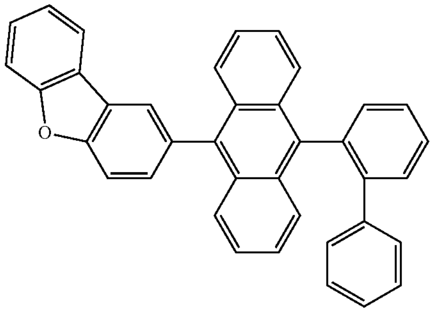
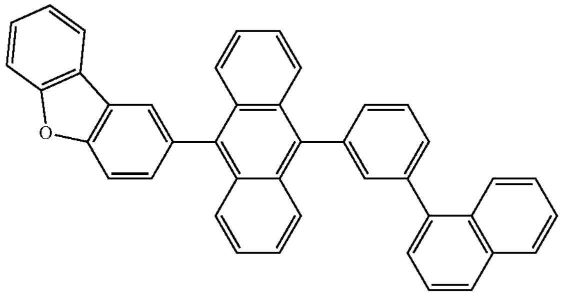
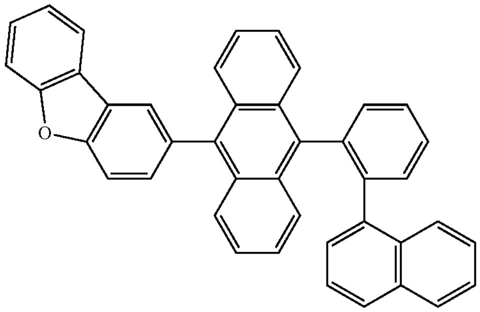
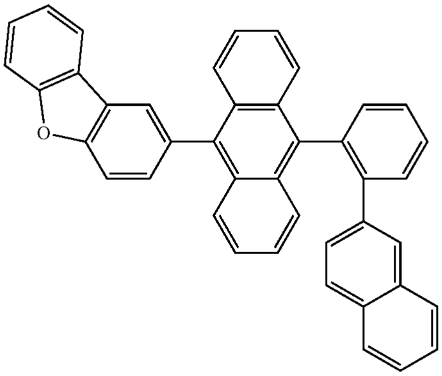

-continued
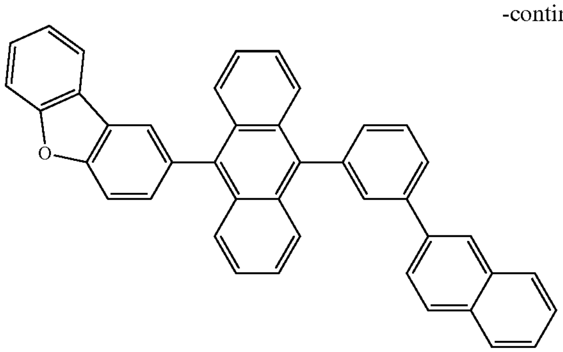
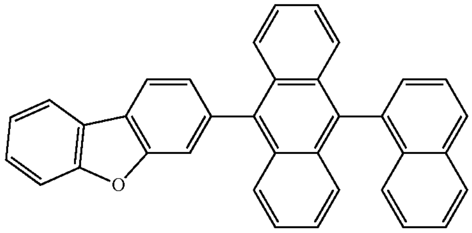
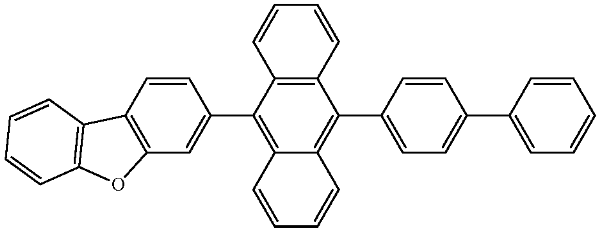
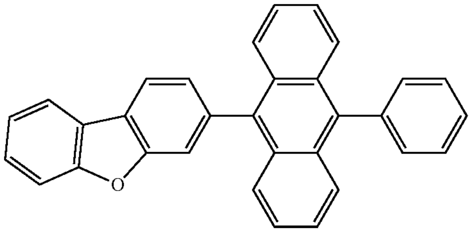
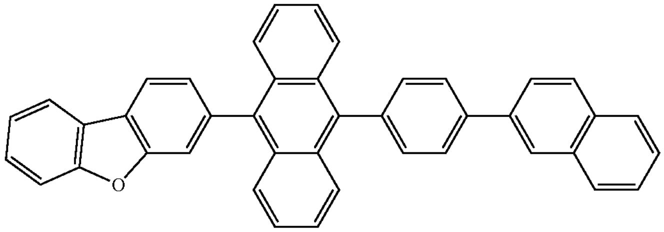
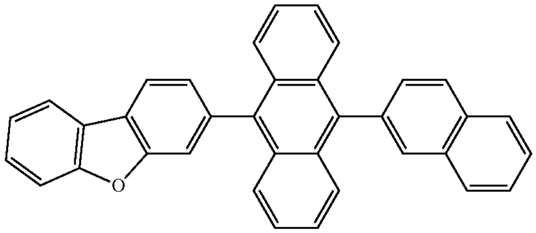
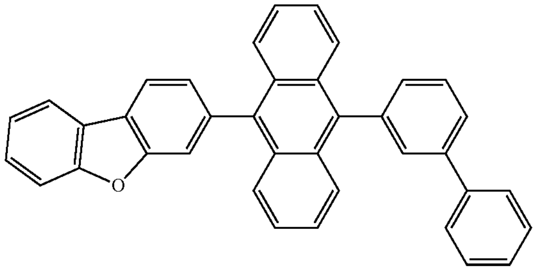
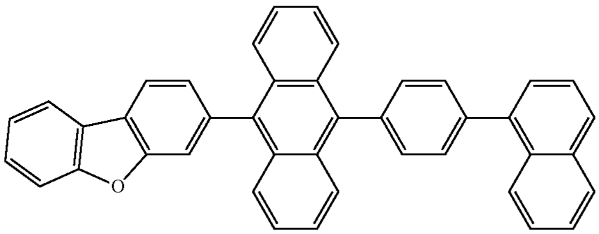
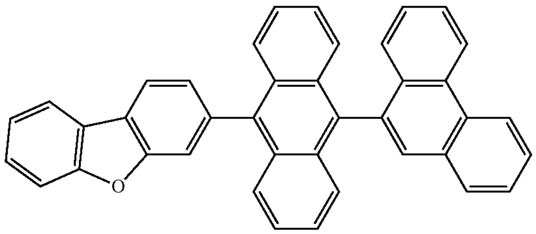
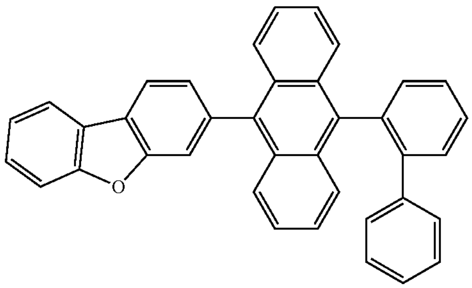
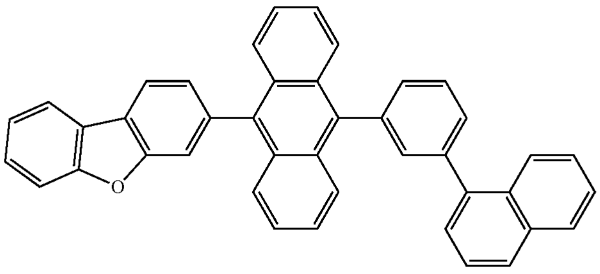

-continued
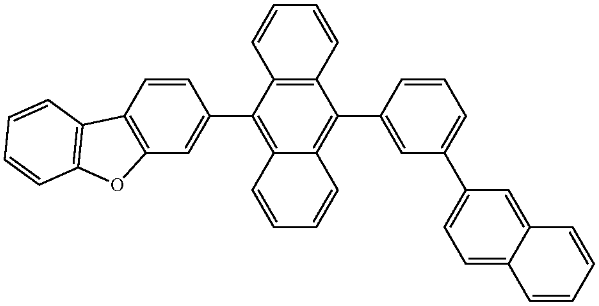
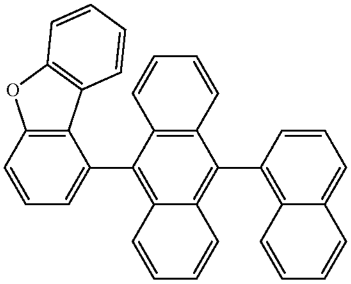
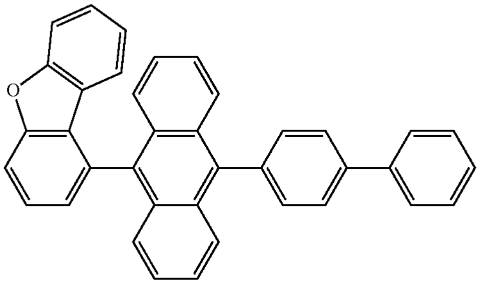
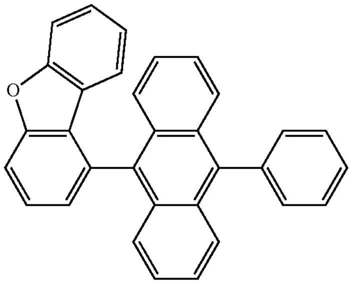
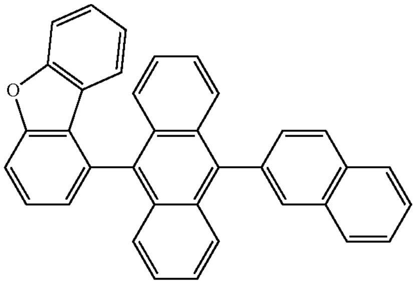
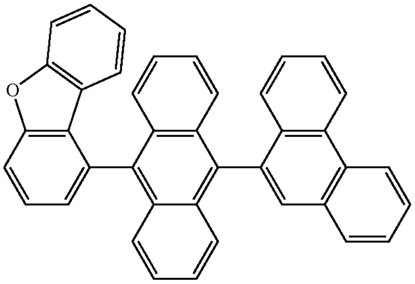
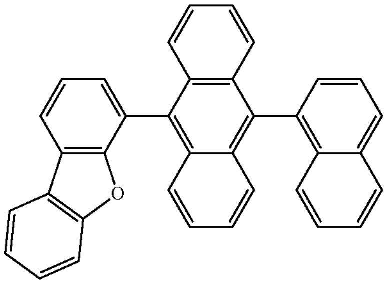
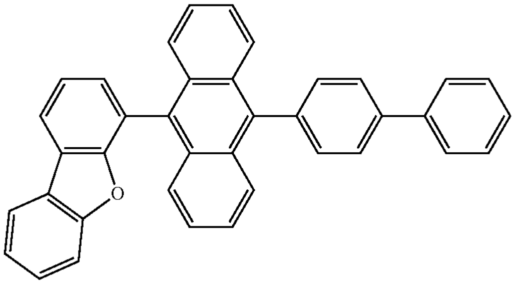
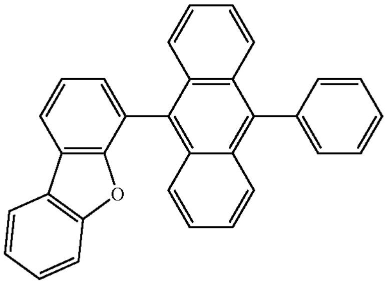
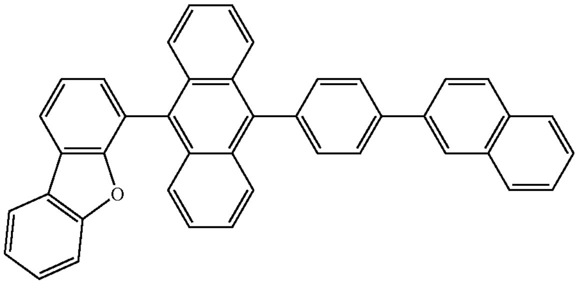
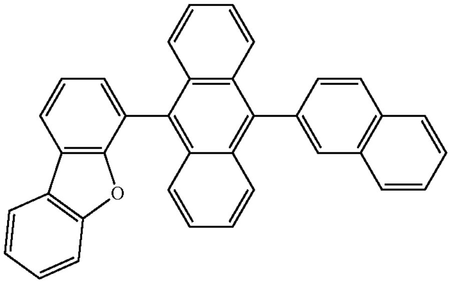
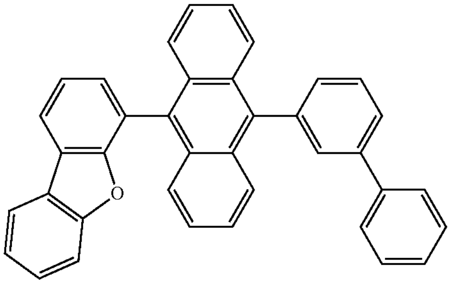

-continued
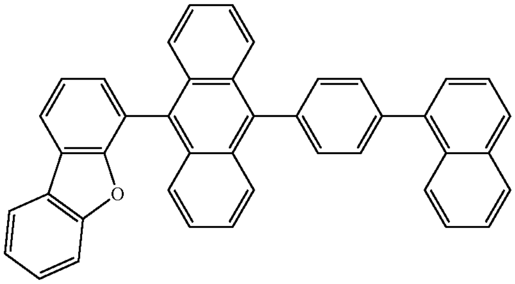
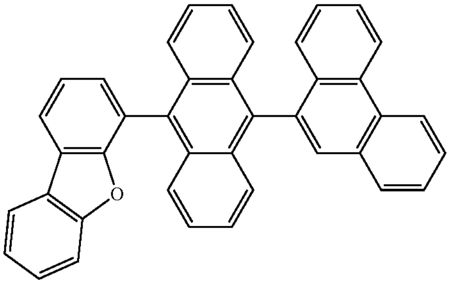
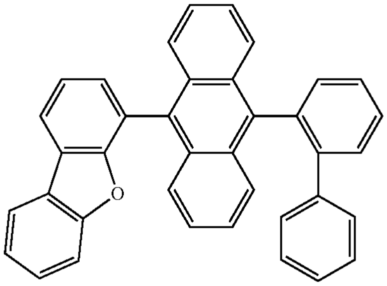
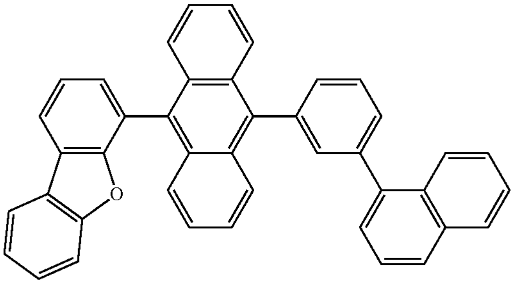
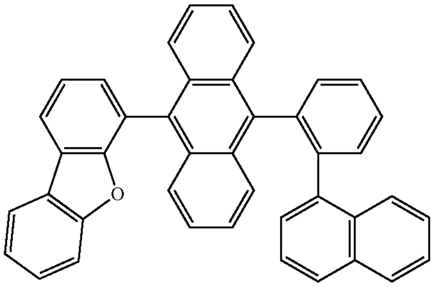
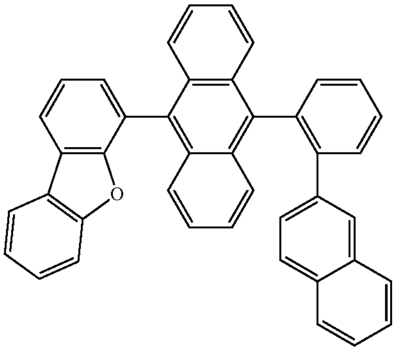
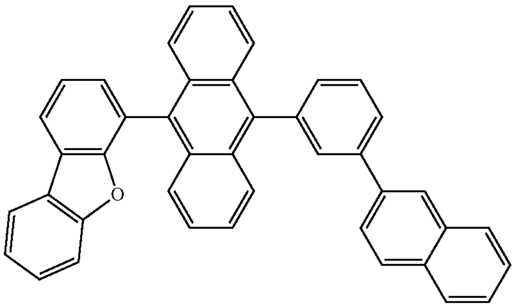
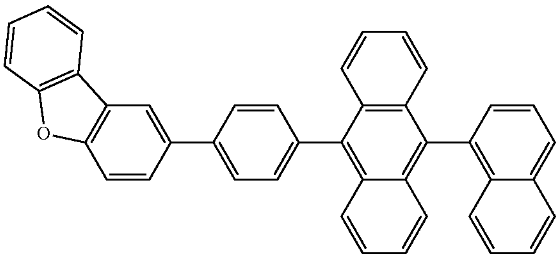

-continued
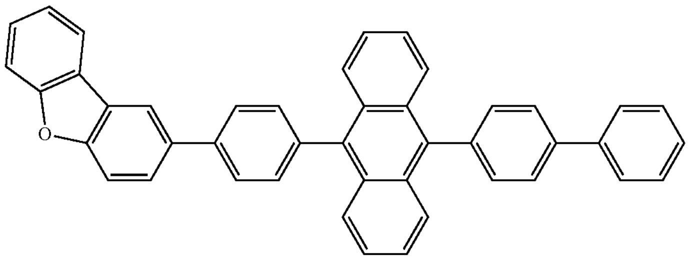
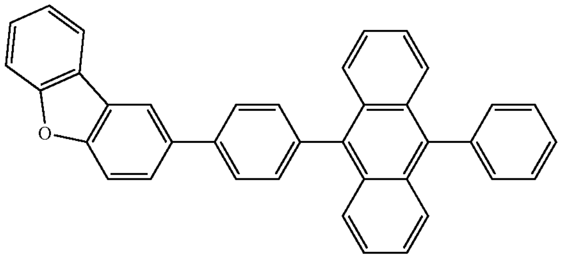
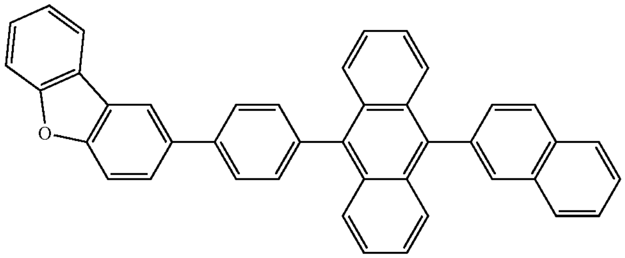
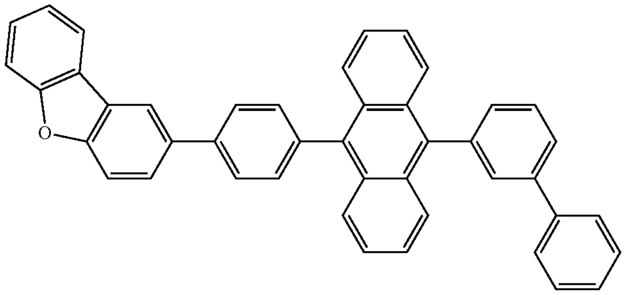
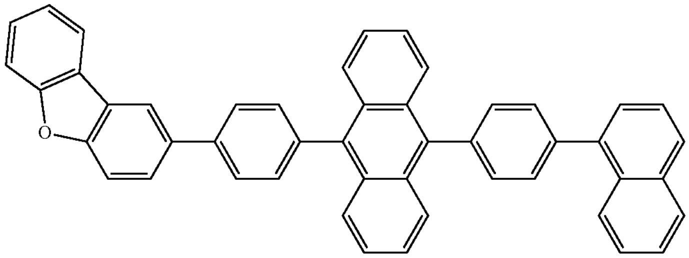
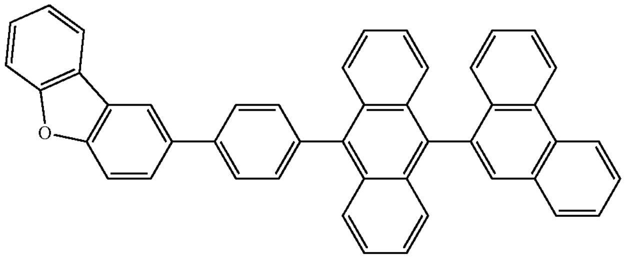

-continued
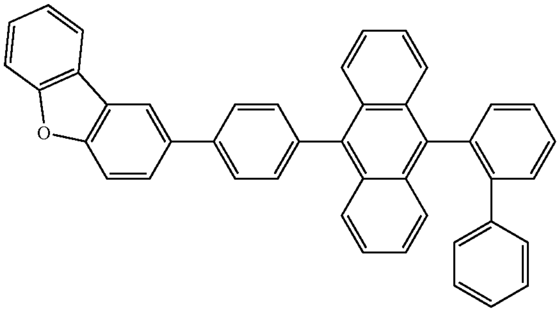
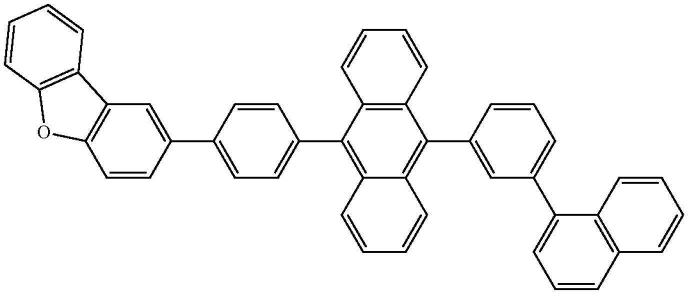
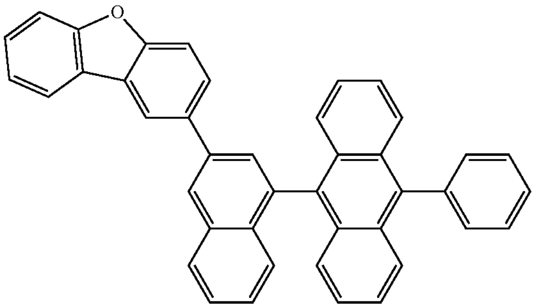
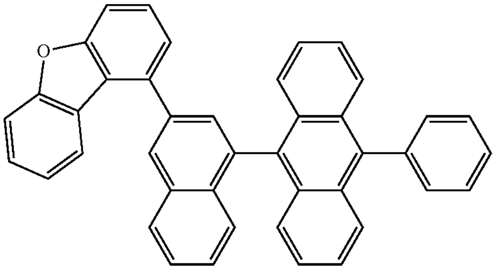
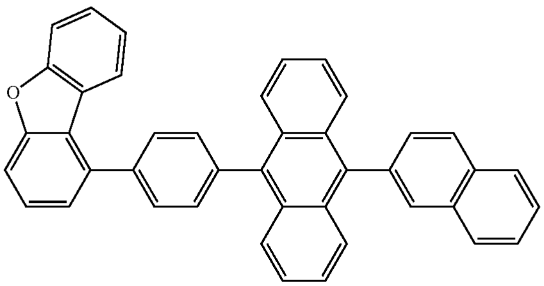
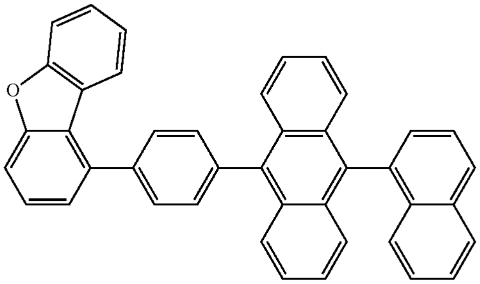
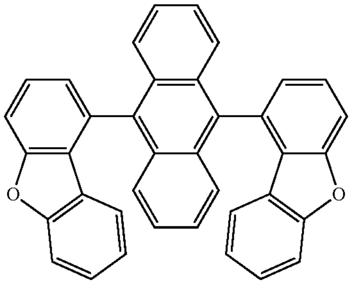
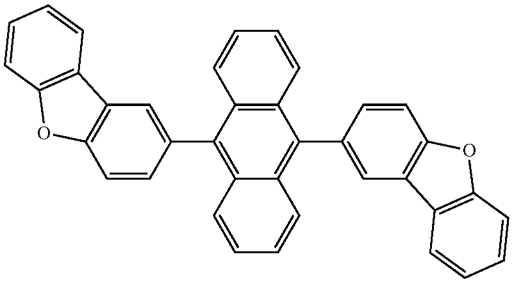

-continued
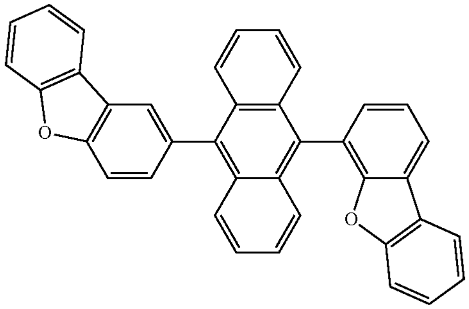
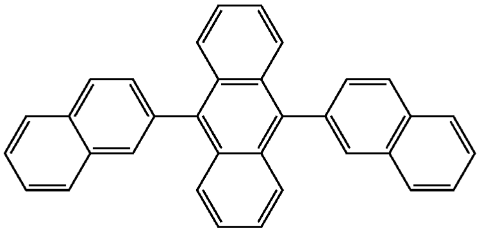
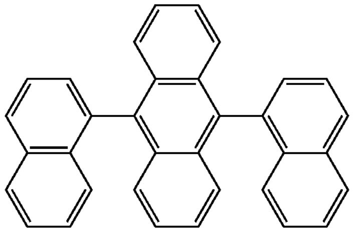
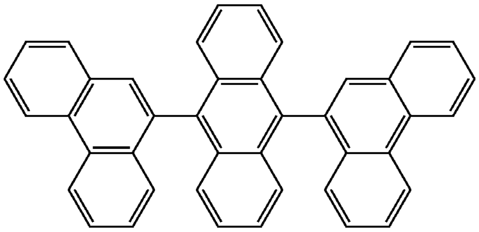
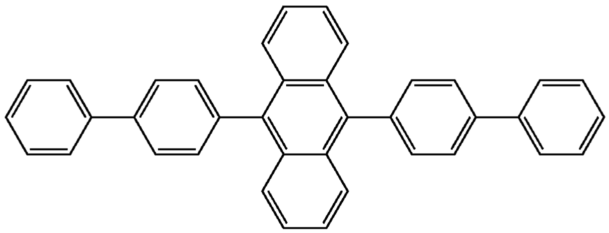
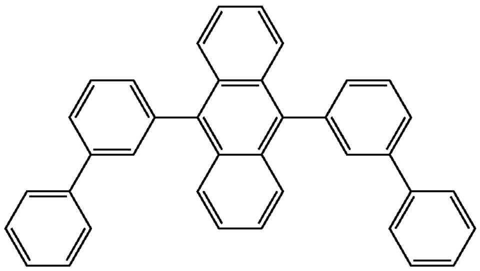
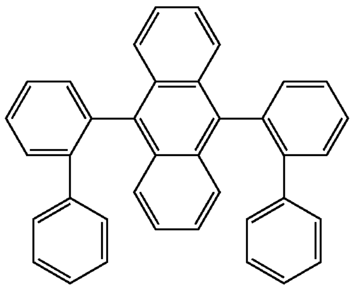
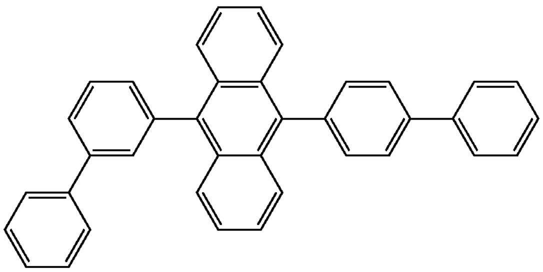
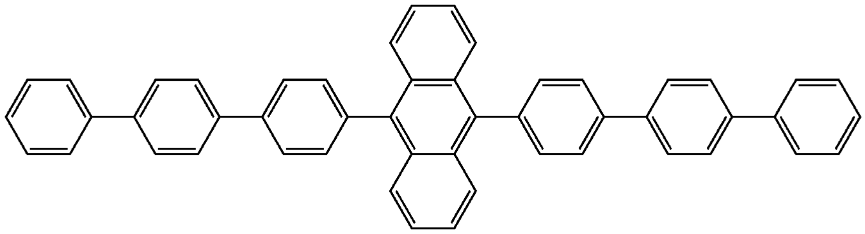
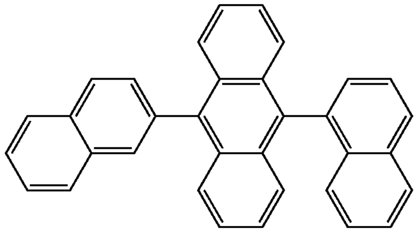
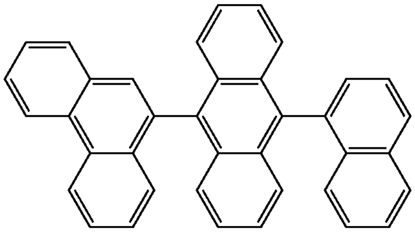

-continued
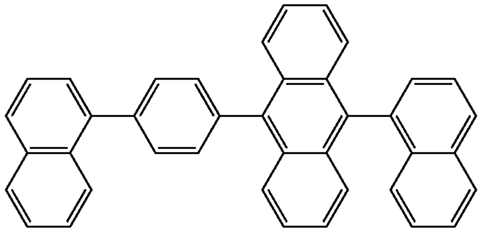
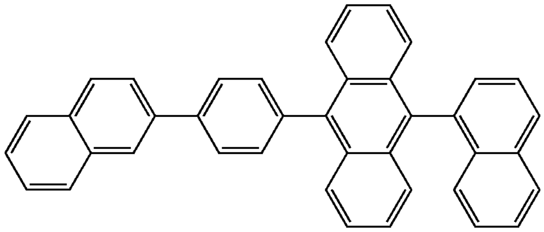
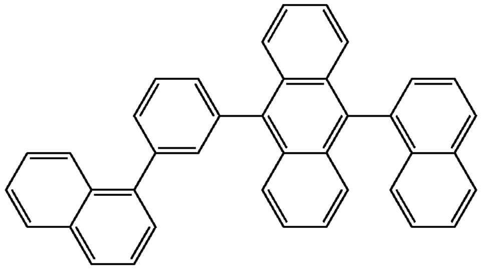
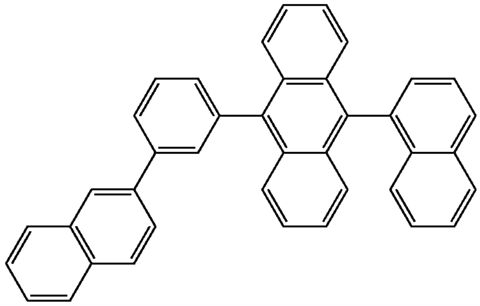
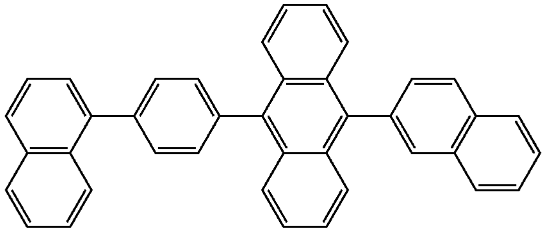
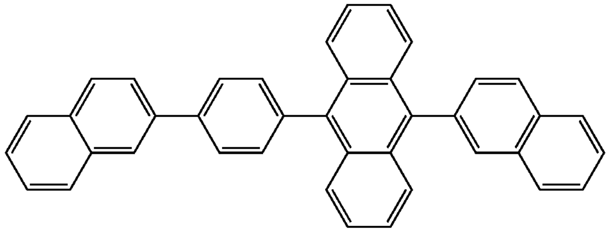
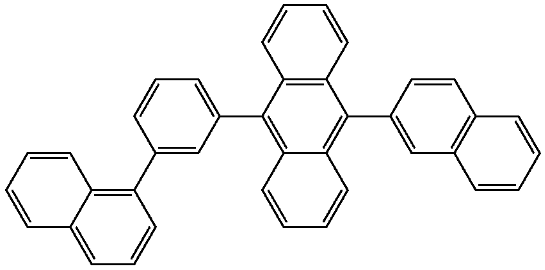
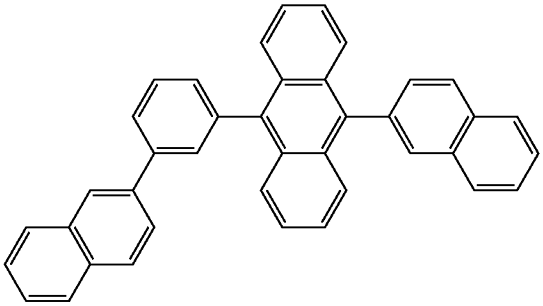
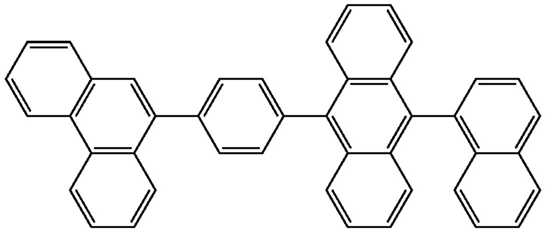
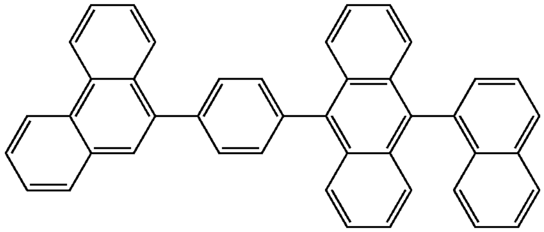

-continued
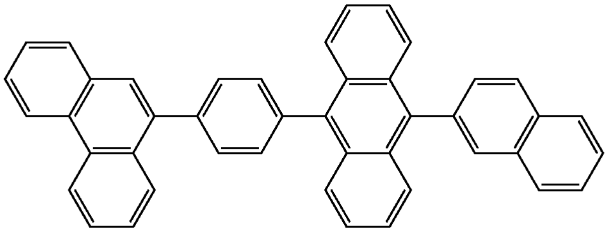
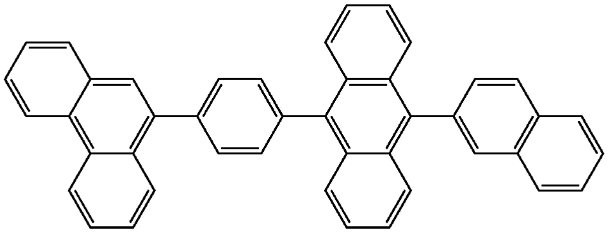
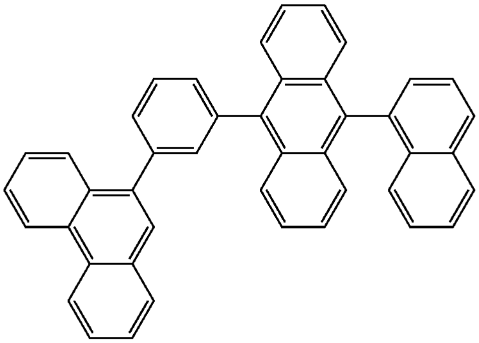
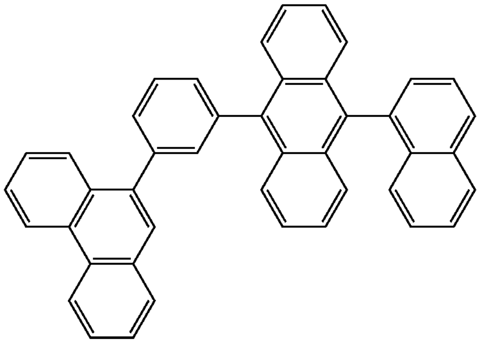
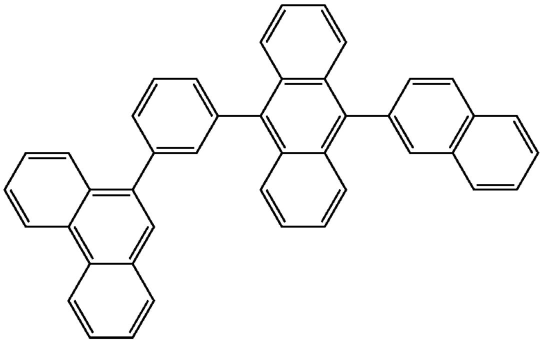
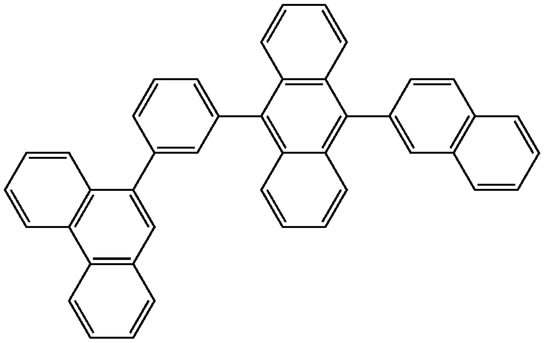
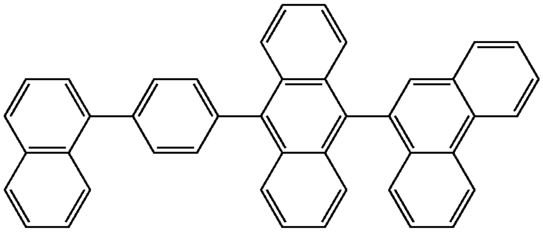
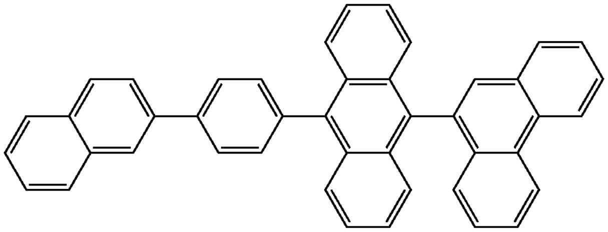

-continued
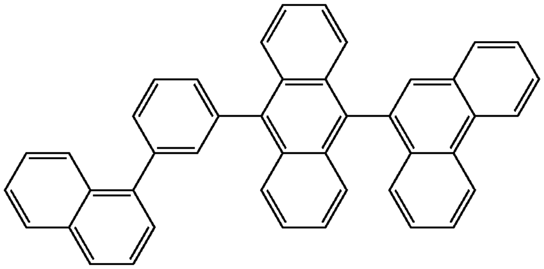
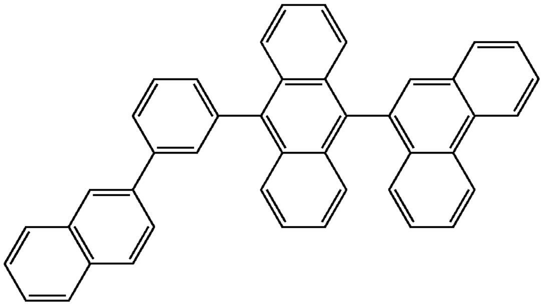
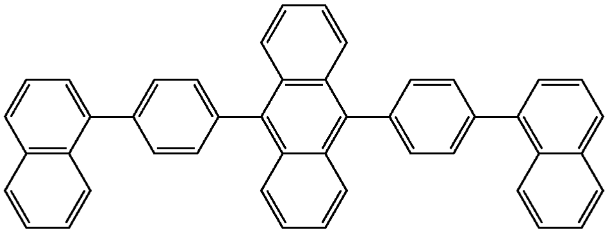
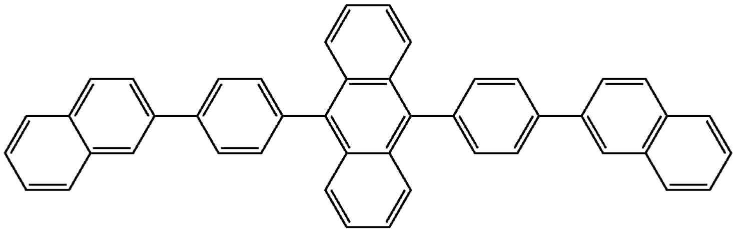
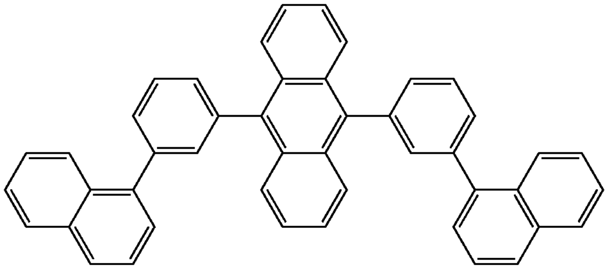
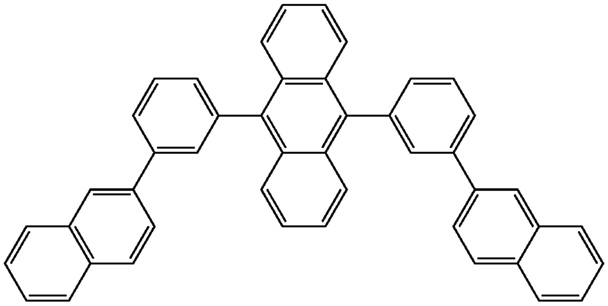
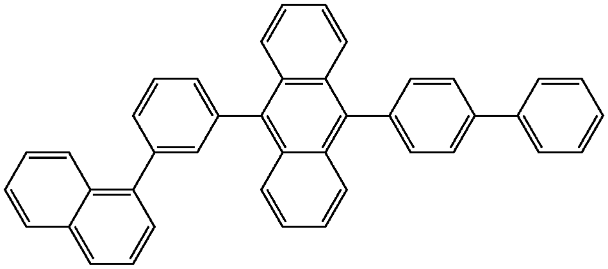

-continued
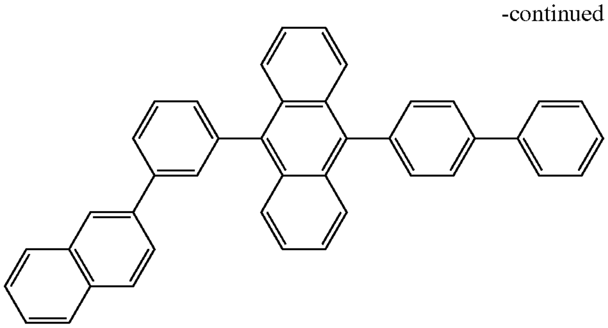
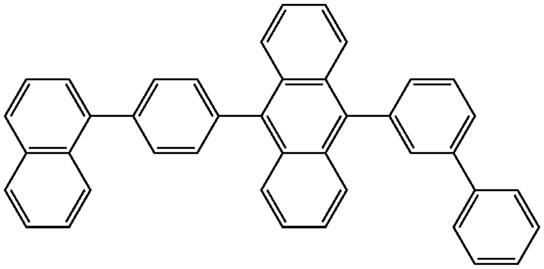
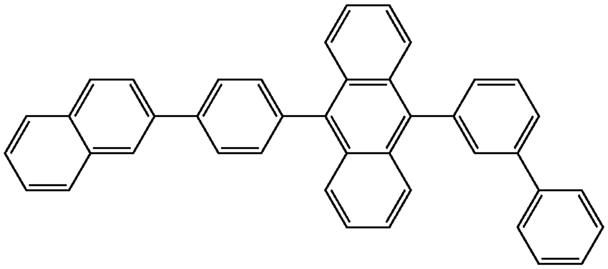
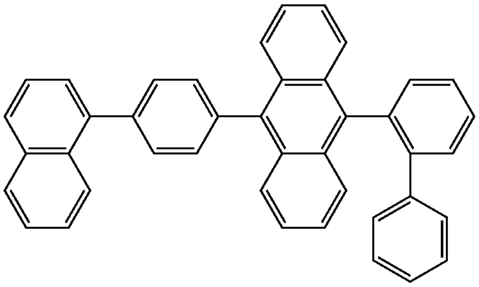
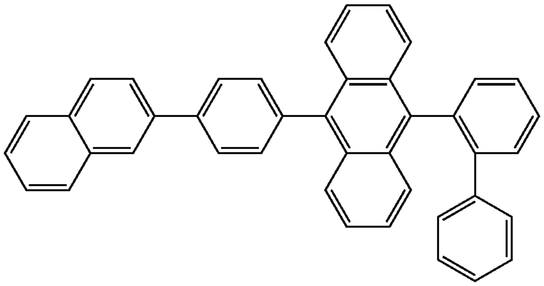
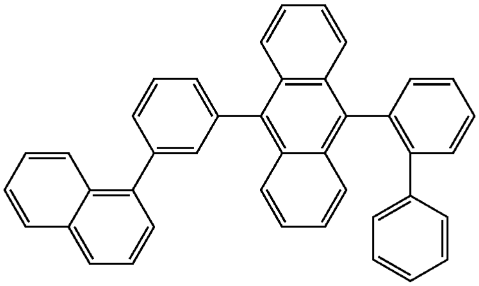
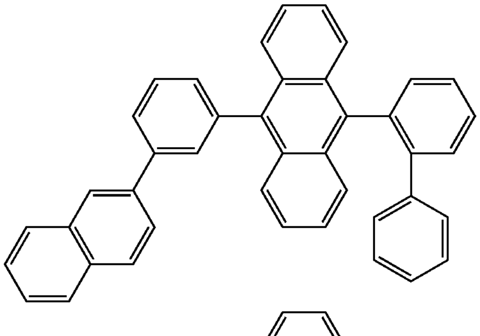
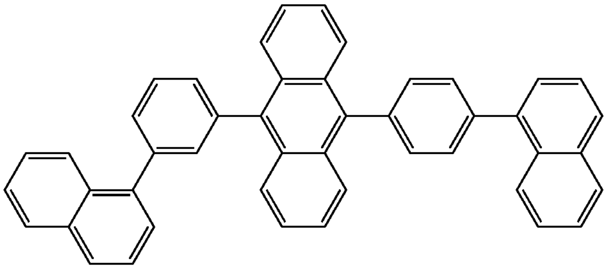
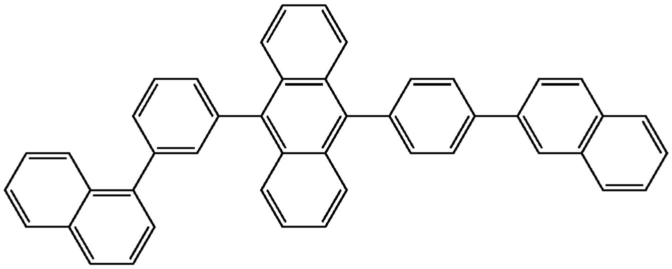

-continued
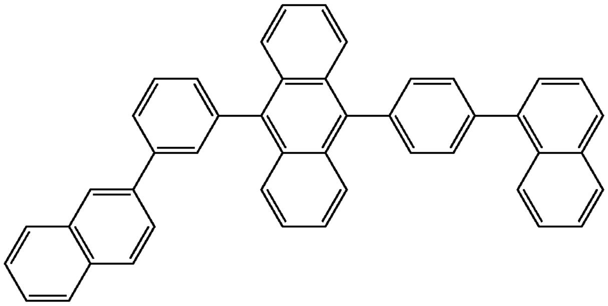
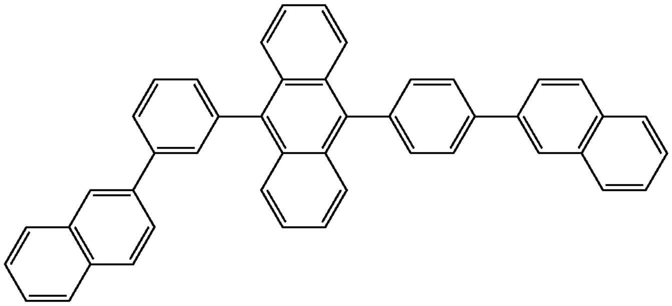
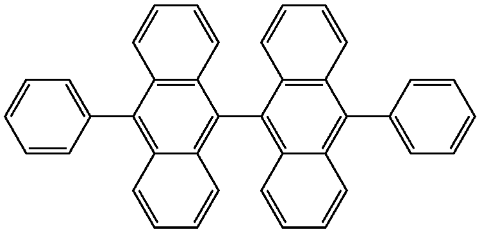
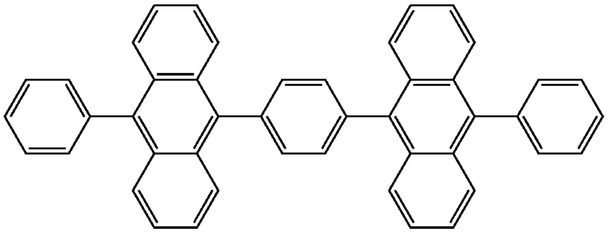
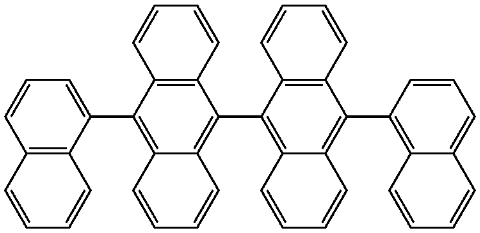
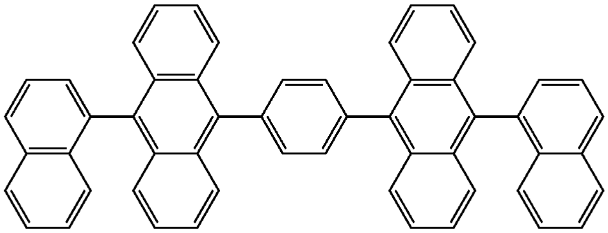
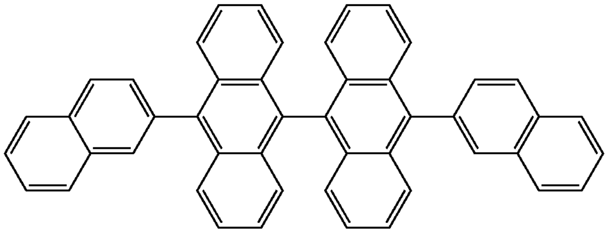
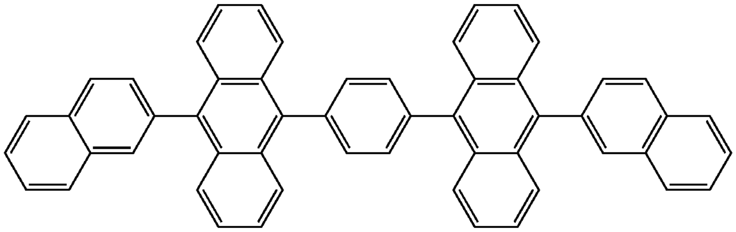

-continued
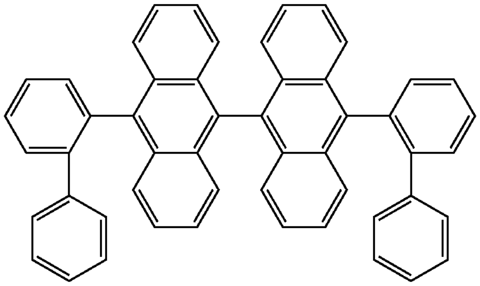
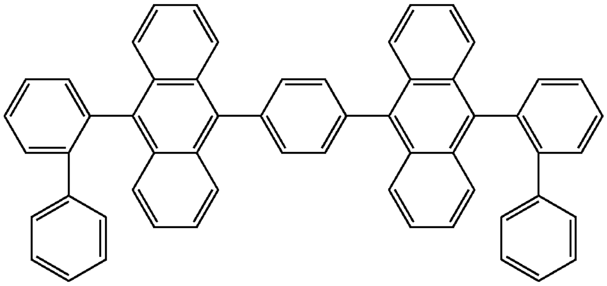
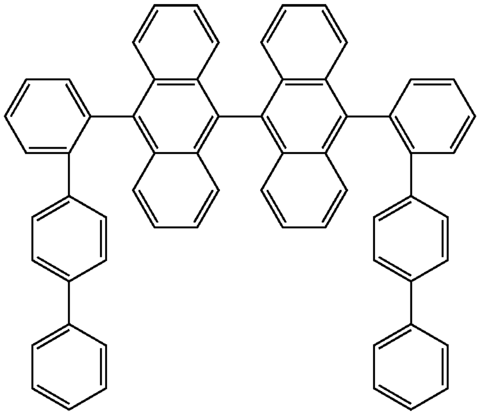
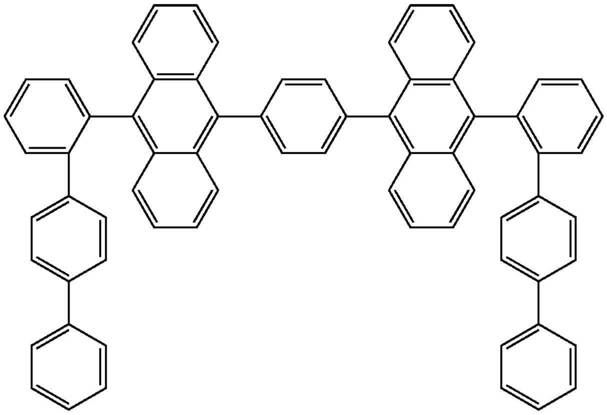
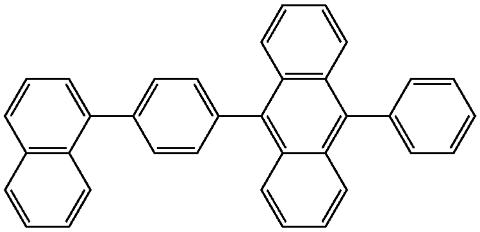
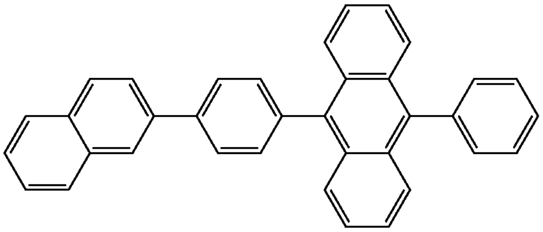
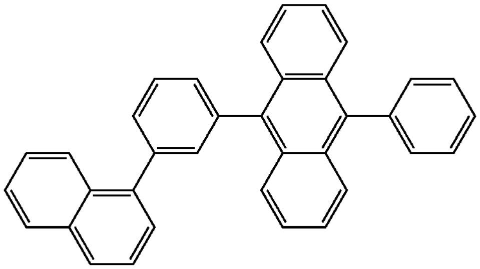
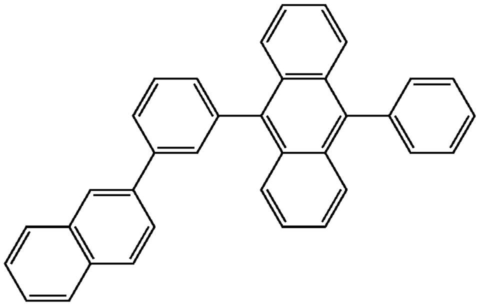
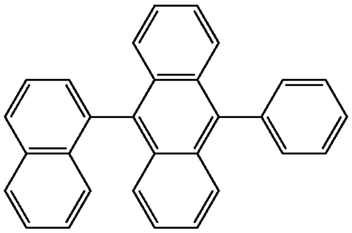
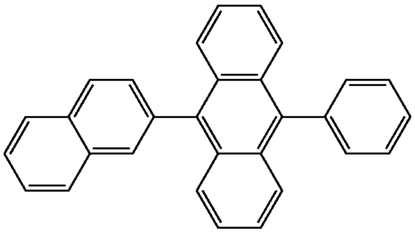
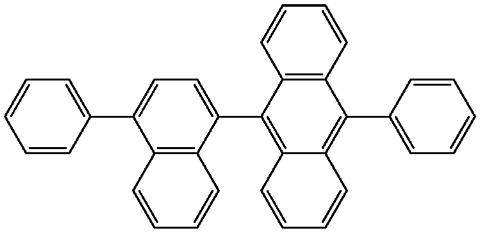
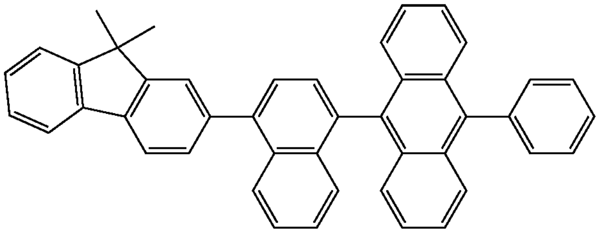

-continued
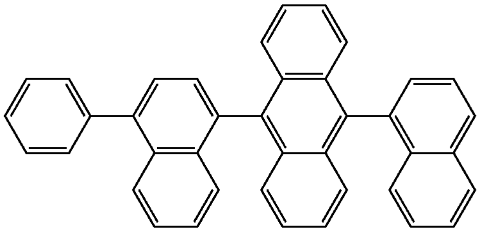
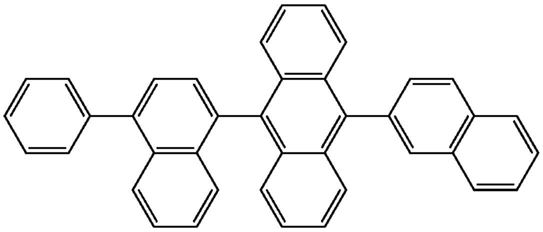
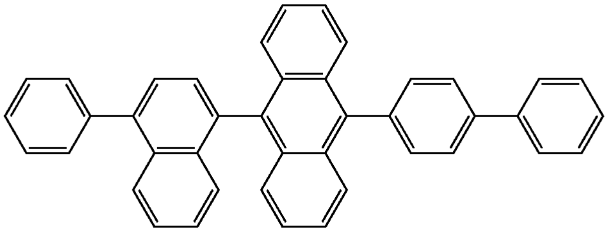
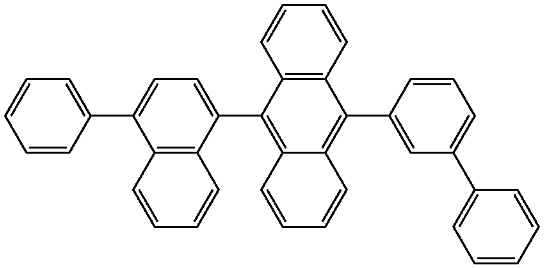
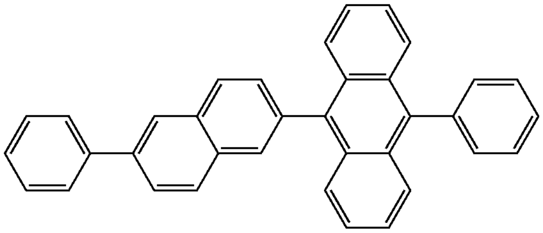
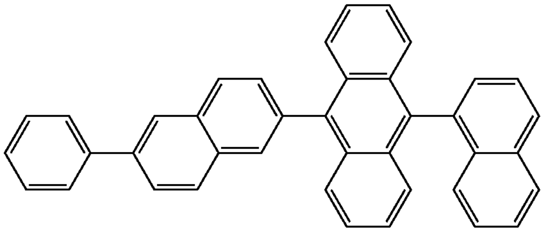
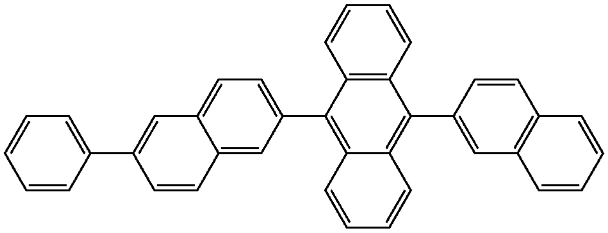
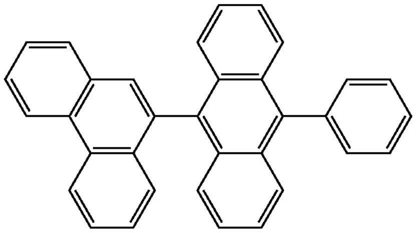
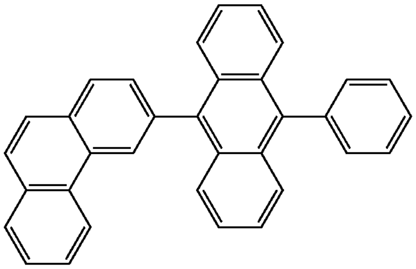
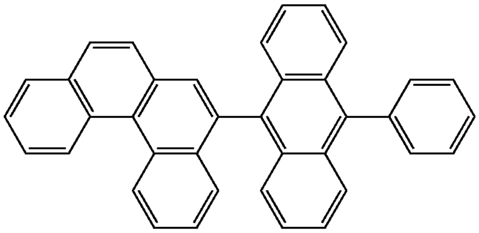

-continued
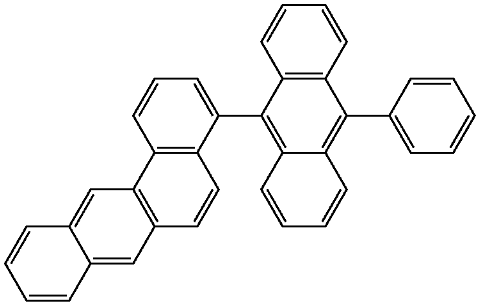
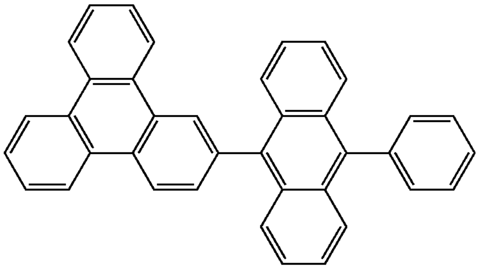
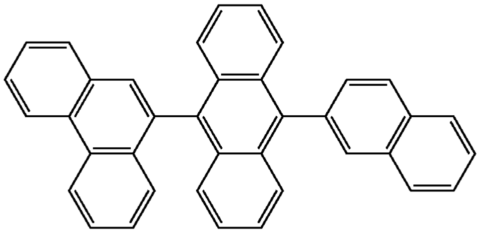
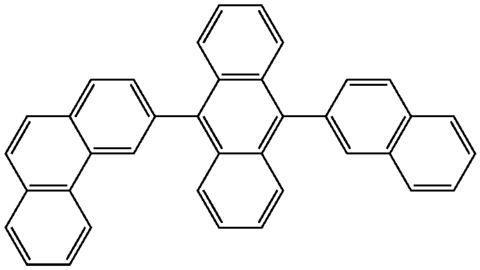
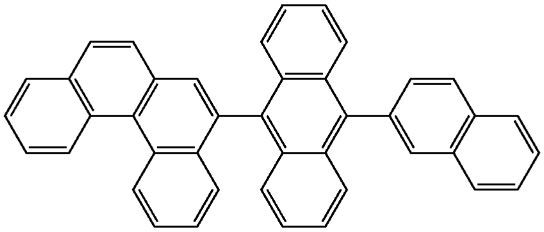
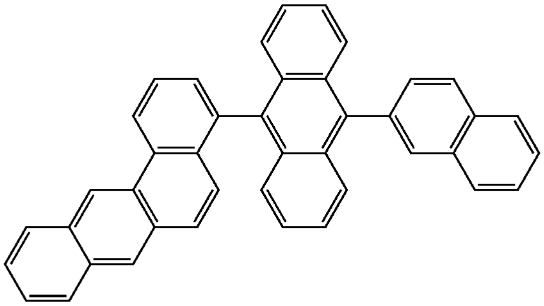
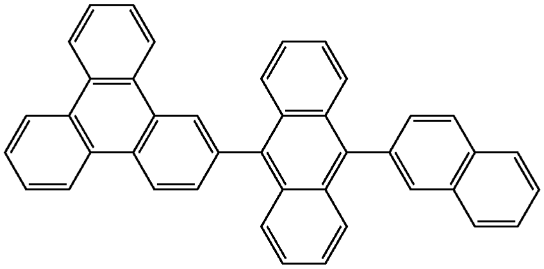
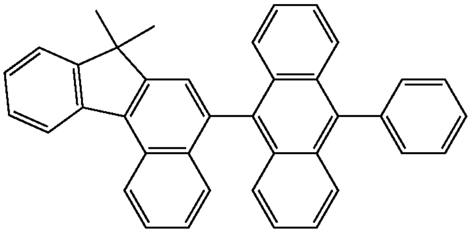
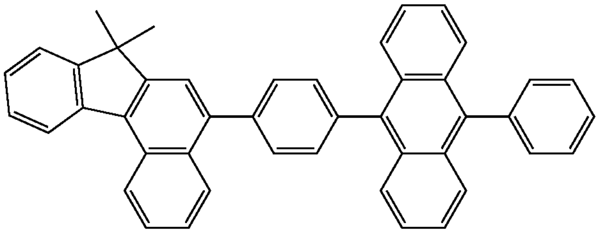
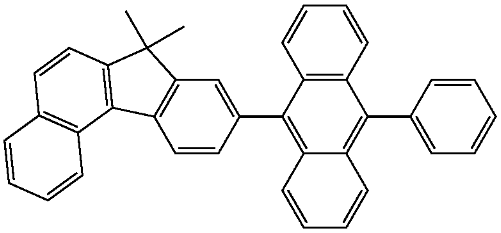
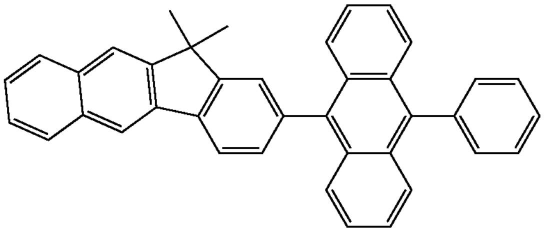
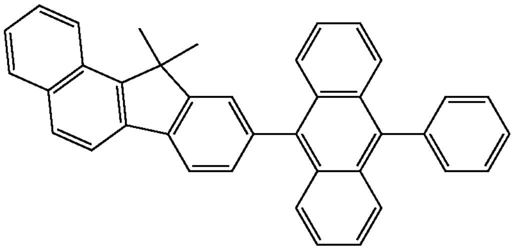

-continued
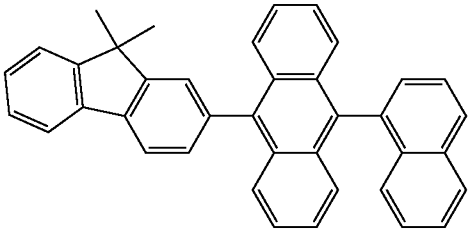
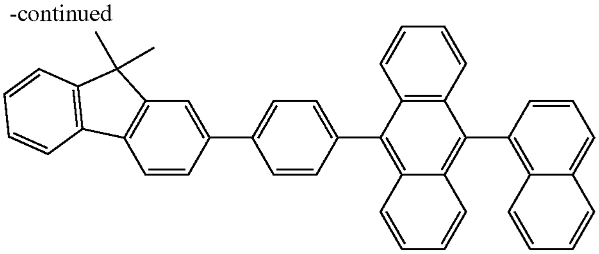
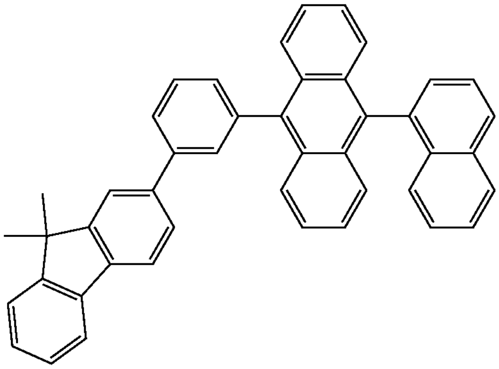
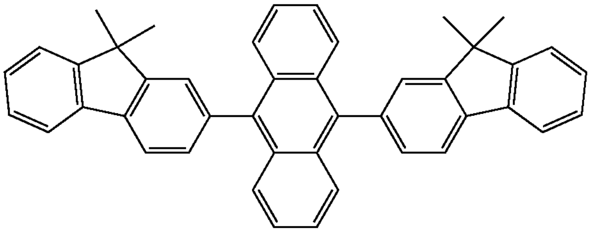
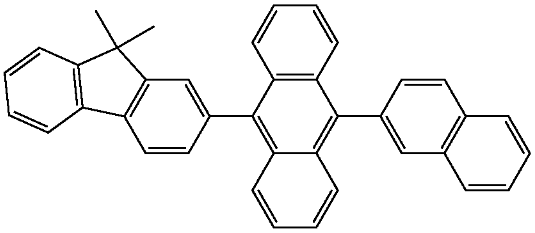
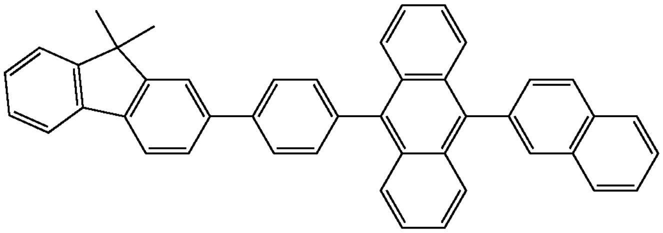
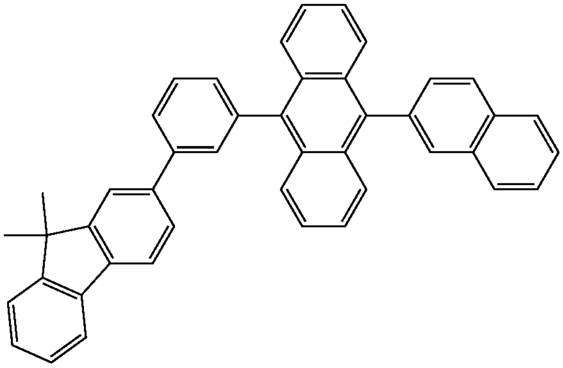
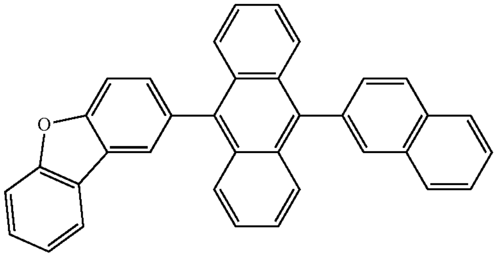
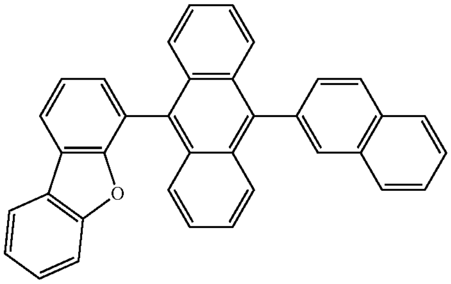
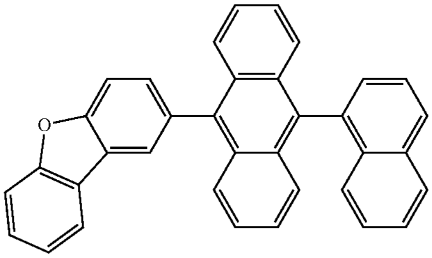

-continued
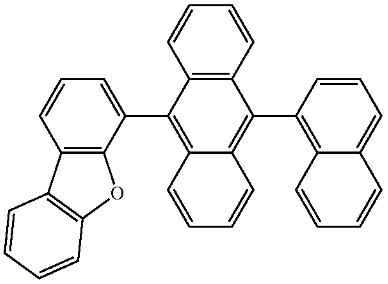
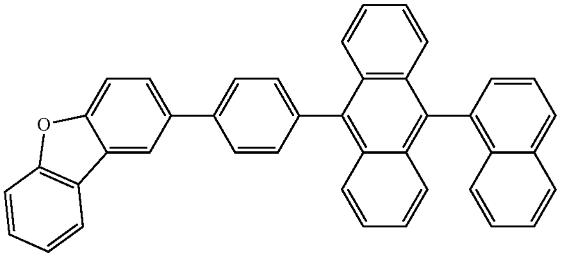
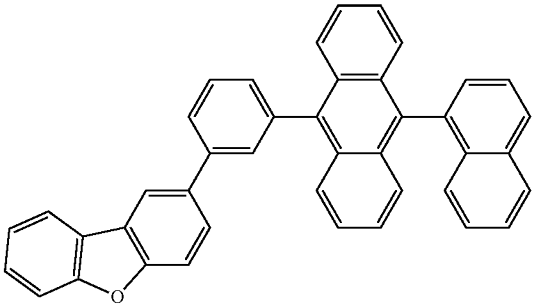
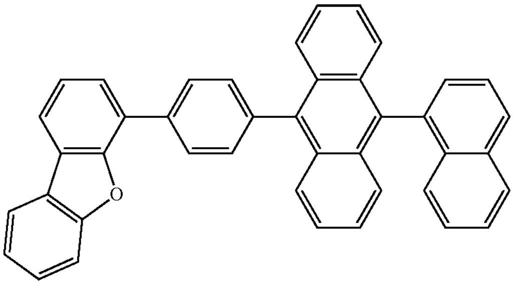
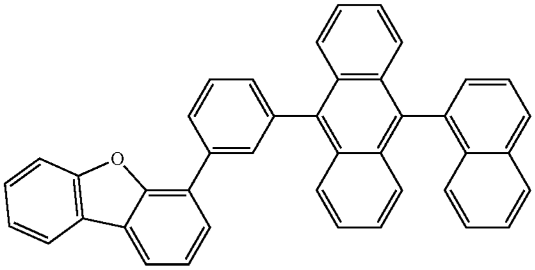
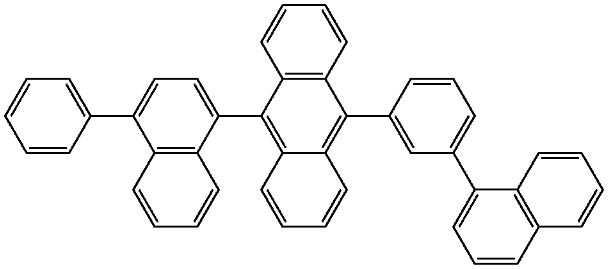
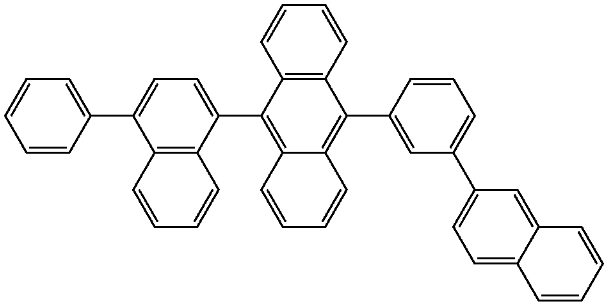

-continued
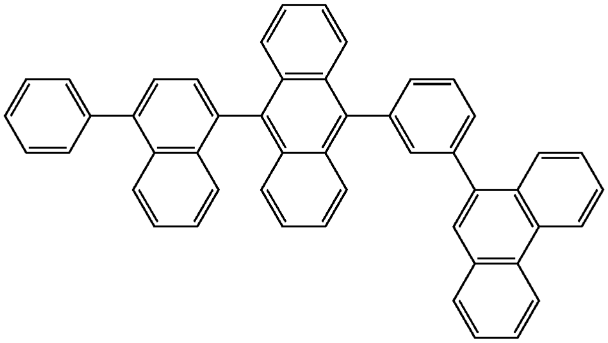
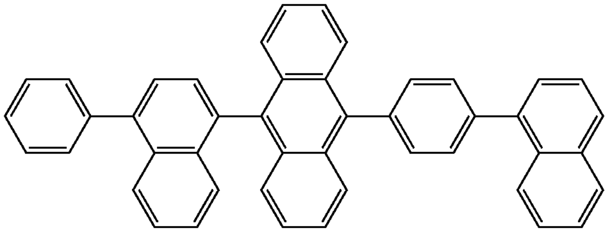
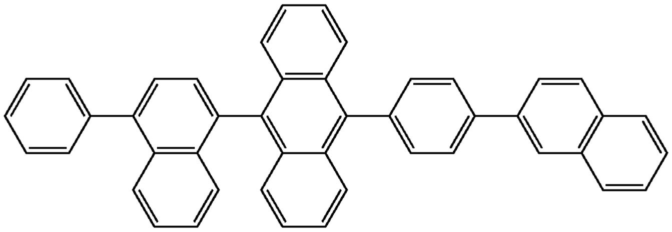
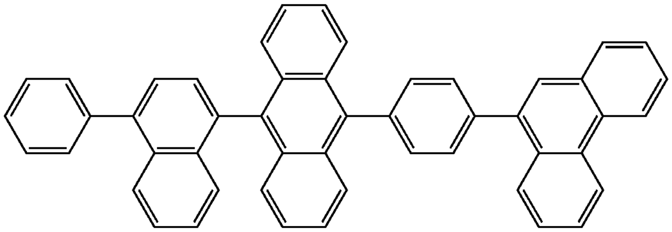
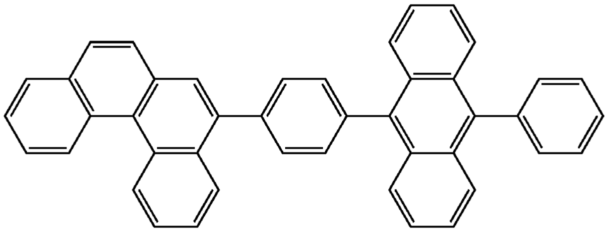
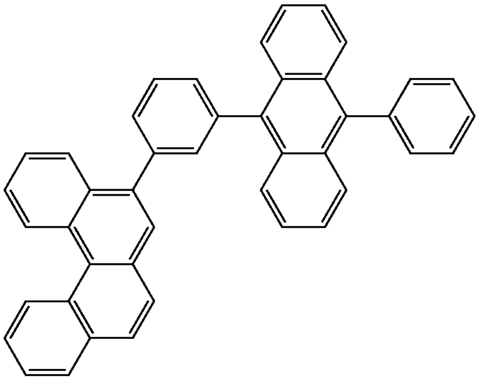

-continued
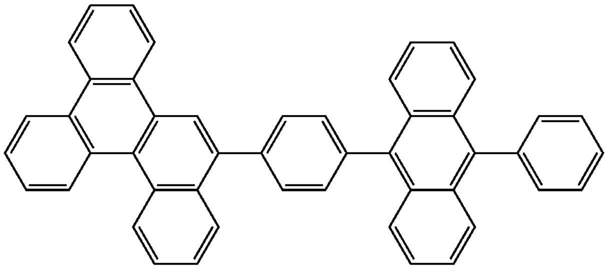
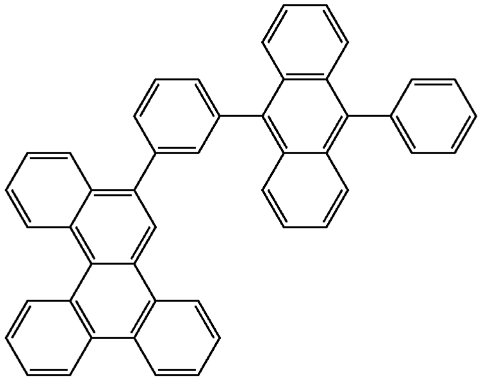
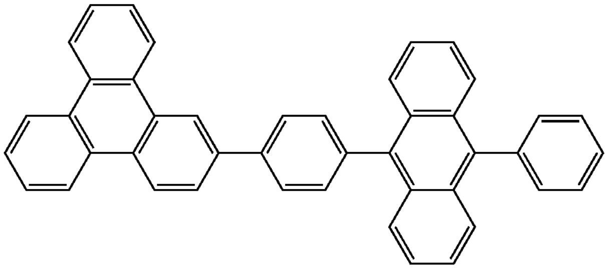
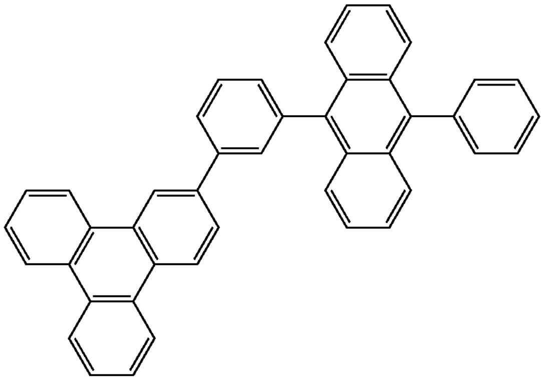
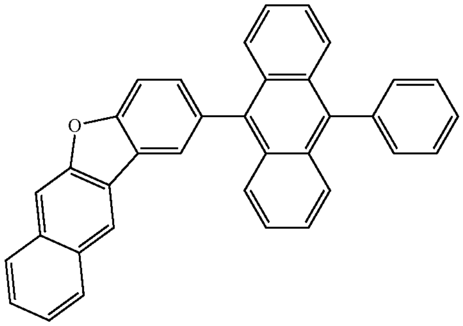
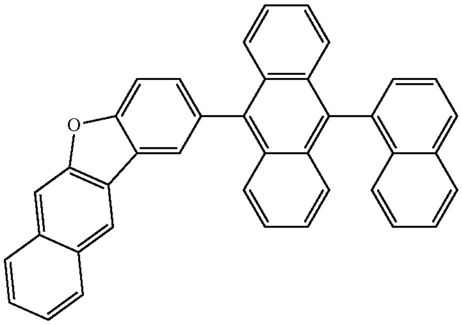
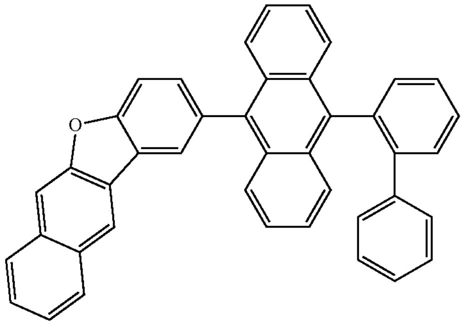
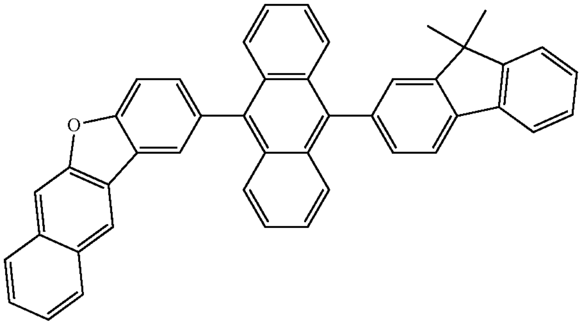
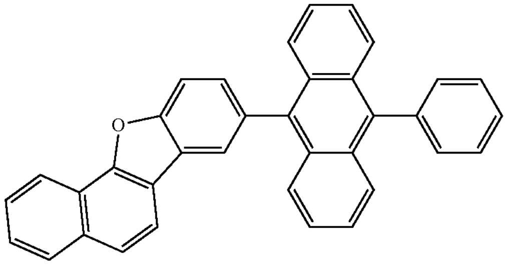

-continued
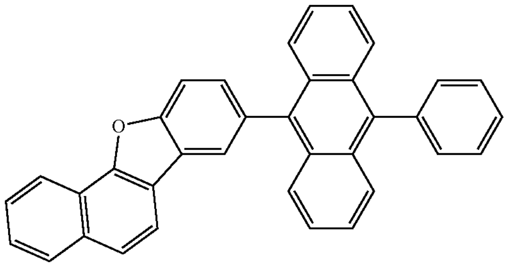
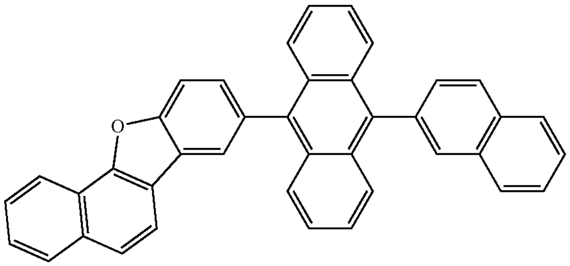
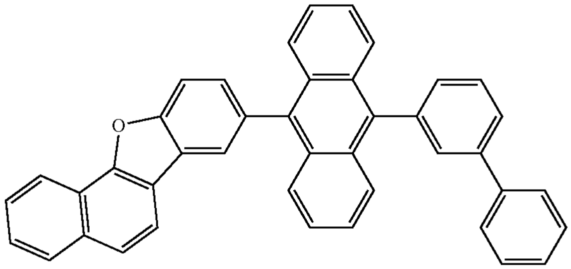
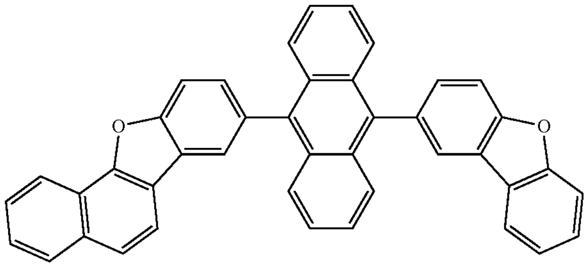
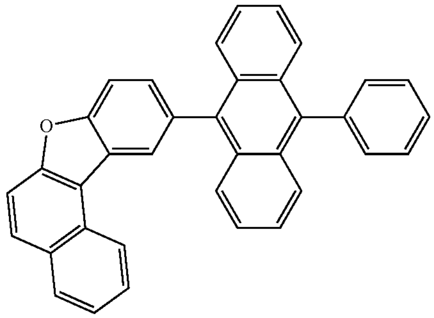
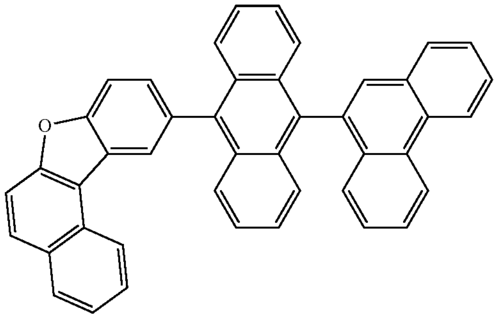
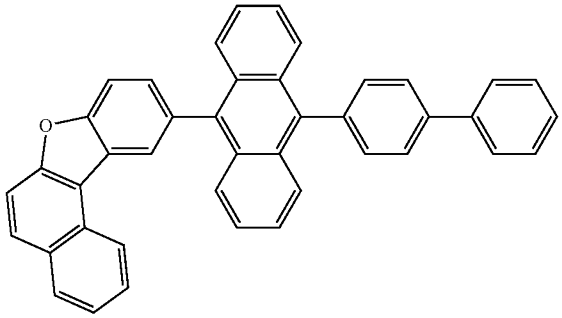
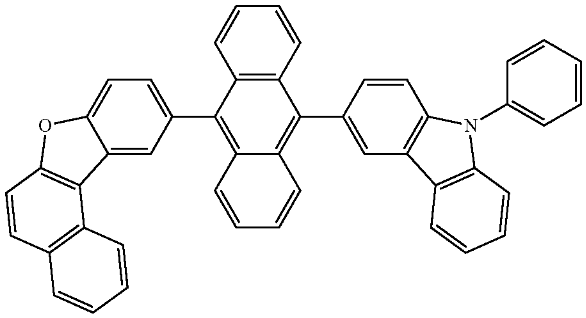

-continued
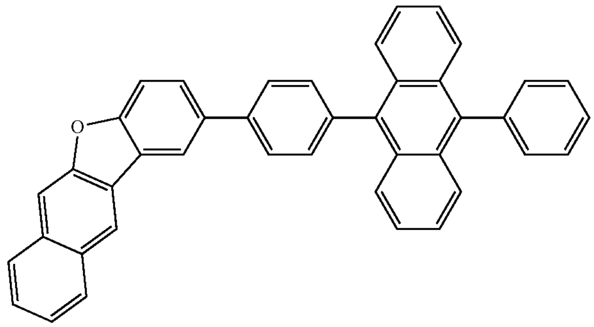
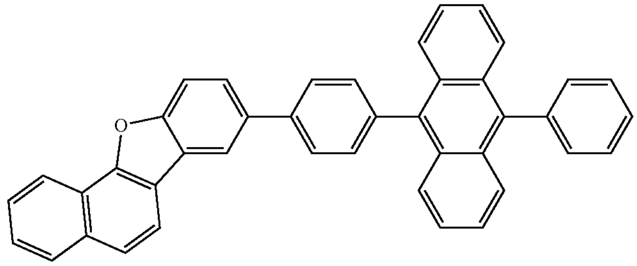
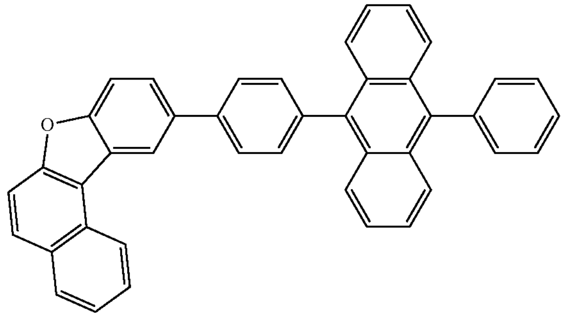
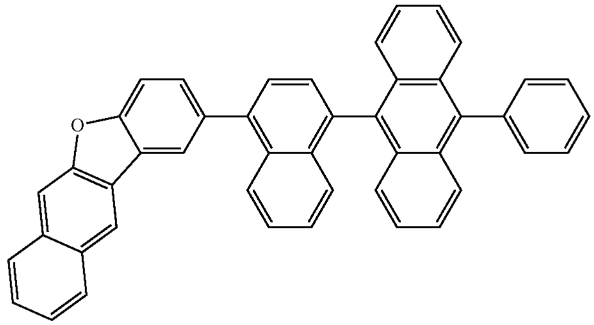
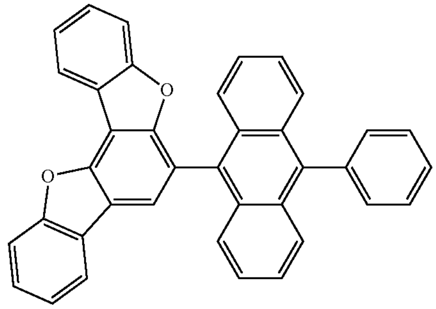
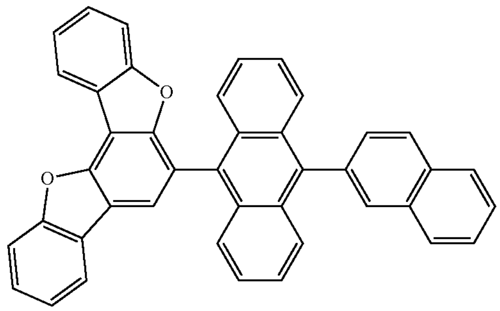
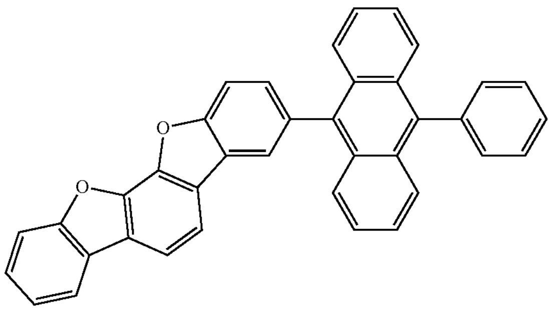

-continued
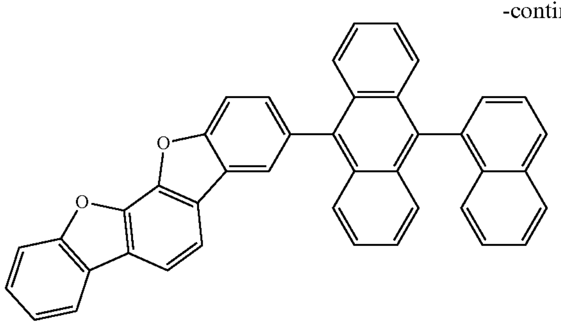
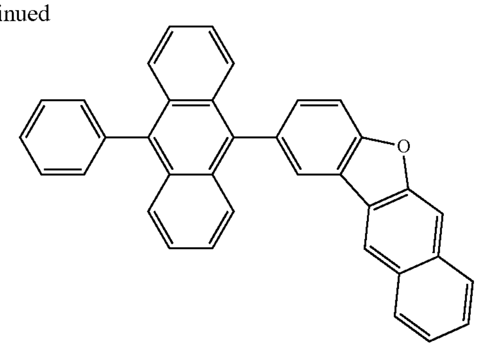
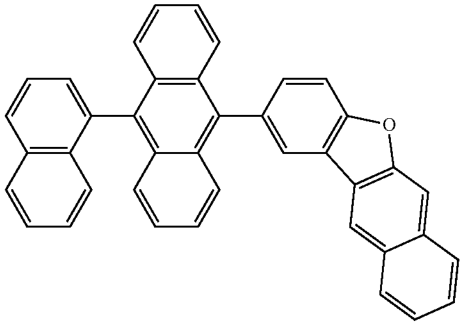
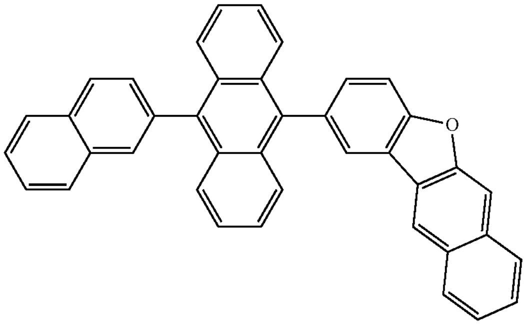
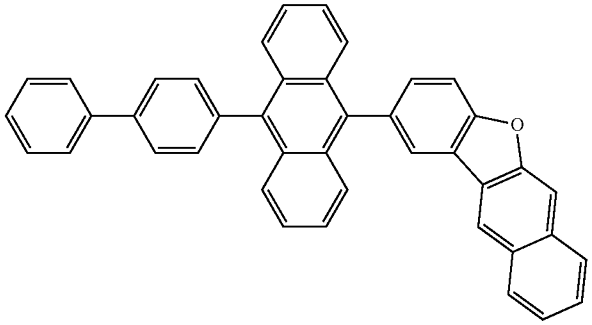
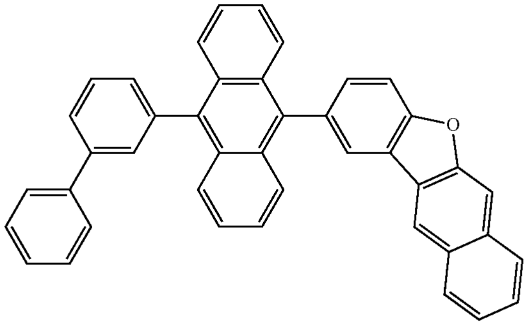
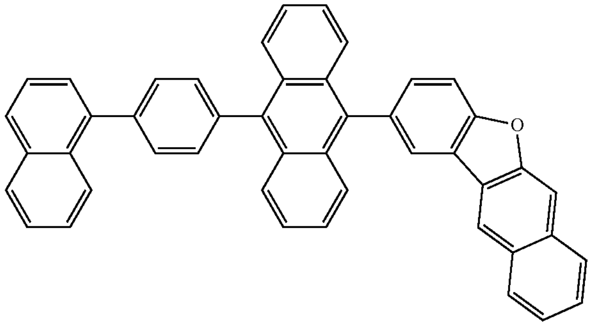
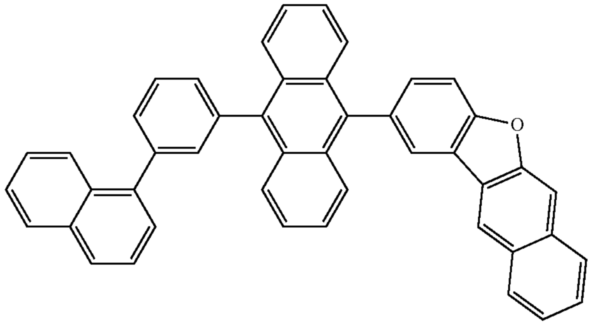

-continued
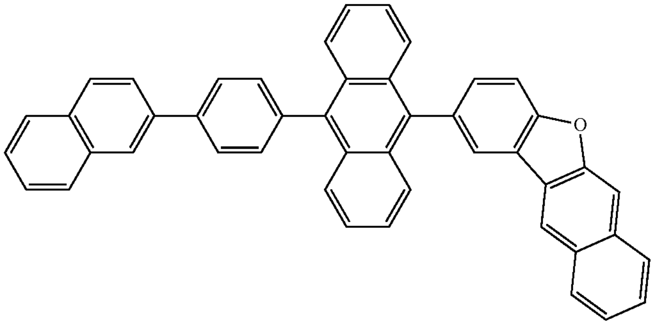
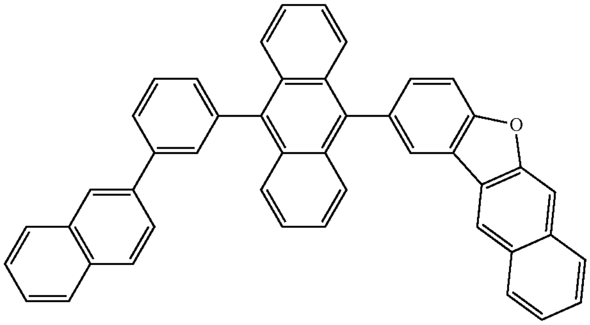
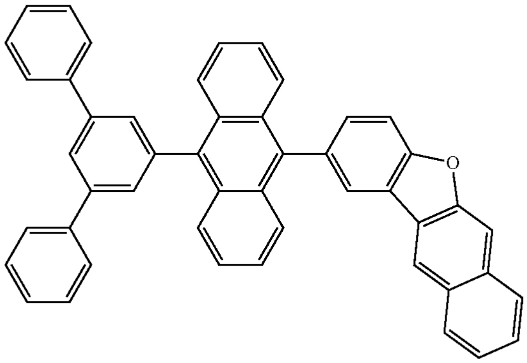
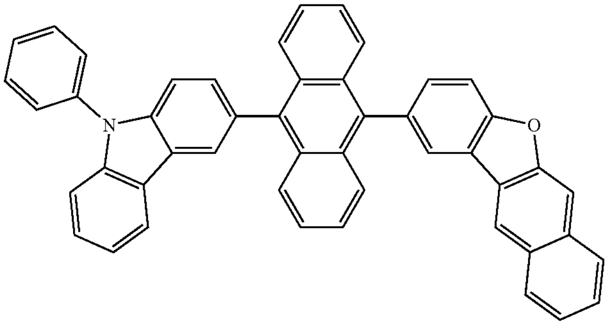
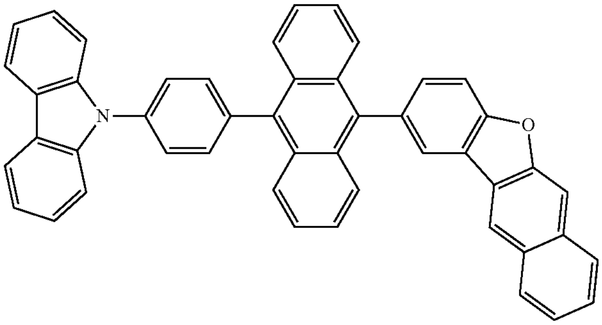
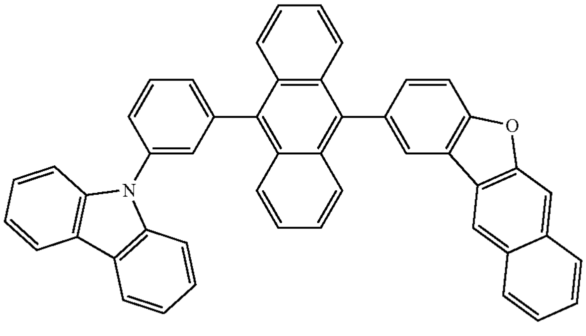
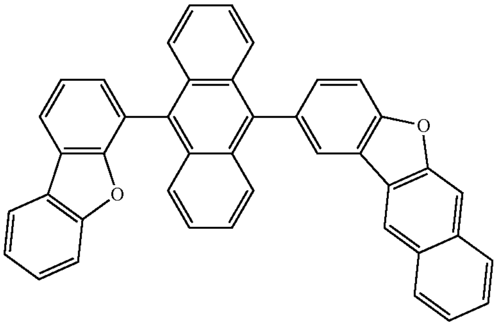

-continued
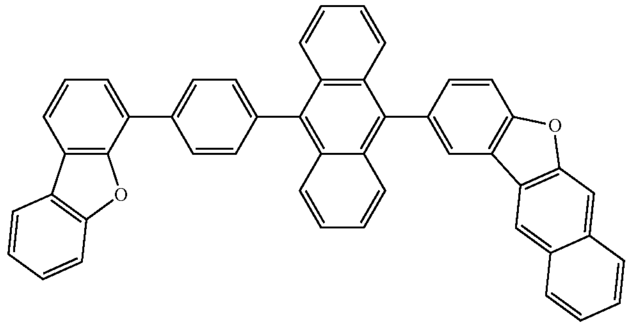
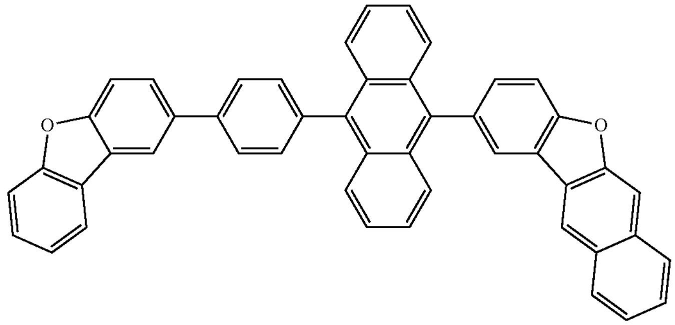
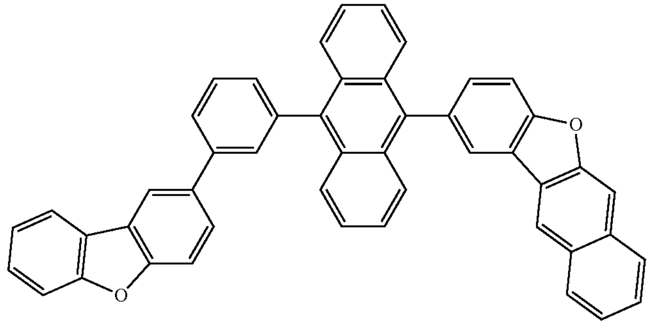
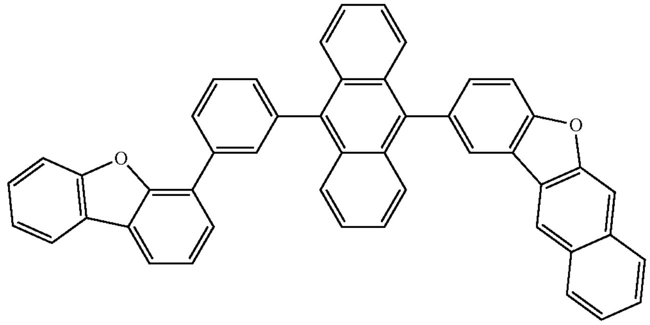
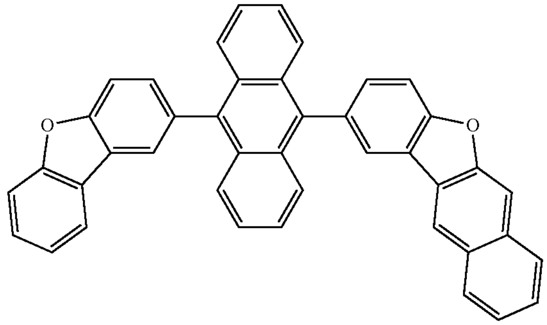
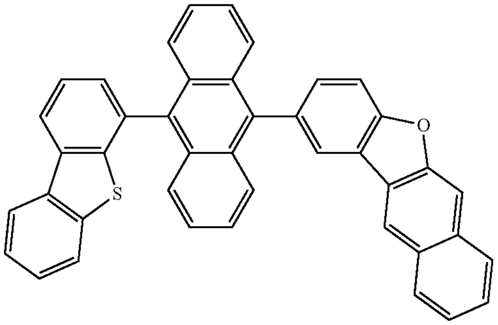

-continued
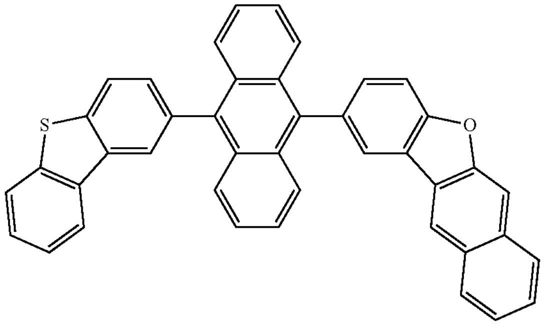
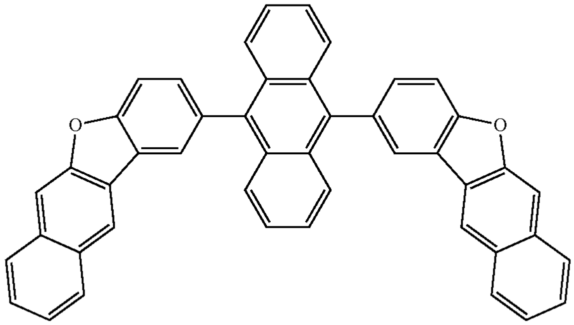
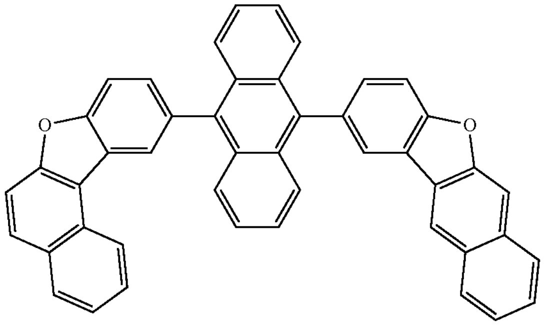
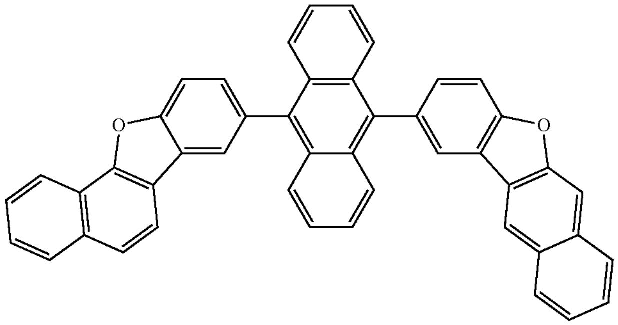
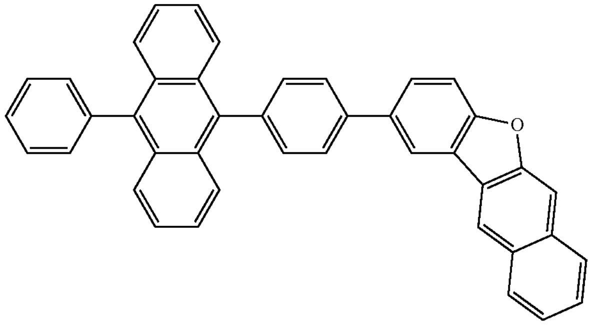
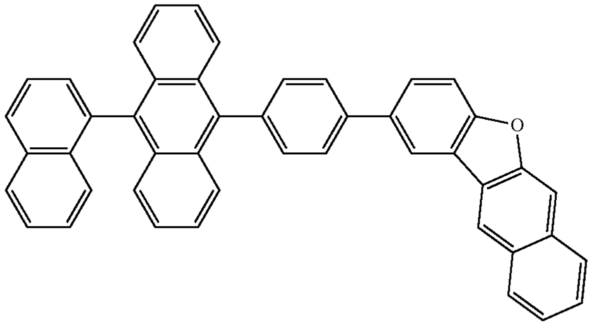

-continued
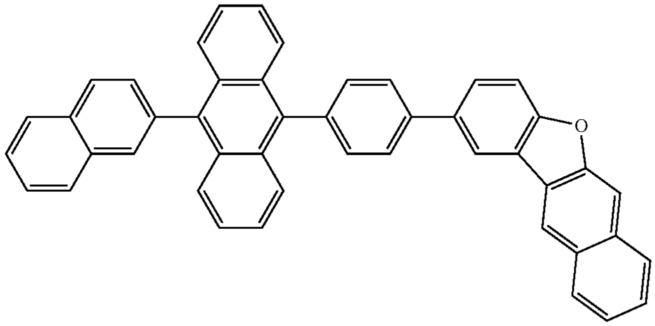
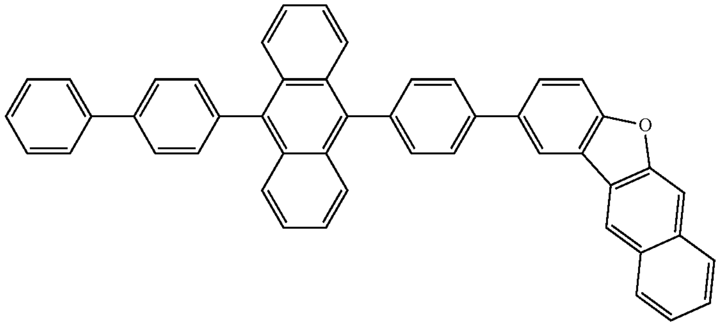
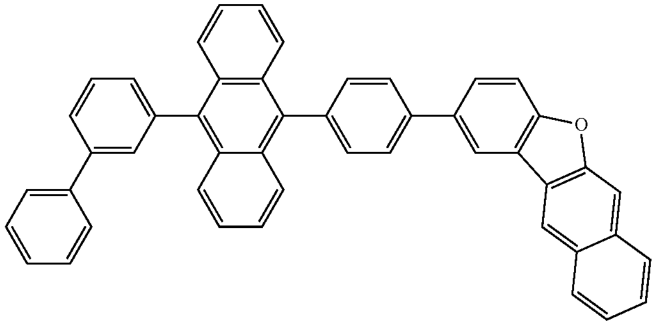
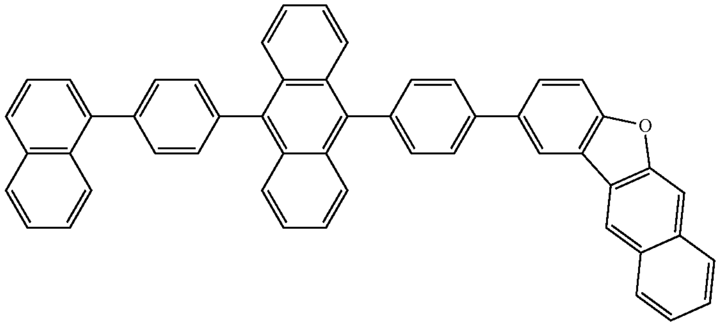
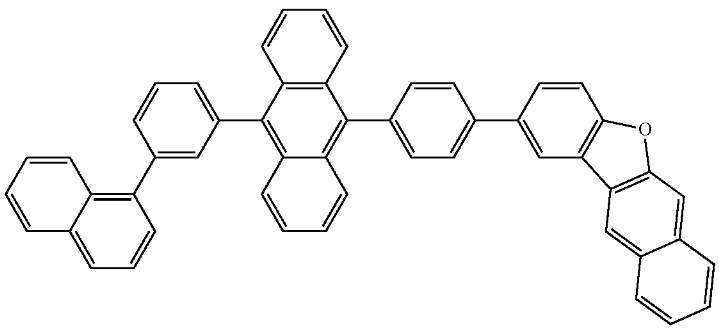

-continued
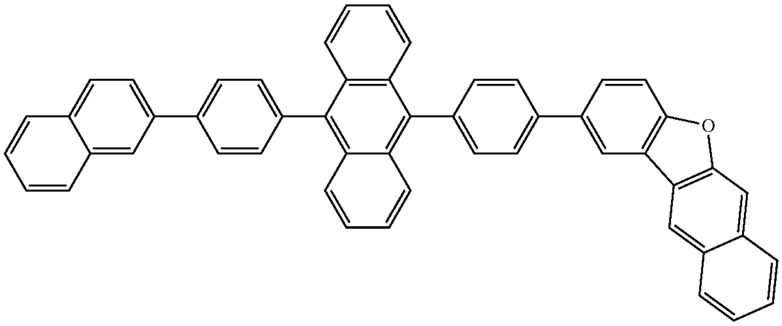
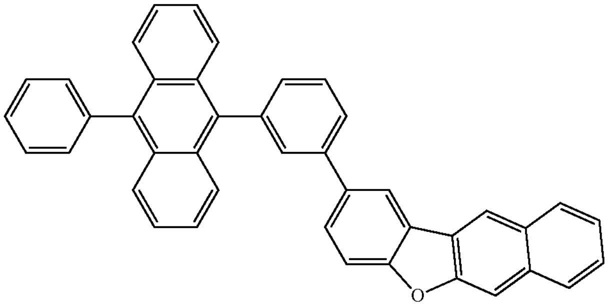
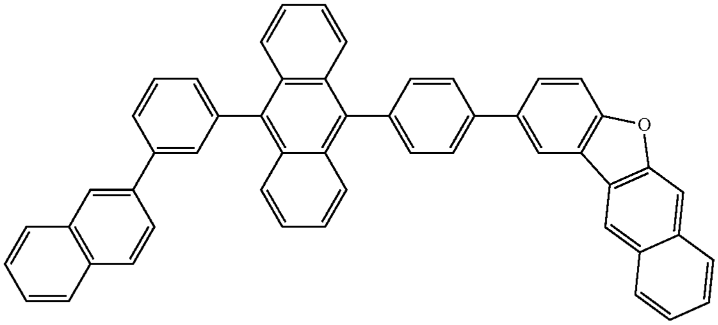
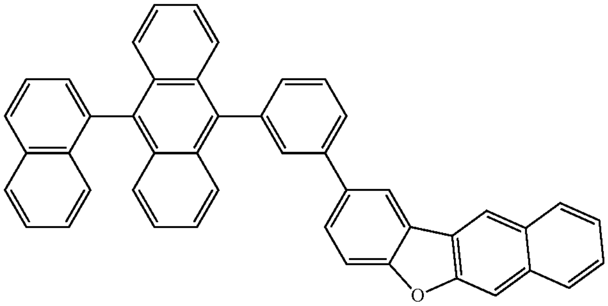
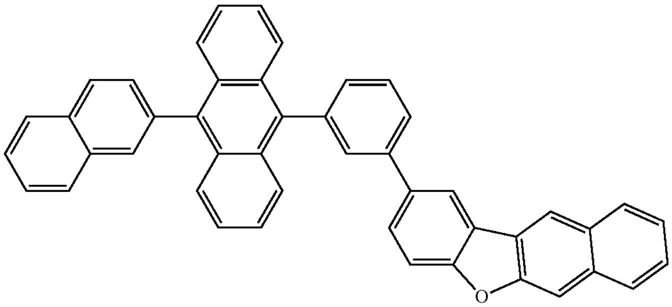

-continued
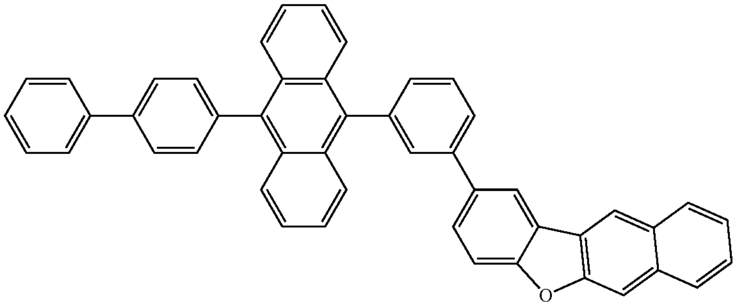
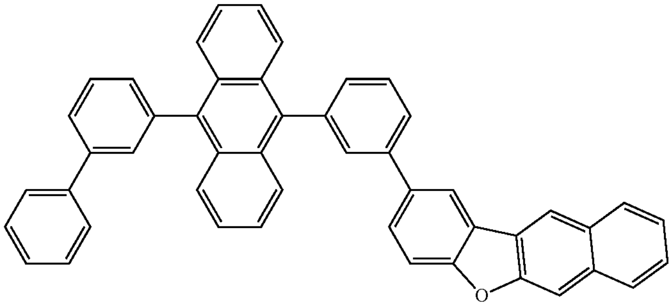
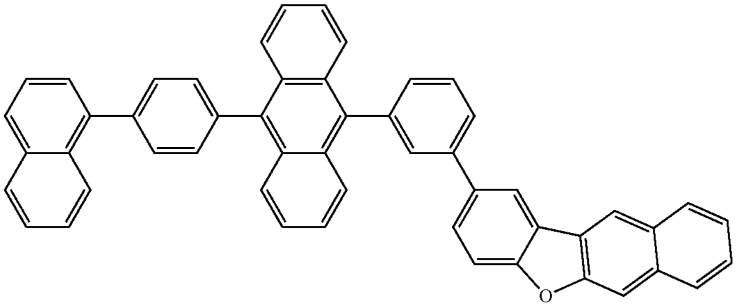
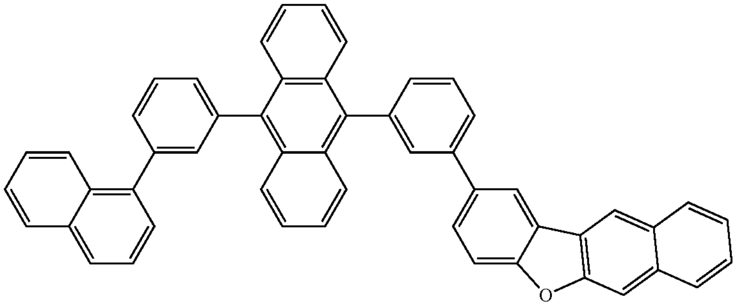
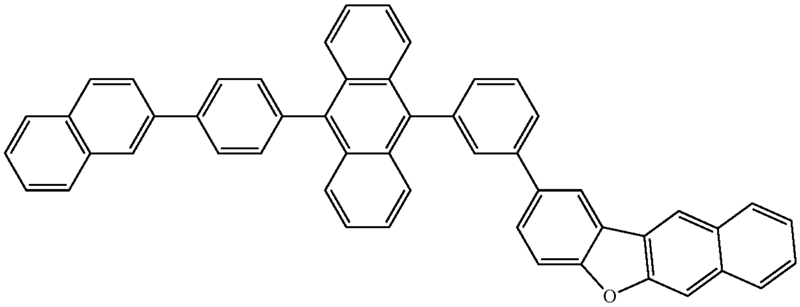

-continued
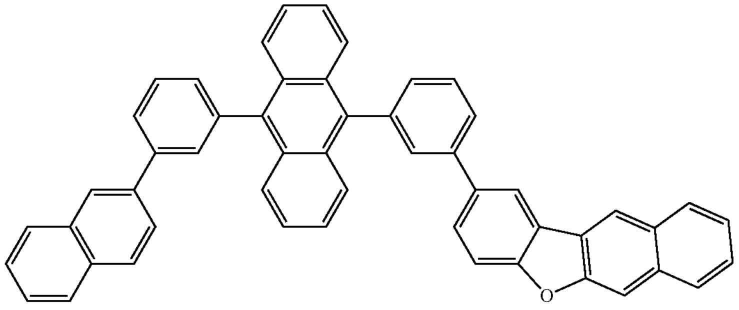
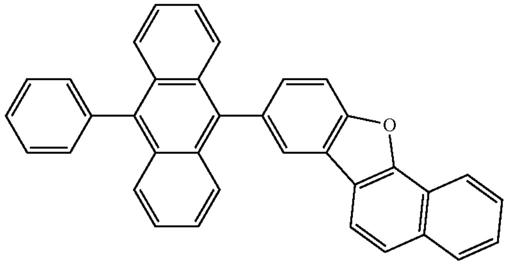
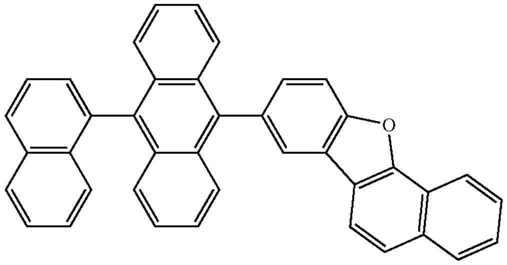
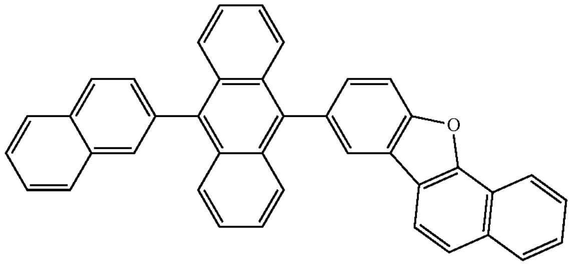
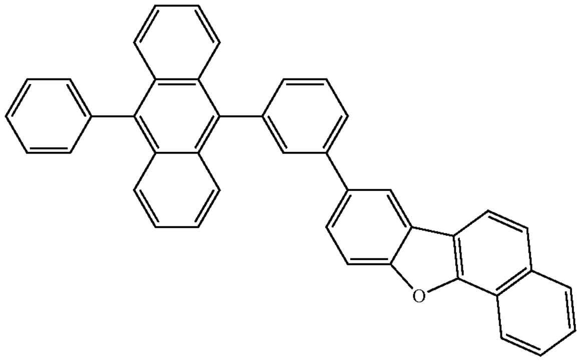
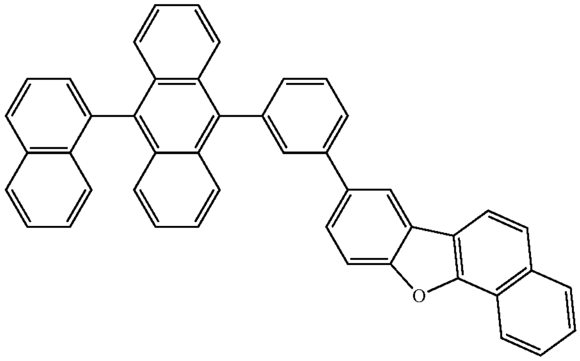

-continued
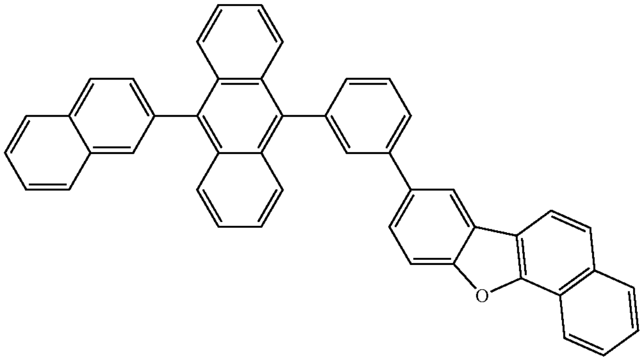
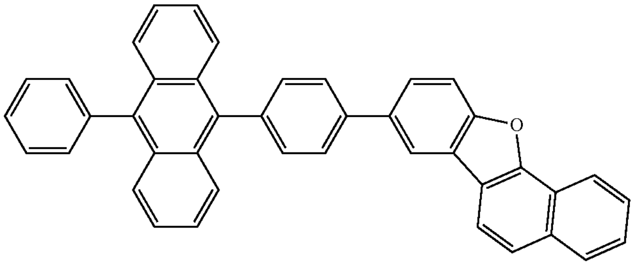
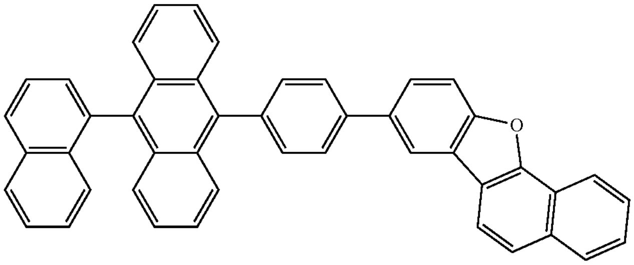
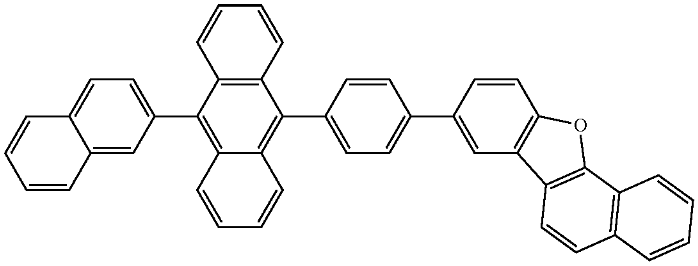
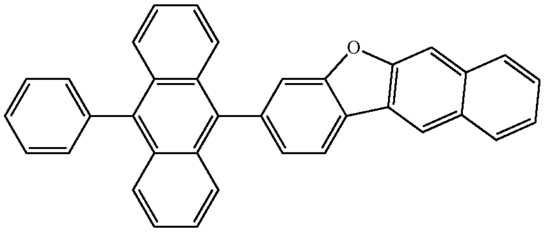
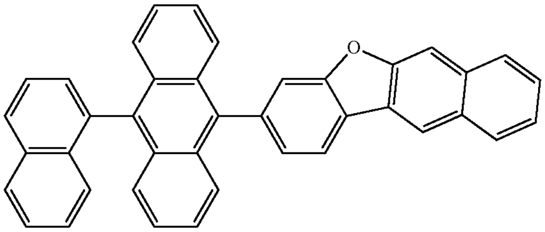
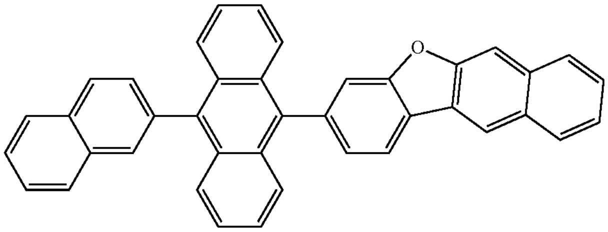

-continued
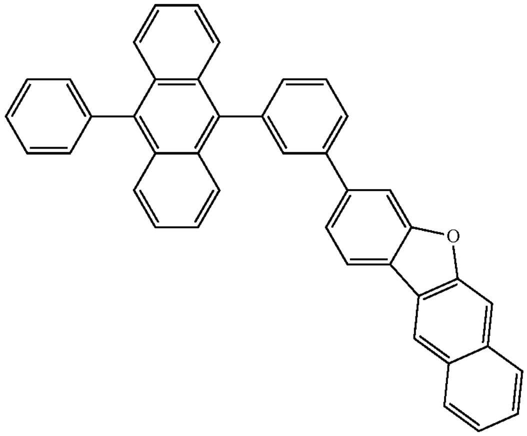
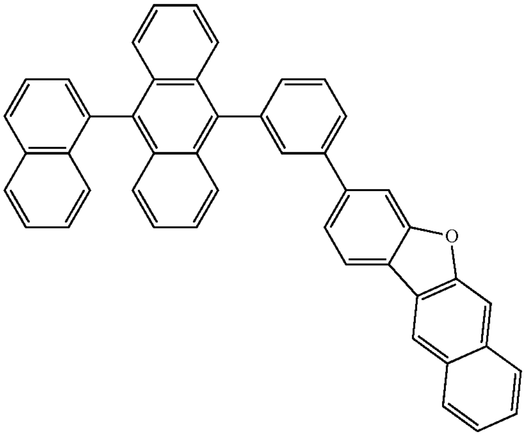
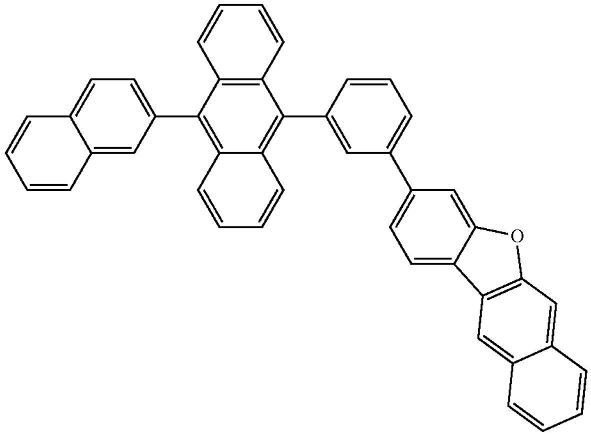
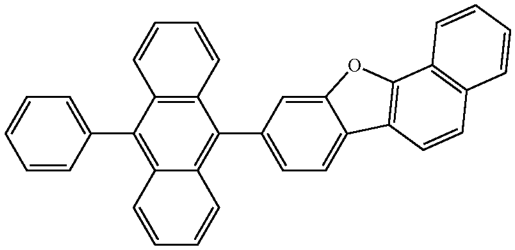
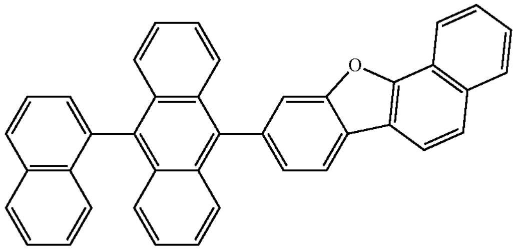
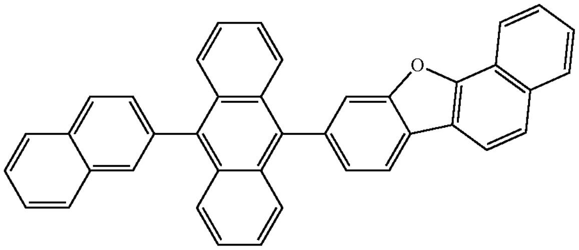
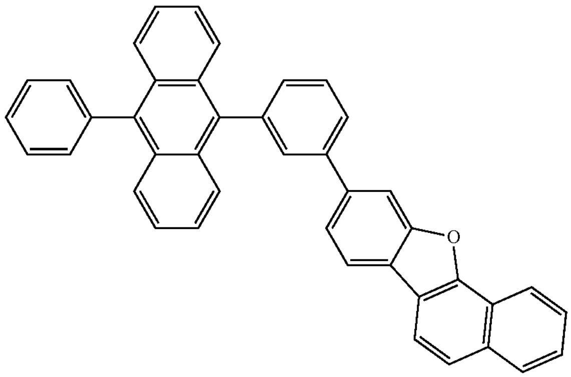

-continued
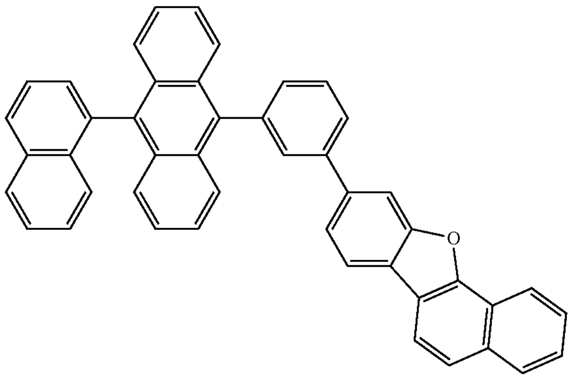
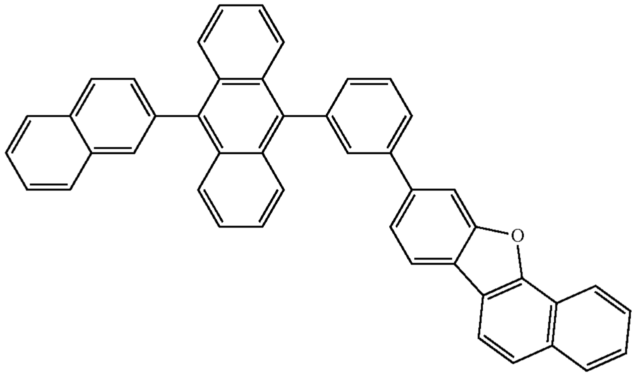
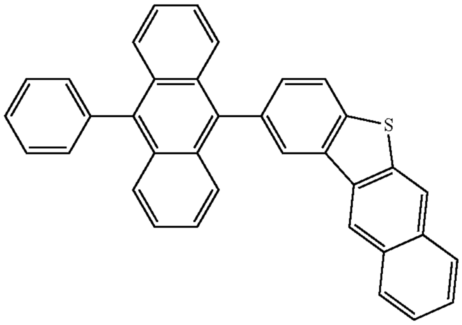
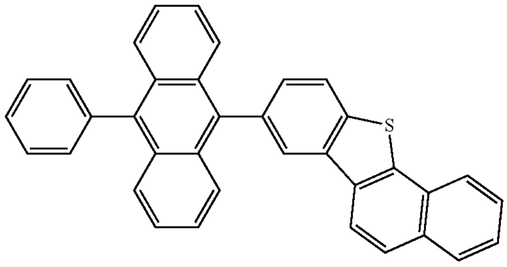
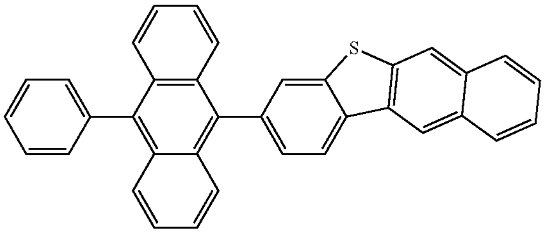
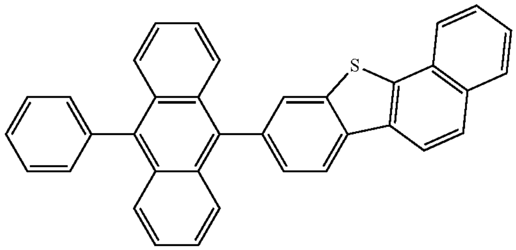
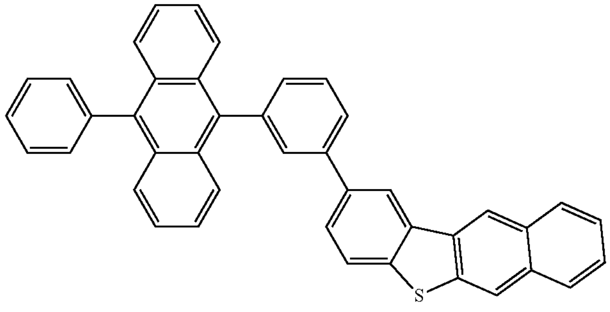
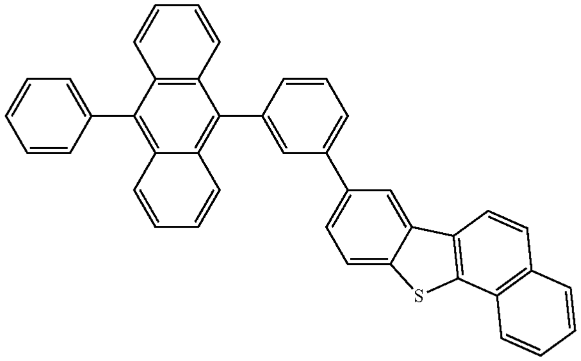
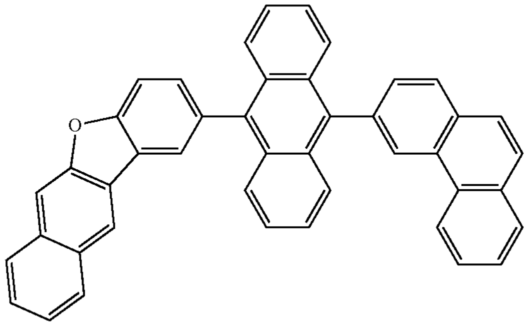

-continued
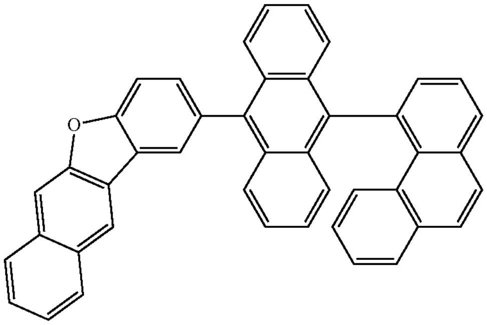
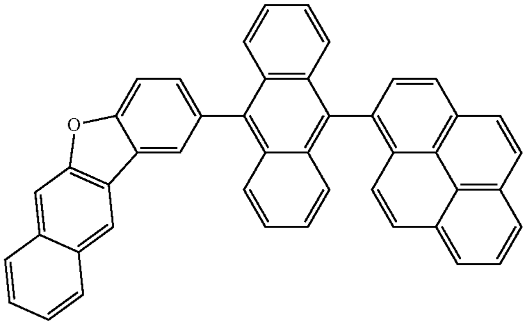
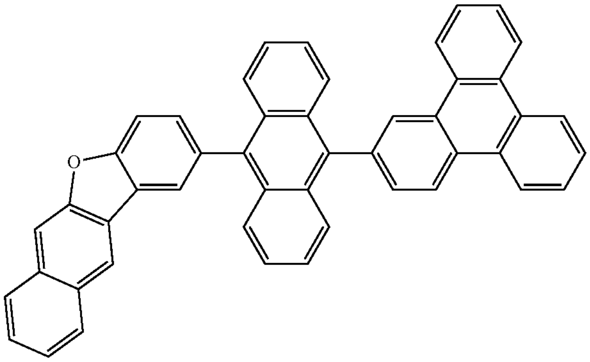
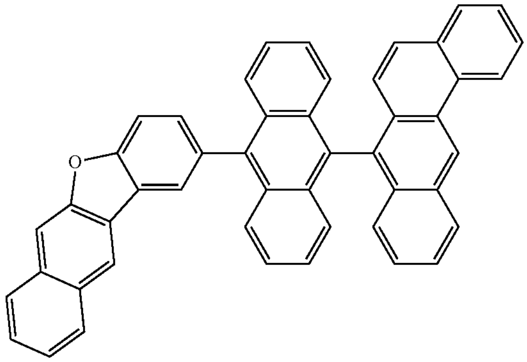
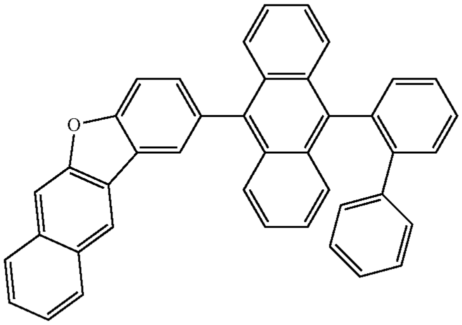
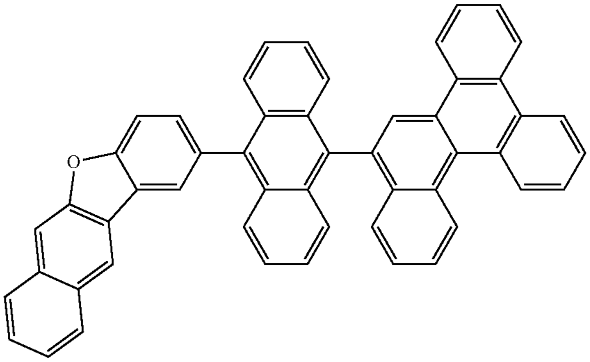
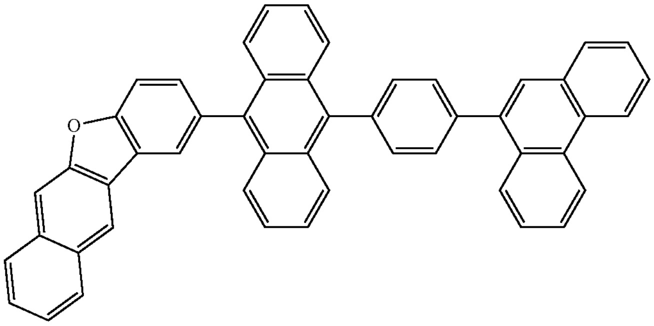
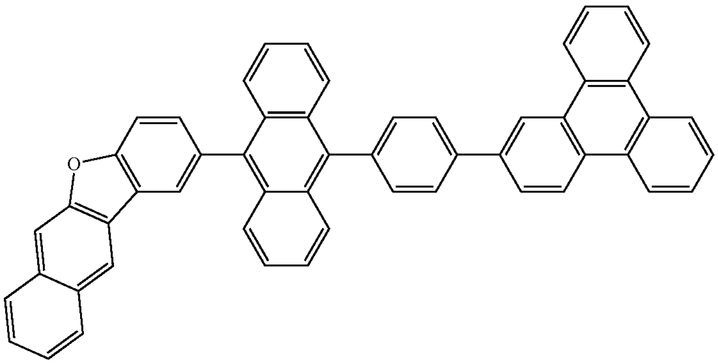

-continued
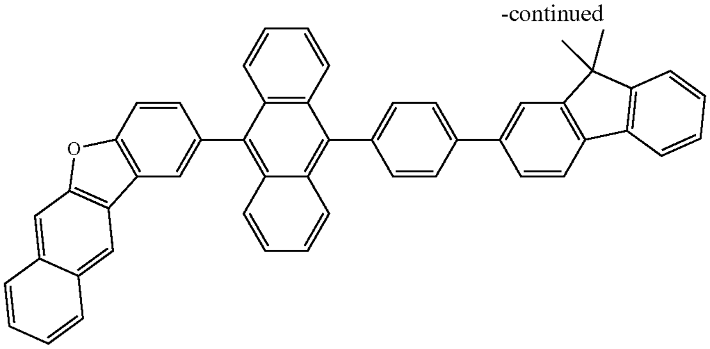
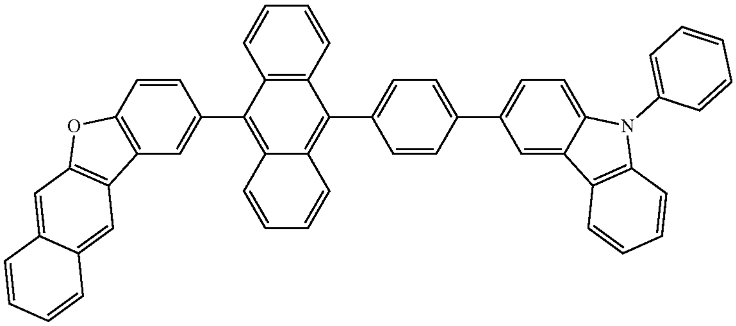
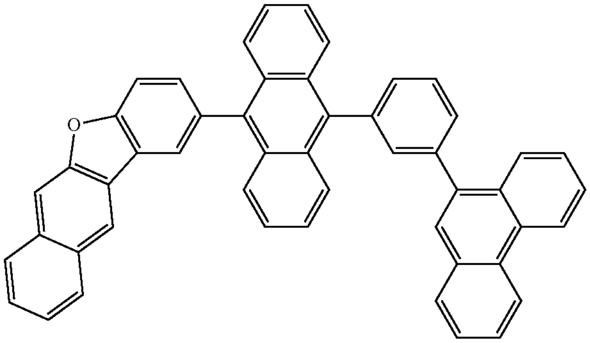
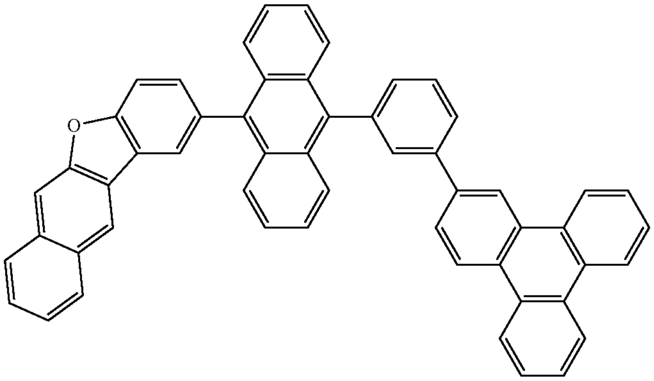

-continued
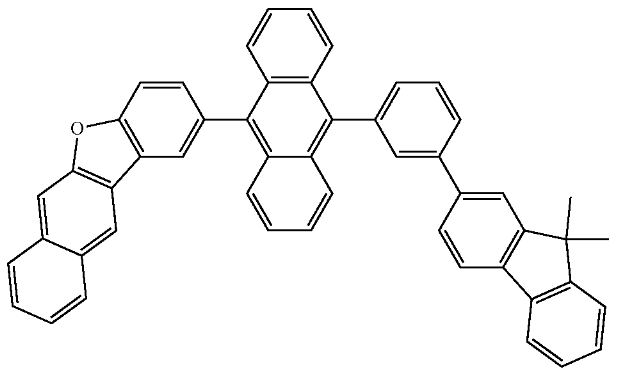
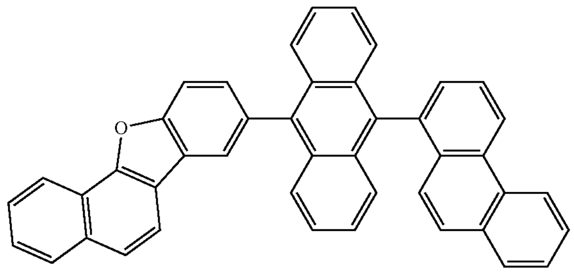
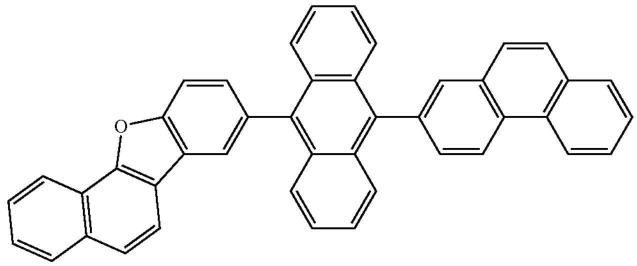
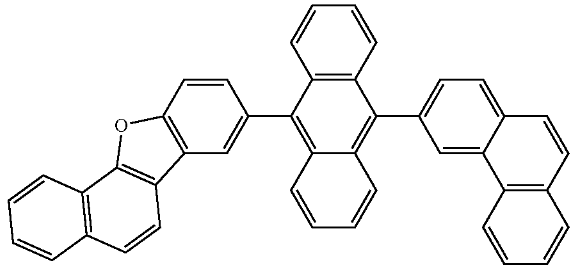
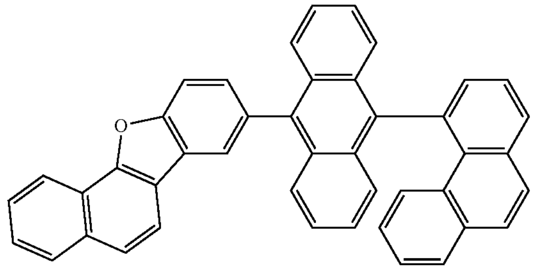
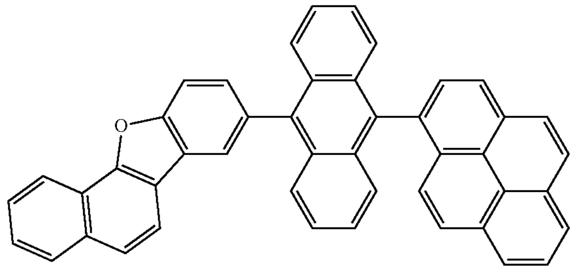

-continued
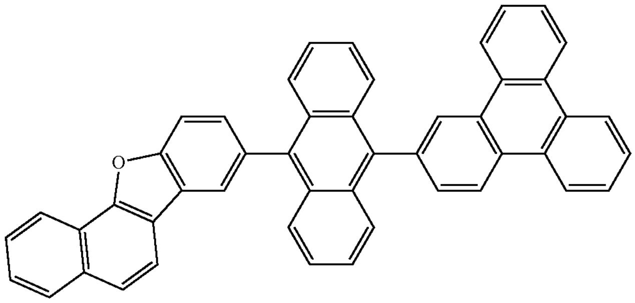
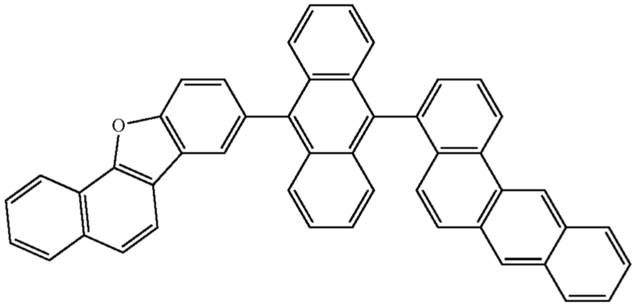
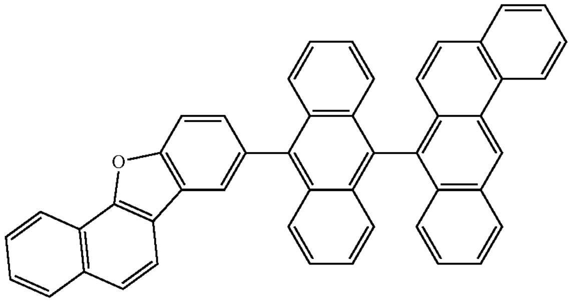
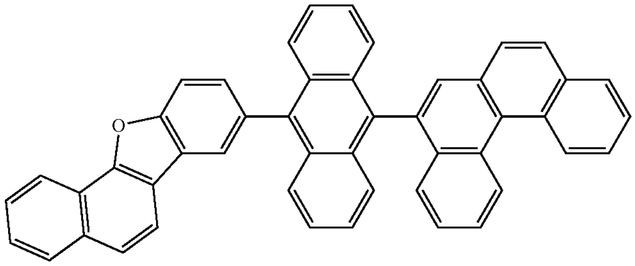
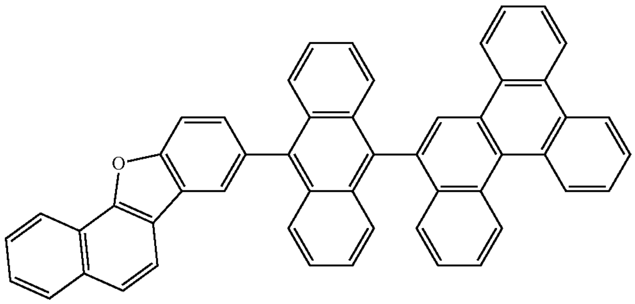

-continued
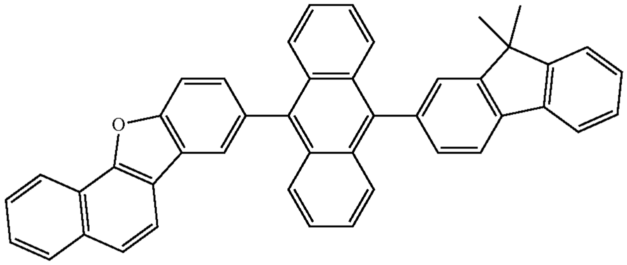
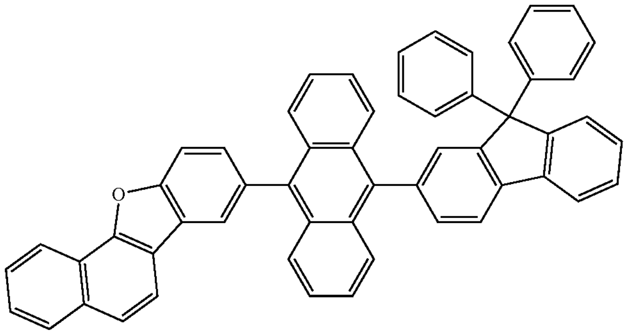
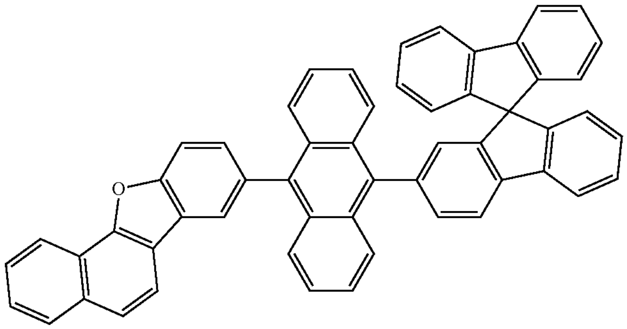
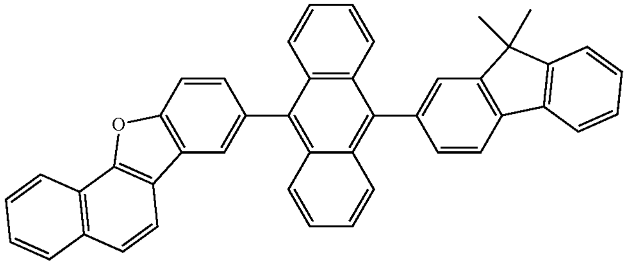
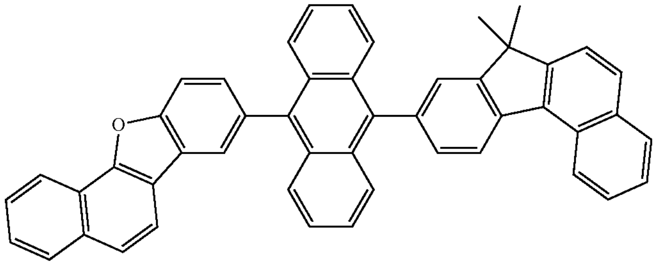

-continued
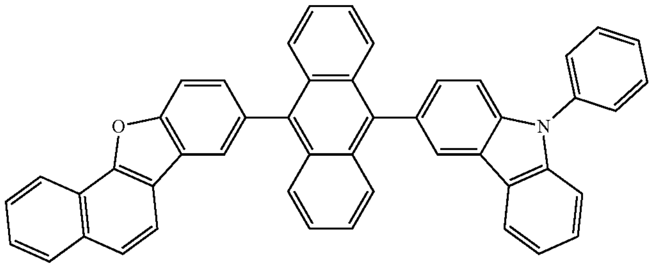
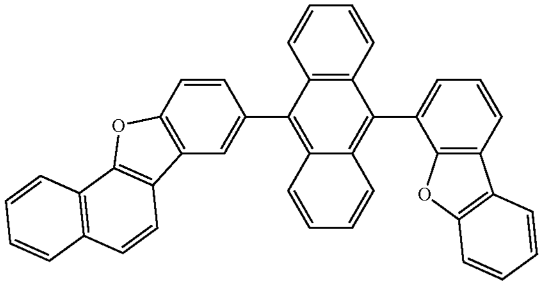
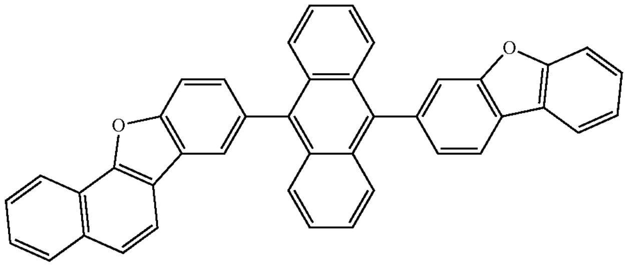
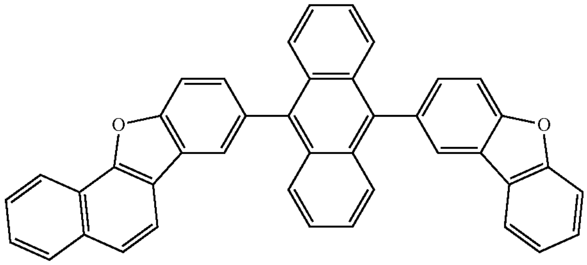
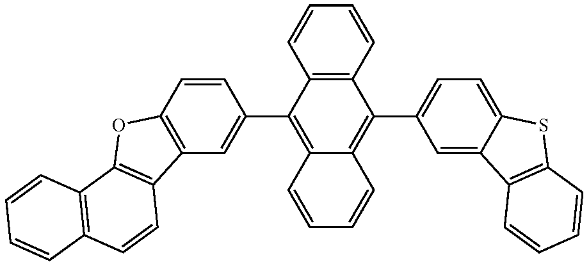
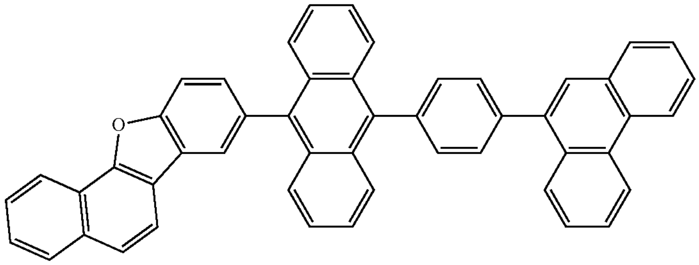

-continued
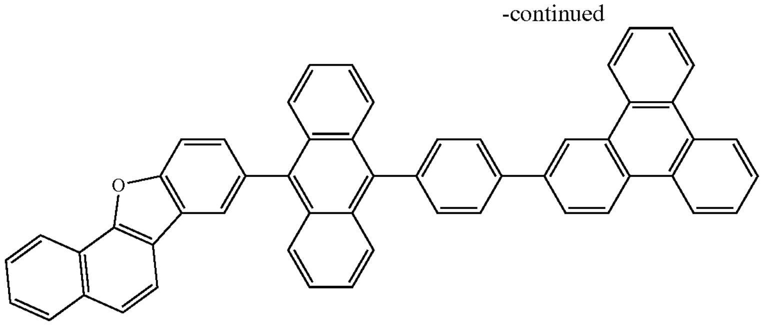
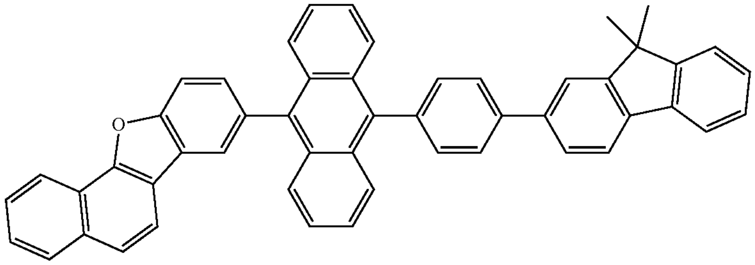
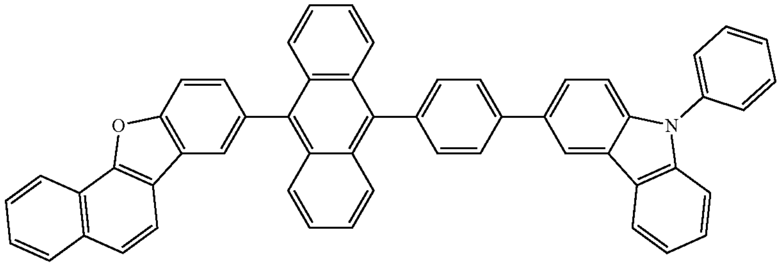
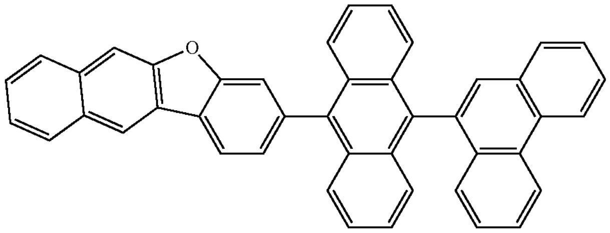
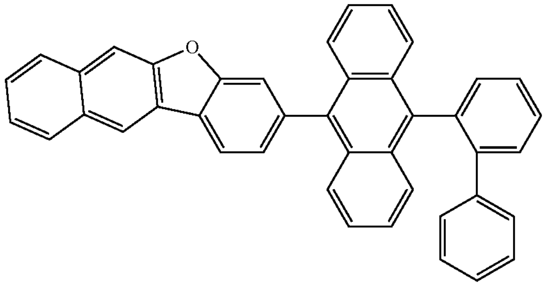
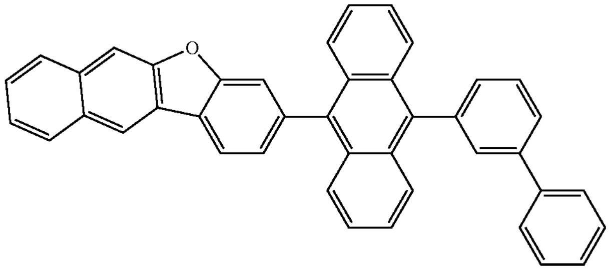

-continued
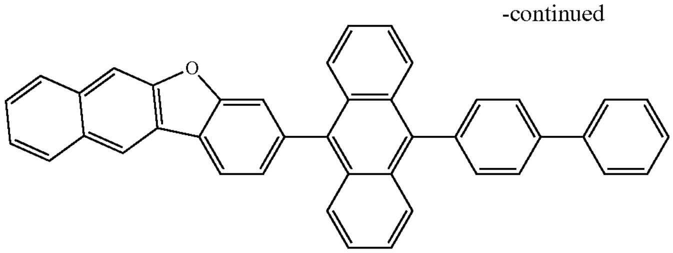
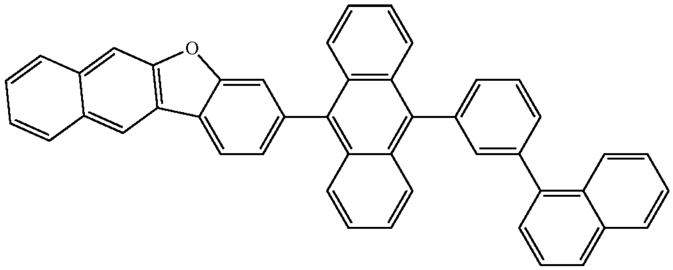
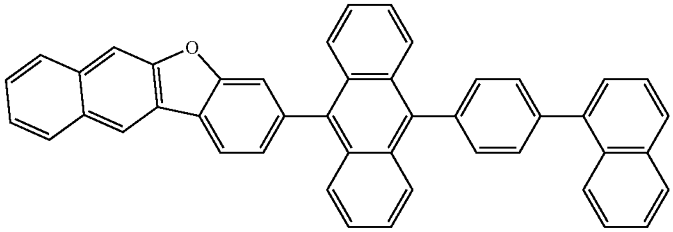
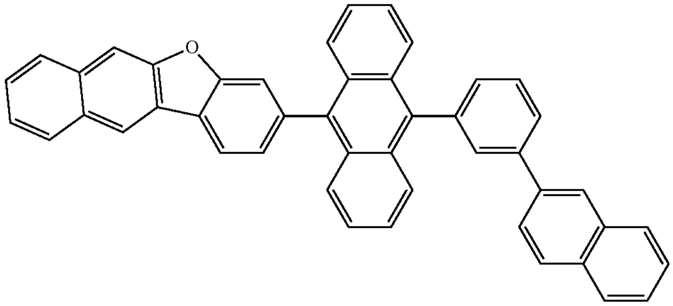
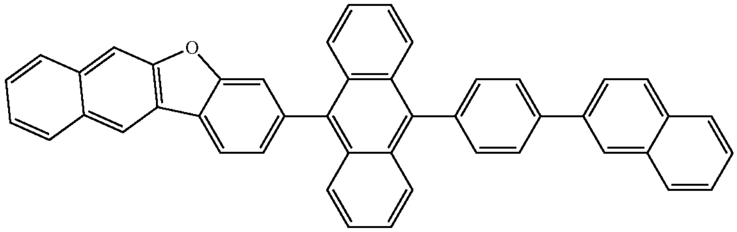
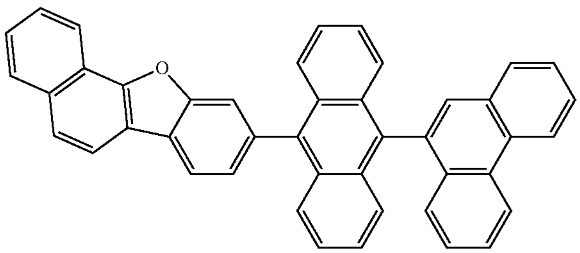
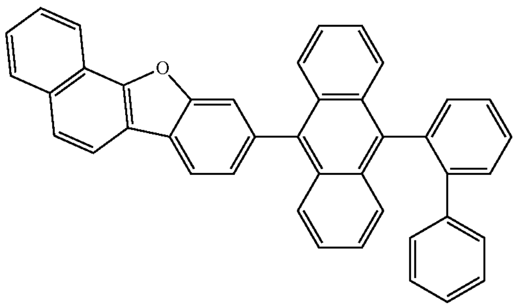

-continued
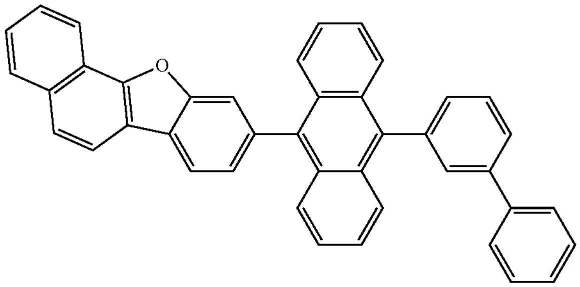
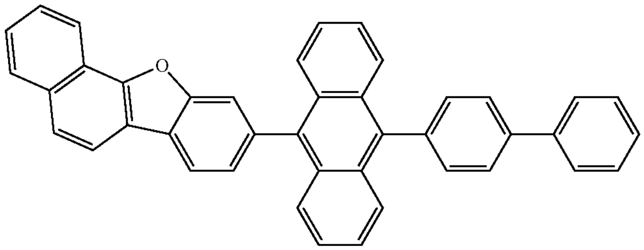
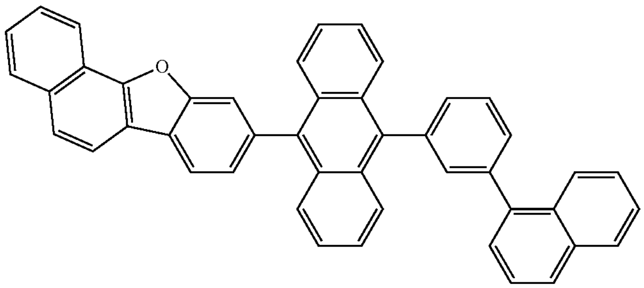
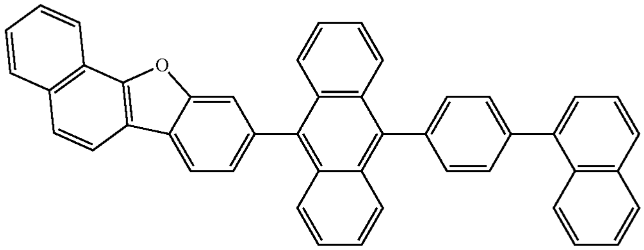
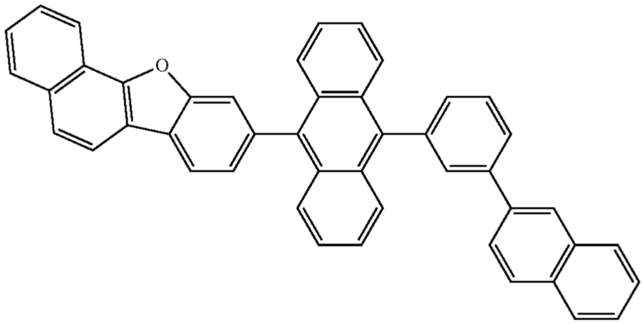

-continued
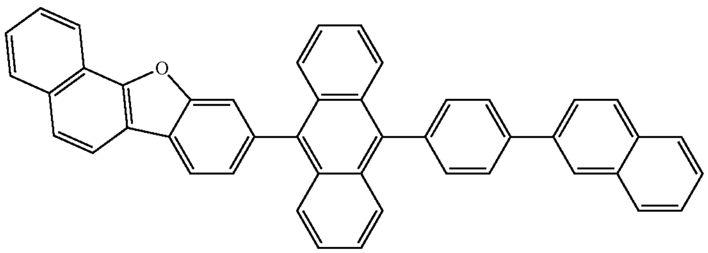
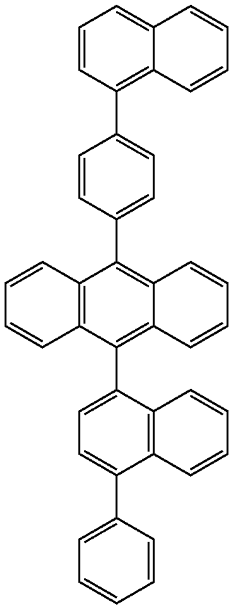
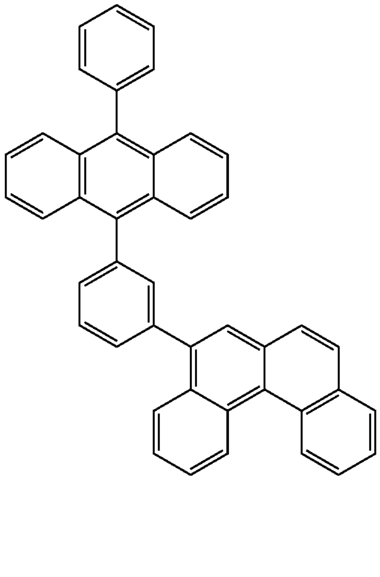
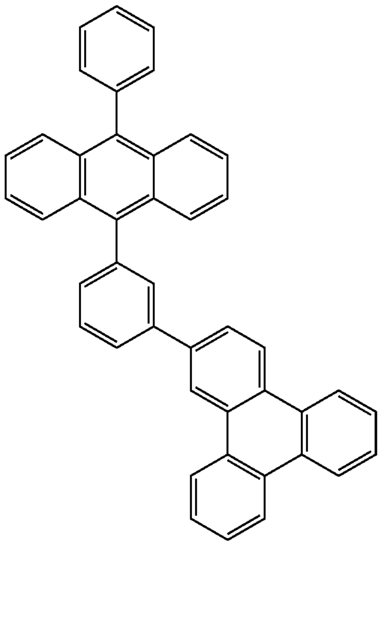
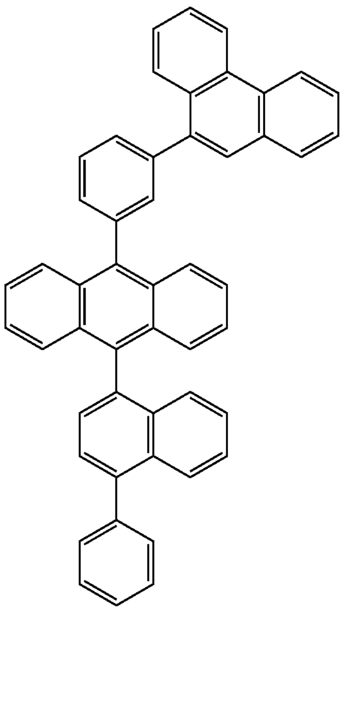

-continued
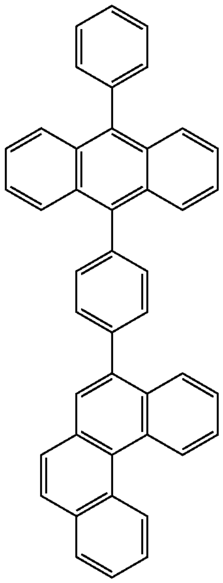
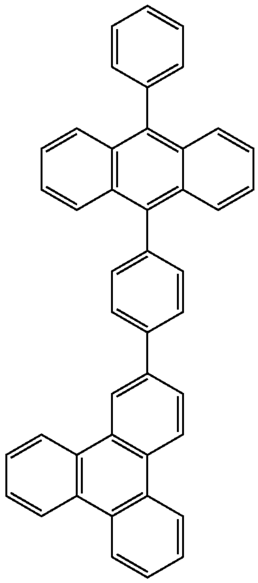
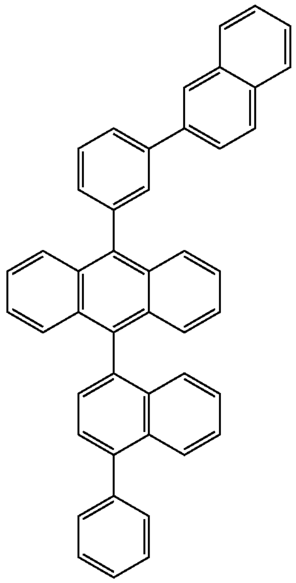
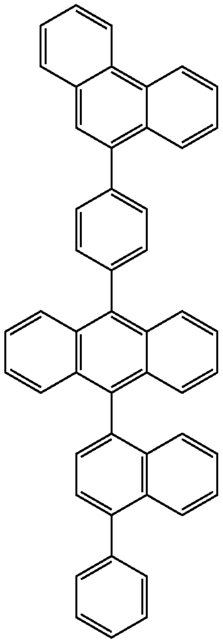
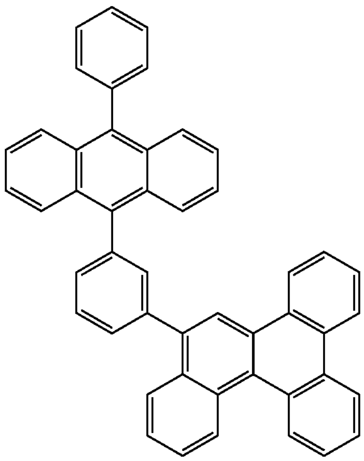
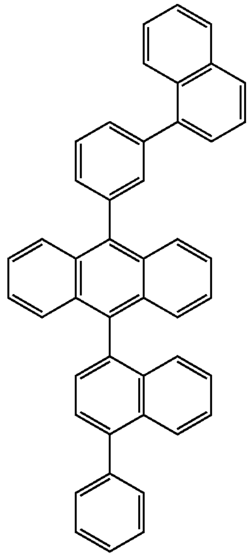
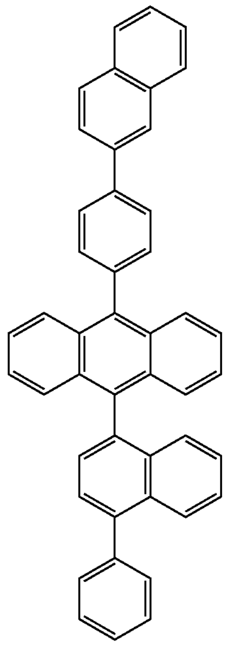

-continued
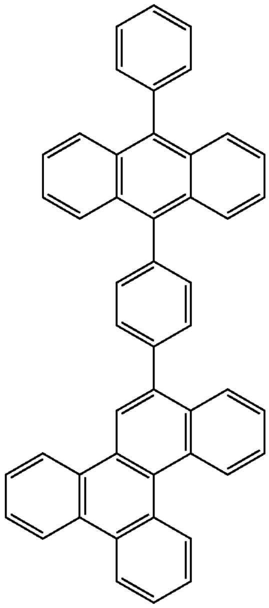
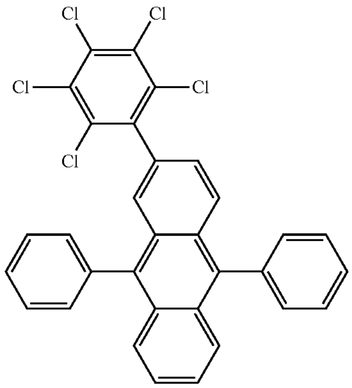
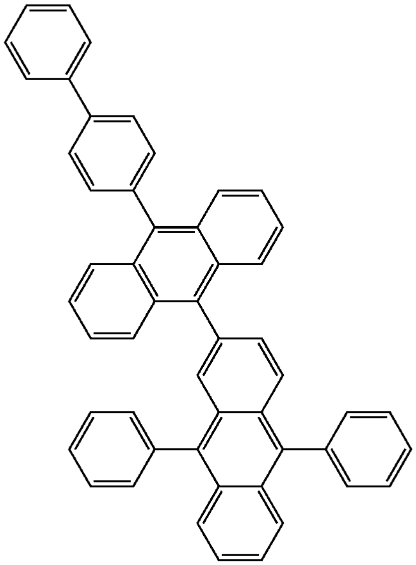
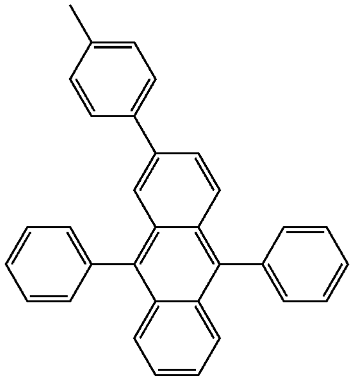
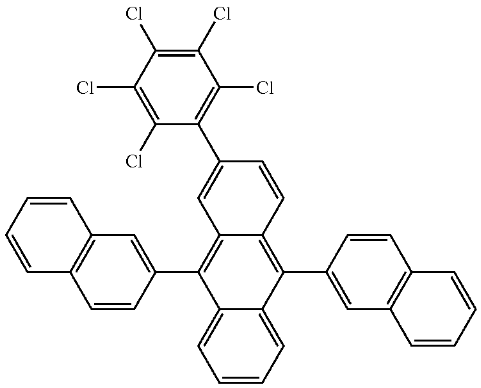
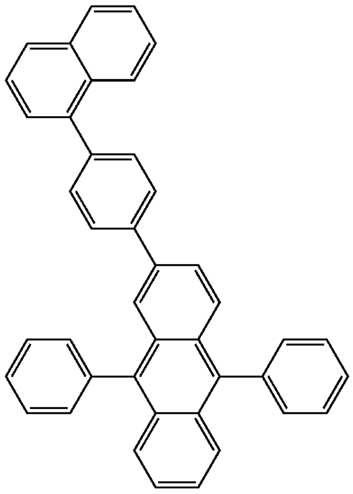
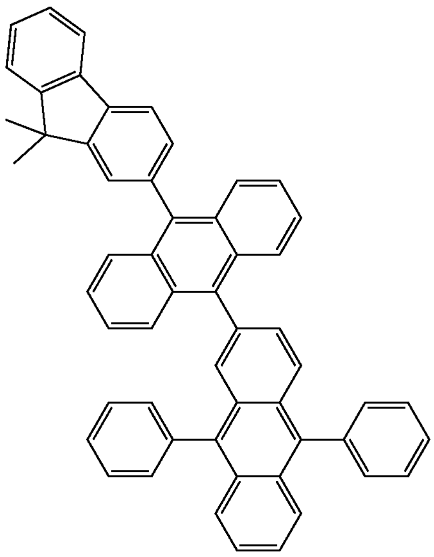

-continued
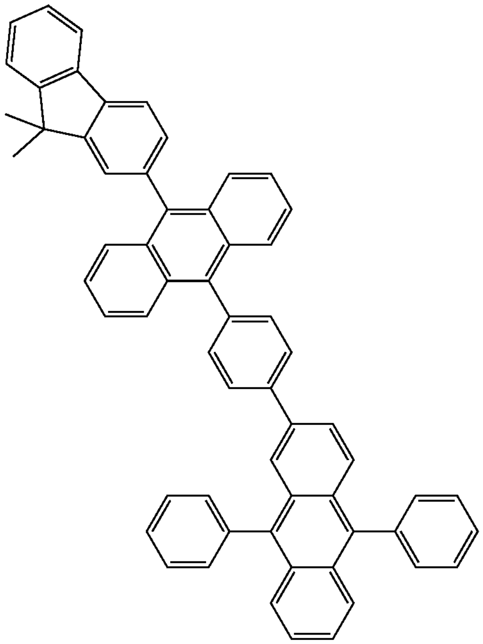
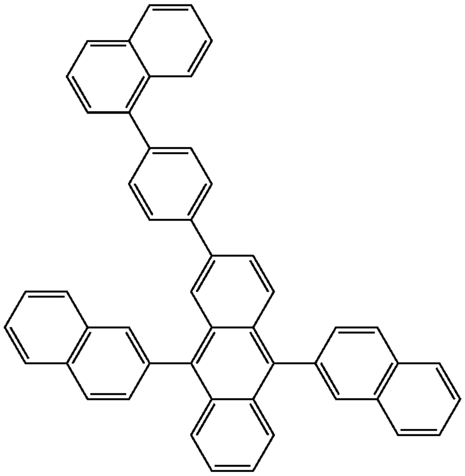
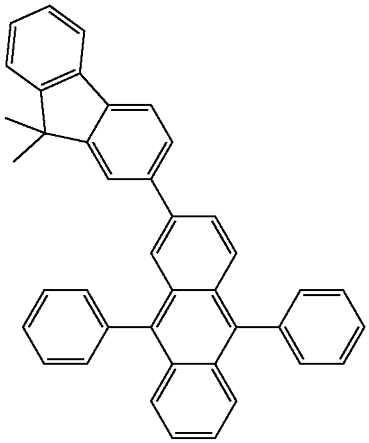
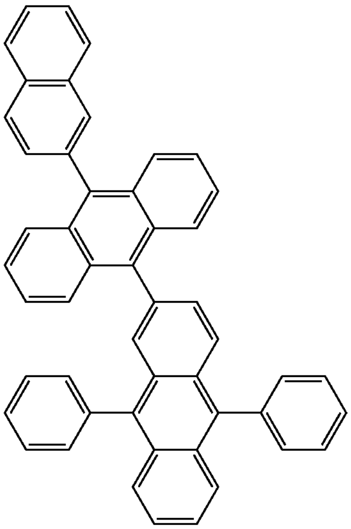

-continued
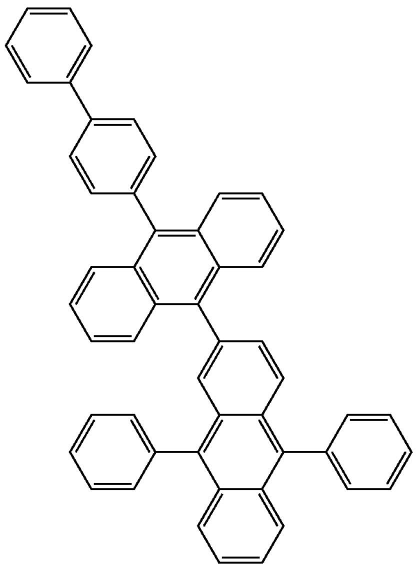
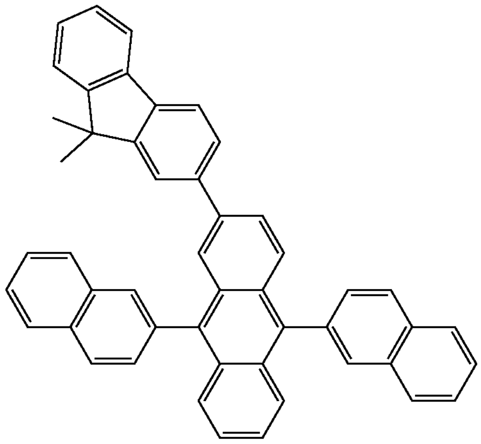
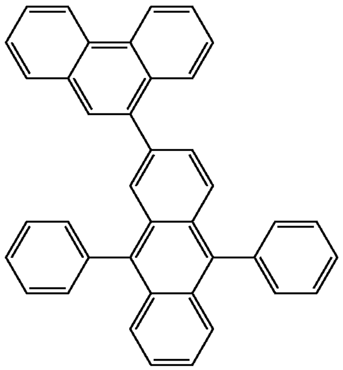
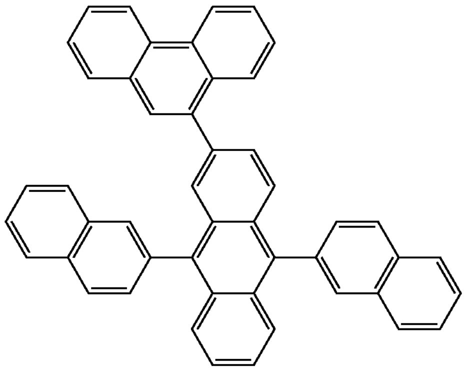
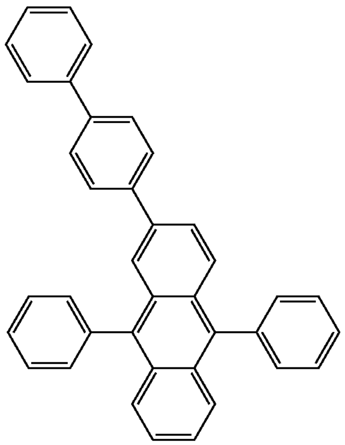
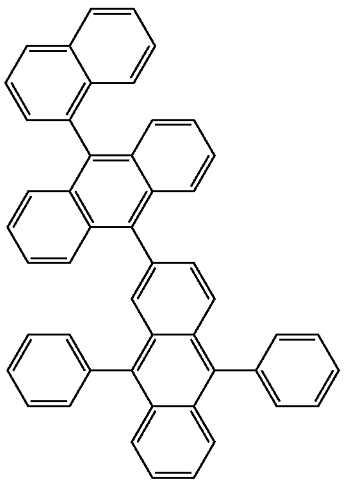
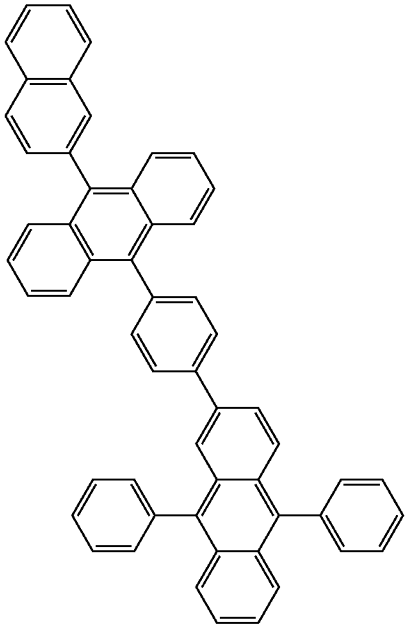

-continued
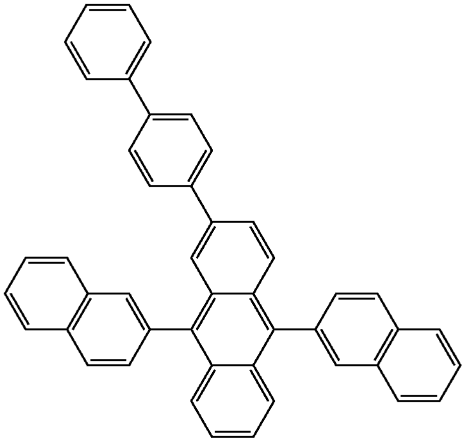
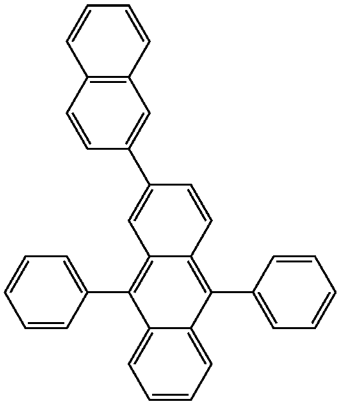
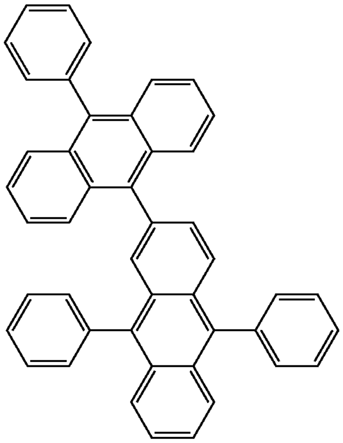
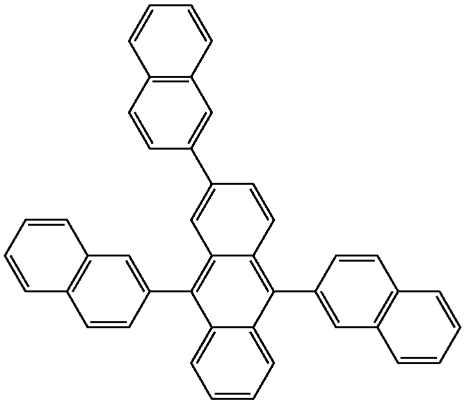
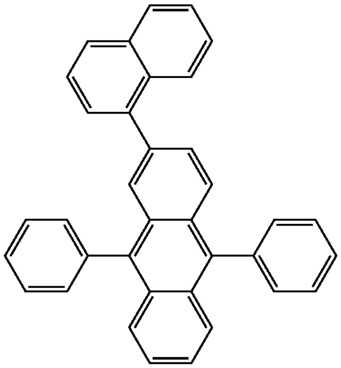
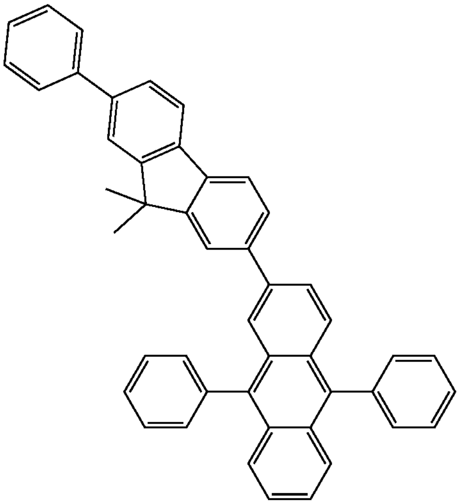

-continued
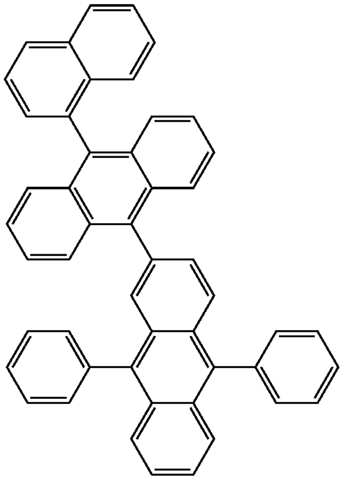
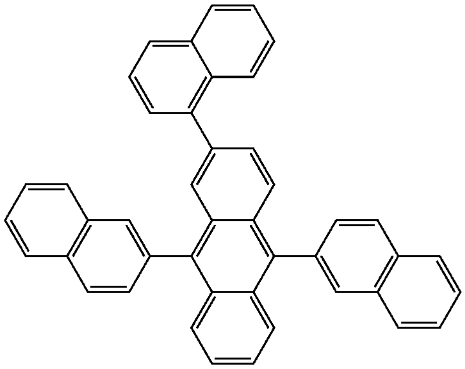
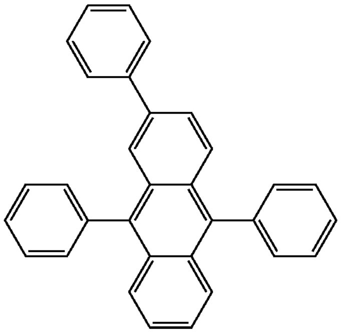
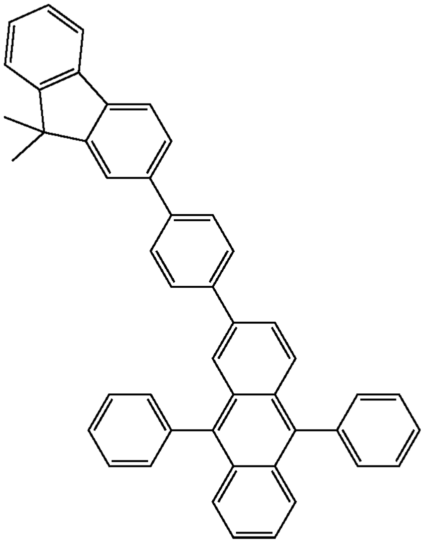
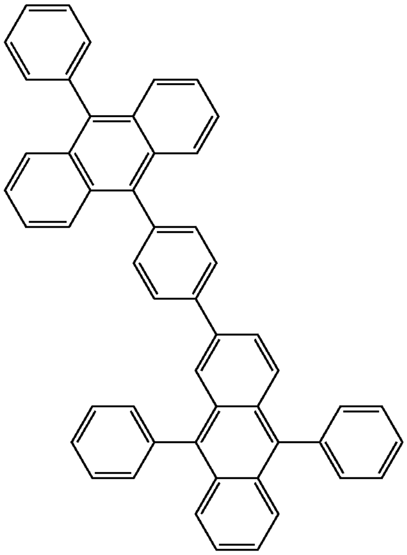
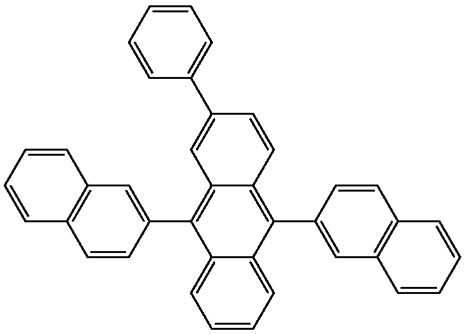

-continued
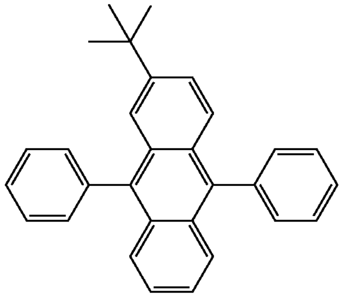
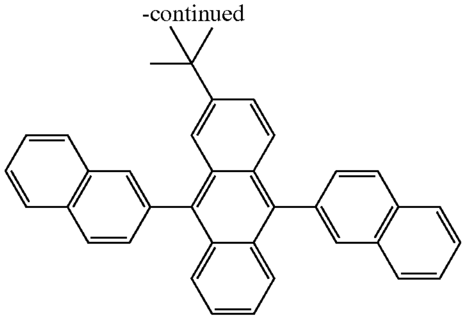
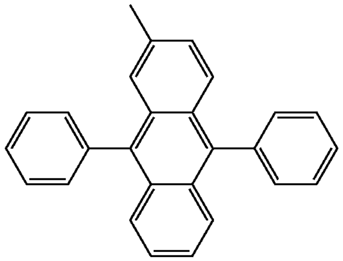
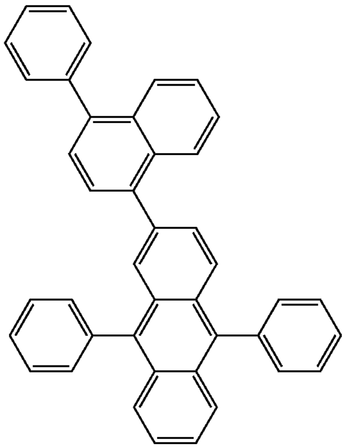
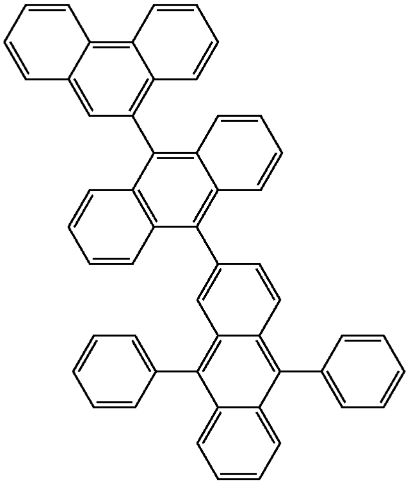
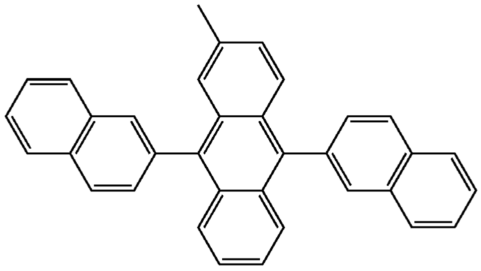
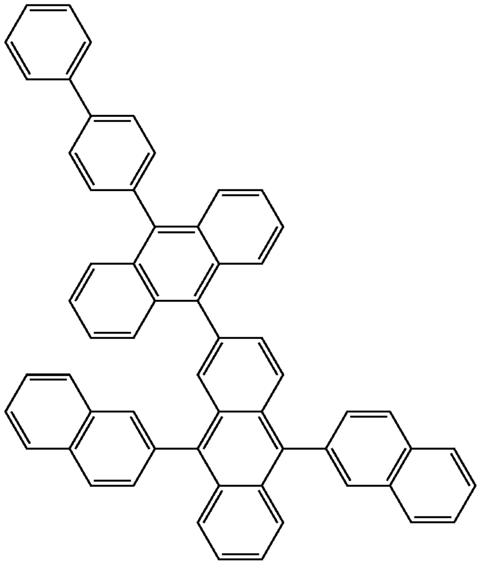
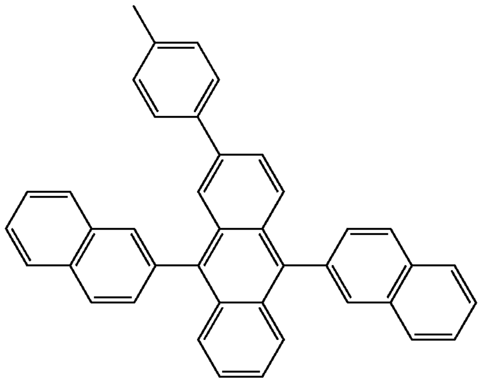
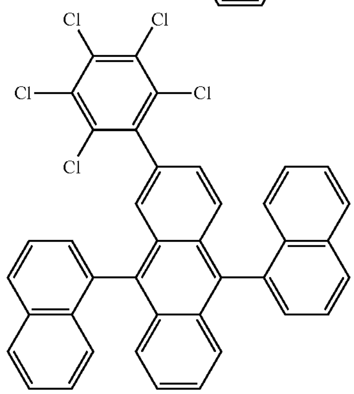

-continued
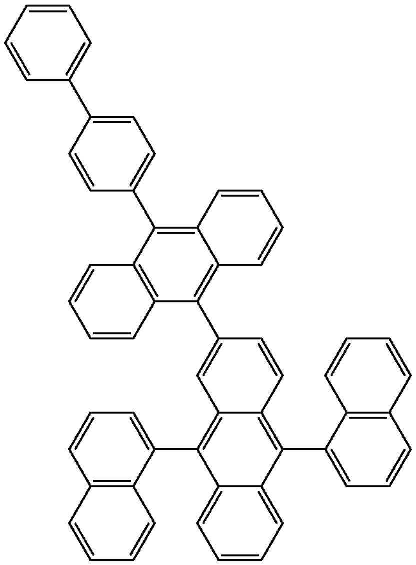
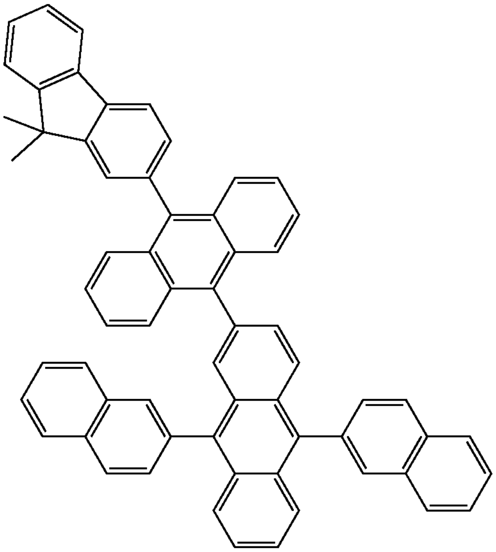
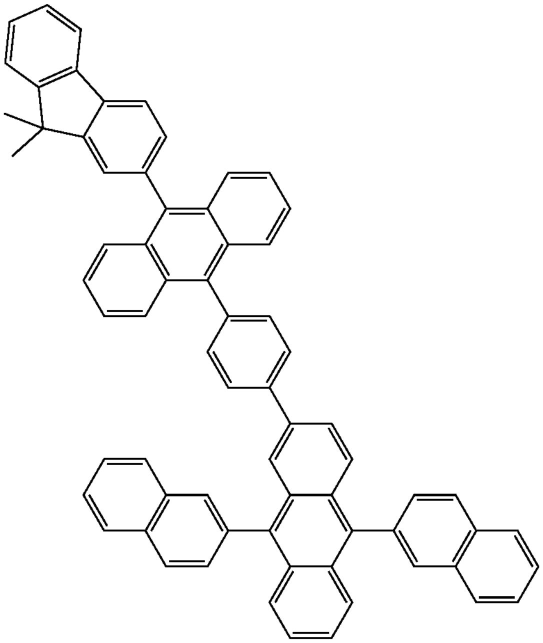
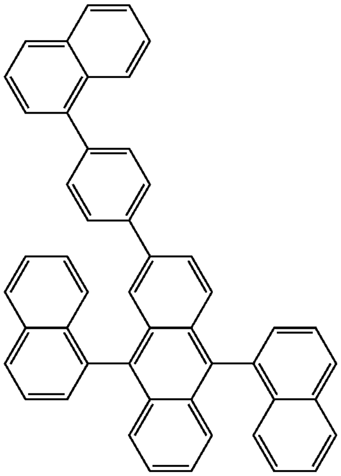

-continued
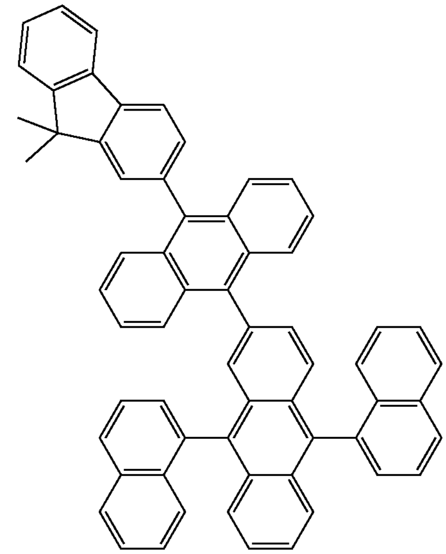
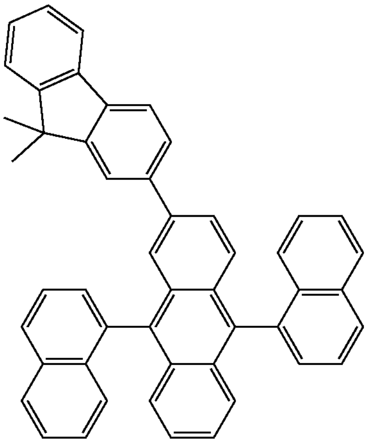
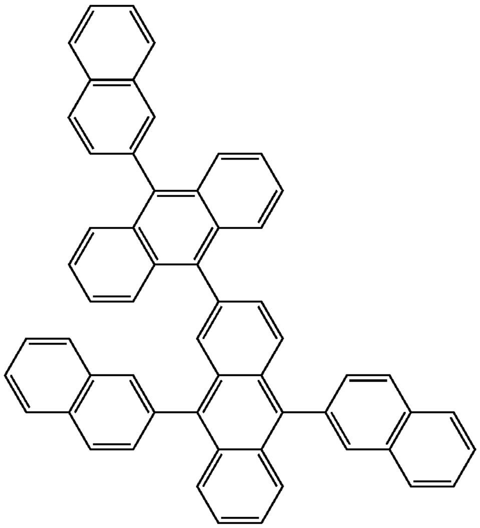
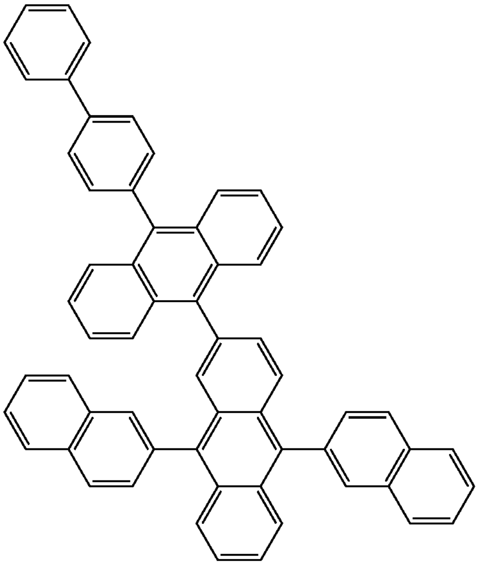
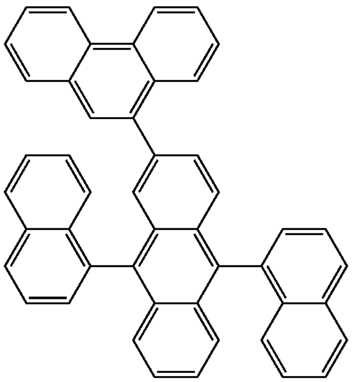
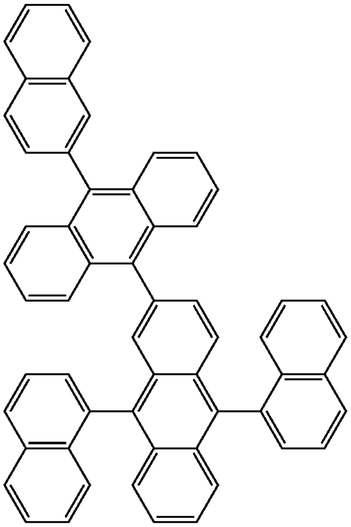

-continued
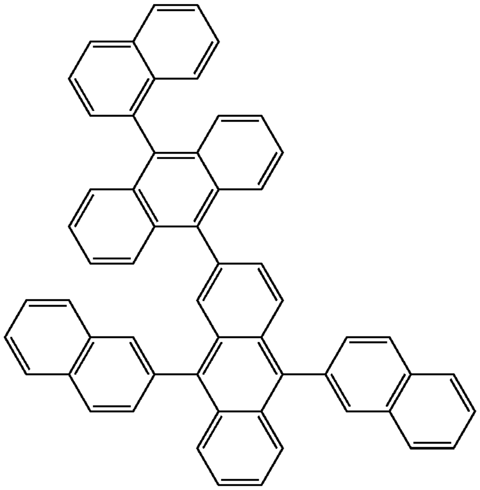
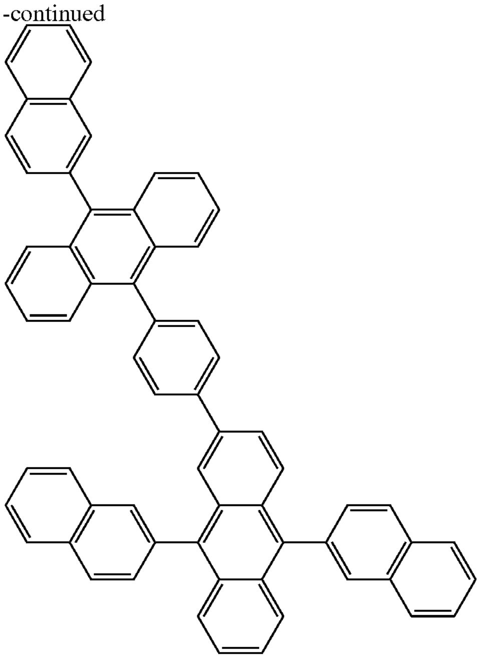
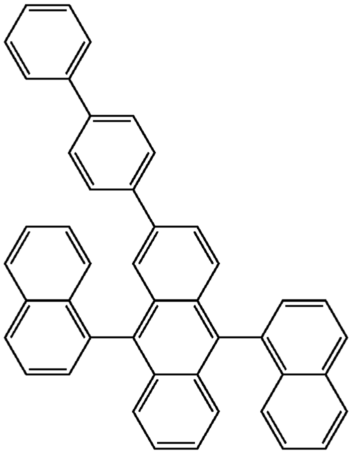
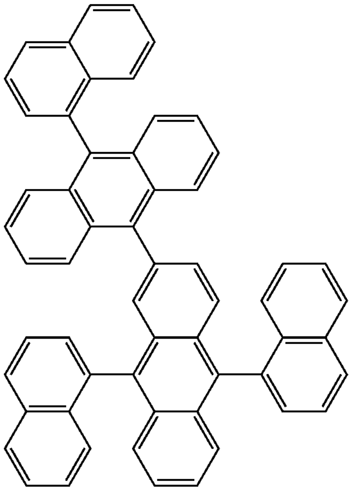
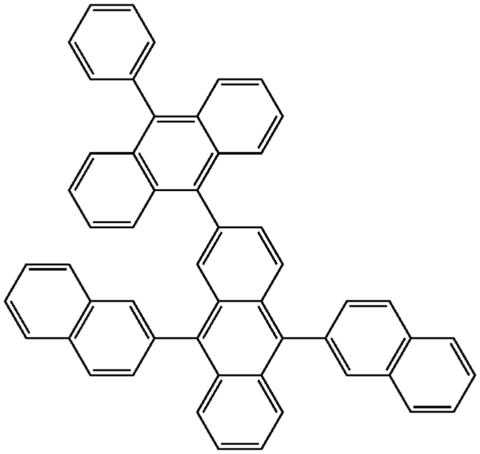
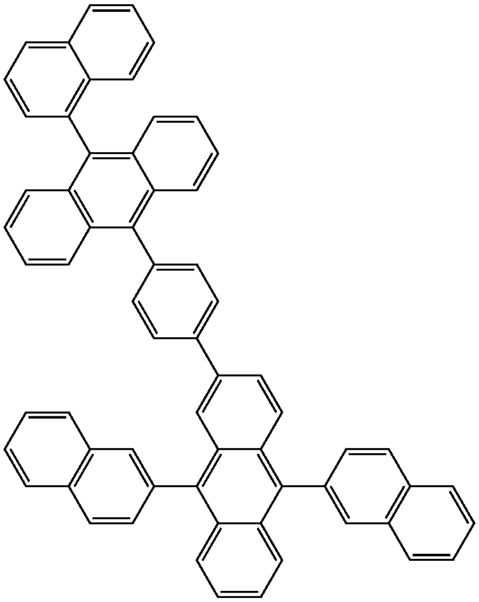

-continued
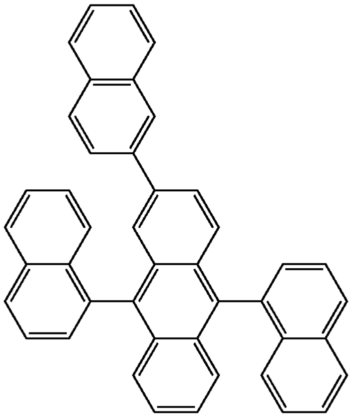
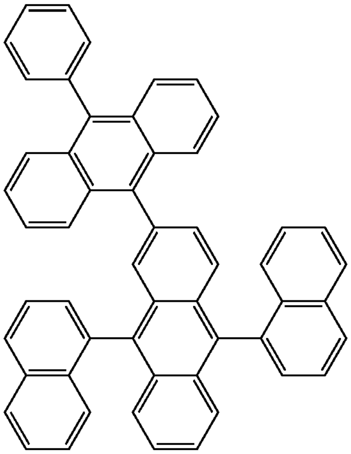
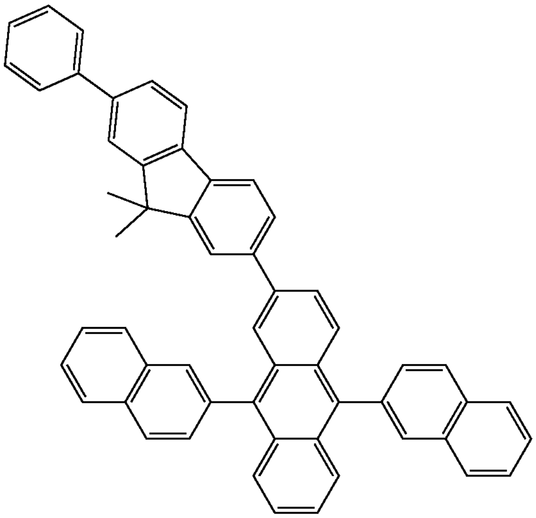
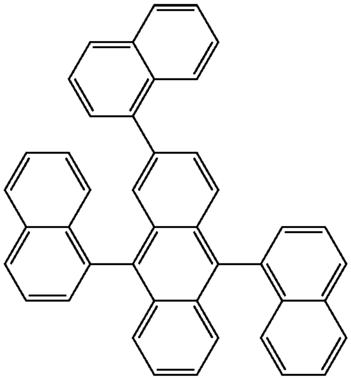
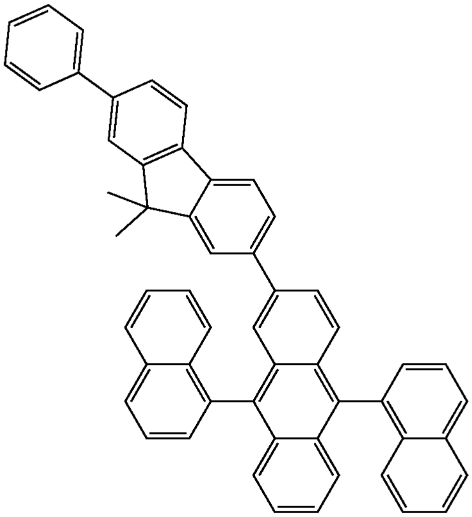
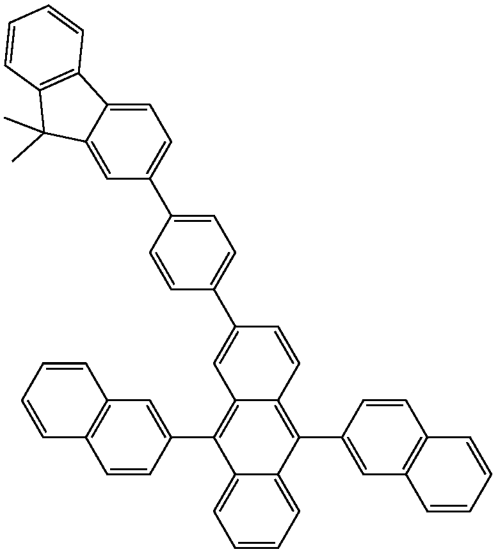

-continued
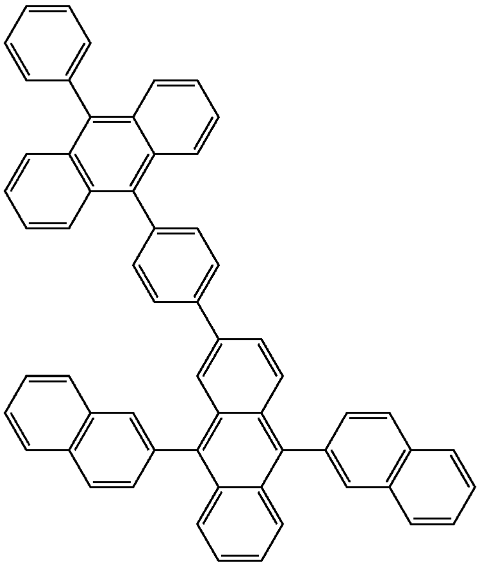
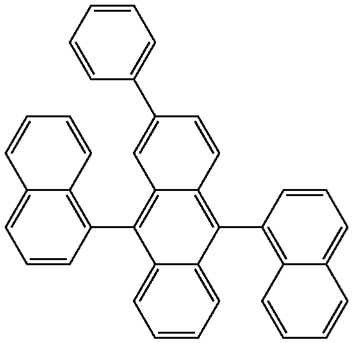
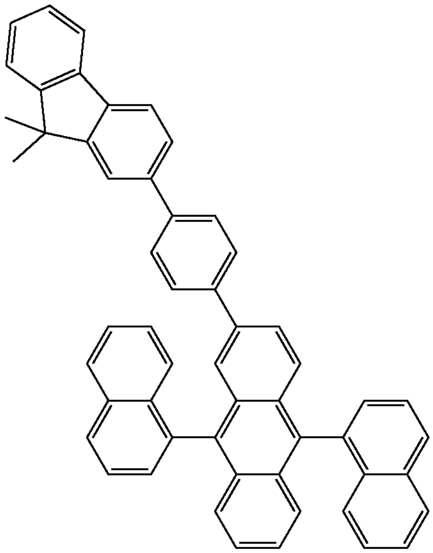
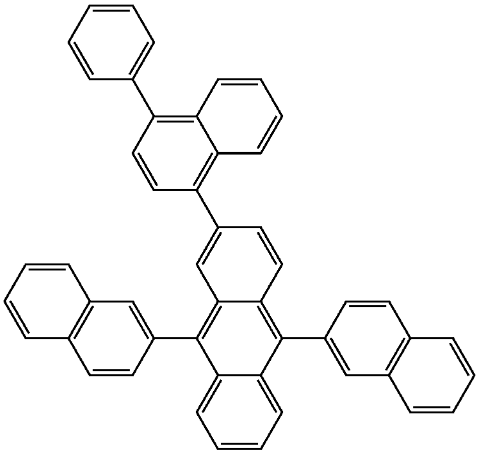
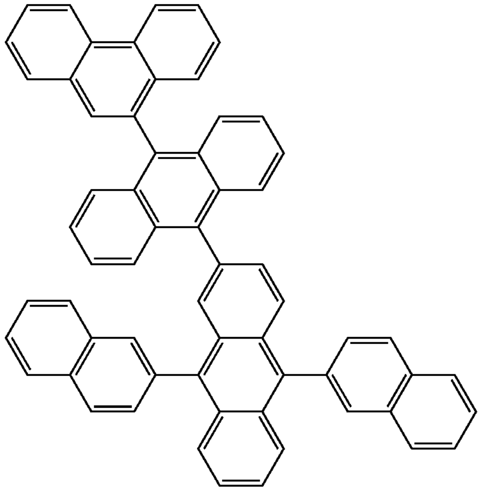
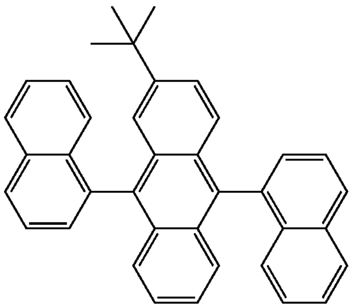

-continued
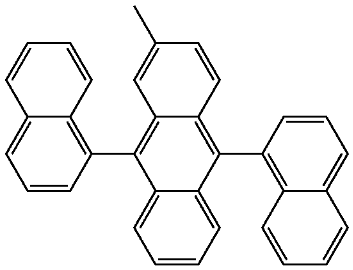
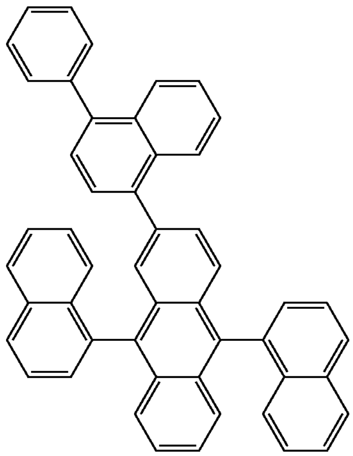
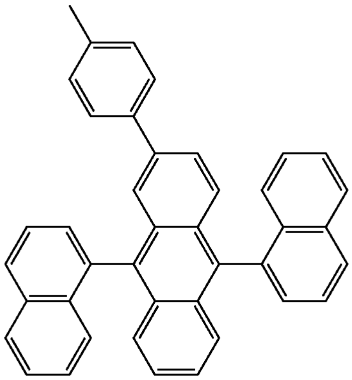
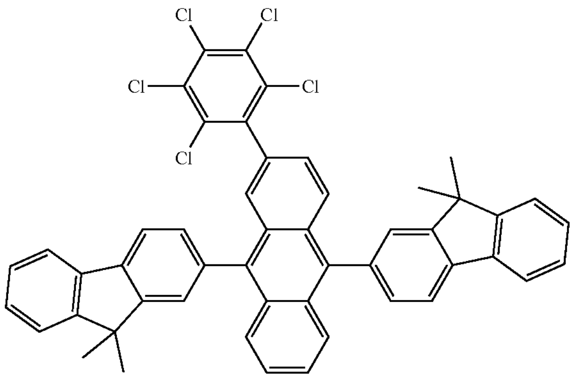
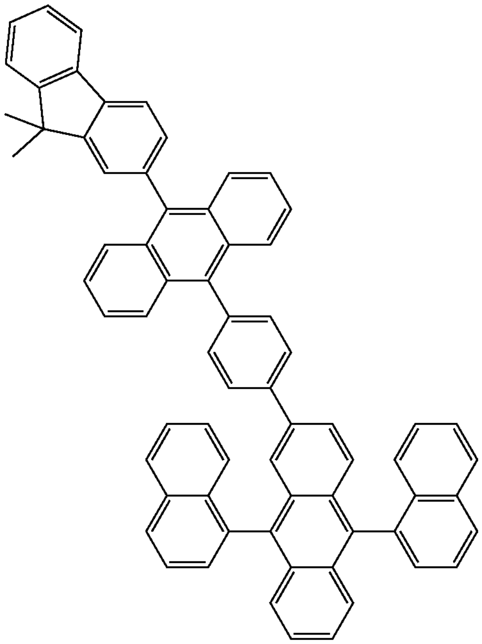
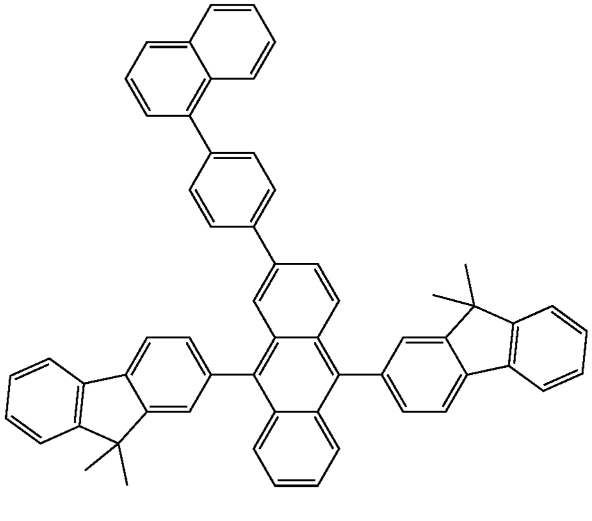
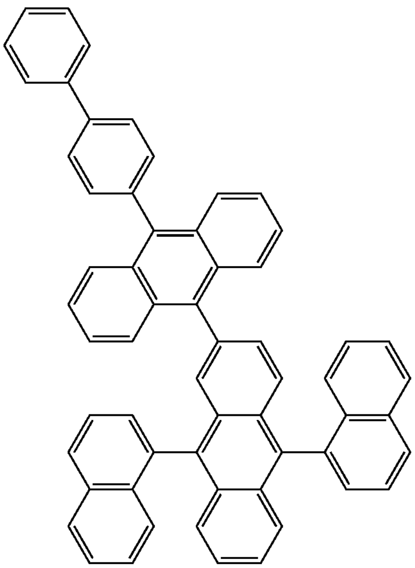

-continued
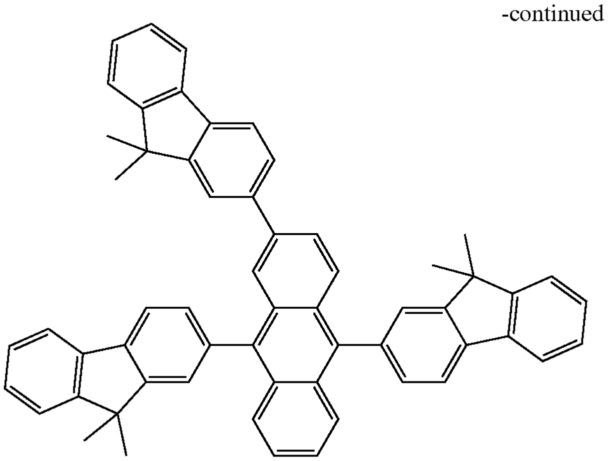
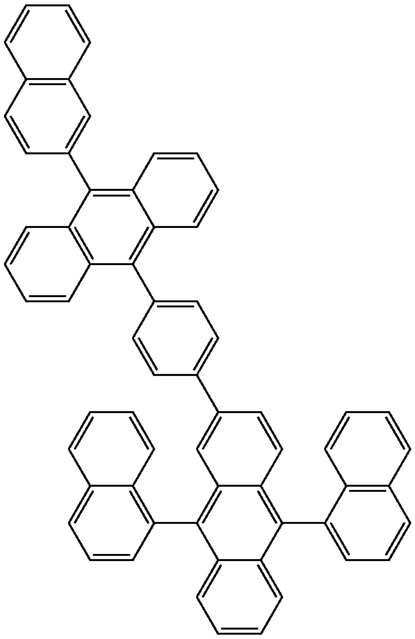
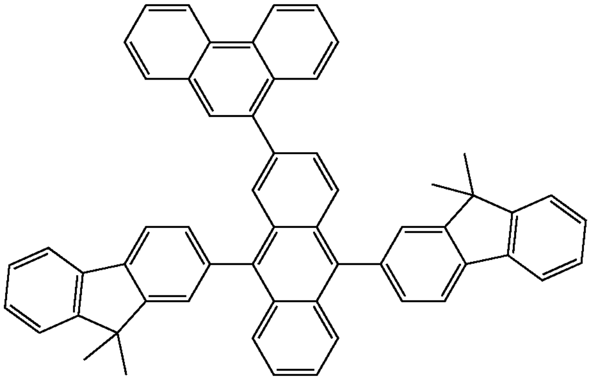
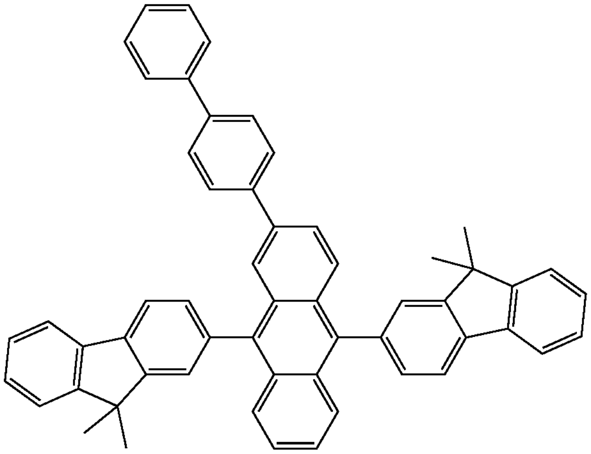
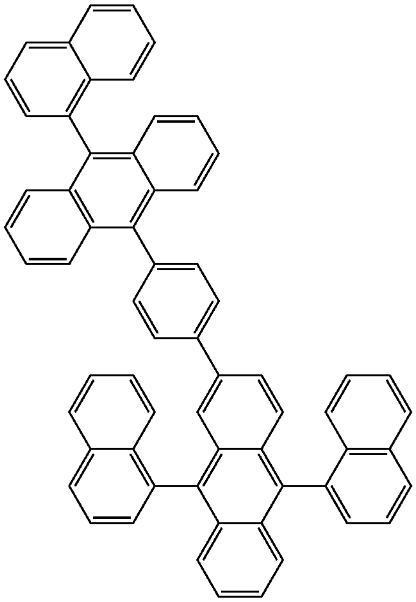

-continued
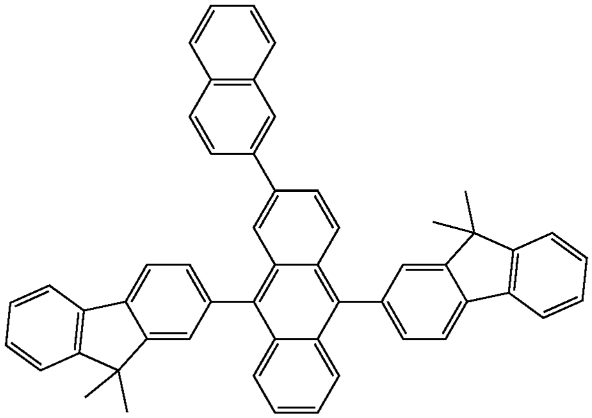
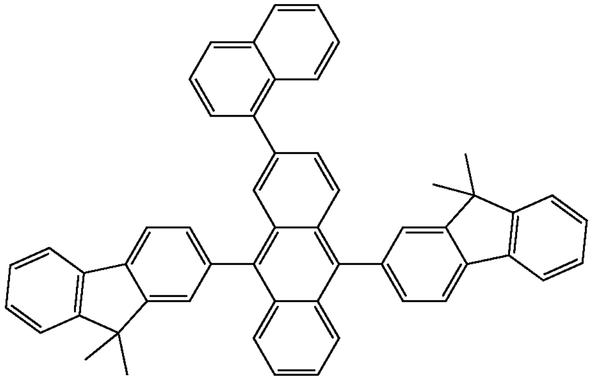
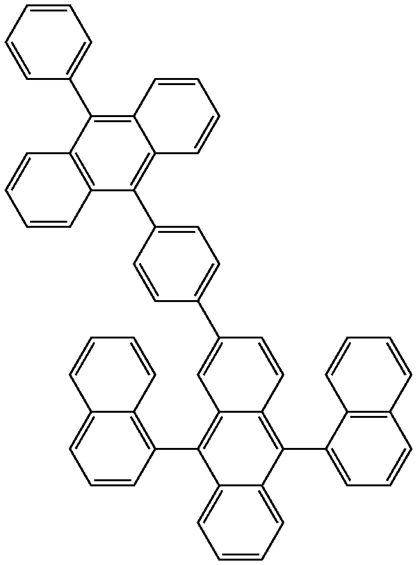
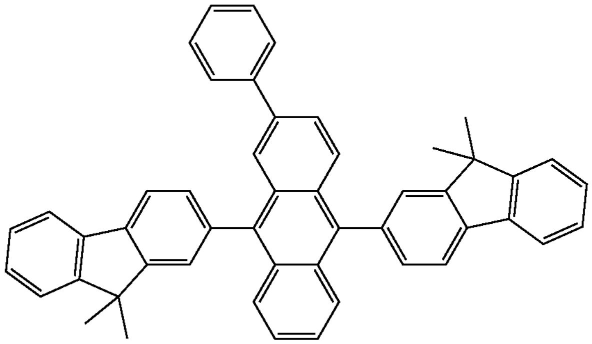
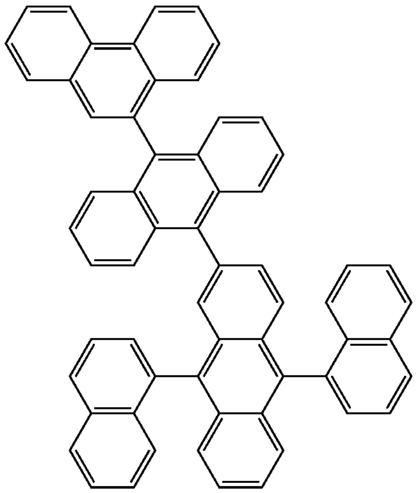

-continued
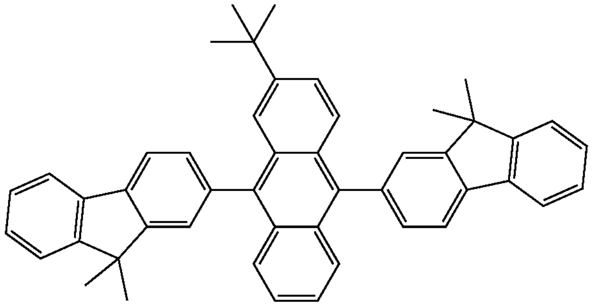
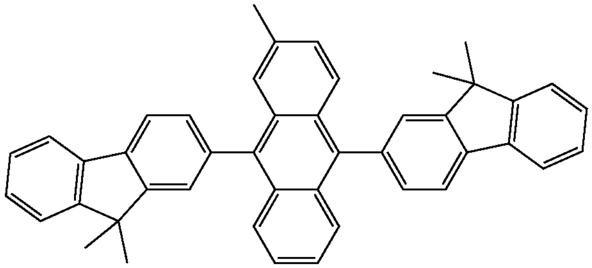
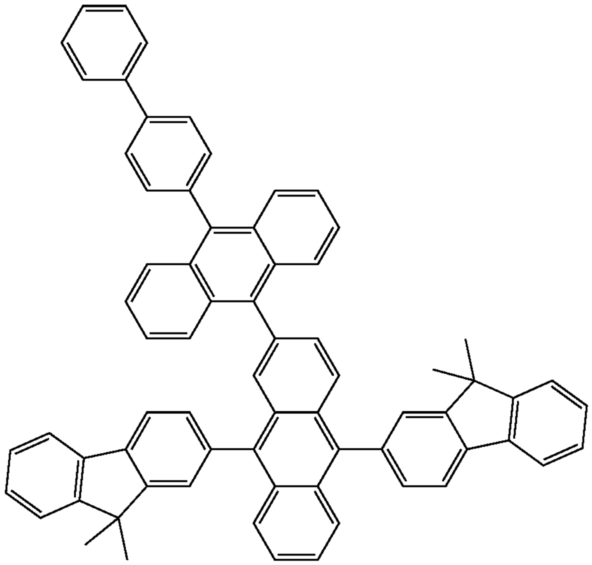
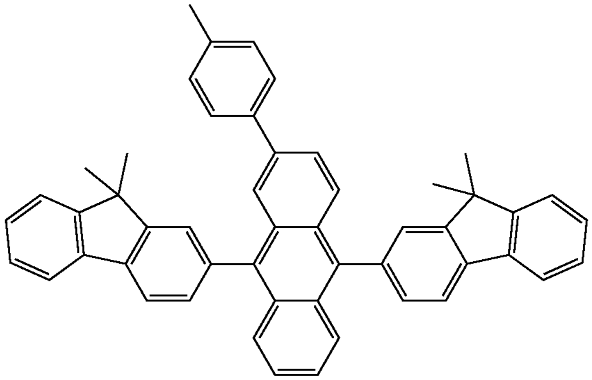

-continued
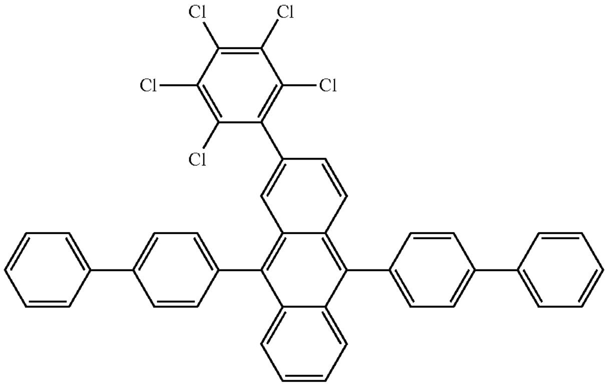
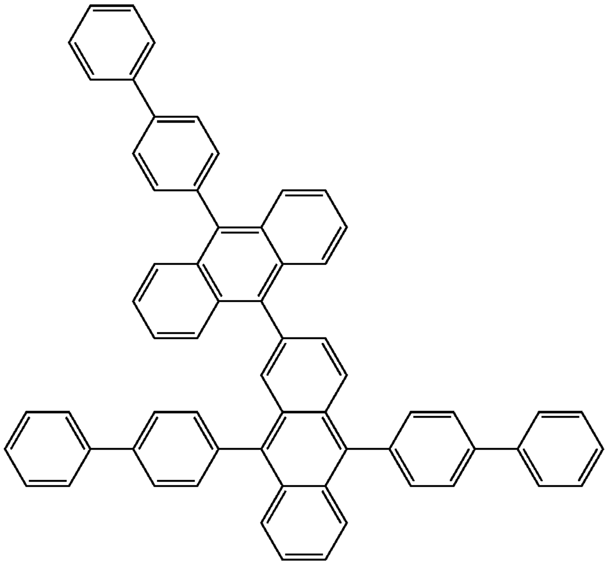
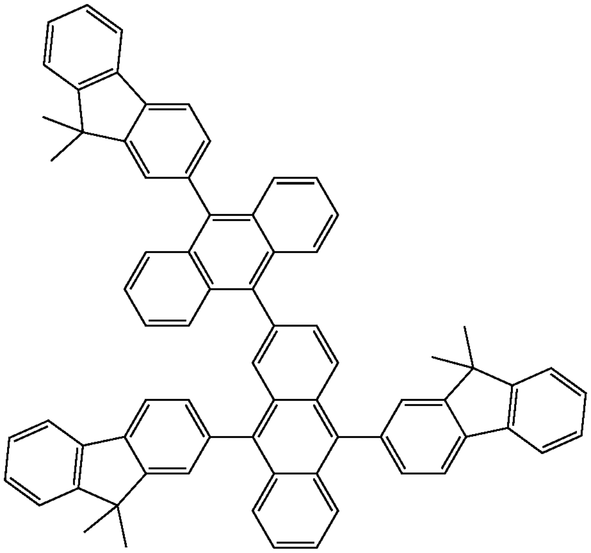

-continued
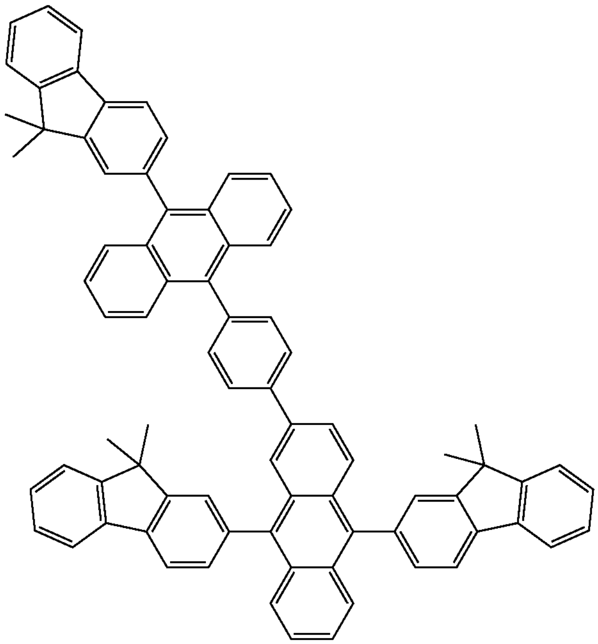
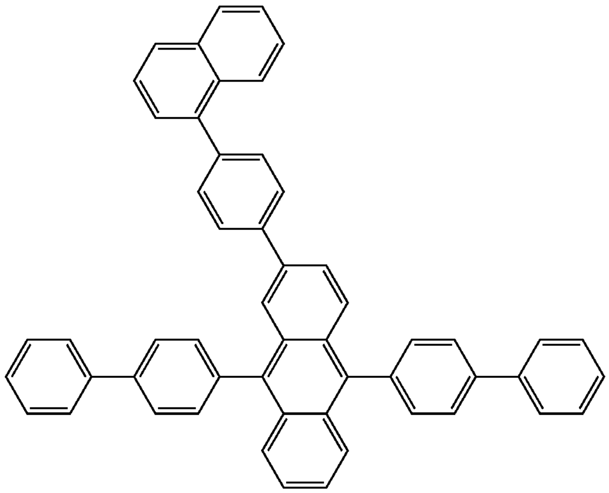
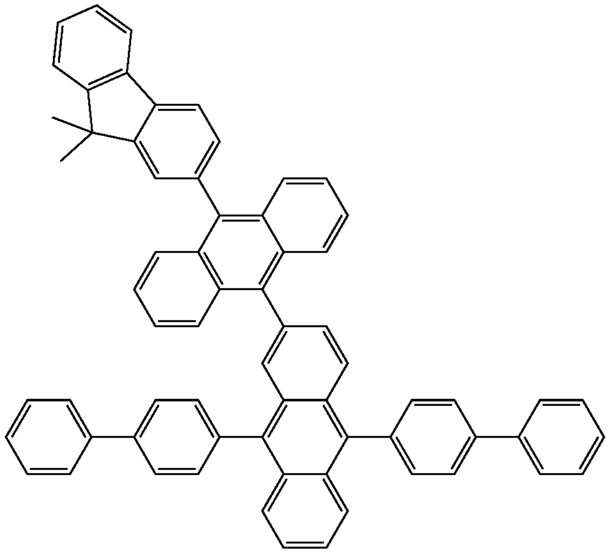

-continued
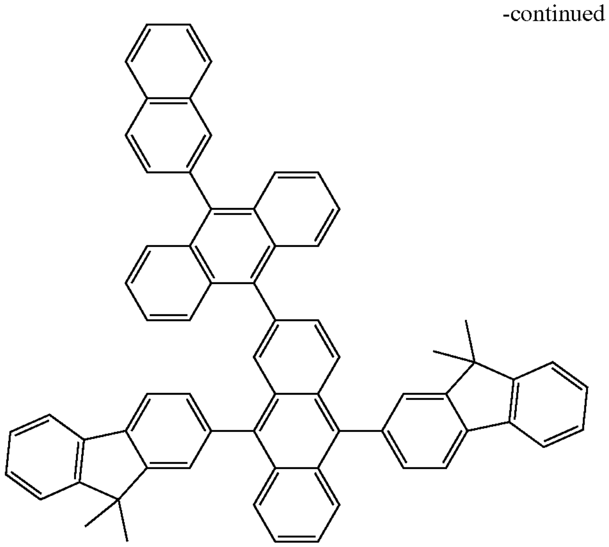
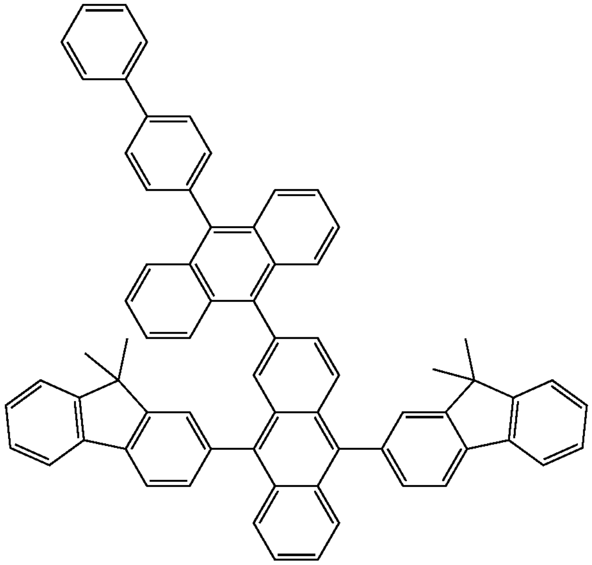
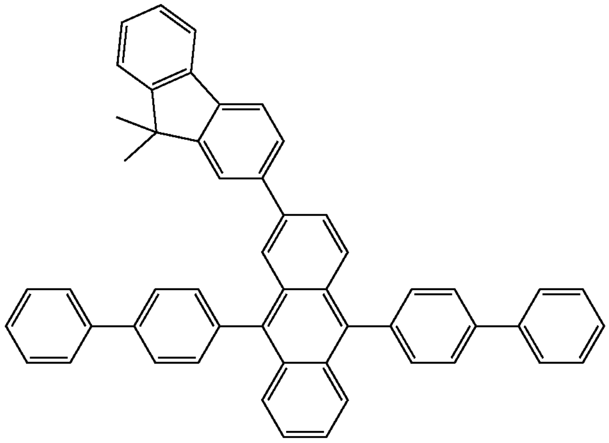

-continued
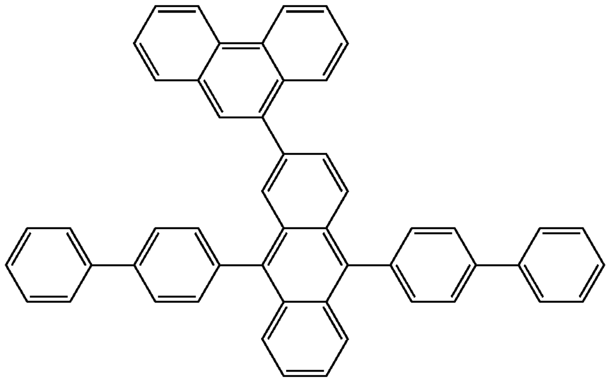
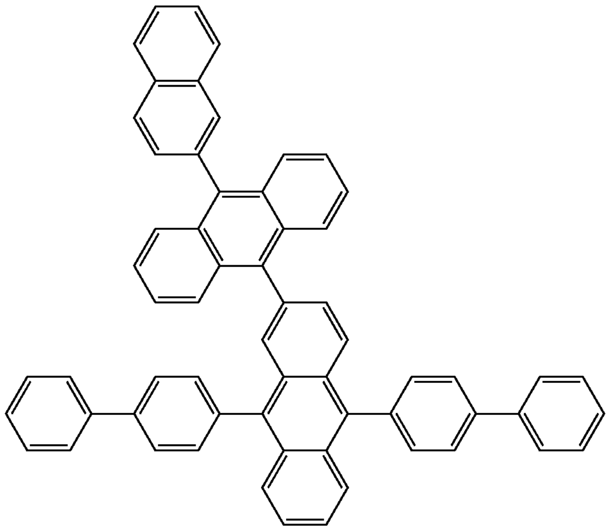
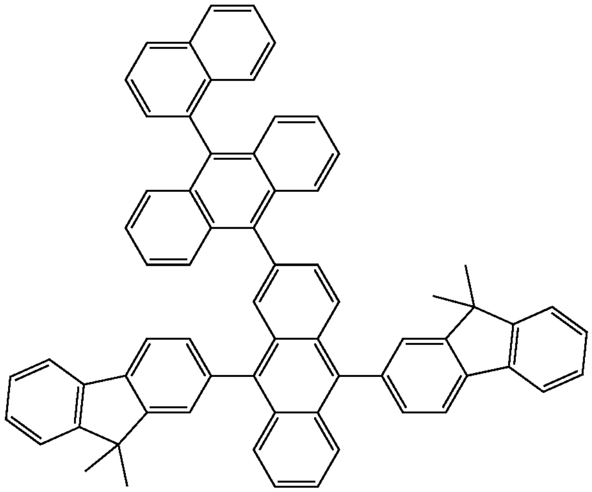

-continued
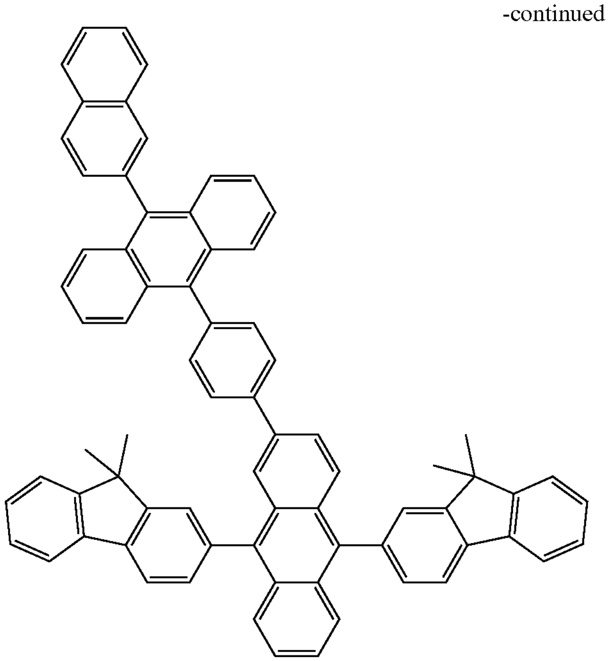
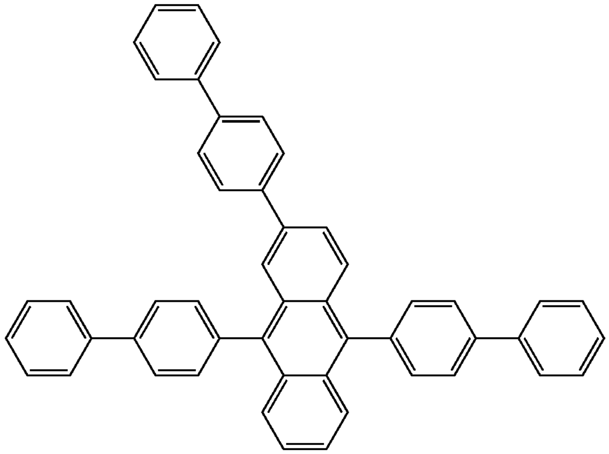
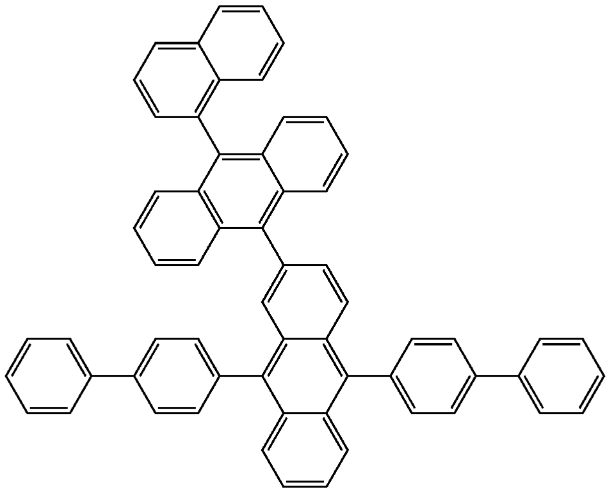

-continued
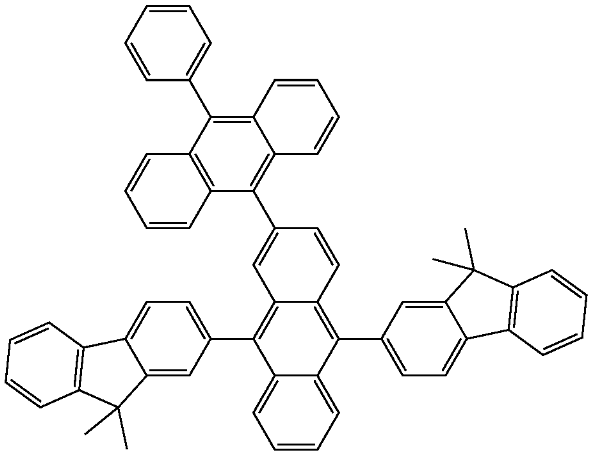
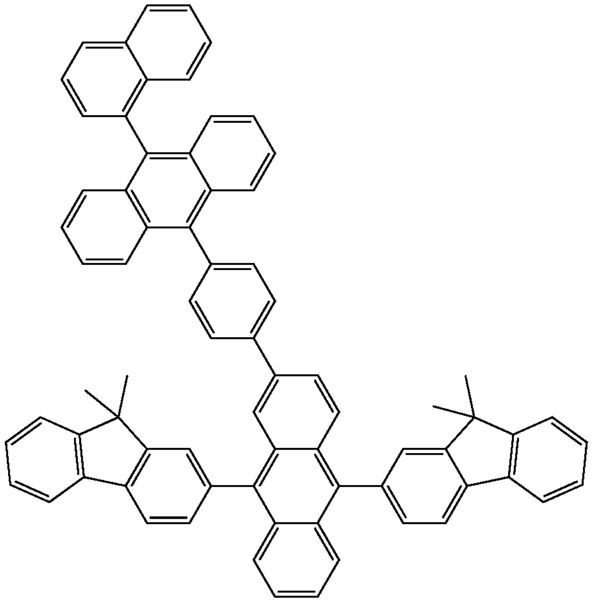
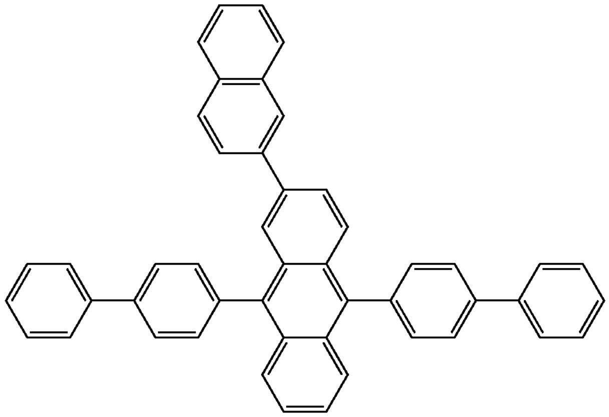
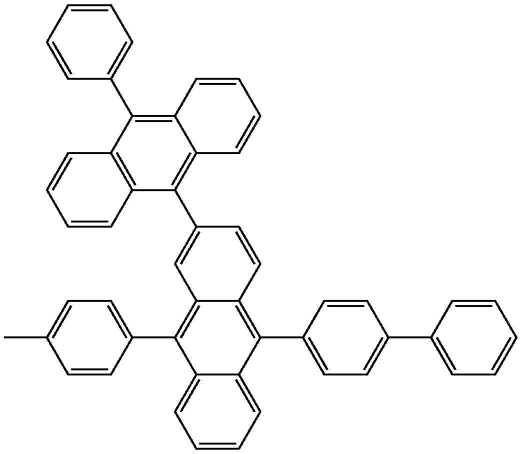

-continued
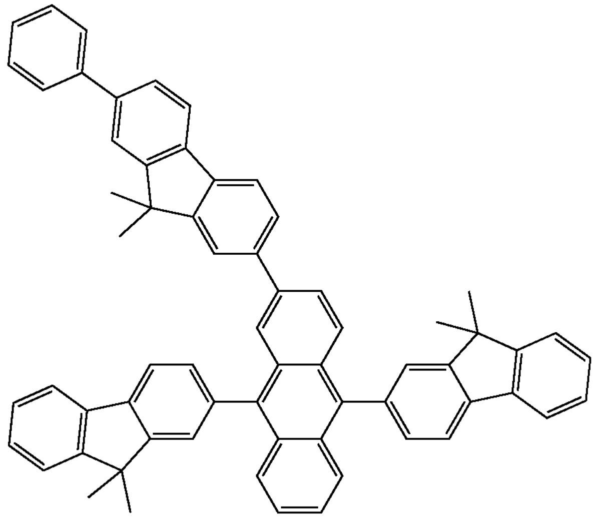
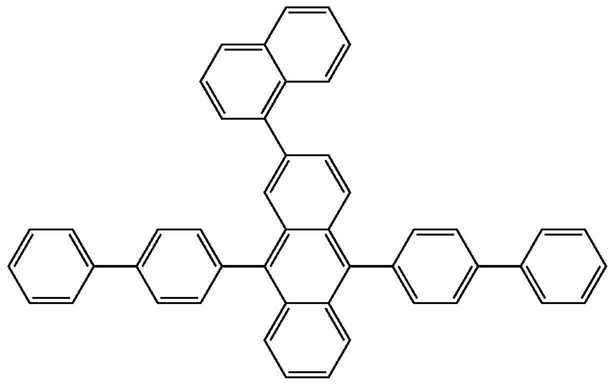
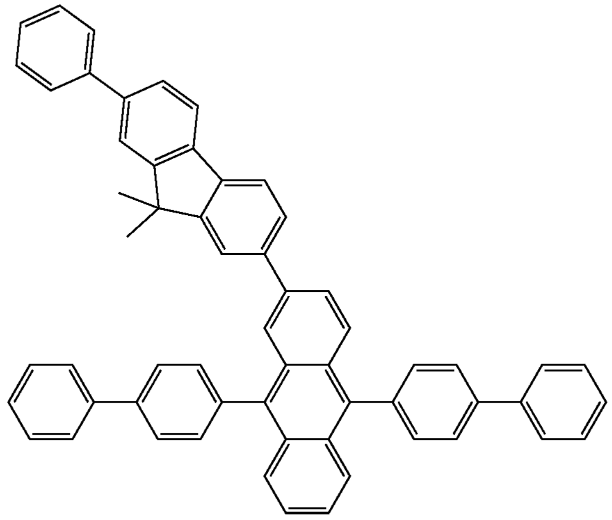

-continued
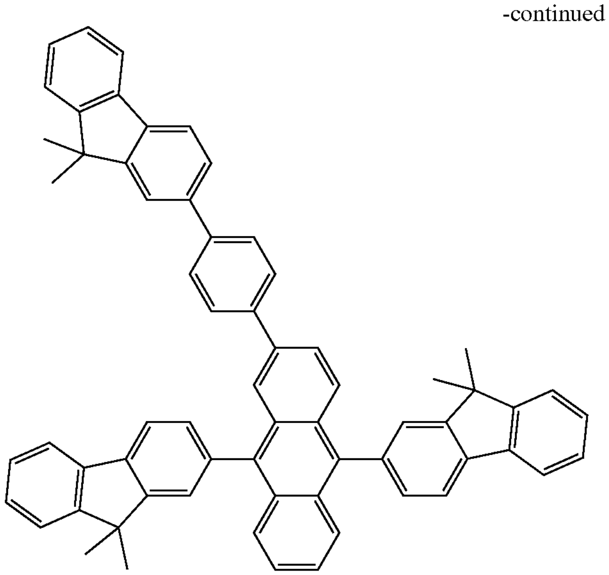
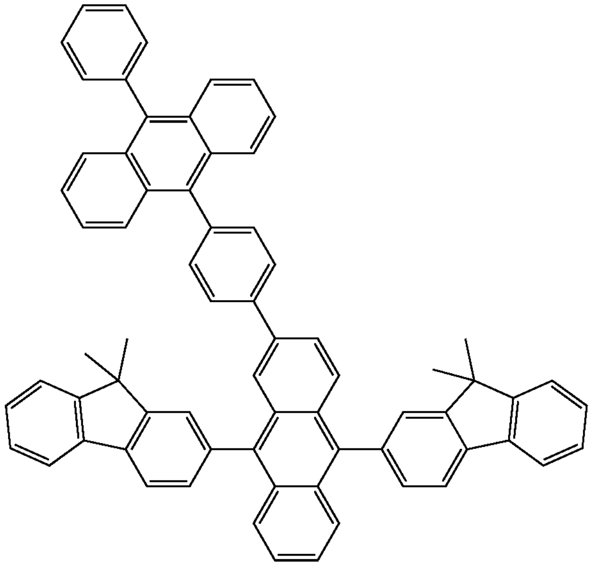
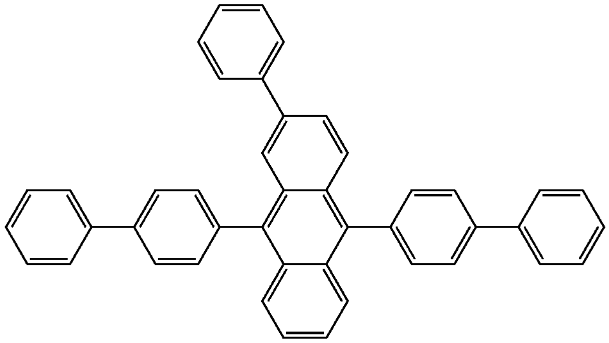

-continued
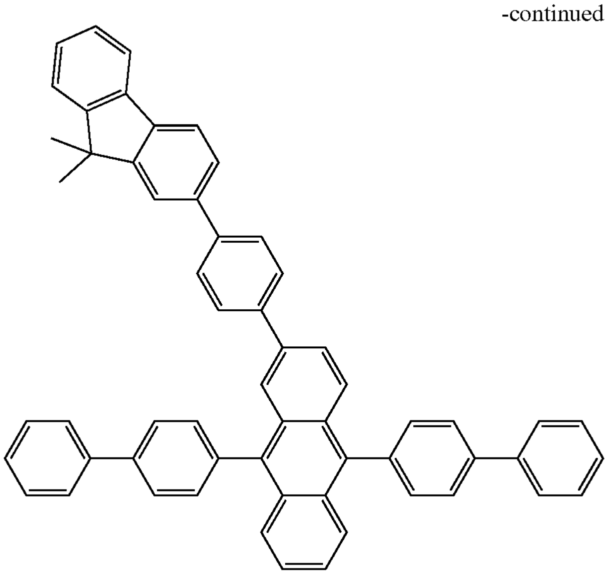
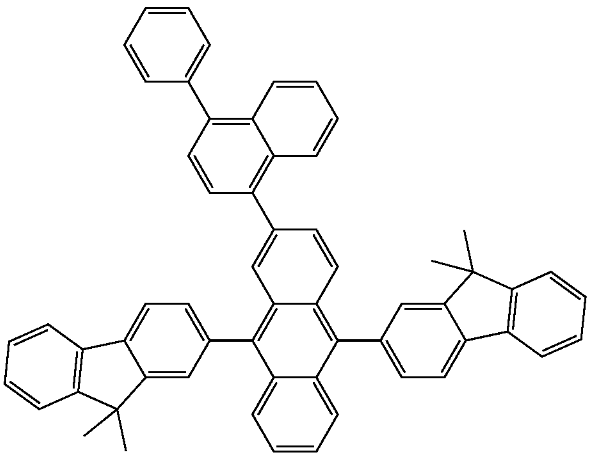
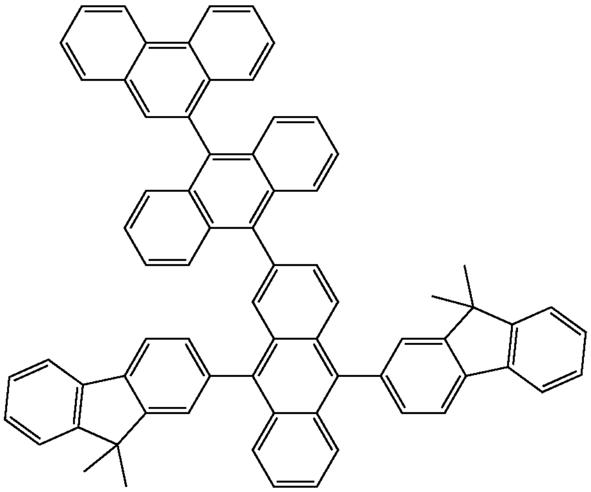

-continued
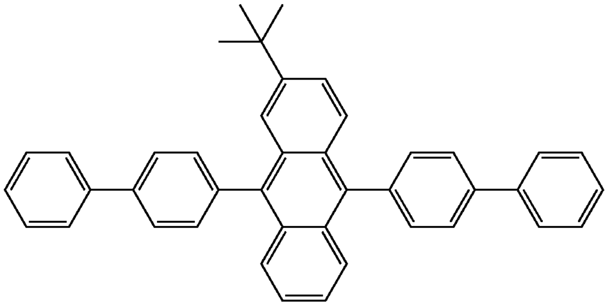
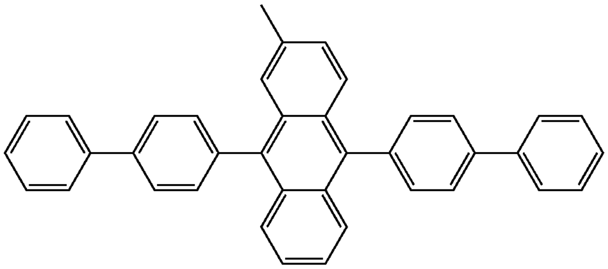
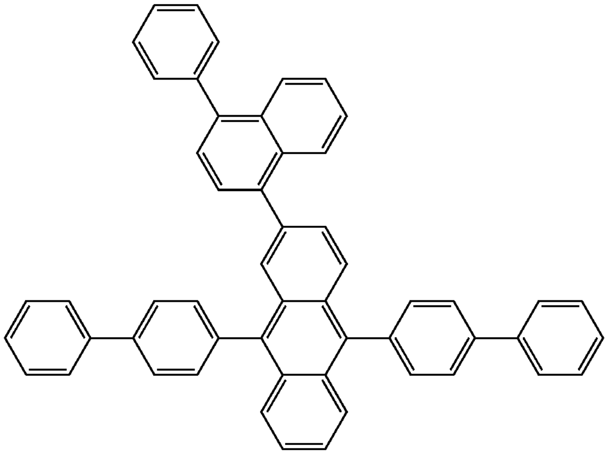
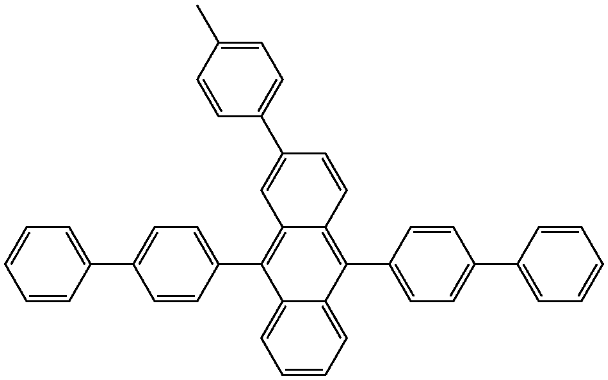
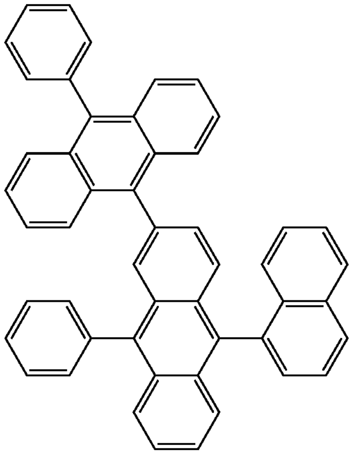

-continued
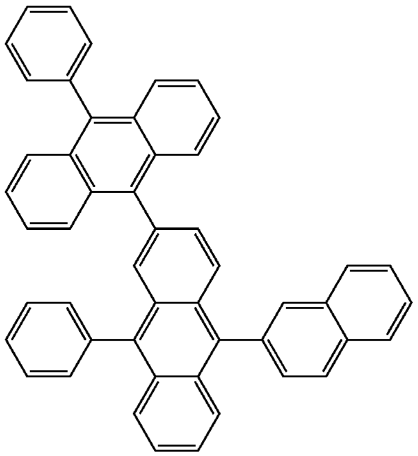
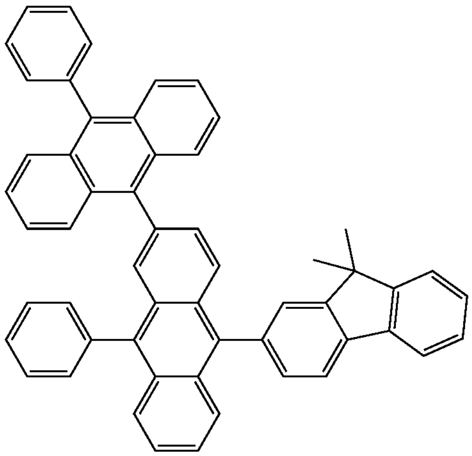
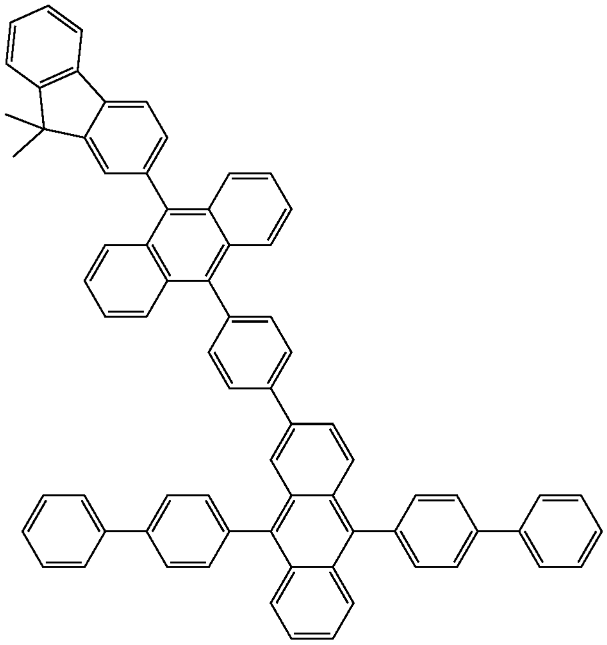
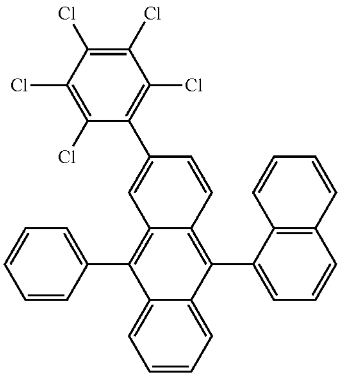
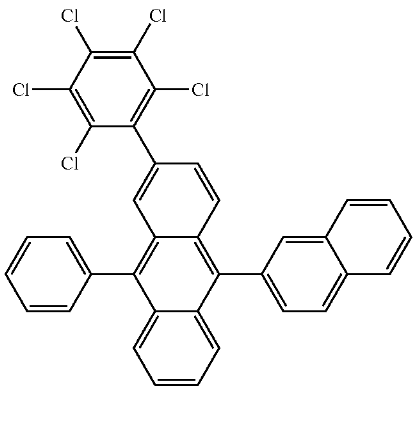
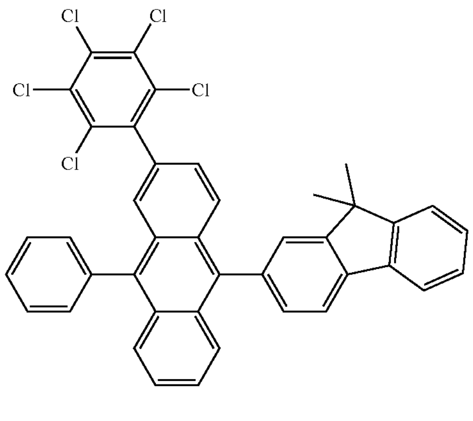

-continued
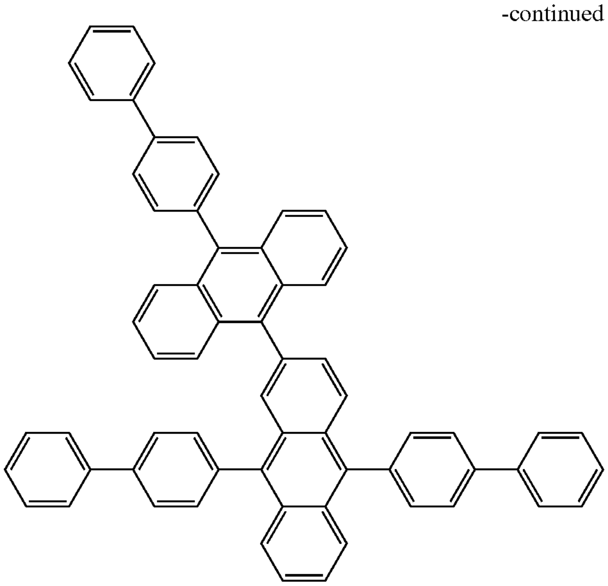
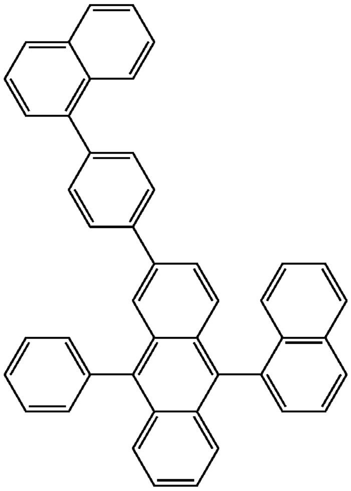
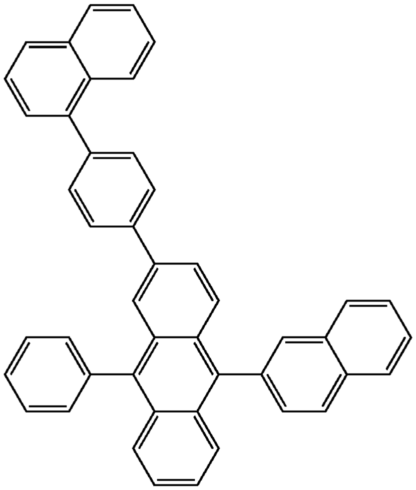
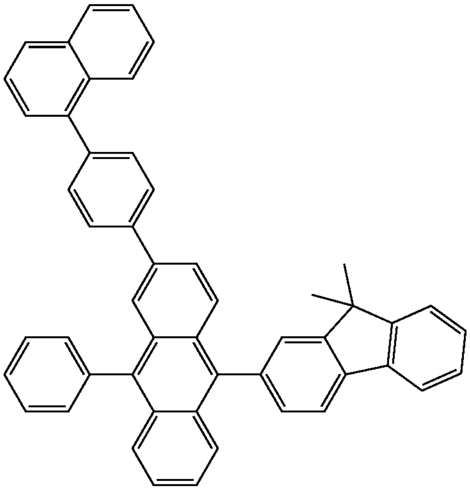
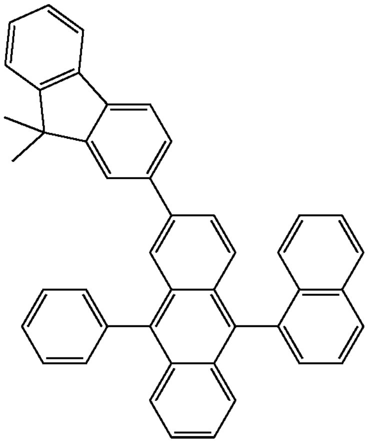
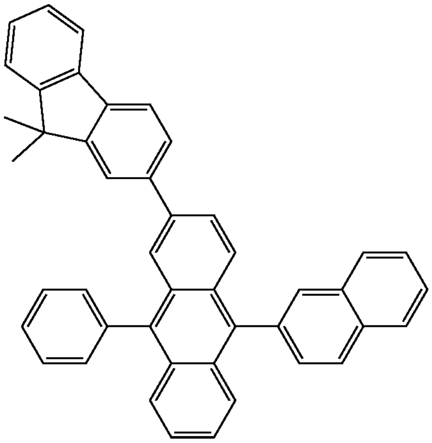

-continued
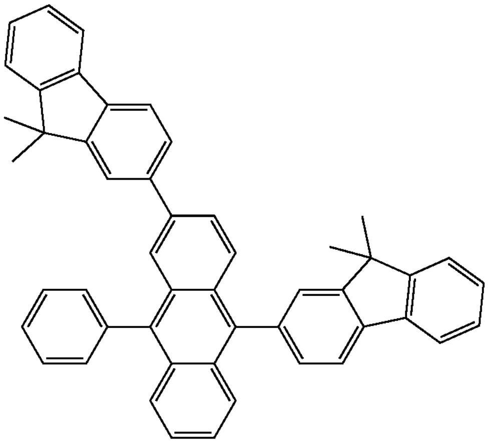
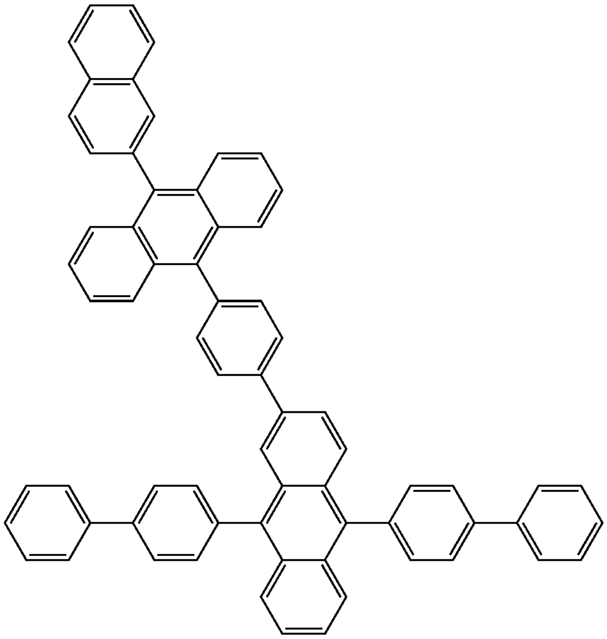
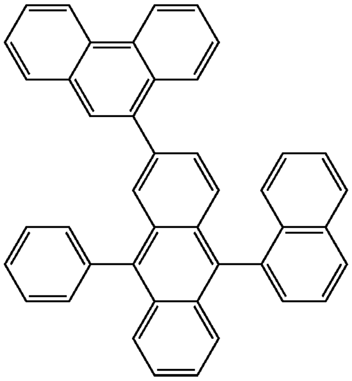
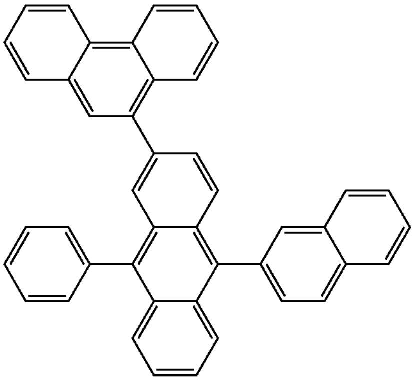
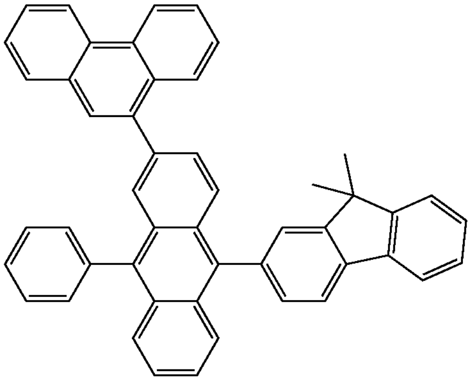
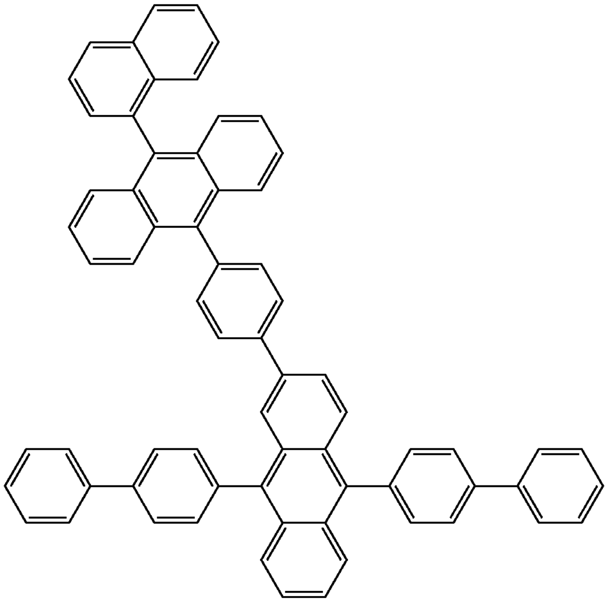

-continued
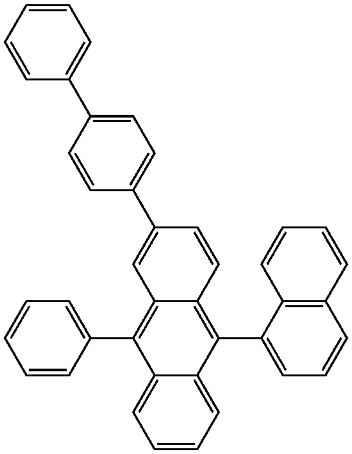
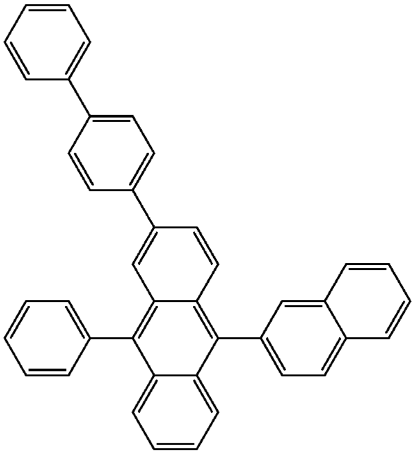
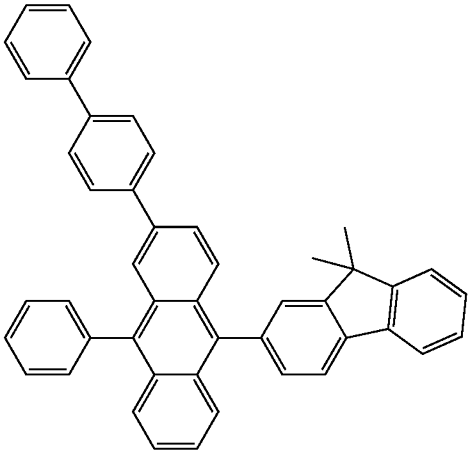
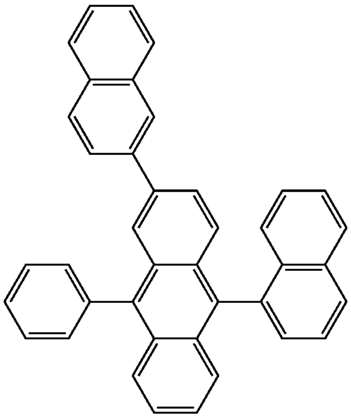
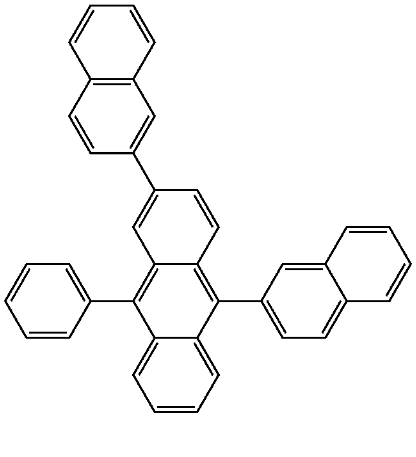
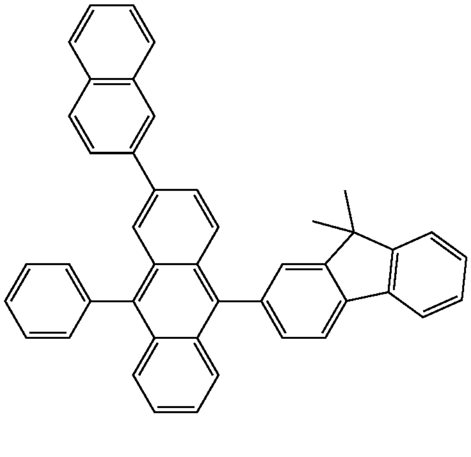

-continued
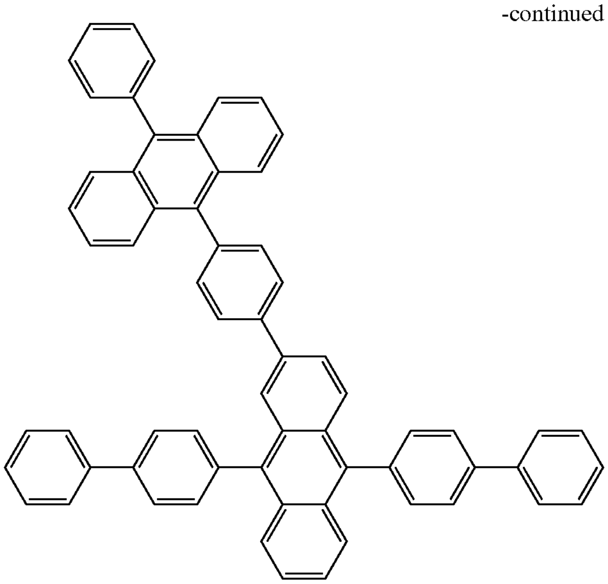
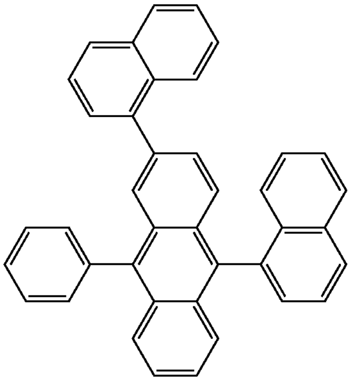
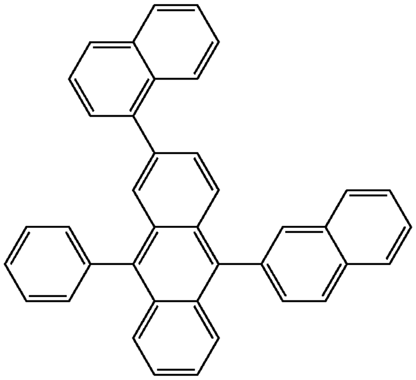
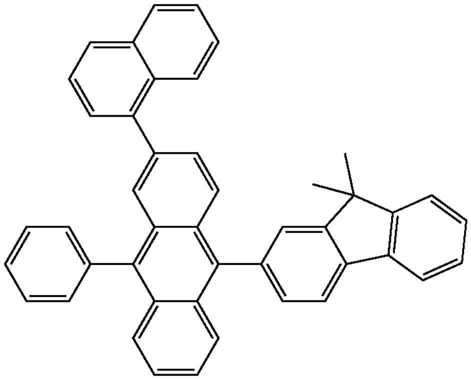
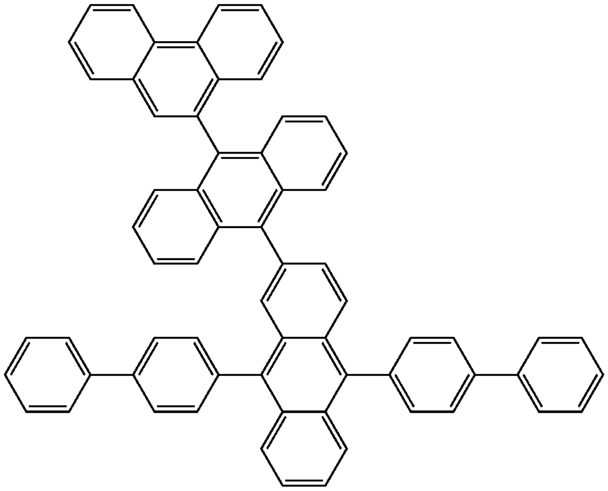
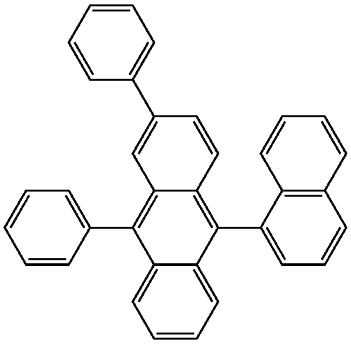

-continued
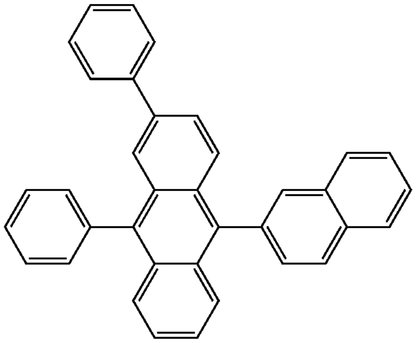
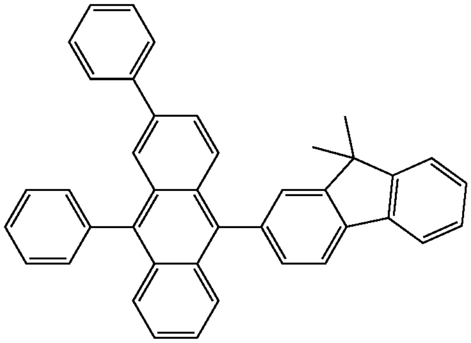
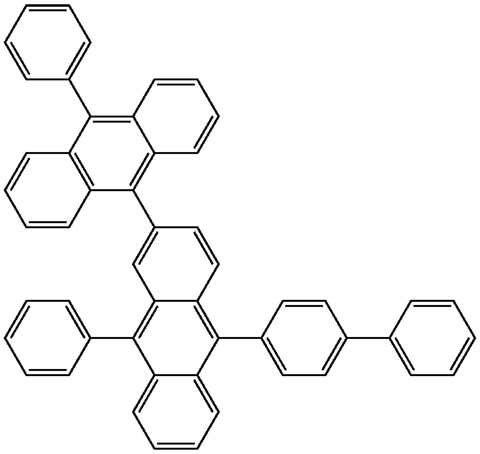
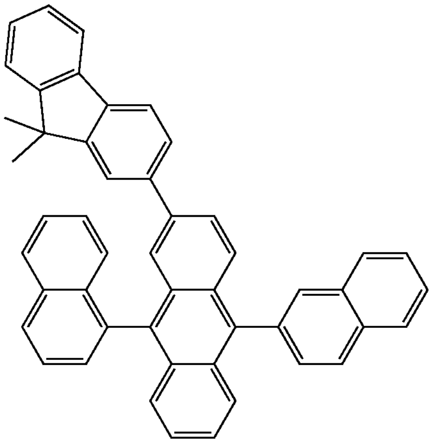
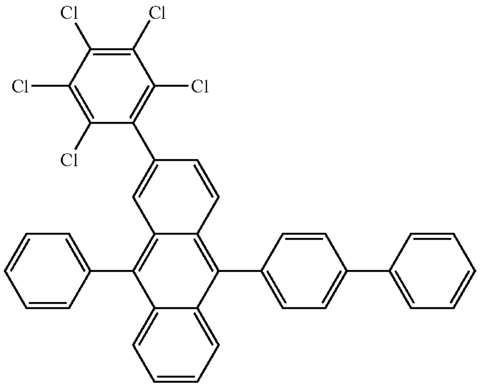
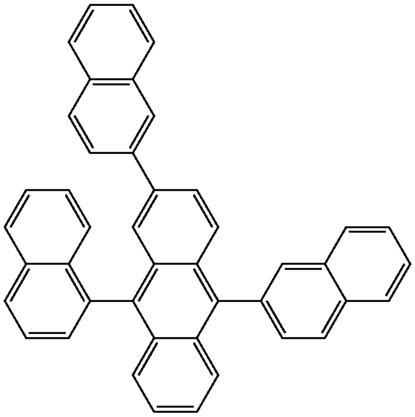
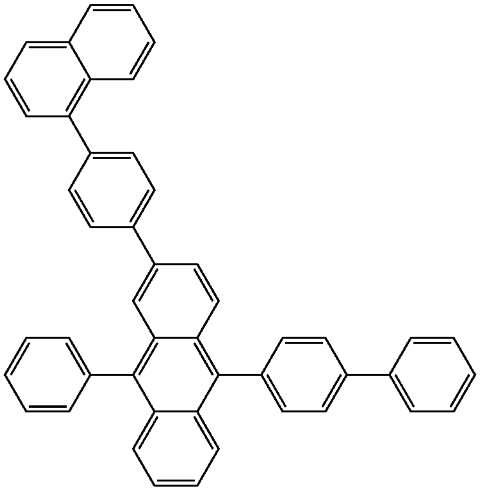
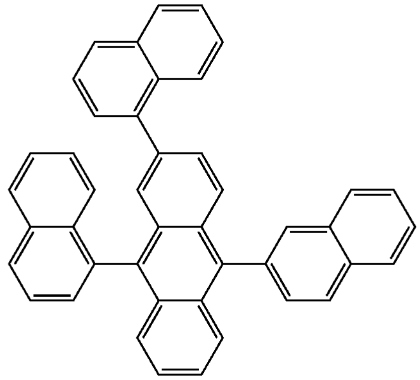

-continued
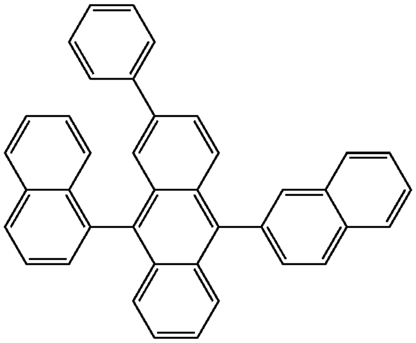
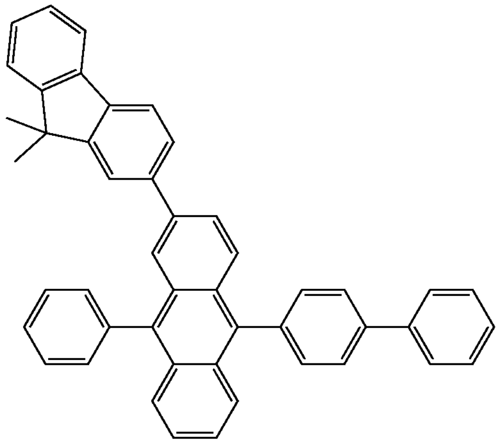
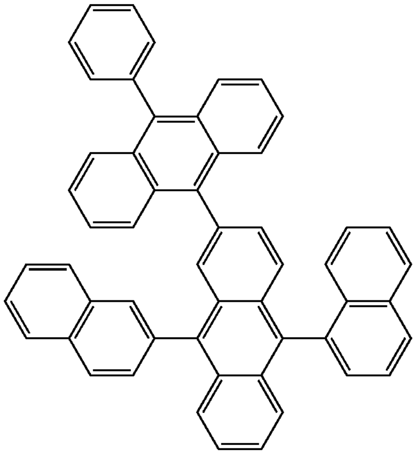
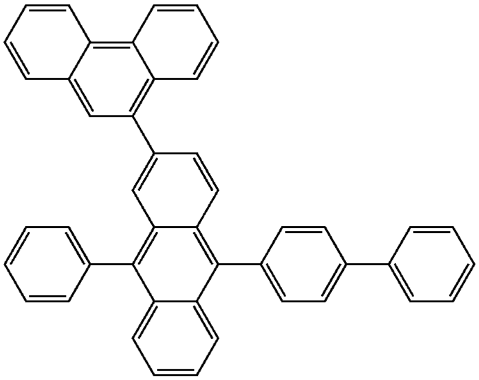
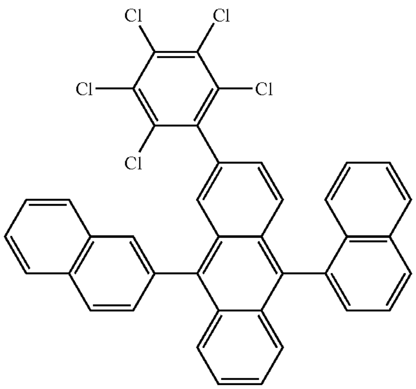
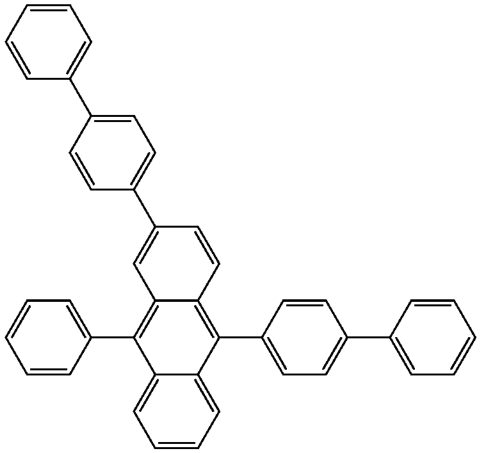

-continued
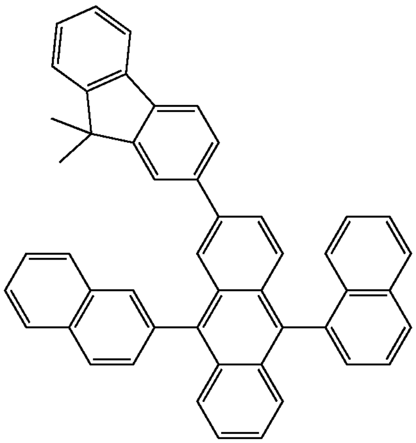
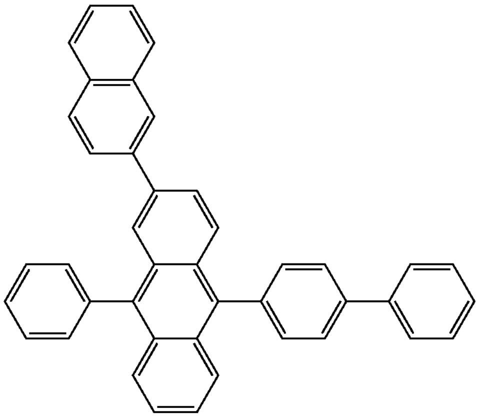
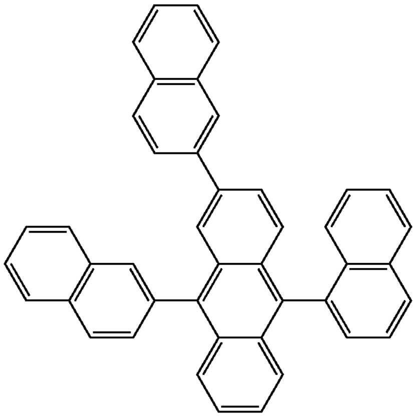
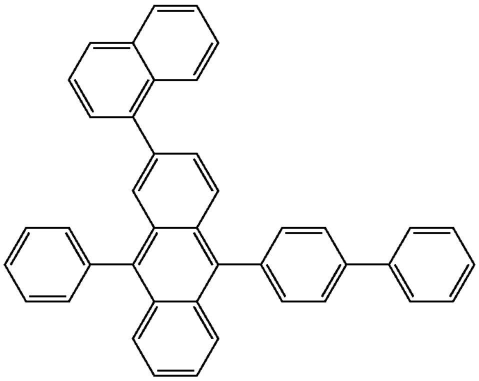
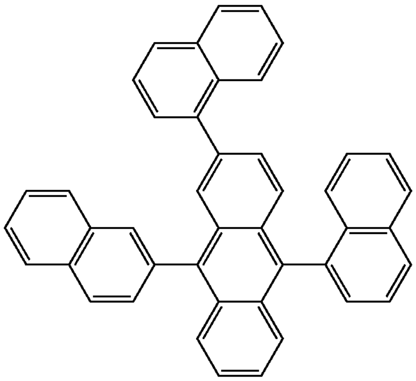
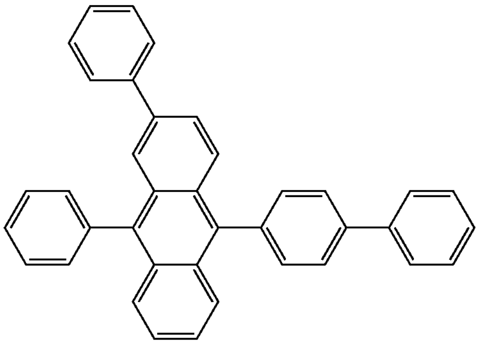
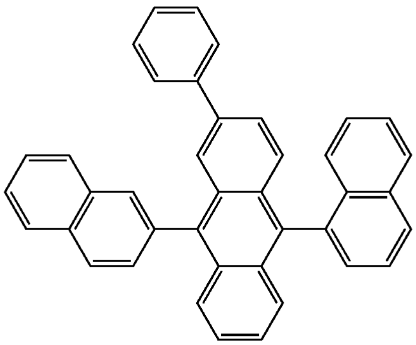
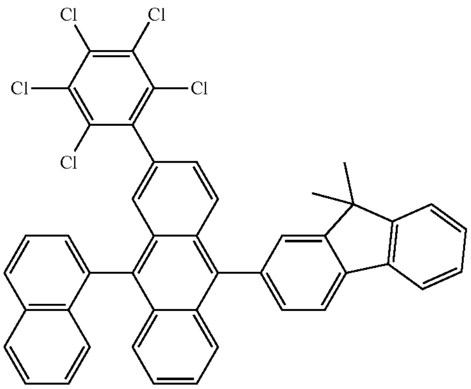

-continued
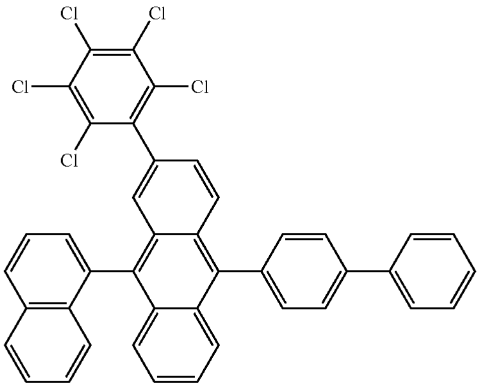
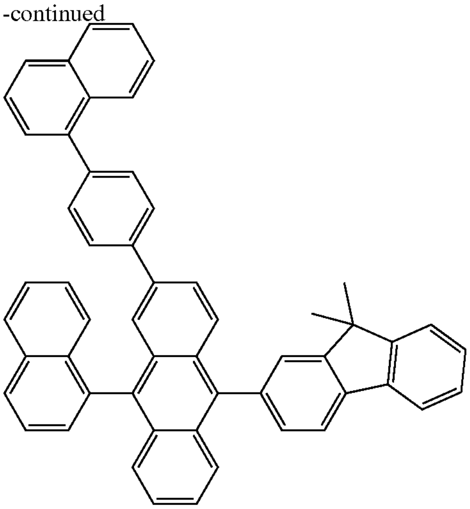
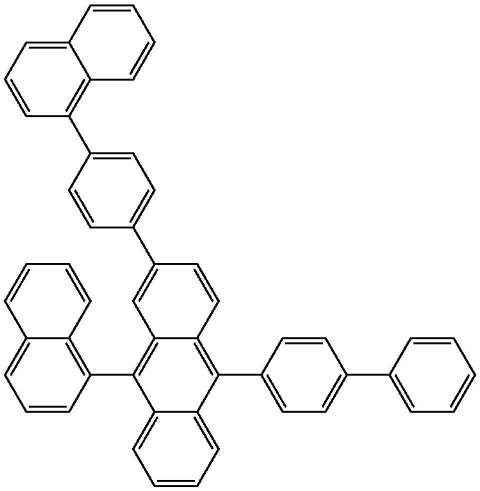
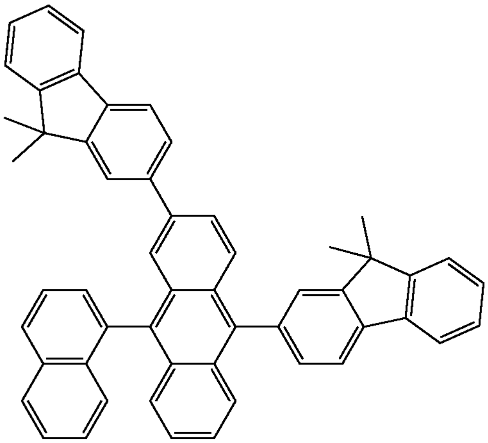
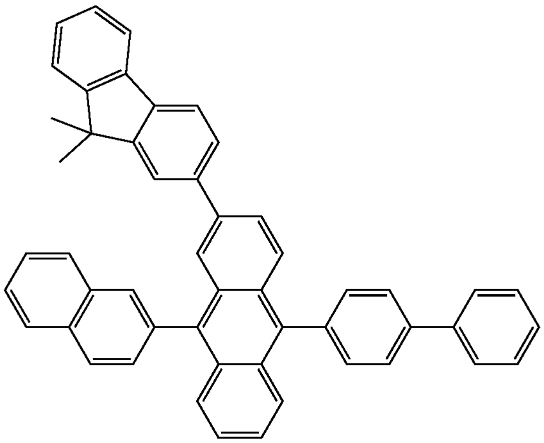
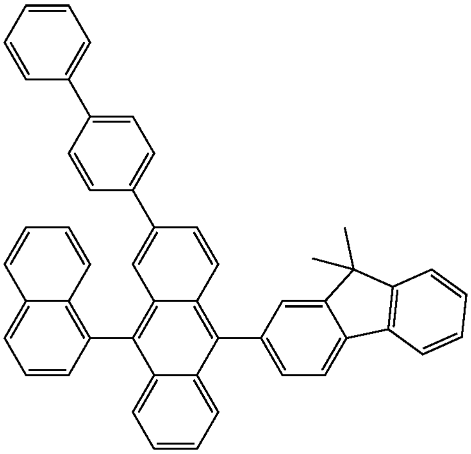

-continued
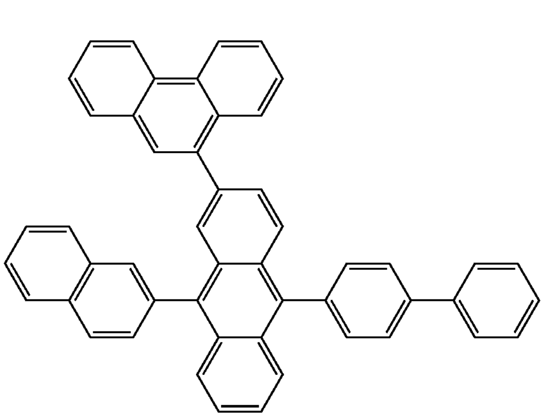
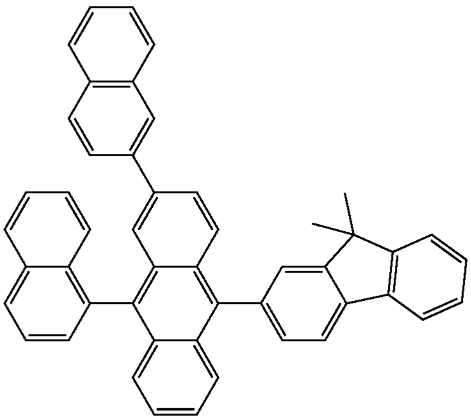
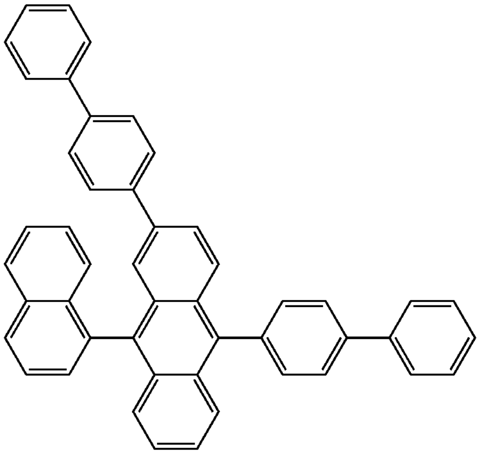
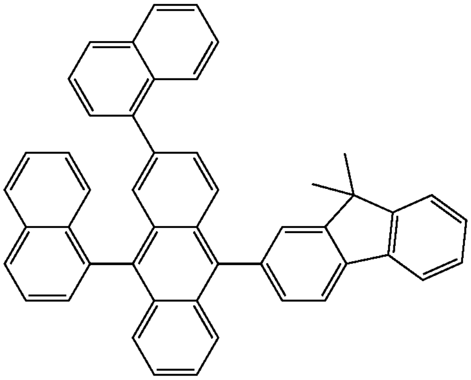
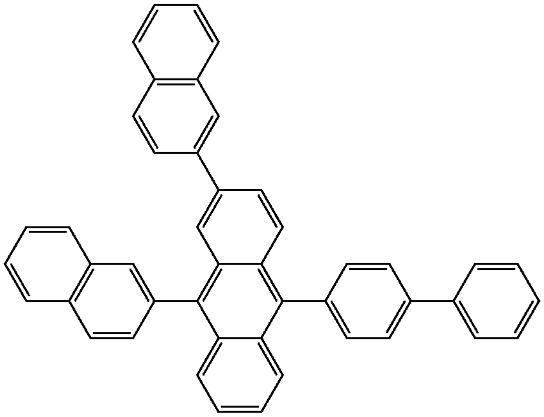
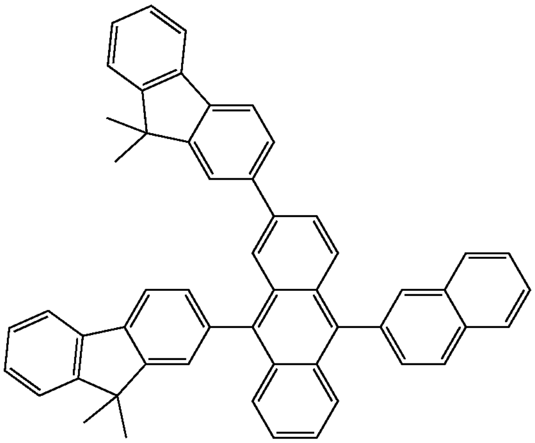
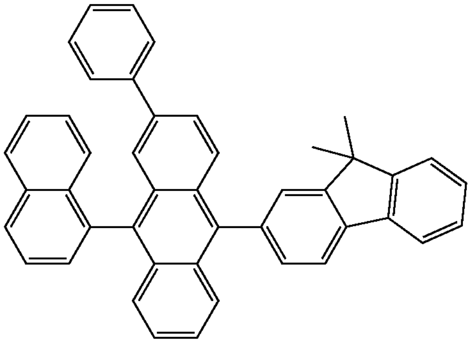
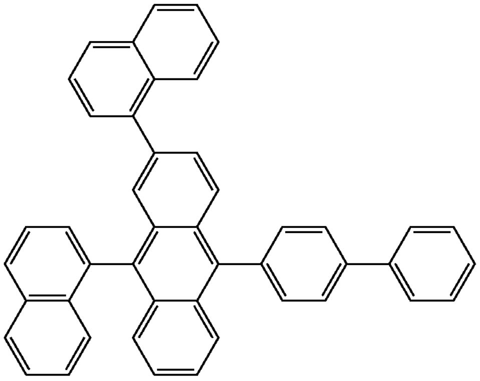

-continued
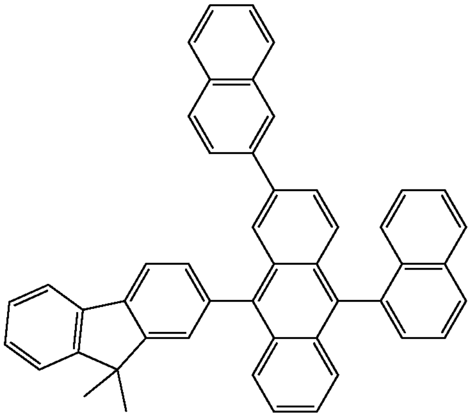
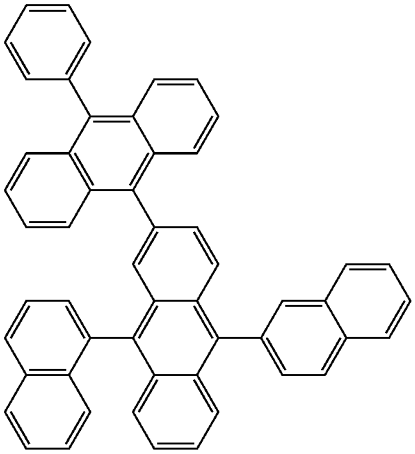
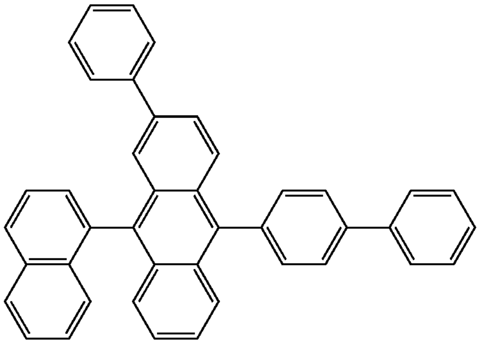
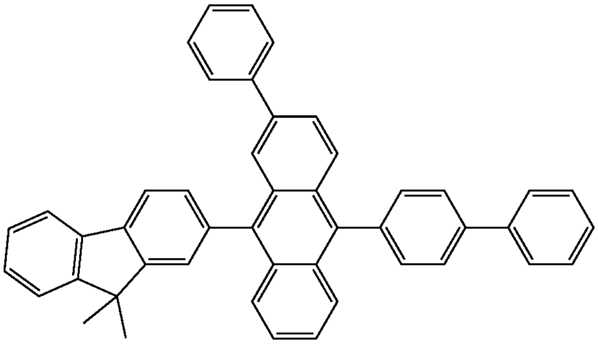
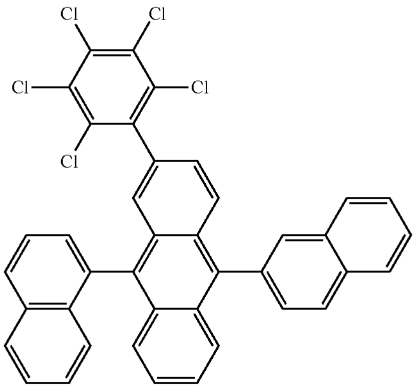
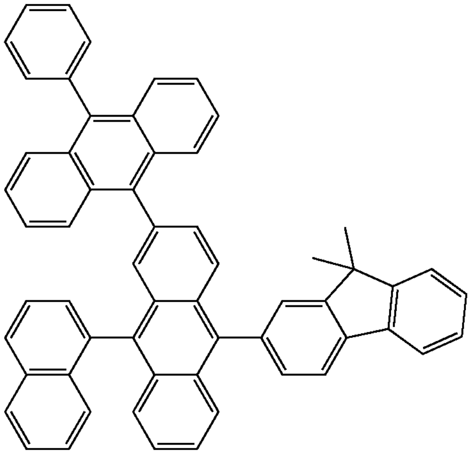
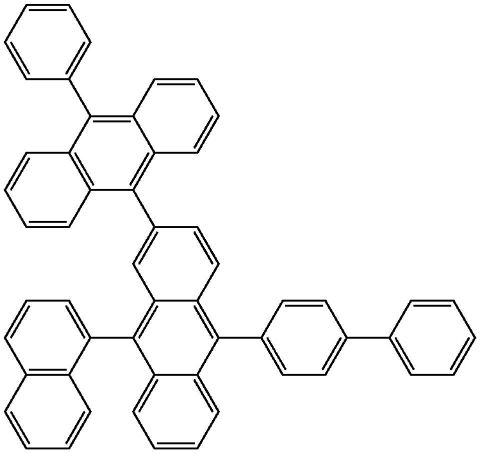
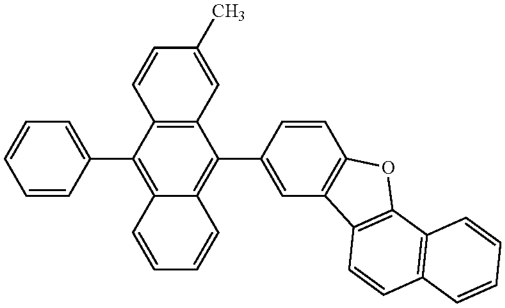

-continued
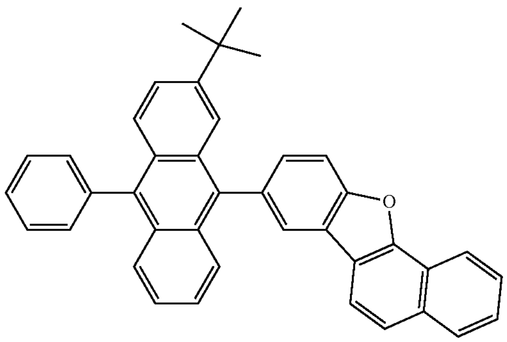
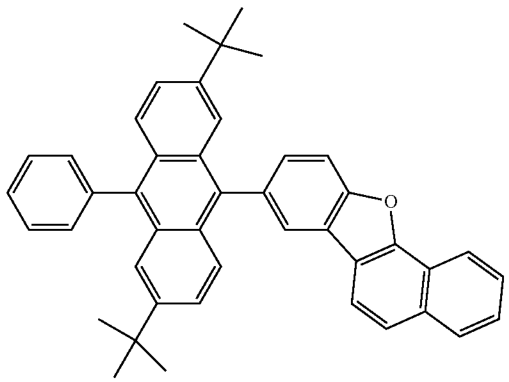
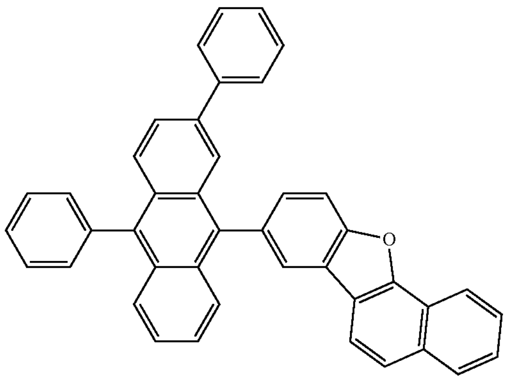
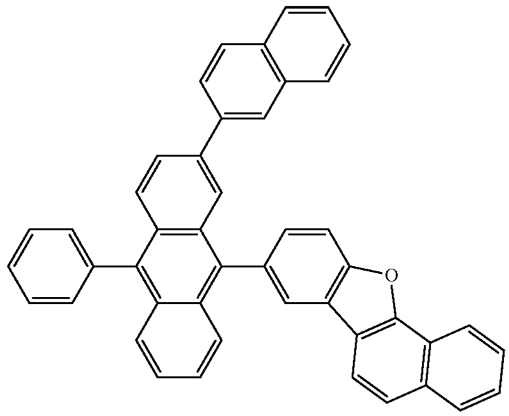
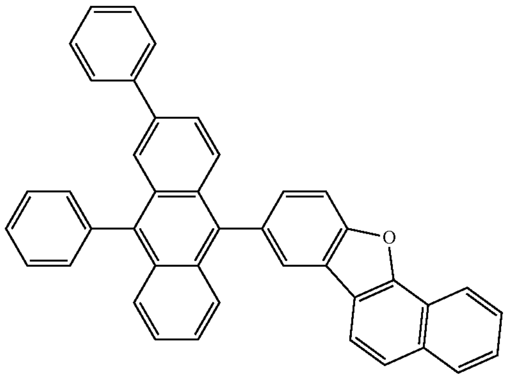
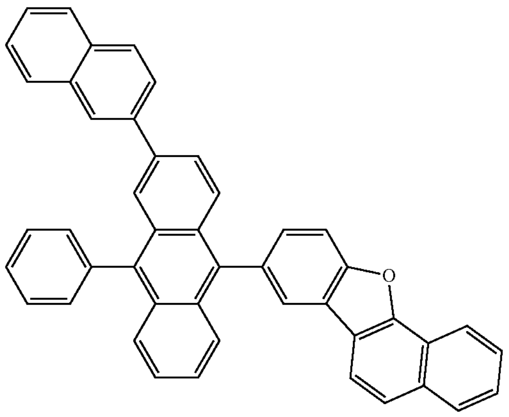
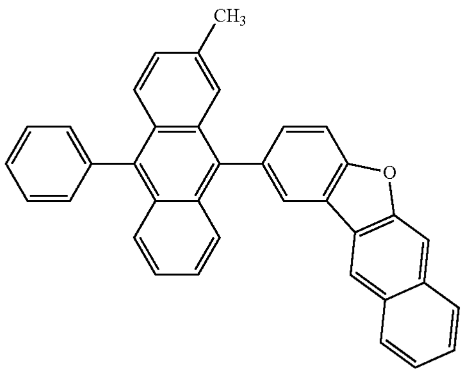
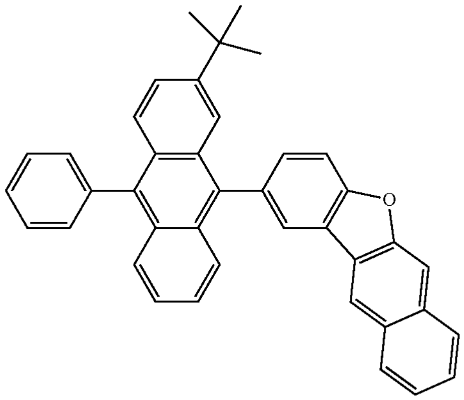

-continued

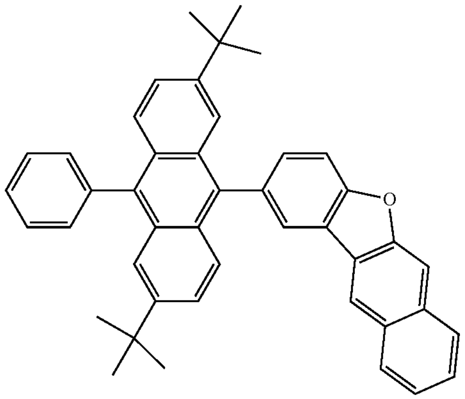

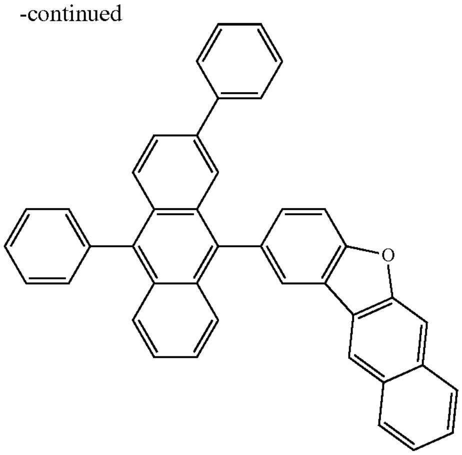

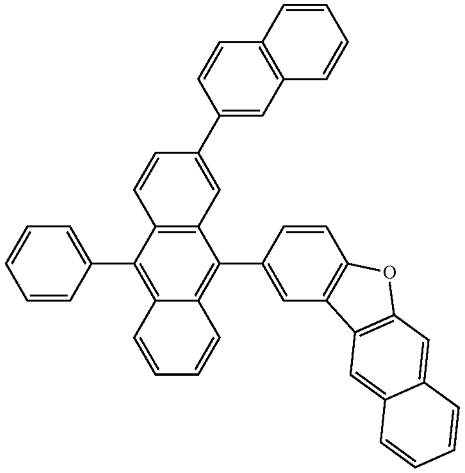

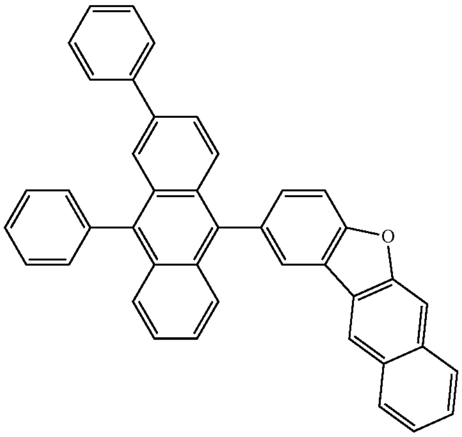

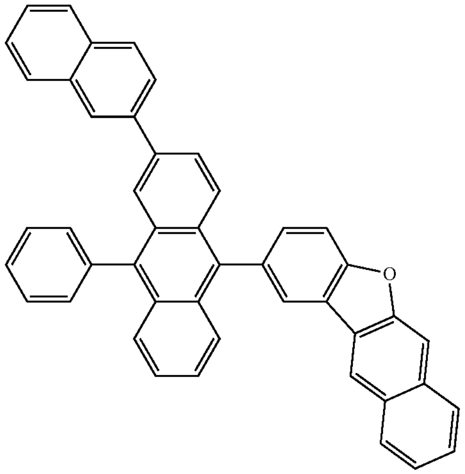

In the case that the emitting layer comprises the compound represented by formula (I) as a dopant and at least one host, wherein preferred hosts are mentioned above, and the hose is more preferably at least one compound represented by formula (10), the content of the at least one compound represented by formula (I) is preferably 0.5 mass % to 70 mass %, more preferably 0.5 to 30 mass %, further preferably 1 to 30 mass %, still further preferably 1 to 20 mass %, and particularly preferably 1 to 10 mass %, further particularly preferably 1 to 5 mass %, relative to the entire mass of the emitting layer.

The content of the at least one host, wherein preferred hosts are mentioned above, preferably the at least one compound represented by formula (10) is preferably 30 mass % to 99.9 mass %, more preferably 70 to 99.5 mass %, further preferably 70 to 99 mass %, still further preferably 80 to 99 mass %, and particularly preferably 90 to 99 mass %, further particularly preferably 95 to 99 mass %, relative to the entire mass of the emitting layer.

An Explanation Will be Made on the Layer Configuration of the Organic EL Device According to One Aspect of the Invention.

An organic EL device according to one aspect of the invention comprises a cathode, an anode, and one or more organic thin film layers comprising an emitting layer disposed between the cathode and the anode. The organic layer comprises at least one layer composed of an organic compound. Alternatively, the organic layer is formed by laminating a plurality of layers composed of an organic compound. The organic layer may further comprise an inorganic compound in addition to the organic compound.

At least one of the organic layers is an emitting layer. The organic layer may be constituted, for example, as a single emitting layer, or may comprise other layers which can be adopted in the layer structure of the organic EL device. The layer that can be adopted in the layer structure of the organic EL device is not particularly limited, but examples thereof include a hole-transporting zone (comprising at least one hole-transporting layer and preferably in addition at least one of a hole-injecting layer, an electron-blocking layer, an exciton-blocking layer, etc.), an emitting layer, a spacing layer, and an electron-transporting zone (comprising at least one electron-transporting layer and preferably in addition at least one of an electron-injecting layer, a hole-blocking layer, etc.) provided between the cathode and the emitting layer.

The organic EL device according to one aspect of the invention may be, for example, a fluorescent or phosphorescent monochromatic light emitting device or a fluorescent/phosphorescent hybrid white light emitting device. Preferably, the organic EL device is a fluorescent monochromatic light emitting device, more preferably a blue fluorescent monochromatic light emitting device or a fluorescent/phosphorescent hybrid white light emitting device. Blue fluorescence means a fluorescence at 400 to 500 nm (peak maximum), preferably at 430 nm to 490 nm (peak maximum).

Further, it may be a simple type device having a single emitting unit or a tandem type device having a plurality of emitting units.

The "emitting unit" in the specification is the smallest unit that comprises organic layers, in which at least one of the organic layers is an emitting layer and light is emitted by recombination of injected holes and electrons.

In addition, the "emitting layer" described in the present specification is an organic layer having an emitting function. The emitting layer is, for example, a phosphorescent emitting layer, a fluorescent emitting layer or the like, preferably a fluorescent emitting layer, more preferably a blue fluorescent emitting layer, and may be a single layer or a stack of a plurality of layers.

The emitting unit may be a stacked type unit having a plurality of phosphorescent emitting layers or fluorescent emitting layers. In this case, for example, a spacing layer for preventing excitons generated in the phosphorescent emitting layer from diffusing into the fluorescent emitting layer may be provided between the respective light-emitting layers.

As the simple type organic EL device, a device configuration such as anode/emitting unit/cathode can be given.

Examples for representative layer structures of the emitting unit are shown below. The layers in parentheses are provided arbitrarily.

(a) (Hole-injecting layer/) Hole-transporting layer/Fluorescent emitting layer (/Electron-transporting layer/Electron-injecting layer)
(b) (Hole-injecting layer/) Hole-transporting layer/Phosphorescent emitting layer (/Electron-transporting layer/Electron-injecting layer)
(c) (Hole-injecting layer/) Hole-transporting layer/First fluorescent emitting layer/Second fluorescent emitting layer (/Electron-transporting layer/Electron-injecting layer)
(d) (Hole-injecting layer/) Hole-transporting layer/First phosphorescent layer/Second phosphorescent layer (/Electron-transporting layer/Electron-injecting layer)
(e) (Hole-injecting layer/) Hole-transporting layer/Phosphorescent emitting layer/Spacing layer/Fluorescent emitting layer (/Electron-transporting layer/Electron-injecting layer)
(f) (Hole-injecting layer/) Hole-transporting layer/First phosphorescent emitting layer/Second phosphorescent emitting layer/Spacing layer/Fluorescent emitting layer (/Electron-transporting layer/Electron-injecting layer)
(g) (Hole-injecting layer/) Hole-transporting layer/First phosphorescent layer/Spacing layer/Second phosphorescent emitting layer/Spacing layer/Fluorescent emitting layer (/Electron-transporting layer/Electron-injecting layer)
(h) (Hole-injecting layer/) Hole-transporting layer/Phosphorescent emitting layer/Spacing layer/First fluorescent emitting layer/Second fluorescent emitting layer (/Electron-transporting Layer/Electron-injecting Layer)
(i) (Hole-injecting layer/) Hole-transporting layer/Electron-blocking layer/Fluorescent emitting layer (/Electron-transporting layer/Electron-injecting layer)
(j) (Hole-injecting layer/) Hole-transporting layer/Electron-blocking layer/Phosphorescent emitting layer (/Electron-transporting layer/Electron-injecting layer)
(k) (Hole-injecting layer/) Hole-transporting layer/Exciton-blocking layer/Fluorescent emitting layer (/Electron-transporting layer/Electron-injecting layer)
(I) (Hole-injecting layer/) Hole-transporting layer/Exciton-blocking layer/Phosphorescent emitting layer (/Electron-transporting layer/Electron-injecting layer)
(m) (Hole-injecting layer/) First hole-transporting Layer/Second hole-transporting Layer/Fluorescent emitting layer (/Electron-transporting layer/electron-injecting Layer)
(n) (Hole-injecting layer/) First hole-transporting layer/Second hole-transporting layer/Fluorescent emitting layer (/First electron-transporting layer/Second electron-transporting layer/Electron-injection layer)
(o) (Hole-injecting layer/) First hole-transporting layer/Second hole-transporting layer/Phosphorescent emitting layer (/Electron-transporting layer/Electron-injecting Layer)
(p) (Hole-injecting layer/) First hole-transporting layer/Second hole-transporting layer/Phosphorescent emitting layer (/First electron-transporting Layer/Second electron-transporting layer/Electron-injecting layer)
(q) (Hole-injecting layer/) Hole-transporting layer/Fluorescent emitting layer/Hole-blocking layer (/Electron-transporting layer/Electron-injecting layer)

(r) (Hole-injecting layer/) Hole-transporting layer/Phosphorescent emitting layer/Hole-blocking layer (/Electron-transport layer/Electron-injecting layer)

(s) (Hole-injecting layer/) Hole-transporting layer/Fluorescent emitting layer/Exciton-blocking layer (/Electron-transporting layer/Electron-injecting layer)

(t) (Hole-injecting layer/) Hole-transporting layer/Phosphorescent emitting layer/Exciton-blocking layer (/Electron-transporting layer/Electron-injecting layer)

The layer structure of the organic EL device according to one aspect of the invention is not limited to the examples mentioned above.

For example, when the organic EL device has a hole-injecting layer and a hole-transporting layer, it is preferred that a hole-injecting layer be provided between the hole-transporting layer and the anode. Further, when the organic EL device has an electron-injecting layer and an electron-transporting layer, it is preferred that an electron-injecting layer be provided between the electron-transporting layer and the cathode. Further, each of the hole-injecting layer, the hole-transporting layer, the electron-transporting layer and the electron-injecting layer may be formed of a single layer or be formed of a plurality of layers.

The plurality of phosphorescent emitting layer, and the plurality of the phosphorescent emitting layer and the fluorescent emitting layer may be emitting layers that emit mutually different colors. For example, the emitting unit (f) may include a hole-transporting layer/first phosphorescent layer (red light emission)/second phosphorescent emitting layer (green light emission)/spacing layer/fluorescent emitting layer (blue light emission)/electron-transporting layer.

An electron-blocking layer may be provided between each light emitting layer and the hole-transporting layer or the spacing layer. Further, a hole-blocking layer may be provided between each emitting layer and the electron-transporting layer. By providing the electron-blocking layer or the hole-blocking layer, it is possible to confine electrons or holes in the emitting layer, thereby to improve the recombination probability of carriers in the emitting layer, and to improve light emitting efficiency.

As a representative device configuration of a tandem type organic EL device, for example, a device configuration such as anode/first emitting unit/intermediate layer/second emitting unit/cathode can be given.

The first emitting unit and the second emitting unit are independently selected from the above-mentioned emitting units, for example.

The intermediate layer is also generally referred to as an intermediate electrode, an intermediate conductive layer, a charge generating layer, an electron withdrawing layer, a connecting layer, a connector layer, or an intermediate insulating layer. The intermediate layer is a layer that supplies electrons to the first emitting unit and holes to the second emitting unit, and can be formed from known materials.

FIG. 1 shows a schematic configuration of one example of the organic EL device of the invention. The organic EL device 1 comprises a substrate 2, an anode 3, a cathode 4 and an emitting unit 10 provided between the anode 3 and the cathode 4. The emitting unit 10 comprises an emitting layer 5 preferably comprising a host material and a dopant. A hole injecting and transporting layer 6 or the like may be provided between the emitting layer 5 and the anode 3 and an electron injecting layer 8 and an electron transporting layer 7 or the like (electron injecting and transporting unit 11) may be provided between the emitting layer 5 and the cathode 4. An electron-barrier layer may be provided on the anode 3 side of the emitting layer 5 and a hole-barrier layer may be provided on the cathode 4 side of the emitting layer 5. Due to such configuration, electrons or holes can be confined in the emitting layer 5, whereby possibility of generation of excitons in the emitting layer 5 can be improved.

Hereinbelow, an Explanation Will be Made on Function, Materials, Etc. Of Each Layer Constituting the Organic EL Device Described in the Present Specification.

(Substrate)

The substrate is used as a support of the organic EL device. The substrate preferably has a light transmittance of 50% or more in the visible light region with a wavelength of 400 to 700 nm, and a smooth substrate is preferable. Examples of the material of the substrate include soda-lime glass, aluminosilicate glass, quartz glass, plastic and the like. As a substrate, a flexible substrate can be used. The flexible substrate means a substrate that can be bent (flexible), and examples thereof include a plastic substrate and the like. Specific examples of the material for forming the plastic substrate include polycarbonate, polyallylate, polyether sulfone, polypropylene, polyester, polyvinyl fluoride, polyvinyl chloride, polyimide, polyethylene naphthalate and the like. Also, an inorganic vapor deposited film can be used.

(Anode)

As the anode, for example, it is preferable to use a metal, an alloy, a conductive compound, a mixture thereof or the like and having a high work function (specifically, 4.0 eV or more). Specific examples of the material of the anode include indium oxide-tin oxide (ITO: Indium Tin Oxide), indium oxide-tin oxide containing silicon or silicon oxide, indium oxide-zinc oxide, indium oxide containing tungsten oxide or zinc oxide, graphene and the like. In addition, it is also possible to use gold, silver, platinum, nickel, tungsten, chromium, molybdenum, iron, cobalt, copper, palladium, titanium, and nitrides of these metals (e.g. titanium oxide).

The anode is normally formed by depositing these materials on the substrate by a sputtering method. For example, indium oxide-zinc oxide can be formed by a sputtering method by using a target in which 1 to 10 mass % zinc oxide is added relative to indium oxide. Further, indium oxide containing tungsten oxide or zinc oxide can be formed by a sputtering method by using a target in which 0.5 to 5 mass % of tungsten oxide or 0.1 to 1 mass % of zinc oxide is added relative to indium oxide.

As other methods for forming the anode, a vacuum deposition method, a coating method, an inkjet method, a spin coating method or the like can be given. When silver paste or the like is used, it is possible to use a coating method, an inkjet method or the like.

The hole-injecting layer formed in contact with the anode is formed by using a material that allows easy hole injection regardless of the work function of the anode. For this reason, in the anode, it is possible to use a common electrode material, e.g. a metal, an alloy, a conductive compound and a mixture thereof. Specifically, a material having a small work function such as alkaline metals such as lithium and cesium; alkaline earth metals such as calcium and strontium; alloys containing these metals (for example, magnesium-silver and aluminum-lithium); rare earth metals such as europium and ytterbium; and an alloy containing rare earth metals.

(Hole-Transporting Layer)/(Hole-Injecting Layer)

The hole-transporting layer is an organic layer that is formed between the emitting layer and the anode, and has a function of transporting holes from the anode to the emitting layer. If the hole-transporting layer is composed of plural layers, an organic layer that is nearer to the anode may often be defined as the hole-injecting layer. The hole-injecting layer has a function of injecting holes efficiently to the organic layer unit from the anode. Said hole injection layer is generally used for stabilizing hole injection from anode to hole transporting layer which is generally consist of organic materials. Organic material having good contact with anode or organic material with p-type doping is preferably used for the hole injection layer.

p-doping usually consists of one or more p-dopant materials and one or more matrix materials. Matrix materials preferably have shallower HOMO level and p-dopant preferably have deeper LUMO level to enhance the carrier density of the layer. Specific examples for p-dopants are the below mentioned acceptor materials. Suitable matrix materials are the hole transport materials mentioned below, preferably aromatic or heterocyclic amine compounds.

Acceptor materials, or fused aromatic hydrocarbon materials or fused heterocycles which have high planarity, are preferably used as p-dopant materials for the hole injection layer. Specific examples for acceptor materials are, quinone compounds with one or more electron withdrawing groups, such as $F_4TCNQ$ (2,3,5,6-tetrafluoro-7,7,8,8-tetracyanoquinodimethane), and 1,2,3-tris[(cyano)(4-cyano-2,3,5,6-tetrafluorophenyl)methylene]cyclopropane; hexa-azatriphenylene compounds with one or more electron withdrawing groups, such as hexa-azatriphenylene-hexanitrile; aromatic hydrocarbon compounds with one or more electron withdrawing groups; and aryl boron compounds with one or more electron withdrawing groups. Preferred p-dopants are quinone compounds with one or more electron withdrawing groups, such as $F_4TCNQ$, 1,2,3-Tris[(cyano)(4-cyano-2,3,5,6-tetrafluorophenyl)methylene]cyclopropane.

The ratio of the p-type dopant is preferably less than 20% of molar ratio, more preferably less than 10%, such as 1%, 3%, or 5%, related to the matrix material.

The hole transporting layer is generally used for injecting and transporting holes efficiently, and aromatic or heterocyclic amine compounds are preferably used.

Specific examples for compounds for the hole transporting layer are represented by the general formula (H),

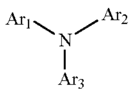

(H)

wherein $Ar_1$ to $Ar_3$ each independently represents substituted or unsubstituted aryl group having 5 to 50 carbon atoms or substituted or unsubstituted heterocyclic group having 5 to 50 cyclic atoms, preferably phenyl group, biphenyl group, terphenyl group, naphthyl group, phenanthryl group, triphenylenyl group, fluorenyl group, spirobifluorenyl group, indenofluorenyl group, carbazolyl group, dibenzofuranyl group, dibenzothiophenyl group, carbazole substituted aryl group, dibenzofuran substituted aryl group or dibenzothiophene substituted aryl group; two or more substituents selected among $Ar^1$ to $Ar^3$ may be bonded to each other to form a ring structure, such as a carbazole ring structure, or a acridane ring structure.

Preferably, at least one of $Ar_1$ to $Ar_3$ have additional one aryl or heterocyclic amine substituent, more preferably $Ar_1$ has an additional aryl amino substituent, at the case of that it is preferable that $Ar_1$ represents substituted or unsubstituted biphenylene group, substituted or unsubstituted fluorenylene group. Specific examples for the hole transport material are

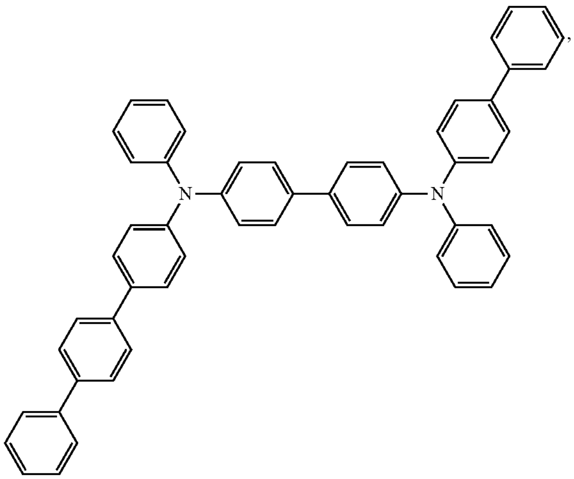

,

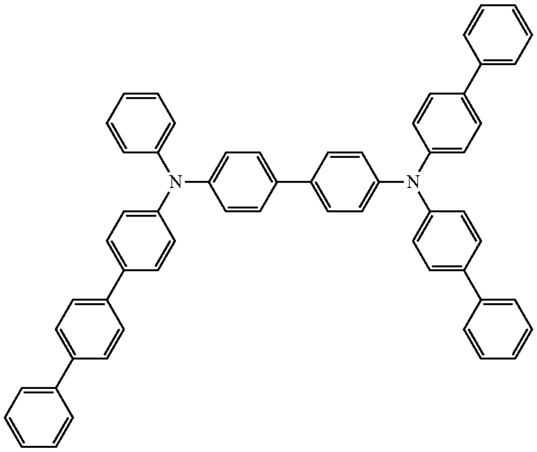

and

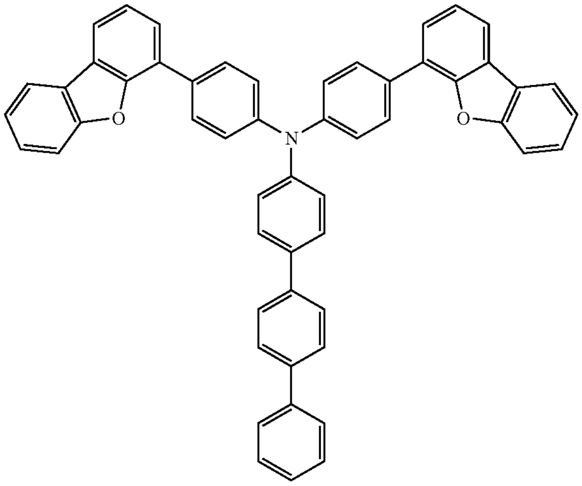

and the like.

A second hole transporting layer is preferably inserted between the first hole transporting layer and the emitting layer to enhance device performance by blocking excess electrons or excitons. Specific examples for second hole transporting layer are the same as for the first hole transporting layer. It is preferred that second hole transporting layer has higher triplet energy to block triplet excitons, especially for phosphorescent devices, such as bicarbazole compounds, biphenylamine compounds, triphenylenyl amine compounds, fluorenyl amine compounds, carbazole substituted arylamine compounds, dibenzofuran substituted arylamine compounds, and dibenzothiophene substituted arylamine compounds.

(Emitting Layer)

The emitting layer is a layer containing a substance having a high emitting property (emitter material or dopant material). As the dopant material, various materials can be used. For example, a fluorescent emitting compound (fluorescent dopant), a phosphorescent emitting compound (phosphorescent dopant) or the like can be used. A fluorescent emitting compound is a compound capable of emitting light from the singlet excited state, and an emitting layer containing a fluorescent emitting compound is called a fluorescent emitting layer. Further, a phosphorescent emitting compound is a compound capable of emitting light from the triplet excited state, and an emitting layer containing a phosphorescent emitting compound is called a phosphorescent emitting layer.

Preferably, the emitting layer in the organic EL device of the present application comprises a compound of formula (I) as a dopant material.

The emitting layer preferably comprises at least one dopant material and at least one host material that allows it to emit light efficiently. In some literatures, a dopant material is called a guest material, an emitter or an emitting material. In some literatures, a host material is called a matrix material.

A single emitting layer may comprise plural dopant materials and plural host materials. Further, plural emitting layers may be present.

In the present specification, a host material combined with the fluorescent dopant is referred to as a "fluorescent host" and a host material combined with the phosphorescent dopant is referred to as the "phosphorescent host". Note that the fluorescent host and the phosphorescent host are not classified only by the molecular structure. The phosphorescent host is a material for forming a phosphorescent emitting layer containing a phosphorescent dopant, but does not mean that it cannot be used as a material for forming a fluorescent emitting layer. The same can be applied to the fluorescent host.

In one embodiment, it is preferred that the emitting layer comprises the compound represented by formula (I) according to the present invention (hereinafter, these compounds may be referred to as the "compound (I)"). More preferably, it is contained as a dopant material. Further, it is preferred that the compound (I) be contained in the emitting layer as a fluorescent dopant. Even further, it is preferred that the compound (I) be contained in the emitting layer as a blue fluorescent dopant.

In one embodiment, no specific restrictions are imposed on the content of the compound (I) as the dopant material in the emitting layer. In respect of sufficient emission and concentration quenching, the content is preferably 0.5 to 70 mass %, more preferably 0.8 to 30 mass %, further preferably 1 to 30 mass %, still further preferably 1 to 20 mass %, and particularly preferably 1 to 10 mass %, further particularly preferably 1 to 5 mass %, even further particularly preferably 2 to 4 mass %, related to the mass of the emitting layer.

(Fluorescent Dopant)

As a fluorescent dopant other than the compound (1), a fused polycyclic aromatic compound, a styrylamine compound, a fused ring amine compound, a boron-containing compound, a pyrrole compound, an indole compound, a carbazole compound can be given, for example. Among these, a fused ring amine compound, a boron-containing compound, carbazole compound is preferable.

As the fused ring amine compound, a diaminopyrene compound, a diaminochrysene compound, a diaminoanthracene compound, a diaminofluorene compound, a diaminofluorene compound with which one or more benzofuro skeletons are fused, or the like can be given.

As the boron-containing compound, a pyrromethene compound, a triphenylborane compound or the like can be given.

As a blue fluorescent dopant, pyrene compounds, styrylamine compounds, chrysene compounds, fluoranthene compounds, fluorene compounds, diamine compounds, triarylamine compounds and the like can be given, for example. Specifically, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenyamine (abbreviation: YGAPA), 4-(10-phenyl-9-anthryl)-4'-(9-phenyl-9H-carbazole-3-yl)triphenylamine (abbreviation: PCBAPA) or the like can be given.

As a green fluorescent dopant, an aromatic amine compound or the like can be given, for example. Specifically, N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazole-9-yl)phenyl]-N-phenylanthracene-2-amine (abbreviation: 2YGABPhA), N,N,9-triphenylanthracene-9-amine (abbreviation: DPhAPhA) or the like can be given, for example.

As a red fluorescent dopant, a tetracene compound, a diamine compound or the like can be given. Specifically, N,N,N',N'-tetrakis(4-methylphenyl)tetracene-5,11-diamine (abbreviation: pmPhTD), 7,14-diphenyl-N,N,N',N'-tetrakis (4-methylphenyl)acenaphtho[1,2-a]fluoranthene-3,10-diamine (abbreviation: p-mPhAFD) or the like can be given.

(Phosphorescent Dopant)

As a phosphorescent dopant, a phosphorescent emitting heavy metal complex and a phosphorescent emitting rare earth metal complex can be given.

As the heavy metal complex, an iridium complex, an osmium complex, a platinum complex or the like can be given. The heavy metal complex is for example an ortho-metalated complex of a metal selected from iridium, osmium and platinum.

Examples of rare earth metal complexes include terbium complexes, europium complexes and the like. Specifically, tris(acetylacetonate)(monophenanthroline)terbium(III) (abbreviation: $Tb(acac)_3(Phen)$), tris(1,3-diphenyl-1,3-propandionate)(monophenanthroline)europium(III) (abbreviation: $Eu(DBM)_3(Phen)$), tris[1-(2-thenoyl)-3,3,3-trifluoroacetonate](monophenanthroline)europium(III) (abbreviation: Eu(TTA) (Phen)) or the like can be given. These rare earth metal complexes are preferable as phosphorescent dopants since rare earth metal ions emit light due to electronic transition between different multiplicity.

As a blue phosphorescent dopant, an iridium complex, an osmium complex, a platinum complex, or the like can be given, for example. Specifically, bis[2-(4',6'-difluorophenyl) pyridinate-N,C2']iridium(III) tetrakis(1-pyrazolyl)borate (abbreviation: Flr6), bis[2-(4',6'-difluorophenyl)pyridinato-N,C2]iridium(III) picolinate (abbreviation: $Ir(CF_3ppy)_2$ (pic)), bis[2-(4',6'-difluorophenyl)pyridinato-N,C2']iridium (III) acetylacetonate (abbreviation: FIracac) or the like can be given.

As a green phosphorescent dopant, an iridium complex or the like can be given, for example. Specifically, tris(2-phenylpyridinato-N,C2') iridium(III) (abbreviation: $Ir(ppy)_3$), bis(1,2-diphenyl-1H-benzimidazolato)iridium (III) acetylacetonate (abbreviation: $Ir(pbi)_2(acac)$), bis(benzo[h]quinolinato)iridium(III) acetylacetonate (abbreviation: $Ir(bzq)_2(acac)$) or the like can be given.

As a red phosphorescent dopant, an iridium complex, a platinum complex, a terbium complex, a europium complex or the like can be given. Specifically, bis[2-(2'-benzo[4,5-a] thienyl)pyridinato-N,C3']iridium(III) acetylacetonate (abbreviation: $Ir(btp)_2(acac)$), bis(1-phenylisoquinolinato-N, C2')iridium(III) acetylacetonate (abbreviation: $Ir(piq)_2(acac)$), (acetylacetonato)bis[2,3-bis(4-fluorophenyl) quinoxalinato]iridium(I) (abbreviation: $Ir(Fdpq)_2(acac)$), 2,3,7,8,12,13,17,18-octaethyl-21H,23H-porphyrin platinum (II) (abbreviation PtOEP) or the like can be given.

As mentioned above, the emitting layer preferably comprises at least one compound (1) as a dopant.

(Host Material)

As host material, metal complexes such as aluminum complexes, beryllium complexes and zinc complexes; heterocyclic compounds such as indole compounds, pyridine compounds, pyrimidine compounds, triazine compounds, quinoline compounds, isoquinoline compounds, quinazoline compounds, dibenzofuran compounds, dibenzothiophene compounds, oxadiazole compounds, benzimidazole compounds, phenanthroline compounds; fused polyaromatic hydrocarbon (PAH) compounds such as a naphthalene compound, a triphenylene compound, a carbazole compound, an anthracene compound, a phenanthrene compound, a pyrene compound, a chrysene compound, a naphthacene compound, a fluoranthene compound; and aromatic amine compound such as triarylamine compounds and fused polycyclic aromatic amine compounds can be given, for example. Plural types of host materials can be used in combination.

As a fluorescent host, a compound having a higher singlet energy level than a fluorescent dopant is preferable. For example, a heterocyclic compound, a fused aromatic compound or the like can be given. As a fused aromatic compound, an anthracene compound, a pyrene compound, a chrysene compound, a naphthacene compound or the like are preferable. An anthracene compound is preferentially used as blue fluorescent host In the case that compound (I) is employed as at least one dopant material, preferred host materials are substituted or unsubstituted polyaromatic hydrocarbon (PAH) compounds, substituted or unsubstituted polyheteroaromatic compounds, substituted or unsubstituted anthracene compounds, or substituted or unsubstituted pyrene compounds, preferably substituted or unsubstituted anthracene compounds or substituted or unsubstituted pyrene compounds, more preferably substituted or unsubstituted anthracene compounds, most preferably anthracene compounds represented by formula (10), as mentioned above.

As a phosphorescent host, a compound having a higher triplet energy level as compared with a phosphorescent dopant is preferable. For example, a metal complex, a heterocyclic compound, a fused aromatic compound or the like can be given. Among these, an indole compound, a carbazole compound, a pyridine compound, a pyrimidine compound, a triazine compound, a quinolone compound, an isoquinoline compound, a quinazoline compound, a dibenzofuran compound, a dibenzothiophene compound, a naphthalene compound, a triphenylene compound, a phenanthrene compound, a fluoranthene compound or the like can be given.

(Electron-Transporting Layer)/(Electron-Injecting Layer)

The electron-transporting layer is an organic layer that is formed between the emitting layer and the cathode and has a function of transporting electrons from the cathode to the emitting layer. When the electron-transporting layer is formed of plural layers, an organic layer or an inorganic layer that is nearer to the cathode is often defined as the electron injecting layer (see for example layer 8 in FIG. 1, wherein an electron injecting layer 8 and an electron transporting layer 7 form an electron injecting and transporting unit 11). The electron injecting layer has a function of injecting electrons from the cathode efficiently to the organic layer unit Preferred electron injection materials are alkali metal, alkali metal compounds, alkali metal complexes, the alkaline earth metal complexes and the rare earth metal complexes.

According to one embodiment, it is preferred that the electron-transporting layer further comprises one or more layer(s) like a second electron-transporting layer, an electron injection layer to enhance efficiency and lifetime of the device, a hole blocking layer, an exciton blocking layer or a triplet blocking layer.

According to one embodiment, it is preferred that an electron-donating dopant be contained in the interfacial region between the cathode and the emitting unit. Due to such a configuration, the organic EL device can have an increased luminance or a long life. Here, the electron-donating dopant means one having a metal with a work function of 3.8 eV or less. As specific examples thereof, at least one selected from an alkali metal, an alkali metal complex, an alkali metal compound, an alkaline earth metal, an alkaline earth metal complex, an alkaline earth metal compound, a rare earth metal, a rare earth metal complex and a rare earth metal compound or the like can be mentioned.

As the alkali metal, Li (work function: 2.9 eV), Na (work function: 2.36 eV), K (work function: 2.28 eV), Rb (work function: 2.16 eV), Cs (work function: 1.95 eV) and the like can be given. One having a work function of 2.9 eV or less is particularly preferable. Among them, K, Rb and Cs are preferable. Rb or Cs is further preferable. Cs is most preferable. As the alkaline earth metal, Ca (work function: 2.9 eV), Sr (work function: 2.0 eV to 2.5 eV), Ba (work function: 2.52 eV) and the like can be given. One having a work function of 2.9 eV or less is particularly preferable. As the rare-earth metal, Sc, Y, Ce, Tb, Yb and the like can be given. One having a work function of 2.9 eV or less is particularly preferable.

Examples of the alkali metal compound include an alkali oxide such as $Li_2O$, $Cs_2O$ or $K_2O$, and an alkali halide such as LiF, NaF, CsF and KF. Among them, LiF, $Li_2O$ and NaF are preferable. Examples of the alkaline earth metal compound include BaO, SrO, CaO, and mixtures thereof such as $Ba_xSr_{1-x}O$ ($0<x<1$) and $Ba_xCa_{1-x}O$ ($0<x<1$). Among them, BaO, SrO and CaO are preferable. Examples of the rare earth metal compound include $YbF_3$, $ScF_3$, $ScO_3$, $Y_2O_3$, $Ce_2O_3$, $GdF_3$ and $TbF_3$. Among these, $YbF_3$, $ScF_3$ and $TbF_3$ are preferable.

The alkali metal complexes, the alkaline earth metal complexes and the rare earth metal complexes are not particularly limited as long as they contain, as a metal ion, at least one of alkali metal ions, alkaline earth metal ions, and rare earth metal ions. Meanwhile, preferred examples of the ligand include, but are not limited to, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfluborane, bipyridyl, phenanthroline, phthalocyanine, porphyrin, cyclopentadiene, β-diketones, and azomethines.

Regarding the addition form of the electron-donating dopant, it is preferred that the electron-donating dopant be formed in a shape of a layer or an island in the interfacial region. A preferred method for the formation is a method in which an organic compound (a light emitting material or an electron-injecting material) for forming the interfacial region is deposited simultaneously with deposition of the electron-donating dopant by a resistant heating deposition method, thereby dispersing the electron-donating dopant in the organic compound.

In a case where the electron-donating dopant is formed into the shape of a layer, the light-emitting material or electron-injecting material which serves as an organic layer in the interface is formed into the shape of a layer. After that, a reductive dopant is solely deposited by the resistant heating deposition method to form a layer preferably having a thickness of from 0.1 nm to 15 nm. In a case where the electron-donating dopant is formed into the shape of an island, the emitting material or the electron-injecting material which serves as an organic layer in the interface is formed into the shape of an island. After that, the electron-donating dopant is solely deposited by the resistant heating deposition method to form an island preferably having a thickness of from 0.05 nm to 1 nm. As the electron-transporting material used in the electron-transporting layer other than a compound of the formula (I), an aromatic heterocyclic compound having one or more hetero atoms in the molecule may preferably be used. In particular, a nitrogen-containing heterocyclic compound is preferable.

According to one embodiment, it is preferable that the electron-transporting layer comprises a nitrogen-containing heterocyclic metal chelate.

According to the other embodiment, it is preferable that the electron-transporting layer comprises a substituted or unsubstituted nitrogen containing heterocyclic compound. Specific examples of preferred heterocyclic compounds for the electron-transporting layer are, 6-membered azine compounds; such as pyridine compounds, pyrimidine compounds, triazine compounds, pyrazine compounds, preferably pyrimidine compounds or triazine compounds; 6-membered fused azine compounds, such as quinolone compounds, isoquinoline compounds, quinoxaline compounds, quinazoline compounds, phenanthroline compounds, benzoquinoline compounds, benzoisoquinoline compounds, dibenzoquinoxaline compounds, preferably quinolone compounds, isoquinoline compounds, phenanthroline compounds; 5-membered heterocyclic compounds, such as imidazole compounds, oxazole compounds, oxadiazole compounds, triazole compounds, thiazole compounds, thiadiazole compounds; fused imidazole compounds, such as benzimidazole compounds, imidazopyridine compounds, naphthoimidazole compounds, benzimidazophenanthridine compounds, benzimidzobenzimidazole compounds, preferably benzimidazole compounds, imidazopyridine compounds or benzimidazophenanthridine compounds.

According to another embodiment, it is preferable the electron-transporting layer comprises a phosphine oxide compound represented as $Ar_{p1}Ar_{p2}Ar_{p3}P{=}O$.

$Ar_{p1}$ to $Ar_{p3}$ are the substituents of phosphor atom and each independently represent substituted or unsubstituted above mentioned aryl group or substituted or unsubstituted above mentioned heterocyclic group.

According to another embodiment, it is preferable that the electron-transporting layer comprises aromatic hydrocarbon compounds. Specific examples of preferred aromatic hydrocarbon compounds for the electron-transporting layer are, oligo-phenylene compounds, naphthalene compounds, fluorene compounds, fluoranthenyl group, anthracene compounds, phenanthrene compounds, pyrene compounds, triphenylene compounds, benzanthracene compounds, chrysene compounds, benzphenanthrene compounds, naphthacene compounds, and benzochrysene compounds, preferably anthracene compounds, pyrene compounds and fluoranthene compounds.

(Cathode)

For the cathode, a metal, an alloy, an electrically conductive compound, and a mixture thereof, each having a small work function (specifically, a work function of 3.8 eV or less) are preferably used. Specific examples of a material for the cathode include an alkali metal such as lithium and cesium; an alkaline earth metal such as magnesium, calcium, and strontium; aluminum, an alloy containing these metals (for example, magnesium-silver, aluminum-lithium); a rare earth metal such as europium and ytterbium; and an alloy containing a rare earth metal.

The cathode is usually formed by a vacuum vapor deposition or a sputtering method. Further, in the case of using a silver paste or the like, a coating method, an inkjet method, or the like can be employed.

Moreover, various electrically conductive materials such as silver, ITO, graphene, indium oxide-tin oxide containing silicon or silicon oxide, selected independently from the work function, can be used to form a cathode. These electrically conductive materials are made into films using a sputtering method, an inkjet method, a spin coating method, or the like.

(Insulating Layer)

In the organic EL device, pixel defects based on leakage or a short circuit are easily generated since an electric field is applied to a thin film. In order to prevent this, it is preferred to insert an insulating thin layer between a pair of electrodes. Examples of materials used in the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. A mixture thereof may be used in the insulating layer, and a laminate of a plurality of layers that include these materials can be also used for the insulating layer.

(Spacing Layer)

A spacing layer is a layer provided between a fluorescent emitting layer and a phosphorescent emitting layer when a fluorescent emitting layer and a phosphorescent emitting layer are stacked in order to prevent diffusion of excitons generated in the phosphorescent emitting layer to the fluorescent emitting layer or in order to adjust the carrier balance. Further, the spacing layer can be provided between the plural phosphorescent emitting layers.

Since the spacing layer is provided between the emitting layers, the material used for the spacing layer is preferably a material having both electron-transporting capability and hole-transporting capability. In order to prevent diffusion of the triplet energy in adjacent phosphorescent emitting layers, it is preferred that the spacing layer have a triplet energy of 2.6 eV or more. As the material used for the spacing layer, the same materials as those used in the above-mentioned hole-transporting layer can be given.

(Electron-Blocking Layer, Hole-Blocking Layer, Exciton-Blocking Layer)

An electron-blocking layer, a hole-blocking layer, an exciton (triplet)-blocking layer, and the like may be provided in adjacent to the emitting layer.

The electron-blocking layer has a function of preventing leakage of electrons from the emitting layer to the hole-transporting layer. The hole-blocking layer has a function of preventing leakage of holes from the emitting layer to the electron-transporting layer. In order to improve hole blocking capability, a material having a deep HOMO level is preferably used. The exciton-blocking layer has a function of preventing diffusion of excitons generated in the emitting layer to the adjacent layers and confining the excitons within the emitting layer. In order to improve triplet block capability, a material having a high triplet level is preferably used.

(Method for Forming a Layer)

The method for forming each layer of the organic EL device of the invention is not particularly limited unless otherwise specified. A known film-forming method such as a dry film-forming method, a wet film-forming method or the like can be used. Specific examples of the dry film-forming method include a vacuum deposition method, a sputtering method, a plasma method, an ion plating method, and the like. Specific examples of the wet film-forming method include various coating methods such as a spin coating method, a dipping method, a flow coating method, an inkjet method, and the like.

(Film Thickness)

The film thickness of each layer of the organic EL device of the invention is not particularly limited unless otherwise specified. If the film thickness is too small, defects such as pinholes are likely to occur to make it difficult to obtain a sufficient luminance. If the film thickness is too large, a high driving voltage is required to be applied, leading to a lowering in efficiency. In this respect, the film thickness is preferably 0.1 nm to 10 μm, and more preferably 5 nm to 0.2 μm.

(Electronic Apparatus (Electronic Equipment))

The present invention further relates to an electronic equipment (electronic apparatus) comprising the organic electroluminescence device according to the present application. Examples of the electronic apparatus include display parts such as an organic EL panel module; display devices of television sets, mobile phones, smart phones, and personal computer, and the like; and emitting devices of a lighting device and a vehicle lighting device.

EXAMPLES

Next, the invention will be explained in more detail in accordance with the following synthesis examples, examples, and comparative examples, which should not be construed as limiting the scope of the invention.

The percentages and ratios mentioned in the examples below—unless stated otherwise—are % by weight and weight ratios.

I Synthesis Examples

All experiments are carried out in protective gas atmosphere.

Compound 1

Intermediate 1-1

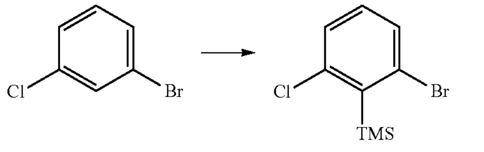

Intermediate 1-1

Under an inert atmosphere, 23.2 ml of n-butyllithium (2.7M in hexanes) were added to 6.34 g (62.7 mmol) of N,N-diisopropylamine while keeping the temperature below 25° C. After stirring for 20 minutes at room temperature, the reaction mixture was diluted with 10 ml of anhydrous tetrahydrofuran to give a freshly prepared solution of LDA (lithiumdiisopropylamid).

Under an inert atmosphere, 10.00 g (52.2 mmol) of 1-bromo-3-chlorobenzene and 6.81 g (62.7 mmol) of chlorotrimethylsilane were dissolved in 30 ml of anhydrous tetrahydrofuran. The clear colorless solution was cooled to −78° C., and to this was slowly added the freshly prepared solution of LDA. The temperature was maintained at −78° C. for 10 minutes, after which it was raised to −30° C. and maintained for 1.5 hours. The bright orange solution was then warmed slowly to room temperature, and stirred for 17 hours to give a yellow milky solution. The reaction mixture was poured into water, and extracted with ethyl acetate. The organic extracts were then dried over $MgSO_4$, filtered, and the solvent was removed on the rotavap. The residue was purified by silica-gel column chromatography using cyclohexane as eluent to give 12.61 g (92% yield) of Intermediate 1-1 as a clear colorless oil.

$^1$H NMR (300 MHz, DMSO-$d_6$) δ 7.59 (dd, J=7.9, 1.1 Hz, 1H), 7.43 (dd, J=8.0, 1.1 Hz, 1H), 7.28 (t, J=7.9 Hz, 1H), 0.51 (s, 9H).

Intermediate 1-2

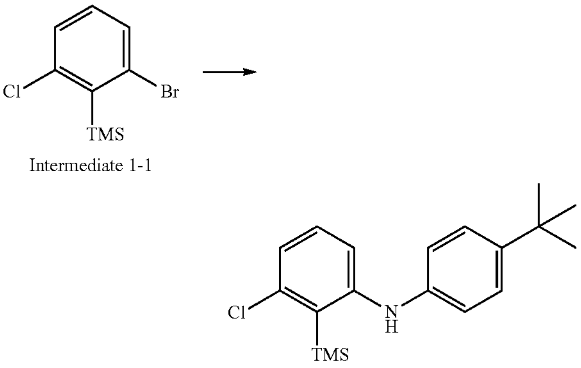

Intermediate 1-1

Intermediate 1-2

5.00 g (18.97 mmol) of Intermediate 1-1, 2.97 g (19.91 mmol) of 4-tert-butylaniline and 7.29 g (76.00 mmol) of sodium tertbutoxide were added to 100 ml of toluene. The suspension was degassed using 3 freeze-pump-thaw cycles, and 347 mg (2 mol %) of tris(dibenzylideneacetone)dipalladium(0) and 439 mg (8 mol %) of tri-tert-butylphosphonium tetrafluoroborate were added to the reaction mixture. After two additional freeze-pump-thaw cycles, the reaction mixture was heated to 60° C. for 25 hours. The reaction was cooled to room temperature and diluted with toluene. The organic extracts were washed with water and dried over $MgSO_4$, filtered, and the solvent was removed on the rotavap. The residue was purified by silica-gel column chromatography using cyclohexane as eluent to give 4.21 g (67% yield) of Intermediate 1-2 as a light orange oil.

$^1$H NMR (300 MHz, DMSO-$d_6$) δ 7.31-7.25 (m, 2H), 7.20-7.16 (m, 2H), 7.13 (dd, J=8.1, 0.9 Hz, 1H), 7.09 (dd, J=7.5, 0.9 Hz, 1H), 6.71-6.68 (m, 2H), 1.24 (s, 9H), 0.36 (s, 9H).

Intermediate 1-3

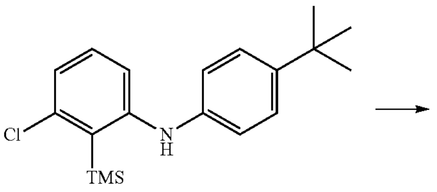

Intermediate 1-2

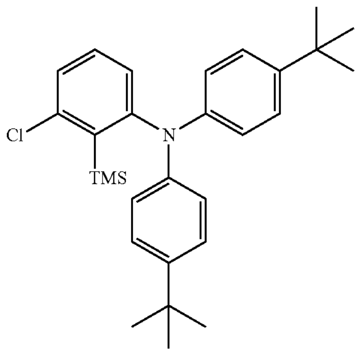

Intermediate 1-3

3.00 g (9.04 mmol) of Intermediate 1-2, 2.12 g (9.94 mmol) of 1-bromo-4-tert-butylbenzene and 3.47 g (36.1 mmol) of sodium tert-butoxide were added to 50 ml of toluene. The suspension was degassed using 3 freeze-pump-thaw cycles, and 166 mg (2 mol %) of tris(dibenzylideneacetone)dipalladium(0) and 209 mg (8 mol %) of tri-tert-butylphosphonium tetrafluoroborate were added to the reaction mixture. After two additional freeze-pump-thaw cycles, the reaction mixture was heated to 60° C. for 19 hours. The reaction was cooled to room temperature and diluted with toluene. The organic extracts were washed with water and dried over $MgSO_4$, filtered over a pad of silica, and the pad was washed with more toluene. The solvent was removed on the rotavap, and the residue was purified by silica-gel column chromatography using cyclohexane as eluent to give a mixture of the desired product and 1-bromo-4-tert-butylbenzene. The residual 1-bromo-4-ter-butylbenzene was removed by distillation under high vacuum at 300° C. to give 3.74 g (98% yield) of Intermediate 1-3 as a clear colorless resin.

$^1$H NMR (300 MHz, DMSO-$d_6$) δ 7.45 (t, J=7.9 Hz, 1H), 7.34 (dd, J=7.9, 1.2 Hz, 1H), 7.31-7.23 (m, 4H), 6.90 (dd, J=7.8, 1.2 Hz, 1H), 6.81-6.71 (m, 4H), 1.25 (s, 18H), 0.17 (s, 9H).

Intermediate 1-4

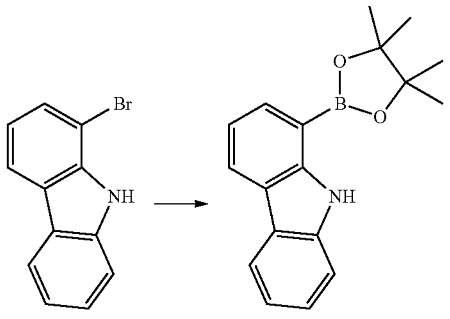

Intermediate 1-4

10.0 g (40.6 mmol) of 1-bromo-9H-carbazole, 13.4 g (52.8 mmol) of bis(pinacolato)diboron and 16.0 g (168.2 mmol) of potassium acetate were suspended in 100 ml of anhydrous N,N-dimethylformamide. The suspension was degassed by evacuating the reaction vessel with high vacuum and backfilling with argon. The procedure was repeated 7 times, and 2.32 g (7 mol %) of [1,1'-bis(diphenylphosphino)ferrocene-palladium(II), complex with dichloromethane were added to the reaction mixture before repeating the evacuation-backfilling 2 times. The reaction mixture was then heated to 80° C. for 19 hours. After cooling to room temperature, the reaction was diluted with 10 ml of diethyl ether and 50 ml of cyclohexane, and filtered over a small pad of silica-gel. The pad was washed with 300 ml of 5:1 mixture of cyclohexane and diethyl ether. The solvents were removed on the rotavap, and the residue was purified by silica-gel column chromatography using cyclohexane as eluent. Fractions containing product were combined, and the solvent removed on the rotavap until a white solid precipitated. The suspension was filtered to give 10.25 g (86% yield) of Intermediate 1-4 as a white solid.

$^1$H NMR (300 MHz, DMSO-$d_6$) δ 10.33 (s, 1H), 8.31-8.23 (m, 1H), 8.14-8.09 (m, 1H), 7.75 (dt, J=8.1, 0.9 Hz, 1H), 7.71 (dd, J=7.2, 1.3 Hz, 1H), 7.44-7.36 (m, 1H), 7.23-7.13 (m, 2H), 1.41 (s, 12H).

Intermediate 1-5

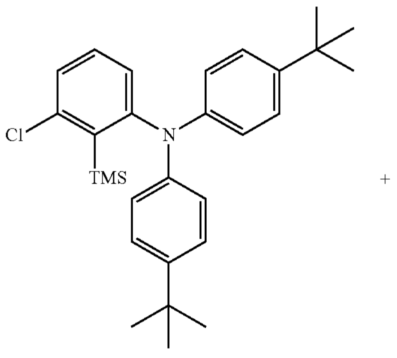

Intermediate 1-3

+

-continued

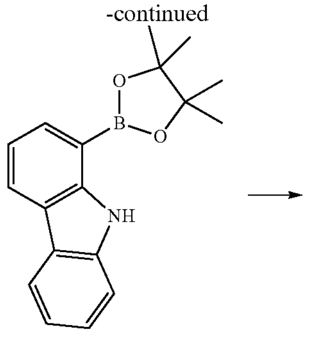

Intermediate 1-4

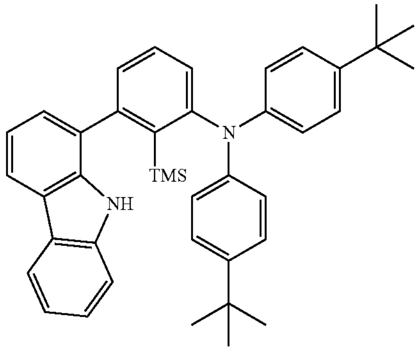

Intermediate 1-5

3.65 g (7.86 mmol) of Intermediate 1-3, 2.54 g (8.65 mmol) of Intermediate 1-4 and 6.68 g (31.5 mmol) of $K_3PO_4$ were suspended in a mixture of 50 ml of toluene, 25 ml of tetrahydrofuran, and 20 ml of water. The suspension was degassed using 3 freeze-pump-thaw cycles, and 17.7 mg (1 mol %) of palladium(II) acetate and 193.7 mg (6 mol %) of SPhos (2-dicyclohexylphosphino-2',6'-dimethoxybiphenyl) were added to the reaction mixture. After two additional freeze-pump-thaw cycles, the reaction mixture was heated to 90° C. for 20 hours, then an additional 8.8 mg (0.5 mol %) of palladium(II) acetate and 96.9 mg (3 mol %) of SPhos were added, and the reaction heated to 90° C. for a further 1 hour. The reaction was then cooled to room temperature and extracted with dichloromethane, and the organic extracts were dried over anhydrous $MgSO_4$, and filtered over a small pad of silica. The pad was washed with dichloromethane, and the solvent of the filtrate was removed on the rotavap. The crude product was purified by silica-gel column chromatography using a mixture of heptane and dichloromethane (0-20% gradient), to give 2.17 g of a colorless foam. The product was further purified by trituration in 40 ml of cyclohexane at room temperature, followed by 40 ml of refluxing petroleum ether 60-80. The resulting solid was filtered at room temperature, and washed with petroleum ether, and dried under vacuum to give 1.76 g (38% yield) of Intermediate 1-5 as a white powder.

$^1$H NMR (300 MHz, dichloromethane-$d_2$) δ 8.14 (dt, J=6.5, 1.0 Hz, 2H), 8.10 (dd, J=7.5, 1.3 Hz, 1H), 7.54-7.47 (m, 1H), 7.46-7.41 (m, 2H), 7.40-7.35 (m, 2H), 7.35-7.31 (m, 2H), 7.31-7.24 (m, 3H), 7.21 (dd, J=7.3, 1.3 Hz, 1H), 7.16 (dd, J=7.9, 1.3 Hz, 1H), 7.14-7.06 (m, 2H), 7.01-6.93 (m, 2H), 1.38 (s, 9H), 1.36 (s, 9H), 0.45 (s, 9H).

Compound 1

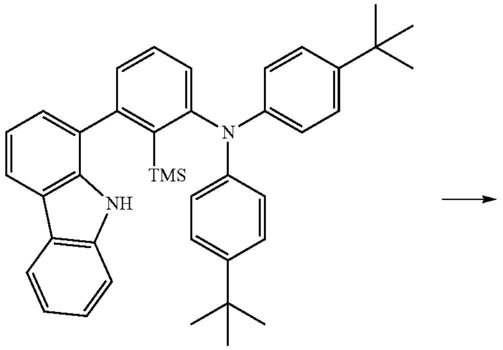

Intermediate 1-5

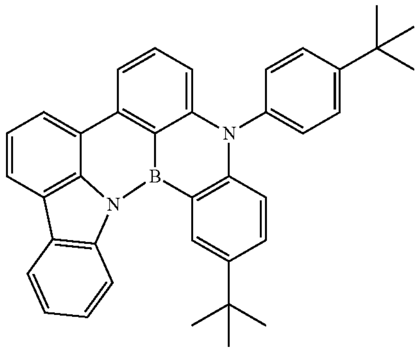

Compound 1

0.50 g (0.84 mmol) of Intermediate 1-5 were dissolved in 10 ml of 1,2-dichlorobenzene and degassed using 3 freeze-pump-thaw cycles. 0.34 g (3.36 mmol) of triethylamine were added to the reaction mixture, followed by the slow addition of 1.68 ml (1.68 mmol) of trichloroborane (1M solution in heptane). The reaction mixture was heated to 180° C. for 42 hours to produce a clear, oily solution. After cooling to room temperature, the gel-like mixture was diluted with 70 ml of cyclohexane, and filtered through a pad of silica. The pad was washed with 200 ml of cyclohexane to remove solvents, and the desired product was eluted into a different fraction using 100 ml of toluene, followed by 100 ml of dichloromethane. The solvents were removed on the rotavap, and the crude product was purified by silica-gel column chromatography using a mixture of heptane and toluene (0-20% gradient) to give the product as an oil, which was crystallized using a few drops of diethylether. The solid was collected by filtration to give 0.13 g (29% yield) of Compound 1 as a bright yellow powder.

$^1$H NMR (300 MHz, dichloromethane-$d_2$) δ 8.77 (d, J=2.5 Hz, 1H), 8.54-8.44 (m, 1H), 8.39 (dd, J=7.9, 1.0 Hz, 1H), 8.29-8.15 (m, 2H), 8.08-7.99 (m, 1H), 7.83-7.73 (m, 2H), 7.68-7.49 (m, 4H), 7.47 (td, J=7.4, 1.1 Hz, 1H), 7.42-7.31 (m, 2H), 6.82 (d, J=9.0 Hz, 1H), 6.72 (dd, J=8.5, 0.7 Hz, 1H), 1.52 (s, 9H), 1.42 (s, 9H).

Compound 2

Intermediate 2-1

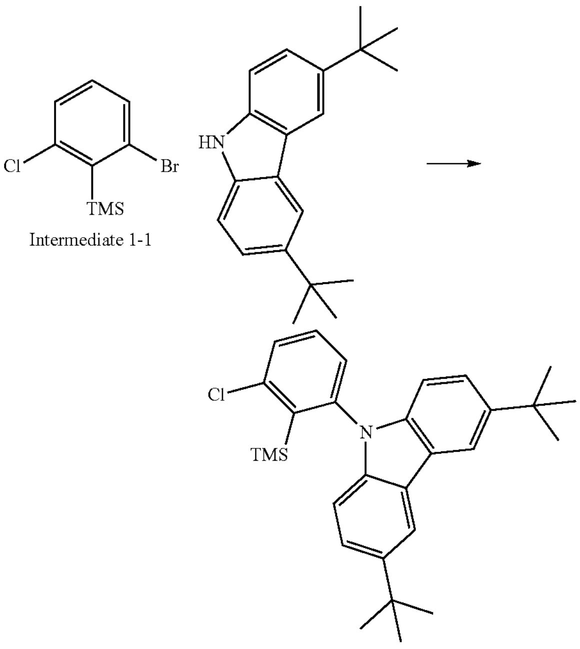

Intermediate 1-1

Intermediate 2-1

5.00 g (18.97 mmol) of Intermediate 1-1, 5.83 g (2.86 mmol) of 3,6-di-tert-butyl-9H-carbazole and 7.29 g (76.00 mmol) of sodium tert-butoxide were added to 150 ml of xylenes. The suspension was degassed using 3 freeze-pump-thaw cycles, and 347 mg (2 mol %) of tris(dibenzylideneacetone)dipalladium(0) and 329 mg (3 mol %) of Xantphos (4,5-bis(diphenylphosphino)-9,9-dimethylxanthene) were added to the reaction mixture. After two additional freeze-pump-thaw cycles, the reaction mixture was heated to 120° C. for 15 hours. An additional 347 mg (2 mol %) of tris(dibenzylideneacetone)dipalladium(0) and 329 mg (3 mol %) of Xantphos were added to the reaction mixture, and the reaction was further heated for a total of 50 hours. The reaction was then cooled to room temperature, extracted with toluene, and the organic extracts were dried over anhydrous $MgSO_4$ and filtered over a small pad of silica. The pad was washed with toluene, and the solvent of the filtrate was removed on the rotavap. The crude product was purified by silica-gel column chromatography using heptane to give 3.25 g (37% yield) of Intermediate 2-1 as a colorless foam.

$^{1}$H NMR (300 MHz, DMSO-$d_6$) δ 8.27 (d, J=1.5 Hz, 2H), 7.66 (dd, J=8.0, 1.3 Hz, 1H), 7.59 (t, J=7.8 Hz, 1H), 7.45 (dd, J=8.6, 1.9 Hz, 2H), 7.13 (dd, J=7.6, 1.3 Hz, 1H), 6.89 (d, J=8.5 Hz, 2H), 1.41 (s, 18H), 0.14 (s, 9H).

Intermediate 2-2

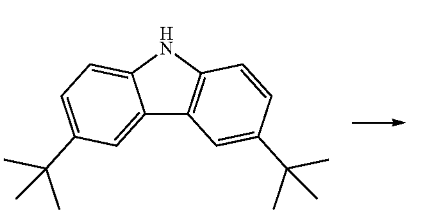

-continued

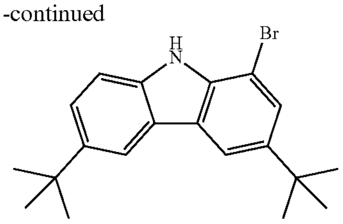

Intermediate 2-2

5.00 g (17.89 mmol) of 3,6-di-tert-butyl-9H-carbazole were dissolved in 50 ml of acetic acid, and to the white suspension were added 3.18 g (17.89 mmol) of N-bromosuccinimide in portions. After 4 hours, 200 ml of water were added, and the reaction further stirred for 30 minutes. The resulting precipitate was filtered, and the solid was washed with water, sat. $NaHCO_3$ solution, and water again. The crude product was purified by silica-gel column chromatography using a mixture of heptane and toluene (0-40% gradient), and subsequently purified again by silica-gel column chromatography using a mixture of cyclohexane and dichloromethane (0-3% gradient). Pure fractions were combined and the solvent removed on the rotavap to give 3.42 g (45% yield) of Intermediate 2-2 as a clear colorless oil.

$^{1}$H NMR (300 MHz, DMSO-$d_6$) δ 11.10 (s, 1H), 8.20 (d, J=1.5 Hz, 1H), 8.18 (dd, J=1.4, 0.9 Hz, 1H), 7.57 (d, J=1.7 Hz, 1H), 7.50 (dd, J=8.6, 1.8 Hz, 1H), 7.45 (dd, J=8.7, 0.8 Hz, 1H), 1.40 (s, 18H).

Intermediate 2-3

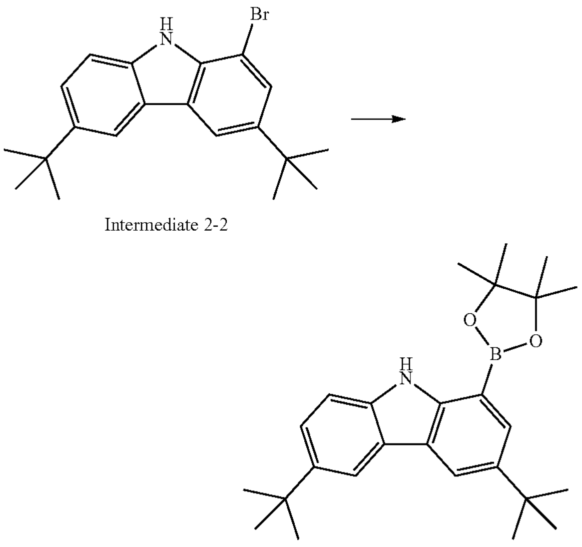

Intermediate 2-2

Intermediate 2-3

3.40 g (9.49 mmol) of Intermediate 2-2, 3.13 g (12.34 mmol) of bis(pinacolato)diboron and 3.73 g (39.20 mmol) of potassium acetate were suspended in 40 ml of anhydrous N,N-dimethylformamide. The suspension was degassed by evacuating the reaction vessel with high vacuum and back-filling with argon. The procedure was repeated 7 times, and 542 mg (7 mol %) of [1,1'-bis(diphenylphosphino)ferrocene]dichloropalladium(II), complex with dichloromethane were added to the reaction mixture before repeating the evacuation-backfilling 2 times. The reaction mixture was then heated to 80° C. for 21 hours. After cooling to room temperature, the reaction was diluted with diethyl ether and washed with water, dried over $MgSO_4$ and filtered over a small pad of silica-gel. The pad was washed with 300 ml of 5:1 mixture of cyclohexane and diethyl ether.

The solvents were removed on the rotavap, and to the brown residue were added 30 ml of petroleum ether 60-80. The solution was then concentrated until a white powder precipitated. The solid was filtered and washed with cold petroleum ether to give 3.05 g (79% yield) of Intermediate 2-3 as a white powder.

$^1$H NMR (300 MHz, DMSO-$d_6$) δ 10.04 (s, 1H), 8.34 (d, J=2.0 Hz, 1H), 8.16 (d, J=1.9 Hz, 1H), 7.71 (d, J=2.1 Hz, 1H), 7.60 (d, J=8.6 Hz, 1H), 7.45 (dd, J=8.6, 2.0 Hz, 1H), 1.41 (s, 30H).

Intermediate 2-4

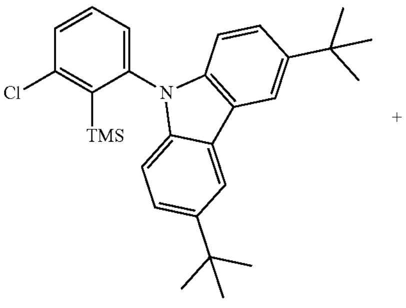

Intermediate 2-1

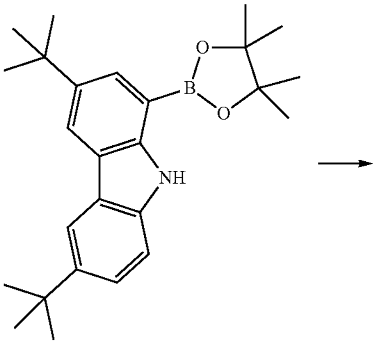

Intermediate 2-3

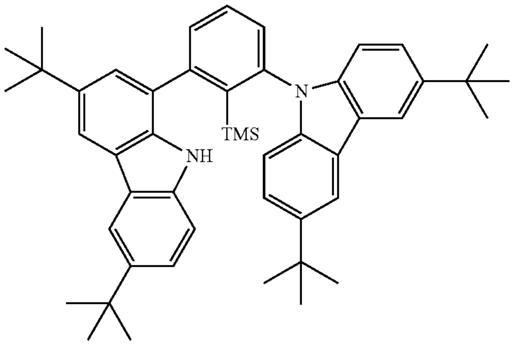

Intermediate 2-4

2.00 g (4.33 mmol) of Intermediate 2-1, 2.46 g (6.06 mmol) of Intermediate 2-3 and 3.67 g (17.3 mmol) of $K_3PO_4$ were suspended in a mixture of 50 ml of toluene, 25 ml of dioxane, and 15 ml of water. The suspension was degassed using 3 freeze-pump-thaw cycles, and 9.7 mg (1 mol %) of palladium(II) acetate and 107 mg (6 mol %) of SPhos were added to the reaction mixture. After two additional freeze-pump-thaw cycles, the reaction mixture was heated to 80° C. for hours, then an additional 0.35 g (0.86 mmol) of Intermediate 2-3, 9.7 mg (1 mol %) of palladium(II) acetate and 107 mg (6 mol %) of SPhos were added, and the reaction heated to 80° C. for a further 12 hours. The reaction was then cooled to room temperature and extracted with toluene, and the organic extracts were dried over anhydrous $MgSO_4$, and filtered over a small pad of silica. The pad was washed with toluene, and the solvent of the filtrate was removed on the rotavap. The crude product was purified by silica-gel column chromatography using a mixture of heptane and tetrahydrofuran (0-1% gradient), to give 2.80 g (92% yield) of Intermediate 2-4 as a white foam.

$^1$H NMR (300 MHz, DMSO-$d_6$) δ 10.70 (s, 1H), 8.27 (d, J=1.9 Hz, 2H), 8.22 (d, J=1.8 Hz, 1H), 8.20-8.17 (m, 1H), 7.70 (t, J=7.6 Hz, 1H), 7.56 (dd, J=7.5, 1.3 Hz, 1H), 7.54-7.47 (m, 2H), 7.46-7.41 (m, 2H), 7.33 (d, J=1.8 Hz, 1H), 7.24 (d, J=8.5 Hz, 1H), 7.20 (dd, J=7.8, 1.2 Hz, 1H), 7.12 (d, J=8.6 Hz, 1H), 1.47 (s, 9H), 1.45-1.43 (m, 18H), 1.42 (s, 9H), −0.72 (s, 9H).

Compound 2

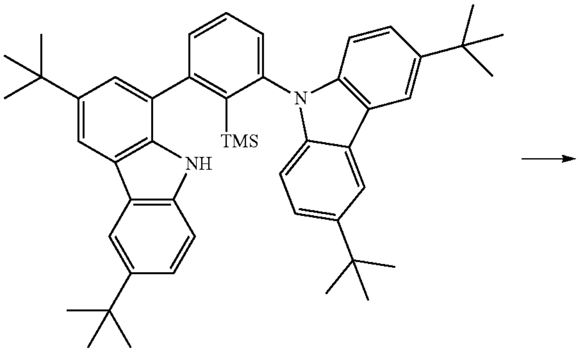

Intermediate 2-4

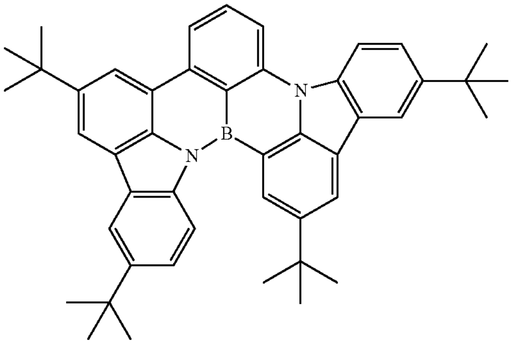

Compound 2

2.44 g (3.46 mmol) of Intermediate 2-4 were dissolved in 70 ml of 1,2-dichlorobenzene and the reaction vessel was purged with nitrogen. 2.42 ml (13.84 mmol) of N-diisopropylethylamine were added at room temperature, followed by the dropwise addition of 5.20 ml (5.20 mmol) of tribromoborane (1M solution in heptane). The resulting clear pale orange solution was heated to 145° C. for 20 hours before cooling to room temperature. The reaction was quenched with the slow addition of 15 ml of methanol, and the resulting solution was poured into 200 ml of methanol. The yellow precipitate was stirred for 5 minutes then filtered, and washed with methanol and dried to give 1.11 g (50% yield) of Compound 2 as a yellow solid.

$^1$H NMR (300 MHz, THF-$d_8$) δ 9.00 (d, J=1.9 Hz, 1H), 8.65 (d, J=8.7 Hz, 1H), 8.58 (d, J=1.9 Hz, 1H), 8.54 (d, J=1.7 Hz, 1H), 8.52 (d, J=8.3 Hz, 1H), 8.46-8.35 (m, 3H), 8.35 (d, J=1.6 Hz, 1H), 8.31 (d, J=1.9 Hz, 1H), 7.95 (t, J=8.1 Hz, 1H), 7.70 (dd, J=8.9, 2.0 Hz, 1H), 7.62 (dd, J=8.7, 2.1 Hz, 1H), 1.61 (s, 18H), 1.54-1.50 (m, 18H).

Compound 3

Intermediate 3-1

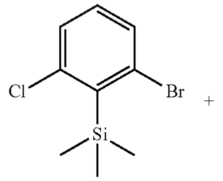

Intermediate 1-1

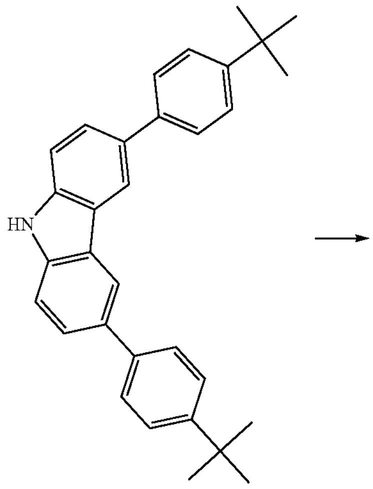

6.00 g (22.76 mmol) of Intermediate 1-1, 10.81 g (25.03 mmol) of 3,6-bis(4-(tert-butyl)phenyl)-9H-carbazole, which was synthesized according to the procedure mentioned in *New Journal of Chemistry,* 2019, 16629, and 4.37 g (45.5 mmol) of sodium tert-butoxide were added to 175 mL of xylenes. The suspension was degassed using 3 freeze-pump-thaw cycles, and 417 mg (2 mol %) of tris(dibenzylideneacetone)dipalladium(0) and 527 mg (4 mol %) of Xantphos (4,5-bis(diphenylphosphino)-9,9-dimethylxanthene) were added to the reaction mixture. After two additional freeze-pump-thaw cycles, the reaction mixture was heated to 120° C. for 15 hours. An additional 347 mg (2 mol %) of tris(dibenzylideneacetone)dipalladium(0) and 329 mg (3 mol %) of Xantphos were added to the reaction mixture, and the reaction was further heated for a total of 41 hours. The reaction was then cooled to room temperature, extracted with toluene, and the organic extracts were dried over anhydrous magnesium sulfate and filtered over a small pad of silica. The pad was washed with toluene, and the solvent of the filtrate was removed on the rotavap. The crude product was purified by silica-gel column chromatography using heptane/THF 95/5 to give 1.6 g (11% yield) of Intermediate 3-1 as a pale yellow foam.

ESI-MS: 614.3 [M+H]$^+$

Intermediate 3-2

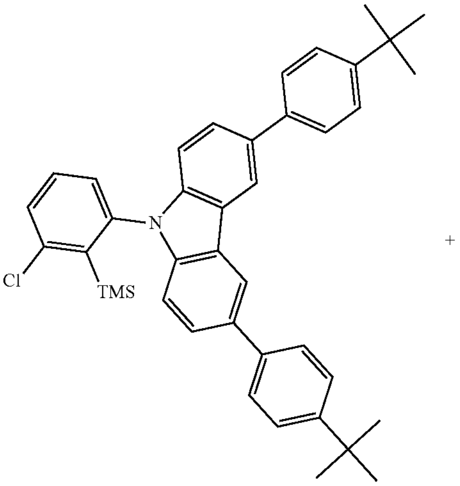

Intermediate 3-1

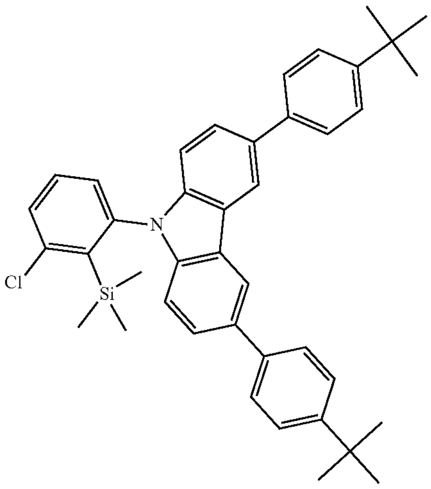

Intermediate 3-1

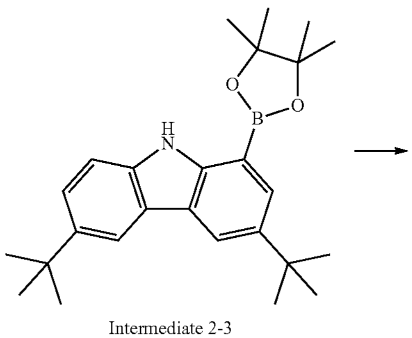

Intermediate 2-3

-continued

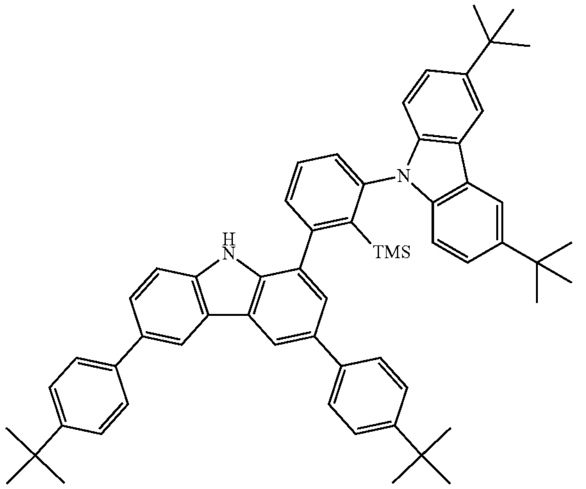

Intermediate 3-2

2.46 g (4.00 mmol) of Intermediate 3-1, 2.11 g (5.21 mmol) of Intermediate 2-3 and 3.40 g (16.0 mmol) of potassium phosphate were suspended in a mixture of 40 mL of toluene, 10 mL of dioxane, and 10 mL of water. The suspension was degassed using 3 freeze-pump-thaw cycles, and 18 mg (2 mol %) of palladium(II) acetate and 197 mg (12 mol %) of SPhos were added to the reaction mixture. After two additional freeze-pump-thaw cycles, the reaction mixture was heated to 90° C. for 15 hours. The reaction was then cooled to room temperature and extracted with toluene, and the organic extracts were dried over anhydrous magnesium sulfate and dry deposited on silica. The crude product was purified by silica-gel column chromatography using a mixture of heptane and toluene (0-35% gradient), to give 1.4 g (41% yield) of Intermediate 3-2 as a pale yellow foam.

ESI-MS: 857.5 $[M+H]^+$

Compound 3

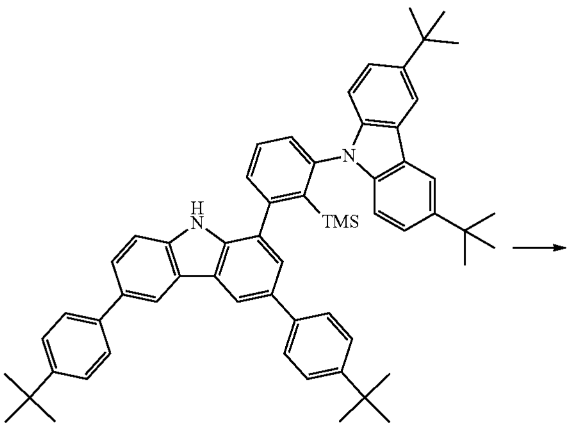

Intermediate 3-2

-continued

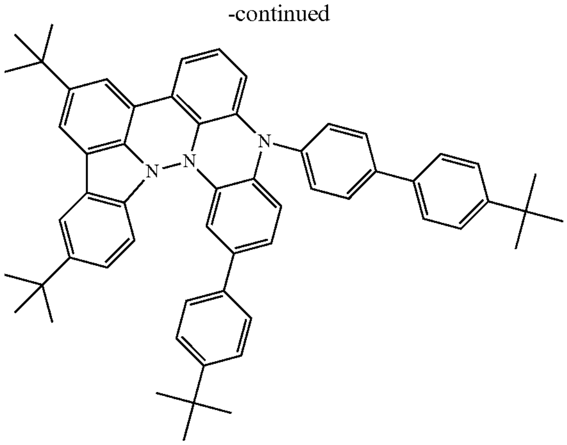

Compound 3

3.70 g (4.32 mmol) of Intermediate 3-2 were dissolved in 80 mL of 1,2-dichlorobenzene and the reaction vessel was purged with nitrogen. 3.02 mL (17.26 mmol) of N,N-diisopropylethylamine were added at room temperature, followed by the dropwise addition of 8.50 mL (8.50 mmol) of tribromoborane (1M solution in heptane). The resulting clear pale orange solution was heated to 160° C. for 16 hours before cooling to room temperature. The reaction was quenched with the slow addition of 5 mL of sodium acetate 10% aqueous solution. The aqueous phase was extracted with toluene (2×20 mL). The combined organic phases were filtered over a silica plug, which was rinsed with toluene (40 mL). The filtrate was poured into 500 ml of methanol. The yellow precipitate was stirred for 5 minutes then filtered, and washed with methanol and dried to give 2.24 g (66% yield) of Compound 3 as a yellow solid.

ESI-MS: 793.5 $[M+H]^+$

Compound 4

Intermediate 4-1

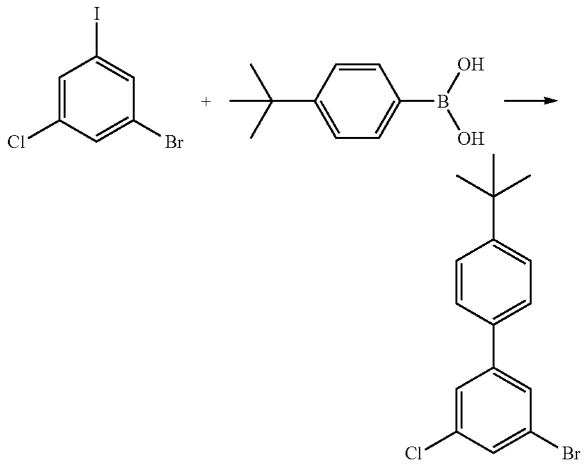

Intermediate 4-1

41.0 g (0.13 mol) of 1-bromo-3-chloro-5-iodobenzene, 23.0 g (0.13 mol) of 4-tert-butylphenylboronic acid, 4.48 g (3.88 mmol) tetrakis(triphenylphosphine)palladium(0), and 300 g of 10% aqueous sodium carbonate solution were suspended in 120 mL of toluene and 120 mL of ethanol. The suspension was three times evacuated and backfilled with argon and heated at 73° C. during 22 hours. The light yellow suspension was cooled down to room temperature and quenched with 200 mL of water. The organic phase was washed with water (2×200 mL) and dried over sodium sulfate. The product was further purified by MPLC with the CombiFlash Companion (silica gel, heptane) to give 39.6 g (93% yield) of Intermediate 4-1 as a white solid.

$^1$H NMR (300 MHz, $CDCl_3$) δ 7.64 (t, 1H), 7.52 (t, 1H), 7.51-7.46 (m, 5H), 1.40 (s, 9H).

Intermediate 4-2

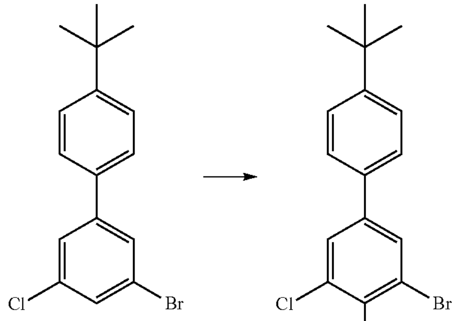

Intermediate 4-1

Intermediate 4-2

16 mL (0.11 mol) of diisopropylamine were dissolved in 100 mL of tetrahydrofuran and dropwise treated with 45 mL of n-butyllithium (2.5 M in hexanes) at −30° C. This solution was slowly added at a maximum temperature of −70° C. to a pre-cooled solution of 30.0 g (93 mmol) of Intermediate 4-1, and 14.1 ml (0.11 mol) of chlorotrimethylsilane in 200 ml of tetrahydrofuran. After complete addition the light yellow solution was further stirred at −75° C. during 45 minutes. 100 mL of 5% aqueous ammonium chloride solution were added and the reaction mixture stirred until room temperature was reached. The solution was diluted with 200 mL of heptane and the organic phase washed with 200 mL of water and with 100 mL of saturated aqueous sodium chloride solution. The organic phase was dried over sodium sulfate, and concentrated under vacuum. The product was further purified by MPLC with the CombiFlash Companion (silica gel, heptane) to give 36.7 g (98% yield) of Intermediate 4-2 as a colorless oil.

$^1$H NMR (300 MHz, $CDCl_3$) δ 7.73 (d, 1H), 7.54 (d, 1H), 7.52 (d, 4H), 1.39 (s, 9H), 0.60 (s, 9H).

Intermediate 4-3

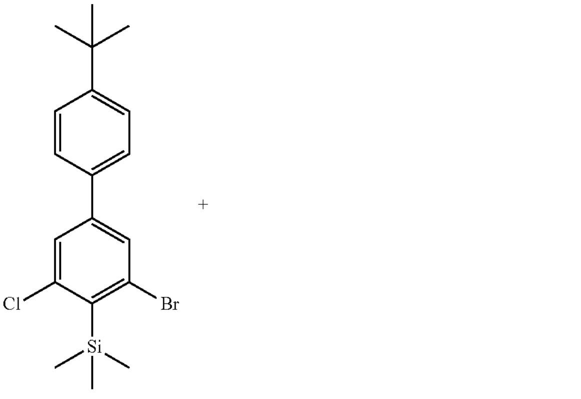

Intermediate 4-2

Intermediate 4-3

2.98 g (7.52 mmol) of Intermediate 4-2, 2.31 g (8.27 mmol) of 3,6-di-tert-butyl-9H-carbazole, 0.28 g (0.3 mmol) of tris(dibenzylideneacetone)dipalladium(0), 0.35 g (0.6 mmol) of 4,5-bis(diphenylphosphino)-9,9-dimethylxanthene (Xantphos), and 2.9 g (30 mmol) of sodium tert-butoxide were suspended in 30 mL of o-xylene. The orange suspension was three times evacuated and backfilled with argon and stirred at 117° C. during 22 hours. The dark brown reaction mixture was cooled down to room temperature and diluted with 100 ml of toluene, followed by extraction with 100 mL of water. The organic phase was washed with 100 ml of water and 100 ml of saturated aqueous sodium chloride, then dried over sodium sulfate and concentrated under vacuum. The product was further purified by MPLC with the CombiFlash Companion (silica gel, heptane). The resulting oil was treated with 100 mL of methanol and stirred at 40° C. until a suspension formed to give 1.37 g (30% yield) of Intermediate 4-3 as a white solid.

ESI-MS (positive, m/z): exact mass of $C_{39}H_{18}ClNSi$=593.32; found 594.4 $[M+1]^+$.

Intermediate 4-4

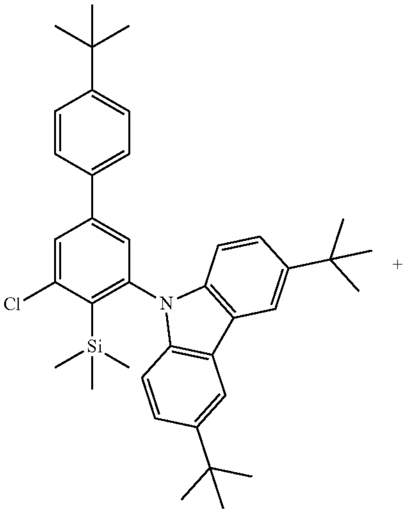

Intermediate 4-3

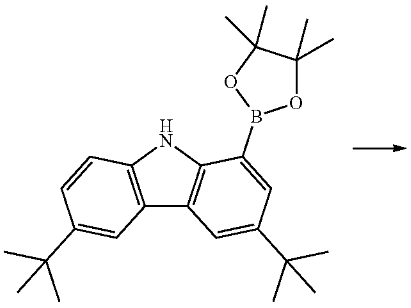

Intermediate 2-3

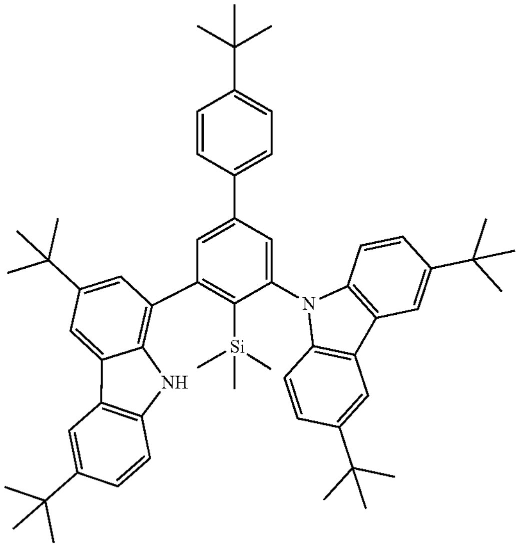

Intermediate 4-4

2.00 g (3.4 mmol) of Intermediate 4-3, 1.64 (4.0 mmol) of Intermediate 2-3, 16 mg (0.07 mmol) of palladium(II) acetate, 171 mg (0.42 mmol) of 2-dicyclohexylphosphino-2',6'-dimethoxybiphenyl (SPhos), and 2.86 g (13.4 mmol) of potassium phosphate tribasic were dissolved in a mixture of 25 mL of toluene, 15 mL of 1,4-dioxane, and 7 mL of water. The solution was three times evacuated and backfilled with argon, and heated at 77° C. during 20 hours. The reaction mixture was cooled down to room temperature, poured into 100 mL of water, and stirred during 10 minutes. The organic passed was filtered through a 3 cm layer of silica gel followed by rinsing the silica gel layer with 200 mL of heptane. The collected eluent was concentrated under vacuum. The product was taken up in ethanol and water was added and as suspension formed. The suspension was stirred for 30 minutes, then filtered and the solid washed with water. The solid was dissolved in dichloromethane, then dried over sodium sulfate, and concentrated under vacuum, to give 1.8 g (64%) of Intermediate 4-4 as a white solid.

ESI-MS (negative, m/z): exact mass of $C_{59}H_{72}N_2Si$=836.55; found 835.6 $[M-1]^+$.

Compound 4

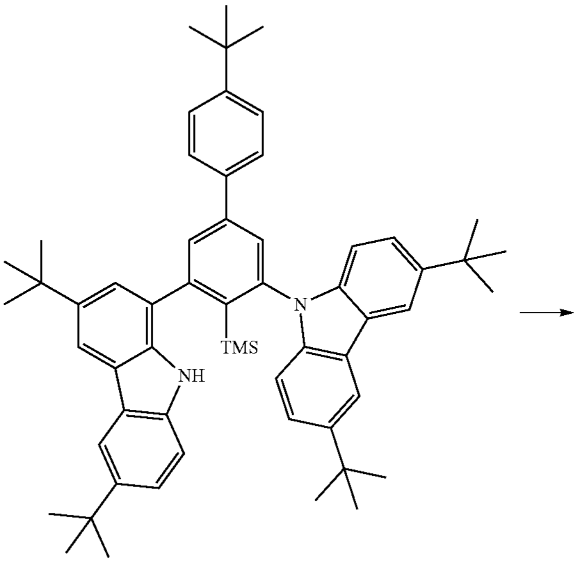

Intermediate 4-4

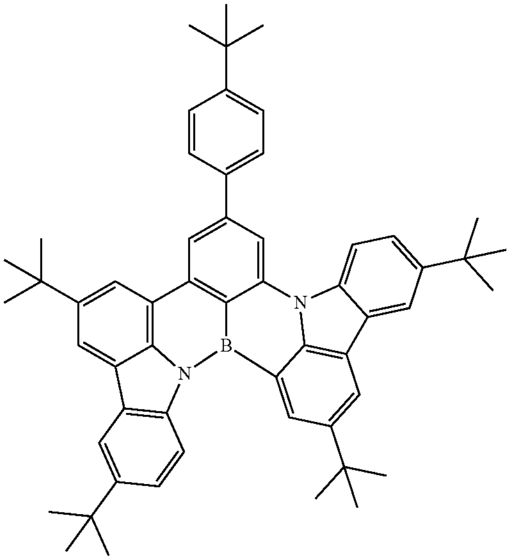

Compound 4

1.80 g (2.15 mmol) of Intermediate 4-4 were dissolved in 40 ml of 1,2-dichlorobenzene. 1.5 mL (8.6 mmol) of N,N-diisopropylethylamine and 3.2 mL of tribromoborane (1.0 M in heptane) were dropwise added. The light yellow solution was heated at 145° C. during 24 hours, cooled down to room temperature and slowly poured into 300 mL of methanol. The suspension was stirred during 10 minutes, the filtered, and the solid washed with methanol and ethanol. The solid was dried under vacuum to give 1.15 g (69% yield) of Compound 4 as a yellow solid.

ESI-MS (positive, m/z): exact mass of $C_{56}H_{61}BN_2$=772.49; found 773.8 $[M+1]^+$.

Compound 5

Intermediate 5-1

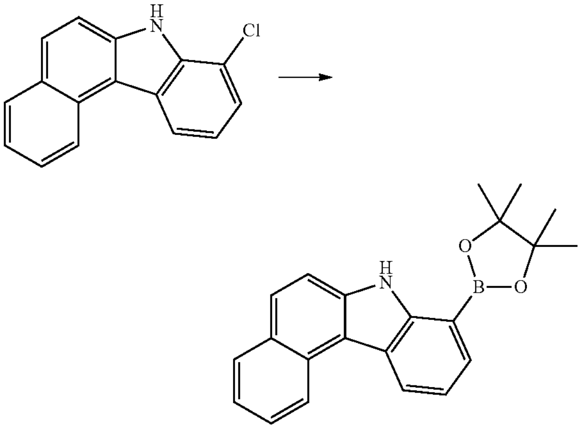

Intermediate 5-1

12.0 g (47.7 mmol) of 8-chloro-7H-benzo[c]carbazole, 18.2 g (71.5 mmol) of bis(pinacolato)diboron, 1.81 g (3.8 mmol) of 2-dicyclohexylphosphino-2',4',6'-triisopropylbiphenyl (XPhos), and 9.4 g (95 mmol) of potassium acetate were suspended in 200 mL of dioxane. 873 mg (0.95 mmol) of tris(dibenzylideneacetone)dipalladium(0) were added and the suspension heated at 101° C. during 40 minutes. The suspension was cooled down and diluted with 40 mL of dioxane. The suspension was filtered through a 3 cm layer of silica gel followed by rinsing the silica gel layer with 100 mL o dioxane. The collected eluent was concentrated under vacuum and the solid recrystallized from 50 mL of heptane. The solid was washed with 30 ml of cold heptane and further dried under vacuum to give 12.3 g (75% yield) of Intermediate 5-1 as a white solid.

ESI-MS (positive, m/z): exact mass of $C_{22}H_{22}BNO_2$=343.17; found 344.4 $[M+1]^+$.

Intermediate 5-2

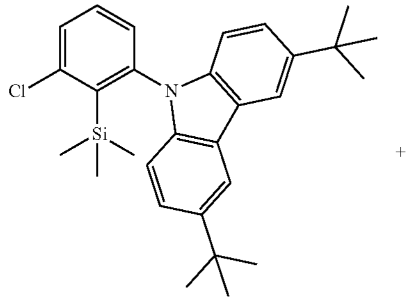

Intermediate 2-1

-continued

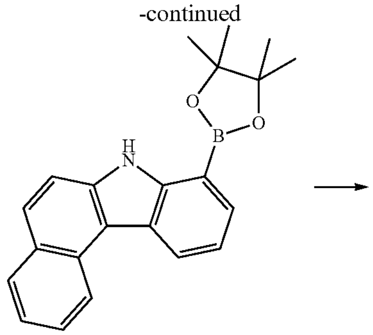

Intermediate 5-1

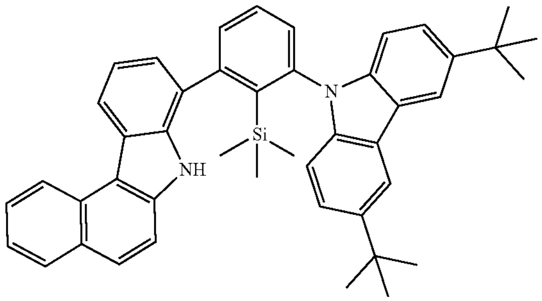

Intermediate 5-2

3.00 g (6.49 mmol) of Intermediate 2-1, 2.45 g (7.14 mmol) of Intermediate 5-1, 29 mg (0.13 mmol) of palladium (II) acetate, 320 mg (0.78 mmol) of 2-dicyclohexylphosphino-2',6'-dimethoxybiphenyl (SPhos), and 5.51 g (26.0 mmol) of potassium phosphate tribasic were dissolved in a mixture of 55 mL of o-xylene, 30 mL of 1,4-dioxane, and 15 mL of water. The reaction mixture was three times evacuated and backfilled with argon, and heated at 84° C. during 3 hours. The reaction mixture was cooled down and 40 mL of toluene and 40 mL of water were added. The organic phase was washed with water (3x40 mL), then dried over sodium sulfate, and concentrated under vacuum. The product was further purified by MPLC with the CombiFlash Companion (silica gel, toluene). The resulting white foam was heated with 50 mL, and the resulting turbid solution cooled down to room temperature. 10 mL of water were added and the mixture heated until a suspension formed. The suspension was stirred during 20 minutes, cooled down to room temperature and filtered. The solid was dissolved in dichlorobenzene, dried over magnesium sulfate, and the solution concentrated under vacuum to give 3.40 g (82% yield) of Intermediate 5-2 as a white solid.

ESI-MS (negative, m/z): exact mass of $C_{45}H_{46}N_2Si$=642.34; found 641.6 $[M-1]^+$.

Compound 5

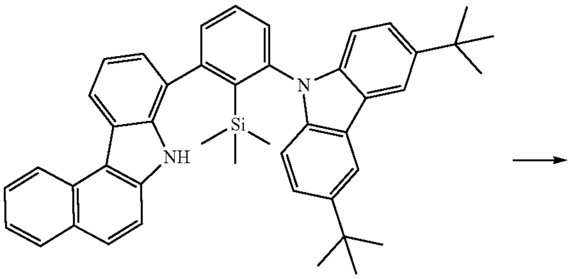

Intermediate 5-2

-continued

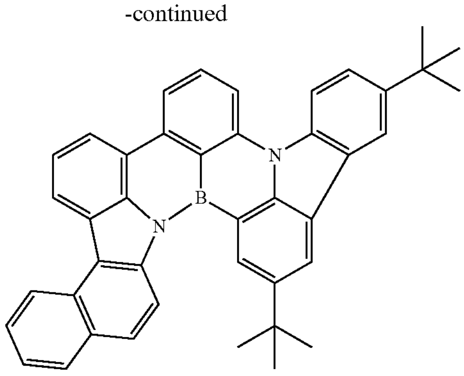

Compound 5

3.40 g (5.29 mmol) of Intermediate 5-2 were dissolved in 70 mL of 1,2-dichlorobenzene. 3.7 mL (21.2 mmol) of N,N-diisopropylethylamine and 10.6 mL of tribromoborane (1.0 M in heptane) were dropwise added. The yellow solution was heated at 150° C. during 18 hours. The orange solution was cooled down and 4 mL of 10% aqueous sodium acetate solution were slowly added. The mixture was dropwise added into 600 mL of methanol. The yellow suspension was filtered and the solid washed with ethanol and heptane. The solid was heated in a mixture of 150 mL dichloromethane and 100 mL isopropanol, and then slowly cooled down to room temperature. The suspension was filtered, and the solid washed with isopropanol to give 2.12 g (69% yield) of Compound 5 as a yellow solid.

ESI-MS (negative, m/z): exact mass of $C_{42}H_{35}BN_2$=578.29; found 579.7 $[M-1]^+$.

Compound 6

Intermediate 6-1

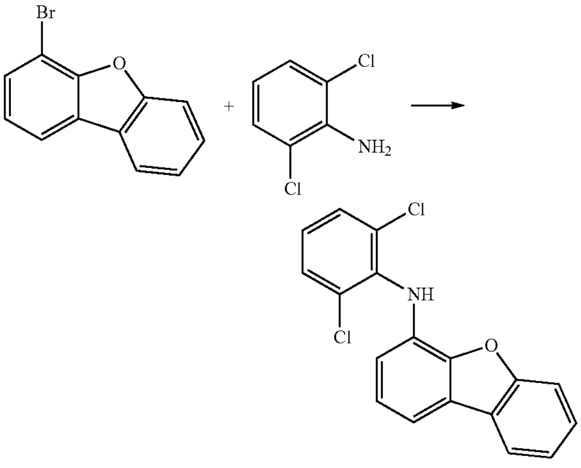

Intermediate 6-1

17.3 g (70.0 mmol) of 4-bromodibenzo[b,d]furan, 12.48 g (77.0 mmol) of 2,6-dichloroaniline, 10.09 g (105 mmol) of sodium ter-butoxide were suspended in 150 mL o-xylenes. The suspension was degassed with Ar, and 2.62 g (6 mol %) of BINAP and 471 mg (3 mol %) of tris(dibenzylideneacetone)dipalladium(0) were added to the reaction mixture. The reaction mixture was heated to 155° C. for 3 hours. The reaction was cooled to room temperature, diluted with toluene/water, and filtered over celite. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 19.26 g (84% yield) of Intermediate 6-1 as a white solid.

ESI-MS: 328.3 $[M+H]^+$

Intermediate 6-2

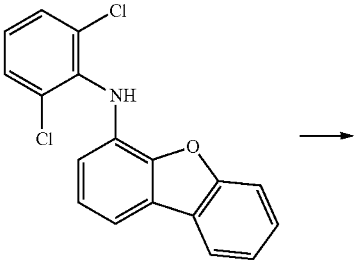

Intermediate 6-1

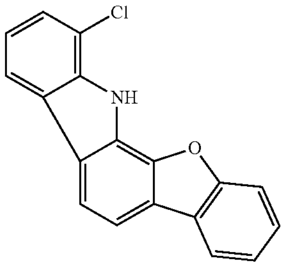

Intermediate 6-2

17.72 g (54.0 mmol) of Intermediate 6-1, 14.9 3 g (108 mmol) of potassium carbonate were suspended in N,N-dimethylacetamide. The suspension was degassed with Ar, and 485 mg (4 mol %) of palladium acetate and 1.59 g (8 mol %) of tricyclohexylphosphonium tetrafluoroborate were added to the reaction mixture. The reaction mixture was heated to 130° C. for 3.5 hours. The reaction was cooled to room temperature, diluted with toluene/water, and filtered over celite. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 10.39 g (66% yield) of Intermediate 6-2 as a white solid.

ESI-MS: 290.0 $[M-H]^-$

Intermediate 6-3

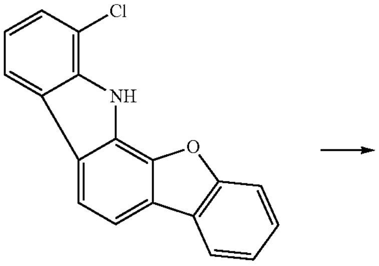

Intermediate 6-2

-continued

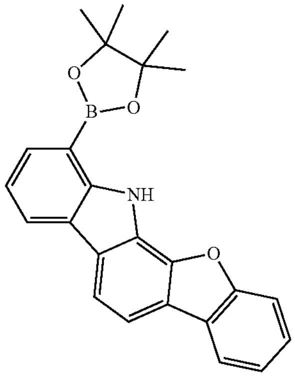

Intermediate 6-3

9.63 g (33.0 mmol) of Intermediate 6-2, 10.06 g (39.6 mmol) of bis(pinacolato)diboron and 8.10 g (83.0 mmol) of potassium acetate were suspended in 125 mL of 1,4-dioxane. The suspension was degassed with Ar, and 453 mg (1.5 mol %) of tris(dibenzylideneacetone)dipalladium(0) and 406 mg (3 mol %) of 2-dicyclohexylphosphino-2',6'-dimethoxybiphenyl were added to the reaction mixture. The reaction mixture was heated to 105° C. for 4 hours. The reaction was cooled to room temperature, diluted with toluene/water, and filtered over celite. The layers were separated, and the water layer was further extracted with toluene. The organic extracts were washed with water, brine, dried over sodium sulfate, filtered and evaporated. The residue was refluxed in 70 mL heptanes for 15 min, cooled to room temperature, then the orange suspension was filtered and dried in vacuo. 11.40 g (90% yield) of Intermediate 6-3 as a beige solid were obtained.

ESI-MS: 382.3 $[M-H]^-$

Intermediate 6-4

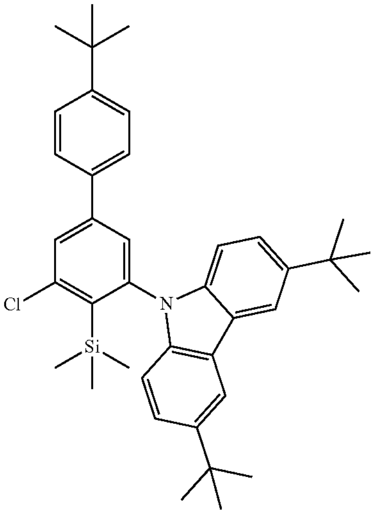

Intermediate 4-3

+

-continued

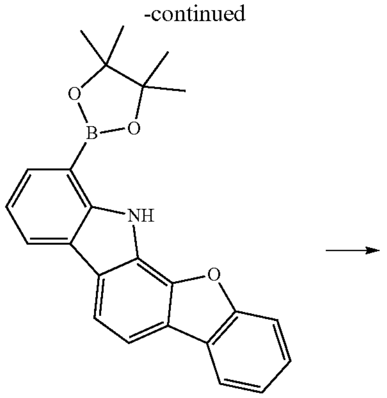

Intermediate 6-3

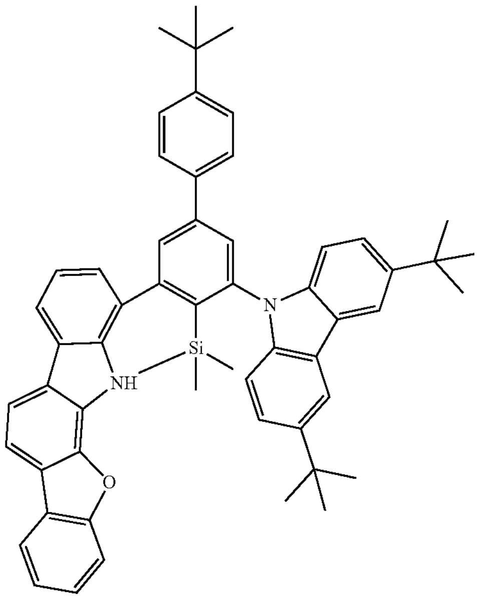

Intermediate 6-4

3.86 g (6.5 mmol) of Intermediate 4-3, 2.74 g (7.15 mmol) of Intermediate 6-3, 4.24 g (13.0 mmol) of caesium carbonate were suspended in a mixture of toluene/ethanol/water (60/20/10 mL). The suspension was degassed with Ar, and 44 mg (3 mol %) of palladium acetate and 186 mg (6 mol %) of 2-dicyclohexylphosphino-2',4',6'-triisopropylbiphenyl were added to the reaction mixture. The reaction mixture was heated to 60° C. for 2.5 hours. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 4.46 g (84% yield) of Intermediate 6-4 as a white foam.

ESI-MS: 813.6 $[M-H]^-$

Compound 6

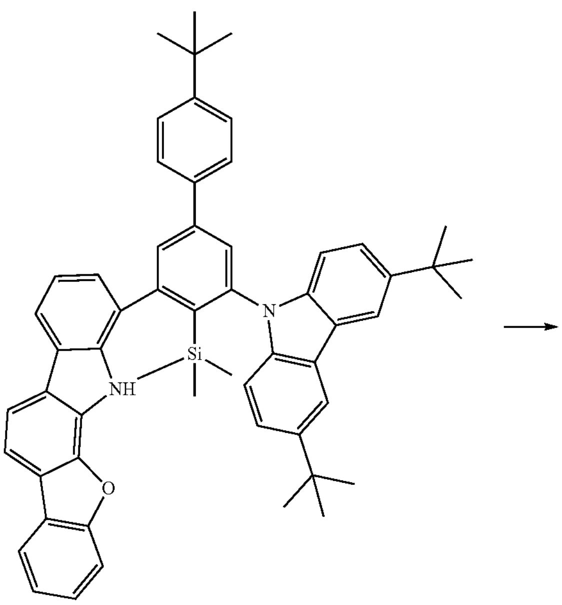

Intermediate 6-4

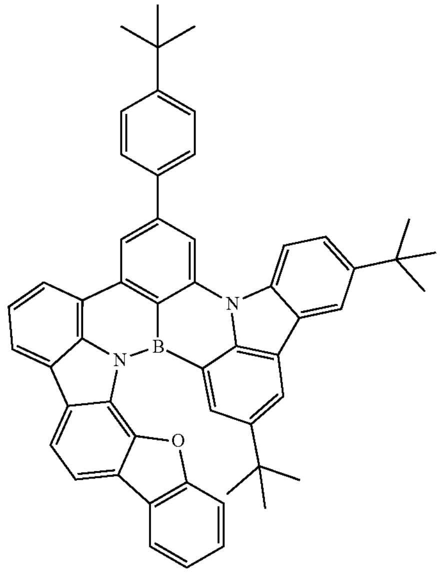

Compound 6

3.26 g (4.00 mmol) of Intermediate 6-4 were dissolved in 50 mL of 1,2-dichlorobenzene and degassed with Ar. 2.79 mL (16.0 mmol) of N-ethyl-N-isopropylpropan-2-amine were added to the reaction mixture, followed by the slow addition of 6.00 mL (6.00 mmol) of tribromoborane (1M solution in hep-tane). The reaction mixture was heated to 160° C. for 28.5 hours. Then, additional 2.00 mL (2.00 mmol) of tribromoborane (1M solution in hep-tane) were added, followed by heating to 160° C. for 16.5 hours. After cooling to room temperature, the reaction as quenched with water, and extracted with 1,2-dichlorobenzene. The combined organic layers were washed with brine, dried over sodium sulfate, filtered and evaporated. The residue was purified by silica-gel column chromatography using heptanes/toluene as eluent to give 1.36 g (45% yield) of Compound 6 as a yellow solid.

ESI-MS: 751.9 $[M+H]^+$

Compound 7

Intermediate 7-1

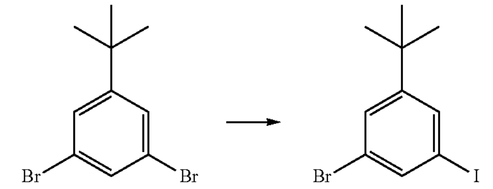

Intermediate 7-1

48.0 g (0.16 mol) of 1,3-dibromo-5-(tert-butyl)benzene were dissolved in 500 ml of tetrahydrofuran. 70.0 ml of n-butyllithium (2.5 M in hexanes) were added dropwise at a maximum temperature of −71° C. during 45 minutes. 45.9 g (0.18 mol) of iodine were added in several portions at a maximum temperature of −55° C. during 15 minutes, and the resulting suspension was further stirred at −78° C. during 45 minutes. 400 ml of 10% aqueous sodium sulfite was added and the reaction mixture further stirred until room temperature was reached. The organic phase was separated and the aqueous phase extracted with cyclohexane (2×150 ml). The combined organic phases were washed with water (2×200 ml) and saturated aqueous sodium chloride. The organic phase was dried over sodium sulfate, and concentrated under vacuum to give 54.7 g (83% yield) of Intermediate 7-1 as an orange oil.

$^1$H NMR (300 MHz, DMSO-$d_6$) δ 7.77 (t, 1H), 7.72 (t, 1H), 7.57 (t, 1H), 1.26 (s, 9H).

Intermediate 7-2

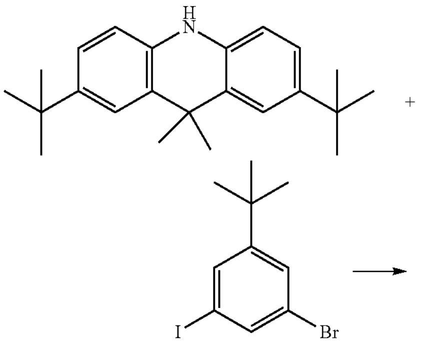

Intermediate 7-1

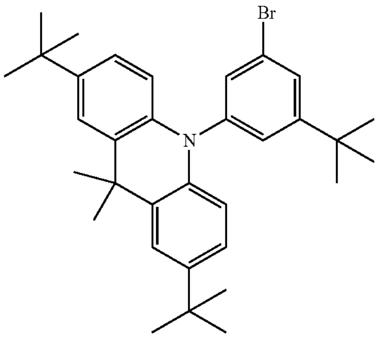

Intermediate 7-2

3.22 g (10.00 mmol) of 9,9-dimethyl-2,7-di(tert-butyl)-9,10-dihydroacrine, 3.73 g (11.00 mmol) of Intermediate 7-1, and 2.88 g (30.00 mmol) of sodium acetate were suspended in 57 mL of Xylene. After the suspension was degassed using 3 freeze-pump-thaw cycles, and 225 mg (1.00 mmol) of palladium acetate and 554 mg (1.00 mmol) of 1,1'-bis (diphenylphosphino)ferrocene were added to the mixture. Then, after two additional freeze-pump-thaw cycles, the reaction mixture was stirred to 100° C. for 1 hour. The reaction was cooled to room temperature and concentrated. The residue was purified by silica-gel column chromatography using cyclohexane as eluent to give 3.42 g (64% yield) of Intermediate 7-2 as a white solid.

ESI-MS: 534.6 [M+H]$^+$

Intermediate 7-3

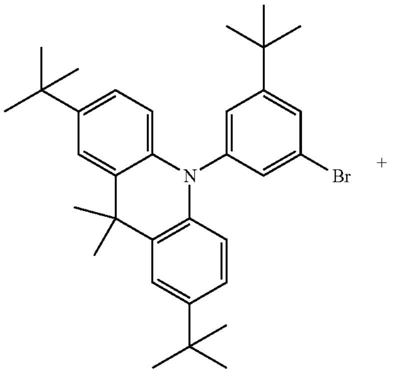

Intermediate 7-2

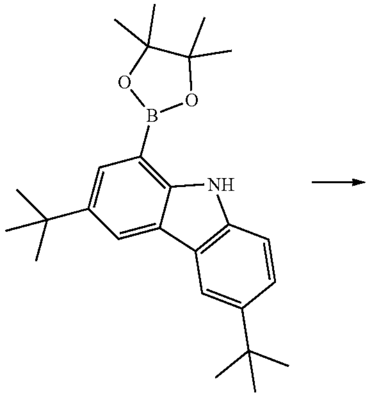

Intermediate 2-3

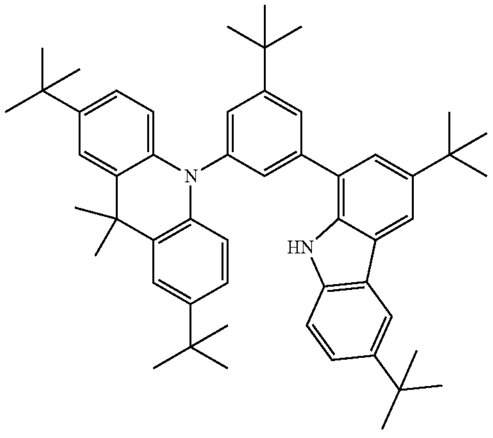

Intermediate 7-3

3.42 g (6.42 mmol) of Intermediate 7-1, 2.86 g (7.06 mmol) of Intermediate 2-3, and 5.45 g (25.68 mmol) potassium phospates were dissolved in 54 mL of toluene, 27 mL of dioxane, and 16 mL of water. After the solution was degassed using 3 freeze-pump-thaw cycles, 29 mg (0.13 mmol) palladium acetate and 316 mg (0.77 mmol) of 2-dicyclohexylphosphino-2', 6'-dimethoxybiphenyl were added to the mixture. Then, after two additional freeze-pump-thaw cycles, the mixture was stirred to 85° C. for 14.5 hours. The reaction was cooled to room temperature and diluted with toluene. The organic extracts were washed with water and dried over sodium sulfate, filtered, and the solution was concentrated. The residue was purified by silica-gel column chromatography using mixed solvent of heptane and dichloromethane as an eluent to give 4.17 g (89% yield) of Intermediate 7-3 as a white solid.

ESI-MS: 731.9 [M+H]$^+$

Compound 7

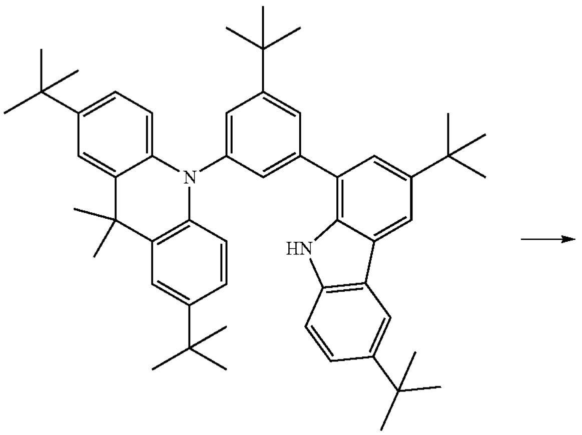

Intermediate 7-3

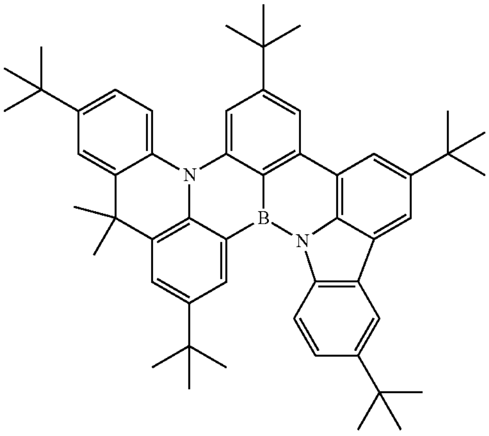

Compound 7

4.14 g (5.66 mmol) of Intermediate 7-3 was dissolved in 190 mL of dichlorobenzene. Then, 11.9 mL (11.9 mmol) of 1.0 M boron tribromide in heptane followed by 4.2 mL (23.78 mmol) of N,N-diisopropylethylamine were added to the solution, and the mixture was stirred at 185° C. for 40 hours. The reaction was cooled to room temperature and diluted with toluene. The reaction mixture was quenched with 1.0 M sodium acetate aq., and the aqueous layer was extracted with toluene. The organic extracts were washed with water and dried over magnesium sulfate, filtered, and the solution was concentrated. The residue was purified by silica-gel column chromatography using heptane as eluent to give 2.49 g (54% yield) of Compound 7 as a yellow solid.

ESI-MS: 739.9 [M+H]$^+$

Compound 8

Intermediate 8-1

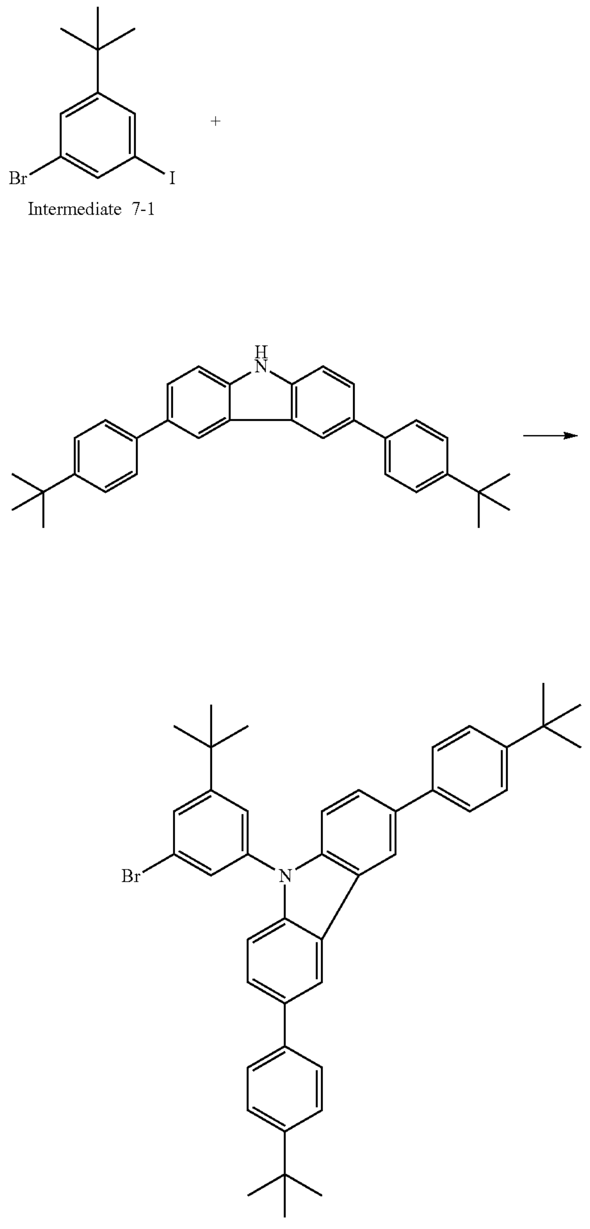

Intermediate 7-1

Intermediate 8-1

5.00 g (14.8 mmol) of Intermediate 7-1, 5.09 g (11.8 mmol) of 3,6-bis(4-(tert-butyl)phenyl)-9H-carbazole, 0.28 g (1.5 mmol) of copper(I) iodide, 0.51 g (4.42 mmol) of cyclohexane-1,2-diamine, and 9.39 g (44.2 mmol) of potassium phosphate tribasic were suspended in 75 ml of 1,4-dioxane, and heated at 91° C. during five hours. The suspension was filtered through a 3 cm layer of silica gel followed by rinsing the silica gel with 100 ml of dioxane. The eluent was concentrated under vacuum, and the product was further purified by MPLC with the Comb/Flash Companion (silica gel, heptane/0-5% gradient of dichloromethane) to give 6.9 g (91%) of Intermediate 8-1.

ESI-MS (positive, m/z): exact mass of $C_{42}H_{44}BrN$=641.27; found 642.7 $[M+1]^+$.

Intermediate 8-1

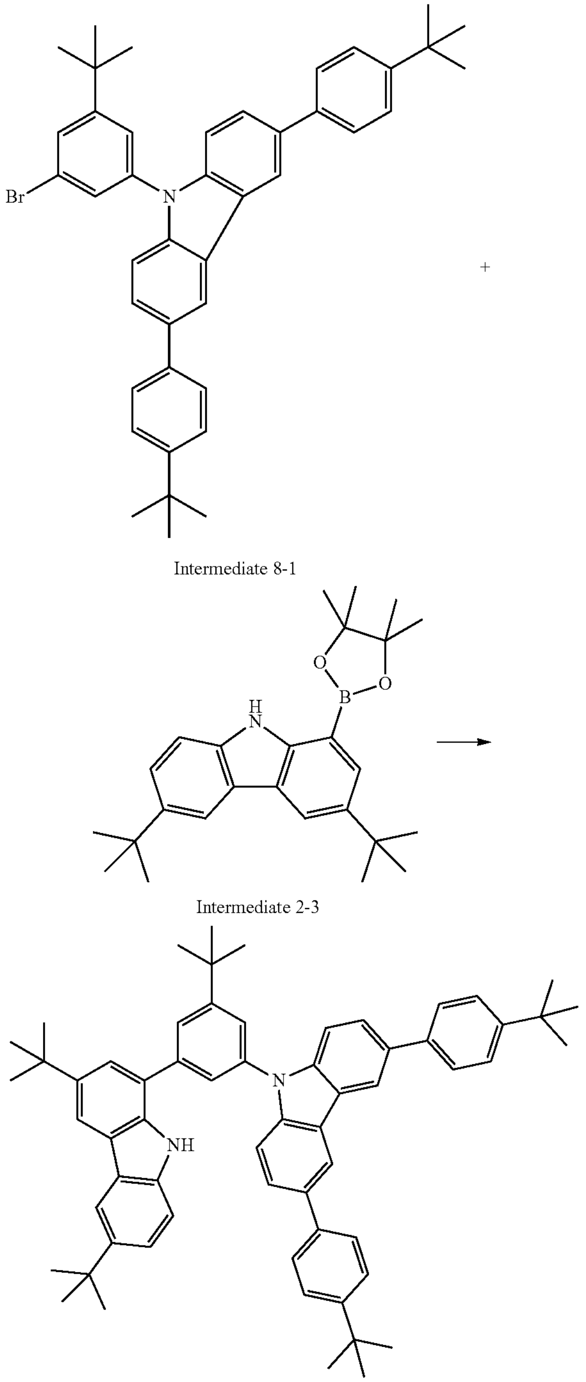

Intermediate 8-1

Intermediate 2-3

Intermediate 8-2

2.20 g (3.42 mmol) of Intermediate 8-2, 1.53 g (3.77 mmol) of Intermediate 2-3, 15 mg (0.07 mmol) of palladium (II) acetate, 154 mg (0.41 mmol) of 2-dicyclohexylphosphino-2',6'-dimethoxybiphenyl (SPhos), and 2.91 g (13.7 mmol) of potassium phosphate tribasic were dissolved in a mixture of 30 ml of toluene, 15 mL of 1,4-dioxane, and 10 ml of water. The solution was three times evacuated and backfilled with argon, and heated at 82° C. during three hours. The reaction mixture was diluted with 100 mL of toluene and treated with 100 ml of water. The organic phase was washed with water (3×50 mL), dried over sodium sulfate and concentrated under vacuum. The resulting oil was diluted with 30 ml of dichloromethane and 50 mL of ethanol. The solution was concentrated under vacuum to a volume of 50 mL and the resulting suspension was filtered and the solid washed with 50 mL of ethanol to give 2.19 g (76% yield) of Intermediate 8-3 as a white solid.

ESI-MS (negative, m/z): exact mass of $C_{62}H_{68}N_2$=840.54; found 840.0 [M−1]$^+$.

Compound 8

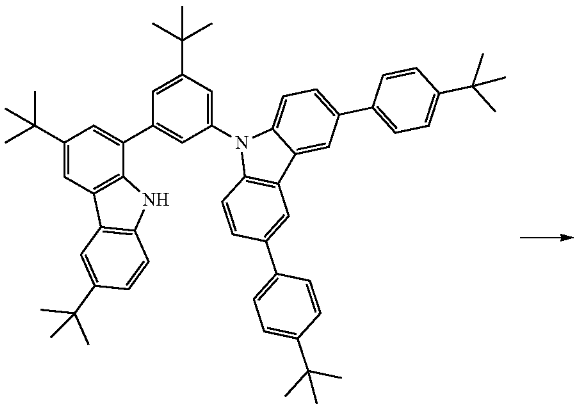

Intermediate 8-2

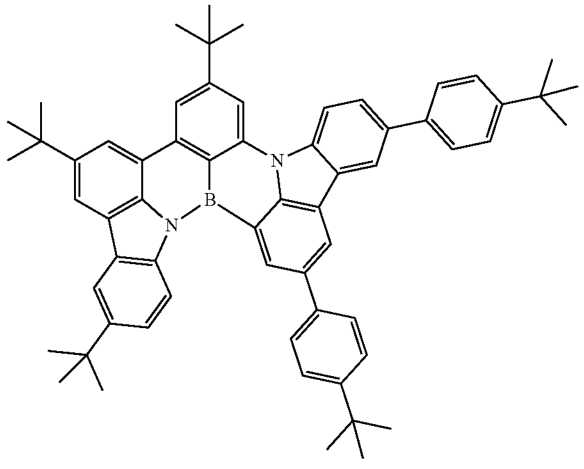

Compound 8

2.00 g (2.38 mmol) of Intermediate 8-2 were dissolved in 40 mL of 1,2-dichlorobenzene. 1.7 mL (9.5 mmol) of N,N-diisopropylethylamine and 4.75 ml of tribromoborane (1.0 M in heptane) were dropwise added. The brown solution was heated at 172° C. during 2.5 hours. The reaction mixture was cooled down, and 100 mL of methanol were added. The suspension was stirred during 15 minutes, and then filtered. The solid was washed with 50 mL of methanol, then 30 mL of water, followed by washing with 50 mL of methanol and 30 mL of heptane. The solid was further purified by MPLC with the CombiFlash Companion (silica gel, dichloromethane) to give 1.84 g (91% yield) of Compound 8 as a yellow solid.

ESI-MS (positive, m/z): exact mass of $C_{62}H_{65}BN_2$=848.52; found 849.8 [M+1]$^+$.

Compound 9

Intermediate 9-1

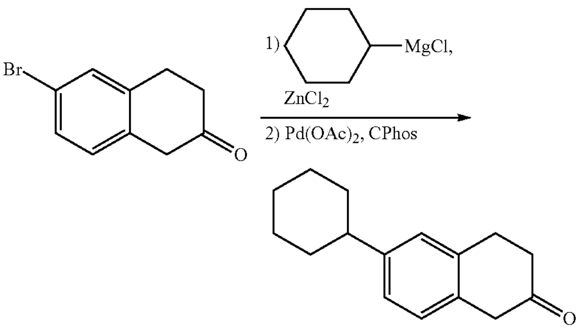

Intermediate 9-1

175 mL of zinc chloride solution (1.9 M in 2-methyltetrahydrofuran) was diluted with 175 mL of tetrahydrofuran and cooled down to 0° C. 300 ml of cyclohexylmagnesium chloride solution (1 M in 2-methyltetrahydrofuran) were added at a maximum temperature of 25° C. during 10 minutes. The reaction mixture was further stirred at 0° C. during 10 minutes, and then slowly added at a maximum temperature of 15° C. to a pre-cooled solution of 54.0 g (0.24 mol) of 6-bromo-2-tetralone, 0.34 g (1.5 mmol) palladium(II) acetate, and 1.30 g (3.0 mmol) of 2-dicyclohexylphosphino-2',6'-bis(N,N-dimethylamino)biphenyl (CPhos) in 540 mL of tetrahydrofuran. The resulting orange suspension was stirred at 0° C. during one hour, and the heated at 31° C. during for an additional hour. 0.34 g (1.5 mmol) palladium(II) acetate, and 1.30 g (3.0 mmol) of CPhos were added and heating continued for another two hours. The black suspension was cooled down to room temperature and filtered over a pad of celite filter aid, followed by rinsing the filter aid with 500 mL of cyclohexane. The combined eluents were mixed with 300 mL of water, and the organic solvents removed under vacuum. The residue was stirred with 600 mL of cyclohexane and 600 mL of ethyl acetate. The organic phase was separated and washed with 300 mL of water and 200 mL of saturated aqueous sodium chloride solution. The organic phase was dried over sodium sulfated and filtered over a pad of silica gel, followed by rinsing the silica gel with 300 ml of a solvent mixture of cyclohexane and ethyl acetate (2:1), and then with 300 mL of ethyl acetate. The combined eluents were concentrated under vacuum to give 59.6 g (87% yield) of Intermediate 9-1.

$^1$H NMR (300 MHz, $CD_2Cl_2$) δ 7.20-6.91 (m, 3H), 3.56 (s, 2H), 3.07 (t, 2H), 2.54 (m, 3H), 1.88 (m, 5H), 1.45 (m, 5H).

Intermediate 9-2

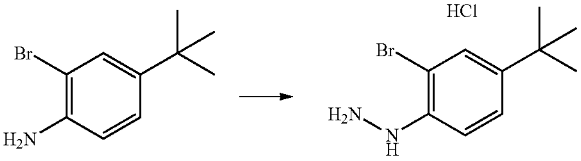

Intermediate 9-2

30.0 g (0.13 mol) of 1-bromo-4-(tert-butyl)aniline were suspended in 300 ml of 37% aqueous hydrochloride solution and cooled down to 0° C. 60.5 g (0.13 mol) of 15% aqueous sodium nitrated solution were dropwise added at a maximum temperature of 2° C. during 15 minutes. A solution of 74.8 g (0.40 mol) of tin chloride in 74.8 g of 37% aqueous hydrochloride was dropwise added at a maximum temperature of 5° C. furing 40 minutes. The thick suspension was stirred at 0° C. during 90 minutes. The suspension was filtered and the off-white residue washed with 150 mL of saturated aqueous sodium chloride and 200 ml of heptane. The remaining solid was dried under vacuum at 40° C. during 18 hours to give 31 g (84% yield) of Intermediate 9-2 as a white powder which was directly used in the next reaction step.

$^1H$ NMR (300 MHz, DMSO-$d_6$) δ 10.43 (br. s, 2H), 7.71 (s, 1H), 7.50 (d, 1H), 7.36 (dd, 1H), 7.14 (d, 1H), 1.25 (s, 9H).

Intermediate 9-3

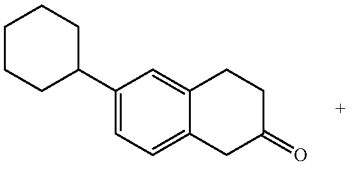

Intermediate 9-1

HCl

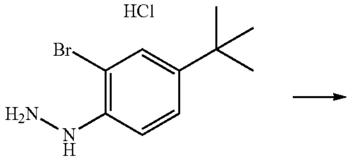

Intermediate 9-2

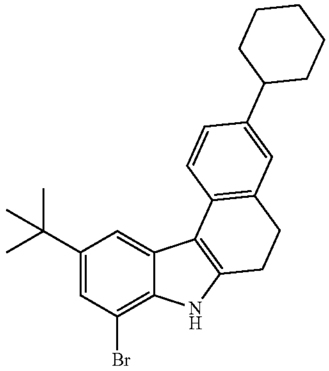

Intermediate 9-3

29.8 g (48.7 mmol) of Intermediate 9-1, and 15.0 g (48.7 mmol) of Intermediate 9-2 was mixed with 150 ml of a 4 N hydrochloride solution in dioxane, and 100 mL of dioxane. The yellow suspension was heated at 110° C. during 90 minutes. The orange suspension was cooled down to room temperature and filtered. The white solid was washed with dioxane, and the collected eluents diluted with water and 250 mL of toluene. The organic phase was separated and washed with sodium bicarbonate solution until a basic pH was reached, followed by washing with saturated aqueous sodium chloride solution, and drying over sodium sulfate. The mixture was filtered over a plug of silica gel, followed by rinsing the silica gel layer with cyclohexane. The collected eluents were concentrated under vacuum. The product was purified by MPLC with the CombiFlash Companion (silica gel, heptane/0-2% gradient of ethyl acetate) to give 14.7 g (69% yield) of Intermediate 9-3 as an orange solid.

ESI-MS (negative, m/z): exact mass of $C_{26}H_{30}BrN$=435.16; found 434.4 $[M+1]^+$.

Intermediate 9-4

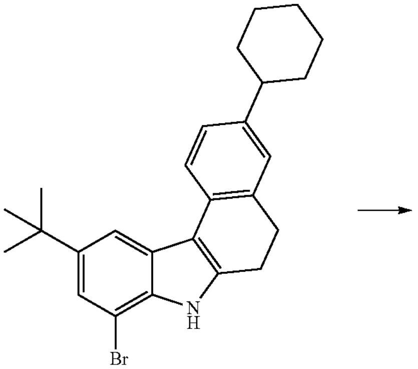

Intermediate 9-3

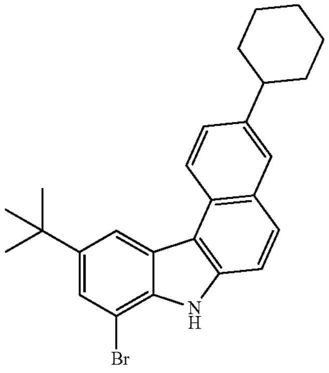

Intermediate 9-4

10.3 g (23.6 mmol) of Intermediate 9-3, and 6.10 g (24.8 mmol) of p-choranil in o-xylene were heated at 138° C. during six hours. The reaction mixture was cooled down to room temperature and diluted with ethyl acetate until a solution formed. The solution was mixed with 20 g of silica gel and concentrated under vacuum. The solid was further purified by MPLC with the CombiFlash Companion (silica gel, heptane/0-2% gradient of ethyl acetate) to give 9.2 g (89% yield) of Intermediate 9-4 as an orange solid.

ESI-MS (positive, m/z): exact mass of $C_{26}H_{28}BrN$=433.14; found 434.3 $[M+1]^+$.

Intermediate 9-5

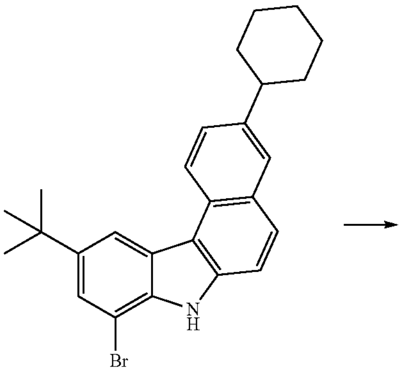

Intermediate 9-4

-continued

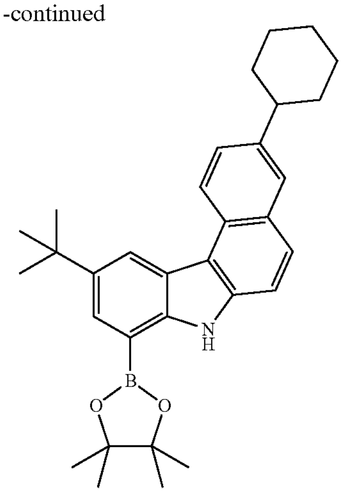

Intermediate 9-5

11.7 g (26.9 mmol) of Intermediate 9-4, 10.3 g (40.4 mmol) of bis(pinacolato)diboron, and 5.40 g (55.0 mmol) of potassium acetate were suspended in 110 mL of dioxane. 520 mg (1.09 mmol) of 2-dicyclohexylphosphino-2',4',6'-triisopropylbiphenyl (XPhos) and 250 mg (0.27 mmol) of &(dibenzylideneacetone)dipalladium(0) were added and the suspension heated at 66° C. during 15 hours. The orange suspension was cooled down and diluted with 140 mL of water. The suspension was stirred at room temperature and filtered. The solid was dissolved in ethyl acetate, and 50 g of celite filter aid was added. The mixture was concentrated under vacuum and subjected to MPLC purification with the CombiFlash Companion (silica gel, heptane/ethyl acetate 9:1) to give 9.3 g (72% yield) of Intermediate 9-5 as a light yellow solid.

ESI-MS (positive, m/z): exact mass of $C_{32}H_{40}BNO_2$=481.32; found 482.7 $[M+1]^+$.

Intermediate 9-6

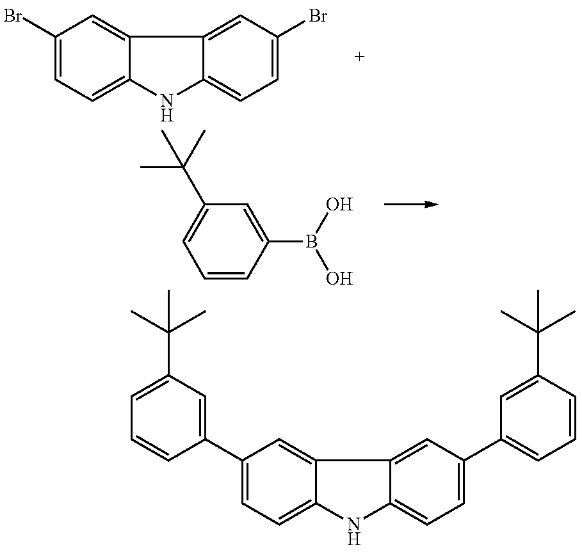

Intermediate 9-6

40.0 g (0.12 mol) of 3,6-dibromo-9H-carabzole, 43.8 g (0.25 mol) of 3-tert-butylphenylboronic acid, 2.13 g (1.85 mmol) tetrakis(triphenylphosphine)palladium(0), and 574 g of 10% aqueous sodium carbonate solution were suspended in 260 ml of toluene and 260 mL of ethanol. The suspension was three times evacuated and backfilled with argon and heated at 74° C. during two hours. The orange suspension was cooled down to room temperature an filtered. The solid was washed with toluene and water, and then dissolved in hot toluene. The hot solution was filtered over a pad of silica gel, followed by rinsing the silica with hot toluene. The combined eluents were concentrated under vacuum until a suspension formed, and cooled down to room temperature. The suspension was filtered and the solid washed with toluene to give 33.0 g (55% yield) of Intermediate 9-6 as a white solid.

ESI-MS (positive, m/z): exact mass of $C_{32}H_{33}N$=431.26; found 432.6 $[M+1]^+$.

Intermediate 9-7

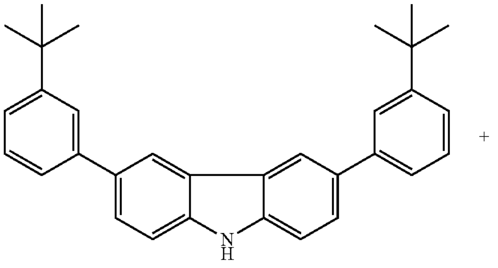

Intermediate 9-6

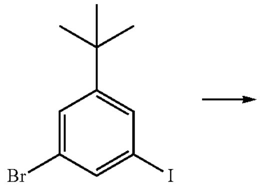

Intermediate 7-1

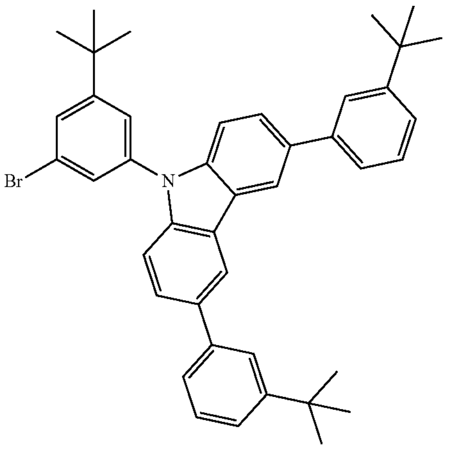

Intermediate 9-7

4.00 g (11.8 mmol) of Intermediate 7-1, 4.07 g (9.44 mmol) of Intermediate 9-6 225 mg (1.18 mmol) of copper(I) iodide, 404 mg (3.54 mmol) of cyclohexane-1,2-diamine, and 7.51 g (35.4 mmol) of potassium phosphate tribasic were suspended in 75 mL of 1,4-dioxane, and heated at 91° C. during six hours. The suspension was filtered through a 3 cm layer of silica gel followed by rinsing the silica gel with 100 mL of dioxane. The eluent was concentrated under vacuum, and the product was further purified by MPLC with the CombiFlash Companion (silica gel, heptane/0-20% gradient of dichloromethane) to give 5.46 g (90%) of Intermediate 9-7.

ESI-MS (positive, m/z): exact mass of $C_{42}H_{44}BrN$=641.27; found 642.6 $[M+1]^+$.

Intermediate 9-8

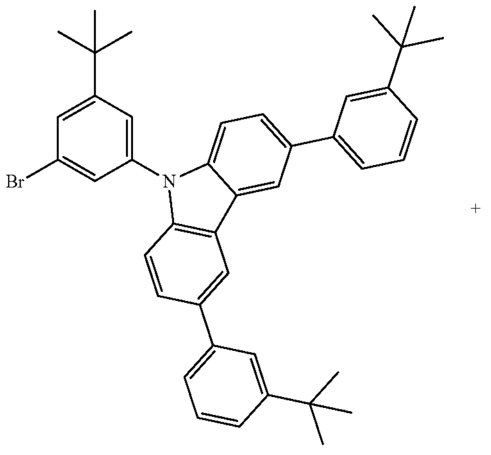

Intermediate 9-7

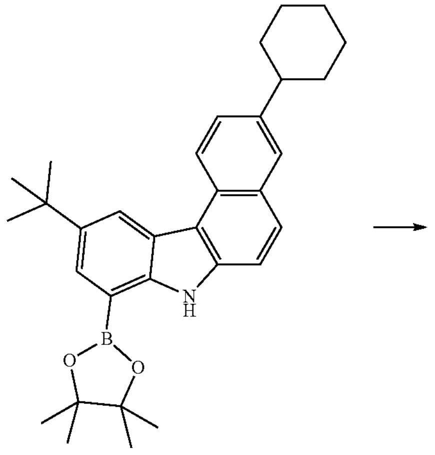

Intermediate 9-5

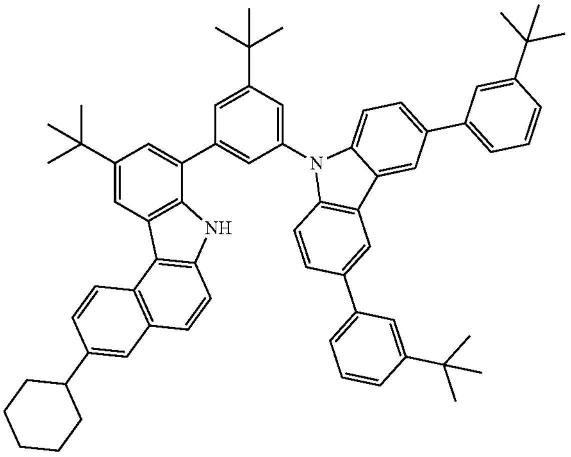

Intermediate 9-8

5.00 g (7.78 mmol) of Intermediate 9-7, 4.12 g (8.56 mmol) of Intermediate 9-5, 35 mg (0.16 mmol) of palladium (II) acetate, 383 mg (0.93 mmol) of 2-dicyclohexylphosphino-2',6'-dimethoxybiphenyl (SPhos), and 6.61 g (31.1 mmol) of potassium phosphate tribasic were dissolved in a mixture of 30 ml of toluene, 15 ml of 1,4-dioxane, and 10 ml of water. The solution was three times evacuated and backfilled with argon, and heated at 82° C. during three hours. The reaction mixture was cooled down to room temperature and diluted with 100 ml of toluene and treated with 100 ml of water. The organic phase was washed with water (3×50 ml), dried over sodium sulfate and concentrated under vacuum. The resulting oil was diluted with 30 ml of dichloromethane and 100 ml of ethanol. The solution was concentrated under vacuum to a volume of 100 ml and the resulting suspension was filtered and the solid washed with 50 ml of ethanol to give 4.7 g (66% yield) of Intermediate 9-8 as a white solid.

ESI-MS (positive, m/z): exact mass of $C_{68}H_{72}N_2$=916.57; found 918.0 $[M+1]^+$.

Compound 9

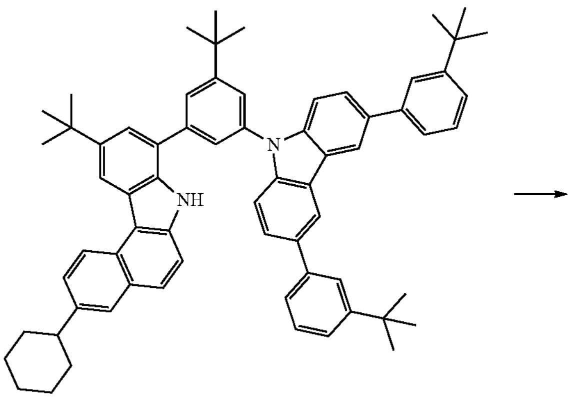

Intermediate 9-8

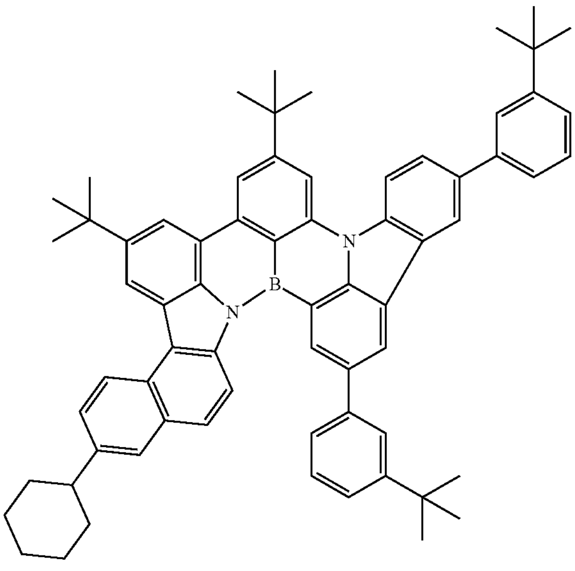

Compound 9

4.50 g (4.91 mmol) of Intermediate 9-8 were dissolved in 120 ml of 1,2-dichlorobenzene. 3.4 ml (19.6 mmol) of N,N-diisopropylethylamine and 9.8 ml of tribromoborane (1.0 M in heptane) were dropwise added. The brown solution was heated at 172° C. during four hours. The reaction mixture was cooled down, and 300 ml of methanol were added. The solution was concentrated under vacuum and the product purified by MPLC with the CombiFlash Companion (silica gel, dichloromethane). The isolated product was dissolved in 20 ml of dichloromethane and treated with 100 ml of acetonitrile. The resulting suspension was stirred during 30 minutes and filtered. The solid was washed with 100 ml of acetonitrile to give 3.86 g (85% yield) of Compound 9 s a yellow solid.

ESI-MS (positive, m/z): exact mass of $C_{58}H_{69}BN_2$=924.56; found 926.0 [M+1]$^+$.

Compound 10

Intermediate 10-1

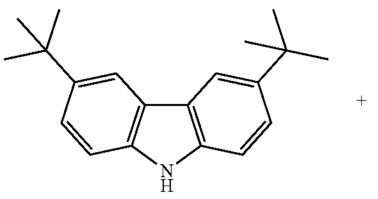

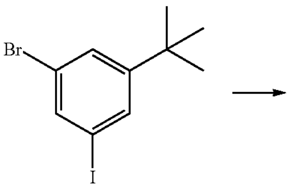

Intermediate 7-1

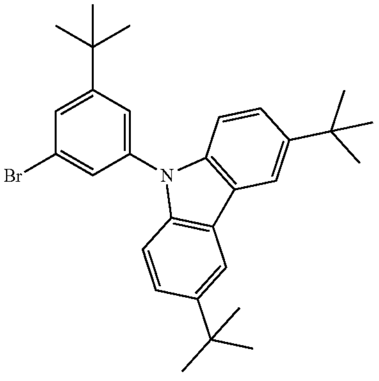

Intermediate 10-1

13.2 g (47.2 mmol) of 3,6-di-tert-9H-carbazole and 20.0 g (59.0 mmol) of Intermediate 7-1 were dissolved in 230 mL of dioxane. To the solution, 1.12 g (5.90 mmol) of copper(I) iodide and 2.02 g (17.7 mmol) of cyclohexane-1,2-diamine and 37.6 g (177 mmol) of potassium phosphate were added. The mixture was stirred at 95° C. for 6.5 hours. After the reaction mixture was cooled at room temperature, the solids were filtered and washed with toluene. The solution was washed with 3-amino-2-propanol in water. The organic layer was dried with sodium sulfate and the solvent was removed. The residue was purified by silica-gel column chromatography using heptane as eluent to give 19.8 g (86% yield) of Intermediate 10-1 as a beige solid.

ESI-MS: 491 [M+H]$^+$

Intermediate 10-2

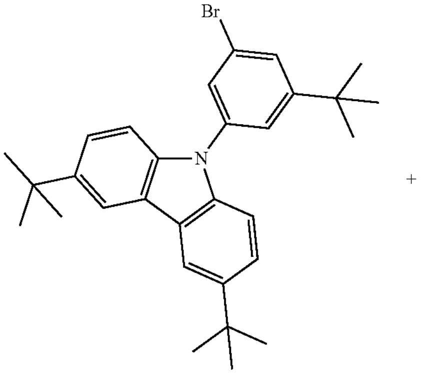

Intermediate 10-1

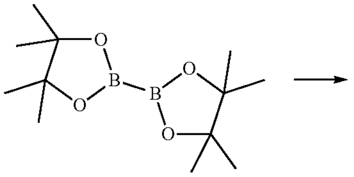

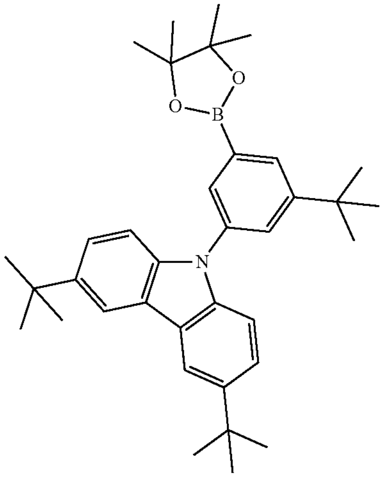

Intermediate 10-2

2.60 g (5.30 mmol) of Intermediate 10-1, 1.38 g (5.45 mmol) of bis(pinacolato)diborane, and 1.04 g (10.60 mmol) of sodium acetate were suspended to 27 mL of toluene. The suspension was degassed using 3 freeze-pump-thaw cycles, and 120 mg (0.13 mmol) of tris(dibenzylideneacetone) dipalladium(0) and 152 mg (0.51 mmol) of 2-dicyclohexylphosphino-2',4',6'-triisopropylbiphenyl were added to the mixture. After two additional freeze-pump-thaw cycles, the reaction mixture was heated to 110° C. for 6 hours. The reaction was cooled to room temperature and diluted with toluene and water. The aqueous layer was extracted with toluene and the organic layers were washed with brine and dried over magnesium sulfate, filtered, and the solution was concentrated. The crude product was recrystallized with dichloromethane and acetonitrile to give 2.69 g (80% yield) of Intermediate 10-2 as a white solid.

ESI-MS: 538.8 [M+H]$^+$

Intermediate 10-3

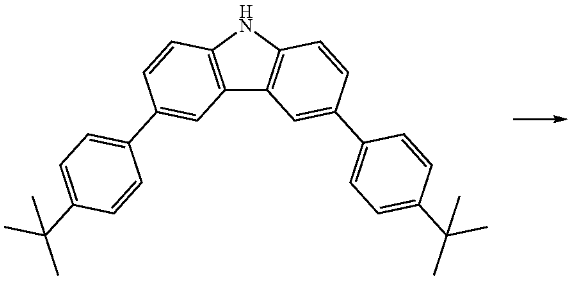

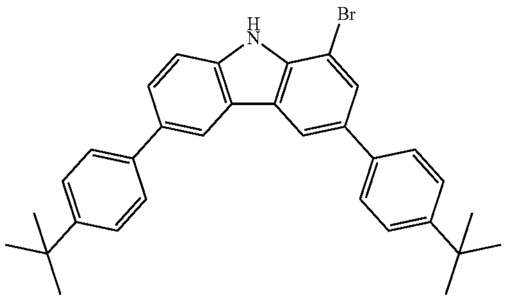

Intermediate 10-3

10.15 g (23.52 mmol) of 3,6-bis(4-(tert-butyl)phenyl)-9H-carbazole was suspended in THF, and 4.19 g (23.52 mmol) of N-bromosuccinimide was added portionwise. After the mixture was stirred at room temperature for 50 min, the reaction mixture was filtered off. The filtrate was concentrated. The crude product was purified by silica-gel column chromatography using a mixed solvent of heptane and dichloromethane as eluent. The product was precipitated in a mixed solvent of dichloromethane and heptane to give 10.21 g (85% yield) of Intermediate 10-3 as a white solid.

ESI-MS: 508 $[M-H]^-$

Intermediate 10-4

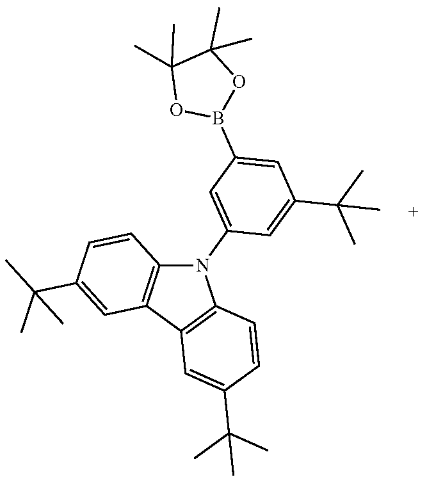

Intermediate 10-2

-continued

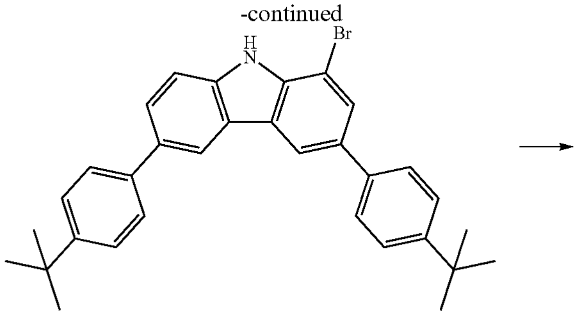

Intermediate 10-3

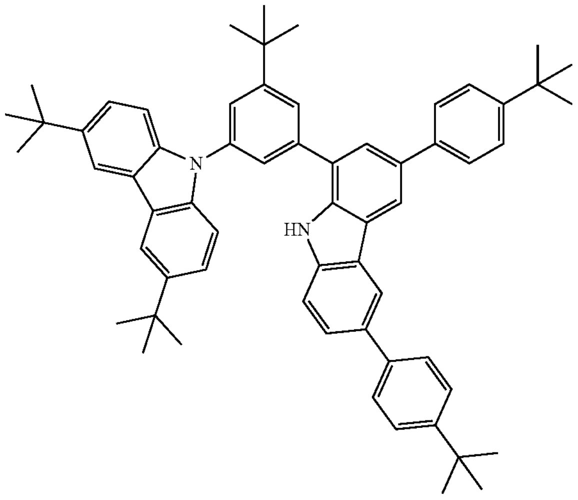

Intermediate 10-4

1.37 g (2.68 mmol) of Intermediate 10-3, 2.55 g (4.03 mmol) of Intermediate 10-2, and 2.28 g (10.73 mmol) potassium phosphate were dissolved in 18 mL of toluene, 9 mL of dioxane, and 6 mL of water. After the solution was degassed using 3 freeze-pump-thaw cycles, 12 mg (0.05 mmol) palladium acetate and 132 mg (0.32 mmol) of 2-dicyclohexylphosphino-2', 6'-dimethoxybiphenyl were added to the mixture. Then, after two additional freeze-pump-thaw cycles, the mixture was stirred to 85° C. for 16.5 hours. The reaction was cooled to room temperature and diluted with toluene. The organic extracts were washed with water and dried over sodium sulfate, filtered, and the solution was concentrated. The residue was purified by silica-gel column chromatography using mixed solvent of heptane and toluene as an eluent to give 2.11 g (93% yield) of Intermediate 7-2 as a white solid.

ESI-MS: 839.8 $[M+H]^+$

Compound 10

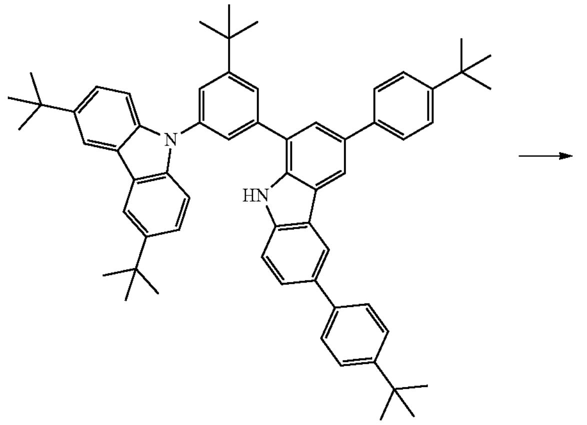

Intermediate 10-4

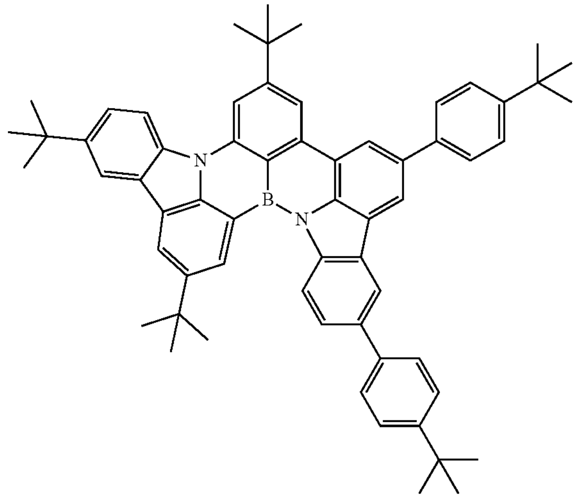

Compound 10

2.11 g (2.51 mmol) of Intermediate 10-4 was dissolved in 36 mL of dichlorobenzene. Then, 5.14 mL (5.12 mmol) of 1.0 M boron tribromide in heptane followed by 1.8 mL (10.28 mmol) of N,N-diisopropylethylamine were added to the solution, and the mixture was stirred at 180° C. for 15 hours. The reaction was cooled to room temperature and diluted with methanol. The precipitate was collected by filtration, and washed with ethanol and water. The crude product was dissolved in dichloromethane and precipitated with iso-propanol followed by filtration to give 1.77 g (83% yield) of Compound 10 as a yellow solid.

ESI-MS: 849.7 $[M+H]^+$

Compound 11

Intermediate 11-1

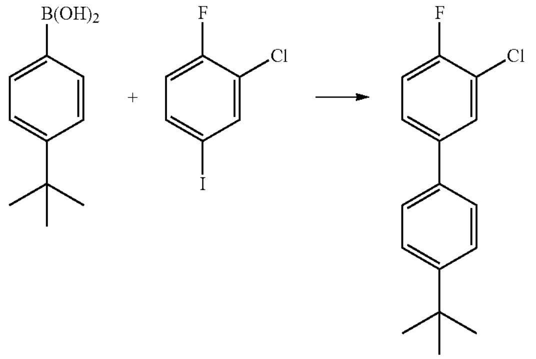

Intermediate 11-1

23.5 g (112 mmol) of 4-bromo-2-chloro-1-fluorobenzene, 20.2 g (112 mmol) of 4-(tert-butyl)phenyl boronic acid were suspended in a mixture of 130 mL of toluene, 130 mL of ethanol, and 250 mL of 10% aqueous sodium carbonate. The mixture was degassed by bubbling $N_2$ gas for 30 min, and 3.9 g (3 mol %) of tetrakis(triphenylphosphine)palladium(0) were added to the reaction mixture under a light $N_2$ flow. The reaction mixture was heated to reflux for 2 hours, then cooled to room temperature. The reaction mixture was extracted with toluene and the organic phase was washed with water and brine, dried over magnesium sulfate and filtered over a small pad of silica-gel. The product was eluted with heptane, and the solvents were removed on the rotavap. The crude product was used without further purification as Intermediate 11-1.

$^1$H NMR (300 MHz, Methylene Chloride-$d_2$) δ 7.68 (dd, J=7.1, 2.3 Hz, 1H), 7.53 (m, 5H), 7.26 (t, J=8.8 Hz, 1H), 1.40 (s, 9H).

$^{19}$F NMR (282 MHz, Methylene Chloride-$d_2$) δ −119.44.

Intermediate 11-2

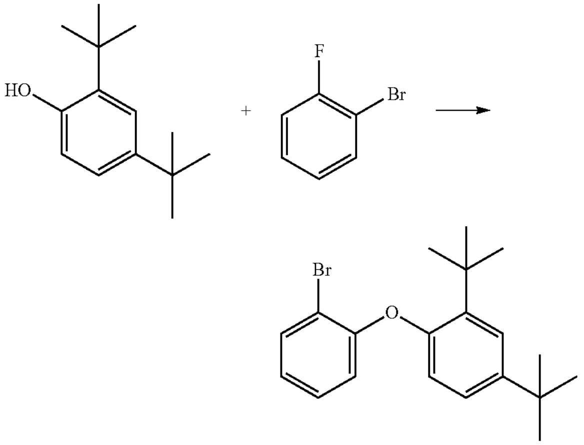

Intermediate 11-2

260 g (1.26 mol) of 2,4-di-tert-butylphenol and 330 g (1.89 mol) of 1-bromo-2-fluorobenzene were added to 5.70 L of N-methylpyrrolidone, and 821 g (2.52 mol) of cesium carbonate were added. The mixture was stirred at 170° C. for 90 hours. The reaction was cooled to room temperature and water was added there. The organic layer was collected. After concentration, the residue was purified by silica-gel column chromatography using heptane as eluent to give 409 g (90% yield) of Intermediate 11-2 as a beige solid.

The product was used without further purification.

Intermediate 11-3

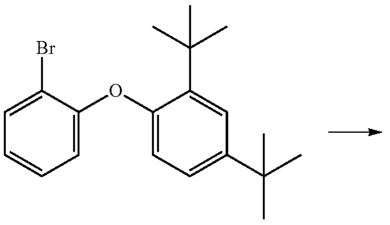

Intermediate 11-2

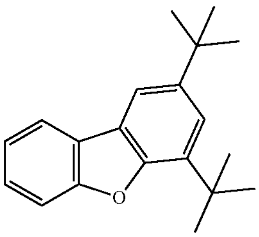

Intermediate 11-3

399 g (1.10 mol) of Intermediate 11-2 were dissolved in 1.40 L of N-methylpyrrolidone, and then 821 g (2.52 mol) of cesium carbonate were added. Under argon atmosphere, 17.38 g (66.3 mmol) of triphenyl phosphine and 7.44 g (33.1 mmol) of palladium(II) acetate were added. The mixture was stirred at 120° C. for 3 hours. The reaction was cooled to room temperature and water was added. The organic layers were collected, and washed with brine. After concentration, the residue was purified by silica-gel column chromatography using toluene as eluent. The main fraction was partly concentrated and precipitated by replacement of the solvent with heptane, followed by filtration to give 227 g (73% yield) of Intermediate 11-3 as a white solid.

ESI-MS: 280 $[M+H]^+$

Intermediate 11-4

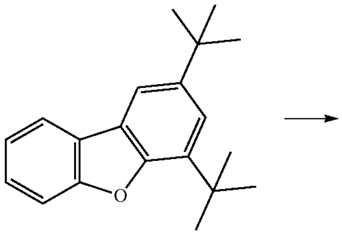

Intermediate 11-3

-continued

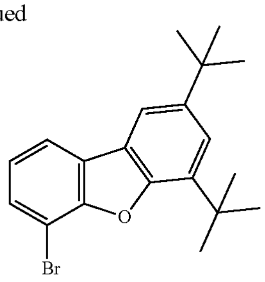

Intermediate 11-4

118 g (421 mmol) of Intermediate 11-3 were dissolved in 1.20 L of THF, and the solution was cooled at 5° C. Under argon atmosphere, 400 ml (620 mmol) of 1.55 M n-butyllithium in hexane were added dropwise at 5° C. After the reaction mixture was cooled at −60° C., 118 g (631 mmol) of 1,2-dibromoethane were added, and the mixture was stirred for 17 hours. To the reaction mixture, 500 ml of water was added, and the aqueous phase was extracted with toluene. The organic phases were collected, and washed with brine. After concentration, the residue was purified by silica-gel column chromatography using toluene as eluent. The main fraction was concentrated. The product was dissolved in hot heptane, and recrystallized with an ice-water bath to give 77 g (51% yield) of Intermediate 11-4 as a white solid.

ESI-MS: 360 $[M+H]^+$

Intermediate 11-5

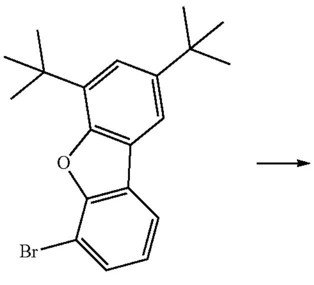

Intermediate 11-4

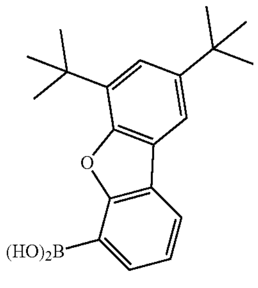

Intermediate 11-5

Under an inert atmosphere, 9.57 ml of n-butyllithium (1.6 M in hexanes) were added dropwise to a solution of 5.00 g (13.9 mmol) Intermediate 11-4 in 50 mL tetrahydrofuran while keeping the temperature below −60° C. using an acetone-dry ice bath. After the addition was complete, the reaction was stirred for 15 minutes at −78° C. 2.20 mL (19.7 mmol) of trimethylborate were then added slowly while keeping the temperature below −60° C. After the addition was complete, the reaction was stirred for 15 minutes at −78° C., and then warmed slowly to room temperature, and stirred for 17 hours to give a milky solution. 50 mL of 10% HCl solution were added to the reaction, and the yellow biphasic mixture was stirred for 1 hour. The resulting mixture was extracted with ethyl acetate, and the organic extracts were washed with water and brine, dried over magnesium sulfate and filtered over a short pad of silica-gel. The solvents were removed on the rotavap to give a 4.25 g (60% yield) of Intermediate 11-5 as a white solid.

$^1$H NMR (300 MHz, DMSO-$d_6$) δ 8.24-8.14 (m, 2H), 7.97 (d, J=1.9 Hz, 1H), 7.41-7.33 (m, 2H), 1.48 (s, 9H), 1.39 (s, 9H).

Intermediate 11-6

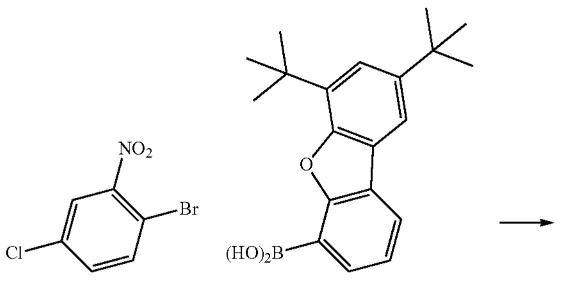

Intermediate 11-5

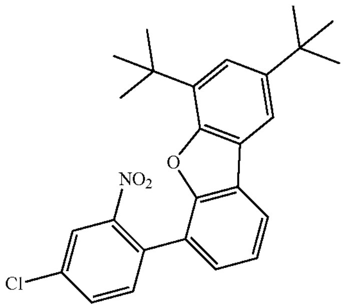

Intermediate 11-6

7.00 g (29.6 mmol) of 1-bromo-4-chloro-2-nitrobenzene, 10.1 g (31.1 mmol) of Intermediate 11-were suspended in a mixture of 70 mL of toluene, 70 mL of ethanol, and 70 mL of 10% aqueous sodium carbonate. The mixture was degassed by bubbling $N_2$ gas for 30 min, and 0.80 g (2.2 mol %) of tetrakis(triphenylphosphine)palladium(0) were added to the reaction mixture under a light $N_2$ flow. The reaction mixture was heated to reflux for 2 hours, then cooled to room temperature. The reaction mixture was extracted with heptane and the organic phase was washed with water and brine, dried over magnesium sulfate and the solvents were removed on the rotavap. The crude product was dissolved in a 1:1 mixture of dichloromethane/ethanol, and concentrated on the rotavap until a yellow suspension formed. The suspension was stirred at room temperature for 1 hour and filtered to give 10.4 g (80% yield) of Intermediate 11-6 as a bright yellow solid.

$^1$H NMR (300 MHz, Methylene Chloride-$d_2$) δ 8.20 (d, J=2.2 Hz, 1H), 8.08 (dd, J=7.4, 1.6 Hz, 1H), 7.92 (d, J=2.0 Hz, 1H), 7.79 (dd, J=8.3, 2.2 Hz, 1H), 7.65 (d, J=8.3 Hz, 1H), 7.55-7.36 (m, 3H), 1.47 (d, J=3.2 Hz, 18H).

Intermediate 11-7

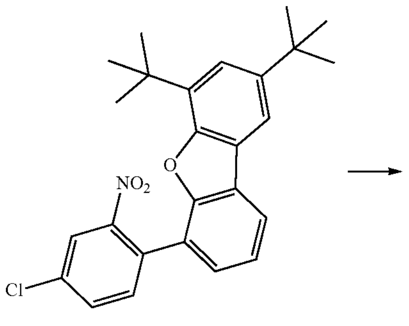

Intermediate 11-6

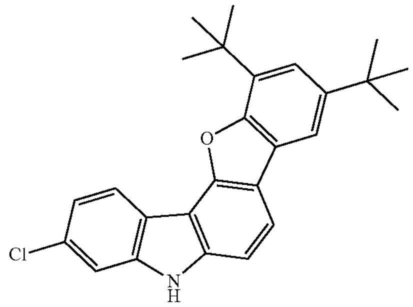

Intermediate 11-7

10.4 g (23.9 mmol) of Intermediate 11-6 and 15.8 g (59.6 mmol) of triphenyl phosphine were dissolved in 100 mL of 1,2-dichlorobenzene and heated to reflux for 3 hours. The 1,2-dichlorobenzene and triphenyl phosphine were then distilled under reduced pressure, and the red oil was cooled and heptane was added with stirring. The resulting orange suspension was stirred at room temperature, then at 0° C. for 30 minutes, before filtering. The solvent from the filtrate was removed on the rotavap, and the crude product was purified by silica-gel column chromatography using a mixture of heptane and toluene to give an off-white solid. The solid was dissolved in refluxing ethanol, and precipitated by adding water at room temperature. The resulting suspension was filtered and subsequent crops combined to give 8.0 g (83% yield) Intermediate 11-7 as a white solid.

ESI-MS: 402.4 [M−H]$^-$

Intermediate 11-8

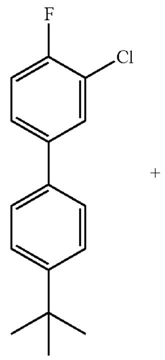

Intermediate 11-1

-continued

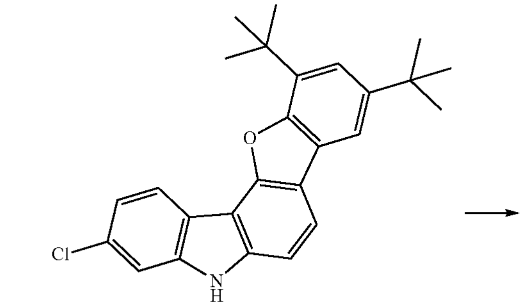

Intermediate 11-7

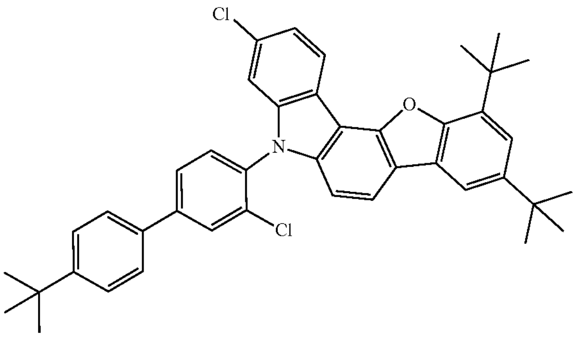

Intermediate 11-8

10.4 g (39.6 mmol) of Intermediate 11-1, 8.00 g (19.8 mmol) of Intermediate 11-7, and 8.41 g (39.6 mmol) of potassium phosphate were suspended in 80 ml of N,N-dimethylformamide and heated to 110° C. for 5 hours. The suspension was then cooled to 100° C., and water was slowly added. The resulting off-white suspension was cooled to room temperature and filtered. The crude solid was triturated 3 times in a 9:1 mixture of hot ethanol/water to give 12.5 g (96% yield) Intermediate 11-8 as a white solid.

ESI-MS: 646.6 $[M+H]^+$

Intermediate 11-9

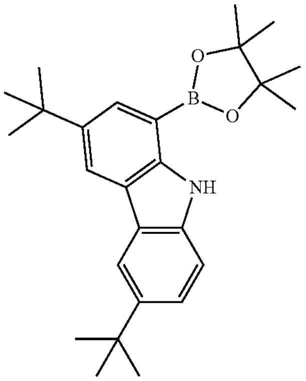

Intermediate 2-3

-continued

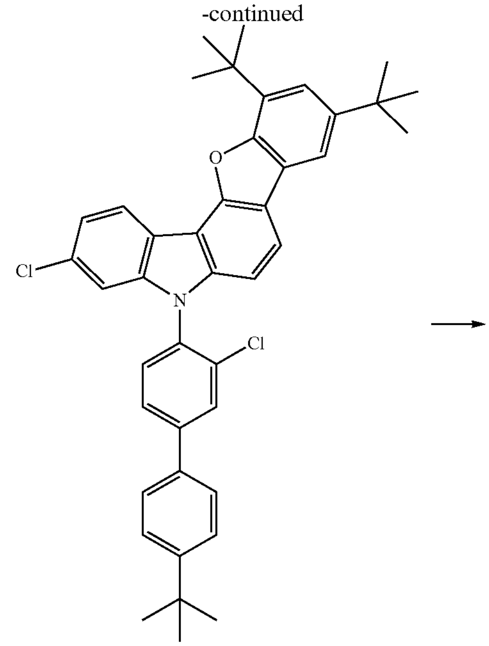

Intermediate 11-8

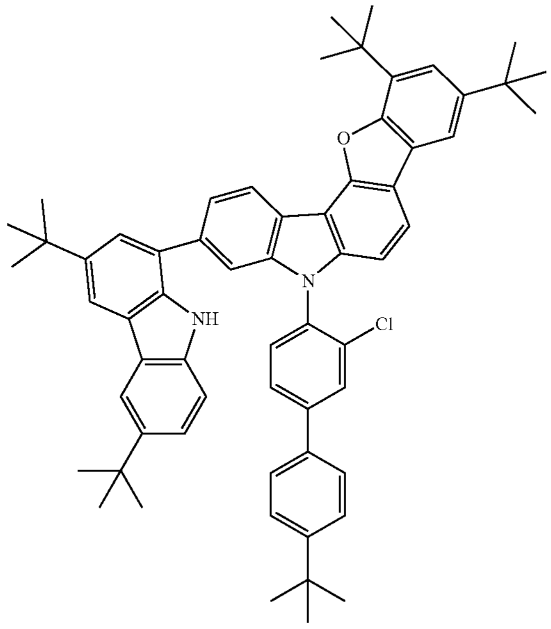

Intermediate 11-9

4.00 g (6.20 mmol) of Intermediate 11-8 and 5.2 g (24.8 mmol) of potassium phosphate were dissolved in a mixture of 120 mL dioxane and 30 mL water, and the mixture was degassed by bubbling $N_2$. 312 mg (12 mol %) of SPhos and 30 mg (2 mol %) palladium(II) acetate were added, and the reaction was heated to 85° C. A previously degassed solution of 3.52 g (8.68 mmol) Intermediate 2-3 in 56 mL dioxane (0.155M) was added dropwise over 45 minutes, and the reaction mixture was then heated to 95° C. for 3 hours. The reaction was cooled to room temperature and poured into water. The resulting precipitate was stirred for 30 minutes and filtered. The crude solid was dissolved in dichloromethane and the organic phase was washed with water and brine. The organics were dried over magnesium sulfate, and 0.5 g of active charcoal were added before refluxing for 30 minutes. The suspension was filtered over a pad of silica-gel, and the product eluted with more dichloromethane. Methanol was added to the filtrate, and the mixture was concentrated on the rotavap until a precipitated formed. The suspension was cooled to room temperature and filtered. The solid was purified by silica-gel column chromatography using a mixture of heptane and dichloromethane to give 3.1 g (28% yield) of Intermediate 11-9 as a white foam.

ESI-MS: 889.9 $[M+H]^+$

Compound 11

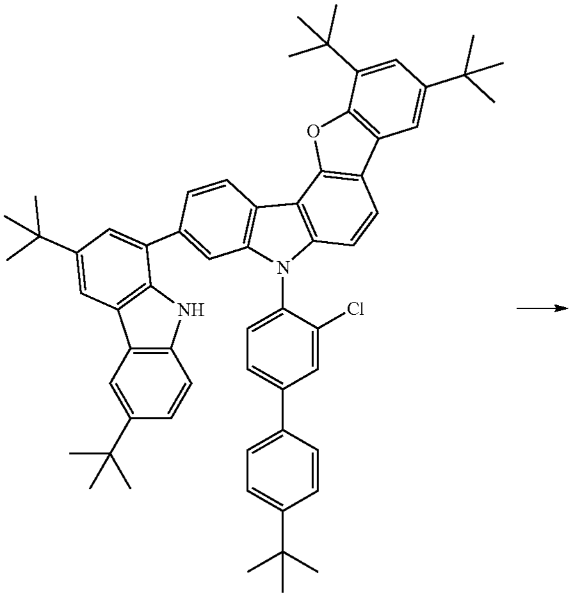

Intermediate 11-9

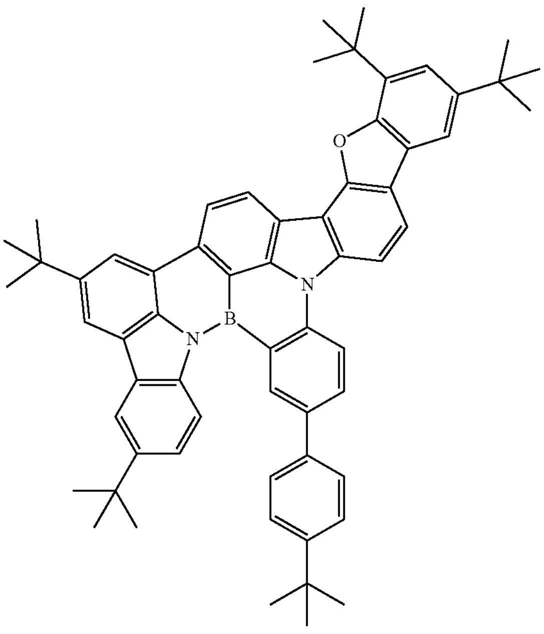

Compound 11

Under an inert atmosphere, 3.50 mL of tert-butyllithium (1.9M in hexanes) were added dropwise to a solution of 1.95 g (2.19 mmol) of Intermediate 11-9 in 200 mL tert-butylbenzene while keeping the temperature below −50° C. using an acetone-dry ice bath. After the addition was complete, the reaction was heated to 45° C. for 1 hour, cooled to −78° C. and 0.35 mL (3.70 mmol) of borontribromide were then added slowly while keeping the temperature below −60° C. The reaction was warmed to room temperature, 1.10 mL (6.58 mmol) of N,N-diisopropylethylamine were added, and the mixture was heated to 150° C. for 17 hours. The reaction was then cooled to room temperature, quenched with water and filtered. The biphasic filtrate was extracted with toluene, and the organic phase was washed twice with 10% aqueous sodium carbonate, followed by brine. The organic extracts were dried over magnesium sulfate and filtered over a pad of silica-gel. The bright orange solution was concentrated on the rotavap to approximately 100 mL, and to this was added 300 mL ethanol. The precipitate was cooled to room temperature and stirred for 17 h before filtering. The resulting solid was purified by silica-gel chromatography using a mixture of heptane and dichloromethane. The resulting resin was dissolved in 200 mL dichloromethane and 200 mL ethanol, and concentrated on the rotavap at 60° C. until a suspension formed. This was then filtered hot, and the solid was washed with some cold ethanol to give 215 mg (11.4% yield) of Compound 11 as a bright yellow solid.

ESI-MS: 864.0 $[M+H]^+$

Compound 12

Intermediate 12-1

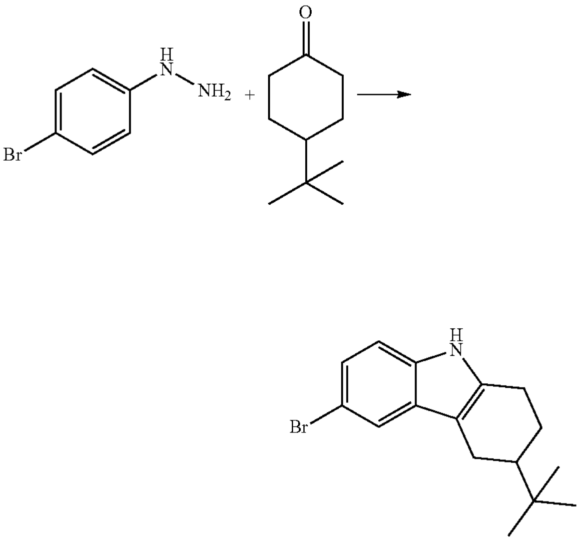

Intermediate 12-1

To 30.0 g (134 mmol) 4-bromophenyl)hydrazine hydrochloride in 270 mL acetic acid, 20.7 g (134 mmol) 4-(tert-butyl)cyclohexan-1-one were added dropwise at 80° C. under nitrogen. Then the reaction mixture was stirred at 100° C. for 5 hours.

The solvent was removed in vacuum and the reaction mixture was dissolved in toluene. The organic phase was washed with water and then with a sodium hydrogen carbonate solution. The organic phase was dried with magnesium sulfate and the solvent was removed in vacuum. The product was used without purification for the next reaction step. Yield 41.0 g Intermediate 12-2

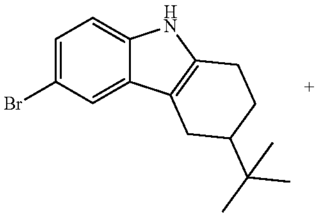

Intermediate 12-1

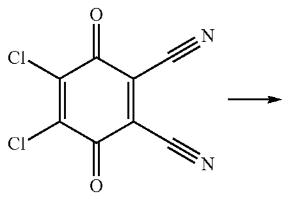

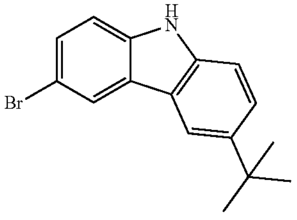

Intermediate 12-2

To 41.0 g (134 mmol) 6-bromo-3-(tert-butyl)-2,3,4,9-tetrahydro-1H-carbazole in 250 mL toluene, 60.8 g (268 mmol) 2,3-dichloro-5,6-dicyanoquinone were added during 10 min under nitrogen. The reaction was exothermic. Then the reaction mixture was stirred for 1 hour at 25° C. The solids were filtered of and were washed with toluene. The organic phase was washed with a 10% sodium hydroxide solution in water. The organic phase was washed with water, brine and was dried with magnesium sulfate. The solvent was removed in vacuum. Column chromatography on silica gel with heptane/ethyl acetate 95/5 gave the product. Yield 21.6 g (52%)

$^1$H-NMR (300 MHz, DMSO-d6) δ=11.3 (s, 1H), 8.39 (s, 1H), 8.19 (s, 1H), 7.45 (m, 4H), 1.40 (s, 9H).

Intermediate 12-3

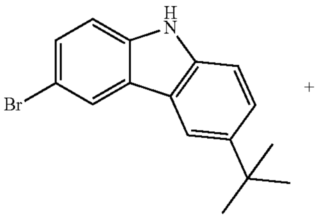

Intermediate 12-2

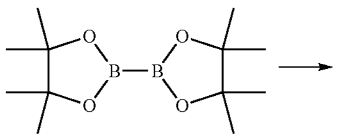

-continued

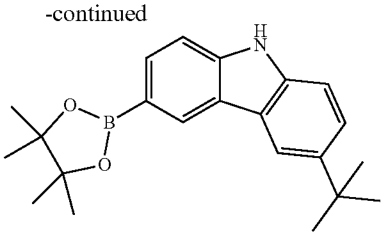

Intermediate 12-3

To 17.9 g (59 mmol) 6-bromo-3-(tert-butyl)-2,3,4,9-tetrahydro-1H-carbazole in 300 mL dioxane and 50 mL water, 27.1 g (107 mmol) 4,4,4',4',5,5,5',5'-octamethyl-2,2'-bi(1,3,2-dioxaborolane) and 17.4 g (178 mmol) potassium acetate were added. The reaction mixture was degassed with argon. 542 mg (0.592 mmol) tris(dibenzylideneacetone)dipalladium(0) and 564 mg (1.18 mmol) 2-dicyclohexylphosphino-2',4',6'-triisopropylbiphenyl (XPhos) were added. The reaction mixture was degassed with argon. The reaction mixture was stirred at 110° C. under argon for 8 hours. The solids were filtered of and the water phase was removed. The solvent was removed in vacuum. Column chromatography on silica gel with heptane/ethyl acetate 90/10 gave the product. Yield 11.7 g (55%)

$^1$H-NMR (300 MHz, DMSO-d6) δ=11.27 (s, 1H), 8.52 (d, 1H), 8.51 (s, 1H), 7.71 (d, 1H), 7.45 (m, 3H), 1.41 (s, 9H), 1.33 (s, 12H).

Intermediate 12-4

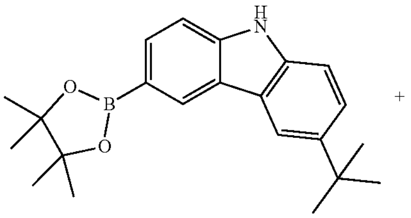

Intermediate 12-3

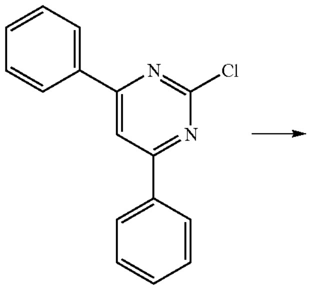

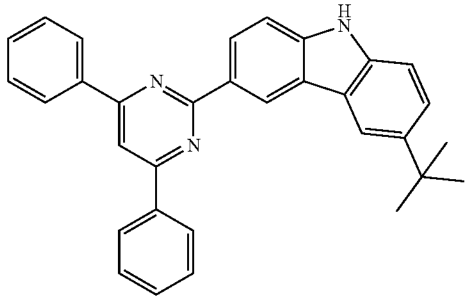

Intermediate 12-4

To 11.7 g (33.4 mmol) 3-(tert-butyl)-6-(4,4,5,5-tetramethyl-1,3,2-dioxaborolan-2-yl)-9H-carbazole in 120 ml xylene, 70 mL dioxane and 50 ml water, 9.81 g (36.8 mmol) 2-chloro-4,6-diphenylpyrimidine and 11.6 g (84.0 mmol) potassium carbonate were added. The reaction mixture was degassed with argon. 1.16 g (1.00 mmol) tetrakis(triphenylphosphine)palladium(0) were added. The reaction mixture was degassed with argon. The reaction mixture was stirred at 110° C. under argon for 8 hours. The water phase was removed. The solvent was removed in vacuum. Column chromatography on silica gel with heptane/ethyl acetate 95/5 and heptane/ethyl acetate 90/10 gave the product. Yield 6.75 g (44%)

ESI-MS: 454 $[M+1]^+$ $^1$H-NMR (300 MHz, DMSO-d6) δ=11.42 (s, 1H), 9.42 (d, 1H), 8.76 (m, 1H), 8.58 (m, 4H), 8.47 (s, 1H), 8.35 (s, 1H), 7.66 (m, 9H), 1.46 (s, 9H).

Intermediate 12-5

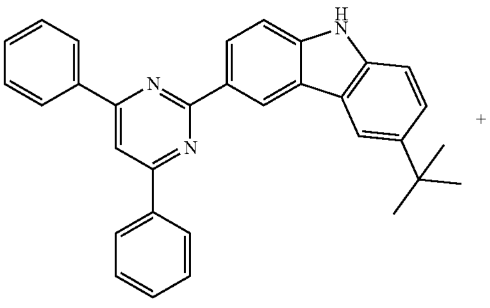

Intermediate 12-4

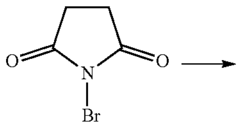

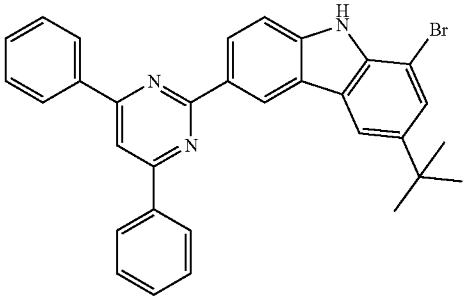

Intermediate 12-5

To 6.75 g (14.9 mmol) 3-(tert-butyl)-6-(4,6-diphenylpyrimidin-2-yl)-9H-carbazole in 60 mL acetic acid 2.65 g (14.9 mmol)N-bromosuccinimide was added and the reaction mixture was stirred at 20° C. under nitrogen. After 2.5 hours the product was filtered of and was washed with acetic acid and than methanol. Column chromatography on silica gel with heptane/ethyl acetate 97/3 gave the product. Yield 4.00 g (39%). The product was crystalized from toluene.

$^1$H-NMR (300 MHz, DMSO-d6) δ=11.61 (s, 1H), 9.45 (m, 1H), 8.84 (m, 1H), 8.58 (m, 4H), 8.49 (s, 1H), 8.41 (s, 1H), 7.67 (m, 8H), 1.46 (s, 9H)

Intermediate 12-6

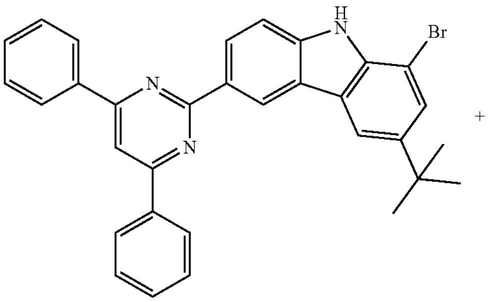

Intermediate 12-5

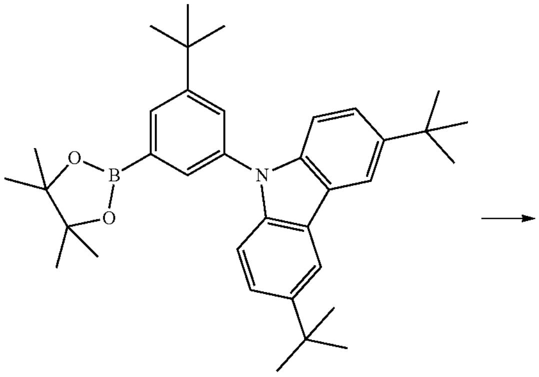

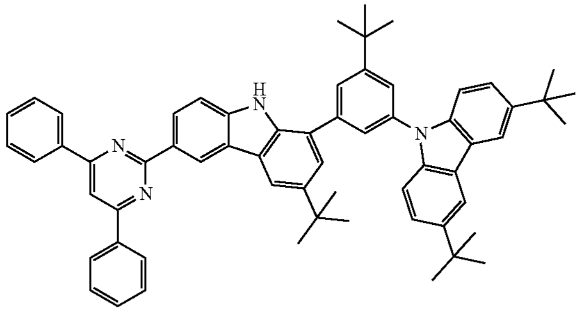

Intermediate 12-6

To 1.52 g (2.85 mmol) 1-bromo-3-(tert-butyl)-6-(4,6-diphenylpyrimidin-2-yl)-9H-carbazole in 30 ml toluene, 15 ml dioxane and 10 ml water, 1.61 g (3.00 mmol) 3,6-di-tert-butyl-9-(3-(tert-butyl)-5-(4,4,5,5-tetramethyl-1,3,2-dioxaborolan-2-yl)phenyl)-9H-carbazole and 1.82 g (8.56 mmol) tri potassium phosphate were added. The reaction mixture was degassed with argon. 94 mg (0.23 mmol) dicyclohexyl(2',6'-dimethoxy[1,1'-biphenyl]-2-yl)phosphane SPhos and 26 mg (0.114 mmol) palladium(II) acetate were added. The reaction mixture was degassed with argon. The reaction mixture was stirred at 70° C. under argon for 1 h. The solids were filtered of and are washed with heptane. The organic phase was dried with magnesium sulfate and the solvent was removed in vacuum. Column chromatography on silica gel with heptane/ethyl acetate 95/5 gave the product. Yield 2.19 g (88%)

$^1$H-NMR (300 MHz, DMSO-d6) δ=11.38 (s, 1H), 9.49 (d, 1H), 8.78 (d, 1H), 8.58 (m, 4H), 8.45 (m, 2H), 8.33 (m, 2H), 7.64 (m, 15H), 1.51 (s, 18H), 1.43 (s, 18H).

Compound 12

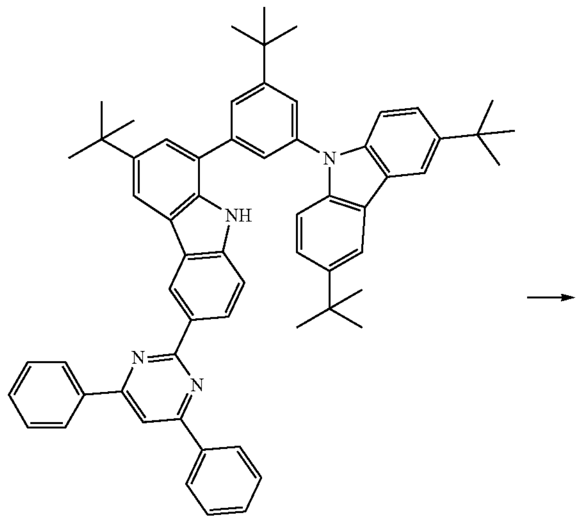

Intermediate 12-6

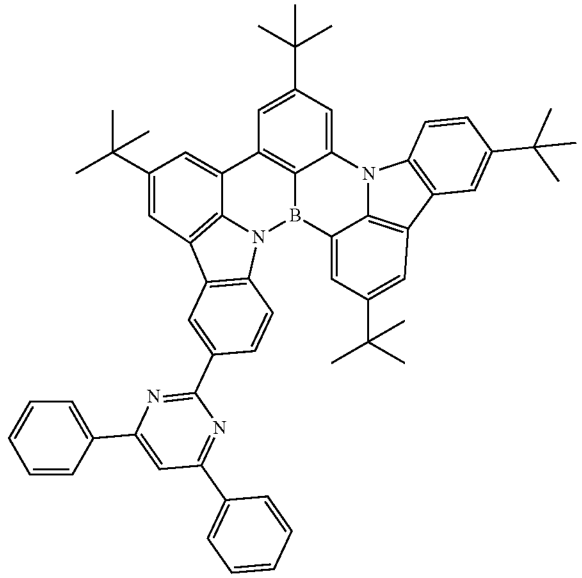

Compound 12

To 1.98 g (2.29 mmol) 3-(tert-butyl-1-(3-(tert-butyl)-5-(3,6-di-tert-butyl-9H-carbazol-9-yl)phenyl)-6-(4,6-diphenylpyrimidin-2-yl)-9H-carbazole in 26 mL o-dichlorobenzene, 1.19 g (9.18 mmol)N-ethyl-N-isopropylpropan-2-amine were added under argon. To the reaction mixture 4.59 mL (4.50 mmol) of a 1 M solution of tri bromoborane in heptane were added during 5 min under argon. The reaction mixture was stirred 2.5 hours at 185° C. under argon. The reaction mixture was cooled to 25° C. and methanol was added. The product was filtered of and was washed with methanol. Column chromatography on silica gel with dichloromethane 100% gave the product.

Yield 1.71 g (77%).

ESI-MS: 871.8 $[M+1]^+$ $^1$H-NMR (300 MHz, $CDCl_3$) δ=9.65 (s, 1H), 9.06 (m, 2H), 8.91 (d, 1H), 8.65 (m, 3H), 8.49 (m, 9H), 7.81 (m, 1H), 7.63 (m, 6H), 1.71 (s, 18H), 1.68 (s, 9H), 1.58 (s, 9H).

Compound 13

Intermediate 13-1

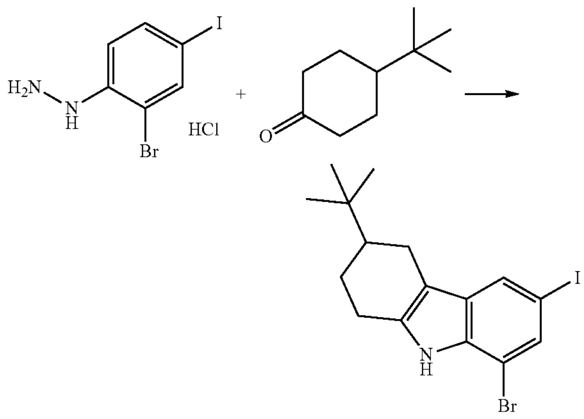

Intermediate 13-1

16.62 g (47.70 mmol) of (2-bromo-4-iodophenyl)hydrazine hydrochloride and 7.36 g (47.70 mmol) of 4-(tert-butyl) cycloheanone were added in 95 mL of acetic acid, and the mixture was stirred at 100° C. for 2 h. After the reaction mixture was cooled at room temperature, the solid was collected by filtration and washed out with ethyl acetate. The filtrate was concentrated, and then the residue was purified by silica-gel column chromatography using a mixed solvent of heptane and dichloromethane as eluent to give 11.2 g (54% yield) of Intermediate 13-1 as white solid.

ESI-MS: 433 $[M+H]^+$

Intermediate 13-2

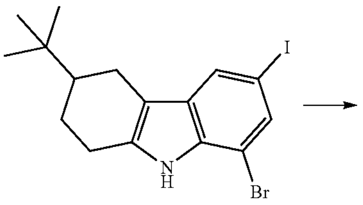

Intermediate 13-1

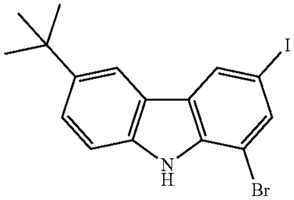

Intermediate 13-2

7.03 g (16.27 mmol) of Intermediate 13-1 and 7.39 g (32.50 mmol) of 2,3-dichloro-5,6-dicyanoquinone were added in 60 mL of toluene, and the mixture was stirred at 100° C. for 2.5 hours. After the reaction mixture was cooled at room temperature, the solid was removed by filtration and washed out with toluene. The filtrate was concentrated, and then the residue was purified by silica-gel column chromatography using a mixed solvent of heptane and dichloromethane as eluent to give 4.73 g (68% yield) of Intermediate 13-2 as a beige powder.

ESI-MS: 427 $[M+H]^+$

Intermediate 13-3

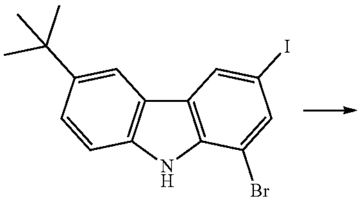

Intermediate 13-2

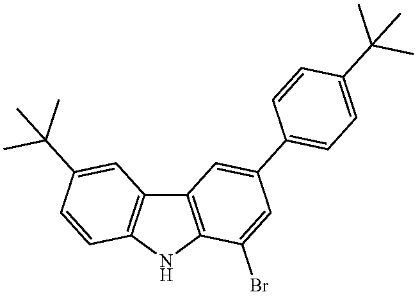

Intermediate 13-3

4.28 g (10.00 mmol) of Intermediate 13-2, 1.78 g (10.00 mmol) of 4-tert-butylbenzeneboronic acid, and 2.76 g (19.99 mmol) potassium carbonate were dissolved in 50 mL of toluene, 10 mL of ethanol, and 10 mL of water. After the solution was degassed using 3 freeze-pump-thaw cycles, 578 mg (0.50 mmol) tetrakis(triphenylphosphine)palladium were added to the mixture. Then, after two additional freeze-pump-thaw cycles, the mixture was stirred to 70° C. for 20 hours. The reaction was cooled to room temperature and diluted with toluene. The organic extracts were washed with water and dried over sodium sulfate, filtered, and the solution was concentrated. The residue was purified by silica-gel column chromatography using mixed solvent of heptane and toluene as an eluent to give 3.56 g (82% yield) of Intermediate 13-3 as a white solid.

ESI-MS: 433 $[M-H]^-$

Intermediate 13-4

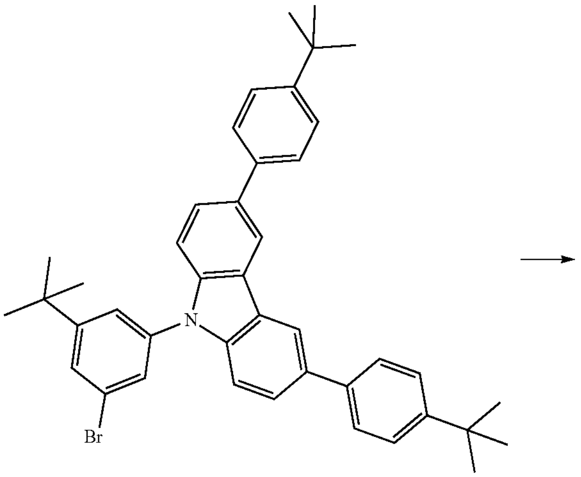

Intermediate 8-1

-continued

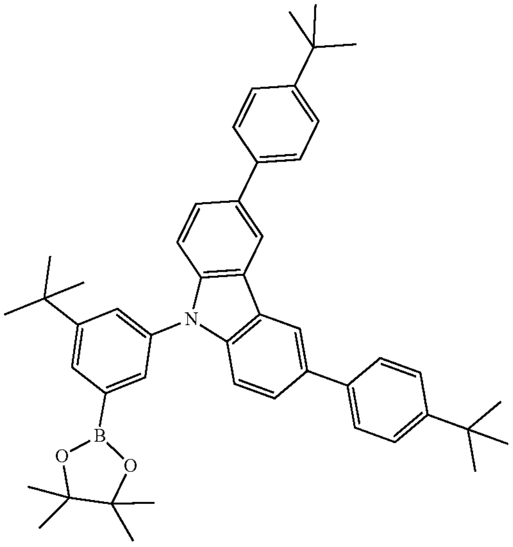

Intermediate 13-4

3.40 g (5.30 mmol) of Intermediate 8-1, 1.38 g (5.45 mmol) of bis(pinacolato)diborane, and 1.04 g (10.60 mmol) of sodium acetate were suspended to 27 mL of toluene. The suspension was degassed using 3 freeze-pump-thaw cycles, and 120 mg (0.13 mmol) of tris(dibenzylideneacetone) dipalladium(0) and 152 mg (0.51 mmol) of 2-dicyclohexylphosphino-2',4',6'-triisopropylbiphenyl were added to the mixture. After two additional freeze-pump-thaw cycles, the reaction mixture was heated to 110° C. for 6 hours. The reaction was cooled to room temperature and diluted with toluene and water. The aqueous layer was extracted with toluene and the organic layers were washed with brine and dried over magnesium sulfate, filtered, and the solution was concentrated. The crude product was recrystallized with dichloromethane and acetonitrile to give 2.74 g (75% yield) of Intermediate 13-4 as a white solid.

ESI-MS: 690 [M+H]

Intermediate 13-5

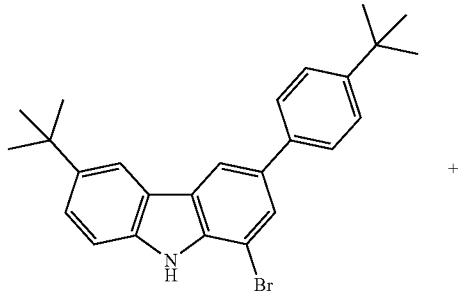

Intermediate 13-3

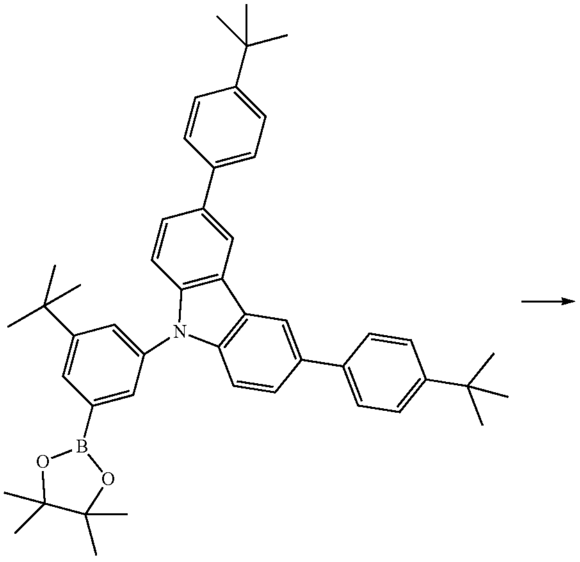

Intermediate 13-4

-continued

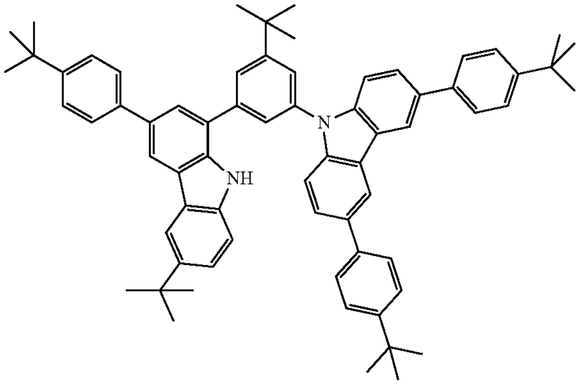

Intermediate 13-5

1.39 g (3.22 mmol) of Intermediate 13-3, 3.06 g (4.84 mmol) of Intermediate 10-2, and 2.73 g (12.8 mmol) potassium phosphate were dissolved in 21 mL of toluene, 11 mL of dioxane, and 7 mL of water. After the solution was degassed using 3 freeze-pump-thaw cycles, 15 mg (0.06 mmol) palladium acetate and 158 mg (0.38 mmol) of 2-dicyclohexylphosphino-2', 6'-dimethoxybiphenyl were added to the mixture. Then, after two additional freeze-pump-thaw cycles, the mixture was stirred to 85° C. for 16.5 hours. The reaction was cooled to room temperature and diluted with toluene. The organic extracts were washed with water and dried over sodium sulfate, filtered, and the solution was concentrated. The residue was purified by silica-gel column chromatography using mixed solvent of heptane and toluene as an eluent to give 2.15 g (79% yield) of Intermediate 13-5 as a white solid.

ESI-MS: 918 $[M+H]^+$

Compound 13

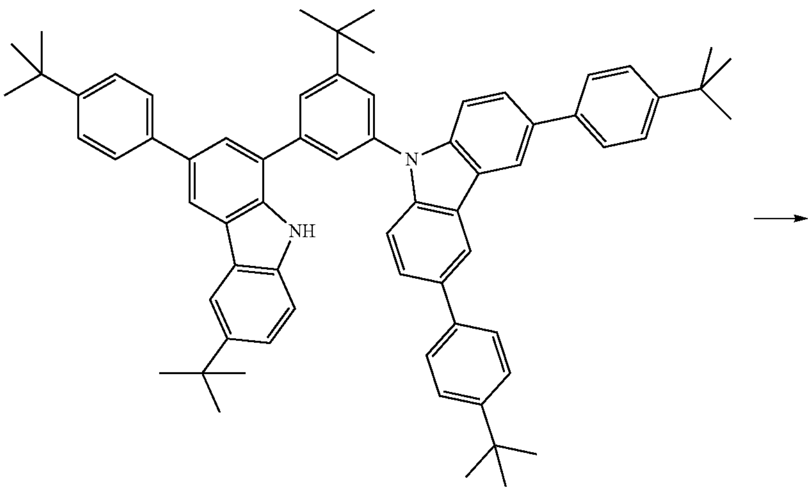

Intermediate 13-5

-continued

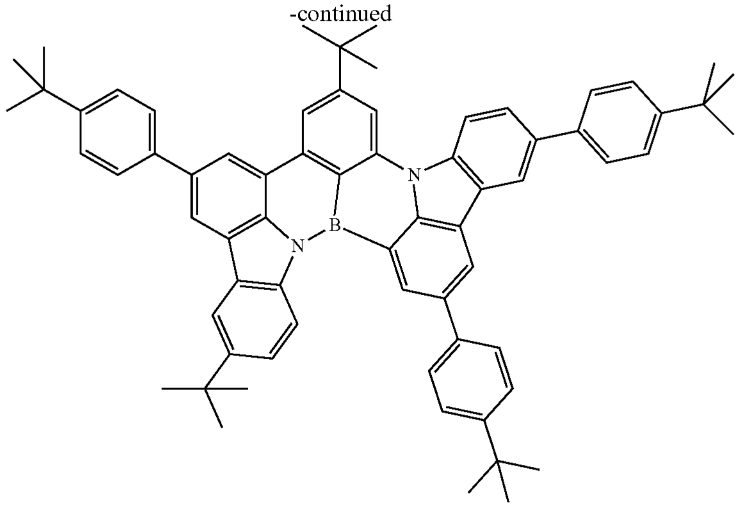

Compound 13

1.83 g (2.00 mmol) of Intermediate 13-5 was dissolved in 28 mL of dichlorobenzene. Then, 4.10 mL (4.10 mmol) of 1.0 M boron tribromide in heptane followed by 1.4 mL (8.19 mmol) of N,N-diisopropylethylamine were added to the solution, and the mixture was stirred at 180° C. for 15 hours. The reaction was cooled to room temperature and diluted with methanol. The precipitate was collected by filtration, and washed with ethanol and water. The crude product was dissolved in dichloromethane and precipitated with isopropanol followed by filtration to give 1.39 g (75% yield) of Compound 13 as a yellow solid.

ESI-MS: 925 $[M+H]^+$

Compound 14

Intermediate 14-1

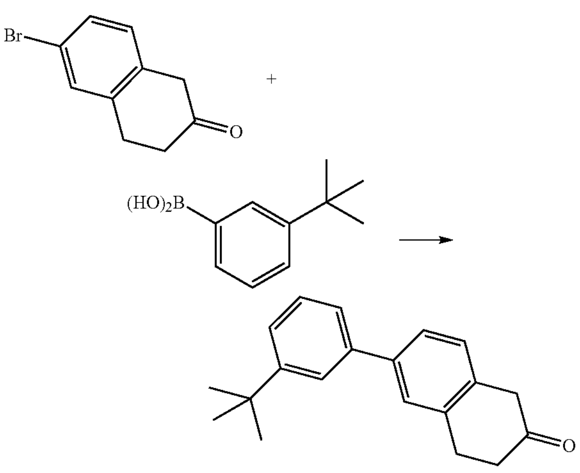

Intermediate 14-1

40.0 g (178 mmol) of 6-bromo-3,4-dihydronaphthalen-2(1H)-one, 38.0 g (213 mmol) of (3-(tertbutyl)phenyl)boronic acid, and 38.6 g (364 mmol) of sodium carbonate were dissolved in 523 mL of toluene, 261 mL of ethanol, and 105 mL of water. After the solution was degassed using 3 freeze-pump-thaw cycles, 3.08 g (2.67 mmol) tetrakis(triphenylphosphine)palladium was added to the mixture. Then, after two additional freeze-pump-thaw cycles, the mixture was stirred to 80° C. for 1.5 hours. The reaction was cooled to room temperature and the reaction mixture was stirred for 30 min after addition of 5 g of sodium cyanide dissolved in 50 mL of water. The organic extracts were washed with water and dried over sodium sulfate, filtered, and the solution was concentrated to give 21.0 g (42% yield) of Intermediate 14-1 as a white solid. It was use for the next reaction without further purification.

Intermediate 14-2

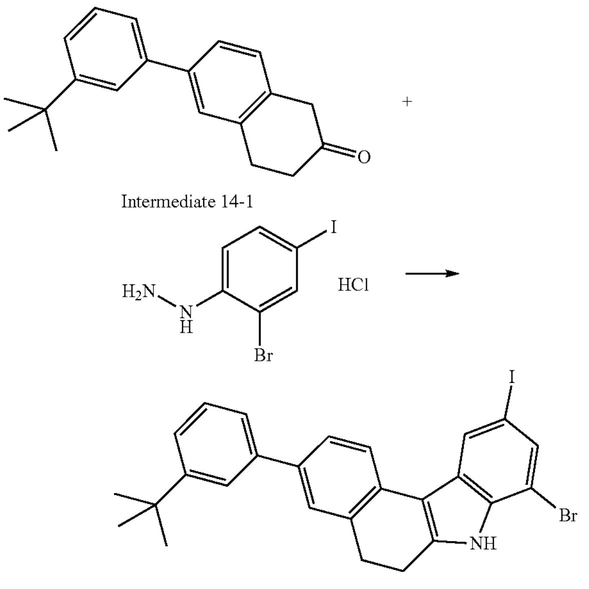

Intermediate 14-1

Intermediate 14-2

27.9 g (71.8 mmol) of (2-bromo-4-iodophenyl)hydrazine hydrochloride and 20.0 g (71.8 mmol) of Intermediate 14-1 were added to 198 mL of 4N HCl in dioxane solution, and the mixture was stirred at 110° C. for 3 hours. After the reaction mixture was cooled at room temperature, the reaction mixture was poured into 500 mL of water. After addition of 600 mL of dichloromethane, the aqueous layer was extracted with dichloromethane, and the collected organic layer was dried over sodium sulfate. After filtered, the solution was concentrated to give 18.8 g (47% yield) of Intermediate 14-2 as white solid.

ESI-MS: 556.2 [M−H]⁻

Intermediate 14-3

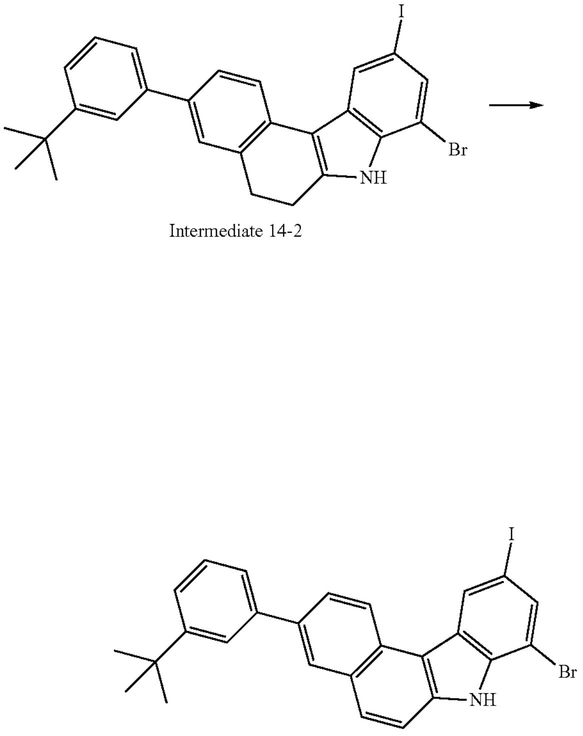

Intermediate 14-2

Intermediate 14-3

18.0 g (32.4 mmol) of Intermediate 14-2 and 8.75 g (35.6 mmol) of 2,3-dichloro-5,6-dicyanoquinone were added in 180 mL of o-xylene, and the mixture was stirred at 130° C. for 2.5 h. After the reaction mixture was cooled at room temperature, the reaction mixture was suspended in 200 mL of heptane. The suspension was filtered and washed out with heptane, and the filtrate was concentrated. The crude product was dissolved in toluene under reflux. After the solution was cooled at room temperature, the formed solid was collected by filtration, and washed with heptane to give 11.25 g (63% yield) of Intermediate 14-3 as a pale gray solid.

ESI-MS: 552.2 [M−H]⁻

Intermediate 14-4

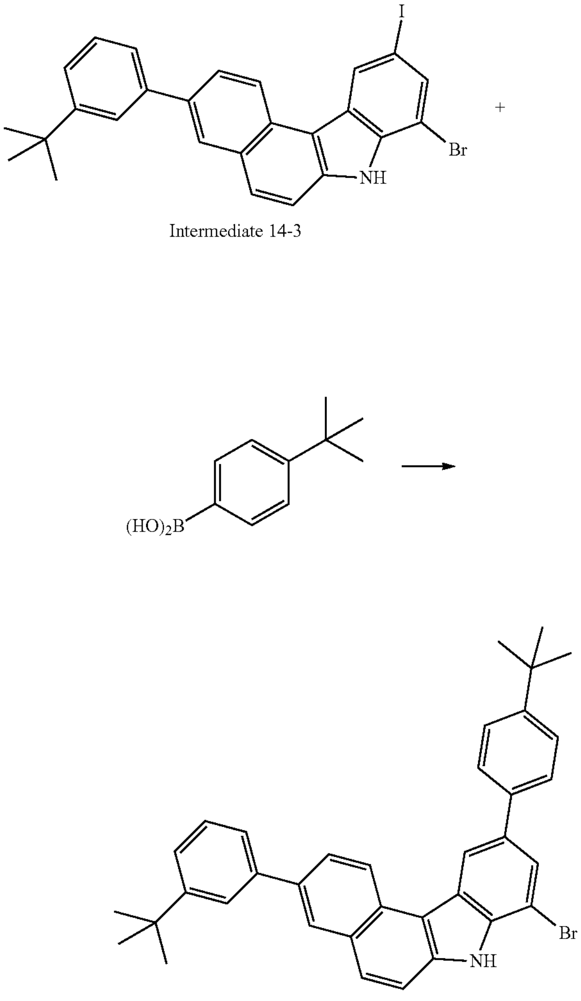

Intermediate 14-3

Intermediate 14-4

11.0 g (19.85 mmol) of Intermediate 14-3, 3.53 g (19.85 mmol) of (4-(tert-butyl)phenyl)boronic acid, and 4.63 g (43.7 mmol) of sodium carbonate were dissolved in 120 mL of toluene, 120 mL of ethanol, and 40 mL of water. After the solution was degassed using 3 freeze-pump-thaw cycles, 688 mg (0.60 mmol) tetrakis(triphenylphosphine)palladium was added to the mixture. Then, after two additional freeze-pump-thaw cycles, the mixture was stirred to 80° C. for 4 hours. The reaction was cooled to room temperature and the reaction mixture was stirred for 30 min after addition of 1 g of sodium cyanide dissolved in 50 mL of water. The organic extracts were washed with water and dried over sodium sulfate, filtered, and the solution was concentrated. The crude product was purified by silica-gel column chromatography using a mixed solvent of heptane and dichloromethane as eluent to give 7.33 g (65% yield) of Intermediate 14-4 as beige solid.

ESI-MS: 560.5 [M−H]⁻

Intermediate 14-5

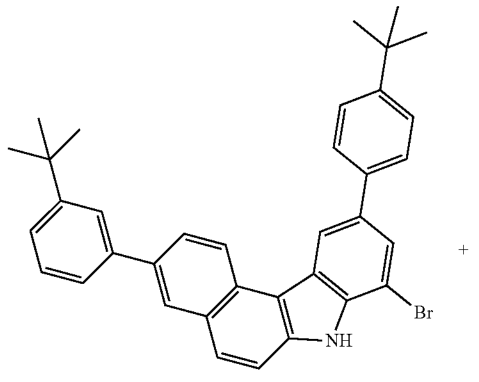

Intermediate 14-4

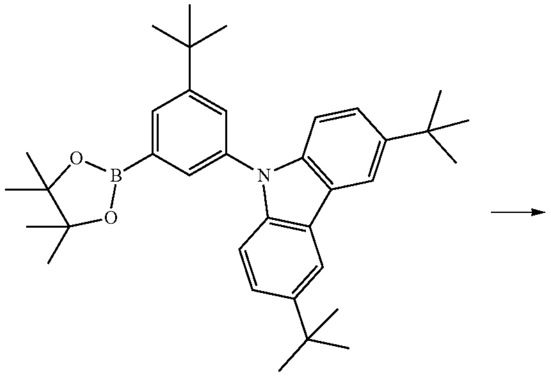

Intermediate 10-2

-continued

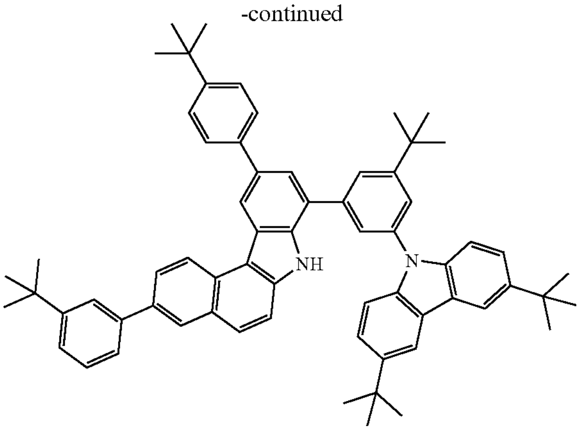

Intermediate 14-5

1.50 g (2.68 mmol) of Intermediate 14-4, 2.15 g (4.01 mmol) of Intermediate 10-2, and 2.28 g (10.70 mmol) potassium phosphate were dissolved in 22 mL of toluene, 11 mL of dioxane, and 7 mL of water. After the solution was degassed using 3 freeze-pump-thaw cycles, 21 mg (0.09 mmol) palladium acetate and 231 mg (0.56 mmol) of 2-dicyclohexylphosphino-2', 6'-dimethoxybiphenyl were added to the mixture. Then, after two additional freeze-pump-thaw cycles, the mixture was stirred to 85° C. for 21 hours. The reaction was cooled to room temperature and diluted with toluene. The organic extracts were washed with water and dried over sodium sulfate, filtered, and the solution was concentrated. The residue was purified by silica-gel column chromatography using mixed solvent of heptane and toluene as an eluent to give 1.72 g (72% yield) of Intermediate 14-5 as a white solid.

ESI-MS: 891 $[M-H]^-$

Compound 14

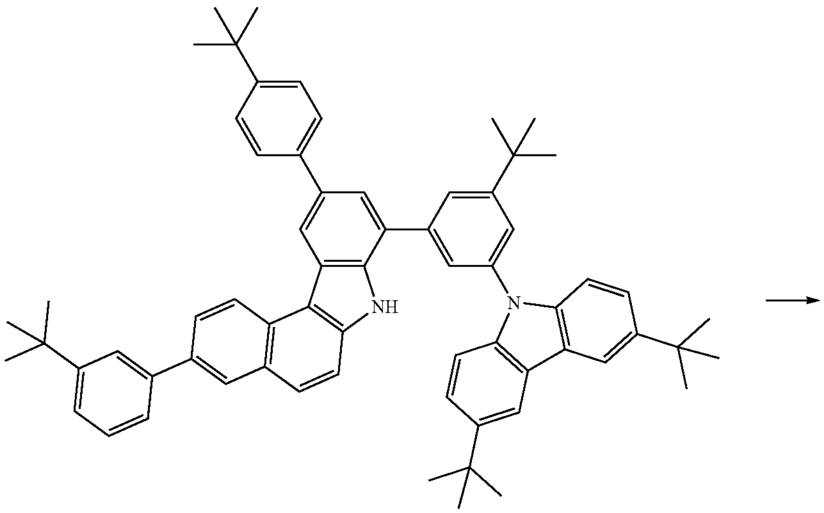

Intermediate 14-5

-continued

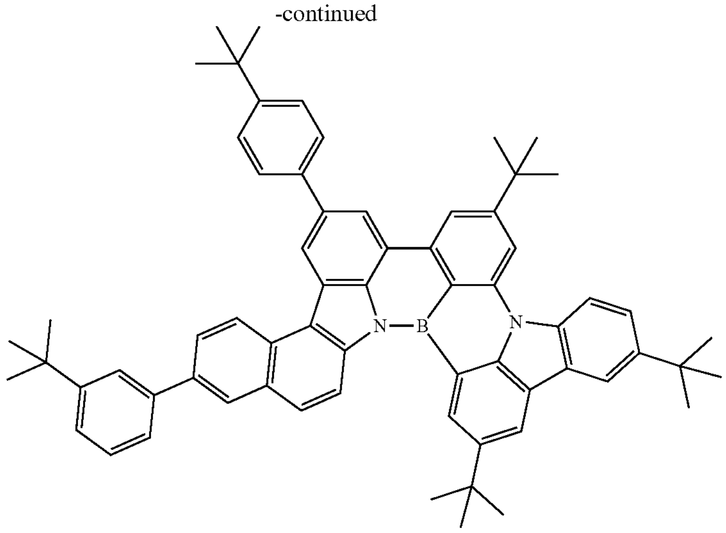

Compound 14

1.78 g (2.00 mmol) of Intermediate 14-5 was dissolved in 28 mL of dichlorobenzene. Then, 4.10 mL (4.10 mmol) of 1.0 M boron tribromide in heptane followed by 1.4 mL (8.19 mmol) of N,N-diisopropylethylamine were added to the solution, and the mixture was stirred at 180° C. for 15 hours. The reaction was cooled to room temperature and diluted with methanol. The precipitate was collected by filtration, and washed with ethanol and water. The crude product was dissolved in dichloromethane and precipitated with isopropanol followed by filtration to give 1.41 g (83% yield) of Compound 14 as a yellow solid.

ESI-MS: 900 $[M+H]^+$

Compound 15

Intermediate 15-1

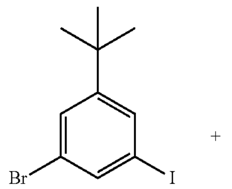

Intermediate 7-1

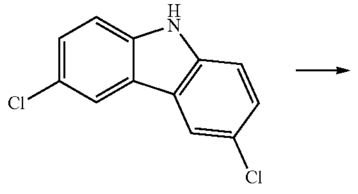

-continued

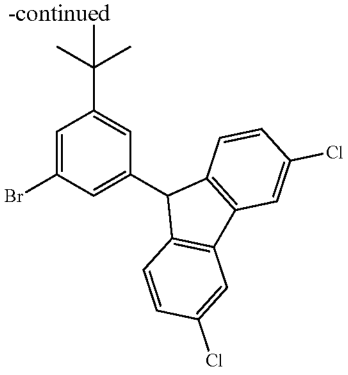

Intermediate 15-1

To a solution of 26.4 g (78.0 mmol) of Intermediate 7-1 in 250 mL of 1,4-dioxane was added 15.35 g (65.0 mmol) of 3,6-dichloro-9H-carbazole, 41.4 g (195.0 mmol) of potassium phosphate, 1.55 g (8.13 mmol) of copper iodide, 2.73 mL (22.75 mmol) of cyclohexane-1,2-diamine. The suspension was degassed with Ar, then heated to 85° C. for 1.5 hours. After cooling to room temperature, the suspension was filtered over celite, rinsing with warm toluene (4×100 mL). The filtrate was evaporated, and the resulting residue was purified by silica-gel column chromatography using heptanes as eluent. The resulting white solid was further recrystallized from cyclohexane (2×150 mL) to give 14.66 g (80% yield) of Intermediate 15-1 as a white solid.

$^1H$ NMR (300 MHz, chloroform-$d_3$) δ 8.05 (dd, 2H), 7.67 (t, 1H), 7.50 (dt, 2H), 7.42 (dd, 2H), 7.32 (dd, 2H), 1.41 (s, 9H).

Intermediate 15-3

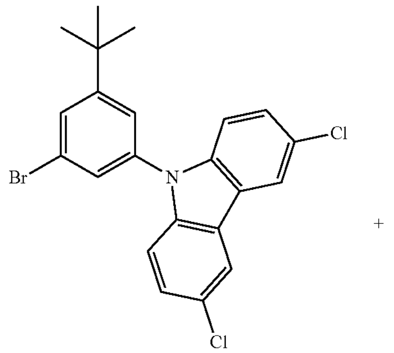

Intermediate 15-1

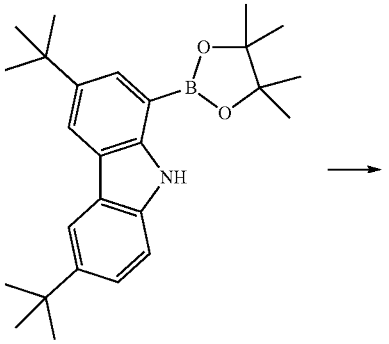

Intermediate 2-3

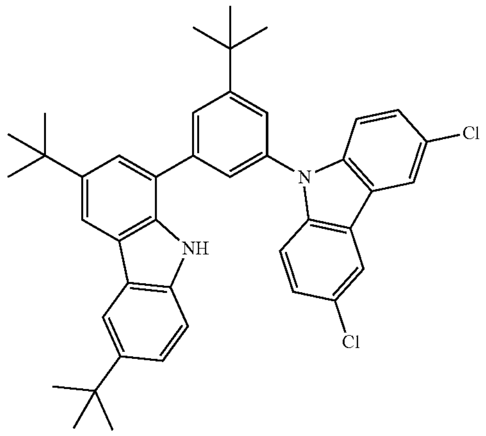

Intermediate 15-2

12.30 g (27.5 mmol) of Intermediate 15-1, 11.15 g (27.5 mmol) of Intermediate 2-3, 2.20 g (55.0 mmol) of sodium hydroxide were suspended in a mixture of tetrahydrofuran/water (120/60 mL). The suspension was degassed with Ar, and 477 mg (1.5 mol %) of tetrakis(triphenylphosphine) palladium(0) were added to the reaction mixture. The reaction mixture was refluxed for 1 hour. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 17.76 g (100% yield) of Intermediate 15-2 as a white foam.

ESI-MS: 643.4[M−H]$^-$

Intermediate 15-3

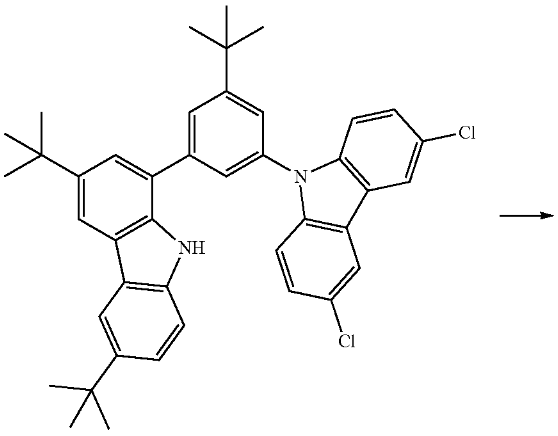

Intermediate 15-2

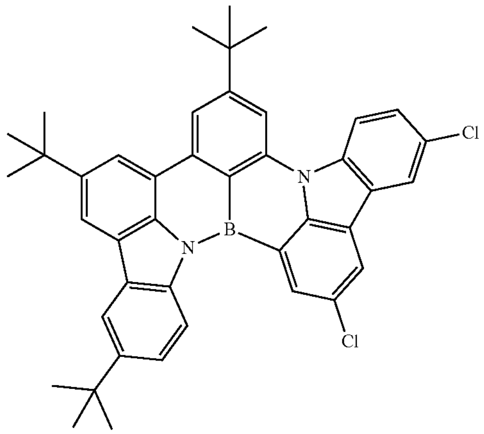

Intermediate 15-3

17.43 g (27.0 mmol) or intermediate 15-2 were dissolved in 225 ml of 1,2-dichlorobenzene and degassed with Ar. 18.49 mL (108 mmol) of N-ethyl-N-isopropylpropan-2-amine were added to the reaction mixture, followed by the slow addition of 54.0 ml (54.0 mmol) of tribromoborane (1M solution in hep-tane). The reaction mixture was heated to 180° C. for 5 hours. After cooling to room temperature, the precipitate formed in the reaction was filtered and rinsed with 1,2-dichlorobenzene, methanol and heptanes to give 13.76 g (78% yield) of Intermediate 15-3 as a yellow solid. The molecular mass of the product was confirmed by LC-MS [M+H] 653.3.

ESI-MS: 653.3[M+H]$^+$

Compound 15

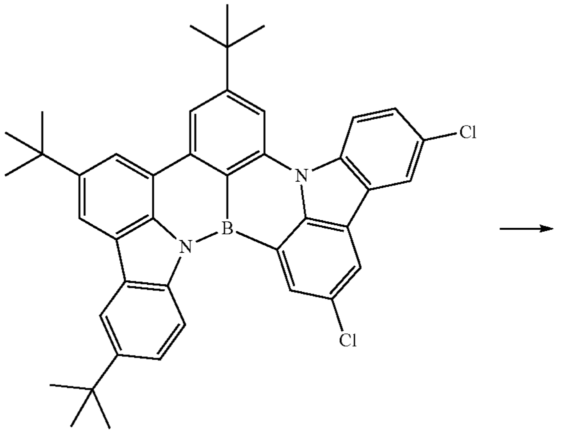

Intermediate 15-3

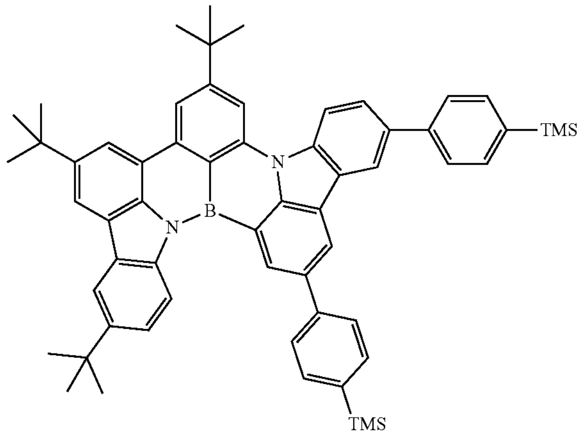

Compound 15

2.35 g (3.6 mmol) of Intermediate 15-3, 2.80 g (14.4 mmol) of (4-(trimethylsilyl)phenyl)boronic acid, 4.69 g (14.4 mmol) of caesium carbonate were suspended in a mixture of toluene/ethanol/water (36/12/6 mL). The suspension was degassed with Ar, and 40 mg (5 mol %) of palladium acetate and 148 mg (10 mol %) of 2-dicyclohexylphosphino-2',6'-dimethoxybiphenyl were added to the reaction mixture. The reaction mixture was heated to 80° C. for 1.5 hours. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 2.98 g (94% yield) of Compound 15 as a yellow solid.

ESI-MS: 881.5[M+H]$^+$

Compound 16

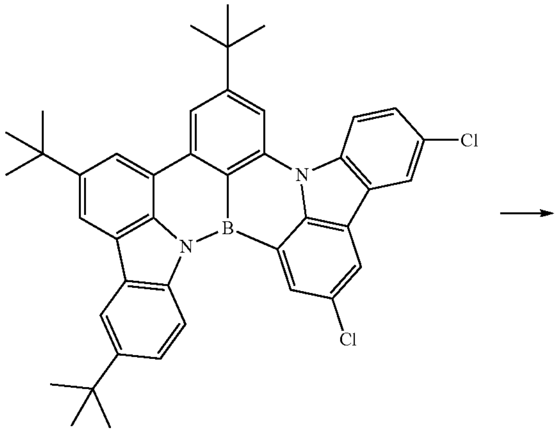

Intermediate 15-3

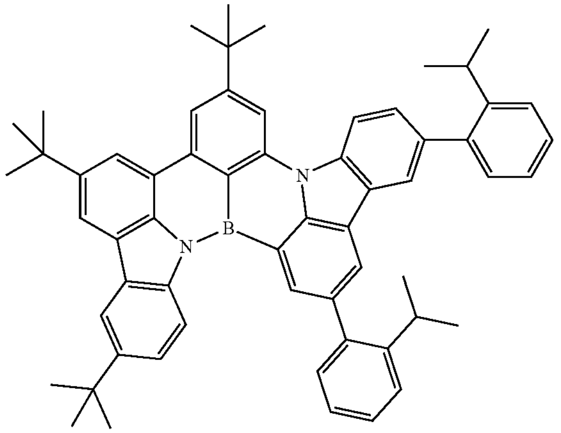

Compound 16

2.61 g (4.0 mmol) of Intermediate 15-3, 2.62 g (16.0 mmol) of (2-isopropylphenyl)boronic acid, 5.21 g (16.0 mmol) of caesium carbonate were suspended in a mixture of toluene/ethanol/water (36/12/6 mL). The suspension was degassed with Ar, and 45 mg (5 mol %) of palladium acetate and 164 mg (10 mol %) of 2-dicyclohexylphosphino-2',6'-dimethoxybiphenyl were added to the reaction mixture. The reaction mixture was heated to 80° C. for 5 hours. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 3.15 g (96% yield) of Compound 16 as a yellow solid.

ESI-MS: 821.5 [M+H]$^+$

Compound 17

Intermediate 17-1

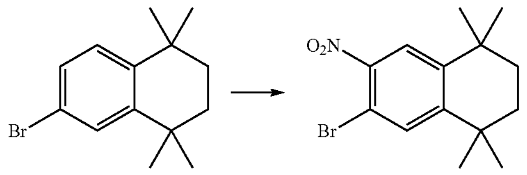

Intermediate 17-1

40.0 g (0.15 mol) of 6-bromo-1,1,4,4-tetramethyl-1,2,3,4-tetrahydronaphthalene were suspended in 150 ml of acetic anhydride. 78 mL (1.12 mol) of nitric acid were dropwised added at room temperature during three hours. The yellow suspension was stirred during 30 minutes, then treated with 1.5 l of water, and further stirred during one hour. The suspension was filtered and the solid washed with 500 mL of water. The solid was suspended in 400 mL of 10% aqueous sodium carbonate solution. The suspension was filtered and the solid washed with 500 mL of water. The solid was further suspended in 150 mL of ethanol, then filtered and the solid washed with 50 ml of ethanol to give 43.2 g (93% yield) of Intermediate 17-1 as a white solid.

$^1$H NMR (300 MHz, DMSO-$d_6$) δ 7.98 (s, 1H), 7.80 (s, 1H), 1.66 (s, 4H), 1.27 (d, 12H).

Intermediate 17-2

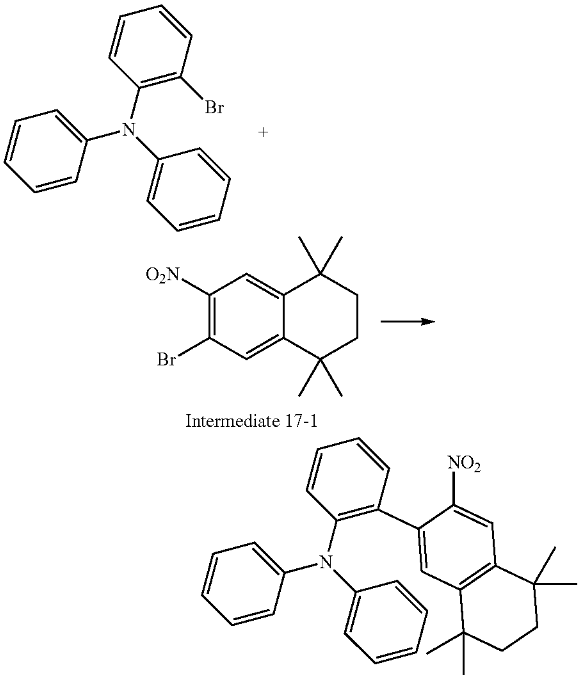

Intermediate 17-1

Intermediate 17-2

20.0 g (61.7 mmol) of 2-bromo-N,N-diphenylaniline in 200 ml tetrahydrofuran were dropwise treated at −78° C. with 25.9 mL of n-butyllithium (2.5 M in hexanes) during 15 minutes. 32.5 mL of zinc chloride solution (1.9 M in 2-methyltetrahydrofuran) were added at −78° C. The yellow solution was warmed up to room temperature during 45 minutes. 18.3 g (58.6 mmol) of Intermediate 17-2, 565 mg (0.62 mmol) of tris(dibenzylideneacetone)dipalladium(0), and 358 mg (1.23 mmol) of tri-terbutylphosphonium tetrafluoroborate were added, and the resulting solution heated at 55° C. during 15 minutes. The reaction mixture was cooled down to room temperature and filtered through a 3 cm layer of silica gel, followed by rinsing the silica gel layer with 50 ml of tetrahydrofuran. The filtrate was concentrated under vacuum and the resulting solid dissolved in 100 ml of hot ethanol. The solution was cooled down to room temperature until a suspension formed. The suspension was filtered and the solid washed with 80 ml of ethanol. The product was purified by MPLC with the CombiFlash Companion (silica gel, heptane/O-40% gradient of toluene) to give 20.3 g (73% yield) of Intermediate 17-2 as a white solid.

ESI-MS (positive, m/z): exact mass of $C_{32}H_{32}N_2O_2$=476.25; found 477.4 [M+1]$^+$.

Intermediate 17-3

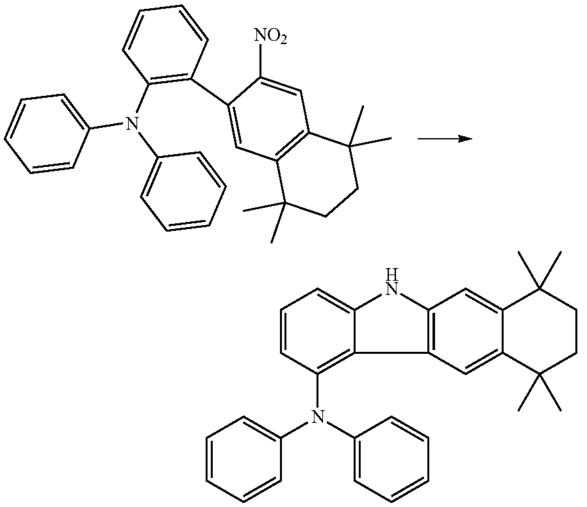

20.0 g (42.0 mmol) of Intermediate 17-2 and 33.0 g (126 mmol) of triphenylphosphane was heated at 174° C. in 100 mL of 1,2-dichlorobenzene during three hours. The reaction mixture was concentrated under vacuum. The product was stirred in 100 mL heptane during one hour. The suspension was filtered and the solid washed with heptane. The filtrate was concentrated under vacuum and the solid dissolved in dichloromethane, then filtered through a 4 cm layer of silica gel, followed by rinsing the silica gel layer with 150 mL of dichloromethane. The combined eluents were concentrated under vacuum and the product was purified by MPLC with the CombiFlash Companion (silica gel, heptane/dichloromethane). The product was dissolved in 30 mL of dichloromethane and diluted with 50 mL of heptane. The solution was concentrated under vacuum down to a volume of 50 mL until a suspension formed. The suspension was filtered and the solid washed with heptane. The solid was suspended in 70 mL of tert-butyl methyl ether. The suspension was filtered and the solid washed with tert-butyl methyl ether. The combined filtrates from the tert-butyl methyl ether washings were concentrated under vacuum to give 6.9 g (37% yield) of Intermediate 17-3 as a solid.

ESI-MS (positive, m/z): exact mass of $C_{32}H_{32}N_2$=444.26; found 445.4 [M+1]$^+$.

Intermediate 17-4

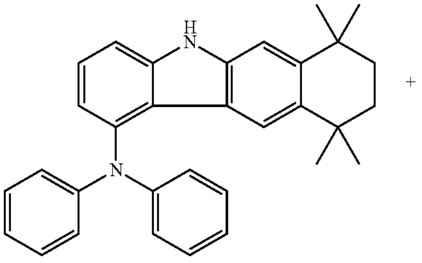

Intermediate 17-3

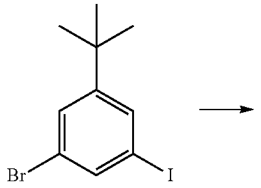

Intermediate 7-1

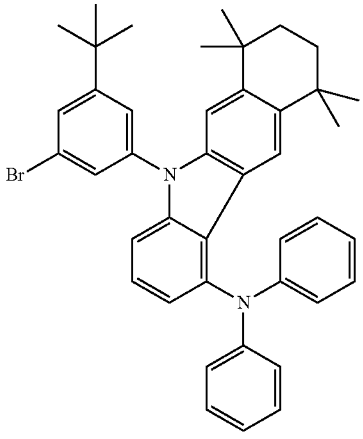

Intermediate 17-4

1.53 g (4.50 mmol) of Intermediate 7-1, 2.00 g (4.50 mmol) of Intermediate 17-3, 86 mg (0.45 mmol) of copper (I) iodide, 154 mg (1.35 mmol) of cyclohexane-1,2-diamine, and 2.86 g (13.5 mmol) of potassium phosphate tribasic were suspended in 50 mL of 1,4-dioxane, and heated at 91° C. during 12 hours. The suspension was cooled down to room temperature and filtered through a 3 cm layer of silica gel, followed by rinsing the silica gel layer with 50 mL of dioxane. The eluents were concentrated under vacuum and the resulting solid dissolved in 30 mL of dichloromethane and 50 mL of ethanol. The solution was concentrated under vacuum down to a volume of 40 mL. The suspension was filtered and the solid washed with ethanol to give 2.56 g (87% yield) of Intermediate 17-4 as a white solid.

ESI-MS (positive, m/z): exact mass of $C_{42}H_{43}BrN_2$=654.26; found 657.4 $[M+3]^+$.

Intermediate 17-5

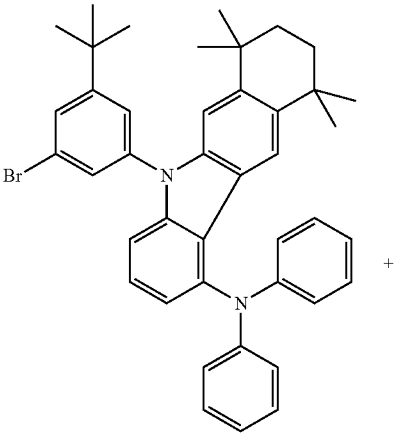

Intermediate 17-4

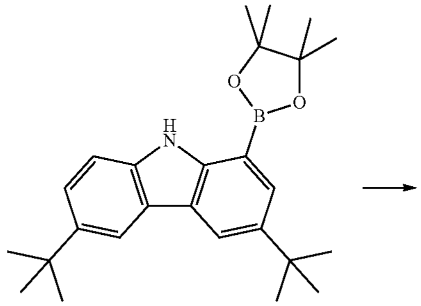

Intermediate 2-3

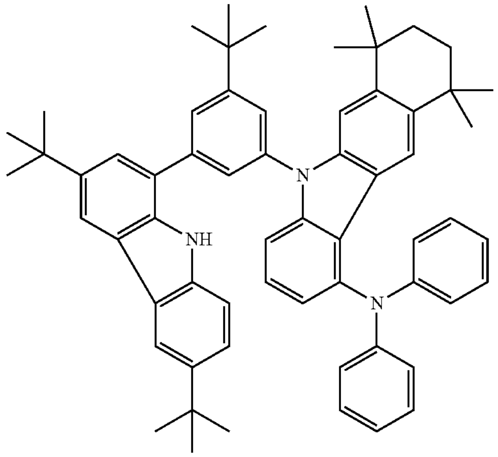

Intermediate 17-5

2.50 g (3.81 mmol) of Intermediate 17-4, 1.70 g (4.19 mmol) of Intermediate 2-3, 17 mg (0.08 mmol) of palladium (II) acetate, 188 mg (0.46 mmol) of 2-dicyclohexylphosphino-2',6'-dimethoxybiphenyl (SPhos), and 3.24 g (15.3 mmol) of potassium phosphate tribasic were dissolved in a mixture of 40 ml of toluene, 20 mL of 1,4-dioxane, and 10 mL of water. The solution was three times evacuated and backfilled with argon, and heated at 82° C. during 90 minutes. The reaction mixture was diluted with 50 mL of toluene and 100 ml of water. The organic phase was separated, washed with water (3×50 mL), dried over sodium sulfate, and filtered over a 3 cm layer of silica gel. The silica gel layer was rinsed with toluene and the combined eluents concentrated under vacuum. The product was purified by MPLC with the CombiFlash Companion (silica gel, heptane). The resulting product was diluted with 30 ml of dichloromethane and 50 ml of ethanol. The solution was concentrated under vacuum down to a volume of 50 ml until a suspension formed. The suspension was filtered and the solid washed with ethanol to give 2.4 g (74% yield) of Intermediate 17-5 as a white solid.

ESI-MS (positive, m/z): exact mass of $C_{62}H_{67}N_3$=853.53; found 854.7 $[M+1]^+$.

Compound 17

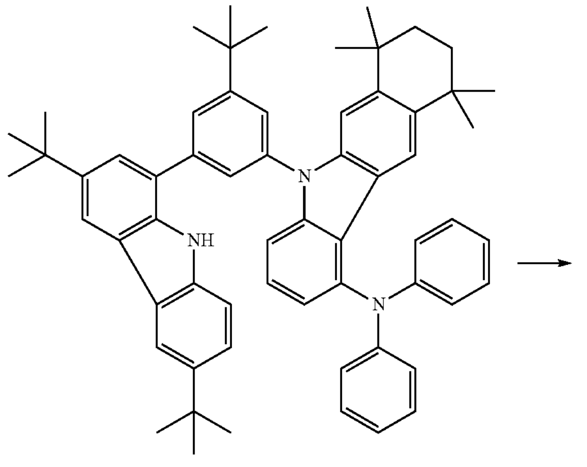

Intermediate 17-5

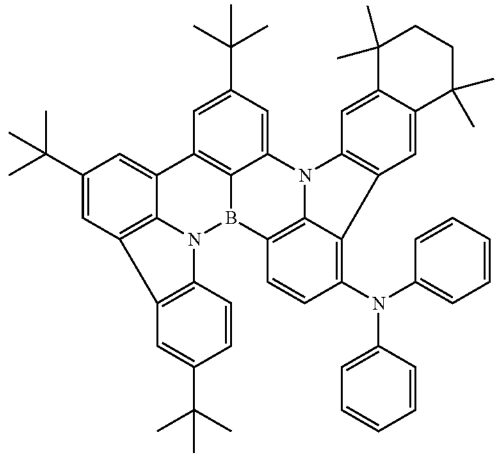

Compound 17

2.30 g (2.69 mmol) of Intermediate 17-5 were dissolved in 46 mL of 1,2-dichlorobenzene. 1.9 mL (10.8 mmol) of N,N-diisopropylethylamine and 5.4 ml of tribromoborane (1.0 M in heptane) were dropwise added. The brown solution was heated at 174° C. during 90 minutes, and cooled down to 36° C. 5.4 mL of tribromoborane (1.0 M in heptane) were dropwise added and heating continued at 174° C. during 90 minutes. The reaction mixture was cooled down to room temperature and 100 mL of methanol were added. The mixture was concentrated under vacuum and the residue dissolved in 100 mL of heptane and 100 mL of water. The organic phase was washed with water (3×50 mL), dried over sodium sulfate, then filtered and concentrated under vacuum. The resulting solid was dissolved in 20 mL of dichloromethane and 60 ml of ethanol. The solution was concentrated under vacuum down to a volume of 50 ml until a suspension formed. The suspension was filtered and the solid washed with ethanol. The product was purified by MPLC with the CombiFlash Companion (silica gel, heptane/O-10% gradient of dichloromethane). The isolated product was dissolved in 20 ml of dichloromethane and 60 ml of ethanol. The solution was concentrated down to a volume of 50 ml until a suspension formed. The suspension was filtered and the solid washed with 30 ml of ethanol to give 0.85 g (37% yield) of Compound 17 as a yellow solid.

ESI-MS (positive, m/z): exact mass of $C_{62}H_{64}BN_3$=861.52; found 862.6 $[M+1]^+$.

Compound 18

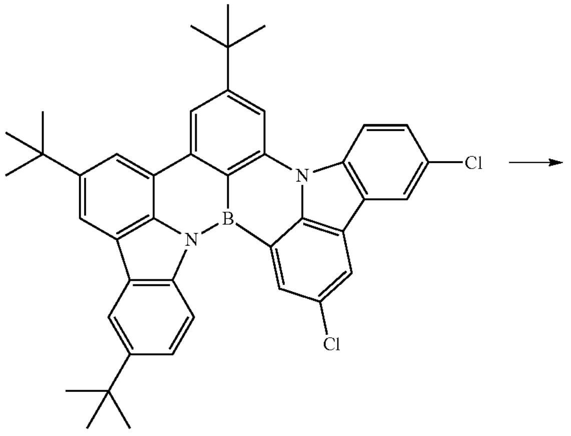

Intermediate 15-3

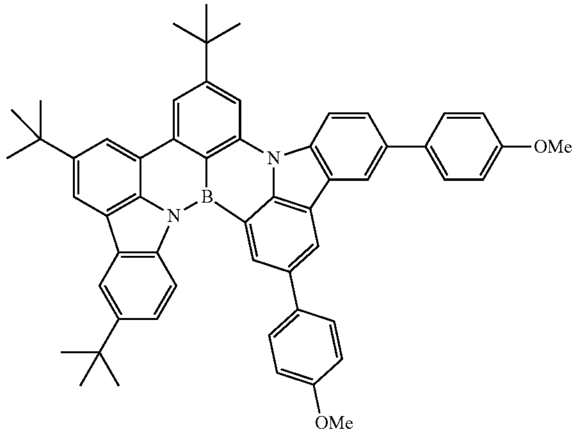

Compound 18

163 mg (0.249 mmol) of Intermediate 15-3, 0.152 mg (1.0 mmol) of (4-methoxyphenyl)boronic acid, 0.325 mg (1.0 mmol) of caesium carbonate were suspended in a mixture of toluene/ethanol/water (6/2/1 mL). The suspension was degassed with Ar, and 3.4 mg (6 mol %) of palladium acetate and 12.3 mg (12 mol %) of 2-dicyclohexylphosphino-2',6'-dimethoxybiphenyl were added to the reaction mixture. The reaction mixture was heated to 80° C. for 2 hours. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptanes/dichloromethane as eluent to give 123 mg (62% yield) of Compound 18 as a yellow solid.

ESI-MS: 797.5 $[M+H]^+$

Compound 19

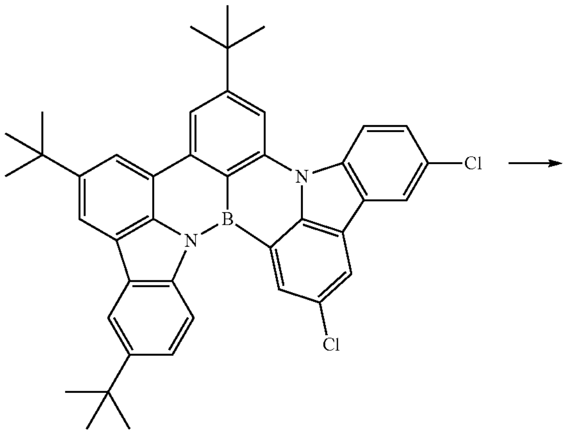

Intermediate 15-3

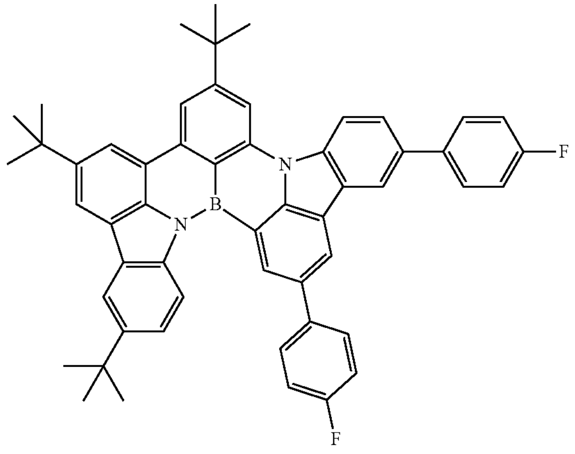

Compound 19

200 mg (0.306 mmol) of Intermediate 15-3, 0.171 mg (1.22 mmol) of (4-fluorophenyl)boronic acid, 0.399 mg (1.22 mmol) of caesium carbonate were suspended in a mixture of toluene/ethanol/water (6/2/1 mL). The suspension was degassed with Ar, and 4.1 mg (6 mol %) of palladium acetate and 15.1 mg (12 mol %) of 2-dicyclohexylphosphino-2',6'-dimethoxybiphenyl were added to the reaction mixture. The reaction mixture was heated to 80° C. for 24 hours. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 166 mg (70% yield) of Compound 19 as a yellow solid.

ESI-MS: 773.4 $[M+H]^+$

Compound 20

Intermediate 20-1

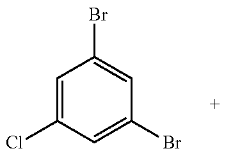

-continued

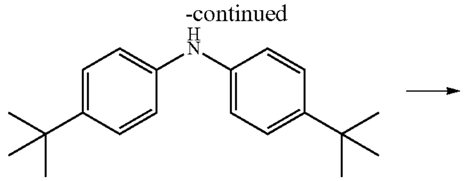

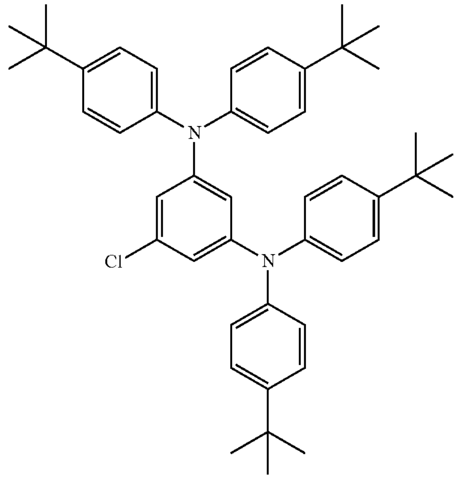

Intermediate 20-1

10.0 g (37.0 mmol) of 1,3-dibromo-5-chlorobenzene, 21.3 g (76.0 mmol) of bis(4-(tert-butyl)phenyl)amine, 703 mg (0.77 mmol) of tris(dibenzylideneacetone)dipalladium(0), 892 mg (3.07 mmol) of tri-tert-butylphosphonium tetrafluoroborate, and 8.89 g (92.0 mmol) of sodium tert-butoxide were suspended in 200 mL of toluene. The suspension was three times evacuated and backfilled with argon and heated at 72° C. during 90 minutes. The dark suspension was cooled down to room temperature and washed with water (2×100 mL). The organic phase was dried over sodium sulfate and concentrated under vacuum. The solid was recrystallized from 300 mL of ethanol, and the then washed with cold ethanol to give to give 18.8 g (76% yield) of Intermediate 20-1 as a white solid.

ESI-MS (positive, m/z): exact mass of $C_{46}H_{55}ClN_2$=670.41; found 671.4 $[M+H]^+$.

Intermediate 20-2

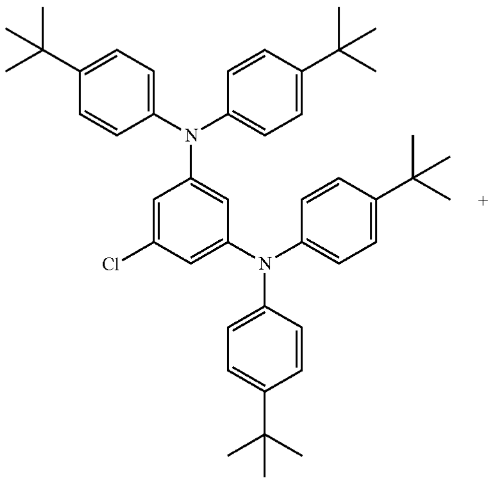

Intermediate 20-1

-continued

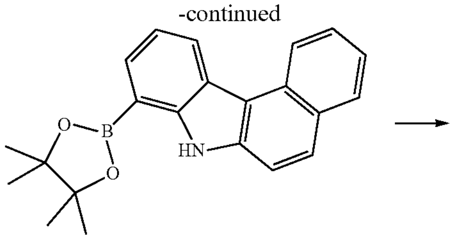

Intermediate 5-1

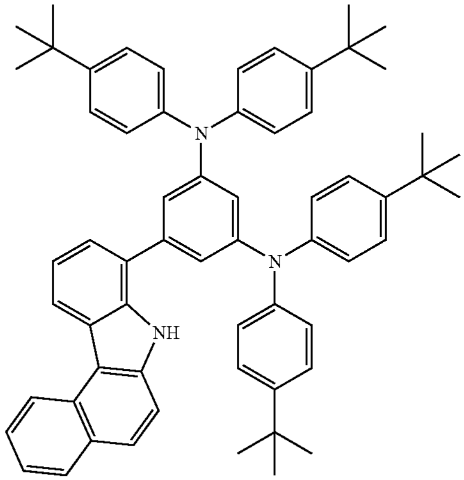

Intermediate 20-2

Compound 20

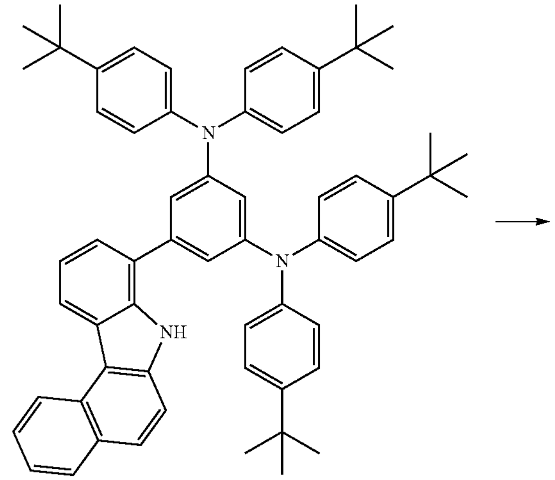

Intermediate 20-2

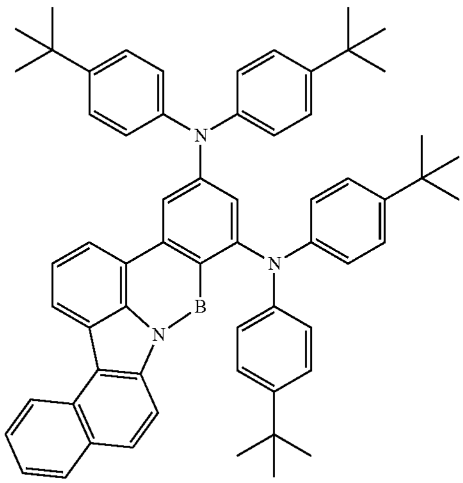

Compound 20

8.00 g (11.9 mmol) of Intermediate 20-1, 4.50 g (13.1 mmol) of Intermediate 5-1, 54 mg (0.24 mmol) of palladium (II) acetate, 587 mg (1.43 mmol) of 2-dicyclohexylphosphino-2',6'-dimethoxybiphenyl (SPhos), and 10.1 g (47.7 mmol) of potassium phosphate tribasic were dissolved in a mixture of 100 mL of o-xylene, 50 mL of 1,4-dioxane, and 30 mL of water. The reaction mixture was three times evacuated and backfilled with argon, and heated at 82° C. during five hours. The reaction mixture was cooled down to room temperature and diluted with 200 mL of toluene and 100 mL of water. The organic phase was washed with water (3×100 mL), dried over sodium sulfate, followed by the addition of dichloromethane. The mixture was filtered and the filtrate concentrated under vacuum. The product was stirred in 30 mL of dichloromethane and 150 mL of ethanol until a suspension formed. The suspension was filtered and the solid washed with 100 mL of ethanol and 100 mL of heptane to give 6.9 g (68% yield) of Intermediate 20-2 as a white solid.

ESI-MS (negative, m/z): exact mass of $C_{62}H_{65}N_3$=851.52; found 850.4 $[M-1]^+$.

3.00 g (3.52 mmol) of Intermediate 20-2 were suspended in 50 mL of 1,2-dichlorobenzen. 2.5 mL (14 mmol) of N,N-diisopropylethylamine and 7 mL of tribromoborane (1.0 M in heptane) were dropwise added. The yellow suspension was heated at 181° C. during 4 hours. The reaction mixture was cooled down and 100 mL of methanol were added. The suspension was stirred during 15 minutes, and then filtered. The suspension was stirred during 15 minutes, and then filtered. The solid was washed with 50 mL of methanol, then 30 mL of water, followed by washing with 50 mL of methanol and 30 mL of heptane. The solid was further purified by MPLC with the CombiFlash Companion (silica gel, dichloromethane) to give 2.1 g (69% yield) of Compound 20 as a yellow solid.

ESI-MS (positive, m/z): exact mass of $C_{62}H_{62}BN_3$=859.50; found 860.7 $[M+1]^+$.

Compound 21

Intermediate 21-1

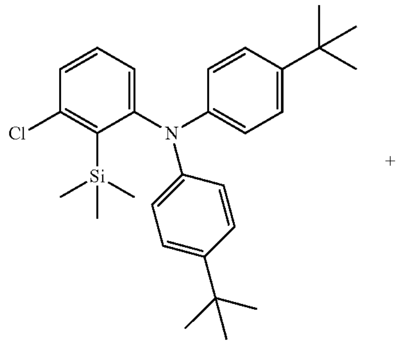

Intermediate 1-3

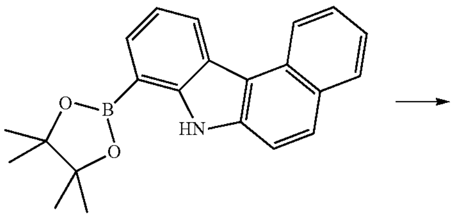

Intermediate 5-1

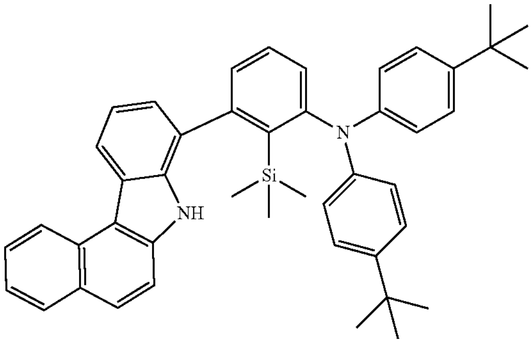

Intermediate 21-1

5.00 g (10.8 mmol) of Intermediate 1-3, 4.07 g (11.9 mmol) of Intermediate 5-1, 48 mg (0.22 mmol) of palladium (II) acetate, 531 mg (1.29 mmol) of 2-dicyclohexylphosphino-2',6'-dimethoxybiphenyl (SPhos), and 9.15 g (43.1 mmol) of potassium phosphate tribasic were dissolved in a mixture of 100 mL of o-xylene, 50 mL of 1,4-dioxane, and 30 mL of water. The emulsion was three times evacuated and backfilled with argon, and heated at 86° C. during 26 hours. The reaction mixture was cooled down and 50 mL of toluene and 50 mL of water were added. The organic phase was washed with water (3×50 mL), then dried over sodium sulfate, and concentrated under vacuum. The solid product was suspended in 100 mL of heptane, then filtered, and the solid washed with heptane. The product was further purified by MPLC with the CombiFlash Companion (silica gel, cyclohexane/0-10% gradient of ethyl acetate). The resulting solid was suspended in 30 mL of dichloromethane and 50 ml of ethanol. The suspension was filtered, and the solid washed with ethanol to give 3.65 g (53% yield) of Intermediate 21-1 as a white solid.

ESI-MS (negative, m/z): exact mass of $C_{45}H_{48}N_2Si$=644.36; found 643.3 $[M-1]^+$.

Compound 21

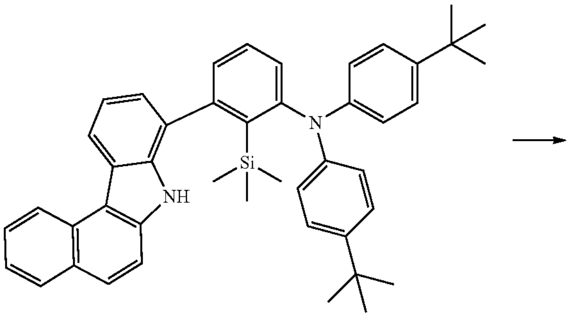

Intermediate 21-1

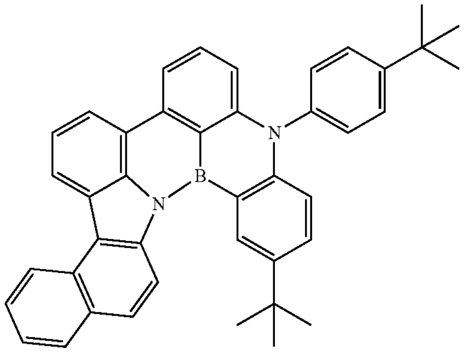

Compound 21

3.50 g (5.43 mmol) of Intermediate 21-1 were dissolved in 200 mL of 1,2-dichlorobenzene. 3.8 mL (21.7 mmol) of N,N-diisopropylethylamine and 8.1 mL of tribromoborane (1.0 M in heptane) were dropwise added. The suspension was heated at 142° C. during 18 hours. The reaction mixture was cooled down and 300 mL of methanol were added. The suspension was filtered and the solid washed with 100 mL of methanol, 50 mL of water, and 50 mL of methanol. The product was further purified by MPLC with the CombiFlash Companion (silica gel, dichloromethane) to give 1.02 g (32% yield) of Compound 21 as a yellow solid.

ESI-MS (positive, m/z): exact mass of $C_{42}H_{37}BN_2$=580.30; found 581.7 $[M+1]^+$.

Compound 22

Intermediate 22-1

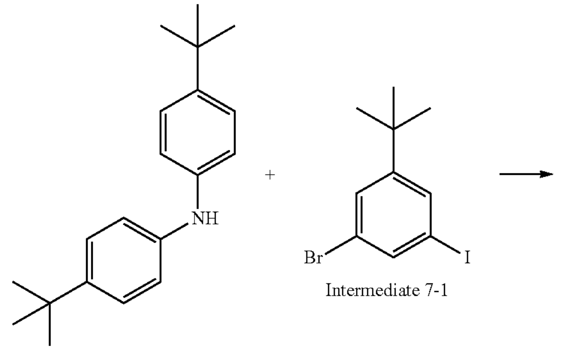

Intermediate 7-1

-continued

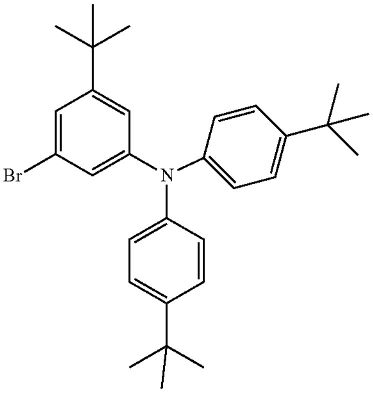

Intermediate 22-1

-continued

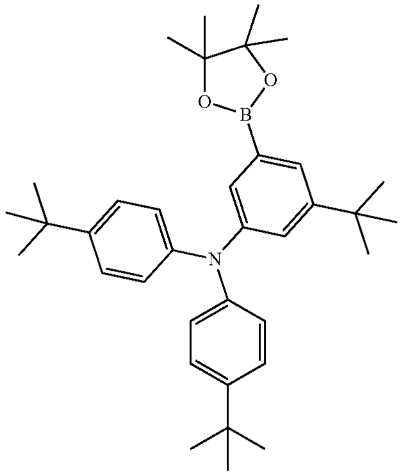

Intermediate 22-2

7.18 g (25.50 mmol) of bis(4-(tert-butyl)phenyl)amine, 10.67 g (25.50 mmol) of Intermediate 7-1, and 3.43 g (35.70 mmol) of sodium tert-butoxide were suspended in 102 mL of toluene. After the suspension was degassed using 3 freeze-pump-thaw cycles, and 295 mg (0.51 mmol) of xantphos and 117 mg (0.13 mmol) of tris(dibenzylideneacetone)dipalladium(0) were added to the mixture. Then, after two additional freeze-pump-thaw cycles, the reaction mixture was stirred to 100° C. for 14.5 hours. The reaction was cooled to room temperature and diluted with toluene and water. The aqueous layer was extracted with toluene. The organic extracts were washed with brine and dried over sodium sulfate, filtered, and the solution was concentrated. The residue was purified by silica-gel column chromatography using cyclohexane as an eluent to give 10.8 g (79% yield) of Intermediate 22-1 as a beige foam.

ESI-MS: 494.6 $[M-H]^-$

Intermediate 22-2

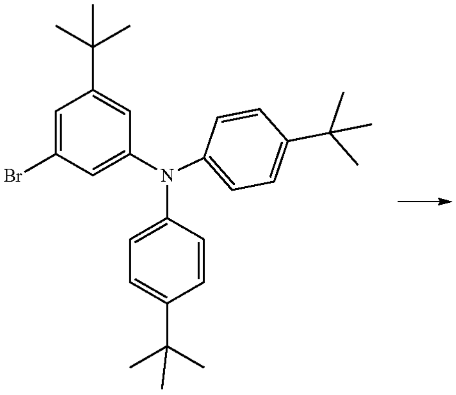

Intermediate 22-1

2.96 g (6.01 mmol) of Intermediate 22-1, 1.98 g (7.81 mmol) of bis(pinacolato)diborane, and 1.18 g (12.02 mmol) of sodium acetate were suspended to 30 mL of toluene. The suspension was degassed using 3 freeze-pump-thaw cycles, and 110 mg (0.12 mmol) of tris(dibenzylideneacetone)dipalladium(0) and 229 mg (0.48 mmol) of 2-dicyclohexylphosphino-2',4',6'-triisopropylbiphenyl were added to the mixture. After two additional freeze-pump-thaw cycles, the reaction mixture was heated to 110° C. for 16 hours. The reaction was cooled to room temperature and diluted with toluene and water. The aqueous layer was extracted with toluene and the organic layers were washed with brine and dried over magnesium sulfate, filtered, and the solution was concentrated. The crude product was recrystallized with dichloromethane and acetonitrile to give 2.56 g (79% yield) of Intermediate 22-2 as a white solid.

ESI-MS: 540.7 $[M+H]^+$

Intermediate 22-3

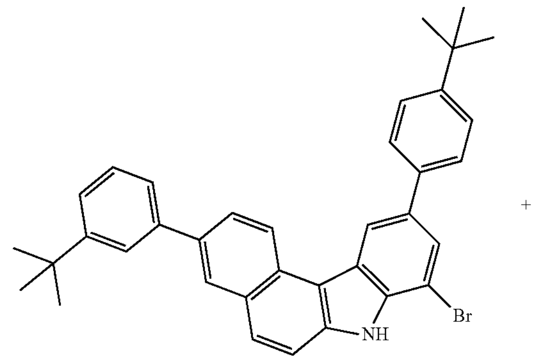

Intermediate 14-4

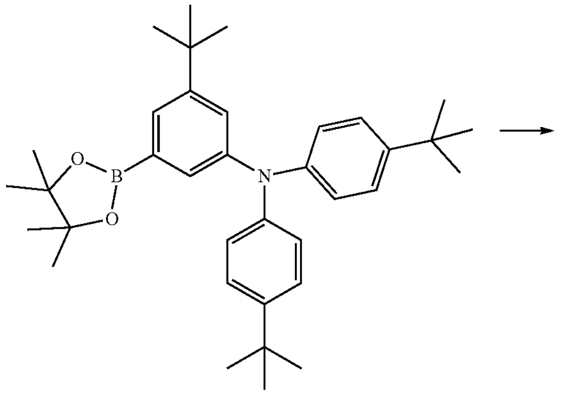

Intermediate 22-2

-continued

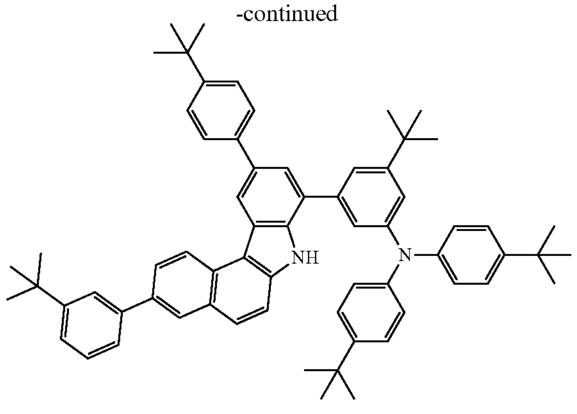

Intermediate 22-3

1.50 g (2.68 mmol) of Intermediate 14-4, 2.16 g (4.01 mmol) of Intermediate 22-2, and 2.28 g (10.70 mmol) potassium phosphate were dissolved in 22 mL of toluene, 11 mL of dioxane, and 7 mL of water. After the solution was degassed using 3 freeze-pump-thaw cycles, 21 mg (0.09 mmol) palladium acetate and 231 mg (0.56 mmol) of 2-dicyclohexylphosphino-2', 6'-dimethoxybiphenyl were added to the mixture. Then, after two additional freeze-pump-thaw cycles, the mixture was stirred to 85° C. for 21 hours. The reaction was cooled to room temperature and diluted with toluene. The organic extracts were washed with water and dried over sodium sulfate, filtered, and the solution was concentrated. The residue was purified by silica-gel column chromatography using mixed solvent of heptane and toluene as an eluent to give 2.87 g (80% yield) of Intermediate 22-3 as a white solid.

ESI-MS: 893.8 $[M-H]^-$

Compound 22

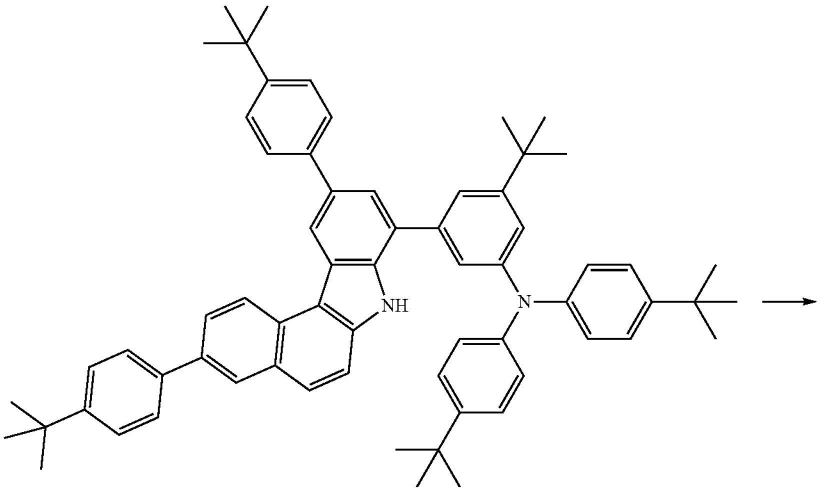

Intermediate 22-3

-continued

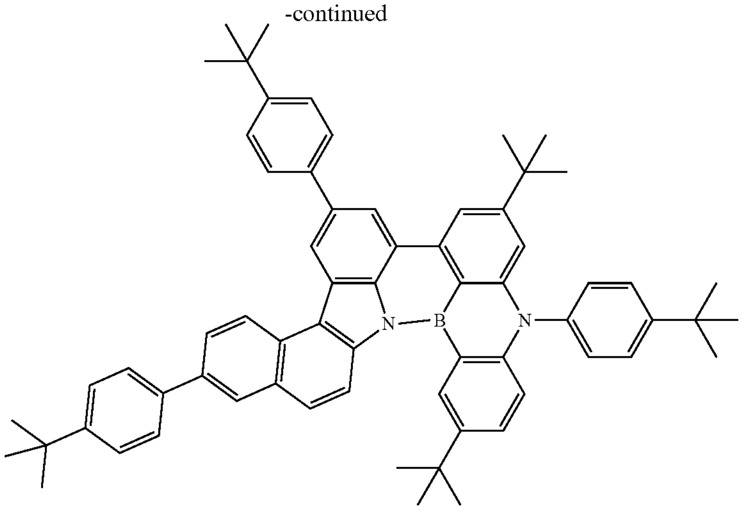

Compound 22

2.87 g (3.21 mmol) of Intermediate 22-3 was dissolved in 46 mL of dichlorobenzene. Then, 6.59 mL (6.59 mmol) of 1.0 M boron tribromide in heptane followed by 2.3 mL (10.28 mmol) of N,N-diisopropylethylamine were added to the solution, and the mixture was stirred at 180° C. for 20 hours. The reaction was cooled to room temperature and diluted with methanol. The precipitate was collected by filtration, and washed with ethanol and water. The crude product was purified by silica-gel column chromatography using a mixed solvent of heptane and dichloromethane as an eluent. The product was dissolved in dichloromethane and precipitated by adding acetonitrile, followed by filtration to give 2.19 g (76% yield) of Compound 22.

ESI-MS: 901.2 $[M+H]^+$

Compound 23

Intermediate 23-1

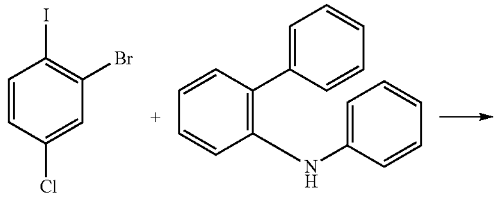

27.2 g (86.0 mmol) of 2-bromo-4-chloro-1-iodobenzene, 20.0 g (82.0 mmol) of N-phenyl-2-biphenylamine and 11.0 g (114 mmol) of sodium tertbutoxide were added to 250 mL of toluene. The mixture was degassed by bubbling $N_2$ gas for 30 min and 933 mg (1.25 mol %) of tris(dibenzylideneacetone)dipalladium(0) and 1.18 g (5 mol %) of tri-tert-butylphosphonium tetrafluoroborate were added. The reaction mixture was heated to 70° C. for 2 hours, then cooled to room temperature. The reaction mixture was filtered over a pad of silica-gel, and the product was eluted with heptane. The filtrate and washings were combined and the solvents were removed on the rotavap, followed by drying under high vacuum at 200° C. The oil was crystallised from a minimum amount of hot heptane. The brown solid was then dissolved in dichloromethane and washed twice with a 0.05% aqueous solution of sodium cyanide followed by brine. The organics were dried over magnesium sulfate and the solvent removed on the rotavap. The oil was crystallised from a minimum amount of hot heptane, filtered, and washed with pentane to give 10.9 g (28.4% yield) Intermediate 23-1 as a white solid.

$^1$H NMR (300 MHz, DMSO-$d_6$) δ 7.45 (d, J=2.4 Hz, 1H), 7.42-7.30 (m, 1H), 7.30-7.08 (m, 10H), 7.07-7.00 (m, 1H), 7.00-6.84 (m, 1H), 6.75 (m, 3H).

Intermediate 23-2

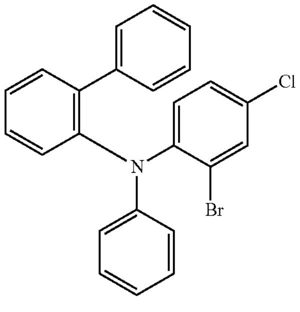

Intermediate 23-1

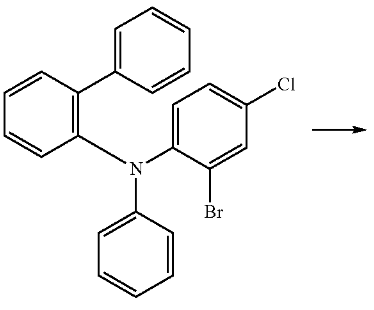

Intermediate 23-1

-continued

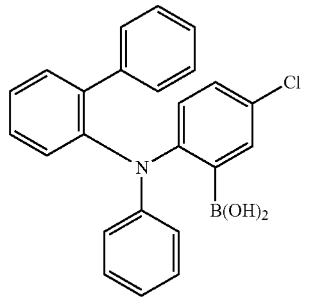

Intermediate 23-2

Under an inert atmosphere, 35 mL of n-butyllithium (2.5 M in hexanes) were added dropwise to a solution of 34.0 g (78.2 mmol) of Intermediate 23-1 in 360 mL tetrahydrofuran while keeping the temperature below −60° C. using an acetone-dry ice bath. After the addition was complete, the reaction was stirred for 1.5 hours at −78° C. 30 mL (268 mmol) of trimethylborate were then added slowly while keeping the temperature below −60° C. After the addition was complete, the reaction was stirred for 15 minutes at −78° C., and then warmed slowly to room temperature, and stirred for 20 minutes to give a milky solution. 400 ml of 10% HCl solution was added to the reaction, and the biphasic mixture was stirred for 1 hour. The organic solvents were removed on the rotavap and the resulting suspension was filtered. The solid was triturated in 500 mL heptane at reflux for 1 hour. The white suspension was then concentrated to half the volume on the rotavap, and stirred for 1 hour at 0° C. before filtering to give 22.3 g (71.3% yield) Intermediate 23-2 as a white solid.

ESI-MS: 400.2 $[M+H]^+$

Intermediate 23-3

-continued

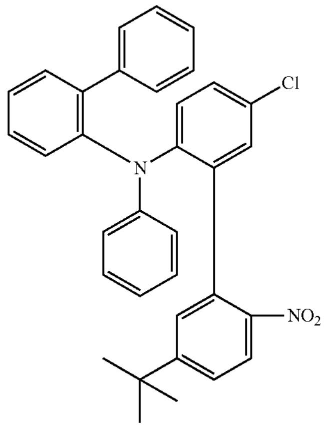

Intermediate 23-3

4.88 g (18.9 mmol) of 2-bromo-4-(tertbutyl)-1-nitrobenzene, 6.3 g (15.8 mmol) Intermediate 23-2, and 1.87 g (81.3 mmol) of sodium hydroxide were dissolved in a mixture of 75 mL dioxane and 30 mL water, and the mixture was degassed by bubbling N2. 547 mg (3 mol %) tetrakis (triphenylphosphine)palladium(0) were added, and the reaction was heated to 85° C. for 3 hours. The reaction was cooled to room temperature and poured into water, extracted with dichloromethane and the organic phase was washed with water and brine. The organics were dried over magnesium sulfate, and heptane was added before the dichloromethane was removed on the rotavap until a precipitate started forming. After stirring the precipitate at approximately 15° C., the suspension was filtered and washed with heptane. The solid was dissolved in 50 mL dichloromethane, and 100 ml heptane was added. The solution was concentrated to about 50 ml on the rotavap, and stirred at room temperature for 1 hour. The yellow suspension was filtered to give 4.72 g (55% yield) of Intermediate 23-3 as a yellow solid.

ESI-MS: 533.3 $[M+H]^+$

Intermediate 23-4

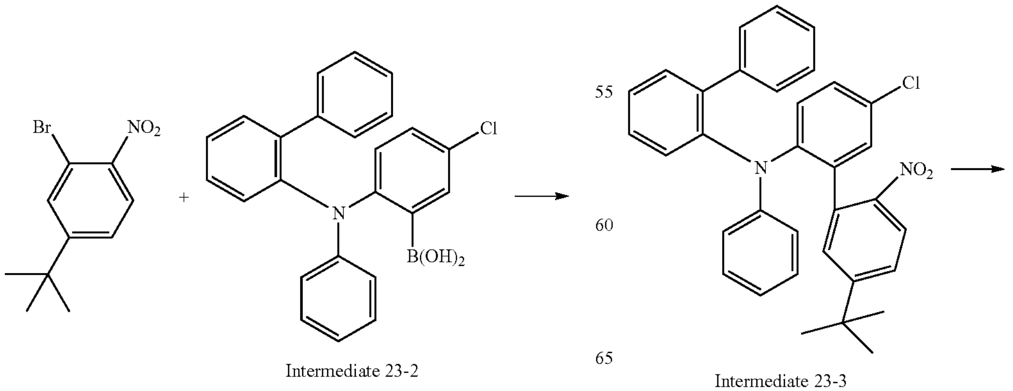

Intermediate 23-2

Intermediate 23-3

-continued

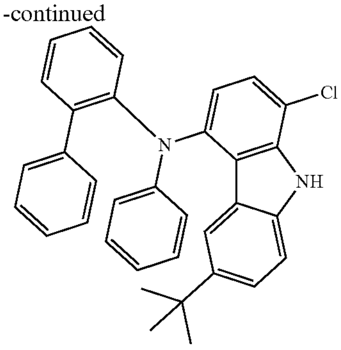

Intermediate 23-4

16.2 g (30.5 mmol) of Intermediate 23-3 and 40.0 g (152 mmol) of triphenylphosphine were dissolved in 160 mL of 1,2-dichlorobenzene and heated to reflux for 11 hours. The 1,2-dichlorobenzene and most of the triphenylphosphine were then distilled under reduced pressure, and the remaining black tar was cooled to room temperature. The residue was then dissolved in refluxing heptane, and 15 g Hyflo® Super-Cel® were added, followed by 5 g of active charcoal. The suspension was then filtered hot over a pad of Hyflo® Super-Cel® and the pad was washed with heptane and the combined filtrate was filtered over a pad of silica. The pad was washed with heptane, and the colorless filtrate was discarded. The product was then eluted with toluene to give an orange filtrate. The solvent from the filtrate was removed on the rotavap, and the crude product was purified twice by silica-gel column chromatography using a mixture of heptane and dichloromethane. The resulting resin was dissolved in a mixture of heptane and dichloromethane, and the dichloromethane removed on the rotavap. The resulting solution was cooled to 0° C., during which a precipitate formed. After stirring for 2 hours, the suspension was filtered to give 4.53 g (30% yield) Intermediate 23-4 as a white solid.

ESI-MS: 499.4 $[M-H]^-$

Intermediate 23-5

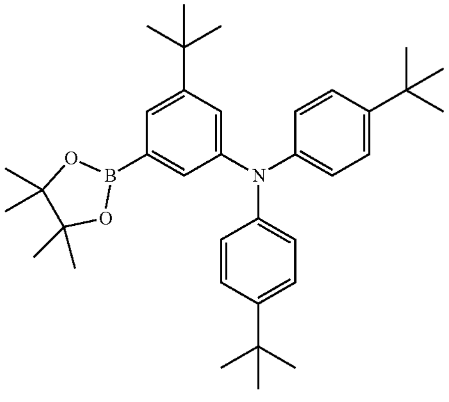

Intermediate 22-2

+

-continued

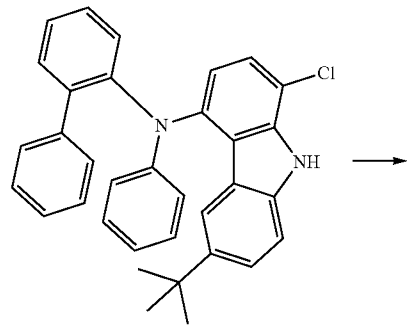

Intermediate 23-4

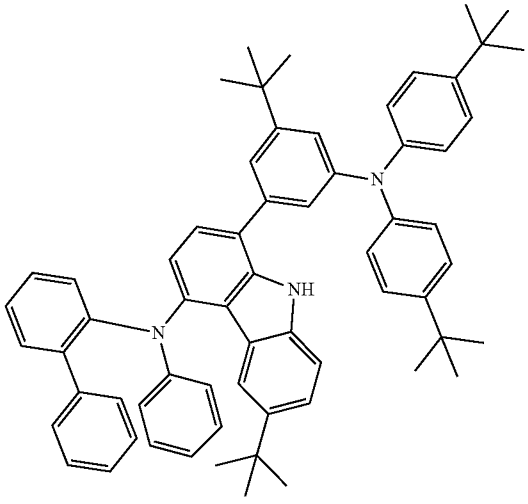

Intermediate 23-5

2.04 g (3.77 mmol) of Intermediate 22-2, 1.8 g (3.59 mmol) of Intermediate 23-4, and 1.91 g (8.98 mmol) of potassium phosphate were suspended in 35 mL toluene, 23 mL dioxane, and 12 mL water, and the reaction mixture was degassed by bubbling $N_2$. 66 mg (2 mol %) tris(dibenzylideneacetone)dipalladium(0) and 137 mg (8 mol %) Xphos were then added, and the reaction heated to 90° C. for 24 hours. An additional 33 mg (1 mol %) tris(dibenzylideneacetone)dipalladium(0) and 69 mg (4 mol %) Xphos were then added and the reaction further heated at 90° C. for 3 hours, then cooled to room temperature. The reaction was poured into 200 mL saturated aqueous ammonium chloride solution, and extracted with ethyl acetate. The organic phase was washed with water, brine, and dried over magnesium sulfate before filtering over a pad of silica-gel. The pad was washed with ethyl acetate, and the solvents of the filtrate were evaporated on the rotavap. The crude product was purified by silica-gel column chromatography using a mixture of heptane and ethyl acetate as eluent, and then again using a mixture of heptane and toluene as eluent. The resulting colorless foam was dissolved in dichloromethane, and methanol was added. The solution was concentrated on the rotavap at room temperature until a precipitate formed. The suspension was stirred at −40° C. for 20 minutes and filtered. A second crop was filtered from the mother liquor, and the white solids combined to give 1.49 g (47% yield) Intermediate 23-5 as a white solid.

ESI-MS: 878.7 $[M+H]^+$, 876.6 $[M-H]^-$

Compound 23

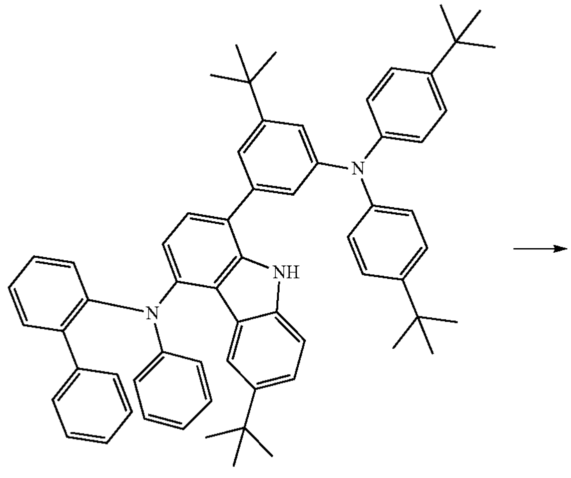

Intermediate 23-5

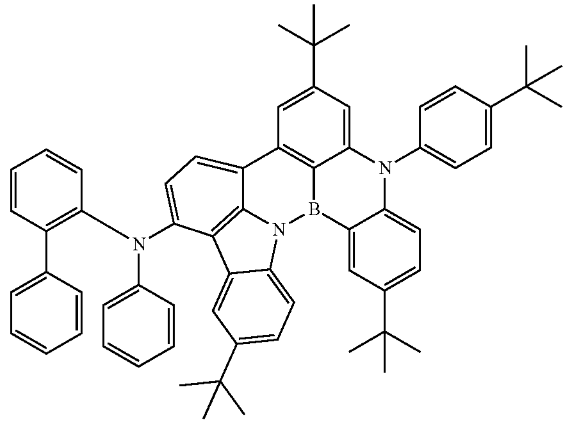

Compound 23

Under an inert atmosphere, 0.75 mL of n-butyllithium (2.5 M in hexanes) were added dropwise to a solution of 1.50 g (1.71 mmol) of Intermediate 23-5 in 70 mL tert-butylbenzene while keeping the temperature below −15° C. using an ice/sodium chloride bath. After the addition was complete, the reaction was heated to room temperature for 20 minutes, then cooled to −15° C. and 3.5 mL of boron-tribromide (1 M in heptane) were then added slowly while keeping the temperature below −10° C. The reaction was warmed to 120° C. for 5 hours. The reaction was then cooled to room temperature and quenched with 100 mL of 10% aqueous sodium bicarbonate solution. The organic phase was washed twice with water, dried over sodium sulfate and filtered over a pad of silica-gel. The pad was washed with toluene, and the filtrate was concentrated on the rotavap to remove the toluene. The yellow solution was cooled to 0° C., and 300 mL acetonitrile were added. A precipitate slowly formed over 2 hours, and the resulting solid was filtered off. The mother liquor was concentrated on the rotavap to an oil and dissolved in dichloromethane. 70 mL acetonitrile was added, and the solution was concentrated on the rotavap to approximately 40 mL. The solution was cooled to room temperature, seeded with crystals from previous precipitation, and left to stir for 1 hour. The resulting precipitate was then filtered, and the combined solids were purified twice by silica-gel column chromatography using a mixture of heptane and dichloromethane as eluent. The purified product was dissolved in 50 mL dichloromethane and 75 mL acetonitrile, and the solution concentrated until a precipitate formed. The suspension was stirred at room temperature for 30 minutes and filtered to give 870 mg (58% yield) of Compound 23 as a bright yellow solid.

ESI-MS: 886.7 $[M+H]^+$

Compound 24

Intermediate 24-1

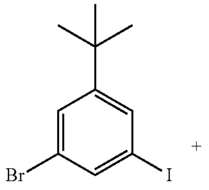

+

Intermediate 7-1

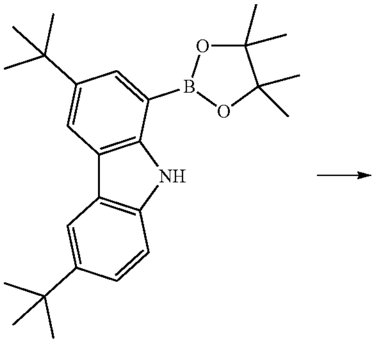

Intermediate 2-3

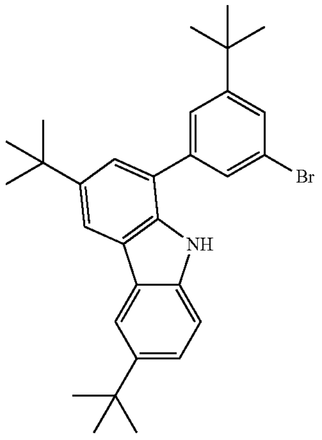

Intermediate 24-1

4.07 g (12.0 mmol) of Intermediate 7-1, 4.13 g (10.2 mmol) of Intermediate 2-3, 0.96 g (24.0 mmol) of sodium hydroxide were suspended in a mixture of tetrahydrofuran/water (54/27 mL). The suspension was degassed with Ar, and 277 mg (2 mol %) of tetrakis(triphenylphosphine) palladium(0) were added to the reaction mixture. The reaction mixture was refluxed for 1.5 hours. The reaction was cooled to room temperature and diluted with toluene/water. The layers were separated, and the water layer was further extracted with toluene. The organic extracts were washed with water, brine and dried over sodium sulfate, filtered and evaporated. The residue was purified by silica-gel column chromatography using heptanes/toluene as eluent to give 4.30 g (73% yield) of Intermediate 24-1 as a white foam.

ESI-MS: 490.2 $[M-H]^-$

Intermediate 24-2

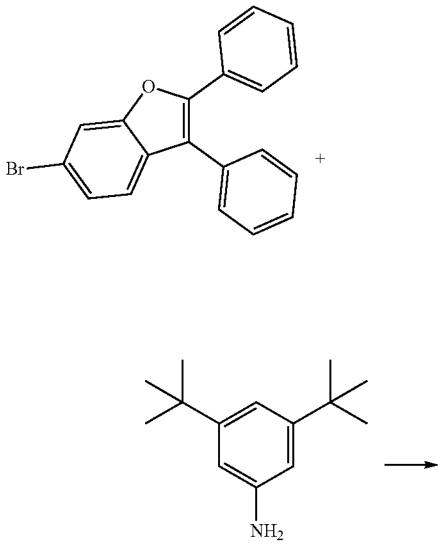

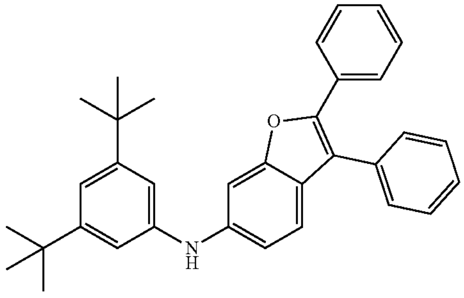

Intermediate 24-2

1.74 g (4.97 mmol) of 6-bromo-2,3-diphenylbenzofuran, 1.00 g (4.87 mmol) of 3,5-di-tert-butylaniline, 1.17 g (12.17 mmol) of sodium tert-butoxide were suspended in 24 mL toluene. The suspension was degassed with Ar, and 166 mg (6 mol %) of 4,5-bis(diphenylphosphino)-9,9-dimethylxanthene and 134 mg (3 mol %) of tris(dibenzylideneacetone) dipalladium(0) were added to the reaction mixture. The reaction mixture was heated to 90° C. for 45 min. The reaction was cooled to room temperature, diluted with toluene/water, and filtered over celite. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 1.4 g (61% yield) of Intermediate 24-2 as a white solid.

ESI-MS [M+H] 474.4.

Intermediate 24-3

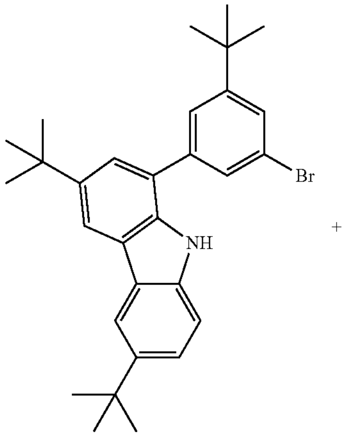

Intermediate 24-1

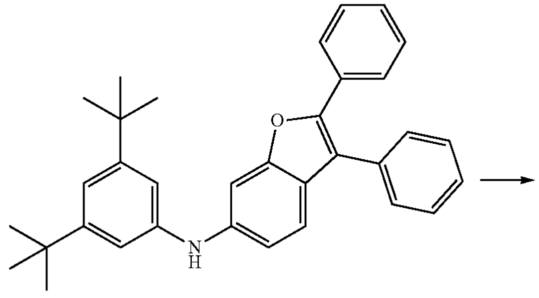

Intermediate 24-2

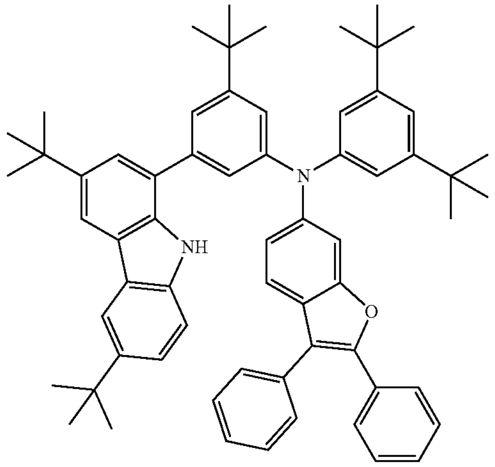

Intermediate 24-3

1.35 g (2.75 mmol) of Intermediate 24-1, 1.30 g (2.75 mmol) of Intermediate 24-2, 661 mg (6.88 mmol) of sodium tertbutoxide were suspended in 35 mL toluene. The suspension was degassed with Ar, and 127 mg (8 mol %) of 4,5-bis(diphenylphosphino)-9,9-dimethylxanthene and 101 mg (4 mol %) of tris(dibenzylideneacetone)dipalladium(0) were added to the reaction mixture. The reaction mixture was heated to 90° C. for 2.5 hours. The reaction was cooled to room temperature, diluted with toluene/water, and filtered over celite. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 2.28 g (94% yield) of Intermediate 24-3 as a beige foam.

ESI-MS: 883.7 [M+H]

Compound 24

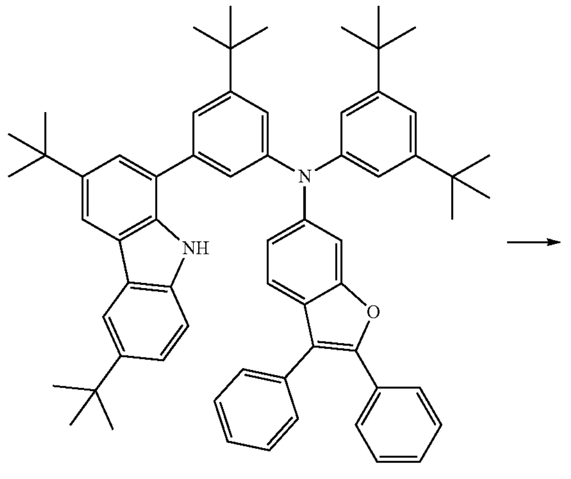

Intermediate 24-3

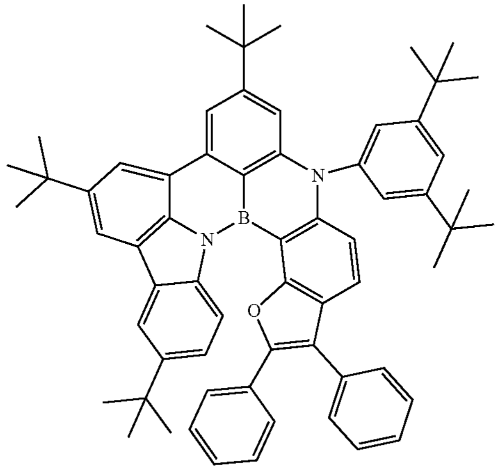

Compound 24

1.86 g (2.1 mmol) of Intermediate 24-3 were dissolved in 40 mL of tert-butylbenzene, degassed with Ar and cooled to 0° C. 4.07 mL (6.51 mmol) of tert-butyllithium (1.6 M solution in pentane) was added dropwise, then stirred for 5 min at the same temperature. Then, the reaction was stirred at room temperature for 2 hours. Then, 4.20 mL (4.20 mmol) of tribromoborane (1M solution in heptane) was added dropwise, the reaction as stirred for 5 min, followed by the addition of 1.44 mL (8.40 mmol) of N-ethyl-N-isopropyl-propan-2-amine. The reaction mixture was stirred at room temperature for 3 hours, followed by quenching with water/toluene. The layers were separated, and the water layer was further extracted with toluene. The organic extracts were washed with water, brine, dried over sodium sulfate, filtered and evaporated. The residue was purified by silica-gel column chromatography using heptanes/toluene as eluent to give 1.25 g (66% yield) of Compound 24 as a yellow solid.

ESI-MS [M+H] 891.6.

Compound 25

Intermediate 25-1

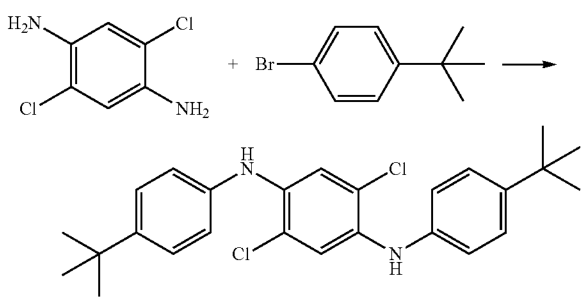

Intermediate 25-1

20.0 g (0.11 mol) of 2,5-dichlorobenzene-1,4-diamine, 48.2 g (0.23 mol) of 1-bromo-4-(tert-butyl)benzene, 517 mg (0.57 mmol) of tris(dibenzylideneacetone)dipalladium(0), 1.06 g (0.6 mmol) of 2,2'-bis(diphenylphosphino)-1,1'-binaphthalene (BINAP), and 32.6 g (0.34 mol) of sodium tert-butoxide were suspended in 400 mL of o-xylene. The suspension was heated at 126° C. during four hours. The reaction mixture was cooled down to room temperature and 100 ml of 5% aqueous sodium cyanide solution were added. The mixture was vigorously stirred during 30 minutes, and then filtered. The remaining solid was washed with 300 mL of ethyl acetate. The collected filtrate was washed with water (3×100 mL), dried over magnesium sulfate and concentrated under vacuum. The resulting solid was suspended in 400 mL of ethanol, and the suspension stirred during one hour. The suspension was cooled down, then filtered, and the solid washed with cold ethanol to give 31.6 g (63% yield) of Intermediate 25-1 as a white solid.

ESI-MS (positive, m/z): exact mass of $C_{26}H_{30}Cl_2N_2$=440.18; found 441.3 $[M+1]^+$.

Intermediate 25-2

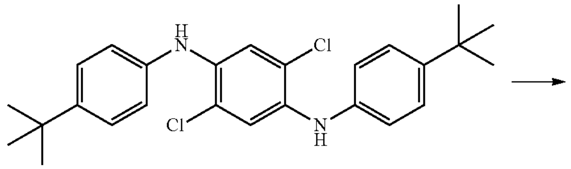

Intermediate 25-1

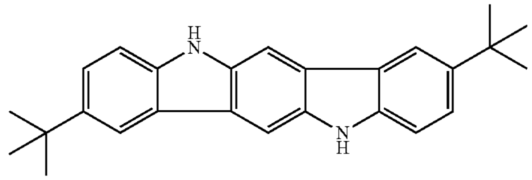

Intermediate 25-2

30.0 g (68.0 mmol) of Intermediate 25-1, 517 mg (0.57 mmol) of palladium(II) acetate, 789 mg (0.6 mmol) of tri-tert-butylphosphonium tetrafluoroborate, 5.2 g (51 mmol) of pivalic acid, and 47 g (0.34 mol) of potassium carbonate were suspended in 300 mL of N-dimethylacetamide. The suspension was heated at 152° C. during eight hours. The reaction mixture was cooled down to room temperature and poured into 1000 mL of water. The suspension was stirred during one hour, then filtered and the solid washed with 400 mL of water. The solid was dissolved in 300 mL of dichloromethane and filtered through a 3 cm layer of silica gel, followed by rinsing the silica gel layer with 600 mL of dichloromethane and 1000 mL of ethyl acetate. The collected eluents were concentrated under vacuum to a volume of 100 mL, and 200 mL of heptane were added. The mixture was stirred until a suspension formed. The suspension was filtered and the white solid washed with heptane to give 25.0 g (quantitative yield) of Intermediate 25-2.

ESI-MS (positive, m/z): exact mass of $C_{26}H_{28}N_2$=368.23; found 369.5 $[M+1]^+$.

Intermediate 25-3

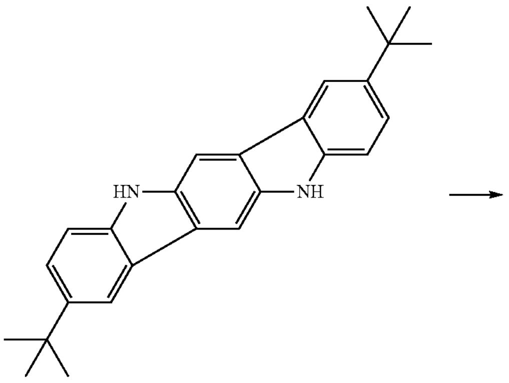

Intermediate 25-2

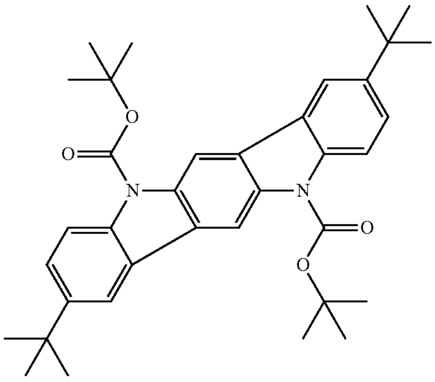

Intermediate 25-3

25.0 g (67.8 mmol) of Intermediate 25-2 and 32.6 g (0.15 mol) of di-tert-butyl dicarbonate were dissolved in 700 mL of tetrahydrofuran. 1.82 g (14.9 mmol) of 4-(dimethylamino)pyridine were added and the suspension stirred at room temperature during two hours. The suspension was filtered and the solid washed with 100 mL of tetrahydrofuran and 200 mL of ethyl acetate to give 29.4 g (76% yield) of Intermediate 25-3 as a white solid.

Intermediate 25-4

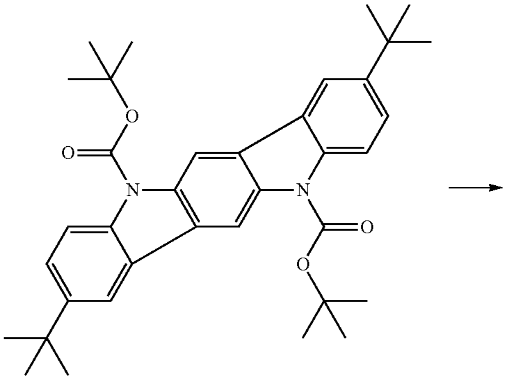

Intermediate 25-3

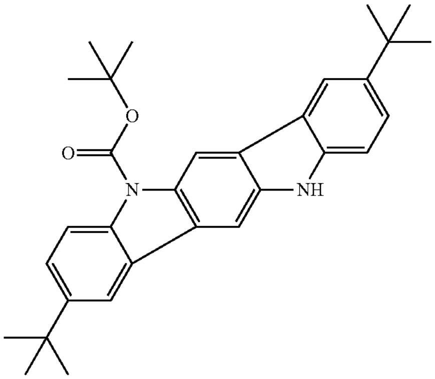

Intermediate 25-4

29.0 g (51.0 mmol) of Intermediate 25-3 was suspended in 600 mL of tert-butylbenzene and heated at 164° C. during three hours. The solution was cooled down and stirred at room temperature during 18 hours. The resulting suspension was filtered. The filtrate was concentrated under vacuum to give 10.2 g (43% yield) of Intermediate 25-4 as a white solid.

ESI-MS (negative, m/z): exact mass of $C_{31}H_{36}N_2O_2$=468.28; found 467.4 $[M-1]^+$.

Intermediate 25-5

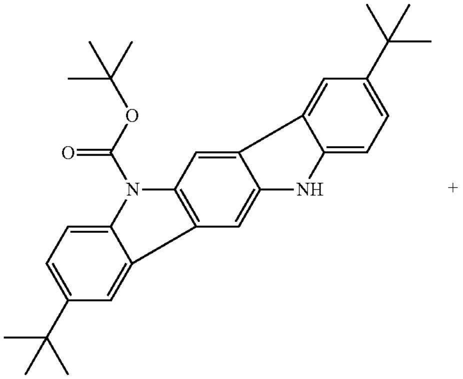

Intermediate 25-4

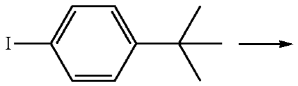

-continued

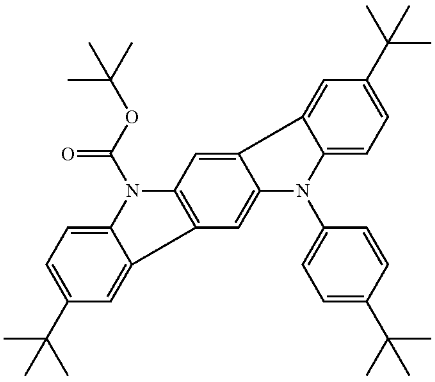

Intermediate 25-5

16.0 g (34.1 mmol) of Intermediate 25-4, 10.7 g (41 mmol) of 1-(tert-butyl)-4-iodobenzene, 650 mg g (3.41 mmol) of copper(I) iodide, 1.12 g (10.2 mmol) of cyclohexane-1,2-diamine, and 21.7 g (102 mmol) of potassium phosphate tribasic were suspended in 350 mL of 1,4-dioxane, and heated at 91° C. during four hours. 1.00 g (3.8 mmol) of 1-(tert-butyl)-4-iodobenzene was added and heating continued at 91° C. during four hours. The suspension was filtered through a 3 cm layer of silica gel and the silica gel layer rinsed with 200 mL of dioxane. The collected eluents were concentrated under vacuum and the product dissolved in 50 ml of dichloromethane. 200 mL of ethanol were added and the solution concentrated down to 200 mL until a suspension formed. The suspension was filtered and the solid washed with ethanol to give 13.8 g (67% yield) of Intermediate 25-5.

ESI-MS (positive, m/z): exact mass of $C_{41}H_{48}N_2O_2$=600.37; found 601.8 [M+1]$^+$.

Intermediate 25-6

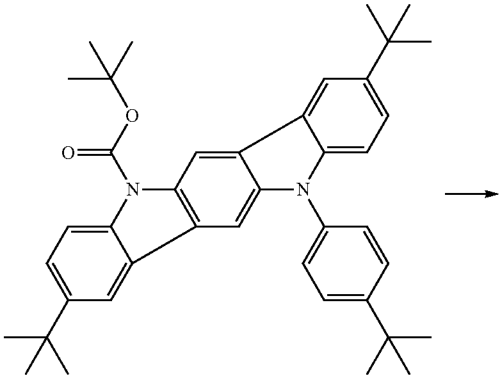

Intermediate 25-5

-continued

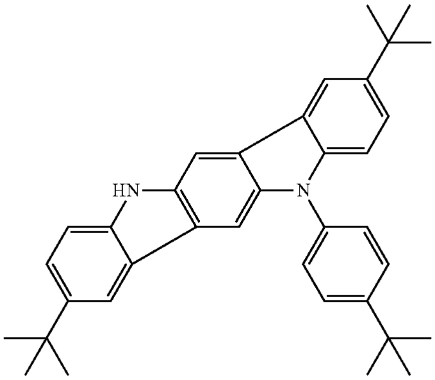

Intermediate 25-6

13.5 g (22.5 mmol) of Intermediate 25-5 was heated at 230° C. during 90 minutes. The melted solid was cooled down and purified by MPLC with the CombiFlash Companion (silica gel, heptane/0-8% gradient of ethyl acetate) to give 8.7 g (77%) of Intermediate 25-6 as a white solid.

ESI-MS (positive, m/z): exact mass of $C_{36}H_{40}N_2$=500.32; found 501.7 [M+1]$^+$.

Intermediate 25-7

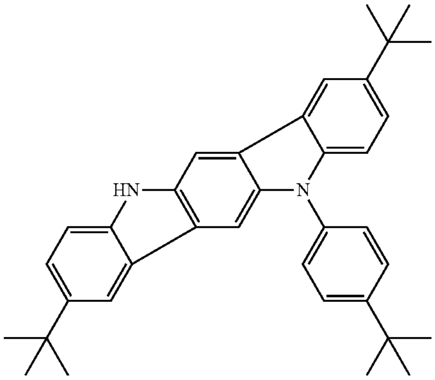

Intermediate 25-6

+

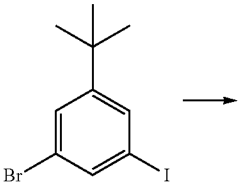

Intermediate 7-1

-continued

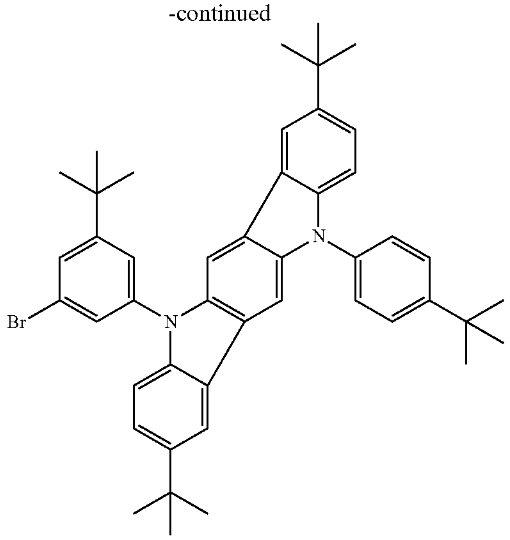

Intermediate 25-7

2.4 g (7.0 mmol) of Intermediate 7-1, 2.70 g (5.39 mmol) of Intermediate 25-6, 103 mg (0.54 mmol) of copper(I) iodide, 185 mg (1.62 mmol) of cyclohexane-1,2-diamine, and 3.43 g (16.2 mmol) of potassium phosphate tribasic were suspended in 100 mL of 1,4-dioxane, and heated at 91° C. during eight hours. The suspension was cooled down to room temperature and filtered through a 3 cm layer of silica gel, followed by rinsing the silica gel layer with 30 mL of dioxane. The collected eluents were concentrated under vacuum and the product was further purified by MPLC with the CombiFlash Companion (silica gel, heptane/0-25% gradient of dichloromethane) to give 2.45 g (64% yield) of Intermediate 25-7 as a white solid.

ESI-MS (positive, m/z): exact mass of $C_{46}H_{51}BrN_2$=710.32; found 711.6 [M+1]$^+$.

Intermediate 25-8

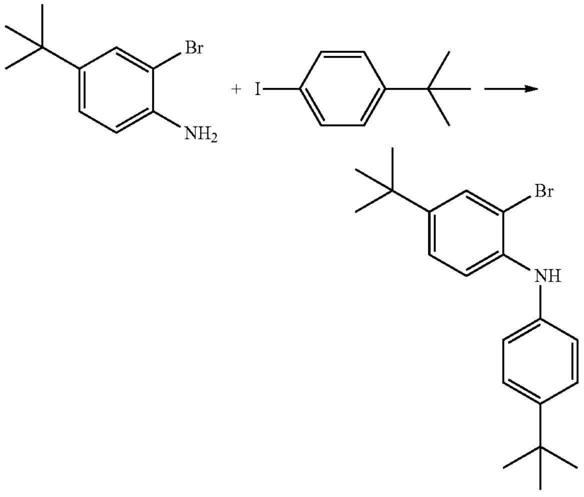

Intermediate 25-8

30.0 g (0.13 mol) of 2-bromo-(tert-butyl)aniline, 34.2 g (0.13 mol) of 1-(tert-butyl)-4-iodobenzene, 295 mg (1.32 mmol) of palladium(II) acetate, 729 mg (1.32 mmol) of 1,1'-bis(diphenylphosphino)ferrocene (dppf) and 19.0 g (0.20 mol) of sodium tert-butoxide were suspended in 300 mL of toluene. The suspension was heated at 108° C. during 18 hours. 148 mg (0.66 mmol) of palladium(II) acetate and 365 mg (0.66 mmol) of dppf were added and heating continued at 108° C. during eight hours. The reaction mixture was cooled down to room temperature and 1 g of sodium cyanide and 100 mL of water were added. The mixture was stirred during one hour and then washed with water (3×100 mL. The organic phase was dried over sodium sulfate and concentrated under vacuum. The product was dissolved in 300 mL of hot methanol, and the solution stirred at roam temperature during 18 hours. The resulting suspension was filtered and the solid washed with cold methanol to give 24.3 g (51% yield) of Intermediate 25-8 as a grey solid.

ESI-MS (positive, m/z): exact mass of $C_{20}H_{26}BrN$=359.12; found 362.4 [M+3]$^+$.

Intermeddled 25-9

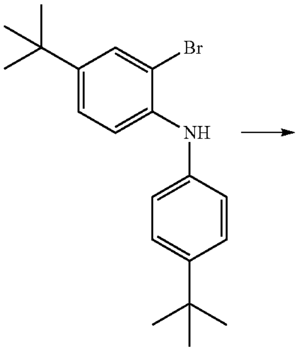

Intermediate 25-8

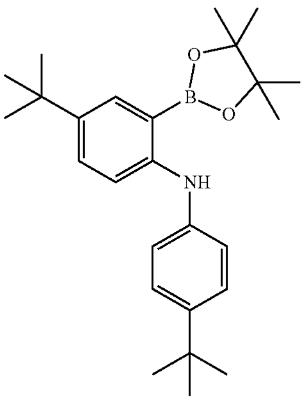

Intermediate 25-9

5.80 g (16.1 mmol) of Intermediate 25-8, 6.13 g (24.1 mmol) of bis(pinacolato)diboron, 394 mg (0.48 mmol) of 1,1'4bis(diphenylphosphino)ferrocene-palladium(I)dichloride dichloromethane complex, and 6.32 g (64.4 mmol) of potassium acetate were suspended in 150 mL of 1,4-dioxane. The reaction mixture was heated at 89° C. during eight hours. The resulting suspension was coaled down to roam temperature and diluted with 100 mL of water and 100 mL of ethyl acetate. The mixture was washed with water (3×50 mL) and the organic phase dried over sodium sulfate and concentrated under vacuum. The resulting solid was dissolved in 50 mL of dichloromethane and 100 mL of ethanol and concentrated under a vacuum down to a volume of 100 mL. The resulting suspension was filtered and the solid washed with 50 mL of ethanol to give 3.8 g (58% yield) of Intermediate 25-9.

ESI-MS (positive, m/z): exact mass of $C_{26}H_{38}BNO_2$=407.30; found 408.7 $[M+1]^+$.

Intermediate 25-10

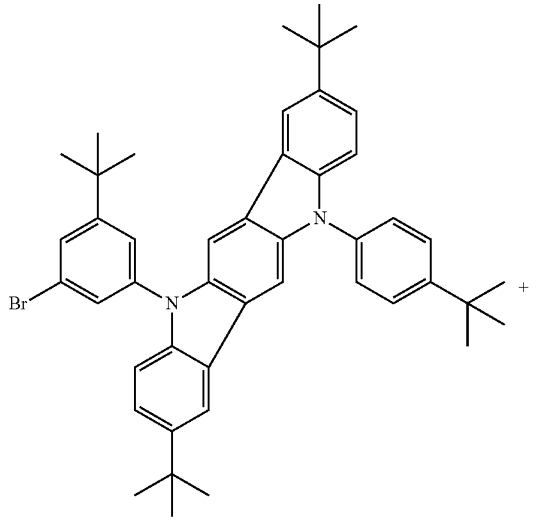

Intermediate 25-7

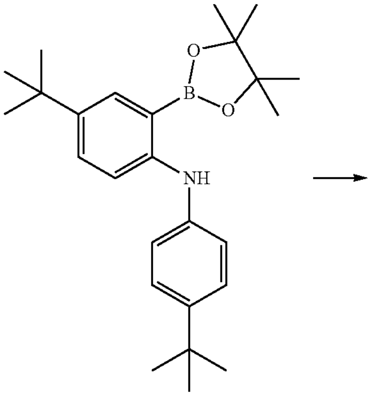

Intermediate 25-9

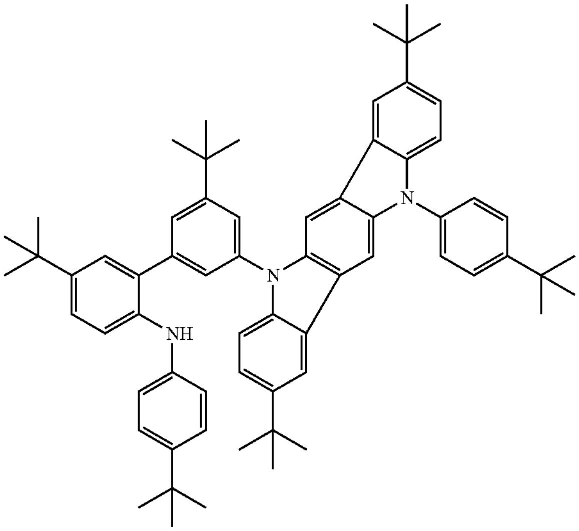

Intermediate 25-10

1.51 g (3.71 mmol) of Intermediate 25-9, 2.40 g (3.37 mmol) of Intermediate 25-7, 151 mg (0.67 mmol) of palladium(II) acetate, 166 mg (0.41 mmol) of 2-dicyclohexylphosphino-2',6'-dimethoxybiphenyl (SPhos), and 2.86 g (13.5 mmol) of potassium phosphate tribasic were dissolved in a mixture of 60 mL of toluene, 30 mL of 1,4-dioxane, and 20 mL of water. The reaction mixture was heated at 83° C. during one hour, and then cooled down to room temperature. 200 mL of toluene and 100 mL of water were added. The organic phase was washed with water (3×100 mL), dried over sodium sulfate and concentrated under vacuum. The product was dissolved in 20 mL of dichloromethane and 70 mL of ethanol. The solution was concentrated under vacuum down to a volume of 60 mL until a suspension formed. The suspension was filtered and the solid washed with 50 mL of ethanol. The product was further purified by MPLC with the CombiFlash Companion (silica gel, heptane/0-16% gradient of dichloromethane) to give 1.59 g (52% yield) of Intermediate 25-10 as a white solid.

ESI-MS (positive, m/z): exact mass of $C_{66}H_{77}N_3$=911.61; found 912.7 $[M+1]^+$.

Compound 25

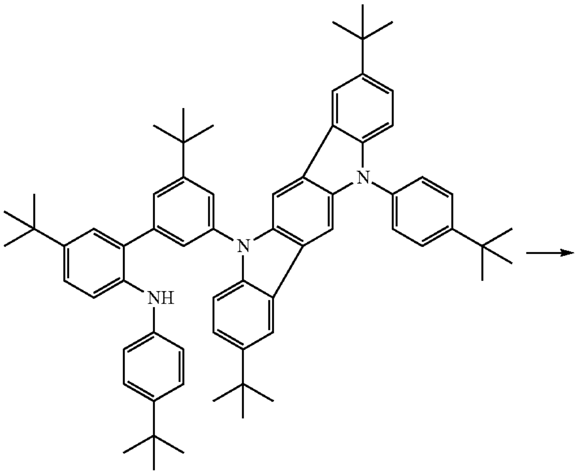

Intermediate 25-10

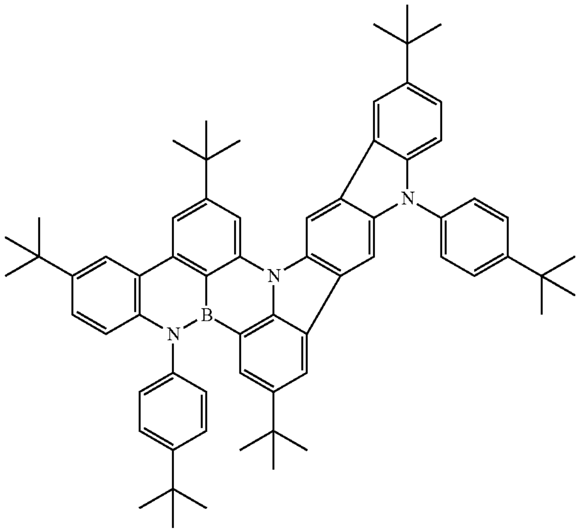

Compound 25

1.50 g (1.64 mmol) of Intermediate 25-10 were dissolved in 45 mL of 1,2-dichlorobenzene. 1.15 mL (6.6 mmol) of N,N-diisopropylethylamine and 3.3 mL of tribromoborane (1.0 M in heptane) were dropwise added. The yellow solution was heated at 174° C. during 2.5 hours. The solution was cooled down to room temperature. 3.3 ml of tribromoborane (1.0 M in heptane) were added and heating continued at 174° C. during 25 hours. The reaction mixture was cooled down to room temperature, diluted with 200 mL of ethanol, and stirred during one hour. The suspension was filtered and the solid further purified by MPLC with the CombiFlash Companion (silica gel, heptane/0-50% gradient of dichloromethane) to give 212 mg (14% yield) of Compound 25 as a yellow solid.

ESI-MS (positive, m/z): exact mass of $C_{66}H_{74}BN_3$=919.60; found 920.9 $[M+1]^+$.

Compound 26

Intermediate 26-1

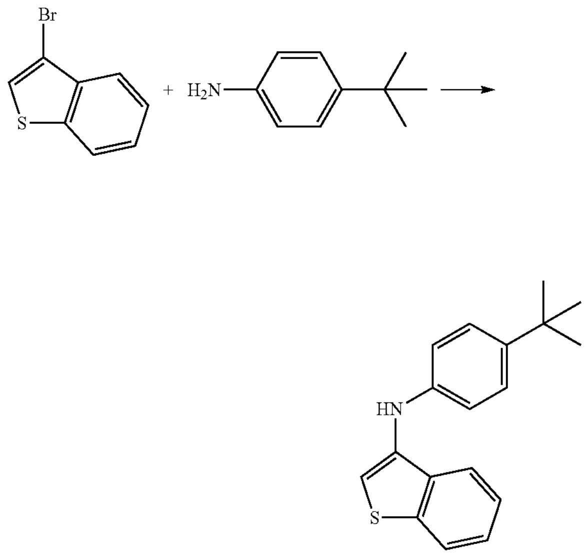

Intermediate 26-1

10.0 g (46.9 mmol) 3-bromobenzo[b]thiophene, 7.00 g (46.9 mmol) of 4-(tert-butyl)aniline, 540 mg (0.94 mmol) of tris(dibenzylideneacetone)dipalladium(0), 876 mg (3.07 mmol) of 2-dicyclohexylphosphino-2',6'-diisopropoxybiphenyl (RuPhos), and 9.02 g (94.0 mmol) of sodium tert-butoxide were suspended in 120 mL of toluene. The suspension was three times evacuated and backfilled with argon and heated at 105° C. during 18 hours. The dark suspension was dissolved cooled down to room temperature and diluted with 100 ml of toluene and 100 mL of water. The aqueous phase was washed with water (3×50 mL), dried over sodium sulfate, and concentrated under vacuum. The product was further purified by MPLC with the CombiFlash Companion (silica gel, cyclohexane/0-2% gradient of ethyl acetate) to give 10.5 g (79% yield) of Intermediate 26-1.

ESI-MS (positive, m/z): exact mass of $C_{18}H_{19}NS$=281.12; found 282.4 $[M+1]^+$.

Intermediate 26-2

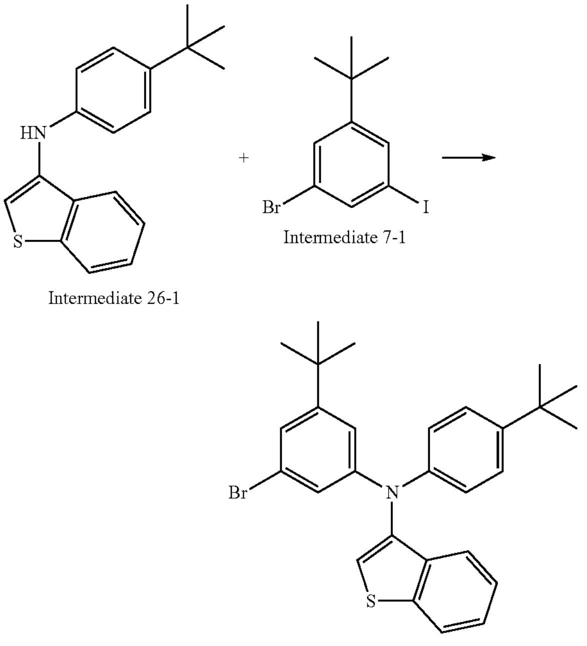

Intermediate 26-1

Intermediate 7-1

Intermediate 26-2

3.61 g (10.7 mmol) of Intermediate 7-1, 3.00 g (10.7 mmol) of Intermediate 26-1, 24 mg (0.11 mmol) of palladium(II) acetate, 63 mg (0.11 mmol) of 4,5-bis(di-phenylphosphino)-9,9-dimethylxanthene (Xantphos), and 1.54 g (16.0 mmol) of sodium tert-butoxide were suspended in 60 mL of toluene. The suspension was heated at 77° C. during four hours. The reaction mixture was cooled down to room temperature and diluted with 100 mL of water and 100 mL of toluene. The organic phase was separated and washed with water (3×100 mL) and dried over sodium sulfate. The mixture was filtered through a 3 cm layer of silica gel and the silica gel layer rinsed with 50 mL of toluene. The collected eluents were concentrated under vacuum and the product was further purified by MPLC with the CombiFlash Companion (silica gel, heptane) to give 2.7 g (51% yield) of Intermediate 26-2.

ESI-MS (positive, m/z): exact mass of $C_{28}H_{30}BrNS$=491.13; found 492.6 $[M+1]^+$.

Intermediate 26-3

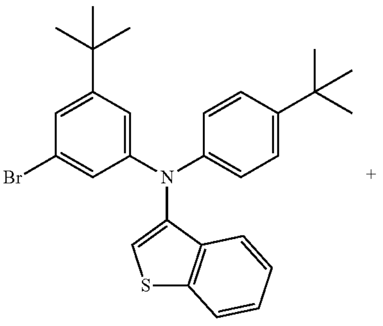

Intermediate 26-2

-continued

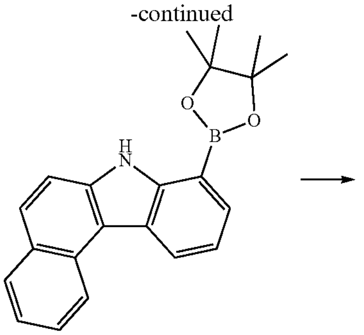

Intermediate 5-1

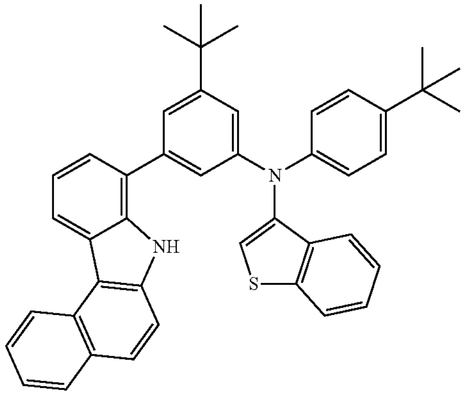

Intermediate 26-3

3.00 g (6.09 mmol) of Intermediate 26-2, 2.30 (6.70 mmol) of Intermediate 5-1, 27 mg (0.12 mmol) of palladium (II) acetate, 300 mg (0.73 mmol) of 2-dicyclohexylphosphino-2',6'-dimethoxybiphenyl (SPhos), and 5.17 g (24.4 mmol) of potassium phosphate tribasic were dissolved in a mixture of 60 mL of toluene, 30 mL of 1,4-dioxane, and 20 mL of water. The solution was three times evacuated and backfilled with argon, and heated at 84° C. during seven hours. The reaction mixture was cooled down to room temperature and diluted with 200 mL of toluene and 100 mL of water. The organic phase was washed with water (3×100 mL), dried over sodium sulfate and concentrated under vacuum. The product was further purified by MPLC with the CombiFlash Companion (silica gel, heptane/0-10% gradient of ethyl acetate). The isolated product was dissolved in 30 mL dichloromethane and 50 ml of ethanol and concentrated under vacuum until a suspension formed. The suspension was filtered and the solid washed with 50 mL of ethanol, to give 2.9 g (76% yield) of Intermediate 26-3.

ESI-MS (positive, m/z): exact mass of $C_{44}H_{40}N_2S$=628.29; found 629.8 $[M+1]^+$.

Compound 26

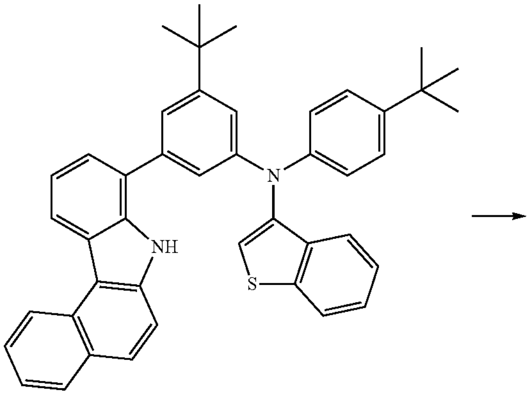

Intermediate 26-3

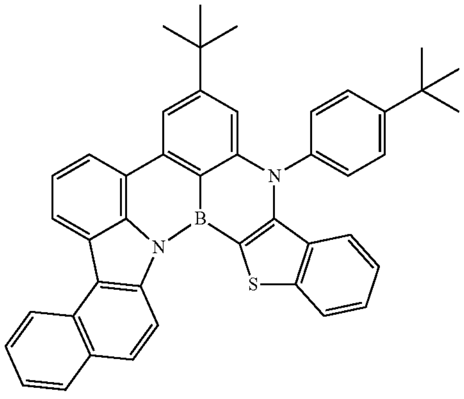

Compound 26

1.50 g (2.39 mmol) of Intermediate 26-3 were suspended in 25 mL of 1,2-dichlorobenzene. 1.7 ml (9.5 mmol) of N,N-diisopropylethylamine and 4.8 mL of tribromoborane (1.0 M in heptane) were dropwise added. The yellow suspension was heated at 176° C. during three hours. The reaction mixture was cooled down to room temperature and diluted with 100 mL of ethanol. The suspension was stirred during 15 minutes, then filtered. The filtrate was concentrated under vacuum and the residue stirred in 100 mL of heptane. The suspension was filtered and the solid washed with 50 mL of heptane to give 142 mg (9% yield) of Compound 26 as a yellow solid.

ESI-MS (positive, m/z): exact mass of $C_{44}H_{40}N_2S$=628.29; found 629.8 $[M+1]^+$.

Compound 27

Intermediate 27-1

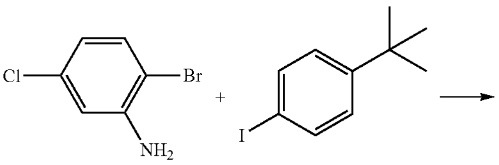

-continued

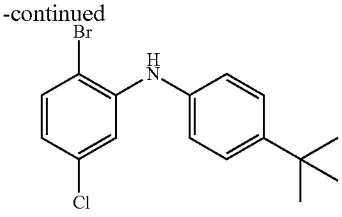

Intermediate 27-1

10.32 g (50.0 mmol) of 2-bromo-5-chloroaniline, 9.13 mL (51.5 mmol) of 1-(tert-butyl)-4-iodobenzene, 6.73 g (70.0 mmol) of sodium tertbutoxide were suspended in 250 mL toluene. The suspension was degassed with Ar, and 289 mg (1 mol %) of 4,5-bis(diphenylphosphino)-9,9-dimethylxanthene and 429 mg (0.5 mol %) of tris(dibenzylideneacetone)dipalladium(0) were added to the reaction mixture. The reaction mixture was heated to 105° C. for 50 min. The reaction was cooled to room temperature, diluted with toluene/water, and filtered over celite. The layers were separated, and the water layer was further extracted with toluene. The organic extracts were washed with water, brine, dried over sodium sulfate, filtered and evaporated. The residue was purified by silica-gel column chromatography using heptane as eluent to give 15.1 g (89% yield) of Intermediate 27-1 as a clear oil.

$^1$H NMR (300 MHz, chloroform-$d_3$) δ 7.46-7.39 (m, 3H), 7.22-7.12 (m, 2H), 6.69 (dd, 1H), 6.05 (broad s, 1H), 1.38 (s, 9H).

Intermediate 27-2

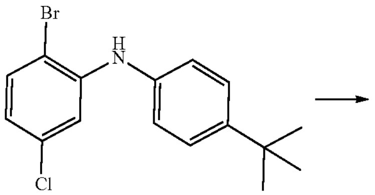

Intermediate 27-1

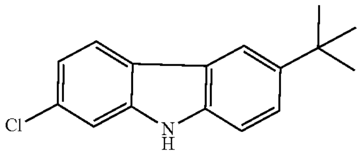

Intermediate 27-2

15.0 g (44.3 mmol) of Intermediate 27-1, 13.35 mL (89.0 mmol) of 1,8-diazabicyclo[5.4.0]undec-7-ene were suspended in 221 mL dimethylformamide. The suspension was degassed with Ar, and 451 mg (1.5 mol %) of bis(triphenylphosphine)pallidum(II) chloride were added to the reaction mixture. The reaction mixture was heated to 120° C. for 30 hours. The reaction was cooled to room temperature, diluted with toluene/water, and filtered over celite. The layers were separated, and the water layer was further extracted with toluene. The organic extracts were washed with water, brine, dried over sodium sulfate filtered and evaporated. The residue was purified by silica-gel column chromatography using heptane/toluene as eluent to give 6.43 g (56% yield) of Intermediate 27-2 as a white solid. The molecular mass of the product was confirmed by LC-MS [M−H]$^-$ 256.5.

Intermediate 27-3

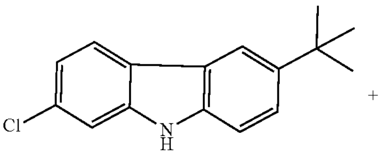

Intermediate 27-2

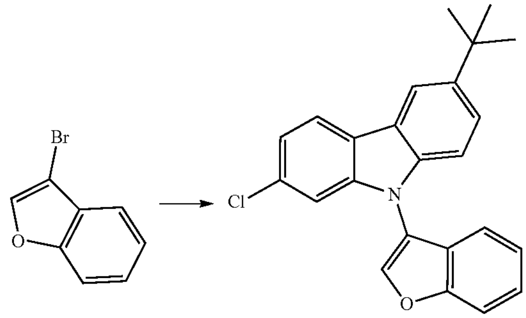

Intermediate 27-3

4.00 g (15.52 mmol) of Intermediate 27-2, 4.59 g (23.28 mmol) of 3-bromobenzofuran, 6.43 g (46.6 mmol) of potassium carbonate, and 986 mg (15.52 mmol) of copper were suspended in 52 mL of nitrobenzene. The suspension was degassed with Ar, then heated to 195° C. for 3 days. The reaction was cooled to room temperature, diluted with toluene, and filtered over celite. The organic layers were washed with a 10% solution of 3-amino-1-propanol until the blue colour disappeared. The aqueous layer was further extracted with toluene. The combined organic extracts were washed with brine, dried over sodium sulfate, filtered, and evaporated. The residue was purified by silica-gel column chromatography using heptane as eluent to give 2.38 g (41% yield) of Intermediate 27-3 as a white foam. The molecular mass of the product was confirmed by LC-MS [M+H]$^+$ 374.5.

Intermediate 27-4

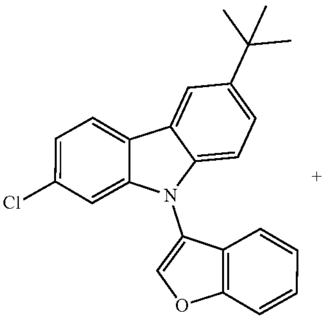

Intermediate 27-3

-continued

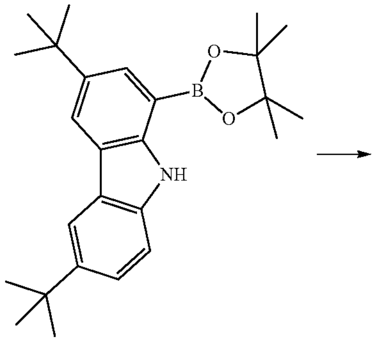

25
Intermediate 2-3

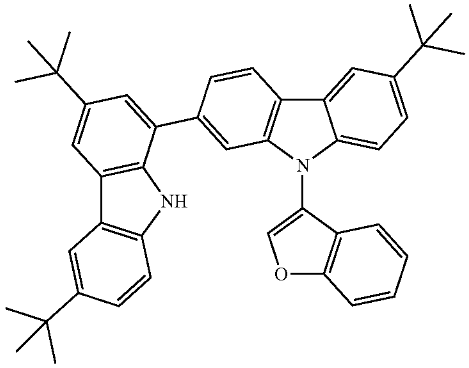

Intermediate 27-4

2.30 g (6.15 mmol) of Intermediate 27-3, 2.74 g (6.77 mmol) of Intermediate 2-3, 4.01 g (12.3 mmol) of caesium carbonate were suspended in a mixture of toluene/ethanol/water (28/9/5 mL). The suspension was degassed with Ar, and 55 mg (4 mol %) of palladium acetate and 235 mg (8 mol %) of 2-dicyclohexylphosphino-2',4',6'-triisopropylbiphenyl were added to the reaction mixture. The reaction mixture was heated to 85° C. for 3 hours. The reaction was cooled to room temperature and diluted with toluene, then filtered over a pad of celite. Water was added to the filtrate, then the layers were separated, and the water layer was further extracted with toluene. The organic extracts were washed with water, brine, dried over sodium sulfate, filtered and evaporated. The residue was purified by silica-gel column chromatography using heptane/toluene, then a second chromatography purification using heptane/dichloromethane as eluent to give 2.1 g (55% yield) of Intermediate 27-4 as a white solid. The molecular mass of the product was confirmed by LC-MS $[M-H]^-$ 615.4.

Compound 27

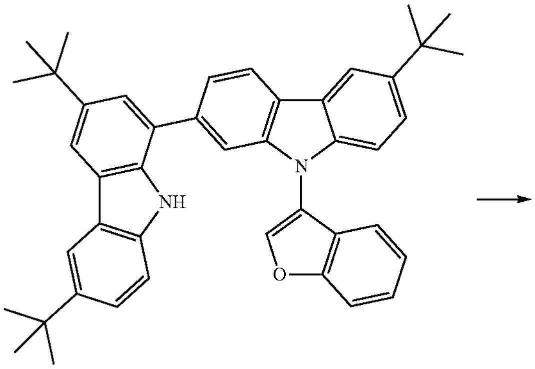

Intermediate 27-4

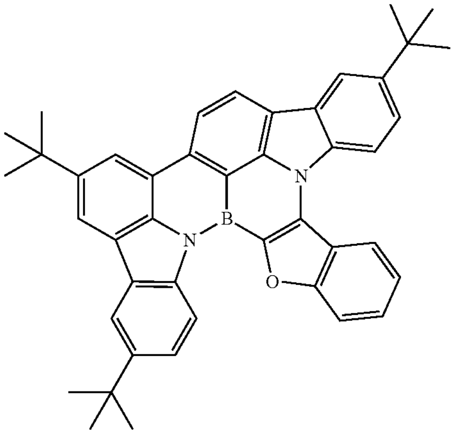

Compound 27

200 mg (0.324 mmol) of Intermediate 27-4 were dissolved in 32 ml of tert-butylbenzene, degassed with Ar and cooled to 0° C. 0.51 mL (0.973 mmol) of tert-butyllithium (1.9M solution in pentane) was added dropwise, then stirred for 5 min at the same temperature. Then, the reaction was stirred at 85° C. for 2 hours. Then, 0.81 mL (0.81 mmol) of tribromoborane (1M solution in heptane) was added dropwise at 0° C., the reaction was allowed to warm up to room temperature over 45 min, followed by the addition of 1.44 mL (8.40 mmol) of N-ethyl-N-isopropylpropan-2-amine. The reaction mixture was stirred at 155° C. for 16 hours. The reaction was cooled to room temperature and diluted with toluene/water. The layers were separated, and the water layer was further extracted with toluene. The organic extracts were washed with water, brine, dried over sodium sulfate, filtered and evaporated. The residue was purified by silica-gel column chromatography using heptane/toluene as eluent to give 5 mg (2% yield) of Compound 27 as a yellow solid. The molecular mass of the product was confirmed by LC-MS $[M+H]^+$ 624.7.

II Evaluation of Compounds

Next, the properties of the compounds used in the examples were measured. Measurement and calculation methods are shown below.

1.1 PHOTOLUMINESCENCE APPLICATION DATA

The toluene solutions of the compounds mentioned in the table were prepared by dissolving the corresponding compound in toluene with a concentration of $10^{-6}$ mol/L. The total fluorescence spectrum was measured in toluene solution using a FP-8300 JASCO Spectrofluorometer.

The photoluminescence (PL) data of inventive compounds 1 to 27 in toluene solution have been determined and are summarized in the following table. As a comparative example, the PL data of comparative compound 1 in toluene solution according to US 2019/0067577 A1 [0122] are disclosed in the table:

| Compound | PL[1)] | FWHM[2)] |
|---|---|---|
| Comparative compound 1 | 430 nm | 34 nm |
| Compound 1 | 434 nm | 17 nm |
| Compound 2 | 443 nm | 18 nm |
| Compound 3 | 452 nm | 20 nm |
| Compound 4 | 448 nm | 19 nm |
| Compound 5 | 447 nm | 20 nm |
| Compound 6 | 448 nm | 20 nm |
| Compound 7 | 457 nm | 38 nm |
| Compound 8 | 451 nm | 20 nm |
| Compound 9 | 455 nm | 20 nm |
| Compound 10 | 448 nm | 19 nm |
| Compound 11 | 443 nm | 18 nm |
| Compound 12 | 448 nm | 19 nm |
| Compound 13 | 454 nm | 20 nm |
| Compound 14 | 453 nm | 18 nm |
| Compound 15 | 450 nm | 19 nm |
| Compound 16 | 445 nm | 19 nm |
| Compound 17 | 449 nm | 18 nm |
| Compound 18 | 454 nm | 21 nm |
| Compound 19 | 450 nm | 20 nm |
| Compound 20 | 442 nm | 16 nm |
| Compound 21 | 442 nm | 17 nm |
| Compound 22 | 449 nm | 17 nm |
| Compound 23 | 453 nm | 21 nm |
| Compound 24 | 446 nm | 19 nm |
| Compound 25 | 446 nm | 20 nm |
| Compound 26 | 440 nm | 16 nm |
| Compound 27 | 442 nm | 11 nm |

[1)]Photoluminescence

[2)]Full width at half maximum

These results demonstrate that inventive compounds 1 to 6, 8 to 27 give a narrower spectrum (smaller FWHM), i.e. better color purity than comparative compound 1. The PL of inventive compound 7 is at longer wavelength than that of comparative compound 1.

Comparative compound 1

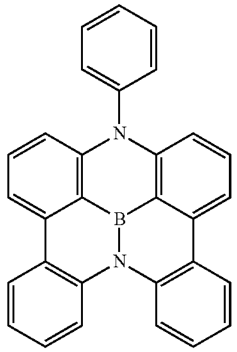

1.2 DEVICE APPLICATION DATA (INVENTED COMPOUND AS EMITTER DOPANT)

Preparation and Evaluation of Organic EL Devices

The organic EL devices were prepared and evaluated as follows:

Application Example 1

A glass substrate with 130 nm-thick indium-tin-oxide (ITO) transparent electrode (manufactured by Geomatec Co., Ltd.) used as an anode was first treated with $N_2$ plasma for 100 sec. This treatment also improved the hole injection properties of the ITO. The cleaned substrate was mounted on a substrate holder and loaded into a vacuum chamber. Thereafter, the organic materials specified below were applied by vapor deposition to the ITO substrate at a rate of approx. 0.2-1 Å/sec at about $10^{-6}$-$10^{-8}$ mbar. As a hole injection layer, 10 nm-thick mixture of Compound HT-1 and 3% by weight of compound HI was applied. Then 80 nm-thick of compound HT-1 and nm of Compound HT-2 were applied as hole-transporting layer 1 and hole-transporting layer 2, respectively. Subsequently, a mixture of 2% by weight of an emitter Compound 2 and 98% by weight of host Compound BH-1 was applied to form a 25 nm-thick fluorescent emitting layer. On the emitting layer, 10 nm-thick Compound ET-1 was applied as electron-transporting layer land nm of Compound ET-2 as electron-transporting layer 2. Finally, 1 nm-thick LiF was deposited as an electron-injection layer and 80 nm-thick Al was then deposited as a cathode to complete the device. The device was sealed with a glass lid and a getter in an inert nitrogen atmosphere with less than 1 ppm of water and oxygen. To characterize the OLED, electroluminescence (EL) spectra were recorded at various currents and voltages. EL peak maximum and Full Width at Half Maximum (FWHM) were recorded at 10 mA/$cm^2$. In addition, the current-voltage characteristic were measured in combination with the luminance to determine luminous efficiency and external quantum efficiency (EQE). Driving voltage (Voltage) was given at a current density of 10 mA/$cm^2$. The device results are shown in Table 1.

Compound HI

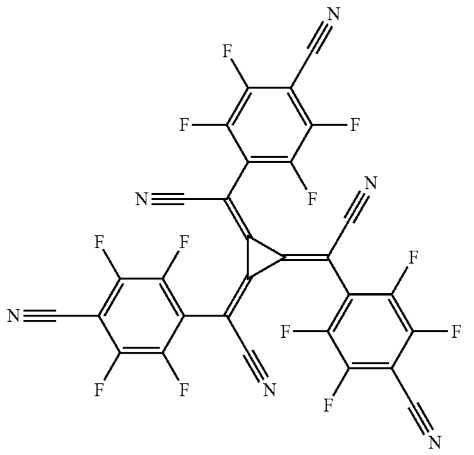

-continued

Compound HT-1

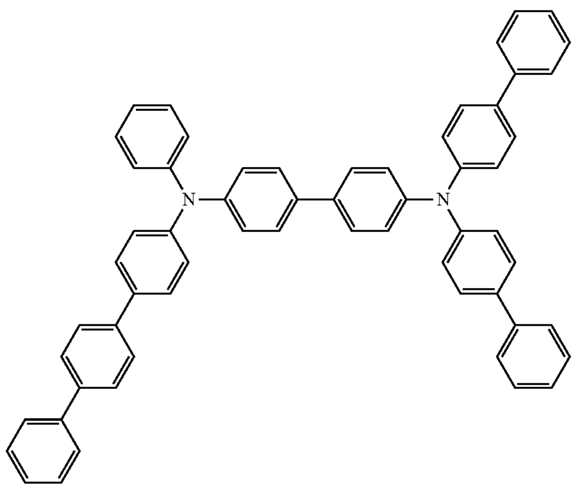

Compound HT-2

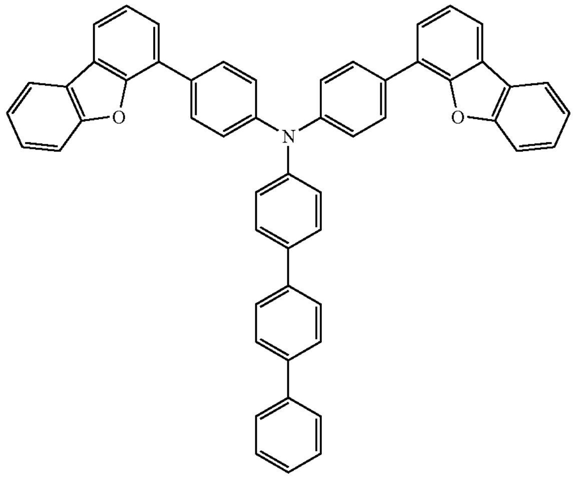

Compound 2

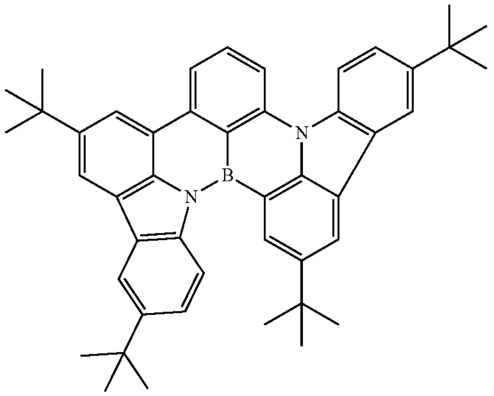

-continued

Compound BH-1

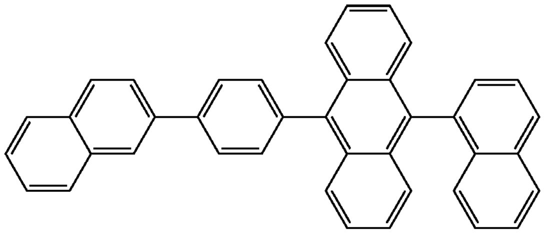

Compound ET-1

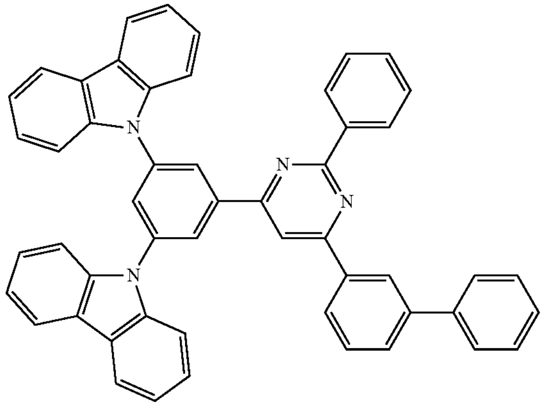

Compound ET-2

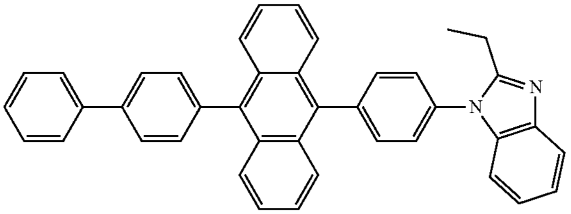

TABLE 1

| Appl. Ex. | Voltage, V | EQE, % | EL max, nm | FWHM, nm |
|---|---|---|---|---|
| Appl. Ex. 1 | 3.69 | 9.05 | 448 | 20 |

These results demonstrate that the compounds of the present invention give good EQE and narrow spectrum (smaller FWHM), i.e. good color purity when used as fluorescent emitting material in OLED.

1.3 ADDITIONAL APPLICATION EXAMPLES

Application example 1 was repeated, except Compounds 3-6, 8, 11,12,15-17, 20, 21 and 23 were used instead of Compound 2 as emitter in the fluorescent emitting layer.

TABLE 2

| Appl. Ex. | Compound | Voltage, V | EQE, % | EL max, nm | FWHM, nm |
|---|---|---|---|---|---|
| Appl. Ex. 2 | Compound 3 | 3.58 | 11 | 457 | 22 |
| Appl. Ex. 3 | Compound 4 | 3.64 | 9.10 | 453 | 22 |
| Appl. Ex. 4 | Compound 5 | 3.66 | 7.15 | 454 | 21 |
| Appl. Ex. 5 | Compound 6 | 3.54 | 7.39 | 455 | 21 |
| Appl. Ex. 6 | Compound 8 | 3.61 | 9.60 | 455 | 22 |

TABLE 2-continued

| Appl. Ex. | Compound | Voltage, V | EQE, % | EL max, nm | FWHM, nm |
|---|---|---|---|---|---|
| Appl. Ex. 7 | Compound 11 | 3.67 | 9.64 | 450 | 21 |
| Appl. Ex. 8 | Compound 12 | 3.65 | 9.90 | 452 | 20 |
| Appl. Ex. 9 | Compound 15 | 3.66 | 9.77 | 455 | 21 |
| Appl. Ex. 10 | Compound 16 | 3.66 | 9.33 | 450 | 21 |
| Appl. Ex. 11 | Compound 17 | 3.66 | 8.95 | 453 | 19 |
| Appl. Ex. 12 | Compound 20 | 3.55 | 7.22 | 447 | 21 |
| Appl. Ex. 13 | Compound 21 | 3.53 | 7.55 | 449 | 18 |
| Appl. Ex. 14 | Compound 23 | 3.71 | 10.07 | 459 | 21 |

The invention claimed is:

1. A heterocyclic compound of formula (VC) formula (I)

(VC)

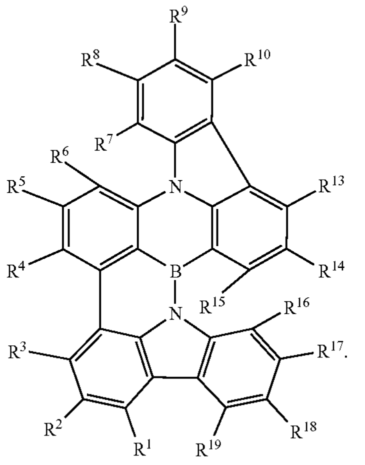

wherein $R^1$ to $R^{19}$ are each independently hydrogen, a substituted or unsubstituted aryl group having 6 to 60 carbon atoms, a substituted or unsubstituted heteroaryl group having 5 to 60 carbon atoms, a substituted or unsubstituted alkyl group having 1 to 20 carbon atoms, a substituted or unsubstituted alkylhalide group having 1 to 20 carbon atoms, a substituted or unsubstituted cycloalkyl group having 3 to 20 carbon atoms, CN, $N(R^{22})$, $OR^{20}$, $SR^{20}$, $B(R^{21})_2$, $SiR^{24}R^{25}R^{26}$, or halogen, $R^{20}$ to $R^{26}$ are each independently a substituted or unsubstituted aryl group having 6 to 60 carbon atoms, a substituted or unsubstituted heteroaryl group having 5 to 60 carbon atoms, a substituted or unsubstituted alkyl group having 2 to 20 carbon atoms, or a substituted or unsubstituted cycloalkyl group having 3 to 20 carbon atoms, two adjacent residues from $R^1$, $R^2$, and $R^3$ and/or from $R^4$, $R^5$, and $R^6$ and/or from $R^7$, $R^8$, $R^9$, and $R^{10}$ and/or from $R^{13}$, $R^{14}$, and $R^{15}$, and/or from $R^{16}$, $R^{17}$, $R^{18}$, and/or $R^{19}$ are optionally form together an optionally substituted ring structure, and wherein at least four of $R^2$, $R^3$, $R^5$, $R^8$, $R^9$, $R^{14}$, $R^{16}$, $R^{17}$, $R^{18}$, and $R^{19}$, are not hydrogen and two adjacent residues of $R^2$, $R^3$, $R^5$, $R^8$, $R^9$, $R^{14}$, $R^{16}$, $R^{17}$, $R^{18}$, and $R^{19}$ optionally form an optionally substituted ring.

2. The heterocyclic compound of claim 1, wherein at least one of $R^4$ to $R^6$ and $R^{13}$ to $R^{15}$ is a substituted or unsubstituted aryl group having 6 to 60 carbon atoms, a substituted or unsubstituted heteroaryl group having 5 to 60 carbon atoms, a substituted or unsubstituted alkyl group having 1 to 20 carbon atoms, a substituted or unsubstituted alkylhalide group having 1 to 20 carbon atoms, a substituted or unsubstituted cycloalkyl group having 3 to 20 carbon atoms, CN, $N(R^{22})_2$, $OR^{20}$, $SR^{20}$, $B(R^{21})_2$, $SIR^{24}R^{25}R^{26}$, or halogen.

3. The heterocyclic compound of claim 1, wherein at least four of $R^2$, $R^3$, $R^5$, $R^8$, $R^9$, $R^{14}$, $R^{16}$, $R^{17}$, $R^{18}$, and $R^{19}$ are independently an unsubstituted alkyl having 1 to 10 carbon atoms, an unsubstituted cycloalkyl having 3 to 12 carbon atoms, or an unsubstituted aryl having 6 to 10 carbon atoms, two adjacent substituents of $R^2$, $R^3$, $R^5$, $R^8$, $R^9$, $R^{14}$, $R^{16}$, $R^{17}$, $R^{18}$, and $R^{19}$ optionally forming an optionally substituted ring.

4. The heterocyclic compound of claim 1, wherein at least four of $R^2$, $R^3$, $R^3$, $R^5$, $R^9$, $R^{14}$, $R^{16}$, $R^{17}$, $R^{18}$, and $R^{19}$ are independently an unsubstituted alkyl group having 1 to 4 carbon atoms, an unsubstituted cycloalkyl group having 5 to 10 carbon atoms, or a substituted or unsubstituted phenyl group.

5. The heterocyclic compound of claim 1, wherein at least four of $R^2$, $R^3$, $R^5$, $R^8$, $R^9$, $R^{14}$, $R^{16}$, $R^{17}$, $R^{18}$, and $R^{19}$ are an unsubstituted tert-butyl group.

6. The heterocyclic compound of claim 1, wherein at least five of $R^2$, $R^3$, $R^5$, $R^8$, $R^{\circ}$, $R^{14}$, $R^{16}$, $R^{17}$, $R^{18}$, and $R^{19}$ are an unsubstituted tert-butyl group or a substituted or unsubstituted phenyl group.

7. The heterocyclic compound of claim 1, wherein at least four of $R^2$, $R^3$, $R^5$, $R^8$, $R^9$, $R^{14}$, $R^{16}$, $R^{17}$, $R^{18}$, and $R^{19}$ are independently an unsubstituted alkyl group having 1 to 4 carbon atoms, an unsubstituted cycloalkyl group having 5 to 10 carbon atoms, or a substituted or unsubstituted phenyl group, two adjacent substituents of $R^2$, $R^3$, $R^5$, $R^8$, $R^9$, $R^{14}$, $R^{16}$, $R^{17}$, $R^{18}$, and $R^{19}$ optionally forming an optionally substituted ring.

8. A heterocyclic compound, having a structure (1)

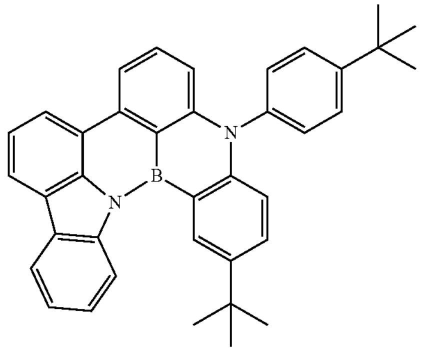

(2)

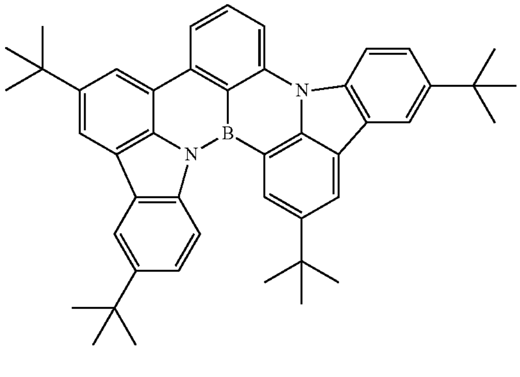

-continued
(3)
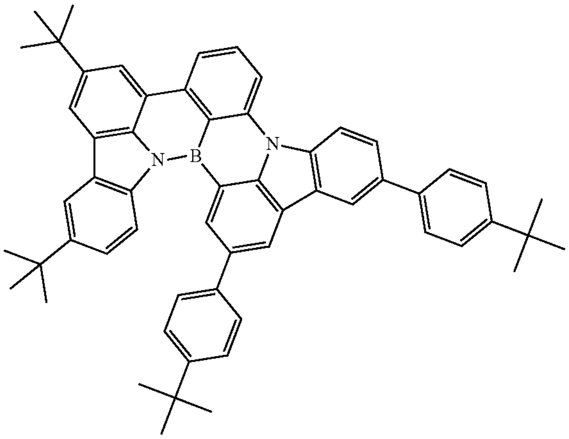
(4)
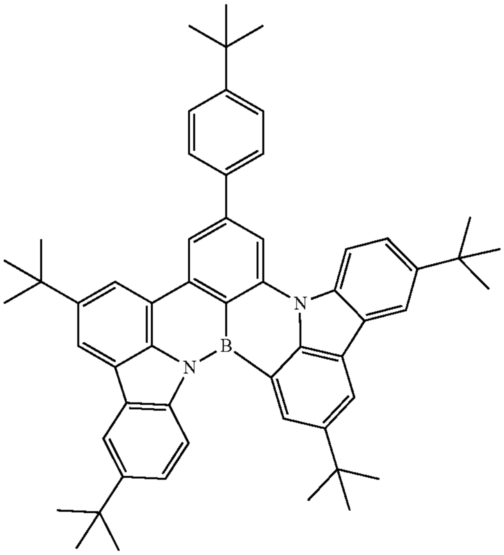
(5)
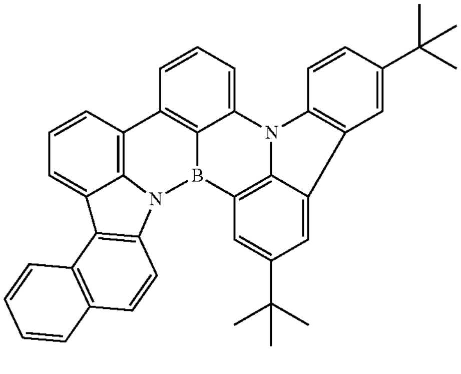
-continued
(6)
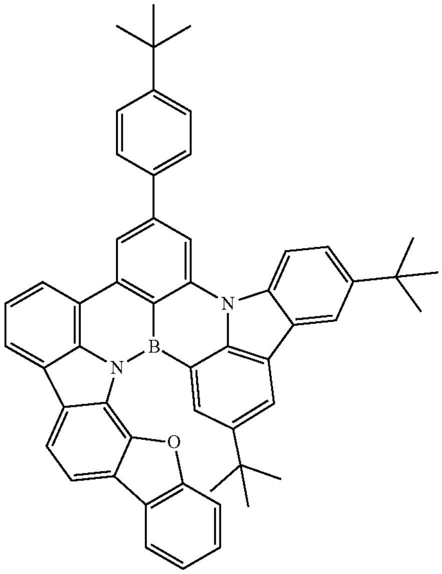
(7)
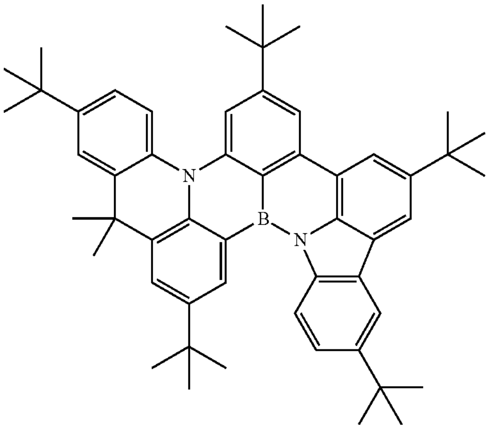
(8)
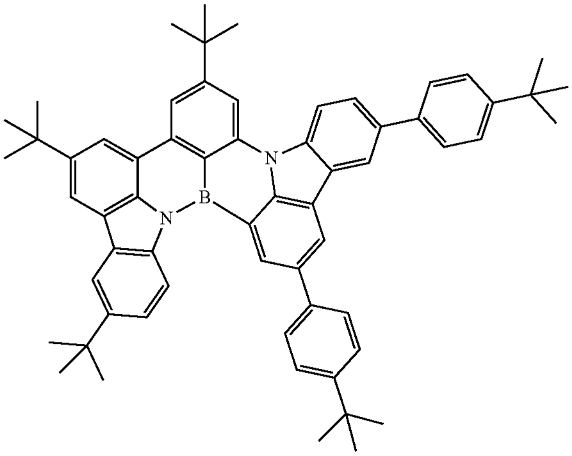

-continued
(9)
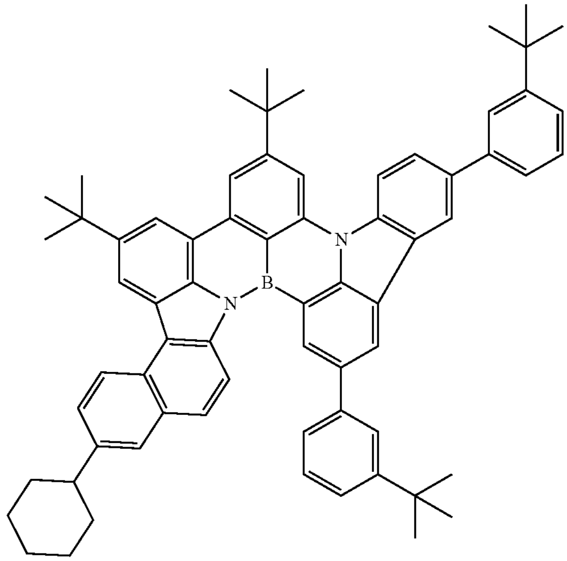
(10)
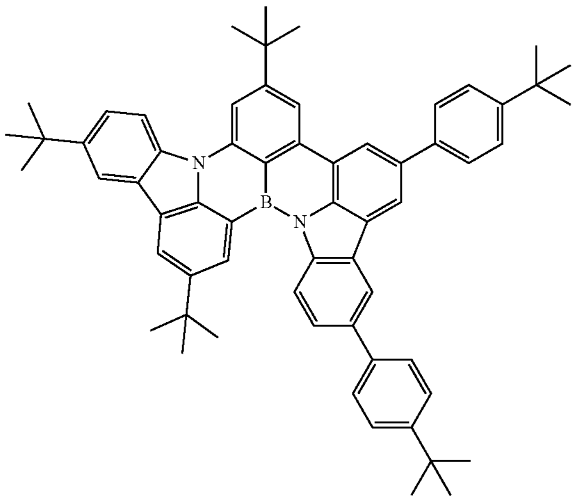
-continued
(11)
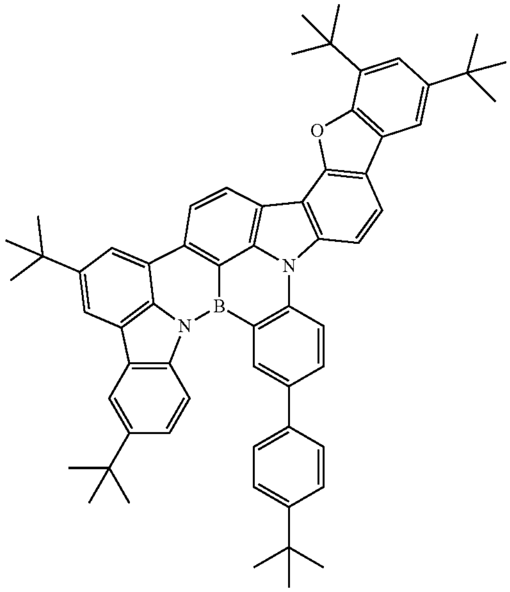
(12)
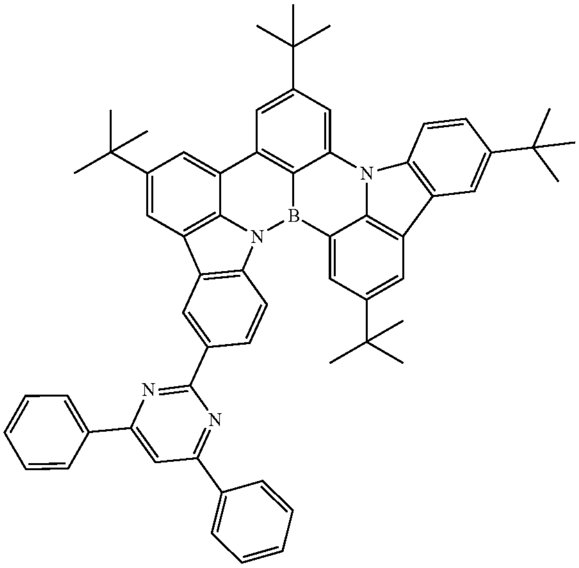
(13)
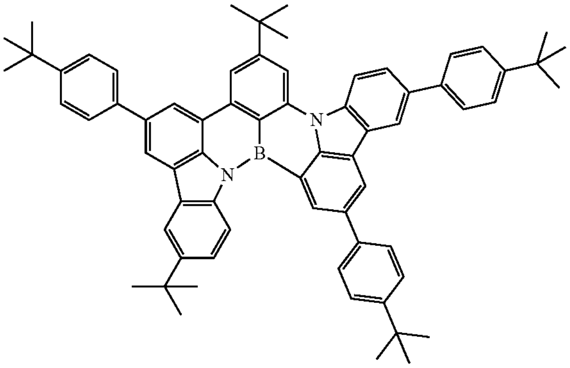

-continued
(14)
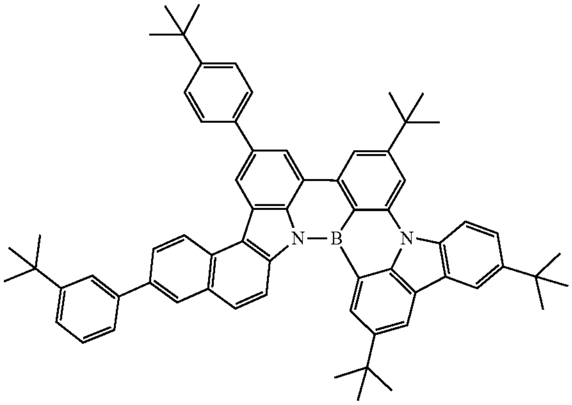
-continued
(17)
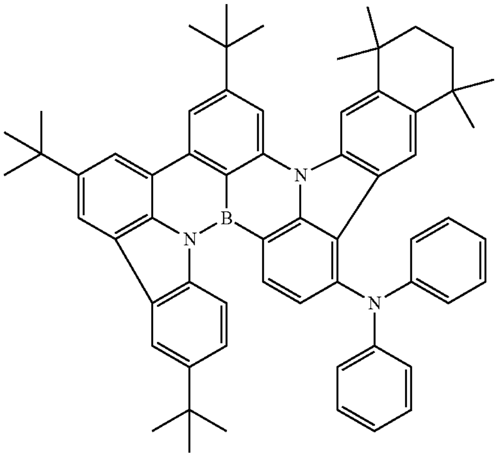
(15)
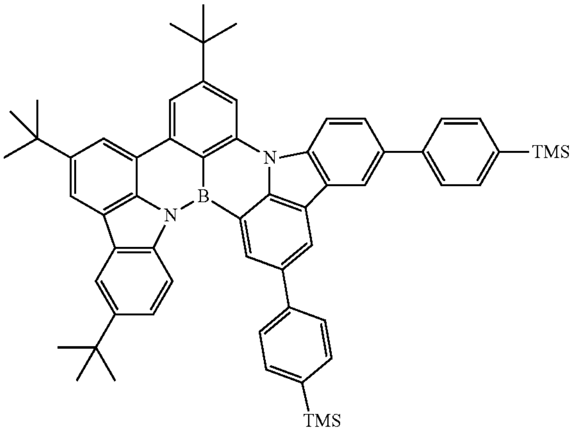
(18)
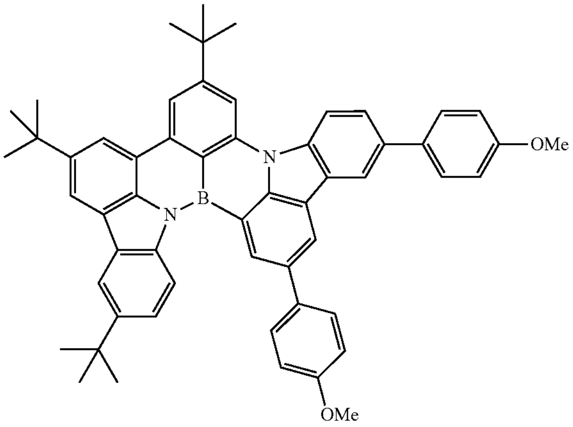
(16)
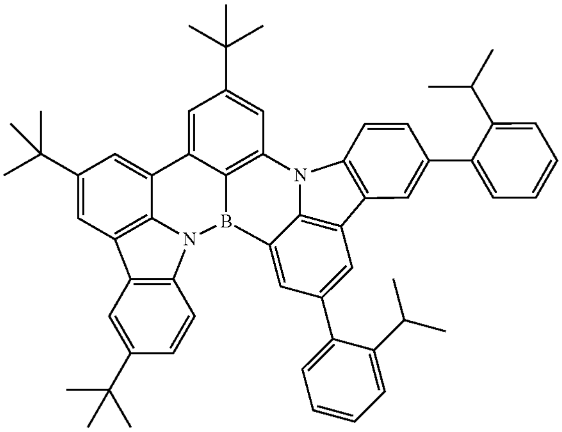
(19)
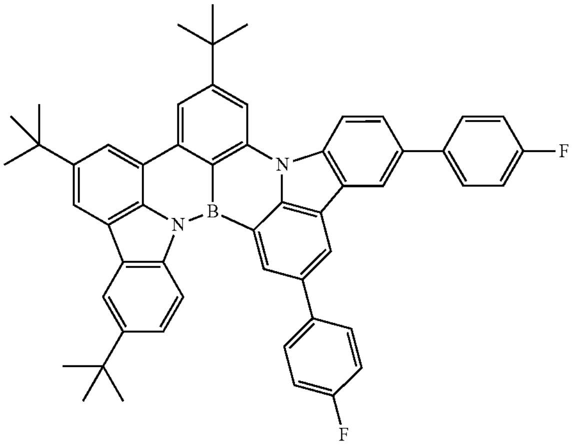

-continued
(20)
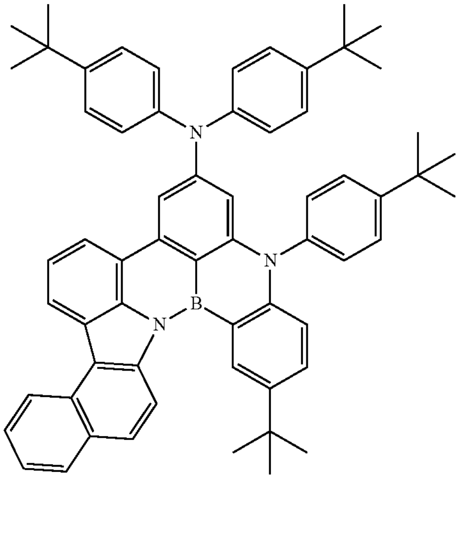
(21)
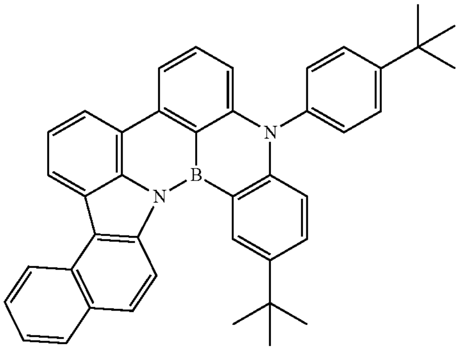
(22)
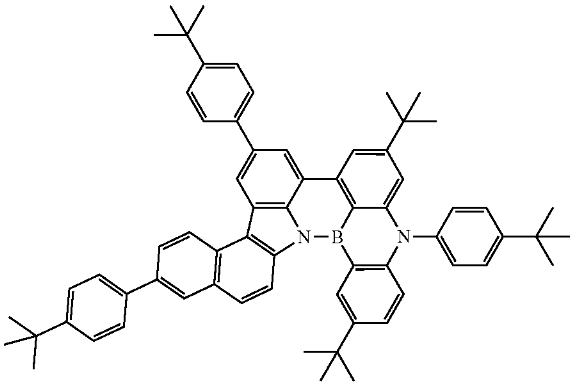
-continued
(23)
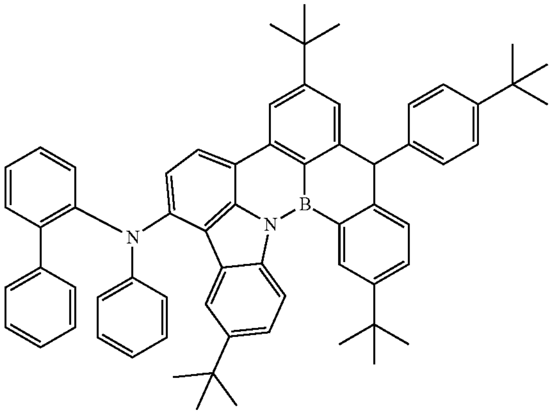
(24)
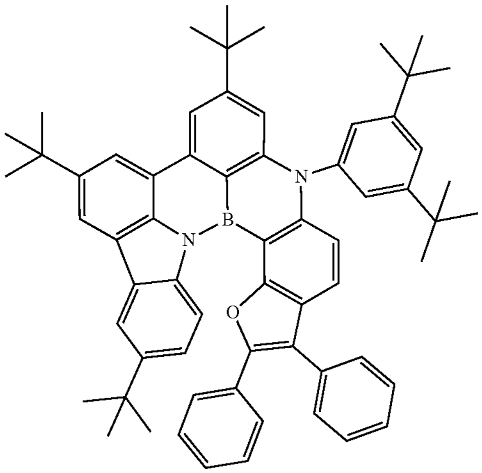

-continued
(25)
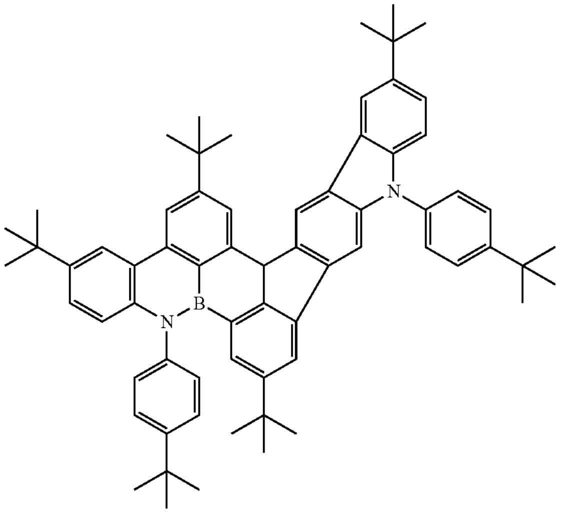
(26)
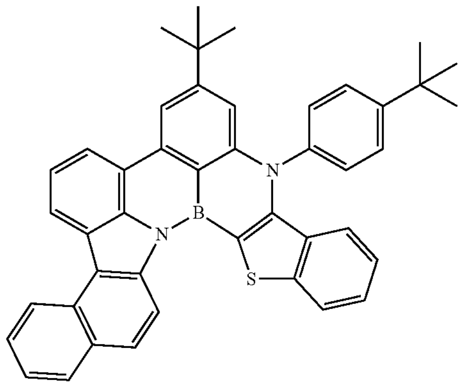
(27)
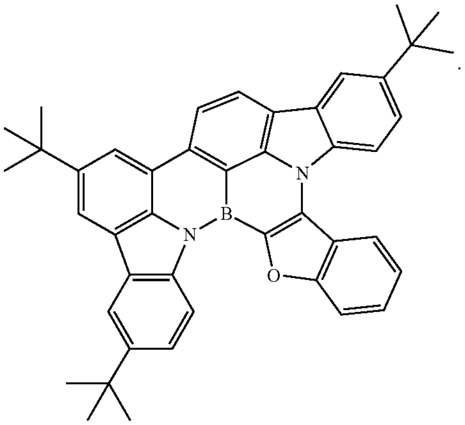
9. The heterocyclic compound of claim 8, having the structure:
(3)
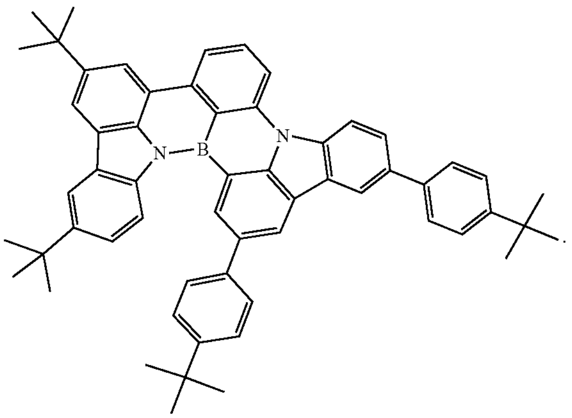
10. The heterocyclic compound of claim 8, having the structure:
(8)
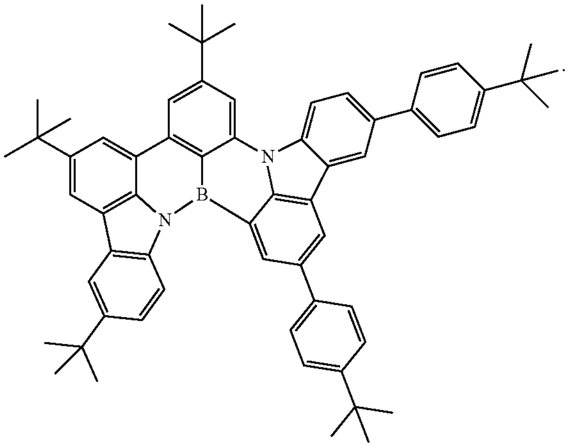

11. The heterocyclic compound of claim 8, having the structure:

(12)

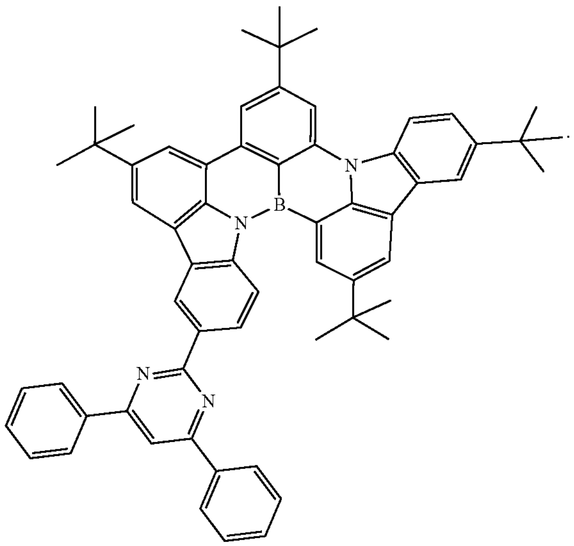

12. The heterocyclic compound of claim 8, having the structure:

(15)

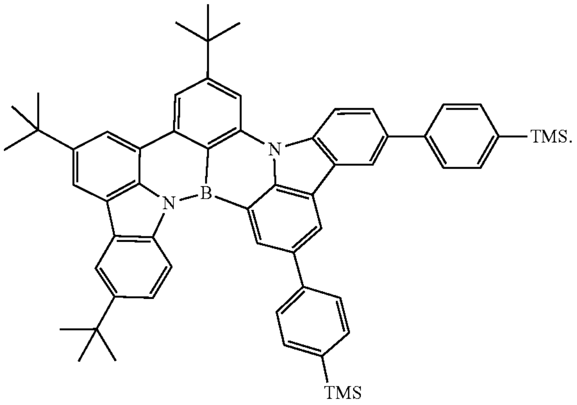

13. The heterocyclic compound of claim 8, having the structure:

(23)

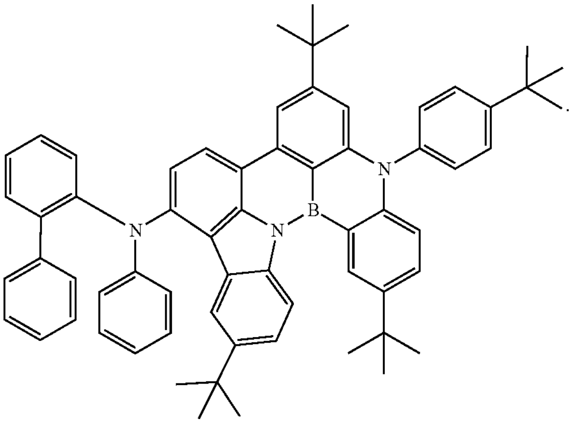

14. A material, suitable for an organic electroluminescence device, the material comprising:

the heterocyclic compound of claim 1.

15. An organic electroluminescence device, comprising:

the heterocyclic compound of claim 1.

16. The device of claim 15, comprising:

a cathode;

an anode; and an organic thin film layer comprising an emitting layer disposed between the cathode and the anode, wherein at least one layer of the organic thin film layer comprises the heterocyclic compound of claim 1.

17. The device of claim 16, wherein the light emitting layer comprises the heterocyclic compound of claim 1.

18. The device of claim 17, wherein the light emitting layer comprises a host and a dopant, wherein the dopant comprises the heterocyclic compound of claim 1.

19. The device of claim 18, wherein the host comprises an optionally substituted fused aromatic hydrocarbon and/or anthracene compound.

20. Electronic equipment, comprising:

the organic electroluminescence device of claim 15.

21. A light emitting layer, comprising:

a host; and a dopant, wherein the dopant comprises the heterocyclic compound of claim 1.

* * * * *